United States Patent [19]

Hyatt

[11] Patent Number: 5,410,621
[45] Date of Patent: Apr. 25, 1995

[54] IMAGE PROCESSING SYSTEM HAVING A SAMPLED FILTER

[76] Inventor: Gilbert P. Hyatt, P.O. Box 846, Cypress, Calif. 90630

[21] Appl. No.: 849,243

[22] Filed: Apr. 7, 1986

Related U.S. Application Data

[63] Continuation-in-part of Ser. 425,731, Sep. 28, 1982, U.S. Pat. No. 4,581,715.

[51] Int. Cl.⁶ ............................................. G06K 9/00
[52] U.S. Cl. ................................ 382/69; 364/724.01
[58] Field of Search .................... 382/1, 43, 41, 54; 340/720; 358/213.23; 367/100; 364/728.03, 521, 819, 825, 827, 724, 726, 720, 734

[56] References Cited

U.S. PATENT DOCUMENTS

| | | | |
|---|---|---|---|
| 2,987,701 | 6/1961 | Grannemann | 367/21 |
| 3,214,700 | 10/1965 | Hook | 367/901 |
| 3,248,708 | 4/1966 | Haynes | 364/200 |
| 3,274,542 | 9/1966 | Ruehle | 367/46 |
| 3,293,614 | 12/1966 | Fenimore et al. | 340/720 |
| 3,315,235 | 5/1967 | Carnevale et al. | 364/200 |
| 3,421,141 | 1/1969 | Meyerhoff | 367/901 |
| 3,462,742 | 8/1969 | Miller et al. | 364/200 |
| 3,479,495 | 11/1969 | Malm | 235/181 |
| 3,487,369 | 12/1969 | King et al. | 364/200 |
| 3,489,996 | 1/1970 | Moon et al. | 367/46 |
| 3,496,529 | 2/1970 | Anstey et al. | 340/15.5 CC |
| 3,501,746 | 3/1970 | Vosbury | 340/720 |
| 3,506,813 | 4/1970 | Trimble | 367/28 |
| 3,509,329 | 4/1970 | Wang et al. | 364/750.5 |
| 3,521,170 | 7/1970 | Leuthold et al. | 364/602 |
| 3,525,072 | 8/1970 | Born et al. | 367/21 |
| 3,557,354 | 1/1971 | Trimble | 364/734 |
| 3,560,933 | 2/1971 | Schwartz | 364/200 |
| 3,566,366 | 2/1971 | Quinn et al. | 364/200 |
| 3,581,274 | 5/1971 | Ruehle | 367/24 |
| 3,593,306 | 7/1971 | Toy | 364/200 |
| 3,609,671 | 9/1971 | Webster | 367/1 |
| 3,614,626 | 10/1971 | Dillard | 325/323 |
| 3,626,168 | 12/1971 | Norsworthy | 364/200 |
| 3,629,509 | 12/1971 | Glaser | 364/424 |
| 3,631,408 | 12/1971 | Kubo | 365/222 |
| 3,633,170 | 1/1972 | Jones | 333/70 T |
| 3,634,883 | 10/1972 | Kreidermacher | 364/200 |
| 3,636,258 | 1/1972 | Brumbach | 235/181 |
| 3,646,333 | 2/1972 | Pryor, Jr. | 364/606 |
| 3,646,522 | 2/1972 | Furman et al. | 364/200 |
| 3,648,255 | 3/1972 | Beasoleil et al. | 364/200 |
| 3,657,705 | 4/1972 | Mekota et al. | 364/200 |
| 3,685,027 | 8/1972 | Allen et al. | 365/188 |
| 3,686,637 | 8/1972 | Zachar et al. | 364/200 |
| 3,689,874 | 9/1972 | Foster et al. | 367/46 |
| 3,701,894 | 10/1972 | Low et al. | 364/728 |
| 3,702,988 | 11/1972 | Haney et al. | 364/200 X |
| 3,714,566 | 10/1973 | Kang | 364/827 |
| 3,721,812 | 3/1973 | Schmidt | 364/726 |
| 3,731,268 | 5/1973 | Landrum, Jr. | 340/15.5 DP |
| 3,735,269 | 5/1973 | Jackson | 328/14 |
| 3,753,240 | 8/1973 | Merwin | 235/152 |
| 3,757,038 | 9/1973 | Jannery et al. | 340/720 |
| 3,777,133 | 12/1973 | Beck et al. | 364/728 |
| 3,801,884 | 4/1974 | Sequin | 358/213.23 |
| 3,811,036 | 5/1974 | Perry | 340/720 |
| 3,831,013 | 8/1974 | Alsup et al. | 364/728 |
| 3,835,446 | 9/1974 | Rowland | 367/901 |
| 3,846,752 | 11/1974 | Nakano et al. | 382/43 |
| 3,878,514 | 4/1975 | Faber | 364/200 |
| 3,883,725 | 5/1975 | Fort et al. | 340/15.5 DP |
| 3,894,219 | 7/1975 | Weigel | 364/602 |
| 3,906,400 | 9/1975 | Gooding et al. | 330/70 T |
| 3,939,465 | 2/1976 | Helton et al. | 367/137 |
| 3,942,034 | 3/1976 | Buss | 364/825 |

(List continued on next page.)

OTHER PUBLICATIONS

An Introduction to Digital Matched Filters; Turin, Proceedings of the IEEE; Jul. 1976.
Designers Guide to Digital Filters; Leon and Bass, (List continued on next page.)

*Primary Examiner*—Jose L. Couso
*Attorney, Agent, or Firm*—Gilbert P. Hyatt; Gregory L. Roth

[57] ABSTRACT

A filter display system is provided to improve display operations. Filtering of display information, such as with correlation filters, improves the image and enhances events of interest. High speed filters for filtering on the fly as the image is being refreshed provides improved capability for iteratively and adaptively enhancing an image. Parallel processing channels provide multiple filtering operations simultaneously for improved performance. Iteratively refreshing a display with filtered information as the filtered image is built up permits operator intervention for optimizing filtering operations.

17 Claims, 18 Drawing Sheets

U.S. PATENT DOCUMENTS

| | | | |
|---|---|---|---|
| 3,958,214 | 5/1976 | Andrews, Jr. et al. | 367/1 |
| 3,987,284 | 10/1976 | Hogan et al. | 364/521 |
| 4,016,554 | 4/1977 | Evans et al. | 364/521 |
| 4,035,629 | 7/1977 | Lampe et al. | 364/819 |
| 4,037,159 | 7/1977 | Martin | 325/30 |
| 4,058,715 | 11/1977 | Niwa | 364/726 |
| 4,086,560 | 4/1978 | Johnston et al. | 367/100 |
| 4,156,914 | 5/1979 | Westezl | 364/825 |
| 4,209,843 | 6/1980 | Hyatt | 364/728.03 |
| 4,283,767 | 8/1981 | Rountree | 364/728 |
| 4,486,850 | 12/1984 | Hyatt | 364/726 |
| 4,491,930 | 1/1985 | Hyatt | 364/726 |
| 4,551,816 | 11/1985 | Hyatt | 364/724 |
| 4,553,213 | 11/1985 | Hyatt | 364/514 |
| 4,553,221 | 11/1985 | Hyatt | 364/724.05 |
| 4,581,715 | 4/1986 | Hyatt | 364/726 |
| 4,686,655 | 8/1987 | Hyatt | 364/724.01 |
| 4,744,042 | 5/1988 | Hyatt | 364/726 |
| 4,825,364 | 4/1989 | Hyatt | 364/200 |
| 4,896,260 | 1/1990 | Hyatt | 364/200 |

OTHER PUBLICATIONS

EDN Magazine; Mar. 20, 1974 pp. 51–59, Apr. 20, 1974 pp. 57–62, May 20, 1974 61–67.

A Digital Correlator Using Delta Modulation; Nakamura, IEEE Transactions on Acoustics, Speech, and Signal Processing; Jun. 1976.

The Theory and Design of Chirp Radars; Klauder, Bell System Technical Journal, vol. XXXIX, No. 4; Jul. 1960.

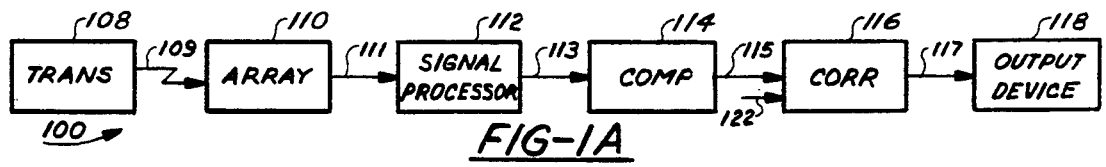
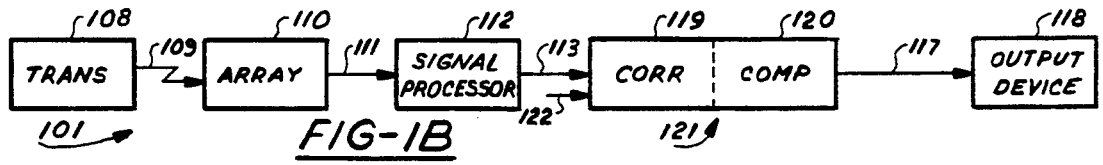
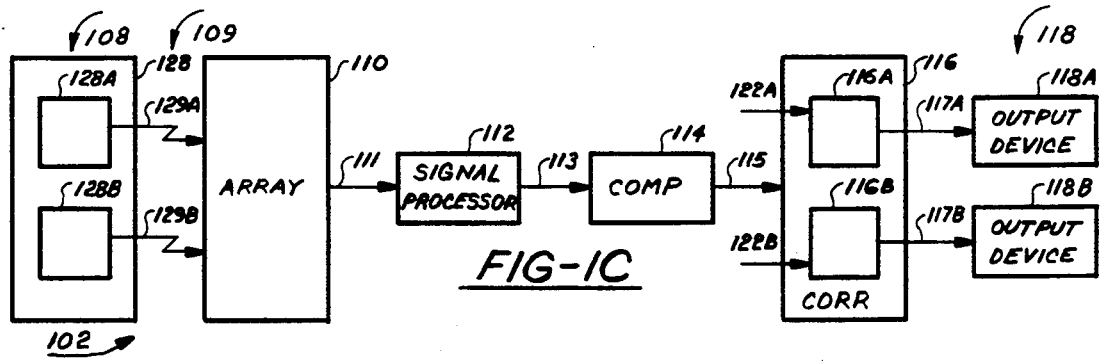
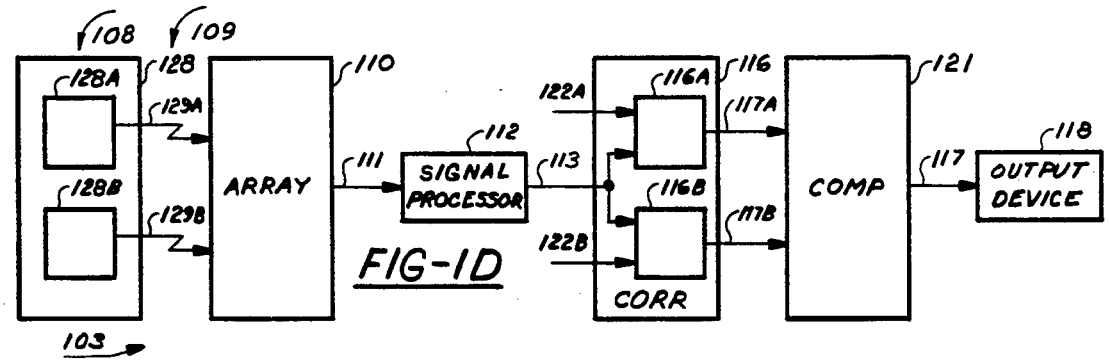
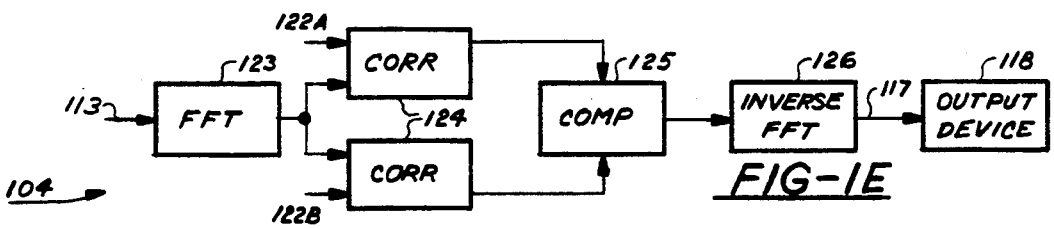
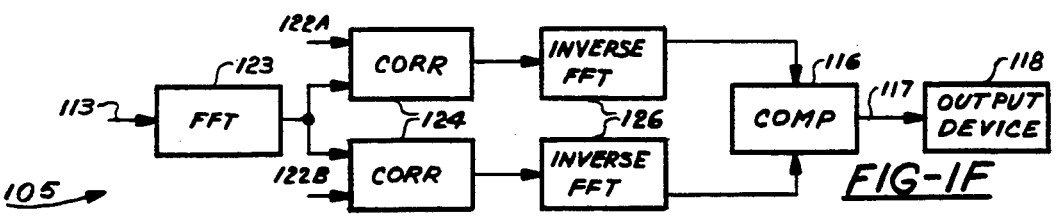

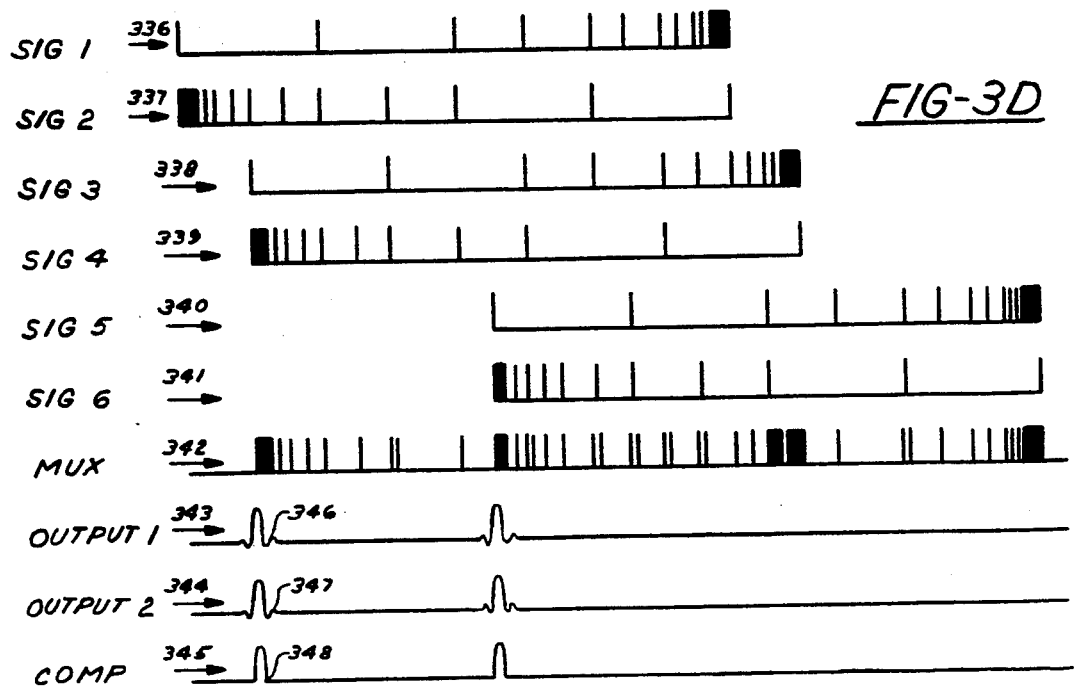
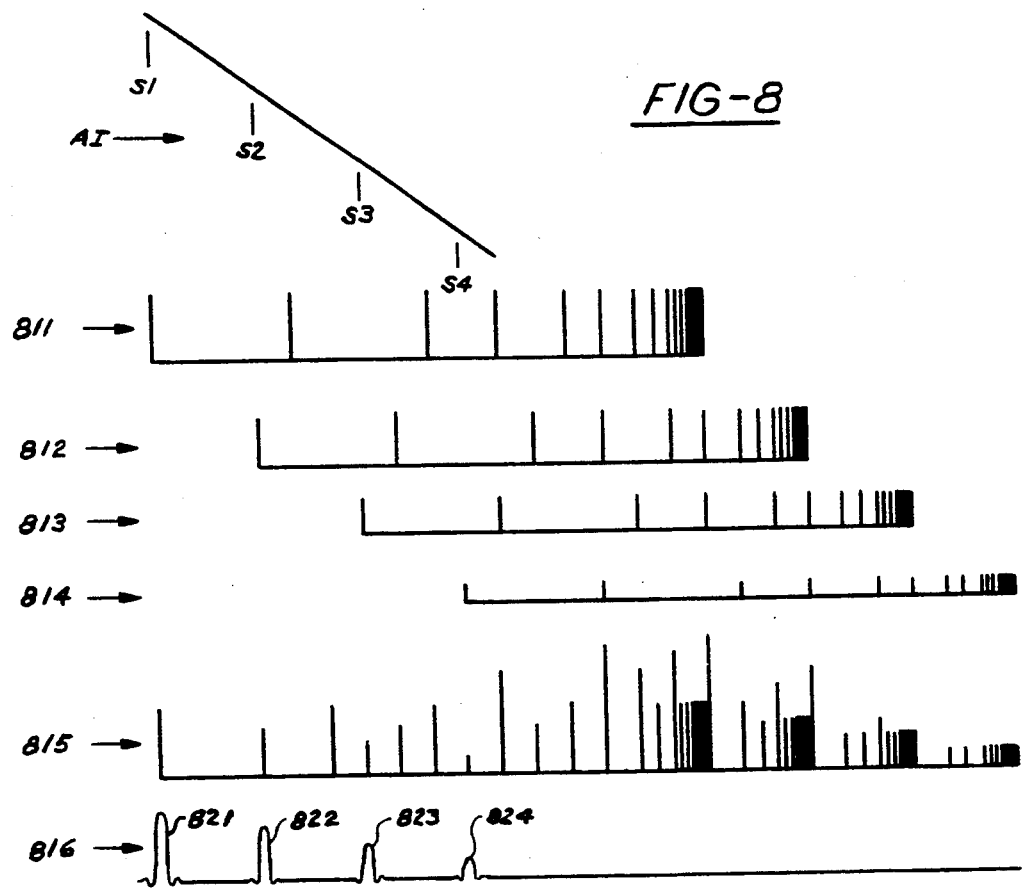

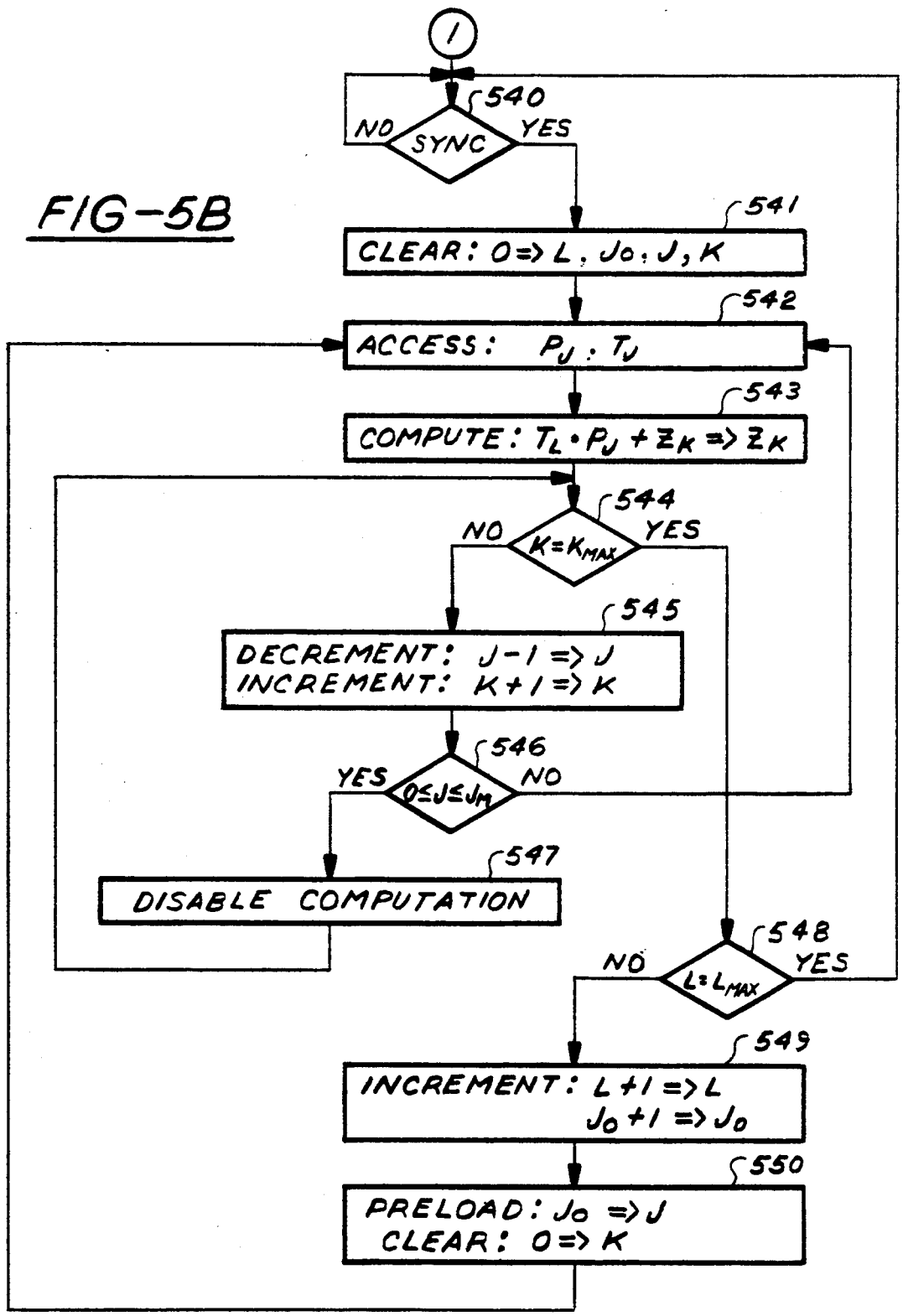

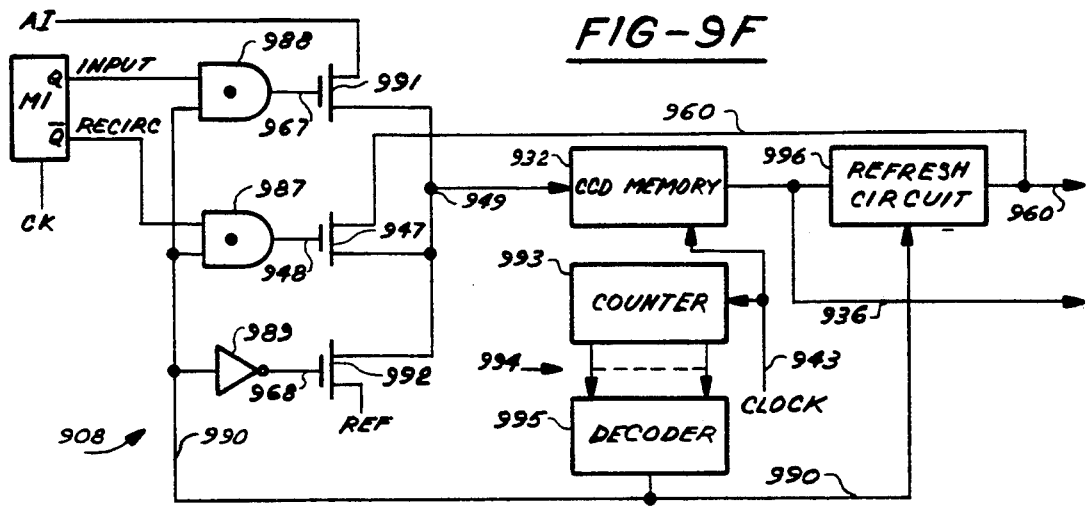
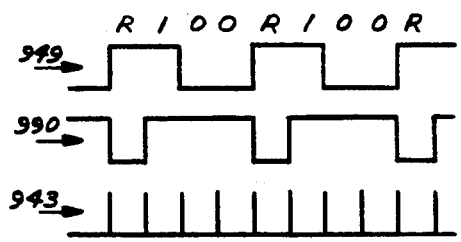
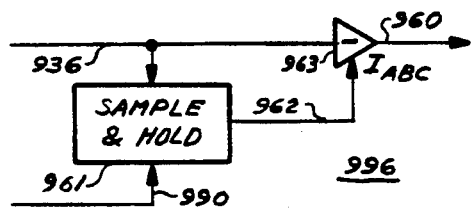
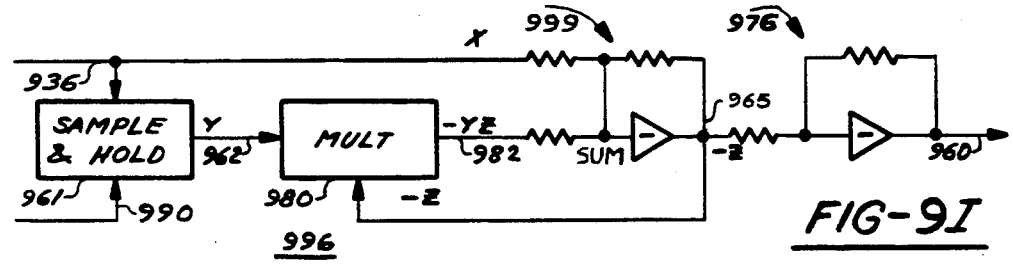
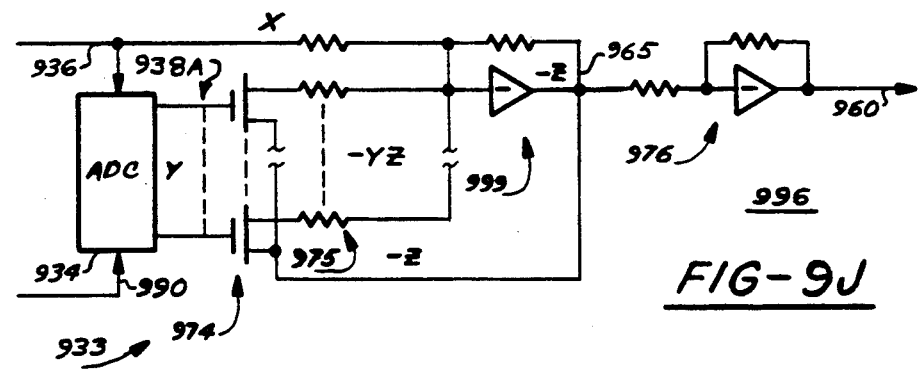

IMAGE PROCESSING SYSTEM HAVING A SAMPLED FILTER

CROSS REFERENCE TO RELATED APPLICATIONS

This application is a continuation in part of parent application FOURIER TRANSFORM PROCESSOR Ser. No. 425,731 filed on Sep. 28, 1982 and now U.S. Pat. No. 4,581,715 issued on Apr. 18, 1986 which is a continuation in part of each application in the following chain of parent patent applications therebetween.

(A) MEMORY SYSTEM USING FILTERABLE SIGNALS Ser. No. 160,872 filed on Jun. 19, 1980 and now U.S. Pat. No. 4,491,930 issued on Jan. 1, 1985;

(B) COMPUTER SYSTEM ARCHITECTURE Ser. No. 860,257 filed Dec. 14, 1977 and now U.S. Pat. No. 4,371,923 issued on Feb. 1, 1983;

(1) FACTORED DATA PROCESSING SYSTEM FOR DEDICATED APPLICATIONS on Ser. No. 101,881 filed on Dec. 28, 1970, proceedings therein having been terminated;

(2) CONTROL SYSTEM AND METHOD Ser. No. 134,958 filed on Apr. 19, 1971, still in the PTO;

(3) CONTROL APPARATUS Ser. No. 135,040 filed on Apr. 19, 1971, still in the PTO;

(4) APPARATUS AND METHOD FOR PRODUCING HIGH REGISTRATION PHOTOMASKS Ser. No. 229,213 filed on Apr. 13, 1972 and now U.S. Pat. No. 3,820,8943 issued on Jun. 28, 1974;

(5) MACHINE CONTROL SYSTEM OPERATING FROM REMOTE COMMANDS Ser. No. 230,872 filed on Mar. 1, 1972 and now U.S. Pat. No. 4,531,182 issued on Jul. 23, 1983;

(6) COORDINATE ROTATION FOR MACHINE CONTROL SYSTEM Ser. No. 232,459 filed on Mar. 7, 1972 and now U.S. Pat. No. 4,370,720 issued on Jan. 25, 1983;

(7) DIGITAL FEEDBACK CONTROL SYSTEM Ser. No. 246,867 filed on Apr. 24, 1972 and now U.S. Pat. No. 4,310,878 issued on Jan. 12, 1982;

(8) COMPUTERIZED SYSTEM FOR OPERATOR INTERACTION Ser. No. 288,247 filed on Sep. 11, 1972 and now U.S. Pat. No. 4,121,284 issued on Oct. 17, 1976;

(9) A SYSTEM FOR INTERFACING A COMPUTER TO A MACHINE Ser. No. 291,394 filed on Sep. 22, 1972 and now U.S. Pat. No. 4,396,976 issued on Aug. 2, 1983;

(10) DIGITAL ARRANGEMENT FOR PROCESSING SQUAREWAVE SIGNALS Ser. No. 302,771 filed on Nov. 1, 1972, still in the PTO;

(11) APPARATUS AND METHOD FOR PROVIDING INTERACTIVE AUDIO COMMUNICATION Ser. No. 325,933 filed on Jan. 22, 1973 and now U.S. Pat. No. 4,016,540 issued on Apr. 5, 1977;

(12) ELECTRONIC CALCULATOR SYSTEM HAVING AUDIO MESSAGES FOR OPERATOR INTERACTION Ser. No. 325,941 filed on Jan. 22, 1973 and now U.S. Pat. No. 4,060,848 issued on Nov. 29, 1977;

(13) ILLUMINATION CONTROL SYSTEM Ser. No. 366,714 filed on Jun. 4, 1973 and now U.S. Pat. No. 3,986,922 issued on Oct. 12, 1976;

(14) DIGITAL SIGNAL PROCESSOR FOR SERVO VELOCITY CONTROL Ser. No. 339,817 filed on Mar. 9, 1973 and now U.S. Pat. No. 4,034,276 issued on Jul. 5, 1977;

(15) MONOLITHIC DATA PROCESSOR Ser. No. 402,520 filed on Oct. 1, 1973 and now U.S. Pat. No. 4,825,364 issued on Apr. 25, 1989;

(16) HOLOGRAPHIC SYSTEM FOR OBJECT LOCATION AND IDENTIFICATION Ser. No. 490,816 filed on Jul. 22, 1974 and now U.S. Pat. No. 4,029,853 issued on Jun. 24, 1980;

(17) COMPUTERIZED MACHINE CONTROL SYSTEM Ser. No. 476,743 filed on Jun. 5, 1974 and now U.S. Pat. No. 4,364,110 issued on Dec. 14, 1982;

(18) SIGNAL PROCESSING AND MEMORY ARRANGEMENT Ser. No. 522,559 filed on Nov. 11, 1974 and now U.S. Pat. No. 4,209,852 issued on Jun. 24, 1980;

(19) METHOD AND APPARATUS FOR SIGNAL ENHANCEMENT WITH IMPROVED DIGITAL FILTERING Ser. No. 550,231 filed on Feb. 14, 1975 and now U.S. Pat. No. 4,209,843 issued on Jun. 24, 1980,

(20) ILLUMINATION SIGNAL PROCESSING SYSTEM Ser. No. 727,330 filed on Sep. 27, 1976; now abandoned;

(21) PROJECTION TELEVISION SYSTEM USING LIQUID CRYSTAL DEVICES Ser. No. 730,756 filed on Oct. 7, 1976, now abandoned;

(22) INCREMENTAL DIGITAL FILTER Ser. No. 754,660 filed on Dec. 27, 1976 and now U.S. Pat. No. 4,486,850 issued on Dec. 4, 1984;

(23) MEANS AND METHOD FOR COMPUTERIZED SOUND SYNTHESIS Ser. No. 752,240 filed on Dec. 20, 1976; now abandoned;

(24) VOICE SIGNAL PROCESSING SYSTEM Ser. No. 801,879 filed on May 13, 1977 and now U.S. Pat. No. 4,144,582 issued on Mar. 13, 1979;

(25) ANALOG READ ONLY MEMORY Ser. No. 812,285 filed on Jul. 1, 1977 and now U.S. Pat. No. 4,371,953 issued on Feb. 1, 1983;

(26) DATA PROCESSOR ARCHITECTURE Ser. No. 844,765 filed on Oct. 25, 1977; now U.S. Pat. No. 4,523,290 issued on Jun. 11, 1985;

(27) DIGITAL SOUND SYSTEM FOR CONSUMER PRODUCTS Ser. No. 849,912 filed on Nov. 9, 1977, now in the PTO;

(29) ELECTRO-OPTICAL ILLUMINATION CONTROL SYSTEM Ser. No. 860,278 filed on Dec. 13, 1977 and now U.S. Pat. No. 4,471,385 issued on Sep. 11, 1984; and

(29) MEMORY SYSTEM HAVING SERVO COMPENSATION Ser. No. 889,301 filed on Mar. 23, 1978 and now U.S. Pat. No. 4,322,819 issued on Mar. 30, 1982; and this application is further a continuation in part of parent application

(30) INTELLIGENT DISPLAY SYSTEM Ser. No. 849,733 filed on Nov. 9, 1977;

all by Gilbert P. Hyatt, where the benefit of the filing dates of all of the above-listed applications are herein claimed in accordance with the United States Code such as with 35 USC 120 and 35 USC 121;

where all the above listed patents and patent applications are incorporated herein by reference as if fully set forth at length herein; and where one skilled in the art will be able to combine the disclosures in said applications and patents that are incorporated by reference with the disclosure in the instant application from the disclosures therein and the disclosures herein.

BACKGROUND OF THE INVENTION

1. Field of the Invention

This invention relates to signal processing arrangements and, in particular, to digital filtering arrangements.

2. Description of the Prior Art

The prior art provides digital filtering arrangements with whole-number digital data processors which require complex computational hardware to implement whole-number computations. Prior art correlators are implemented as frequency-domain correlators by first performing a Fast Fourier Transform (PFT) to convert time-domain input information to frequency-domain information, then by performing a correlation operation in the frequency-domain, and then by performing an inverse PFT for converting the frequency-domain correlated information to time-domain information for interpretation by an operator. The large quantity of whole-number computational operations such as multiplication operations for an PFT computation, complex hardware, and extensive computations result in expensive correlation processors which are not able to operate in real-time. Further, prior art equipment such as digital correlators are implemented based upon requiring input resolution comperable to the desired output resolution. Therefore, prior art systems such as the CAFDRS system proved by United Geophysical of Pasadena, Calif. use a compositor to composite information prior to correlation to order to reduce the data rate of correlation input information. Further, such prior art systems cannot perform real-time correlation computations but can only perform correlation computations off-line; where on-line real-time correlation is not feasible in the prior art because of correlator speed limitations. The prior art operation of compositing-before-correlation, which is used to reduce data rates, introduces many limitations such as requiring repeatable signal sources and requiring repetition of ensonifying signals for compositing-before-correlation. Further, the non-real-time off-line operation of prior art correlators, resulting from the relatively low performance of prior art whole-number correlators, precludes correlation of information as acquired in real-time and precludes the ability for correlating all of the information acquired without first compositing.

The prior art has considered that a correlator must have a computational word size that is related to a required output word size. For example, a 16-bit correlators generates 16-bit correlation output words by performing computations with 16-bit computational circuits on 16-bit input trace and pilot words. Consequently, prior art correlators typically having a 16-bit word size have been implemented with complex computations for manipulating 16-bit words.

BRIEF DESCRIPTION OF THE INVENTION

The present invention is directed to signal processing and digital filtering, particularly using multiple signature signals for location of objects such as in geophysical exploration and applicable to many other types of systems. In a geophysical exploration system, an improved digital filtering arrangement is provided which yields improved digital filtering capability with a significant reduction in cost when compared to prior art systems. Use of a plurality of overlapping signature signals that are separated through filter processing provides improvements in productivity and capability. For example, ensonfication of a geophysical environment from multiple shotpoints with signals having different signatures and without listening periods increases the rate at which information that can be acquired and processed.

An arrangement for compositing-after-correlation is provided for a geophysical application which yields substantial advantages over the prior art systems. One advantage is that a plurality of different pilot signals may be generated sequentially to reduce "computational noise" associated with the correlation function such as the "side lobes" associated with a correlation peak. Another advantage is that uncontrollable pilot singals such as dynamite blasts may be used, wherein each return trace may be correlated against a measured pilot signal. Yet another advantage may be elimination of a compositor, where compositing is a summation operation and wherein the correlation algorithm of the present invention provides multiplication and summing operations; where compositing may be implicit in the correlation operation and need not be implemented in a special compositor. Still a further advantage is that the time associated with a "listening" period between transmitted chirp signals may be eliminated by overlapping or superimposing pilot signals which are separable through correlation rather than through time delays.

In accordance with a feature of the present invention, an improved sampled filtering system is provided.

In accordance with another feature of the present invention, an improved sampled filter device is provided in the form of a correlator.

A further feature of the present invention provides an improved geophysical exploration system.

A still further feature of the present invention provides an improved correlation processor.

In accordance with still another feature of the present invention, a compositing-after-correlation arrangement is provided.

Yet another feature of the present invention provides a multi-channel filtering arrangement.

Yet another feature of the present invention provides for reduction or elimination of a listening period between ensonifying signals.

A still further feature of the present invention provides for generation and processing of overlapping signature signals.

The foregoing and other objects, features, and advantages of the present invention will become apparent from the following detailed description of preferred embodiments of this invention as illustrated in the accompanied drawings.

BRIEF DESCRIPTION OF THE DRAWINGS

A better understanding of the invention may be obtained from a consideration of the detailed description hereinafter taken in conjunction with the drawings which are briefly described below.

FIG. 1 comprising FIGS. 1A-1F is a block diagram of a system in accordance with the present invention wherein FIG. 1A is a block diagram of a signal processing system having a separate correlator and compositor; FIG. 1B is a block diagram of a system having a combined correlator and compositor; FIG. 1C is a block diagram of a system having a plurality of transmitters and a plurality of correlators for correlation-after-compositing; FIG. 1D is a block diagram of a system having a plurality of transmitters and a plurality of correlators for compositing-after-correlation; FIG. 1E is a block diagram of a data processing arrangement in accordance with FIGS. 1A-1D for providing frequency-domain correlation and frequency-domain compositing; and FIG. 1F is a block diagram of a data processing arrangement in accordance with FIGS. 1A-1D for providing frequency-domain correlation and time-domain compositing.

FIG. 2 comprising FIGS. 2A and 8 is a detailed block diagram representation in accordance with FIG. 1 wherein FIG. 2A provides a detailed block diagram of the signal processing arrangement in accordance with FIG. 1 and wherein

FIG. 3 comprising FIGS. 3A-3D shows chirp signal waveforms illustrating operation of the system in accordance with the present invention wherein FIG. 3A illustrates simple correlation operations; FIG. 3B illustrates compositing-before-correlation operations; FIG. 3C illustrates compositing-after-correlation operations for sequential up-chirp signals; FIG. 3D illustrates compositing-after-correlation operations for simultaneous up-chirp and down-chirp signals.

FIG. 5 comprising FIGS. 5A and 5B presents flow diagram and state diagram representations of correlator and compositor operations in accordance with the present invention wherein FIG. 5A illustrates a multi-channel embodiment and FIG. 5B illustrates a signal channel embodiment.

FIG. 6 comprising FIGS. 6A-6H provides a detailed schematic and block diagram representations of a correlator and compositor arrangement in accordance with the present invention wherein

FIG. 7 comprising FIGS. 7A-7I provides detailed block diagram and schematic representation and provides signal diagrams for a communication embodiment in accordance with the present invention wherein FIG. 7C shows a rate multiplier embodiment of a chirp generator in accordance with FIG. 7D.

FIG. 8 shows chirp signal waveforms illustrating operation of the system in accordance with FIG. 7 for an analog chirp signal communication arrangement.

FIG. 9 comprising FIGS. 9A-9J illustrates signal processing arrangements using charge couple devices (CCDs) in accordance with the present invention wherein FIG. 9A illustrates a CCD channel processor arrangement; FIG. 9B illustrates a CCD beam forming arrangement; FIG. 9C illustrates a CCD hybrid memory arrangement; FIG. 9D illustrates signal degradation and compensation in accordance with the hybrid memory arrangement in accordance with FIG. 9C; FIG. 9E illustrates an alternate embodiment of a CCD memory arrangement; FIG. 9F illustrates an adaptive memory refresh arrangement; FIG. 9C illustrates the signal forms associated with the adaptive memory refresh arrangement shown in FIG. 9F; FIG 9H shows a first refresh circuit; FIG. 9I shows a refresh circuitry having an analog implicit servo; and FIG. 9J shows a hybrid refresh circuit having an implicit servo.

Figure 2A:
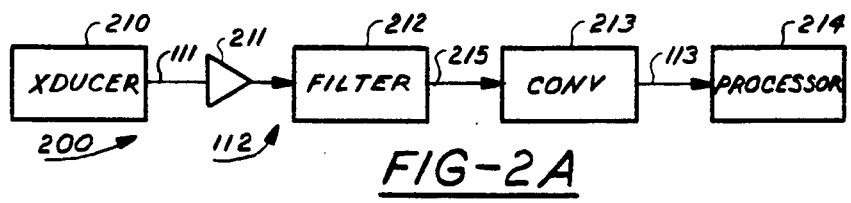

By way of introduction of the illustrated embodiment, the components shown in FIGS. 1-9 of the drawings have been assigned general reference numerals and a description of each such component is given in the following detailed description. The components in the figures have been assigned three-digit reference numerals wherein the hundreds-digit of the reference numeral is related to the figure number except that the same component appearing in successive drawing figures has maintained the first reference numeral. For example, the components in FIG. 1 have reference numerals between 100 and 199 and the components in FIG. 2 have reference numerals between 200 and 299.

DETAILED DESCRIPTION OF THE INVENTION

The system of the present invention can take any of a number of forms. Preferred embodiments of several forms of the present invention are shown in the accompanying figures and will be described in detailed hereafter.

A digital filtering system is provided for acquiring and processing signals using a digital filter for signal separation and signal enhancement. A digital correlator is provided for generating high resolution output data in response to low resolution input data processed with low resolution computational circuits. In one embodiment, a real-time time-domain correlator is provided with single-bit resolution computational elements to implement the correlator filtering operation. Use of the high speed real-time correlator of the present invention permits further enhancement of signals with the capability of correlation using a plurality of correlation operators. Particular advantages are achieved with the use of the real-time correlator in a geophysical exploration system embodiment and in a communication embodiment. Systems applications of the digital filter includes a communications modem for modulating and demodulating chirp signals to enhance data communication and compositing-after-correlation in a geophysical exploration system. Detailed circuitry is provided to implement such systems including an improved chirp signal generator, a multi-chirp signal generator, a chirp modulator, and a correlation demodulator.

The present invention provides signal processing and digital filtering arrangements for signal enhancement which are applicable to multitudes of different types of systems. In a geophysical exploration system, an improved digital filtering arrangement is provided which yields improved digital filtering capability with a significant reduction in cost when compared to prior art systems. Further, the availability of the low cost and high performance correlator of the present invention permits use of correlation digital filters in multitudes of applications that previously could not qualify such digital filtering capability. for example, use of digital filters may significantly enhance processing such as in the medical diagnostic systems, equipment diagnostic systems, radar and sonar signal processing systems, pattern recognition systems, communication systems, and in many other signal processing and data processing applications.

A simplified correlator arrangement is provided for digital filtering operations, where the digital correlator is implemented to process low resolution input data such as single-bit data in a high speed and low cost arrangement while still providing high resolution output data. A characteristic of the correlation operation is that input data resolution does not limit output data resolution; where greater output data resolution can be obtained than available with the input data by enhancing the information over many samples. This may be considered to be an averaging of a statistical combination of many samples to enhance precision and may be considered analagous to the integration signals using analog filters to enhance the signal-to-noise ratio and other such characteristics. In one configuration of the correlator of the present invention, a one-bit resolution computational operation is provided to implement a low cost high speed correlator, where the input or trace signal and the operator or pilot signal may have only one-bit resolution. A one-bit computation is simple to implement, thereby providing low cost and high speed when compared to conventional whole-number computations typically performed on 16-bit words.

This arrangement generating high resolution correlator output information in response to low resolution input information is described in a preferred embodiment, wherein low resolution input information may be single-bit information and the high resolution output information may be a 20 bit information. The prior art has considered that it is necessary to have input resolution and computational resolution comparable to required output resolution. In accordance with this feature of the present invention, intrinsic characteristics of a filtering algorithm are recognized wherein low resolution input information may be used to generate high resolution output information. Preferred embodiments of the present invention take advantage of this characteristic by receiving low resolution input information such as single-bit information, processing low resolution information such as single-bit information, and updating high resolution output information in response to the low resolution input information and low resolution data processing.

An arrangement for compositing-after-correlation is provided for a geophysical application which yields substantial advantages over the prior art systems. One advantage is that a plurality of different pilot signals may be generated sequentially to reduce "computational noise" associated with the correlation function such as the "side lobes" associated with a correlation peak. Another advantage is that uncontrollable pilot singals such as dynamite blasts may be used, wherein each return trace may be correlated against a measured pilot signal. Yet another advantage may be elimination of a compositor, where compositing is a summation operation and wherein the correlation algorithm of the present invention provides multiplication and summing operations; where compositing may be implicit in the correlation operation and need not be implemented in a special compositor. Still a further advantage is that the time associated with a "listening" period between transmitted chirp signals may be eliminated by overlapping or superimposing pilot signals which are separable through correlation rather than through time delays.

A correlator is a widely applicable digital filter and is exemplary of the generalized digital filtering arrangements of the present invention. A correlator can enhance signals so efficiently that information can be extracted from signals where no information appears to exist. It may be used to perform many signal processing and filtering operations including separation of signals from noise, separation or demultiplexing of multitudes of signals that are mixed together, and enhancing low level signals. For example, a geophysical exploration application may use a correlator to separate millions of seismic signals reflected from subsurface structures which are all combined together and which are mixed with high levels of noise.

The digital correlator of the present invention is an important technological advancement that supercedes limitations of prior art correlators and which generally enhances applicability of correlators. Prior art correlators have three major limitations which are low speed, high price, and low accuracy. The correlator of the present invention overcomes these limitations, having a price-to-performance characteristic that is significantly better than with prior art correlators and having the highest levels of accuracy.

Speed is a primary consideration where correlators are often required to process voluminous amounts of data that is being acquired in real-time. Prior art correlators are too slow to process information in real-time for high data rate applications. Therefore, many prior art systems have limited throughput and required expensive data buffering to compensate for correlator speed limitations. For such prior art systems, expensive disc memories are used to buffer input information until the correlator can "catch-up" with the acquired data and the acquisition of data must be discontinued until the correlator can process the previously acquired data. Therefore, such systems must tolerate the high cost of buffer memories and the low productivity caused by discontinuing operations until the correlator can "catch-up". The correlator of the present invention has extremely high speed, permitting data to be correlated in real-time as acquired without limiting system productivity and without requiring expensive buffer memories as with prior art systems. For example, the correlator of the present invention can process geophysical information in real-time from 1,024-channels with 1-millisecond samples but the prior art CAFDRS geophysical exploration system cannot even process information in real-time from 24-channels with 4-millisecond samples. For a geophysical application, the correlator of the present invention is almost 1,000-times faster than the CAFDRS correlator. Other prior art correlators may provide greater speed than the CAFDRS correlator but have significantly higher cost, where the correlator of the present invention may have approximately a 100-time speed advantage over the very expensive highest speed prior art correlators.

Price is a primary consideration, where correlator price may be a primary system constraint. Higher speed prior art correlators may be priced at over $50,000 and may total almost $100,000 when buffer memories, peripherals, and interfaces are included. The correlator of the present invention can be produced, to sell profitably for under $10,000 in a sophisticated geophysical configuration. Further, price advantages accrue as a result of the reduction in buffer memory requirements and in enhanced throughput as a result of the real-time capabilities of the correlator of the present invention.

Accuracy is a secondary consideration with prior art correlators, where 16-bit resolution (1-part in 65,000) is typical. Applications requiring greater precision cannot be accommodated with prior art correlators which have a fixed resolution characteristic and a limited flexibility to adjust resolution to the specific requirements of the application. The correlator of the present invention has substantially unlimited resolution capability, wherein the resolution can be modularly expanded to meet any practical requirement. A preferred embodiment is configured for 20-bit resolution (1-part-per-million), which is more than 10-times the resolution of prior art correlators having 16-bit resolution.

The correlator of the present invention provides state-of-the-art capability with a price-to-performance characteristic that may be more than ten-times better than available with prior art correlators based upon a unique correlation concept and design. The correlator of the present invention uses new correlator concepts to achieve high speed and high accuracy at low cost in contract to the "brute-force" approaches used in prior art correlators. Therefore, the correlator of the present invention can be qualified for applications which could not tolerate the high price, low speed, or other limitations of prior art correlators.

A geophysical exploration embodiment of the present invention will now be described.

Geophysical exploration equipment is primarily used to locate oil, where seismic vibrations are impressed on the earth and geophone transducers sense the reflected seismic signals as indicative of subsurface structures. The received waveforms are extremely complex, including signals from millions of subsurface reflectors all superimposed together with varying amplitudes and with high levels of noise. The processing of these extremely complex seismic signals is usually performed on large scale computers at computer centers implementing complex filtering computations in software.

Signal enhancement and data compression are often provided in the field using a compositor, which effectively adds corresponding samples from many vibrator sweeps to reduce the amount of data that must be recorded. Because of the complexity of the row data and the composited data, it is not possible for an operator to determine the nature of the subsurface structures not to adequately determine if meaningful information is being acquired. Field exploration is very expensive typically costing $5,000 per day, where acquisition of poor information without the ability to detect and correct the situation during data acquisition may have extreme consequences. It is often necessary to return and "reshoot" the area at extremely high cost, but there may not be the opportunity to reshoot the area because of conditions such as weather and accessibility associated with areas such as in Alaska, or because of prohibitive costs to reaccess the area, or because of equipment availability. The ability to correlate and evaluate seismic data in the filed permits obtaining of clear and meaningful information with the ability to continue to accumulate information until acquired data is satisfactory. Further, the ability to correlate and evaluate seismic data in the field permits exploration of important subsurface structures that are not along the exploration route but which are often detected during exploration. Still further, the ability to correlate in the field permits optimization of data such as by compensating for noise, enhancing seismic data associated with important subsurface structures, and reducing the amount of time expended by precluding the need to take excessive data "just to be safe". Many other important considerations are related to correlation of data in the field. As on analogy, a correlator in a field system may be considered to provide the advantages of eyesight to an explorer, where the absence of a correlator in a field system may be considered to be "exploring blind".

Many prior art geophysical exploration systems have compositors and a few of the more advanced prior art systems have correlators, where these prior art compositors and correlators are extremely expensive yet are low in performance. For example, the CAFDRS system utilizes two computers and two disc memories, wherein a first computer performs compositing in real-time as the data is acquired and the second computer performs correlation if and when time is available. But not in real-time. It is estimated that the CAFDRS system includes a cost of $100,000 for the computers and computer peripherals that are required for compositing and correlation operations, yet correlation is still not provided in real-time. Further, the CAFDRS system provide only 24-channels of input data which significantly limits productivity and seismogram resolution.

The system of the present invention utilizes a new correlation concept which provides both compositing and correlation operations in a low-cost high-speed system. The system of the present invention may accommodate 1,024-channels of input data (which yields 40-times greater productivity than with the CAFDRS system), provides real-time correlation as rapidly as the signals are acquired (approximately 500-times greater speed than with the CAFDRS system) and at an estimated cost for the data processing subsystem of under $10,000 for 24-channels (compared to an estimated cost of $100,000 for the CAFDRS data processing subsystem). Further, the system of the present invention provides the capability for compositing-after-correlation, which is a capability that greatly enhances the productivity of exploration and the significance of the acquired data. Further, the system of the present invention significantly simplifies auxiliary systems such as the "front and" sensor system including cabling, geophones, and signal processing and the system of the present invention simplifies operation by automatically compensating for noise, gain, and filtering usually performed manually by an operator in prior art systems. Other advantages of the system of the present invention includes significant increases in productivity such as by elimination of the non-productive "listening period" and the ability to get significantly more information out of the acquired signals than possible with prior art systems.

The system of the present invention provides many important features which can be better understood from a comparison with prior art systems. Two advanced systems in the field of geophysical exploration are the GEOCOR system and the CAFDRS system, each of which includes a compositor and a correlator in a semi-portable truck system. The CAFDRS system uses general purpose computers for compositing and for correlation, yielding relatively slow operation and limited performance. The GEOCOR system uses special purpose computers for compositing and correlation and provides higher levels of performance. The system of the present invention provides significant improvements over these prior art systems, where the system of the present invention uses a special purpose compositor-correlator arrangement that provides real-time correlation and provides compositing-after-correlation capability which are not available in prior art systems. Further, the system of the present invention obtains significantly greater productivity than available with prior art systems; yielding 50-times the productivity of the CAFDRS system as a result of a larger array and other features that significantly enhance productivity. The salient features of these systems are briefly discussed below.

Array size is an important consideration, where array size determines the area covered for each shotpoint and the resolution or spacing between traces, where array size is related to productivity and precision respectively. The CAFDRS system provides a conventional 24-geophone array which is a common size for most systems. The GEOCOR system provides a 256-geophone array which is a significant improvement over other prior art systems. The system of the present invention provides a 1,024-geophone array yielding a significant improvement at lower cost.

Sample rate is an important consideration, wherein sample rate defines the resolution of a trace and defines the smallest size subsurface structure that can be identified. The CAFDRS and GEOCOR systems provide sample rates of 500 and 250 samples-per-second, which is typical for prior art geophysical systems. The system of the present invention provides greater sampling rates than possible with even the most advanced prior art systems, permitting identification of smaller subsurface structures.

Sweep period defines length of a VIBROSEIS sweep, where sweep length is usually limited to 32-seconds in prior art systems by disc storage limitations. The type of the present invention provides a unique composite-after-correlation capability which permits elimination of the sweep listening period which is required with prior art systems and permits many sweeps to be superimposed and to be continuously generated without exceeding reasonable memory limitations.

Sample quantity is related to sweep considerations, where the number of samples is defined by the length of the sweep and the sample rate of the system. Prior art systems such as the CAFDRS system have memory limitations, wherein a long sweep is incompatible with a high sample rate. The system of the present invention permits virtually unlimited sweep lengths at high sample rates, consistent with the composite-after-correlation capability of the present invention.

Correlation capability is an important requirement for geophysical exploration systems. Prior art systems provide only off-line non-real-time correlation, wherein data acquisition operations are discontinued while correlation is being performed. The ability of the system of the present invention to correlate in real-time while input information is being acquired significantly enhances throughput and productivity while providing the highest levels of data processing. Further, the system of the present invention is the only system providing compositing-after-correlation capability, which further enhances seismogram precision and flexibility by providing pilot signal flexibility and improves productivity by eliminating the need for a listening period. Further, prior art systems implement correlation with 16-bit resolution. The system of the present invention uses a correlation algorithm that provides 20-bit correlation resolution, providing an improvement in correlation resolution by a factor of 16-times.

Ensemble size is a characteristic of existing systems which defines the number of VIBROSEIS sweeps that can be composited prior to correlation. Because the system of the present invention provides compositing-after-correlation and because the system of the present invention eliminates the usual listening period between the VIBROSEIS sweeps, the limitations of discrete ensembles looses significance; where the system of the present invention has an unlimited ensemble size.

Excitation to ensonify the subsurface structures is typically generated with a VIBROSEIS using chirp sweep techniques. Dynamite blasts remain an important excitation source, but the CAFDRS and the GEOCOR systems have only VIBROSEIS capability and cannot accommodate dynamite blasts because they cannot provide composite-after-correlation capability. The system of the present invention can accommodate dynamite blasts and other non-repeatable excitation sources because of the compositing-after-correlation capability.

Relative productivity is a primary consideration for geophysical exploration because of the high expenses associated with geophysical exploration, typically $5,000 per day, and the limited opportunity for exploration due to climatic conditions such as in the Arctic and in the jungles where a considerable amount of exploration takes place. The system of the present invention provides the highest productivity available primarily because of the large array size and also because of elimination of VIBROSEIS listening periods, adaptive determination of the amount of data required rather than acquiring an excessive amount of data "just to be safe", and with the implementation of techniques that obtain more data from the acquires signals than achieved with the prior art systems.

Cost is an important consideration, where it is estimated that the system of the present invention can be sold for significantly less than one-third of the cost of systems having compositing and correlation capability such as the CAFDRS and GEOCOR systems and that the system of the present invention can be sold for significantly less than the cost of systems not having such compositing and correlation capability, yet the low cost system of the present invention may have 10-times the productivity of the most advanced prior art systems.

The improved filtering system of the present invention is being developed for Digital Nutronics Corp of Northridge Calif. under the trade names as the GEophysical EXploration (GEX) system © and the SEismic EXploration (SEX) system ©.

DESCRIPTION OF CORRELATION AND COMPOSITING

The correlation operation is a well known mathematical operation, defined by the integral equation set forth in equation (1) below.

$$\int f(t)g(t-t) \qquad \text{equation (1)}$$

This integral equation represents a continuous function such as for an analog system, but the correlation computation may be synthesized with a discontinuous or sampled function such as implemented with digital computers.

A definition of terms will now be presented to facilitate better understanding of this description. A correlation computation is based upon a form of comparison between two signals, wherein a first signal may be called an operator or a pilot signal because it represents a filter operator and a second signal may be called an input signal or a trace signal because it represents an input trace signal to be filtered or to be processed in conjunction with the operator or pilot signal. The correlator computation generates a correlation output signal which represents the degree of correlation between the trace signal and the pilot signal. Digital correlation may be performed between a sampled digital trace signal and a sampled digital pilot signal to generate a sample digital output signal. The samples may be time-domain samples representing the amplitude of the signal at discrete time intervals or may be frequency-domain samples representing the amplitude of the signal at discrete frequency intervals. The trace signal samples and the pilot signal samples may have the same intervals to provide corresponding samples between the pilot and trace signals for correlation. The sample intervals of the output signal may correspond to the sample interval of the trace signal and the pilot signal. Corresponding samples may be shown in tabular form herein for simplicity of discussion, wherein corresponding time or phase related samples may be lined-up vertically to indicate such time or phase relations.

Digital correlation computations may be grouped into two categories, time-domain correlation and frequency-domain correlation. Time-domain correlation requires significantly more computational operations than frequency-domain correlation but frequency-domain correlation involves first transforming of time-domain data into frequency-domain data in order to perform frequency-domain correlation and second transforming of correlated frequency-domain data into time-domain data for convenient evaluation by an operator.

Time-domain correlation is implemented by comparing an input or trace signal with a correlation operator or pilot signal as the pilot signal is shifted past the trace signal. For each shift position between the pilot signal and the trace signal as they are shifted therebetween, each corresponding pair of samples of the pilot signal and the trace signal for that particular shift position are compared by multiplying each corresponding pair of samples and by summing up all of the products related to that particular shift position. This sum-of-the-products number for a particular shift position defines the correlation output signal for that particular shift position. This is shown in equation (1), wherein a time-domain trace signal f(t) is compared with a time-domain pilot signal g(t) as the pilot signal is shifted past the trace signal under control of the shift operator T which displaces the correlation pilot signal g(t) by a variable T as the function g(t−T) shifts along the trace signal f(t). This correlation operation can be shown with digital samples for a simplified embodiment, as exemplified with the following description with reference to Table I.

A simplified description will now be presented with reference to Table I to exemplify time-domain correlation. A trace signal is received and sampled as a function of time, where the sequential samples are shown in Table I as samples A through H. A correlation pilot signal may be another sampled signal or may be a set of samples to synthesize a desired filter operator. The correlation pilot signal is shown in Table I as a signal represented by samples 1 through 4. The pilot signal is shown in Table I in five different positions of displacement along the trace signal, wherein the pilot signal may be considered to be shifted to the right by one shift position as the correlation computation progresses from pilot signal position I through pilot signal position V. In pilot signal position I, the four pilot signal samples 1 through 4 are compared to the corresponding four samples of the trace signal A through D by multiplying each corresponding sample and adding the products to form the first output signal sample I. For the first pilot signal position (I), pilot signal samples 1 through 4 correspond to trace signal samples A through D respectively, where multiplication of the corresponding samples (A and 1, B and 2, C and 3, and D and 4) and the summation of the products provides an output signal sample as shown by the equation I=A1+B2+C3+D4 in the right-hand portion of Table I. Shifting the pilot signal one-bit position to the right causes pilot signal samples 1 through 4 to correspond with trace signal samples B through E respectively. The output equation shown as II=B1+C2+D3+E4 represents the sum-of-the-products calculation for the second pilot signal shift position II. Similarly, again shifting the pilot signal successive one-bit positions to the right, shown as pilot signal positions III-V, cause the pilot signal samples to correspond to other groups of trace signal samples and yields the correlation-output equations shown in the right hand column of Table I.

The equations representing the correlation computation output signal samples shown in Table I defines the magnitude of the correlation computation output signal sample for the related shift position, wherein the amplitude of this output signal sample represents the degree of correlation or similarity between the trace signal and the pilot signal and represents the phase or time relationship associated with that pilot signal shift position. Magnitude of the output signal sample at each output sample point may be plotted relative to the pilot signal shift position, as shown in the bottom line of Table I; wherein the output signal samples represent the time-domain waveform samples related to the filtered or correlated trace signal. The correlation output signal is shorter than the trace signal; wherein the length of the correlation output signal in number of samples ($N_Z$) is related to the difference between the number of trace signal samples ($N_T$) and the number of pilot signal samples ($N_P$) plus one as shown in equation (2). In the above simplified example, the input signal has 8-samples and the operation signal has 4-samples, yielding a solution of 5-samples (8−4+1) as shown in Table I. In a geophysical embodiment, the trace signal may have 32,000 samples and the pilot signal may have 24,000 samples; yielding an output signal having 8,001 samples (32,000−24,000+1).

The number of computations for time-domain correlation is related to both, the number of samples in the pilot signal and the number of samples in the trace signal, wherein the number of samples in the pilot signal defines the number of multiplication and summation computations for each shift position and the number of samples in the trace signal relative to the pilot signal defines the number of shift positions. The number of multiplication and summation operations required to implement time-domain correlation may be defined with equation (3) and equation (4), respectively, wherein $N_P$ represents the number of pilot signal samples and $N_T$ represents the number of trace signal samples.

TABLE I

| TRACE    | A | B | C | D | E | F | G | H |
|----------|---|---|---|---|---|---|---|---|
| PILOT I  | 1 | 2 | 3 | 4 |   |   |   |   |
| PILOT II |   | 1 | 2 | 3 | 4 |   |   |   |
| PILOT III|   |   | 1 | 2 | 3 | 4 |   |   |
| PILOT IV |   |   |   | 1 | 2 | 3 | 4 |   |
| PILOT V  |   |   |   |   | 1 | 2 | 3 | 4 |
| OUTPUT   | I | II| III| IV| V |   |   |   |

Output column (H):
- PILOT I: $A1 + B2 + C3 + D4$
- PILOT II: $B1 + C2 + D3 + E4$
- PILOT III: $C1 + D2 + E3 + F4$
- PILOT IV: $D1 + E2 + F3 + G4$
- PILOT V: $E1 + F2 + G3 + H4$

TABLE II

| TRACE  | A  | B  | C  | D  | E  | F  | G  | H  |
|--------|----|----|----|----|----|----|----|----|
| PILOT  | 1  | 2  | 3  | 4  | 5  | −6 | 7  | 8  |
| OUTPUT | A1 | B2 | C3 | D4 | E5 | F6 | G7 | H8 |

TABLE III

| $T_L \rightarrow$ | $T_0$ | $T_1$ | $T_2$ | $T_3$ | $T_4$ | $T_5$ | $T_6$ | $T_7$ | $T_8$ | $T_9$ | $T_{10}$ | $T_{11}$ | $T_{12}$ | $T_{13}$ | $T_{14}$ | $T_{15}$ | $Z_K \downarrow$ |
|---|---|---|---|---|---|---|---|---|---|---|---|---|---|---|---|---|---|
| $P_J \rightarrow$ | $P_0$ | $P_1$ | $P_2$ | $P_3$ | — | — | — | — | — | — | — | — | — | — | — | — | $Z_0$ |
| | — | $P_0$ | $P_1$ | $P_2$ | $P_3$ | — | — | — | — | — | — | — | — | — | — | — | $Z_1$ |
| | — | — | $P_0$ | $P_1$ | $P_2$ | $P_3$ | — | — | — | — | — | — | — | — | — | — | $Z_2$ |
| | — | — | — | $P_0$ | $P_1$ | $P_2$ | $P_3$ | — | — | — | — | — | — | — | — | — | $Z_3$ |
| | — | — | — | — | $P_0$ | $P_1$ | $P_2$ | $P_3$ | — | — | — | — | — | — | — | — | $Z_4$ |
| | — | — | — | — | — | $P_0$ | $P_1$ | $P_2$ | $P_3$ | — | — | — | — | — | — | — | $Z_5$ |
| | — | — | — | — | — | — | $P_0$ | $P_1$ | $P_2$ | $P_3$ | — | — | — | — | — | — | $Z_6$ |
| | — | — | — | — | — | — | — | $P_0$ | $P_1$ | $P_2$ | $P_3$ | — | — | — | — | — | $Z_7$ |
| | — | — | — | — | — | — | — | — | $P_0$ | $P_1$ | $P_2$ | $P_3$ | — | — | — | — | $Z_8$ |
| | — | — | — | — | — | — | — | — | — | $P_0$ | $P_1$ | $P_2$ | $P_3$ | — | — | — | $Z_9$ |
| | — | — | — | — | — | — | — | — | — | — | $P_0$ | $P_1$ | $P_2$ | $P_3$ | — | — | $Z_{10}$ |
| | — | — | — | — | — | — | — | — | — | — | — | $P_0$ | $P_1$ | $P_2$ | $P_3$ | — | $Z_{11}$ |
| | — | — | — | — | — | — | — | — | — | — | — | — | $P_0$ | $P_1$ | $P_2$ | $P_3$ | $Z_{12}$ |
| $Z_K \rightarrow$ | $Z_0$ | $Z_1$ | $Z_2$ | $Z_3$ | $Z_4$ | $Z_5$ | $Z_6$ | $Z_7$ | $Z_8$ | $Z_9$ | $Z_{10}$ | $Z_{11}$ | $Z_{12}$ | | | | |
| $M_B \rightarrow$ | $M_0$ | $M_1$ | $M_2$ | $M_3$ | $M_0$ | $M_1$ | $M_2$ | $M_3$ | $M_0$ | $M_1$ | $M_2$ | $M_3$ | $M_0$ | | | | |

$Z_0 = P_0 \cdot T_0 + P_1 \cdot T_1 + P_2 \cdot T_2 + P_3 \cdot T_3$
$Z_1 = P_0 \cdot T_1 + P_1 \cdot T_2 + P_2 \cdot T_3 + P_3 \cdot T_4$
$Z_2 = P_0 \cdot T_2 + P_1 \cdot T_3 + P_2 \cdot T_4 + P_3 \cdot T_5$
$Z_3 = P_0 \cdot T_3 + P_1 \cdot T_4 + P_2 \cdot T_5 + P_3 \cdot T_6$
$Z_4 = P_0 \cdot T_4 + P_1 \cdot T_5 + P_2 \cdot T_6 + P_3 \cdot T_7$
$Z_5 = P_0 \cdot T_5 + P_1 \cdot T_6 + P_2 \cdot T_7 + P_3 \cdot T_8$
$Z_6 = P_0 \cdot T_6 + P_1 \cdot T_7 + P_2 \cdot T_8 + P_3 \cdot T_9$
$Z_7 = P_0 \cdot T_7 + P_1 \cdot T_8 + P_2 \cdot T_9 + P_3 \cdot T_{10}$
$Z_8 = P_0 \cdot T_8 + P_1 \cdot T_9 + P_2 \cdot T_{10} + P_3 \cdot T_{11}$
$Z_9 = P_0 \cdot T_9 + P_1 \cdot T_{10} + P_2 \cdot T_{11} + P_3 \cdot T_{12}$
$Z_{10} = P_0 \cdot T_{10} + P_1 \cdot T_{11} + P_2 \cdot T_{12} + P_3 \cdot T_{13}$
$Z_{11} = P_0 \cdot T_{11} + P_1 \cdot T_{12} + P_2 \cdot T_{13} + P_3 \cdot T_{14}$
$Z_{12} = P_0 \cdot T_{12} + P_1 \cdot T_{13} + P_2 \cdot T_{14} + P_3 \cdot T_{15}$

TABLE V $Z_0 = T_0 \cdot P_0 + T_1 \cdot P_1 + T_2 \cdot P_2 + T_3 \cdot P_3$
$Z_1 = \phantom{T_0 \cdot P_0 +} T_1 \cdot P_0 + T_2 \cdot P_1 + T_3 \cdot P_2 + T_4 \cdot P_3$
$Z_2 = \phantom{T_0 \cdot P_0 + T_1 \cdot P_0 +} T_2 \cdot P_0 + T_3 \cdot P_1 + T_4 \cdot P_2 + T_5 \cdot P_3$
$Z_3 = \phantom{T_0 \cdot P_0 + T_1 \cdot P_0 + T_2 \cdot P_0 +} T_3 \cdot P_0 + T_4 \cdot P_1 + T_5 \cdot P_2 + \ldots$
$Z_4 = \phantom{T_0 \cdot P_0 + T_1 \cdot P_0 + T_2 \cdot P_0 + T_3 \cdot P_0 +} T_4 \cdot P_0 + T_5 \cdot P_1 + \ldots$
$Z_5 = \phantom{T_0 \cdot P_0 + T_1 \cdot P_0 + T_2 \cdot P_0 + T_3 \cdot P_0 + T_4 \cdot P_0 +} T_5 \cdot P_0 + \ldots$ Output Samples $= (N_T - N_P + 1)$  equation (2)

Products $= N_P(N_t - N_P + 1)$  equation (3)

Sums $= (N_P - 1)(N_T - N_P + 1)$  equation (4)

TABLE VI

| TIME | SAMPLE | TRACE 1 | TRACE 2 | TRACE 3 |
|------|--------|---------|---------|---------|
| TA   | A      | 1A      | 2A      | 3A      |
| TB   | B      | 1B      | 2B      | 3B      |
| TC   | C      | 1C      | 2C      | 3C      |
| TD   | D      | 1D      | 2D      | 3D      |

TABLE VII

| A → | A1 | A2 | A3 | A4 | A5 | A6 | A7 | A8 |
| --- | --- | --- | --- | --- | --- | --- | --- | --- |
| B → | B1 | B2 | B3 | B4 | B5 | B6 | B7 | B8 |
| C → | C1 | C2 | C3 | C4 | C5 | C6 | C7 | C8 |
| D → | D1 | D2 | D3 | D4 | D5 | D6 | D7 | D8 |
| E → | E1 | E2 | E3 | E4 | E5 | E6 | E7 | E8 |
| X → | X1 | X2 | X3 | X4 | X5 | X6 | X7 | X8 |

TABLE VIII $$X1 = A1 + B1 + C1 + D1 + E1$$
$$X2 = A2 + B2 + C2 + D2 + E2$$
$$X3 = A3 + B3 + C3 + D3 + E3$$
$$X4 = A4 + B4 + C4 + D4 + E4$$
$$X5 = A5 + B5 + C5 + D5 + E5$$
$$X6 = A6 + B6 + C6 + D6 + E6$$
$$X7 = A7 + B7 + C7 + D7 + E7$$
$$X8 = A8 + B8 + C8 + D8 + E8$$

Frequency-domain correlation will now be described with reference to Table II. A frequency-domain trace signal is shown with samples A-H, wherein a frequency-domain signal may be provided by first sampling a time-domain signal and then converting the sampled time-domain signal to a frequency-domain signal with well known transforms such as a Discrete Fourier transform (DFT) or a Fast Fourier Transform (FFT) computation. Samples A-H represent the frequency related spectral lines, wherein sample A may represent amplitude of a lowest frequency spectral line and sample H may represent amplitude of a highest frequency spectral line. A frequency-domain correlation pilot signal is shown as samples 1-8 which correspond to the frequency related samples of the trace signal samples A-H respectively. The frequency-domain trace signal samples and pilot signal samples represent plots of magnitude as a function of frequency, which may be considered to be a spectrum plot or a frequency-domain representation of a sampled signal.

Correlation in the frequency-domain is implemented simply by multiplying each corresponding sample of the trace signal and the pilot signal to generate the related sample of the correlation output signal in the frequency-domain, as shown by the output signal in Table II. For example, multiplication of trace signal sample A and pilot signal sample 1 for the lowest frequency sample of the spectrum yields a correlation output signal sample A1 having an amplitude related to the product A1 for the lowest frequency output signal sample. Similarly, multiplication of the trace signal sample H and the pilot signal sample 8 for for the highest frequency sample of the spectrum yields a correlation output signal sample H8 having an amplitude related to the product H8 for the highest frequency output signal sample. Similarly, all intermediate frequency output signal samples may be computed as shown in the bottom row of Table II. Therefore, the computations for frequency-domain correlation are merely a quantity of multiplication computations that are related to the frequency resolution or, alternatively, the number of spectrum samples in the frequency-domain.

The prior art has considered time-domain correlation to be impractical using prior art techniques, as will be illustrated below. In a geophysical exploration application, the trace signal may have 32,000-samples and the pilot signal may have 24,000-samples, therefore requiring approximately 192-million multiplication and 192-million addition operations per channel to implement time-domain correlation, as calculated from equations (3) and (4). Assuming that a conventional computer can perform a multiplication computation in 15-microseconds and an addition computation in 2-microseconds, approximately one-hour of computational time may be required per channel of correlation computations. Further, assuming that it is desired to have 1,000-channels per system, approximately 1,000-hours of computational time may be required to implement the correlation computations; which is approximately 100,000-times slower than real-time. Therefor, real-time time-domain correlation has not been used in prior art systems which are implemented with conventional digital data processing techniques.

Conventional general purposes processors and special purpose processors cannot achieve sufficient computational speed required for even a single trace signal based upon the above geophysical example, where it is not conceivable that conventional techniques could be utilized to provide such computations for a minimum requirement of 24-trace and certainly not for an ultimate requirement of 1,000-traces.

One feature of the present invention provides a real-time time-domain correlator that can accommodate the geophysical application described in the above example, including a trace signal having 32,000-samples, a pilot signal having 24,000-samples, and 1,000-channels.

In accordance with the present invention, an unique correlator arrangement is provided to permit high speed computations, such as 25-million multiplication operations per second with a low cost correlator embodiment. Further, a low cost multi-processor arrangement is provided using a plurality of low cost correlators. Each of the plurality of low cost correlators may be dedicated to a part of a channel, to a single channel, or to a plurality of channels as required to meet the speed requirements of the particular system.

One embodiment of the correlator of the present invention can be better understood with a simplified example to illustrate operation. This example is exemplary of one algorithm for implementing the present invention but has been simplified to more clearly illustrate the concepts involved.

An array of numbers is shown in Table III, which will be used to schematically illustrate the algorithm, Sixteen trace signal samples $T_0$-$T_{15}$ are shown across the top of Table III. Trace signal terminology shell herein be used to indicate an input waveform in the temporal-domain or time-domain such as a continuous signal from a geophone sensor. Samples of the trace signal are designated with sequential time related subscripts such as $T_0$-$T_{15}$. For this example, samples taken at increasing time intervals are labeled with sequentially increasing numbers, wherein $T_0$ is a first temporal-domain sample, $T_1$ is the next subsequent temporal-domain sample, $T_2$ is the next subsequent temporal-domain sample, etc. Therefore, the trace samples shown in Table III represent samples taken at increasing times as the trace signal progresses towards the right.

A pilot signal is represented in Table III as samples $P_0$-$P_3$, wherein the pilot signal samples are intended to represent samples of a correlation operator or pilot signal to be correlated with a trace signal T. As discussed for the trace signal above, pilot signal samples $P_0$-$P_3$ represent sequential samples taken as a function of increasing time as the subscript designation of the sample increases, as shown by the sequence of pilot signal sample subscripts increasing as the pilot signal progresses to the right.

One correlation algorithm of the present invention is based upon comparing the pilot signal samples with a corresponding set of trace signal samples as the pilot signal samples are shifted along the trace signal samples toward the right side of Table III. For example, the four pilot samples $P_0$-$P_3$ of this example are compared with the first four trace samples $T_0$-$T_3$ to generate the first correlator output sample $Z_0$, compared with the next four trace samples $T_1$-$T_4$ to generate the next correlator output signal $Z_1$, etc to progressively compare the pilot signal samples with all sequential sets of trace signal samples to generate the $Z_0$-$Z_{12}$ correlation output samples. In one embodiment, the pilot signal examples may be shifted one-sample to the right after each sequential set of comparisons to provide the next set of comparisons to sequence. This shifting to the right of the pilot signal is shown in Table III, where each shift and comparison operation is shown one line nearer the bottom of Table III as the comparison computation progresses toward the right of the trace signal $T_0$-$T_{15}$ or as the comparison computation progresses forward with increasing time. Therefore, a time sequence of correlated output signals samples $Z_0$-$Z_{12}$ may be generated as a function of increasing time as the pilot signal comparison computation progress towards the right portion of the trace indicative of increasing time.

The comparison computations shown as correlated output signal samples $Z_0$-$Z_{12}$ are evaluated in Table IV, wherein the schematic notation shown in Table III is set into equation form. The trace and pilot signal samples that are lined-up or correspond to each other as shown in Table III are multiplied together to provide products, then all of these products for that particular correlated output sample are summed together to generate the correlated output sample $Z_K$. For example, the first correlated output term $Z_0$ shows correspondence of trace and pilot samples in Table III by the pilot samples being directly below the corresponding trace samples shown as $P_0$ and $T_0$, $P_1$ and $T_1$, $P_2$ and $T_2$, and $P_3$ and $T_3$. The corresponding samples are multiplied together to generate products and the products are summed together as shown in Table IV to generate the $Z_0$ correlated output sample. For example, the $P_0$ sample and the corresponding $T_0$ sample are multiplied together to generate the product term $P_0 \cdot T_0$ and, similarly, the other three corresponding samples are multiplied together to generate the product terms $P_1 \cdot T_1$, $P_2 \cdot T_2$, and $P_3 \cdot T_3$. The four product terms are then added together to provide the correlated output sample $Z_0$. Similarly, the other correlated output samples $Z_1$-$Z_{12}$ are calculated by first multiplying the corresponding shifted pilot and trace signal samples shown having vertical relationships in the same column of Table III and then by summing the product terms related to the particular output sample. The difference between each output sample is primarily that the pilot signal has been shifted right relative to the trace signal or, alternately, the trace signal could be shifted left relative to the pilot signal to progressively change the corresponding sample relationships and thereby to progressively change the phase between the pilot signal and selected portions of the trace signal.

Each horizontal row of Table III corresponds to a different relative location of the pilot signal samples and the trace signal samples, where the changes in this correspondence progresses towards the right-hand portion of Table III with increasing time as the comparison of the pilot signal progresses towards increasing time related samples of the trace signal. Each horizontal row of Table III corresponds to a different correlation comparison or output sample, being identified with correlated output samples $Z_0$-$Z_{12}$. The output samples $Z_0$-$Z_{12}$ are shown progressing vertically downward towards the bottom of Table III to illustrate correspondence with the pilot signal shift positions progressing vertically downward and the output samples $Z_0$-$Z_{12}$ are also shown progressing horizontally at the bottom of Table III to illustrate correspondence with the pilot signal as it is shifted horizontally to the right of Table III. Therefore, the notation in Table III illustrates a time related schematic notation as the pilot signal is compared with the trace signal progressing to the right of Table III. A time related computational operation is provided by shifting the pilot signal and trace signal relative to each other as a function of progressing vertically downward to define output samples related to the progression of pilot signal comparisons as the pilot signal samples are progressively shifted along the trace signal samples and therefore along the output samples $Z_0$-$Z_{12}$ which are related to progressively increasing time-related correlations.

The example discussed with reference to Table III illustrates a pilot signal being shifted relative to a trace signal to provide different shift orientations therebetween. This shifting notation is used for simplicity of discussion and is illustrative of one implementation. It is herein intended that this shifting notation exemplify various comparison arrangements including shifting of a pilot signal relative to a trace signal, shifting of a trace signal relative to a pilot signal, shifting in a direction of increasing time, shifting in a direction of decreasing time, and other changes in relative positions between a pilot signal and a trace signal. In yet another embodiment, shifting operations may be implicit in accessing of parameters from a random access memory rather than from a shifting type memory, wherein a sequence of accesses may be achieved with a counter being a sequence of accesses may be achieved with a counter being incremented through a sequence of addresses. Still further, comparisons need not be sequential in nature, wherein various correlation output samples may be calculated in a non-sequential form, such as calculating $Z_6$, $Z_3$, $Z_{10}$, and other samples in either a random form or a non-sequential form. Still further as described in an alternate embodiment with reference to FIGS. 5 and 6 hereinafter, calculation of correlation output samples may be provided in a form that partially calculates product terms for each of the output samples rather than calculating a complete output sample at a particular time. The calculation of product terms associated with each trace sample as that trace sample becomes available has particular advantages for real-time correlation and exemplifies an important feature of the present invention. For example, calculation of all product terms for the $T_3$ trace sample when it becomes available permits the computation to progress in real-time without buffering and without storing trace samples will the whole trace signal has been sampled, wherein the product computations for the $T_3$ trace sample may included generating the $P_3$ and $T_3$ product and adding it to the $Z_0$ output sample, calculating the $P_2$ and $T_3$ product and adding it to the $Z_1$ output sample, calculating the $P_1$ and $T_3$ product and adding it to the $Z_2$ output sample, and calculating the $P_0$ and $T_3$ product and adding it to the $Z_3$ output sample.

In a non-real-time embodiment, the complete correlated output samples may be calculated for each shift position of a pilot signal along a trace signal. The product terms for each output sample may be spread over a period of time, where a four-sample pilot signal may be spread over four trace signal samples which are acquired over four-sample intervals. Therefore, a time delay may be necessary until four trace samples are accumulated before a particular correlated output sample can be completely calculated. For example, the $Z_0$ sample cannot be completely calculated until the $T_0$–$T_3$ trace samples have been acquired and processed.

The system of the present invention provides real-time correlation, where a trace signal may be correlated with a pilot signal in real-time as the trace samples become available. Various advantages accrue from computing output products in real-time as the trace samples become available. These advantages include (1) elimination or reduction of input buffer memory which may be required for a non-real-time algorithm to store trace samples until a sufficient number of trace samples have been accumulated to generate a complete correlated output sample $Z_K$ and (2) computing "on-the-fly" in real-time as the signals become available in contrast to a non-real-time algorithm which accumulates trace samples for a period of time for computing an output sample only after complete information has been accumulated. Still other advantages accrue that will become obvious from the descriptions hereinafter.

An algorithm will now be presented to exemplify the real-time correlation feature of the present invention. Pilot signal symmetry is shown in Table IV, which means that the first column is related to the $P_0$ sample products, the second column is related to the $P_1$ sample products, etc; wherein the shifting of the pilot signal along the trace signal to generate the sequential output samples $Z_K$ is illustrated by the increasing time-related notation of the trace samples for each of the pilot samples. For example, the first column of Table IV shows the $P_0$ sample multiplied by the $T_0$ sample for the $Z_0$ output sample, by the $T_1$ sample for the $Z_1$ output sample, by the $T_2$ sample for the $Z_2$ output sample, etc. This is indicative of the shifting of the $P_0$ pilot sample across the trace signal to generate the $P_0$ product term for each of the output samples. Alternatively, Table IV may be restructured for columns with the same trace sample, such as in Table V wherein the first column is related to products having a $T_1$ sample term, the second column is related to products having a $T_1$ sample term, etc. Therefore, when the $T_0$ trace signal is acquired, it can be multiplied by the $P_0$ pilot signal sample and added to the $Z_0$ output sample. Then when the $T_1$ trace signal sample is acquired, it can be multiplied by the $P_1$ pilot signal sample and added to the $Z_0$ output sample (which is the $T_0 \cdot P_0$ product term) to progressively build-up the $Z_0$ output sample. Further, the $T_1$ trace signal sample can be multiplied by the $Z_0$ pilot signal sample and added to the $Z_1$ output sample to build-up the $Z_1$ output sample. Further, as the $T_2$·$T_3$, and subsequent trace signal samples are acquired; the product computations associated with each received trace signal sample can be computed and each product term can be added to the related $Z_K$ output sample that is being built-up in the corresponding $Z_K$ memory location as the trace samples are received. Therefore, a correlation computation may be implemented that generates sequential product terms as the related trace signal samples are received to progressively build up the $Z_K$ output samples, thereby eliminating the prior art requirement to store input trace signal samples until a complete set of trace signal samples is acquired. Effectively, this real-time algorithm generates sub-computational solutions for each $Z_K$ output sample as the computation progresses in real-time in contrast to the prior art approach of storing all trace samples, then completely calculating a particular Z output sample and then progressing to the calculation of the next complete Z output sample.

An orderly structure is shown in Table V, wherein each column has the same trace signal samples related to a constant sample time interval. Therefore, as time progresses toward the right of Table V, the trace signal may be sampled and all computations related to a particular trace signal sample may be performed without dependence on any other trace signal samples.

The maximum number of products that must be generated for each input trace sample is equal to the number of samples in the pilot signal, which is four in the present example. Further, the first trace samples and the last trace samples do not required this maximum number of product terms, as shown in Table III. This is further shown in Table V, wherein the $T_0$ trace sample need only be multiplied by the $P_0$ pilot sample, the $T_1$ trace sample need only be multiplied by the $P_1$ and $P_2$ pilot examples, etc. Therefore, it can be seen that extra computational time may be available at the start of a trace and at the completion of a trace for a real-time correlation algorithm, as will be discussed in detail hereinafter with reference to FIGS. 5 and 6.

In summary, the real-time correlator algorithm of the present invention defined an output signal sample as the sum-of-the-products of a pilot sample and a trace sample for a fixed shift position or phase relationship therebetween. Therefore, each point is defined by a sample of a pilot signal multiplied by a corresponding sample of a trace signal and with the corresponding products summed together. For an "on-the-fly" algorithm, all trace signal samples may not be available simultaneously and therefore partial products may be built-up. This is accomplished by taking each trace signal sample in turn as it becomes available and comparing that trace signal sample with a plurality of samples of the pilot signal, adding each product to a different output signal sample. For example, a trace signal sample may be multiplied by a first pilot signal sample and added to a first output signal sample, multiplied by a second pilot signal sample and added to a second output signal sample multiplied by a third pilot signal sample and added to a third output signal sample, etc.

A further feature of the present invention provides for compositing-after-correlation, where it is desired to continue to buildup the output terms over many traces. Therefore, the start of a trace would not necessarily clear the output sample memory but may add the correlated trace product computations from the new trace to the corresponding product computations of the last prior trace.

The real-time time-domain correlation algorithm and arrangement of the present invention is significantly different from the prior art non-real-time frequency-domain correlation arrangements. In prior art systems, correlation of a multi-trace set of data is performed by processing the data for each trace signal separate and independent of processing of the data for the other traces. In one embodiment implemented in the CAFDRS system, 24-input channels provide 24-individual trace signals which are processed with a compositor to provide 24-individual composited trace signals. A non-real-time frequency-domain correlator is implemented with a General Automation SPC-16 minicomputer, wherein the minicomputer accesses one composited trace signal from the stored composited data and performs a correlation computation between the signal trace signal and a pilot signal. Each of the 24-traces are correlated independent of all other traces. Therefore, the correlator is merely a single trace correlator that correlates each of a plurality of traces in sequence with the pilot signal. The prior art correlator architecture does not consider that a plurality of traces are provided from a plurality of channels, where the correlator is implemented as merely a single channel correlator that is time-shared between a plurality of channels.

In accordance with a feature of the present invention, a multichannel correlator arrangement is provided wherein the correlator algorithm and implementation considers the number of channels and processes information from a plurality of channels in an interleaved or overlapping form. This multichannel correlator arrangement is a unique feature of the real-time time-domain correlator of the present invention, wherein prior art non-real-time correlators provide for buffering of input trace signals such as with disc memories where prior art correlators partitions and structure correlation computations independent of real-time considerations. For example, the prior art non-real-time correlators process all samples of a first trace signal before processing any samples associated with another trace signal, wherein the samples at the end of a first trace signals that had been acquired after the samples at the beginning of the other traces may be processed first. Therefore, in prior art systems all samples in a single trace may be processed before earlier received samples at the beginning of other traces are processed where prior art correlators correlate data in a form that is not only not in real-time but is not even time sequential for the relative times of arrivals of the samples.

Spacial-domain and temporal-domain signals will now be illustrated with a brief example with reference to Table VI. Time samples A–D may be considered to be temporal-domain samples wherein samples A–D are taken at different times and therefore have a variable temporal-domain characteristic. Samples of a plurality of trace signals such as trace signals 1–3 may be made at a particular sample interval such as a sample interval A. Samples 1A–3A taken at sample interval A from trace signals 1–3 respectively have a constant temporal-domain characteristic, wherein the time of each sample is substantially the same, and have a variable spacial-domain characteristic, wherein each sample is taken from a different trace signal generated by a different transducer of an array of transducers across the array in the spacial-domain. Similarly, samples 1A–1D may be taken from a single trace at a successive sample intervals thereby having a constant spacial-domain characteristic related to a single trace signal and having a variable temporal-domain characteristic being the sequential samples at increasing sample times TA–TD.

For simplicity herein, any references to temporal-domain samples are intended to mean samples having a variable temporal-domain characteristic and having a constant spacial-domain characteristic such as trace signal 1 samples 1A–1D; trace signal 2 samples 2A–2D; or trace signal samples 3 samples 3A–3D. Similarly, any reference to spacial-domain samples are intended to mean samples having a constant temporal-domain characteristic and having a variable spacial-domain characteristic such as time TA samples 1A–3A; time TB samples 1B–3B; time TC samples 1C–3C, or time TD samples 1D–3D.

Spacial-domain and temporal-domain samples are herein intended to mean samples taken with both a variable temporal-domain characteristic and a variable spacial-domain characteristic such as samples taken across an array of trace signals at sequential sample times exemplified by samples 1A, 2B, and 3C or samples 1B, 2C, and 3D.

Further, a spacial-frequency is herein intended to mean the frequency across the array such as the wave pattern sensed by an array of transducers for a particular sample interval and a temporal-frequency is herein to mean the frequency as a function of time such as sampled with a plurality of sample intervals for a particular trace signal.

In accordance with another feature of the present invention, the real-time time-domain correlator of the present invention provides correlation computations for the samples that is consistent with the time-of-arrival or time-of-acquisition of the samples. Therefore,the earlier samples associated with each of a plurality of trace signals may be processed before the later arrivals associated with the plurality of any of the trace signals. Effectively, correlation is performed across any array in the spacial-domain based upon constant time-of-arrival or constant temporal-domain samples in contrast to the prior art arrangements of correlating along a trace with constant spacial-domain trace samples and varying time-of-arrival or temporal-domain samples. Another way of defining this feature of the present invention is to consider the correlation algorithm of the present invention as providing correlation in the spacial-domain across a plurality of channels for a particular time-interval in contrast with the prior art correlator arrangements which provide correlation in the temporal-domain or time-domain along a trace with varying time-of-arrival but constant channel or spacial-domain samples. This consideration may be better understood with a simplified example shown in Table IV. Three traces are shown as traces 1 through 3, with each trace having four samples A through D. For simplicity, it is herein assumed that all corresponding time samples are sampled simultaneously for each of the three channels. Therefore,at time T, sample 1A is taken from channel 1, sample 2 A is taken from channel 2, and sample 3A is taken from channel 3. In prior art systems, each trace is correlated effectively simultaneously and independent of all other traces. For example, prior art correlators accept samples 1A through 1D of trace 1 and correlate all of these samples in trace 1 independent of other traces. In prior art systems, after completion of correlation of trace 1, trace 2 will be correlated and finally trace 3 will be correlated in sequence. Each trace signal corresponds to a channel in the spacial-domain, where the horizontal dimension set forth in Table VI may be considered to be taken in the spacial-domain at constant time and each of the samples A through D may be considered to be taken in the temporal-domain with increasing time. In accordance with one feature of the present invention, a correlator is provided for real-time time-domain correlation across the temporal-dimension or in the temporal-domain of the array, wherein correlation is provided for all samples taken at time TA; being samples 1A, 2A, and 3A; across the array of traces during substantially constant time. In one embodiment of the present invention, these samples are correlated as they are received in time; where the prior art requirement, to buffer all of the information until a complete trace is accumulated, is eliminated with the system of the present invention, thereby reducing the amount of memory required and further enhancing the real-time nature of the correlation computation.

A distinction between prior art correlation algorithms and the real-time time-domain algorithm of the present invention discussed above will be further exemplified relative to Table IV. Trace signal samples are typically taken at substantially fixed time intervals across an array, wherein the samples across the array have a constant temporal-domain or time-domain parameter and have a variable spacial-domain parameter from trace-to-trace across the array. For example, sample A represents a substantially constant time period, wherein each of the traces; trace-1, trace-2, and trace-3; are sampled at sample time A to provide constant time samples 1A-3A across the array. The real-time time-domain algorithm of the present invention provides for processing these constant temporal-domain, variable spacial-domain samples and to provide correlation computations thereon. In prior art systems, all of the samples for all of the traces are acquired, buffered, and composited prior to correlation where samples 1A-3A, 1B-3B, etc are acquired and buffered prior to correlation. After all samples are taken in the temporal-domain as shown in Table VI as a row; prior art systems correlate each individual trace in the spacial-domain as shown in Table VI as a column, wherein each trace is correlated independent of all other traces. For example, prior art systems would correlate trace 1 comprising samples 1A-1D, then store the correlated output samples of trace 1; then correlate trace 2 comprising samples 2A-2D, then store the correlated output samples of trace 2; wherein correlation would progress on a trace-by-trace basis from channel-to-channel in the spacial-domain.

The spacial-domain may be considered to be the domain having a spacial variable, wherein the plurality of trace channels may be related to a distribution of transducers along an array in the spacial-domain and each trace from a particular transducer is related to a constant spacial-domain parameter with samples taken at a variable time in the temporal-domain. Similarly, samples taken across an array at particular time intervals may be considered to have a constant temporal-domain parameter for each set of constant time samples and a variable spacial-domain parameter.

One feature of the present invention provides a significantly different correlation algorithm for real-time operation, wherein correlation is provided as the samples are received, wherein each correlation operation is related to a constant time-domain parameter and a variable spacial-domain parameter across the array. For example, when sample A is acquired across the array (samples 1A-3A), the samples acquired for a particular sample time interval may all be correlated as the samples are received. At subsequent sample times such as sample B time, another set of constant temporal-domain, variable spacial-domain samples (samples 1B-3B) are acquired and correlated. This real-time correlation algorithm of the present invention progressively builds up the correlation output signal as the samples are acquired, thereby mitigating the need to buffer large amounts of input information until a complete set of trace samples are acquired as with prior art systems. Further, with the compositing-after-correlation feature of the present invention, the need to accumulate the samples for compositing-before-correlation is eliminated thereby further enhancing the feasibility of real-time compositing-after-correlation.

In summary, one real-time correlation feature of the present invention can be contrasted to prior art correlation algorithms with reference to Table VI; wherein the real-time correlation algorithm of the present invention provides successive correlation computations across the rows of Table VI for each sample before progressing to subsequent samples arriving at subsequent time-intervals on a sample-by-sample progression basis as contrasted to prior art correlation algorithms which provide correlation along the columns of Table VI for each trace before progressing to the correlation of the next trace on a trace-by-trace progression basis. This real-time algorithm of the present invention will be described hereinafter relative to FIG. 6E for a multi-processor arrangement such as having an individual correlation processor for each channel, wherein each sample for each channel may be processed as it is received simultaneously or in parallel by each of the multi-processor channel arrangements. An alternate embodiment of this feature of the present invention described with reference to FIG. 5A hereinafter may provide a processor for a plurality of channels being time-shared between the plurality of channels such as by sequentially processing each of the received samples for a particular sample interval having a constant temporal-domain parameter as described above; wherein the sequential processing across the array such as across a row associated with Table VI before sequentially progressing to other subsequent samples exemplifies this real-time correlation algorithm in accordance with the instant real-time correlation algorithm feature of the present invention.

For simplicity of discussion, signals samples are shown lined up in columns and rows in the tablets for exemplifying the features of the present invention, where this row and column configuration is provided for simplicity and is not intended to be a limitation on the present invention. For example, sampling of all traces for a particular sample interval is shown associated with each row of Table VI wherein all samples in a particular row such as samples 1A-3A correspond to a particular sample time.

In accordance with another feature of the present invention, the samples need not be taken at a constant sample time but the samples may be taken sequentially such as by using a sequential multiplexer arrangement; wherein the sampling process may be sequential and may be either continuous or discontinuous with time intervals between samples. As an example of this feature of the present invention, the samples shown in Table VI may be taken in the sequence of samples 1A, 2A, 3A, 1B, 2B, 3B, 1C, etc in a sequential fashion for scanning across the traces in the spacial-domain and then repeating the scanning across the traces for subsequent sample times. This embodiment may be implemented with all samples having constant sample intervals and alternately may be implemented with differences between the sample intervals. For example, samples 1A-3A may be taken rapidly for a substantially constant time of sampling for all traces at sample time A (samples 1A-3A), followed by a longer time delay before sampling the traces at sample time B, followed by relatively rapid sampling of all traces at sample time B (samples 1B–3B), etc. Sampling techniques are well known in the art such as in data acquisition systems and telemetry systems, wherein sampling intervals may be controlled by clock pulse rates and sampled signals may be selected with an address counter being incremented with controlling clock pulses to sequence between addresses of a plurality of channels; wherein a particular channel may be selected with a multiplexer operating in response to an address counter.

The operation of compositing will now be described. Compositing is used in the prior art to accumulate input signals for improvement of signal-to-noise (S/N) ratio and for data compression to reduce data rates required for recording or post processing. Compositing will now be described with reference to Tables VII and VIII.

A schematic notation will be described with reference to Table VII to illustrate compositing. Six signal rows are shown labeled signals A through E and X. Signal A is received, sampled, and digitized to provide a sequence of samples shown as samples A1–A8 having substantially constant time periods therebetween. Similarly, waveforms B through E have sequential samples $B_1$–$B_8$ through $E_1$–$E_8$ respectively. Waveform X illustratives a composited waveform having composited samples X1–X8 which are calculated from the corresponding samples in waveforms A–E as described with the equations shown in Table VIII. The first composited sample X1 in composited waveform X is calculated by adding up all of the corresponding samples of the received signals, wherein signals A–E have corresponding first samples A1–E1 and wherein corresponding first samples A1–E1 are summed together to generate the first composited sample X1. Similarly, corresponding second samples A2–E2 are summed together to generate the second composited sample X2, corresponding third samples A3–E3 are summed together to generate the third composited sample X3, etc.

In a geophysical embodiment, a VIBROSEIS may be used to ensonify subsurface structures and a return signal A is sampled to provide sequential time related samples A1–A8. Next, the VIBROSEIS may be used to again ensonify subsurface structures and the return signal B is sampled to provide sequential time related samples $B_1$–$B_8$ corresponding as nearly as possible to samples A1–A8 respectively of waveform A. This process may be repeated many times, wherein 16-times is a typical quantity thereby generating 16-signals that are sampled and wherein a composited signal is generated having the sum of all corresponding samples. Therefore, a composited signal X is generated by compositing corresponding samples of a plurality of waveform A–E to generate the composited samples X1–X8 for the composited waveform X.

Compositors are well known in the art such as provided by Scientific Data Systems of Santa Monica, Calif. as Trace compositor Model 1011 described in Technical Manual SDS 980262A dated Nov. 1967 and incorporated herein by reference and such as the compositor in the CAFDRS system manufactured by United Geophysical of Pasadena, Calif.

Prior art compositors have many limitations and problems. For example, the ensonifying signals such as the VIBROSEIS must be precisely synchronized with the receiving of the reflected signals to insure that the sequential trace signals line-up therebetween. Further, it is necessary that ensonifying signals be identical to insure that corresponding samples composited together are related to the same sweep signal. Still further, the operation of compositing precludes the use of non-repeatable ensonifying sources such as explosives because of the above requirement for repeatability between ensonifying signals. Yet further, the operation of compositing integrates, averages, smears, and otherwise obscures the specific information from each signal.

As will be discussed in detail below, an arrangement that correlates trace signals without compositing obtains substantial advantages such as precluding the need to have precisely repeatable ensonifying signals, permitting use of non-repeatable ensonifying sources such as dynamite, eliminating a large memory requirement for storing trace signals, and eliminating a large computational requirement associated with storing composited signals and computing the composited signals respectively. Further, a compositor arrangement requires a listening period, as will be described hereinafter, which may be eliminated with the system of the present invention to enhance productivity.

A correlator may be considered to a device for data compression, wherein large amounts of data may be processed to compress the data into a reduced form. For example, A geophysical embodiment may have 1,000-channels and 32,000-samples per channel based upon a sample rate of 1,000-samples per second and a 12-second trace. Therefore, a total of approximately 32-million (1,000-channels times 32,000-samples per channel) would have to be buffered or prior art geophysical correlator arrangements. Further, assuming a 24,000-sample pilot signal, total of 8,0001 output signal samples would be generated per channel as calculated with equation (2) (32,000-trace samples minus 24,000-operator samples plus 1) providing data compression that reduces a total of 32-million input signal samples (1,000-channels) to only 8-million output signal samples (1,000-channels) for data compression by a factor of 4. Further, the use of compositing to further compress the input information, such as with compositing-before-correlation or by compositing-after-correlation in accordance with the present invention, provides additional data compression by a factor related to the number of composites. For example, a system providing sixteen composites provides an additional data compression factor of 16 by compositing 16-ensembles together to reduce the number of individual samples that must be stored and processed. Therefore, data compression for the above example provides a data compression factor of 4 for correlation and a data compression factor of 16 for compositing, yielding data compression by a factor of 64. Therefore, the quantity of output signal samples may be only about 2% of the total number of trace signal samples.

Data compression is further improved with the system of the present invention by eliminating the need to buffer composited information prior to correlation. In the above example, 32-million composited samples would be buffered or stored prior to correlation and an additional 8-million samples would be buffered or stored after correlation, yielding a total storage requirement of 40-million samples. In accordance with the compositing-after-correlation feature of the present invention; the need to store the composited information before correlation is eliminated where the above requirement for storing 40-million samples (32-million composited samples and 8-million correlated samples) is reduced to a requirement for storing only the 8-million correlated signals for an improvement of 5-times (8-million samples compared to 40-million samples). This advantage is further enhanced by the consideration that this large number of samples must be continually accessed for compositing and correlation updates, where a reduction in the number of samples by a factor of 5 may also provide a reduction in memory across data rates.

RESOLUTION CONSIDERATIONS

It is generally considered that the accuracy of a digital computational is limited by the least accurate computational parameter. Therefore, prior art systems are implemented under the incorrect assumption that high resolution input data and high resolution computations are necessary to obtain high accuracy output data for a correlation computation. For example, if a 10-bit resolution digital number is added to a 15-bit resolution digital number, the sum will be a 15-bit resolution digital number having 10-bits of significant resolution which is the 10-most-significant-bits (MSBs) and 5-bits of nonsignificant resolution which is the 5-least-significant-bits (LSBs). Further, if a 10-bit resolution digital number is multiplied by a 15-bit resolution digital number, the product will be a 25-bit resolution digital number with 10-MSBs of significant resolution and 15-LSBs of nonsignificant resolution. Therefore, the prior art has considered that it is necessary to provide high significance resolution input data and high significance resolution computations to obtain high significance resolution output data. For example, prior art correlators provide 16-bits of significant digital resolution for input words and 16-bits of significant computational resolution to attempt to achieve up to 16-bits digital output accuracy. This prior art rationale has necessitated implementation of complex whole-word data processors in prior art systems. For simplicity of discussion, the term "resolution" is herein intended to mean "significant resolution"; wherein the distinction of significant resolution over non-significant resolution will be achieved by referring to nonsignificant resolution by the full terminology "non-significant resolution". Although many non-significant bits of resolution may be provided which do not contribute to the effective resolution or accuracy of the system such as by adding non-significant zero LSBs; the terms accuracy or precision is therefore intended to be related to the significant resolution of a number and not to the nonsignificant resolution of the number.

One feature of the present invention provides high resolution output data in response to low resolution input data and low resolution computations for a digital filter processor. Therefore, in accordance with one feature of the present invention, a digital filter exemplified with a correlator arrangement is provided for receiving input data having a first resolution characteristic and for generating output data having a second resolution characteristic; wherein the output data has a greater, or higher, or better resolution characteristic than the input data. In effect, output data can be provided having a resolution characteristic that is relatively independent of the resolution characteristic of the input data. In one embodiment, in put data having single-bit resolution is processed with a single-bit correlator arrangement in accordance with the present invention for providing output data having 20bit resolution. The single-bit input resolution may not significantly limit the resolution of the output data, where the resolution of the output data is determined more by the number of correlation samples than by the input signal resolution and where even 20-bit output resolution is not an inherent limitation for single-bit input resolution data. For example, correlation with a larger number of samples may permit 24-bit, 32-bit, and greater levels of output data resolution depending upon the number of correlation samples.

A digital number may be defined as having a resolution determined by the number of binary-bits, wherein the number of bits to the base two defines the number of counts for the linear resolution of the system. For example, a 10-bit number is aid to have a resolution of 10-bits, which means that the resolution is one part in $2^{10}$ or one part in 1,024-counts. Therefore, a 10-bit digital number provides an exponential resolution of 10-bits which is equal to a linear resolution of one part in 1.024 or approximately a resolution of one-tenth of one-percent (0.001).

The feature of the present invention wherein high-resolution output correlation numbers are generated in response to low resolution input numbers will now be discussed with reference to several examples to illustrate the concept.

In a first example, a digital system will be considered having single-bit resolution for the pilot and trace signal samples and wherein the pilot signal has 66,000 correlatable samples. For a single-bit trace signal sample and a single-bit pilot signal sample, the product may be either a one-bit product for a comparison condition or a zero-bit product for a non-comparison condition. This consideration can be better understood with reference to multiplication of a pair of sign-bits. A positive signal-bit product is obtained when the sign-bit of the trace signal sample and the sign-bit of the pilot signal sample have the same sign, either both being positive or both being negative, thereby yielding a positive product sign-bit. Similarly, a negative sign-bit product is obtained when the sign-bit of the trace signal sample and the sign-bit of the pilot signal sample are different wherein one-sign-bit is positive and the other sign-bit is negative. The magnitude of an output signal sample is determined by the sum-of-the-products. Therefore a minimum output signal sample magnitude may be obtained for all summed products being negative sign-bits indicative of non-comparisons and a maximum output signal sample magnitude may be obtained for all summed products being positive sign-bits or one-bits indicative of full comparison between the trace signal and the pilot signal. For the present example having 66,000 pilot signal samples; a maximum output signal sample magnitude may be 66,000 which is related to approximately a 16-bit digital resolution. Combinations of positive and negative products yield output signal sample magnitude in between the minimum of zero and the maximum of 66,000 wherein the magnitude of an output signal sample is related to the degree of correlation for a particular comparison between the trace signal and the pilot signal. Therefore, a correlation computation having only single-bit input data resolution can generate output data with 16-bit resolution or any other resolution output information depending upon the number of correlation samples considered.

In a second example, an input analog signal may have noise superimposed thereon and may have a low signal-to-noise ratio. An analog filtering arrangement such as an integrator may be used to smooth or filter the input signal to enhance the signal-to-noise ratio, wherein the smoothing is a summation type of operation and wherein the smoothed or filtered output signal may have greater precision than the noisy input signal. For example, an input signal may be a 2-volt DC signal having ±1-volt of ripple or noise superimposed thereon, Therefore, an instantaneous measured or sample of the input DC signal may be anywhere within the range of 2-volts ±1-volt, yielding a relatively low accuracy measurement of 50%. After filtering, the output signal may be a 2-volt DC signal having only 0.1 -volt of noise or ripple superimposed thereon. Therefore, an instantaneous measurement or sample of the output DC signal may be anywhere within the range of 2-volts ±0.1-volt yielding a relatively high accuracy measurement of 5% which is approximately 10-times better than the accuracy of the input signal. Therefore, integration or summation of a signal over a period of time or over a plurality of samples may be used to integrate-out or filter-out errors in that signal, combining signal portions to provide an output signal that has a higher accuracy and resolution than the related input signal.

Resolution and accuracy of a correlator is related to (1) the resolution and accuracy of the input trace and pilot signal samples, (2) the number of sub-computational products which are related to the number of samples in the pilot signal, and (3) the number of signals that are composited together after correlation. For the single-bit correlator of the present invention, accuracy and resolution of the input signal samples may be one-bit. For a 24,000 sample pilot signal, the accuracy and resolution is about 14-bits. For 16-trace composite-after-correlation operations, the accuracy and resolution are enhanced with another 4-bits. Therefore, a system having a single-bit correlation with a 24,000-sample pilot signal and with 16-composite-after-correlation operations may provide an 18-bit output signal sample resolution (14-bits plus 4-bits).

In general with computations such as the correlation computation, summation of a plurality of samples increases resolution and accuracy of an output signal with respect to an input signal because of the summation or integration process.

In accordance with the present invention, a high accuracy correlator can be implemented by providing computational resolution less than the resolution required for the output signal, thereby reducing costs and increasing speed over prior art correlators that implement computations having a computational resolution comparable to the resolution required for the output signal. In a preferred embodiment, the trace signal and the pilot signal may each be single-bit resolution signals and the computation may be implemented with single-bit multiplication and addition computations. In another embodiment, the input signal and the data signal may be represented by a single-bit signal and a multi-bit signal, wherein the trace signal may be the single-bit signal and the pilot signal may be the multi-bit signal, or conversely. In yet another embodiment, the trace signal and/or the pilot signal may be a single-bit binary signal, a ternary signal, or a multi-bit binary signal and wherein both the trace signal and the pilot signal may have the same resolution or may have different resolutions. In still another embodiment, the trace signal and the pilot signal may be represented with low resolution multi-bit binary signals such as 4-bit resolution signals to yield a high resolution output signal such as a 20-bit resolution output signal. Therefore, advantages are obtained by representing the trace and pilot signals as lower resolution binary signals for generating higher resolution output signals, wherein the input signals may be represented as low resolution single-bit binary, ternary, or multi-bit binary signals for generating higher resolution output signals. In accordance with yet another feature of the present invention, the two correlation input signals, which are the trace signal and the pilot signal, may have different resolutions; wherein the pilot signal may be single-bit binary resolution signal and the trace signal may be a ternary signal or a multi-bit binary signal. In general, different lower resolution input correlation signals may be used to generate higher resolution output signals. In an embodiment described above, the input correlation signals (the trace signal and the pilot signal) may be single-bit resolution binary signals which are used to generate a 20-bit resolution output signal. Alternately, one of the two input correlation signals (the trace signal or the pilot signal) may be a single-bit binary signal and the other one of these two input correlation signals may be a ternary signal. In yet another embodiment, the trace signal and the pilot signal may both be ternary signals. Instill another embodiment, one of the two input correlation signals (either the trace signal or the pilot signal) may be a multi-bit digital signal such as a four-bit digital signal and the other of these two input correlation signals may be either a one-bit binary signal or a ternary signal. In still another embodiment, the two input correlation signals (the trace signal and the pilot signal) may be multi-bit binary signals either having the same resolution such as both of these signals being four-bit binary signals or may have different resolutions such as one of these signals being a two-bit binary signal and the other of these signals being a four-bit binary signal to generate a 20-bit output signal. Other combinations of accuracy and resolution will now become obvious to those skilled in the art from the teachings of the present invention.

A simplified discussion will now be provided to illustrate how low resolution input information can preserve amplitude information sufficient to reconstruct signals through digital filtering such as through correlation to generate high resolution output signals. These discussions are provided in simple form for intuitive understanding and are not intended to be rigorous derivations nor error analysis. Further, these discussions on errors, noise, and resolution are provided merely for backup information to impart an intuitive understanding of a rationale that shows why the system of the present invention operates in the form described. It should be noted that one skilled in the art may practice the present invention from the hardware and software embodiments disclosed herein independent of whether the underlying qualifications are understood and accepted. For example, from the teachings of the present invention one skilled in the logical design art can design a correlator to accept single-bit input signal samples for generating higher resolution output signal samples independent of whether such a logical designer understands why it is permissible to round-off input signals to single-bit resolution. The following discussions are presented to inpart an intuitive feeling associated with considerations such as very small signal-to-noise ratios (large noise components), enhancement of resolution with correlation computations, and other such considerations and is not intended as a rigorous analysis or qualification of the implementations provided herein.

The correlation computation of the present invention may be used to locate signals mixed with high levels of noise, wherein the noise may have a very high amplitude and the signal may have a very low amplitude. Therefore, conversion of trace input samples with high resolution provides high resolution noise information, wherein the signal is "buried" in the noise and the high resolution of the input signal merely relates to sampling of noise with high resolution. Therefore, sampling of extremely noisy signals to high resolution may not provide a meaningful advantage over sampling of noisy signals with low resolution such as with one-bit resolution. Signal enhancement may be achieved through correlation operations enhancing the signal-to-noise ratio but may not be achieved by high-resolution conversion of input samples, wherein correlation operations do not required high resolution noise information and other digital filtering operations discussed do not required high resolution noise information. It may be considered that a noisy signal is inherently a low resolution signal because the noise superimposed thereon reduces the significance of an input signal sample. Therefore, because of the low resolution associated with the noisy input signal, sampling to high resolution such as with a ten-bit analog-to-digital converter provides extensive nonsignificant information that is not necessary for a correlation computation.

A correlation algorithm may be described as searching a trace signal in the temporal-domain or phase-domain to find a match with a pilot signal, wherein the correlation computation is extremely sensitive to phase considerations and may have only a secondary sensitivity to amplitude considerations. Phase information is preserved in low resolution input samples because phase may be related to the sign-bit of the input sample to detect when a zero-crossing occurs as positive-to-negative or negative-to-positive transitions, wherein the magnitude of peak signals may be of less significance and may actually degrade the sensitivity of the correlation operation especially in the present of extensive noise.

When a small analog signal has high levels of noise superimposed thereon. The random nature of the zero-crossings of the noise signal components may be biased by the amplitude of the signal component. For example, a positive signal component reduces the negative duty-cycle of the noise signal component. Therefore, magnitude of the signal component may be related to a duty-cycle characteristic of the noise signal. The duty-cycle of a purely random noise signal is 50% in the positive-state and 50% in the negative-state, which is then biased to provide different duty-cycle relationships in the positive and negative states based on the biasing by the signal superimposed thereon. Duty-cycle is herein intended to mean the percent of time that a signal occupies a state, wherein noise duty-cycle may be the percent of time that the noise is in the positive-state compared to the percent of time that the noise is in the negative-state. For example, a 50% duty-cycle may indicate that the noise is in the positive-state for a duration of time equal to the time the noise is in the negative-state and a 100% duty cycle may indicate that the noise is always in the positive-state and never in the negative-state. If the noise has a relatively high frequency, then a large number of zero-crossing conditions will occur. Further, if the signal-to-noise ratio is small, then the noise duty-cycle will not be biased too far from the normal 50% duty-cycle nature of noise and, therefore, the large number of zero-crossings will be essentially preserved. Because the signal amplitude may be resident in the duty-cycle of the noise in the positive-state and in the negative-state, a low resolution input sample such as a one-bit input sample may be sufficient to completely define the duty-cycle nature of the noise as biased by the signal. Further, the duty-cycle considerations and the relatively large number of zero-crossing transitions preserve the phase nature of the signal in the noise and therefore provide good correlation even with low resolution input samples and low signal-to-noise ratios. Further, high resolution samples may provide noise amplitude information having only a small component of signal amplitude information; wherein the correlation computation used in conjunction with low input signal-to-noise ratios is very sensitive to phase information which is preserved with low resolution input samples and is relatively insensitive to high resolution amplitude information, wherein high resolution amplitude information may be related mostly to noise amplitude and therefore may not significantly enhance the phase information; and wherein signal amplitude information may be implicit in the noise duty-cycle and therefore in zero-crossing information available from low resolution samples. Different amplitudes of the signal component in either the positive-state or negative-state biases the noise component from a 50% duty-cycle to a greater duty-cycle in the positive-state when biased with a positive signal component and a greater duty-cycle in the negative-state when biased with a negative signal component; wherein the magnitude of the duty-cycle is related to the magnitude of the signal biased impressed thereon.

Therefore, a small signal superimposed upon large amplitude noise biases the noise duty-cycle in relation to the signal amplitude and polarity and therefore the signal amplitude and polarity can be reconstructed from the noise duty-cycle. Because noise zero-crossing information is related to noise duty-cycle, a low resolution sample such as a single-bit sample is sufficient to extract noise duty-cycle information and therefore to reconstruct the signal impressed thereon. This consideration can be better understood by the analogy of filtering of analog signals, where a filter effectively averages noise and generates a filtered output signal related to duty-cycle of the noise as biased by the signal impressed thereon.

Input signals are usually mixed with extensive amounts of noise so that a visual observation of the input signals may only show large amounts of noise but may not show the signals included therein. Therefore, a whole-number analog-to-digital conversion of input samples may provide primarily sampled noise information that is non-significant, where the whole-number resolution may merely provide the noise magnitude to high resolution and may provide the signal magnitude to low resolution. Therefore, monitoring the sign-bit of the signals with a single-bit analog-to-digital conversion may provide substantially the same signal resolution as provided with a whole-number analog-to-digital conversion for a noisy input signal. Therefore, roundoff of the input signal may have an inconsequential effect and may not require the high resolution input signals as provided with prior art systems.

The system of the present invention may provide significant precision advantages over the prior art systems, notwithstanding the above discussed roundoff of the input signal. As discussed herein, the correlation and compositing algorithms enhance resolution by combining or filtering many samples having random noise superimposed thereon to reduce the amount of noise and to effectively improve the signal-to-noise ratio. In the system of the present invention, the sum-of-theproducts computation may use low resolution input signals such as single-bit signals and the low resolution computation may be used to update output words having high resolution such as 16-bit words or 20-bit words or any resolution word required; wherein the sum-of-the-products computation may not be rounded-off- in a preferred embodiment of the present invention.

In prior art systems, the input signal may be converted with 16-bit resolution and the computations; such as a Fast Fourier Transform, correlation computation in the frequency-domain, and an inverse Fast Fourier Transform; typically have a fixed word size such as 16-bits wherein the multiplication, addition, and other computations are rounded-off to the 16-bit word size during the computation. Assuming that the correlation computations permit enhancement of resolution, prior art arrangements provide the correlation computation in the frequency-domain thereby generating high resolution information which is subsequently processed with an inverse Fast Fourier Transform which rounds-off the high precision correlated information to 16-bit information through many iterative stages of transform computations, thereby progressively degrading the precision of the computation through successive computation and roundoff operations, where roundoff errors accumulate as the computation progresses through the inverse Fast Fourier Transform operations and wherein the error buildup may be based upon a root-sum-of-the-square (RSS) statistical relationship or other well known error propagation relationships. Therefore, roundoff after correlation as implemented in prior art systems causes an error build-up in the output information while the absence of roundoff after correlation in accordance with the present invention preserves the accuracy obtained with the correlation computation.

In view of the above, roundoff during signal acquisition may have small impact or even an inconsequential impact on precision of output information while roundoff after the correlation computation may have a significant impact on precision of output information. Therefore, low resolution conversion and multiplication and high resolution output in accordance with the present invention may provide significant accuracy improvements over the prior art arrangements where prior art arrangements provide smaller amounts of roundoff in the input but propagate roundoff through the correlation computation and the computations following the correlation computation. Therefore, the system of the present invention provides lower cost higher speed input signal conversion and multiplication computations in conjunction with high output resolution in contrast with prior art systems.

DESCRIPTION OF FIG. 1

The present invention provides various unique arrangements of subsystems to configure improved digital filtering systems and provides unique arrangements for the subsystems. System arrangements 100-105 are shown in FIGS. 1A-1F, wherein advantages achievable with different arrangements in accordance with the present invention will be discussed with reference thereto. Preferred embodiments of the subsystem discussed with reference to FIGS. 1A-1F are discussed in more detail with reference to FIGS. 2-9 hereinafter. Alternatively, subsystems shown in FIGS. 1A-1F may be implemented with well known prior art devices that may be arranged in the unique manner in accordance with the present invention and having the unique cooperation discussed with reference in FIGS. 1A-1F. For simplicity of discussion, the system of the present invention may be described with reference to a geophysical exploration system or other systems. It is herein intended that any references to a geophysical exploration system or other system be exemplary of the more general applicability of the system of the present invention and be useable in other applications such as sonar applications, radar applications, communication applications, and other applications.

A plurality of system configurations 100-105 are illustrated in FIGS. 1A-1F respectively and will be discussed hereafter to illustrate preferred embodiments of the system of the present invention.

One embodiment of the present invention is shown as system 100 in FIG. 1A. Transmitter 108 may generate transmitted signals 109 to ensonify an environment. Reflections from the environment shown as signal 109 may be received by an array of transducers 110 to generate transducer output signals 111 to signal processor 112. Signal processor 112 may process array signals 111 to generate processed output signals 113 for processing with compositor 114 and correlator 116 and for subsequent outputting with output device 118.

Transmitter 108 may be a VIBROSEIS for generating seismic energy to ensonify subsurface structures. Alternately, transmitter 108 may be a pieso-electric crystal transducer for a sonar application, a radar transmitter for a radar application, or other well known transmitter devices. Transmitted signal 109 may be a signal having a constant frequency such as with a constant frequency radar or sonar pulse or may have a variable frequency such as a chirp signal as used in chirp radar systems and in geophysical exploration systems.

Array 110 may be an array of geophones in a geophysical application, an array of hydrophones in a sonar application, an array of radar receivers such as in a phased array antenna for radar systems, or other well known transducer arrays. Array 110 may be a single-dimensional linear array, a rectangular two-dimensional array, or other array configuration such as discussed in copending patent application Holographic System For Object Location And Identification incorporated herein by reference. Transducer signals 111 may be unprocessed signals obtained directly from the array transducers or may be preprocessed such as with isolation amplifiers associated with array 110.

Signal processor 112 may be any well known signal processor including arrangements of filters and amplifiers for processing analog signals and analog-to-digital converters (ADSs) such as used in geophysical exploration systems and acoustic imaging systems. Processed signals 119 may be digital signals from an ADS included in signal processors 112 for processing with digital devices such as compositor 114 and correlator 116.

Compositor 114 may be used to enhance a signal such as for enhancing signal-to-noise ratio, where the function of a compositor is well known in the art. A compositor performs signal enhancement by adding corresponding samples from each of a plurality of sequential trace signals 113; where the operation of a compositor is discussed in detail hereinafter. Correlator input signals may be digital signal samples 115 from compositor 114 or digital signal samples 113 from signal processor 112. Correlator 116 receives input trace signals in either composited form as signals 115 or in uncomposited form as signals 113 for correlating trace signals 113 or 115 with a pilot signal 122. The output of correlator 116 is filtered signal 117 which may have an enhanced signal-to-noise ratio, an enhanced resolution through compression of a chirp signal into a pulse signal, or otherwise enhanced filtered signals. Compositor 114 and correlator 116 may be whole-number compositors and correlators that are well known in the art such as used in the CAFDRS system. Alternately, in accordance with the present invention correlator and compositor arrangements may process single-bit resolution digital signals to provide low cost and high speed correlation and compositing.

Filtered signals 117 may be provided to output device 118 which may include a CRT display, a magnetic tape recorder, and a general purpose digital computer as provided in a sonar acoustic imaging system; a magnetic tape recorder, a plotter, and a digital computer as provided in a geophysical exploration system; or other well known output devices.

In accordance with another feature of the present invention, a combined correlator and compositor device 121 is provided for simplicity of mechanization and for providing a capability of compositing-after-correlation. The arrangement of system 101 shown in FIG. 13 replaces compositor 114 and correlator 116, which are discussed with reference to FIG. 1A above, with the combined correlator and compositor arrangement 121 including correlator 119 and compositor 120. In FIG. 1B, transmitter 108 generates signals 109 which are sensed by array 110 to generate array signals 111 to signal processors 112, as discussed with reference to FIG. 1A above. Processed signals 113 from signal processor 112 may be processed with correlator 119 such as a one-bit correlator and then by composite 120, wherein the operation of compositing may be implicit in the correlation algorithm and may not actually require a separate compositor device. This arrangement may provide substantial savings in cost of a compositor and may provide the valuable capability of compositing-after-correlation as will be described in detail hereinafter. Output signal 117 from correlator and compositor arrangement 121 may be further processed with output device 118 as discussed with reference to FIG. 1A above. A preferred embodiment of a combined compositor and correlator is provided herein and discussed in detail with reference to FIGS. 5 and 6 hereafter. Alternately, correlator 119 and compositor 120 may be separate devices such as prior art correlator and compositor device which may be arranged in the preferred embodiment of system 101 shown in FIG. 13 to obtain the further advantages of compositing-after-correlation.

An alternate embodiment for the system of the present invention is illustrated in FIG. 1C as system 102. Transmitter 128 is shown including a combination of individual transmitters 128A and 128B generating different signals 129A and 129B respectively. As discussed above for signal 109 with reference to FIG. 1A, signals 129A and 129B are used to ensonify an environment. Reflections related thereto may be sensed by array 110 providing transducer signals 111 to signal processor 112 for generating processed signals 113 as discussed for FIG. 1A above. The plurality of ensonifying signals 129A and 129B may be chirp signals having different signatures for separation through correlation as will be discussed in detail hereafter. For example, signal 129A may be an up-chirp signal and signal 129B may be a down-chirp signal. In a geophysical embodiment, transmitters 128A and 128B may each be a separate VIBROSEIS signal generator, wherein VIBROSEIS 129A may generate up-chirp signal 129 and VIBROSEIS 128B may generate down-chirp signal 129B. Up-chirp signal 128A and down-chirp signal 129B may be combined or mixed together as they propagate through the subsurface environment and as they are reflected from various subsurface reflectors towards transducer array 110. Devices shown in FIG. 1C such as array 110, signal processor 112, and compositor 114 may be the same as discussed with reference to FIGS. 1A and 1B above. Composited output signal 115 may include the combined components of reflections associated with each transmitted signal 129A and 129B superimposed together.

Correlator 116 may include a plurality of correlator devices 116A and 116B for correlating processed signal 113 with pilot signals 122A and 122B respectively. If pilot signal 122A is an up-chirp signal similar to that generated by transmittor 128A, correlator output signal 117A from correlator 116A may represent correlation information related to up-chirp signal 129A. Similarly, if pilot signal 122B is a down-chirp signal similar to that generated by transmitter 128B, correlator output signal 117B from correlator 116B may represent correlation information relating to down-chirp signal 129B. Therefore, mixing of up-chirp and down-chirp signals 129A and 129B may generate a combination processed signal 113 related to both up-chirp and down-chirp signal reflections which may be separated with correlators 116A and 116B for correlating input trace signal 113 with up-chirp pilot signal 122A for generating up-chirp related signal 117A and with down-chirp pilot signal 122B for generating down-chirp related signal 117B respectively. Mixing and separation of signals in accordance with the present invention will be discussed in detail with reference to FIGS. 3 and 7 hereinafter. Separated output signals 117A and 117B from correlators 116A and 116B respectively may be recorded on different output devices 118A and 118B respectively for separately outputting the separated information. Output devices 118A and 118B may each be the same as output device 118 as discussed for FIG. 1A above.

A particular advantage of the embodiment shown in FIG. 1C is that different ensonifying signals 129A and 129B may simultaneously generate different forms of information. For example, a high-frequency chirp signal 129A may generate high resolution information and a low-frequency chirp signal 129B may generate low resolution information, or different chirp signals may have different ranges, or different chirp signals may have other different characteristics therebetween. Therefore, generation of a plurality of different ensonifying signals 129A and 129B and separation of the reflected signals through correlation may permit isolation of different characteristics of reflectors in the environment with simultaneous or overlapping signals.

As will be discussed in detail hereinafter, ensonifying an environment with different signals 129A and 129B will cause mixing and superposition of these signals in the environment as they propagate through the environment. An alternate arrangement may provide generating a plurality of different signals and mixing these different signals before transmission such as with an electronic signal input to a VIBROSEIS signal generator which may be used to ensonify an environment with a single transmitter excited by having a plurality of different signal components, such as represented by signals 122A and 122B, for separation through correlation as discussed with reference to FIG. 1C above. Such an arrangement having overlapping signals will be discussed in detail with reference to FIG. 7 hereinafter.

In an alternate embodiment, system 103 is shown in FIG. 1D as being similar to system 102 shown in FIG. 1C except that system 102 provides correlation-after-compositing capability and system 103 provides compositing-after-correlation capability. As discussed for system 102 above, system 103 includes a plurality transmitter devices 123A and 123B to generate transmitted signals 129A and 129B respectively which may be reflected by subsurface structures and wherein the reflected signal may be received by array 110 to generate transducer signals 111 for processing with signal processor 112 to generate processed transducer signals 113. Correlator 116 say comprise a plurality of individual correlators 116A and 116B to correlate processed signal 113 with a first pilot signal 122A corresponding to transmitted signal 129A and a second pilot signal 122B corresponding to transmitted signal 129B to generate individual correlation output signals 117A and 117B respectively to compositor 121. Compositor 121 may be a multiple channel compositor, which may be similar to the single channel compositor 114 described with reference to FIG. 1A except that multiple channel compositor 121 may receive a plurality of corresponding signal samples 117A and 117B substantially simultaneously for compositing together. Therefore, each sample in compositor 121 may have a plurality of substantially simultaneously received trace samples 117A and 117B for compositing theretogether for each composite sample operation in contract to the single channel compositor 114 of FIG. 1A which merely composites one trace sample for each compositor operation. Alternatively, compositor 121 may include a plurality of compositors such as compositor 114, wherein an individual compositor 114 may be provided in each channel such as for separately compositing signals 117A and 117B. Output device 118 may be used for outputting correlated and composited signal 117 (as discussed with reference to FIG. 1A above) or, alternatively as shown in FIG. 1C, a plurality of output devices such as output devices 118A and 118B may be used to output separately correlated and separately composited information in conjunction with the arrangement set forth in FIG. 1D.

In accordance with another feature of the present invention, system 104 shown in FIG. 1E and system 105 shown in FIG. 1F may be used to further process the processed signal 113 from signal processor 112. A Fast Fourier Transform (FFT) device 123 may be used to generate frequency-domain information to correlators 124 in response to time-domain information 113 from signal processor 112. Correlators 124 may be frequency-domain correlators that implement correlation by multiplying corresponding frequency-domain samples of a trace signal from FFT processor 123 with frequency-domain pilot signal samples 122A or 122B to generate a correlated frequency-domain signal. System 104 may provide compositing of separately correlated frequency-domain signals with compositor 125 and then provide an inverse FFT 126 to generate correlated and composited time-domain signal 117 for output with output device 118. Alternately as shown in FIG. 1F, the frequency-domain correlator output signals may be processed with inverse FFT 126 to obtain time-domain signals to compositor 116 which may be a time-domain compositor for generating time-domain composited and correlated signals 117 to output device 118.

The arrangement shown in FIG. 1E provides frequency-domain correlation, frequency-domain compositing, and compositing-after-correlation capabilities while the arrangement shown in FIG. 1F provides frequency-domain correlation, time-domain compositing, and compositing-after-correlation capabilities. Although the arrangements described with reference to FIGS. 1B and 1F provide for combining of the correlation output signals in compositors 126 and 116 respectively, alternate embodiments may provide correlation output signals for individual compositing with separate compositors so that each signal separated with correlators 124 may be composited separately for separate recording such as discussed with reference to FIG. 1C above using a plurality of output devices.

Correlators and compositors are well known in the art such as the compositor and correlator arrangements of the CAFDRS system. Because that prior art system implements correlation and compositing under program control in GP computers, many alternate arrangements may be implemented in accordance with the teachings of the present invention by reprogramming of the GP computers. For example; because the CAFDRS correlator performs frequency-domain correlation with a single operator, the embodiments discussed with reference to FIGS. 1C–1F may be implemented for correlating the trace signal against a plurality of operators and separately storing the correlation output signals therefrom. Alternately, correlation output signals may be composited together in the frequency-domain as discussed with reference to FIG. 1E or may be each converted to the time-domain with the well known inverse FFT computation for compositing in the time-domain. Therefore, although preferred embodiments of the present invention discussed with reference to FIG. 1A–1F may use the improved correlator and compositor arrangement of the present invention; alternately prior art compositors and correlators may be used to implement the arrangements shown in FIGS. 1A–1F and to implement other arrangements in accordance with the teachings of the present invention.

In a preferred embodiment, systems embodiments 100–105 shown in FIGS. 1A–1F may operate in real-time providing fully processed data to output device 118 simultaneously as data is being acquired from transducer array 110. Alternately, systems 100–105 may operate in a non-real-time or in an off-line manner wherein information may be received from array 110 and buffered or temporarily stored such as with a memory contained in compositor 114 or correlator 116 until it can be fully processed. In such an off-line non-real-time system, data may be selectively processed with compositor 114 and/or correlator 116 so that only part of the information received is processed to permit higher speed portions of the system to continue to operate. In the non-real-time embodiment, the system may generate information for compositing and for correlation and may cease data acquisition operations until the previously acquired data has been processed and output. A real-time high speed correlator and compositor arrangement will be discussed in detail hereinafter in accordance with a preferred embodiment of the present invention.

Subsystem components shown in FIGS. 1A–1F will now be discussed in more detail.

Transducer array 110 may consist of a single transducer or a plurality of transducers. The plurality of transducers may be arranged in various geometrical configurations. For example, a geophysical system may provide a linear single-dimensional array of transducers, an underwater acoustic system may provide a two-dimensional rectangular array of transducers, a medical diagnosis system may provide an array of transducer stratigically located on the body of a patient, and an equipment diagnosis system may provide a three-dimensional array of transducers located on the structure of a machine. In a geophysical application, input signals 109 may be seismic signals or shock waves transmitted through subsurface geophysical structures and sensed with seismic transducers known as geophones. In an underwater acoustics application, input signals 100 may be acoustic signals transmitted through a water medium and sensed with acoustic transducers known as hydrophones. In a radar application, input signals may be electromagnetic radar or radio signals transmitted through the atmosphere or through space and sensed with electromagnetic transducers such as radar antennas and receivers which may be integrated together in a phased array antenna arrangement. In a medical diagnostic application, input signals 109 may be electrocardiograph signals sensed with wall known electrocardiograph electrodes or may be acoustic signals sensed with hydrophone type electrodes. In a machine diagnosis application, input signals 109 may be vibration signals, fluid flow signals, electrical signals or other well known signal forms sensed with wall known transducers such as vibration transducers, fluid flow meters, electrical sensors, or other well known transducer devices.

In view of the above, input signals 109 may be any form of signals such as vibration signals, acoustic signals, radio signals, electrical signals, fluid flow signals, or other well known signals and transducers 110 may be any well known transducers for sensing input signals 109 such as geophones, hydrophones, vibration transducers, flow transducers, electrical sensors, and other well known transducer elements. Further, transducer array 110 may be a single transducer or a plurality of transducers arranged in various array configurations including a single-dimensional linear array, a two-dimensional rectangular array, or a three-dimensional array. Further, array 110 may not necessarily be linear, rectangular, or in any other well known geometric arrangement; but may be arranged for optimum response such as a distribution of sensors on the body of a patient, a distribution of sensors on a structure of a machine, or a distribution of geophones on the ground. Still further, array 110 may be a one-dimensional array, a two-dimensional array, or a three dimensional array wherein these array configurations may have regular or irregular forms or patterns. Further, input signals 109 may be available as an array of signals and may not require a physically identifiable array of transducers, wherein the transducers may be implicit in the device and the array may merely constitute an array of input signals without the necessity for transducers to change the form of the signals.

Signal processors 112 may be any signal processors required to process array signals 111 to provide processed output signals 113. Signal processors 112 may include analog signal processor circuits and digital signal processor circuits. Transducer signals 112 may be analog or digital signals and processed signals 113 may be analog or digital signals. In a geophysical application, signal processors 112 may include amplifiers, filters, multiplexers, and analog-to-digital converters to provide processed digital output signals 113. In an underwater acoustic application, signal processors 112 may include phase sensitive demodulators, filters, multiplexers, and analog-to-digital converters to provide processed digital signals 113. In an alternate embodiment, signal processors 112 may include squaring amplifiers or other arrangements to generate an incremental squarewave or a digital sign-bit for output signal 113 as will be described in detail for a preferred embodiment hereinafter. Further, signal processors 112 may include analog signal processors such as amplifiers and filters to generate analog output signals 113 such as for compositing or correlation with analog devices such as with charge coupled devices or other well known analog signal processing arrangements. In still other embodiments, signal processors 112 may be an integral part of transducer array 110 such as with a batch fabricated transducer array and signal processing arrangement or for monolithic transducers and signal processors.

Output device 118 may be any output devices including displays, recorders, control systems, and other output devices. In a geophysical embodiment, output devices 118 may include a magnetic tape recorder for recording either composited or correlated and composited information for subsequent processing at a large scale computer center. A geophysical system embodiment further provides visual display outputs such as with a galvanometer strip-chart recorder or a plotter for plotting composited and/or correlated data for operator viewing. In an acoustic imaging system, output devices 118 may include a CRT display for displaying acoustic images and may include a magnetic tape recorder or other recording device for more permanent storage of processed information. In a diagnostic embodiment, output device 118 may be an oscilloscope or a plotter for displaying correlated waveforms to a doctor in a medical diagnostic system or to a mechanic in an equipment diagnostic system. In a control embodiment, output device 118 may be a control system for controlling a missile or an aircraft in response to correlated data 117 or for controlling a machine such as a machine tool to adaptively optimize operation in response to correlated output signals 117. Many other output devices are well known in the art and may be used with the system of the present invention, where output device 118 may even be a data communications terminal for communicating information with a remote computer center over telephone lines or over a microwave data link. Therefore, output device 118 is considered to be a generalized output device that may be satisfied by any user system, data acquisition system, data communication system, or other such arrangements.

DESCRIPTION OF FIG. 2

The signal acquisition arrangement of the present invention will now be described with reference to FIGS. 2A and 2B to illustrative the signal acquisition portions of the systems shown in FIG. 1. The arrangement of FIG. 2A may represent a single trace channel associated with the multi-channel arrangements of FIG. 1. Transducer 210 may be one of a plurality of transducers included in array 110 and may be a geophone such as manufactured by Geo Space Corp of Houston, Tex. Transducer signal 111 may be processed with well known amplifier arrangements 211 and well known filter arrangements 212 prior to conversion with converter 213. Amplifiers 211, filters 212 and converter 213 may be included in signal processor 112 (FIG. 1).

Filters 212 may be any combination of filters and may include a low-cut filter, a high-cut filter, an anti-aliasing filter, and other well known filter arrangements such as provided with prior art geophysical exploration systems. Converter 213 may be an analog-to-digital converter (ADC) such as used in prior art geophysical systems or such as a preferred embodiment discussed with reference to FIG. 23 hereafter. Amplified and filtered signal 215 may be processed with converter 213 to provide digital signal 113 to processor 214. Processor 215 may include compositor 114 and correlator 116 (FIG. 1) and may include various computer and data processing arrangements for data processing of converted signal 113.

Converter 213 shown in FIG. 2A will now be discussed in more detail with reference to FIG. 23. Amplified and filtered signals 215 may be received from a plurality of channels such as the channel shown in FIG. 2A and may be multiplexed with analog multiplexer 220 to be sequentially converted with analog-to-digital converter (ADC) 222 for input to a computer 223 and for storage in memory 224. Each of the plurality of channels 215 may be selected by a multiplexer HUX 220 under control of address register 221. Address register 221 may be a well known sequential counter arrangement or may be programmable by loading a desired channel address 227 from computer 223 into address register 221. The selected analog signal from HUX 220 may be converted with ADS 2222 to provide a digital output signal to computer 223. Operation of ADC 222 may be under control of self-contained sequencing logic as with prior art ADC devices or may be operated under program control of computer 223 with control signals 226, as discussed in copending patent application Apparatus And Method For Providing Interactive Audio Communication which is incorporated herein by reference. Computer 223 may be used in conjunction with memory 224, wherein memory 224 may be a computer main memory for storing instructions or may be an output memory device such as a disc memory or a magnetic tape memory.

DESCRIPTION OF FIG. 3

The signal processing system of the present invention can be readily described with various examples to illustrate the signal forms and the signal processing operations. Various signal forms are shown in FIGS. 3A-3D and will be used to exemplify various features of the present invention.

Signals processed with the system of the present invention may be any well known signal form and may include many signal forms that may be readily synthesized or generated with well known signal generators. In a preferred embodiment, the signal may have a sinusoidal form or a squarewave form, but other embodiments utilizing sawtooth signals, trapezoidal signals, pulse signals, and even noise signals may be used in accordance with the present invention. For simplicity herein, sinusoidal type signals will be considered to exemplify the present invention, wherein sinusoidal signals are intended to exemplify the broader teachings of the present invention which are applicable to a wide range of different signal types.

Figure 3A:
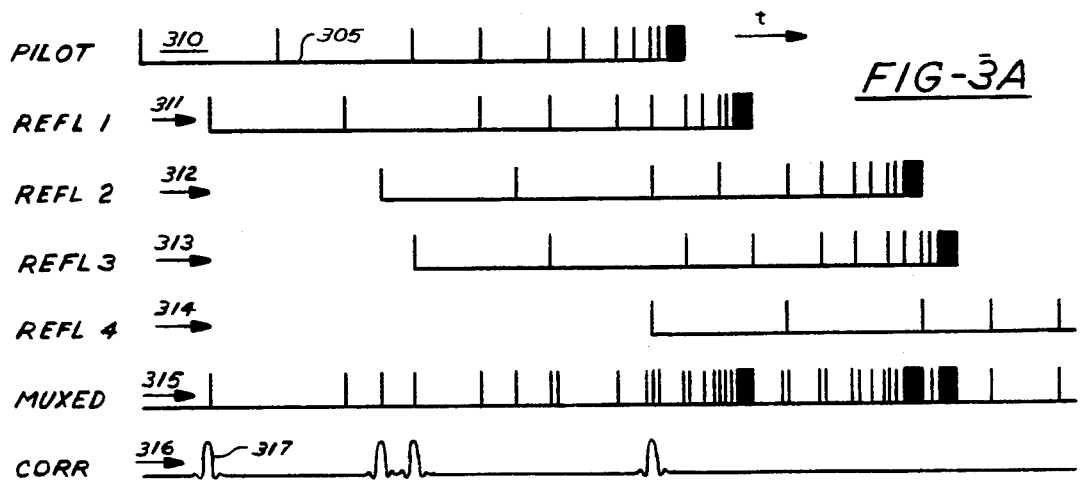

A schematic notation will be defined to illustrate signals in a form that more clearly exemplifies the present invention. Drawing of sinusoidal signals and combining of sinusoidal signals may be relatively complex and may not illustrate the teachings of the example in a clear and simple form that is readily understood. Therefore, a schematic signal notation will now be described with reference to FIG. 3A, where this schematic notation will be used for simplicity and clarity. A pilot signal 310 is shown in FIG. 3A using this schematic notation. A horizontal line 305 is shown to illustrate the duration of the signal from the start of the signal representing an earliest time shown at the left-hand edge of the signal to the completion of the signal representing later time at the right-hand edge of the signal; wherein time is assumed to be linearly increasing as the signal progresses toward the right-hand portion of the figure as shown with arrow t. Waveform 310 is shown changing as a chirp signal wherein the frequency changes as time progresses. Waveform 310 is shown as an up-chirp signal starting at a low frequency and progressing in a frequency sweep towards a higher frequency. Vertical lines are used to represent frequency by the spacing therebetween. Waveform 310 shows a wider spacing between vertical lines at the left-hand edge of the signal and a narrower spacing between vertical lines at the right-hand edge of the signal, wherein the wider spacing is indicative of lower frequency portions and the narrower spacing is indicative of higher frequency portions of waveform 310. The relative spacing between vertical lines may be considered to be proportional to the relative periods between signal cycles or may be representation of a fixed number of signal cycles between adjacent vertical lines. For example, the vertical lines may represent a period of five signal cycles; wherein vertical lines spaced further apart are intended to represent signal cycles therebetween having a longer period and therefore a proportionally lower frequency than is represented by vertical lines having smaller spacing therebetween. The frequency is shown increasing toward the right-hand portion of waveform 310, where the vertical lines get closer together until the spacing becomes very small as indicated by the shaded portion of waveform 310 at the right-hand edge of the waveform.

A multiplexed signal 315 may be shown in schematic form by projecting the component vertical lines of signals 311-314 vertically downward projected on multiplexed signal 315. Multiplexed signal 315 contains vertical lines corresponding to the combination of vertical lines contained in the phase related signals 311-314 that are multiplexed together. For example, the first vertical line of signals 311-314 is the first vertical line of signal 311 which is projected vertically downward to provide the first vertical line for multiplexed signal 315. Similarly, the second vertical line in signals 311-314 is the second vertical line of signal 311 which is projected vertically downward and drawn as the second vertical line for multiplexed signal 315. Similarly, the third and fourth vertical lines of signals 311-314 are shown as the first vertical line in signal 312 and the first vertical line in signal 313 respectively which are projected vertically downward and drawn as the third and fourth vertical lines for multiplexed signal 315. Similarly, all other vertical lines in signals 311-314 are projected vertically downward to form the vertical lines shown for signal 315. When concentrations of vertical lines are projected from the combination of a plurality of vertical lines in signals 311-314, the vertical lines may be slightly spread when projected on multiplexed signal 315 to illustrate the concentration of projected vertical lines. Therefore, multiplexed signal 313 provides a schematic representation related to the concentration of frequency related components shown schematically with vertical lines from signals 311-314 which are superimposed as projected onto multiplexed signal 315.

Correlation output signals may be represented by a showing of peak signals, related side lobe signals, and other signal components. For example, a correlation output signal 316 shows four peak signals such as peak signal 317 with related sidelobe components. Further, outputs signals 343 and 344 (FIG. 3D) show sidelobe signals 346 and 347 and output signal 345 shows the absence of sidelobe signals 348. Further, correlation output signal noise components and other perturbations are shown with output signals 329 and 331 (FIG. 3C) as noise signal components 330 and 332. A schematic notation is used for correlation output signals such as signal 316 that is different from the schematic notation used for frequency chirp signals 310-314 and multiplexed signals 315, wherein the shape of the envelope of digital sample magnitudes is represented with output signals as shown with output signal 316. This digital magnitude envelope representation is different from the frequency related vertical line notation used for chirp signals 310-314 and the multiplexed signal vertical line notation used with multiplexed signal 315. As will be described in detail with reference to FIGS. 5 and 6 hereinafter, the output signal is represented by a plurality of output signal samples having amplitudes being represented by a binary magnitude representation of a digital number. Therefore, a correlation output signal such as signal 316 may not be a continuous signal as shown in FIG. 3A in continuous signal envelope schematic form, but may actually be a sequence of digital samples. A continuous envelope representation is used for correlation output signals such as signal 316 to illustrate the envelope associated with the sequence of digital samples, wherein the amplitude of a correlation output signal 316 at a particular point is provided by a digital word associated with that sample point, wherein the digital word has a digital magnitude related to the amplitude of the correlation output signal sample at the related point. For example, digital output signal samples associated with signal peak 317 may have large digital magnitudes, digital output signal samples associated with sidelobes of peak signal 317 may have smaller digital magnitudes, and digital output signal samples associated with the low level signal in between peak signals may have vary small digital signal sample magnitudes.

Chirp waveforms are well known in the art and may be defined as an up-chirp having an increasing frequency and a down-chirp having a decreasing frequency. Frequency changes may be linear frequency changes, where frequency may vary directly as a function of time; but frequency changes or sweeps may follow other functions such as being exponential frequency changes or other frequency changes having various analytic functions and further may be random or discontinuous frequency changes having a discontinuity or having random frequency changes such as with a noise signal. For simplicity of discussion, a chirp signal may be shown as a linear up-chirp signal or a linear down-chirp signal to exemplify the features of the present invention. It is herein intended that any simplified discussion relative to a chirp signal, a linear frequency sweep, or other such well known and simple signal be merely exemplary of the more general concepts of the present invention which are applicable to a bread range of signal forms and are not limited to the simple linear chirp signals used for simplicity to exemplify the features of the present invention.

A chirp signal may be defined as a sinusoidal waveform that changes infrequency, wherein the change in frequency may be a linear change infrequency or other change in frequency. A chirp may be an up-chirp starting from a low frequency and increasing infrequency, a down-chirp starting at a high frequency and decreasing infrequency, or other variations in frequency. A chirp is a well known signal that may be generated by a voltage controlled oscillator (VCO) or a variable frequency oscillator (VFO), wherein a VCO and a VFO may generate a sinusoidal signal, a squarewave signal, a trapezoidal signal, or other signal having a controllable frequency characteristic. For simplicity of discussion, a chirp signal will be shown as a sequence of vertical lines (FIGS. 3A, 3B, 3C, 3D, 7B, and 7C) wherein the spacing between the vertical lines is related to the frequency. For example, waveform 310 (FIG. 3A) is shown as an up-chirp signal starting at a lower frequency having a larger spacing between vertical lines and progressing toward a higher frequency having successively smaller spacings between vertical lines. In one schematic notation, these vertical lines may be used to indicate a quantity of cycles of the waveform, where the spacing between vertical lines in waveform 311 may indicate every fifth cycle of a sinusoidal waveform. Therefore, as the vertical lines become more closely spaced, the five sinusoidal cycles have shorter periods and therefore have a higher frequency.

One feature of the present invention provides for separation of signals such as separation of a chirp signal from noise and separation of a plurality of superimposed chirp signals which may also be superimposed on noise. For simplicity of illustration, effects such as a superimposed noise may not be shown to provide a clear illustration of the signals contained therein. Nevertheless, the effects of noise and other such influences are intended to be implicit in the waveform diagrams and discussions presented herein.

A chirp signal may be generated by many well known techniques. In a geophysical embodiment, a chirp signal may be generated by a VIBROSEIS vibrating generator which is a vibrator that introduces vibratory or seismic signals into the ground. Various types of sweep generators may be used to provide a chirp signal including a voltage controlled oscillator (VCO) and a variable frequency oscillator (VFO) which are well known in the art. Similarly variable frequency or pulse rates may be generated with well known digital devices such as a digital differential analyzer (DDA) or a counter arrangement using digital feedback. One such product is the voltage-to-frequency converter Model No. 3329 manufactured by Optical Electronics Inc of Tucson, Ariz. which generates an output frequency having sinusoidal, triangular, and squarewave outputs at a frequency proportional to an input DC signal. Another well known voltage-to-frequency converter is model VFV manufactured by Datel Systems Inc of Canton, Mass. These voltage-to-frequency converters may be used to generate a signal having controllable frequency such as an up-chirp signal by providing an analog function module for generating an input signal to the voltage-to-frequency converter. For example, if a voltage integrator is used as the input to the voltage-to-frequency converter having a constant voltage input, the integrator will generate a linear ramp voltage to the voltage-to-frequency converter and the voltage-to-frequency converter will generate a linear chirp frequency in response thereto as will be discussed with reference to FIG. 7 hereinafter. Various other analog functions may be generated such as an analog exponential function which may be implemented with a pair of cascaded integrators. Further, other analog function modules such as multipliers, dividers, recipcals, and logrithmic function generators are commercially available. For example, Function Modules Inc of Casta Mesa, Calif. provides a multiplier/divider module P/N 550, divider module P/N 540, reciprocal module P/N 545, logrithmic module P/N 530 and other analog function generating modules. Still other analog function generating modules are well known in the analog computer art such as discussed in the textbooks by Korn and by Levine referenced herein. Further, Hybrid Systems Corp of Burlington, Mass. provides multiplying, dividing, and square rooting modules model numbers 107, 125, 106 and 101 respectively for generating analog functions. Still further, various inverse analog functions may be provided using implicit servos with the function generation module in an implicit servo feedback loop as discussed in the textbook by Levine referenced herein. In view of the above, well known analog function generator modules may be provided to generate virtually any desired function in analog signal form and a commercially available voltage-to-frequency converter may be used to convert the analog function to a frequency function to synthesizes a frequency related sweep or chirp having substantially any desired sweep characteristics.

Figure 3B:
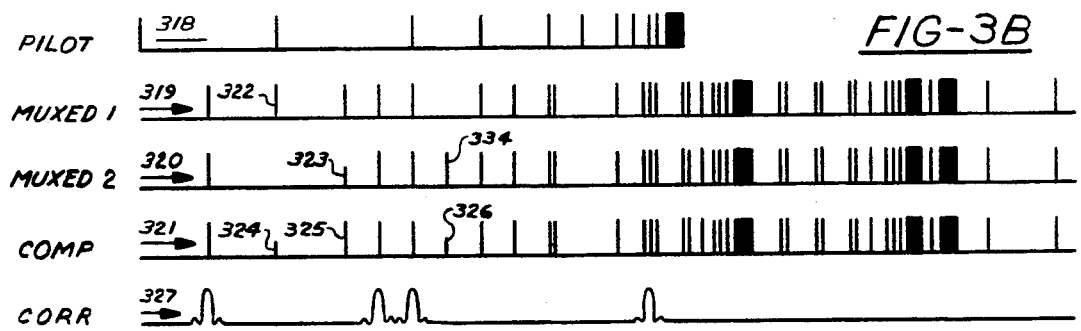
Figure 3C:
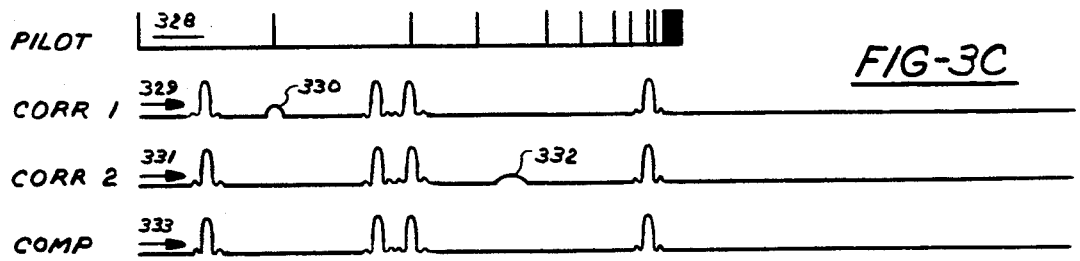

The operations of correlation and compositing will be better understood with the following discussion referenced to FIGS. 3A–3C. Briefly stated, the operation of correlation is related to the searching of a signal with an operator or pilot signal to find the similarity therebetween and further to compress the similarities into a pulse or amplitude peak signal and the operation of compositing is related to the adding or summation or integration of corresponding signal portions. The operations of correlation and compositing include summation operations on information that may be statistically uncorrelated due to high levels of random noise, wherein such summation operations may enhance the signal-to-noise ratio of the signal and may be used to enhance the resolution or precision of the signal. The operation of compositing merely enhances the signal-to-noise ratio and the related signal amplitude but does not change the form or signature of the repetitive signals contained therein. The operation of correlation enhances the signal-to-noise ratio of a signal and further changes the characteristics of the signal by grouping many terms of the signal to perform what is known in the art as compressing a signal to a pulse. These operations of increasing signal-to-noise ratio, signal location, and signal compression are useful where a correlator can find signals buried in noise, can enhance the signal-to-noise ratio, and can compress a long signal into a pulse to provide high resolution and a high signal-to-noise ratio. These effects are very important, wherein the signal-to-noise ratio and therefore the discriminating power of the correlator is related to the length of the pilot and trace signals, yet the length of the signal does not degrade the time resolution because of the compression to a pulse. Therefore,extremely long chirp signals may be used in noisy environments, wherein the noise is significantly reduced by the length of the signal received and the time resolution is reconstructed when the long chirp signal is compressed into a pulse. These characteristics will be exemplified with FIGS. 3A–3C hereinafter.

The waveforms shown in FIG. 3A exemplify a typical correlation and compositing application. This arrangement may be discussed with reference to geophysical exploration applications to exemplify the features of the present invention. It is herein intended that any reference to a particular application be exemplary of a broad range of applications to which the example may be applied.

A pilot signal 310 is shown as a chirp signal which may be generated with a VIBROSEIS to ensonify subsurface structures in a geophysical application. Subsurface structures cause the pilot signal to be reflected, wherein the reflected signals are received with a geophone array and wherein the time between the generation of the pilot signal 310 and acquisition of each reflected signal 311–314 is related to the distance or depth of the reflector. Pilot signal 310 is reflected from a first shallow depth reflector and received as reflection signal 311. Deeper reflectors cause reflection signals REFL 2-REFL 4 312–314 to be reflected at subsequently greater depths and thereby to be received by the geophone array at sequentially longer time intervals. This is indicated by the reflection signals REFL 1-REFL 4 311–314 starting at progressively longer time intervals from the generation of the pilot signal 310 as shown by the start of the reflected signals 311 $\alpha$ 314 being progressively shifted to the right of FIG. 3A. Therefore, each reflected signal 311–314 represents reflection from a different subsurface structure and the time delay from the start of pilot signal 310 to reflected signals 311–314 represents the relative depths of the subsurface structures. Amplitude of the reflected signals may vary as a function of size of the reflector, reflection characteristics of the subsurface structure, depth of the subsurface structure, absorption and dispersion characteristics of the subsurface environment and other such characteristics. For simplicity, amplitude variations are not shown in FIGS. 3A–3C but will become apparent to those of ordinary skill in the prior art. The various reflected signals 311–314 are received by the geophones, wherein a geophone signal or trace signal is shown in simplified schematic form as multiplexed waveform MUXED 315. The geophone transducer senses the reflections as the seismic energy is reflected from the subsurface structures, wherein the geophone transducer senses the various reflections as superimposed signals or multiplexed signals MUXED 315. These superimposed signals are shown schematically as waveform 315 wherein the vertical lines of waveforms 311–314 are projected vertically downward to construct multiplexed signal 315 containing the superimposed components supplied by reflected waveforms 311–314. The summation of all of the signal components having different frequencies is shown as MUXED signal 315 wherein the densities of vertical lines are related to the frequency components superimposed together.

An observer viewing multiplexed signal MUXED 315 may not be able to distinguish between the individual reflections. This consideration is rendered even more complex when large amounts of noise are superimposed on signal 315, when reflected signals are varied in amplitude, when reflected signals are shown in continuous signal form rather than the vertical line schematic notation of this example, and when occurrence of hundreds and possibly millions of different reflections are superimposed together. Therefore, multiplexed signal 315 is shown in simplified schematic form representing only four superimposed reflections to illustrate the concepts of the present invention.

A correlation algorithm may be used to separate each reflection from multiplexed waveform 315, to separate the reflected signals from the noise, and to compress each reflected signal into a pulse. The correlation algorithm "searches" the multiplexed signal 315 with the pilot signal 310 to detect common portions therebetween. The "search" is performed by shifting or sliding pilot signal 310 past multiplexed signal 315 and by comparing the two signals at each particular shift position to evaluate the degree of similarities. The correlation output signal 316 provides a figure-of-merit related to the degree of similarity, wherein this correlation output signal 316 is generated by summing all products of all corresponding samples between the pilot signal 310 and the multiplexed signal 315 for a particular shift position therebetween as discussed above with reference to Tables I-VI. This sum-of-the-products computation is shown as a correlated signal CORR 316, wherein the position along correlated signal 316 is related to the shift position of the pilot signal 310 as it is shifted along and compared with the multiplexed signal 315. For example, when pilot signal 310 has been shifted to a position corresponding to reflection signal 311; a comparison between the pilot signal 310and the multiplexed signal 315 shows a good comparison because the sum-of-the-products computation has a high value for this position showing good comparison. The sum-of-the-products computations provide a peak 317 related to compression of reflection REFL 1 311 into pulse 317 by correlation with pilot signal 310. Similarly, as pilot signal 310 is shifted along multiplexed signal 315 and compared for each shift position, additional good comparisons are provided for positions defined by pulses in correlated waveform 316 corresponding with the start of reflections 312-314 shown directly above the correlated output pulses of waveform 316. Therefore, a very complex multiplexed signal 315 can be searched with a pilot signal 310 to detect similarities therebetween and a correlation output signal 316 provides peaks 317 related to the degree of correlation between pilot signal 310 and multiplexed signal 315 for each shift position. Therefore, a correlation output peak 317 may be provided for pilot signal shift positions having good correlation, thereby indicating the finding of a chirp signal buried in multiplexed signal 317; wherein the correlation output peak 317 may indicate the start of a chirp signal component buried in multiplexed signal 315 and the amplitude of the peak signal 317 may be related to the degree or figure-of-merit of the comparison. For simplicity of explanation, correlation signal 316 shows correlation peaks and correlation peak sidelobes, but does not obscure the example by showing noise, amplitude relationships, or other complexities that may exist in such a correlated signal.

In a geophysical embodiment, peaks of correlated signal 316 are related to location of reflectors in the subsurface environment, wherein the relative displacements of the peaks of the correlation signal 316 are related to signal propogation times through the subsurface environment and wherein propogation times are related to depths of the subsurface structures. Therefore, for a geophysical embodiment correlated waveform 316 may be related to four important reflectors at particular depths defined by the distances along correlated signal 316 and where greater depths are represented by greater distances from the left-hand edge of correlated signal 316.

The operation of compositing-before-correlation will now be discussed with reference to FIG. 3B. Pilot signal 310 (FIG. 3A) is shown as pilot signal 318 in FIG. 3B for convenience. Pilot signal 318 is used to ensonify subsurface structures resulting in a first trace signal shown as multiplexed signal MUXED 1 319 which is received and stored by a geophysical exploration system. Multiplexed signal 319 is shown identical to multiplexed signal 315 (FIG. 3A) representing the same subsurface structures as for the example described with reference to FIG. 3A. One difference exists between ideal multiplexed signal 315 and multiplexed signal 319, wherein a noise pulse 322 is introduced into signal 319. Similarly, pilot signal 318 is again used to ensonify subsurface structures resulting in a second multiplexed signal MUXED 2 320 which is received and stored by the geophysical exploration system. Multiplexed signal 320 is shown identical to multiplexed signal 319 except that the noise pulse 322 in multiplexed signal 319 is not included in multiplexed signal 320; vertical line 323 is shown with reduced amplitude; and an additional noise signal 334 is introduced into multiplexed signal 320 to illustrate the effects of random noise. The effects of random noise is shown different between different traces, being multiplexed signal 319 and multiplexed signal 320. Multiplex signals 319-320 may be composited by adding corresponding samples to generate composited signal COMP 321. Corresponding samples of traces 319 and 320 are represented by vertical correspondence, wherein traces 319 and 320 are added together, corresponding vertical point by corresponding vertical point, to form composited signal 321. Composited signal 321 is shown with constant amplitude normalized to a peak amplitude for simplicity, although it should be understood that the amplitude of composited signal 321 is related to the sum-of-the-amplitudes of the trace signals 319 and 320. Noise signals 322 and 334 are not repeated in alternate trace signals and therefore may sum to small signal amplitudes 324 and 326 respectively. Signal amplitude 323 that is shown degraded by noise in trace signal 320 is summed with corresponding race signals to provide corresponding composited sample 325 having a reduced effect of the signal degradation introduced in multiplex signal 320 but not introduced in multiplexed signal 319; wherein the effect of this degraded signal component 323 is reduced by the adding of the non-degraded signal component from multiplexed signal 319. Therefore, it can be seen that compositing operations will reduce effects of random errors such as noise, where the randomness of the noise signal components will integrate to lower amplitudes and the repetitive nature of the actual signal portions will integrate to higher amplitudes, thereby enhancing the signal-to-noise ratio and mitigating the effects of noise and other random type error mechanism.

The operation of correlation may be performed after the compositing operation by correlating composited signal 321, wherein the correlated output signal 327 is similar to correlated output signal 316 (FIG. 3A) except that noise may be reduced and signals may be enhanced through compositing operations.

The operation of compositing-after-correlation will now be discussed with reference to FIG. 3C. Pilot signal 328 is shown identical to pilot signal 310 for simplicity. It is assumed that pilot signal 328 illuminates subsurface structures to generate a first trace signal 319 which is correlated to provide correlated signal 329 similar to correlated signals 316 and 327 and to generate a second trace signal 320 which is correlated to provide correlated signal 331 similar to correlated signals 316 and 327 because of the same subsurface structures being ensonified. Correlated signal 329 is shown with noise signal component 330 and correlated signal 331 is shown with noise signal component 332, wherein noise signals 330 and 332 are not repeated for different correlated signals because of the random nature of the noise. Compositing of the corresponding samples of correlation signal 329 and correlation signal 331 is similar to the compositing of uncorrelated trace signals 319 and 320 which was discussed with reference to FIG. 3B above; wherein the compositing of correlated signals 329and 331 yields composited correlated signal 333. Composited correlated signal 333 does not show the effects of noise 330 from signal 329 nor noise 332 from signal 331 because these noise signal components 330 and 332 were not repeated on other correlated waveforms where their significance is reduced by compositing in signal 333. Therefore, compositing-after-correlation has an effect of enhancement of signal-to-noise ratios similar to compositing-before-correlation.

Prior art systems may perform compositing-before-correlation because the compositing operation is substantially simpler than the correlation operation, wherein compositing involves merely summation of corresponding samples while correlation involves multiplication computations and substantially greater amounts of sum-of-the-products is a complex and time consumming computation when implemented with prior art digital computers. Therefore, prior art systems perform compositing for data compression; where many trace signals are combined to minimize storage and computations and where correlation computations may be performed on the composited signal as discussed with reference to FIG. 3B. The high-speed real-time nature of the correlator of the present invention permits real-time correlation while the trace signals are being received and provides compositing-after-correlation capability yielding substantial advantages over the prior art systems. These advantages include (1) elimination of the requirement for large amounts of compositor memory, where the correlation memory requirements are smaller than the compositor memory requirements; (2) use of different pilot signals to ensonify the subsurface structures; and (3) use of ensonifying signals that are not repeatable such as with dynamite blasts by correlating the pilot signal out of the trace signal before compositing wherein compositing may obscure effects of different pilot signals. Other advantages of the compositing-after-correlation feature of the present invention are discussed elsewhere herein.

Another feature of the present invention will now be exemplified with reference to FIG. 3D. A plurality of chirp signals may be provided as pilot signals for ensonifying subsurface structures. A VIBROSEIS signal generator may be used to generate the plurality of ensonifying signals. For example, a first up-chirp signal 336 may be generated with a first VIBROSEIS and a first down-chirp signal 337 may be generated with a second VIBROSEIS. Alternately, signal 336 and signal 337 may be electronically generated and electronically mixed as discussed for summing or multiplexing circuit 759 with reference to FIG. 7D, wherein MUX signal 342 may have a plurality of different chirp signals multiplexed therein and may be used to excite a VIBROSEIS for generating a multiplexed pilot signal. For simplicity, each chirp signal 336 and 337 are shown lined-up and starting at the same time and having the same chirp envelope. It will be recognized that the teachings of this simplified example are readily expandable to having chirp signals that start at different times, chirp signals having different length chirp envelopes,and other forms of chirp signals that may be multiplexed together.

Multiplexing may be accomplished by electrically combining a plurality of different chirp signals or by implicitely combining a plurality of different signals. For example, the use of a plurality of VIBROSEIS generators each ensonifying the subsurface environment with a different chirp signal provides implicit or implied multiplexing of chirp signals because the different chirp signals impressed on the subsurface environment are combined in the subsurface environment and are effectively multiplexed together. An electronic form of multiplexing will be discussed with reference to FIG. 7D, wherein a plurality of chirp signals are added together electronically with circuit 759 to provide a multiplexed chirp signal.

The plurality of chirp signals 336 and 337 are reflected from subsurface structures,wherein the reflections appear to be multiplexed together as shown for multiplexed signal 342 related to two such reflections. The build-up of multiplexed signal 342 is shown by a first reflection of up-chirp signal 336 and down-chirp signal 337 having a time delay related to the distance of the reflecting structure, wherein SIG 3 338 and SIG 4 339 represent the components of the chirp signals reflected from a first subsurface structure. Similarly, SIG 5 340 and SIG 6 341 represent the components of the chirp signals reflected from a second subsurface structure. Reflected signals 338-341 are shown multiplexed together in time relation therebetween as multiplexed signal 342. Correlation of multiplexed signal 342 with up-chirp signal 336 will detect and separate out up-chirp components of the reflected signal shown by SIG 3 338 from a first reflector and SIG 5 340 from a second reflector to generate output signal 343 in response thereto. Similarly, correlation of multiplexed signal 342 with down-chirp signal 337 will detect and separate out components of the reflected signal shown by SIG 4 339 from a first reflector and SIG 6 341 from a second reflector to generate output signal 344 in response thereto. The correlation output peak signals shown in output signal 1 343 and output signal 2 344 line up vertically in time and phase because the pilot signals chirp SIG 1 336 and chirp SIG. 2 337 are lined up in time and phase and the reflecting structures are detected at the same distances, thereby resulting in the same time intervals between each chirp signal reflection.

Output signal 1 343 and output signal 2 344 may be composited-after-correlation by adding signals 343 and 344 sample-by-sample to generate each of the corresponding output samples of the composited signal 345. Therefore, in accordance with yet another feature of the present invention, FIG. 3D illustrates the generation of a plurality of different pilot signal signatures either simultaneously, overlapping therebetween, or sequentially following each other, receiving and correlation of the multiplexed pilot signals such as to define subsurface structures; and compositing-after-correlation of the correlation output signals to obtain a composite-after correlation signal 345.

In accordance with still another feature of the present invention, noise, sidelobes and other perturbing effects on an output correlation signal may be reduced by compositing a plurality of signals after correlation, wherein each of the composited signals may be related to different correlation pilot signals. For example, correlation output signal 343 is related to up-chirp signal 336 and correlation output signal 344 is related to down-chirp signal 337. The perturbing effects such as noise, sidelobes, and other perturbing effects may be different for different types of pilot signals; wherein compositing-after-correlation may be used to reduce these perturbing signal components by adding the different correlation output signals having different perturbing components and thereby adding the different perturbing components together causing cancellation of these perturbing components therebetween. For example, correlation output signal 343 is shown with sidelobe 346 and correlation output signal 344 is shown with sidelobe 347; wherein sidelobes 346 and 347 may be different therebetween such as caused by different correlation operators. Compositing or adding corresponding samples of correlation output signal 343 and correlation output signal 344 together generate composited signal 345 which may have enhanced signal peaks because the signal peaks are similar and may have reduced perturbing components such as shown in signals 343 and 344. Therefore composited signal 345 may have reduced sidelobe signal 348 and reduced noise and other perturbing effects because of the adding together of different perturbing components from correlation output signal 343 and correlation output signal 344 thereby providing cancellations therebetween.

Separation of different signature signals through correlation is based upon two primary considerations and many secondary considerations. The primary considerations are how well a signature signal correlates with itself and how poorly a signal correlates with other signature signals. For example, if a first signature signal generates a large output signal peak when correlated with a first pilot signal and generates a small output signal peak when correlated with a second signature signal and if a second signature signal generates a large output signal peak when correlated with the second pilot signal and generates a small output signal peak when correlated with the first signature signal, then the first and second signature signals may be separated therebetween through correlation. These characteristics of good signature signals may be described as having good autocorrelation by correlation with the same signature signal and having poor cross-correlation by correlation with the different signature signal for separation therefrom. The secondary considerations may be the signal-to-noise ratio, the number of pilot signal samples, the number of trace signal samples, and others.

One well known code having a good autocorrelation function is a Barker code. A Barker code may be used with the features of the present invention for providing signature signals in accordance with Barker codes.

An arrangement providing a plurality of of chirp generators such as for simultaneously ensonifying a geophysical environment provides advantages such as for generating different signature signals related to different signal characteristics. A correlator arrangement may be provided having a plurality of correlator channels, wherein each correlator channel operates in response to a pilot signal related to a different one of the ensonifying signals to individually separate out the reflections related to each of the ensonifying signals. In an alternate arrangement, a single correlator channel may be provided having a pilot signal that is related to the combination or superposition of a plurality of the ensonifying signals. For example, the plurality of ensonifying signals may include an up-chirp signal and a down-chirp signal transmitted simultaneously and the pilot signal for the correlator may be related to the sum or combination of the up-chirp and down-chirp ensonifying signals for separating out reflections related to the combined or multiplexed up-chirp and down-chirp ensonifying signals. Such an arrangement may be exemplified with reference to FIG. 3D wherein up-chirp signal 336 and down-chirp signal 337 may be used to ensonify a subsurface environment and wherein up-chirp signal 336 may be generated by a first VIBROSEIS and down-chirp signal 337 may be generated by a second VIBROSEIS or, alternately, up-chirp signal 336 and down-chirp signal 337 may be combined electronically such as with the multiplexing arrangement discussed with reference to FIG. 7 hereinafter to form a combination or multiplexed up-chirp and down-chirp signal for exciting a VIBROSEIS to ensonify the geophysical environment.

A plurality of correlators may be provided as discussed with reference to FIG. 3D above for correlating the multiplexed signal 342 with up-chirp signal 336 in a first correlator and with down-chirp signal 337 in a second correlator to generate output signals 343 and 344 respectively which may be composited together to generate signal 345, as discussed in detail above. Alternately, a single correlator may be used for correlating multiplexed signal 342 in response to a multiplexed pilot signal, wherein the multiplexed pilot signal may be a pilot signal having up-chirp signal 336 and down-chirp signal 337 multiplexed together for providing a combination up-chirp and down-chirp pilot signal. Correlating multiplexed signal 342 with the combination up-chirp and down-chirp pilot signal may provide an output signal related to correlation with both, up-chirp signal 336 and down-chirp signal 337; which may be similar to composited signal 345. In view of the above, it may be desirable to generate a plurality of signature signals multiplexed together either by electronics summing or by propagation through a environment and wherein signal components may be separated from multiplexed signal 342 by either (1) correlating with individual pilot signals and compositing the plurality of correlation output signals theretogether or (2) correlating with a composite pilot signal being related to a plurality of signal signature combined theretogether for generating an output signal related to characteristics of each of a plurality of correlation operations.

An arrangement has been discussed with reference to FIG. 3D above for providing compositing-after-correlation associated with chirp pilot signals. In an alternate embodiment, a plurality of ensonifying signals may be provided such as with dynamite blasts or other characteristic signatures. The signature of an ensonifying signal may be determined by monitoring the signals and loading a pilot signal memory such as pilot signal memory discussed with reference to FIGS. 4 and 6 hereinafter. The acquired pilot signal may then be used to correlate with a related trace signal for identification of subsurface reflectors. In accordance with the composite-after-correlation feature of the present invention, subsequent ensonifying signals may be stored as pilot signals for correlation of subsequent trace signals to provide compositing of a sequence of trace signals associated with different ensonifying signals such as with sequential dynamite blasts. In a first embodiment, a dynamite blast may be initiated and the pilot signal signature thereof may be monitored and stored in a pilot signal memory, followed by correlation of the stored pilot signal with a related trace signal related thereto for updating output signal samples. After completion of correlation of a first trace signal, a second dynamite blast may be initiated and the pilot signal signature monitored and stored in the pilot signal memory, followed by correlation of the stored pilot signal with a trace signal related thereto for updating output signal samples; wherein correlation of the second trace signal with the second pilot signal may composite output samples of the second correlation with out samples of the first correlation. Similarly, a plurality of sequential dynamite blasts may be initiated, sampled to generate related pilot signals, correlated with the related trace signals, and then composited with prior correlation output signal samples in an output signal memory arrangement as discussed with reference to FIG. 6 hereinafter.

In an alternate embodiment, a plurality of ensonifying signals such as dynamite blasts may be initiated in sequence, wherein each ensonifying signal may be monitored and stored in a different pilot signal store. It may be desirable to provide each ensonifying signal in sequence without overlap therebetween to permit convenient detection and sampling of each ensonifying signal without being overlapped and obscured by other ensonifying signals, where ensonifying signals such as dynamite blasts may have a relatively short duration compared to the propagation time through the ensonified environment. In such an embodiment, reflections of each of the ensonifying signals from subsurface structures may be superimposed or multiplexed theretogether and receive as a multiplexed trace signal. The plurality of pilot signals sampled in response to the plurality of ensonifying signals may each be correlated with the single trace signal which has all reflections multiplexed together; wherein the correlated output signals associated with each correlator channel may be related to reflections associated with a particular one of the dynamite blasts. The plurality of correlation output signals from the plurality of channels may be composited theretogether such as by updating output signal samples with an update circuit and output sample memory common to each of the plurality of correlator channels, as will be further discussed with reference to FIG. 6 hereinafter.

In still another embodiment, a plurality of VIBROSEIS signal generators may simultaneously ensonify the subsurface environment wherein each of a plurality of VIBROSEIS generators may be positioned at a different shotpoint and may generate different ensonifying signals. For example, a first VIBROSEIS generator at a first shotpoint may generate up-chirp ensonifying signals and a second VIBROSEIS generator at a second shotpoint may generate down-chirp ensonifying signals. A geophysical exploration system in accordance with the present invention may provide a multi-channel correlator for correlating reflected seismic signals with an up-chirp pilot signal in a first correlator channel and with a down-chirp signal in a second correlator channel to provide a plurality of correlation output signals each being related to a different shotpoint. This simultaneous ensonification from a plurality of shotpoints provides enhanced productivity, as will be discussed in detail in the section on a multiple shotpoint arrangement provided hereinafter.

In yet another alternate embodiment, a plurality of explosive signals may be provided at different shotpoints, wherein the explosive signal at each shotpoint may have a characteristic signature that is different from the characteristic signatures of explosive charges at other shotpoints for separation therebetween through correlation, as discussed above for simultaneous VIBROSEIS ensonification at each of a plurality of shotpoints. In yet another alternate embodiment, each explosive blast may be initiated in sequence without having overlapping therebetween such as for providing a first blast at a first shotpoint and then providing a second blast at a second shotpoint, wherein the second blast may not be initiated until after the first blast has been completed. Although the ensonifying blasts may not be overlapping, the reflected signals from each of the ensonifying blasts from different shotpoints may be overlapping therebetween. An arrangement may be provided for sampling each of the ensonifying explosions at each of the shot-points and for storing the sampled ensonifying explosion as a correlator pilot signal. Seismic reflections from subsurface reflectors related to the plurality of ensonifying blasts from different shotpoints may be multiplexed together as they propogate through the subsurface environment and may be received as a multiplexed signal having reflected seismic signals related to ensonifying signals from each of a plurality of shotpoints reflected from each of a plurality of subsurface reflectors. A multi-channel correlator may provide correlation in response to each of a plurality of pilot signals wherein each pilot signal may have been derived by monitoring the ensonifying signals for each of the shotpoints. Therefore, simultaneous ensonification from a plurality of shotpoints may be provided with explosive generators in place of the VIBROSEIS generators discussed above. This simultaneous ensonification from each of a plurality of shotpoints and separation of reflected seismic signals related to the different shotpoints is discussed in detail herein in the section on the multiple shotpoint arrangement.

DESCRIPTION OF FIG. 4

A hardware embodiment of a correlator in accordance with the present invention will now be discussed with reference to FIG. 4. A pilot signal register 412 and a trace signal register 417 are provided for storing pilot signal samples and trace signal samples respectively. Input circuitry 423 may be used to load or recirculate the pilot signal samples and the trace signal samples. Computational circuitry 413, 419, and 420 are used to update output signal samples stored in registers 421.

A pilot signal may be received with squaring amplifier 410 to provide a single-bit digital squarewave signal to input gates 411 enabled by the LOAD P signal through inverter 414. As digital register 412 is clocked, the squarewave pilot signal from amplifier 410 is sampled or shifted into register 412 to load single-bit pilot signal samples into register 412. Similarly, a trace signal may be processed with squaring amplifier 415 for input to trace shift register 417 through selection gate 416 in response to the LOAD T signal through inverter 418. In this manner, registers 412 and 417 cane loaded with single-bit pilot signal samples and single-bit trace signal samples. In an alternate embodiment,squaring amplifiers 410 and 415 may be replaced with analog-to-digital converters for generating whole-number multi-bit samples for storage in registers 412 and 417. For simplicity of illustration, a single-bit correlator is discussed with reference to FIG. 4.

After the pilot and trace signals are loaded into registers 412 and 417 respectively, the LOAD P and LOAD T signals may be controlled to be high to disable the loading of new pilot and trace signals through gates 411 and 416 respectively as disabled by inverters 414 and 418 respectively and to enable the recirculation or feedback path into registers 412 and 417 respectively. The pilot signal in register 412 and the trace signal in register 417 may be recirculated to provide access to the desired pilot signal and trace signal in registers 412 and 417 respectively to provide the multiplication operation with exclusive-OR (XOR) circuit 419 such as an S/N 7486 exclusive-OR circuit and a summation operation with counter 420. As the pilot signal samples in register 412 and the trace signal samples in register 417 are recirculated, the pilot signal samples are shifted one-bit to the left with an extra time delay imposed by flip-flop 413; wherein the pilot signal samples stored in register 412 are processed one-bit per recirculation with respect to the trace signal samples stored in register 417 to effectively shift the pilot signal samples along the trace signal samples,as discussed with reference to Table III above. As each pilot and trace signal becomes available from registers 412 and 417 respectively, a one-bit multiplication is provided with exclusive-OR circuit 412 to provide command signal 424 to counter 420 to control updating of the output signal sample in register 421. Command signal 424 may command counter 420 to either increment or not-increment the count for an embodiment using an up-counter such as S/N 7490 or S/N 74163 up-counters. Alternately, command signal 424 may command counter 420 to either increment or decrement the count for an embodiment using an up-down counter such as S/N 74190 or S/N 74192 counters. Alternately, the command signal 424 may command counter 420 to either decrement or non-decrement the count for an embodiment using a down-counter such as S/N 74190 and S/N 74192 counters operating in a down-counter mode. Such counter operations are discussed in greater detail with reference to Z-counter 613 with reference to FIGS. 6D and 6E hereinafter and for other counter arrangements herein.

If output signals from registers 412 and 417 are the same, either both zeros or both ones; command signal 424 will be a zero and if the outputs of registers 412 and 417 are different, wherein one of the signals is a one and the other signal is a zero, then command signal 424 will be a one. Counter 420 may be incremented in response to a zero-state of signal 424 and may not be incremented for a one-state of signal 424 for the above mentioned up-counter embodiment. Therefore, the greater the magnitude of an output signal sample in counter 420 or in registers 421, the greater the correlation between the trace signal and the pilot signal and the lower the magnitude of an output signal sample in counter 420 or in registers 421, the less the correlation between the trace signal and the pilot signal. If an inverter is placed in any one of the signal paths into or out of exclusive-OR gate 419, the counter information will be inverted wherein counter 420 and registers 421 will then have a sample magnitude that is the inverse of the sample magnitudes discussed above.

Each recirculation of the pilot signal in pilot register 412 and of the trace signal in trace register 417 provides a single comparison or a single output signal sample, as shown for each row in Table III. Counter 420 is shown being loaded from registers 421 and being unloaded into registers 421, wherein a sequence of output signal samples such as samples $Z_0$–$Z_{12}$ (Table III) may be stored in counter 420 and registers 421. In an embodiment related to Table III, registers 421 may comprise 12 16-bit registers and counter 420 may comprise one 16-bit counter totaling storage for thirteen output signal samples; wherein registers 421 and the counter 420 are recirculated similar to that shown for recirculation around registers 412 and 417 to sequentially load the next output signal sample in sequence from registers 421 into counter 420 and to load the last prior updated sample from counter 420 into register 421. This loading and storing of the contents of counter 420 may be accomplished once per recirculation of registers 412 and 417, wherein the plurality of comparisons between the pilot signal in register 412 and the trace signal in register 417 are each used to control the incrementing or non-incrementing of counter 420 in response to the comparison for each bit of the pilot signal and the trace signal stored in registers 412 and 1 417. Therefore, for each recirculation of registers 412 and 417, counter 420 updates an output sample related to a plurality of comparisons made with gate 419 between the pilot signal in register 412 and the trace signal in register 417. For the next subsequent recirculation, the last updated output signal sample from counter 420 may be stored in registers 421 and the next output signal sample in sequence may be loaded from registers 421 into counter 420 for updating during the next sequential recirculation of registers 412 and 417 under control of command signal 424 from exclusive-OR gate 419.

Figure 4:
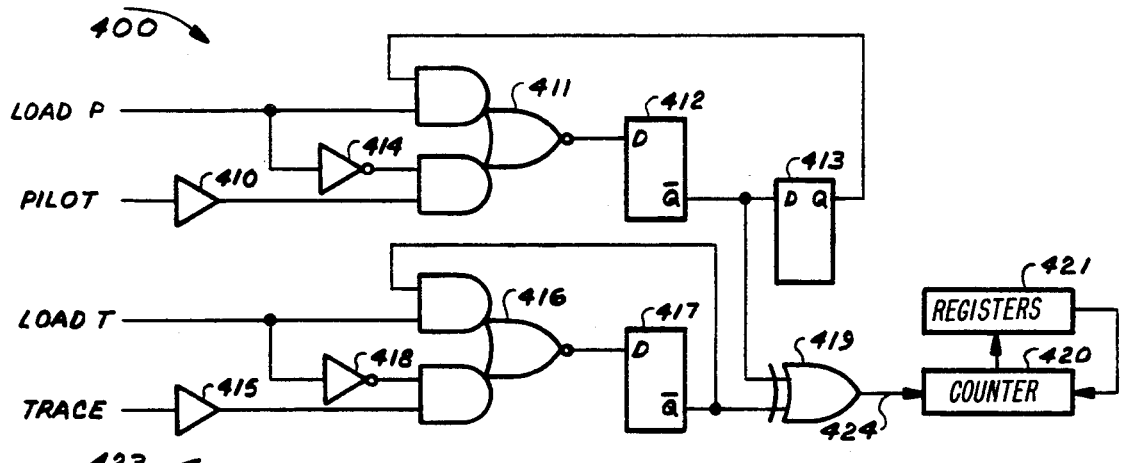
FIG. 4 illustrates a single-bit correlator mechanization in accordance with the present invention.

The computational and output memory arrangement using exclusive-OR gate 419, counter 429, and registers 421 has been described briefly for simplicity with reference to FIG. 4 above to illustrate the single-bit correlation algorithm of the present invention. This computational output arrangement will be discussed in greater detail for an alternate embodiment of the single-bit correlation algorithm with reference to FIG. 6 hereinafter.

Because AND-OR-NOT circuits 411 and 416 generate inverted outputs, the pilot and trace signal samples stored in registers 412 and 417 are stored in inverted or ones-complement form. Therefore, by obtaining the output on the $\overline{Q}$ output line of registers 412 and 417, the inverted information in registers 412 and 417 may be again inverted to provide non-inverted outputs from registers 412 and 417.

Control logic may be provided for the arrangement shown in FIG. 4, wherein such control logic is well known in the art. Further, analog signal processing arrangements may be provided in a form similar to that shown in FIG. 2A. Further, prior art arrangements can readily be modified to permit one of ordinary skill in the art to practice the teachings of the present invention. One such prior art arrangement is the MW-10 system manufactured by Real Time Geophysics Inc of Norwood, Mass. wherein the documentation related thereto is incorporated by reference.

The arrangement shown in FIG. 4 uses well known components where squaring amplifiers 410and 415 may be μ A710 comparators; inverters 414 and 418 may be S/N 7404 inverters; AND-OR-NOT gates 411 and 416 may e S/N 7451 gates; shift register 412 and 417 may be S/N 7491A circuits or may be well known MOS-FET shift register circuits; D flip-flop 413 may be an S/N 7474 circuit; exclusive-OR circuit 419 may be an S/N 7486 circuit; counter 420 may be a plurality of 4-bit up-counter circuits such as S/N 7490 or S/N 74163 circuits or a plurality of 4-bit up-down-counter circuits such as S/N 74190 or S/N 74192 circuits; and registers 421 may be a plurality of parallel-input parallel-output register circuits such as S/N 74174 circuits, or 74175 circuits, or a random access memory (RAM) such as S/N 74200 circuits, or a plurality of shift registers such as S/N 7491A circuits, or other well known register or memory circuits.

DESCRIPTION OF FIG. 5A

The features of the correlator of the present invention will now be illustrated with an example using a general purpose computer embodiment. The present invention provides many important features that will be exemplified therewith including real-time correlation, time-domain correlation, compositing-after-correlation, and other features.

The system of the present invention has been discussed with reference to FIG. 1B above for a combination correlator and compositor arrangement and with reference to FIGS. 2A and 2B above for a stored program computer implementing the digital data processing operations including correlation and compositing. In particular, signal processor 112 is shown in FIG. 2B including a multiplexer 220 and 221 and an ADC 222 while the correlator-compositor arrangement 121 (FIG. 1B) is shown in the form of a general purpose computer 223. Any well known general purpose stored program computer may be used such as the PDP-11 computer and associated interfaces and peripherals supplied by Digital Equipment Corp of Maynard, Mass. and the SPC-16 computer and associated interfaces and peripherals supplied by General Automation of Ansheim, Calif. Alternately, the SPC-16 computer implementation of the CAFDRS system may be modified to practice the teachings of the present invention. In a preferred embodiment, the computer system of copending patent application Ser. No. 101,881 referenced above and continuations therefrom, incorporated herein by reference, may be used to practice the teachings of the present invention.

Figure 2B:
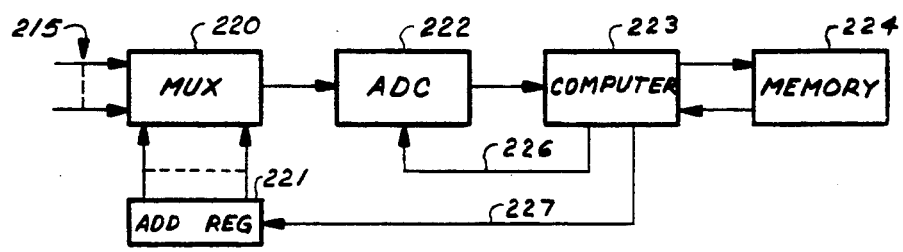
FIG. 2B illustrates a converter in more detail in accordance with FIG. 2A.

The correlator arrangement shown in FIG. 2A uses a computer to implement a correlation algorithm under program control. Such a software correlation embodiment is described herein because of the simplicity in illustrating the features of the present invention. From the teachings of this example, those of ordinary skill in the art will be able to practice the present invention with other embodiments such as special purpose logical embodiments.

Figure 5A:
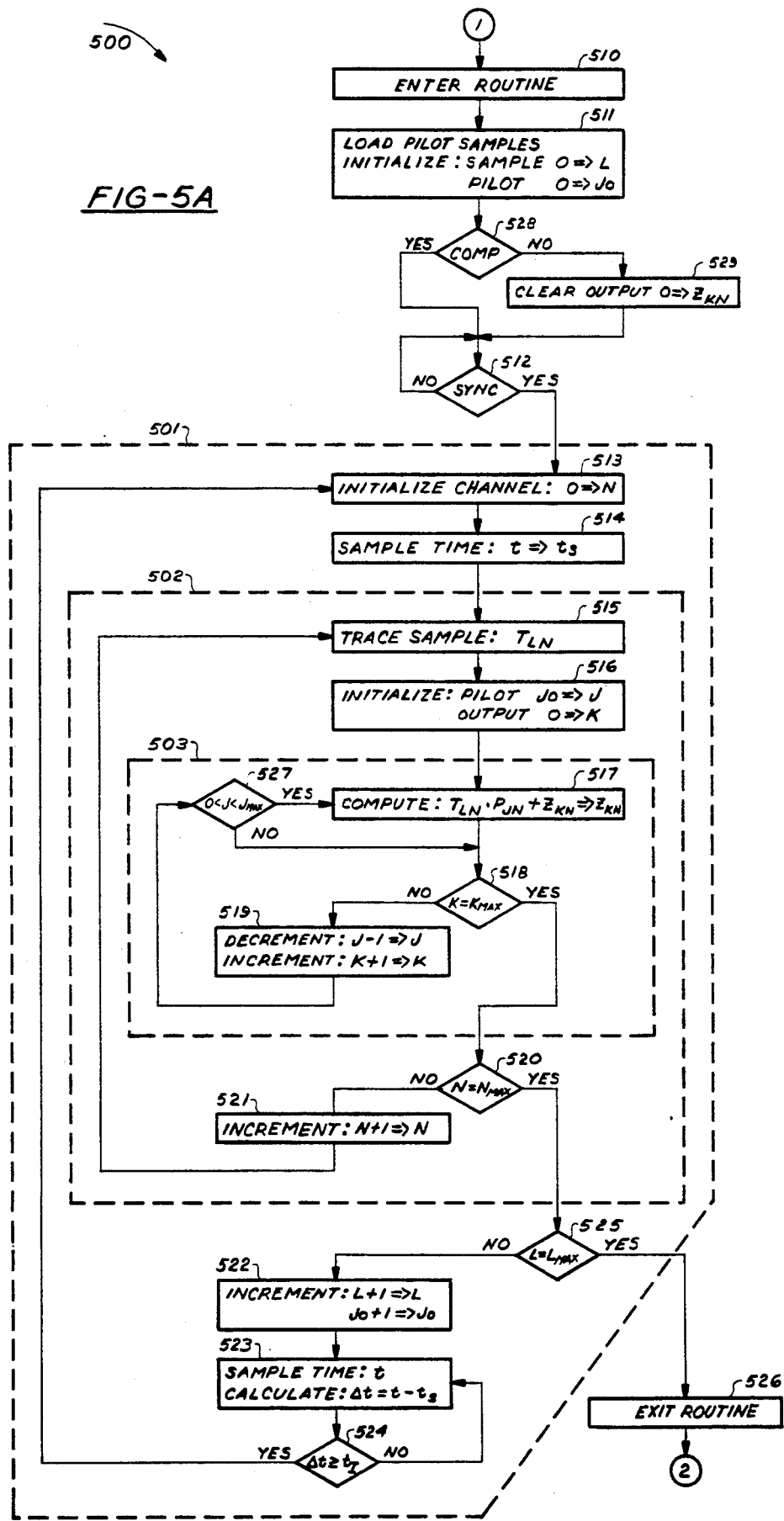

A flow diagram is provided in FIG. 5A illustrating the operation of a correlation algorithm in accordance with the present invention. This algorithm may be implemented in a software form with a general purpose digital computer or in a hardwired logic form with a special purpose logical arrangement. For simplicity of discussion, the implementation of the flow diagram set forth in FIG. 5A will be exemplified with a software embodiment using a stored program computer.

System 200 (FIGS. 2A and 2B) provides for implementing the correlation algorithm shown in flow diagram form in FIG. 5A. A plurality of channels 215 are received with multiplexer 220 for selecting one of said plurality of channels for input to a correlator. Trace signals 215 may be preprocessed such as with analog signal processors 112 including amplification and filtering. A particular trace channel is selected with multiplexer 220 in response to an address placed in an address register 221 to address the desired channel. The selected channel is processed with ADC 222 to generate a digital signal to computer 223 in response to the analog signal from multiplexer 220. Computer 223 may control multiplexer 220 by transmitting an address to address register 221 to select one of a plurality of input channels 215 with multiplexer 220. Computer 223 may also control operation of the ADC 222 with ADC control signals 226. Computer 223 operates with memory 220 for accessing and for storing digital information including a stored program for operating computer 223 and including correlation output signal samples and correlation pilot signal samples. MUX 220 may be implemented with a plurality of analog switches such as FET switches selected with address decoding logic for decoding a desired address from address register 221 to select an appropriate analog switch for communicating the selected input channel 215 to the output of MUX 220. ADC 212 may be a conventional whole-number successive approximation ADC or may be a single-bit ADC as described in detail hereinafter. Computer 223 may be any well known stored program digital computer and memory 224 may be any well known memory arrangement such as a core memory, a disc memory, a tape memory, or combinations thereof.

In one embodiment, system 200 may be implemented with equipment sold commercially by Digital Equipment Corporation of Maynard, Mass.; wherein computer 223 may be the PDP-11 computer, memory 224 may be the PDP-11 computer main memory in a core memory form and may also be peripheral memory such as well known tape and disc memories using interface memory controllers provided by Digital Equipment Corp. Further, input signal processors MUX 220 and ADC 222 may be commercially available devices such as provided for use with said PDP-11 computer by Digital Equipment Corp. Alternately, an addressable MUX 220 and a controllable ADC 222 operating in conjunction with a stored program computer 223 under program control is presented in copending patent applications incorporated herein by reference. Therefore, from the disclosures set forth herein with reference to FIGS. 2A, 2B, and 5A and other disclosures thereof; one or ordinary skill in the art will be able to practice the present invention.

The flow diagram set forth in FIG. 5A represents a real-time correlation algorithm for a plurality of input trace signals processed in a time-shared manner. A plurality of iterative loops are provided to process each sample for each trace signal, which will now be briefly described and which is described in detail hereinafter. Inner loop 503 iteratively processes a particular trace signal sample $T_L$ with each of the pilot signal samples $F_J$ to update the output signal samples $Z_K$ for the particular channel M. Middle loop 502 sequences across a plurality of trace signal channels N to obtain a trace signal sample $T_{LN}$ from each of the plurality of trace signals for a substantially constant sample time; wherein each spacial-domain sample across the array of trace signals is iteratively processed with the appropriate pilot signal samples $P_{JN}$ with inner loop 503. Further, outer loop 501 is used to control sampling in the temporal-domain. Therefore, each iteration through outer loop 501 selects the next sequential sampling time $t_S$; each iteration through middle loop 502 selects a sample from each of the trace signal channels N for the sample time interval controlled with outer loop 501; and each iteration through inner loop 503 selects a pilot signal sample for processing the trace signal sample that was selected with middle loop 502 for the time interval samples selected with outer loop 501.

Assuming that there are J pilot samples, N trace channels, and L sample time intervals; inner loop 503 iterate to process the quantity of J pilot samples for each of the N channel trace signal samples selected with inner loop 502, for each of the sampling intervals selected with outer loop 501; yielding a total number of J iterations through inner loop 503 for each of N iterations through middle loop 502 for each of L iterations through outer loop 501 for a total of J·N·L iterations through inner loop 503 to implement a compete correlation computation.

A symbolic notation will now be defined for simplicity of describing correlation algorithms. A trace signal sample may be designated with a symbol T having the appropriate subscripts to designate the spacial-domain channel N and the temporal-domain sample L. Similarly, a pilot signal sample may be designated with a symbol P having the appropriate subscripts to designate the spacial-domain channel N and the temporal-domain sample J. Similarly, an output signal sample may be designated with a symbol Z having the appropriate subscripts to designate the spacial-domain channel N and the temporal-domain sample K. Therefore, temporal-domain samples for the trace signal, the pilot signal, and the outputs signal are designated with the subscripts L, J, and K respectively and the spacial-domain channel is designated with the subscript N. Therefore, a trace signal sample may be designated $T_{LN}$ for defining the temporal-domain trace signal sample L from the spacial-domain trace channel N. Similarly, a pilot signal sample may be designated $P_{JN}$ for defining the temporal-domain pilot signal sample J from the spacial-domain pilot channel N. Similarly, an output signal sample may be designated $Z_{KN}$ for defining the temporal-domain output signal sample K from the spacial-domain channel N. Therefore, subscripts L, J, and K define the temporal-domain designation of the sample for the trace signal, pilot signal, and output signal respectively for a particular channel N.

The subscript N may be used to designate the channel when appropriate such as for an embodiment having a plurality of different channels but the subscript N may be eliminated for simplicity of discussion and when the channel designation is not needed.

The subscript notation discussed above may have particular significance to a computer programmer because the subscripts may be used as indicies for multi-level indexing. For example, the stored pilot signal samples $P_{JN}$ and the output signal samples $Z_{KN}$ may be stored in sections of memory called pages or blocks in the form of tables, wherein the index N may identify a table of samples in a page or block of memory for a particular channel and wherein the J or K subscript associated with the pilot signal sample and output signal sample respectively may identify the sample from the table. In a simple embodiment, the subscript N may represent the more significant portion of an index parameter and the subscript J may represent the less significant portion of an index parameter; wherein first indexing of a pilot sample address with the N-index will address the appropriate block of memory and second indexing of the indexed pilot sample address with the J-index will address the location in the block of memory storing the desired pilot signal sample or first indexing of an output sample address with the N-index will address the appropriate block of memory and second indexing of the indexed output sample address with the K-index will address the location in the block of memory storing the desired trace signal sample.

The software embodiment of the correlator algorithm of the present invention will now be described with reference to FIG. 5A. FIG. 5A may represent either a software embodiment or a hardware embodiment. In a software embodiment, FIG. 5A may be used as a computer flow diagram which may be coded in any well known instruction set for general purpose digital computers such as the Digital Equipment Corp PDP-11 mini-computer. In a hardware embodiment, FIG. 5A may represent a state diagram executed under control of special purpose logical counter and decoder control arrangements for sequencing through a plurality of states in iterative or repetitive form, where each state represents one or more operations performed in response to the state control signals. Therefore, the teachings of the present invention described with reference to FIG. 5A may be implemented in either a software embodiment or a hardware embodiment by those of ordinary skill in the art from the teachings provided herein. Further, a hardware embodiment is discussed herein with reference to FIG. 5B using many of the teachings set forth in the discussions referenced to FIG. 5A but departing from FIG. 5A for both, simplicity of discussion and for teaching of an alternate embodiment.

Flow diagram 500 may be exemplified with the computation algorithm shown in Table III and Table IV, where flow diagram 500 will be further discussed hereinafter with reference to examples set forth in Table III following the generalized description of flow diagram 500.

A plurality of iterative or repetitive loops are shown in FIG. 5 to iteratively generate or build-up partial correlation solutions until all of the input trace samples have been received and processed for completing the solutions. A plurality of loops are provided within other loops to show the various stages of data processing. Inner loop 503 provides for processing each trace signal sample for each channel with the complete set of pilot signal samples. Middle loop 502 provides for sequencing across an array of channels or traces to setup the processing for each sample of each channel, wherein each trace sample of each channel is processed with inner loop 503 for the particular sample selected with middle loop 502. Outer loop 501 provides for sequencing through a plurality of trace samples in the temporal-domain or time-domain, wherein each temporal-domain sample including a sample from each of the plurality of channels is processed with middle loop 502 to select each channel sample in sequence and each channel sample is processed with each of a plurality of pilot samples with inner loop 503. Therefore, flow diagram 500 provides iterative loops within iterative loops for efficient implementation of the real-time correlation algorithms of the present invention in either software or in hardware. In a software embodiment; iterative loops 501, 502, and 503 may be programmed as subroutines having calling sequences to setup initial conditions of the subroutine as shown in flow diagram 500 and as discussed in detail hereinafter. Programming of various levels of subroutines; shown with operations 501, 502, and 503, is well known in the prior art and may be defined as nesting of subroutines wherein the nested subroutines shown in flow diagram 500 are programmable by those or ordinary will in the art from the teachings of the present invention.

The correlation routine may be programmed as a reenterant routine under control of an executive program for time-shared operation or may be programmed as a dedicated routine such as with a general purpose digital computer performing only the correlation operations. In a dedicated embodiment, entrance point 1 may be operationally connected to exit point 2. In a reentrant routine operating under control of a time-shared executive routine, the executive routine may transfer to point 1 to enter correlation program 500 and correlation program 500 may return to the executive routine from points 2.

Flow diagram 500 will be discussed herein in the form of a reentrant subroutine under control of an executive routine for simplicity of discussion. The executive routine may transfer to the correlation routine entered at point 1 through operation 510. A calling sequence may be implemented in operation 510 to store the return address and to provide other overhead or executive operations. Correlation operations may be initialized in operation 511 where initialization may include loading of pilot signal samples and zero-setting the trace sample parameter L and the pilot start sample parameter Jo. The pilot signal samples may be stored in an off-line memory such as a disc or tape memory and may be accessed with well known computer arrangements. Alternately, computer 223 may sample the pilot signal such as with multiplexer 220 and ADC 222. Pilot samples may be whole-number samples such as 5-bit or 16-bit samples or may be single-bit samples such as one-bit samples described herein. Pilot signal samples may be stored in a main computer memory such as a core memory in sequential addresses such as for well known table lockup operations and for convenient indexing through the table of pilot signal sampler with an index parameter which may be related to the pilot signal sample parameter J as discussed hereinafter. Initialization of trace sample parameter L to a zero defines that the first sample in time will be processed first and wherein the L-parameter may be incremented from the zero initial condition as the correlation computation progresses to subsequent time-domain trace signal samples. The pilot start sample parameter Jo may be initially set to zero and may be incremented as the computation progresses, as described for the L-parameter above.

The program may next test a composite command in operation 528 to determine if compositing-after-correlation is required. If compositing-after-correlation is not required, the program may branch along the NO path to clear the output sample memory in operation 529. Clearing of a memory is a well known prior art operation and may be performed with an iterative loop incrementing through memory addresses and clearing the addressed locations. If compositing-after-correlation is required, the memory storing the output signal samples from the last correlation is not cleared but is preserved, wherein the program will loop around operation 529 along the YES path to last for a start signal in operation 512 without clearing output memory in operation 529. This compositing control operation is discussed further with reference to operation 517 hereinafter.

The correlation program may be synchronized with the input trace signal, where synchronization may be performed with a sync pulse tested in operation 512. If a sync pulse is not detected, the program may loop back around test 512 as a delay until a sync pulse is detected. When a sync pulse is detected in operation 512, the program will branch to outer loop routine 501 to process the trace signal samples. In one embodiment, the sync pulse may be received as a discrete input (DI) detected with a skip-on-discrete (SD) instruction in operation 512. If the discrete sync pulse is not detected, the program will execute a transfer (TR) instruction following the SK-instruction which will loop back along the NO path to wait for a sync pulse. If a sync pulse is detected with an SD-instruction, the program will skip over the transfer instruction and follow the YES path to commence with the processing of trace signal samples.

When the sync pulse is detected in operation 512, the program will branch to outer loop routine 501 to process sequential trace signal samples for a plurality of parallel trace channels. Routine 501 begins with an initialization operation 513 to initialize the computation to channel zero (N=0). Because of the real-time nature of the sampling and processing of trace signals, time t will be measured in operation 514 and stored as time sample $t_S$. After processing the samples for a particular sample interval, the program may delay until the next sample time prior to iterating through the outer loop 501 for the next subsequent set of acquired samples, as will be discussed for operations 523 and 524 hereinafter. Timing may be performed with an off-line real-time clock, by counting time with the program, or by considering the delays implicit in the program as is well known in the prior art.

After initializing the outer loop 501 for a particular time interval in operations 513 and 514, middle loop routine 502 will be executed to process each time related sample for each of the plurality of channels, where the program sequences through the plurality of channels with operations 515 and 516 and performs correlation computations on a single trace sample for a single channel with inner loop routine 503 before looping back to operation 513 to again initialize the outer loop 501 for the next sequential sample for each channel.

Middle loop 502 may be entered from operation 514 of outer loop 501 to load a trace sample in operation 515 and to initialize the computation for processing that sample in operation 516. Trace sample $T_{LN}$ is obtained from channel N in the sequence of channels for each time related sample L. Middle loop 502 iteratively processes samples from each of the plurality of channels N for each sample time period L by continually looping back to operation 515 for each subsequent channel N associated with a particular time interval L.

Inner loop 503 may be initialized in operation 516 to define the starting pilot signal sample with $P_{Jo}$ and to define the starting output signal sample with $Z_0$. Inner loop 503 then iteratively updates each of the output signal samples $Z_K$ starting with output signal sample $Z_0$ with each of the related pilot signal samples $P_J$ starting with pilot signal sample $P_{Jo}$. The pilot signal sample address J is decremented for each iteration, analogous to the shifting of the pilot signal past the incoming trace signal as discussed above for the correlation algorithms.

Inner loop 503 provides processing for each input trace sample with all of the appropriate pilot samples for that channel and provides for exiting inner loop 503 when the last output signal sample has been updated with the product of the related pilot signal sample and the particular trace signal sample. Updating of each output signal sample is performed by multiplying the trace signal sample $T_{LN}$ and the appropriate pilot signal sample $P_{JN}$, then adding the product thereof to the related output sample $Z_{KN}$, and then storing the updated output signal sample $Z_{KN}$ in the related storage location.

The trace signal sample $T_{LN}$ and the pilot signal sample $P_{JN}$ may either or both be a single-bit sample, a ternary sample, or a digital whole-number sample and the product thereof may be a single-bit sample, a ternary sample, or a whole-number sample. This product may be added to the least significant portion of the output signal sample $Z_{KN}$ which is accessed from memory. The updated output signal sample $Z_{KN}$ is then stored back into memory. The pilot sample $P_{JN}$ and the output sample $Z_{KN}$ may be accessed from memory and stored in memory with well known technique such as table-lookup techniques, wherein the subscripts K, J, and N may be used as index operators for indexing through a table of parameters. Output signal sample $Z_{KN}$ may be accessed from a stored table with multi-level indexing such as indexing to the appropriate section of memory related to the channel N and indexing to the appropriate sample K within that channel N with multi-level indexing using index operators K and N. Adding of the product $T_{LN} \cdot P_{JN}$ to the output sample $K_{KN}$ may be performed without roundoff, thereby permitting the updated output sample $Z_{KN}$ to build-up to a grater precision than available in the resolution of the product, as discussed in detail above.

If correlation output memory had been cleared in operation 529 above, then the first execution of operation of 517 for each output point would fetch a zero value for $Z_{KN}$ because the output memory location $Z_{KN}$ had been zero-set in operation 529 for correlation without compositing. Therefore, the output signal samples in storage locations $Z_{KN}$ will buildup from zero for the signal correlation operation being implemented. If compositing-after-correlation is selected with test 528, then the program will branch along the YES path to bypass operation 529 to preserve the results of prior correlation operations. The new correlation updates for a new correlation computation may be added to the corresponding output signal samples from prior correlation computations, wherein correlation updates from the present correlation computation may be used to update the output signal samples from a prior correlation computation for implementing compositing-after-correlation. Therefore, the effects of compositing-after-correlation of two independent trace signals is similar to the mere correlation of a single trace signal with a pair of operators or the correlation of a double-length trace signal with a single operator; wherein the system of the present invention improves correlation with compositing-after-correlation operations.

After performing the partial sum-of-the-product computation in operation 517, the program branches to operation 518 to test the K-parameter to determine if the K-parameter is equal to Kmax, indicative of the last output sample $Z_{Kmax}$ for a particular channel N being processed. If the last output signal sample has not been processed, operation loops back to sequence through the set of output samples $Z_{KN}$ and related pilot samples $P_{JN}$ to complete the processing for the particular trace signal sample $T_{LN}$ through operations 519 and 527. When the last output signal sample for the particular channel has been updated, indicated by the K-parameter being equal to the Kmax-parameter, the program branches to operation 520 to exit the inner loop 503 for iteratively looping back through middle loop 502 or outer loop 501 or for exiting the subroutine if the correlation operations have been completed.

If the K-parameter is not equal to the Kmax-parameter as tested in operation 518, then additional output samples must be updated for the particular trace signal sample. This iterative sequence progresses to operation 519 for decrementing the J-parameter, which is related to the shifting of the pilot signal, and for incrementing the K-parameter which is related to the updating progression through the output samples. This operation of decrementing the J-parameter and incrementing the K-parameter can be better understood with the discussion referenced to Table III above.

Many computations associated with this algorithm may be eliminated with the test set forth in operation 527, wherein computations may be eliminated that are related to the blank spaces shown in Table III which do not have pilot signal samples $P_0$–$P_3$ associated therewith and which therefore represented the absence of an output signal update requirement. If a pilot signal sample is within the scope of the computation indicated by the pilot signal parameter J being in between 0 and Jmax, the appropriate output signal sample $Z_{KN}$ must be updated with the product of the pilot signal sample $P_{JN}$ and the trace signal sample $T_{LN}$ as performed in operation 517. If the pilot signal parameter J is outside of the range from 0 to Jmax such as with a negative value of J, then output signal sample $Z_{KN}$ should not be updated in the computation of operation 517. Therefore, computational time may be saved by skipping the correlation computation shown in operation 517 for a J-parameter outside of the computational range as defined with operation 527, where a pilot signal parameter J outside of the range of the computation causes the program to branch along the NO path directly to operation 518 instead of to operation 517 in order to save computational time and to avoid undesirable updates of the output signal. The program iteratively progresses each trace signal sample within inner loop 503 to sequentially update a plurality of output signal samples in response to a plurality of pilot samples within the range of the computation for each input trace signal sample of each channel and the program skips the computation in operation 517 and merely increments through the iteration for pilot signal sample parameters J outside the range of the computation.

When inner loop 503 has increment through all of the output signal samples for a particular trace signal sample, as determined by K equalling Kmax in operation 518, the program exits inner loop 503 through operations 520 and 521 to loop back to operation 515 for processing of samples of the other channels for a particular sample interval and then through operations 520, 525, 522, 523, and 524 to operation 513 for processing of samples of subsequent sample intervals after all channels have been processed for a particular sample interval.

After a particular trace signal sample has been processed to update the output signal samples for a particular channel in inner loop 503, the program loops back to operation 515 in middle loop 502 to sequence through each of the N-channels for a particular sample time L. A test is made in operation 520 to determine if the trace signal sample just processed with inner loop 503 is the sample for the last channel Nmax. If the sample for the last channel Nmax has just been processed, the program branches along the YES path from operation 520 to exit middle loop 502 for processing trace signal samples for the next time period. If the trace signal sample just processed with inner loop 503 is not from the last channel Nmax, then the program branches along NO path from operation 520 to operation 521 to increment the N-parameter to identify the next sequential trace channel and to loop back to operation 515 in middle loop 502 to iteratively select the next trace channel for correlation with the pilot signal in inner loop 503. Middle loop 502 provides iterations to process the particular time interval samples for each of a plurality of trace channels in sequence until the last channel has been processed for that time interval, at which time middle loop 502 is exited through operation 520 to wait for and to process the samples for the next sample time interval.

After processing each trace signal sample with inner loop 503 for each of the N-channels for the same time interval as controlled with middle loop 502, the program branches out of the middle loop 502 to operation 525 to determine if the last processed time interval sample L is the last time interval sample Lmax which must be processed. If the last sample has been processed, the program branches out of outer loop 501 to operation 526 for exiting the correlation routine through point 2. Exiting of the routine is indicative of completion of the correlation for each of the trace signals. Exiting of routine 500 may be performed by accessing a return address and transferring indirect to this return address location which may be an executive routine location for commencing with executive routine operations.

If the test in operation 525 shows that the last time interval sample Lmax has not been processed, wherein L is not equal to Lmax; then the program branches to operation 522 to increment the trace signal parameter L to the next sample and to increment the pilot signal start sample Jo for outer loop processing of the next set of time interval samples. The program then progresses to operation 523 for sampling the time parameter t and calculating a time interval parameter $\Delta t$ by subtracting the last prior sample $t_S$ from the present time t. The $\Delta t$-parameter is tested in operation 524 to determine if the proper time interval has expired for sampling of the N-channel signals for the next set of trace signal samples. If the time interval has not expired, the program loops back to operation 523 along the NO Path to continue to again sample the time parameter t and to again test the change in time $\Delta t$ until the time interval $t_I$ has expired. When the time interval has expired, the program loops back along the YES path from operation 524 to operation 513 to iterate through the correlation for the next time interval set of samples from each of the N-channels.

The correlator of the present invention may generate a correlation output as digital samples stored in an output memory device. In an embodiment requiring preserving of each correlation output signal, the results of a correlation computation may be transmitted to a using system or may be recorded on a disc memory or on magnetic tape for future use. A subsequent correlation solution may be preserved independent of the prior correlation by clearing out the correlation memory prior to starting a new correlation operation. Further, if it is desired to provide compositing-after-correlation, the correlation output memory may not be cleared but the results of a subsequent correlation computation may be added to the results of the prior correlation computation thereby implementing compositing-after-correlation by not clearing the correlation output memory. Clearing of memory is a simple task that is well known in the art. Clearing of memory in a hardware embodiment may be accomplished by disabling or zero-setting one stage of a fetch and restore recirculation loop while a sequence of memory locations are accessed, as discussed with reference to FIG. 6D hereinafter. Alternately, memory may be cleared by enabling a clear input such as for a memory or a counter device having appropriate memory and counter circuitry for clearing. Clearing of memory in a software embodiment may be provided with a program loop that iteratively increments through memory and zero-sets the stored information such as by writing zeros into the stored locations or by other well known programming techniques. A simple test to determine whether compositing-after-correlation is to be performed for a particular correlation operation may be readily implemented with digital logical devices or with program operations to determine if memory should be cleared for not compositing-after-correlation or if memory should be preserved for compositing-after-correlation.

Various operations such as looping apparatus 512 and 524 shown in a form that particularly lands itself to simplicity of discussion. Greater efficiency may be provided using a real-time correlation routine that periodically returns to the executive routine such as during a wait time delay period shown with operations 512 and 524 to perform other calculations while waiting for a sync pulse to arrive in operation 512, or a sample time interval to expire in operation 524, or for other such reason. In such real-time operations, the correlation routine may transfer to a real-time executive routine when time is available or when priority operations associated with other operations must be performed and the executive routine may transfer back or return to the correlation routine to continue the correlation algorithm. Such real-time operation is well known in the art and may be applied to the program flow diagram 500 of FIG. 5A by those of ordinary skill in the art from the teachings herein.

The subscripts set forth in FIG. 5A may be representative of well known indexing operations such as multi-level indexing operations. For example, the $P_J$ pilot signal may be have a J-index which is decremented as shown in operation 519, wherein the J-parameter may be used as an index parameter for indexing through the pilot signal sample memory to access the appropriate pilot signal sample $P_J$ for the computation in operation 517. Alternately, the pilot signal may have a multi-level JN-index, where a first level of index may be based upon the channel index number N and wherein a second level of index may be based upon the pilot sample index number J. Using one well known multi-indexing programming arrangement, the location of a pilot sample to be accessed may be indexed first with the N-channel parameter defining the more significant portion such as a "page" or "block" of addresses of the stored pilot signal samples and may be further indexed with the J-sample parameter defining the less significant portion of the addresses within the "page" or "block" of N-addresses of pilot signal samples associated with the selected channel N. Therefore, a common correlation program can be used for all samples and for all channels by merely changing the index parameters L, N, and K.

As discussed above, correlation is accomplished for a plurality of time interval samples in the temporal-domain as selected with outer loop 501; wherein each temporal-domain set of samples across the N-channels in the spacial-domain is sequentially processed with middle loop 502; and wherein each of the samples in the temporal-domain (iteratively selected with outer loop 501, and in the spacial-domain (iteratively selected with middle loop 502) is iteratively processed with inner loop 503 by performing the correlation computations on the trace signal sample by comparison with all of the pilot signal samples and by updating of the appropriate output signal samples. Outer loop 501 and middle loop 502 may be considered to be a two-dimensional selection program, wherein middle loop 502 provides for scanning across the array of N-channels in the spacial-domain and outer loop 501 provides for scanning along the trace signals in the temporal-domain.

In view of the above description and flow chart 500, many important features and teachings have been exemplified in accordance with the present invention. For example, a unique algorithm has been provided for real-time correlation and for time-domain correlation. Real-time correlation is exemplified by the partial signal updating of the output signal samples for each trace signal sample, thereby precluding the need to store the input trace samples, and thereby providing all processing associated with a particular trace signal samples when that trace signal sample is received. Further, time-domain correlation is exemplified by the multiplication of each trace sample with all of the related pilot signal samples and by the shifting of the pilot signal and trace signal in relation thereto, which is in direct contrast to the prior art frequency-domain correlation such as with transformation using Fast Fourier transforms and multiplication of matricies in the frequency-domain. A further feature of the present invention is exemplified with the sampling of a plurality of channels in the spacial-domain for a substantially constant time-interval in the temporal-domain and the processing of a set of spacial-domain samples before temporal-domain samples. Yet further, an arrangement is provided for reducing the number of computations required to implement the correlation algorithm by detecting when updates are required with operation 527 and by not performing update operations that are not required. Still further, flow diagram 500 exemplifies iterative processing and nesting of iterative routines for more efficient correlation computations.

In order to provide a better understanding of the correlation algorithm set forth in FIG. 5A, a brief example will be discussed with reference to Table IX. Table IX sets forth the parameters associated with the flow diagram of FIG. 5A and provides numerical values for these parameters to illustrate the iterative nature of the processing and to specifically exemplify the operation.

The column headings of Table IX will now be described. The ROW NO column provides sequential row numbers as a reference to the operations set forth in Table IX. The operations shown in FIG. 5A that are sequentially executed to change the parameters of this example are listed in the column titled OPERATION REF, wherein the 500 series numbers in this column correspond to the 500 series numbers referencing operations in FIG. 5A. For example, reference number 511 in row 1 of Table IX corresponds to operation 511 of FIG.5A. The columns SAMPLE TIME L, CHANNEL N, PILOT START SAMPLE Jo, PILOT SAMPLE J, and OUTPUT SAMPLE K correspond to the parameters L, N, Jo, J, and K discussed above with reference to FIG. 5A. The column entitled SKIP OPERATIONS shows an arrow opposite a blank row related to a group of sequential operations that have been skipped for simplicity of discussion.

TABLE IX

| ROW NO | OPERATION REF NO | TRACE SAMPLE L | CHANNEL N | PILOT START SAMPLE Jo | PILOT SAMPLE J | OUTPUT SAMPLE K | SKIP OPERATIONS |
|---|---|---|---|---|---|---|---|
| 1 | 511 | 0 | — | 0 | — | — | |
| 2 | 513 | 0 | 0 | 0 | — | — | |
| 3 | 516 | 0 | 0 | 0 | 0 | 0 | |
| 4 | 519 | 0 | 0 | 0 | −1 | 1 | |
| 5 | 519 | 0 | 0 | 0 | −2 | 2 | ↑ |
| 6 | | | | 0 | | | |
| 7 | 519 | 0 | 0 | | −11 | 11 | ↓ |
| 8 | 519 | 0 | 0 | 0 | −12 | 12 | |
| 9 | 519 | 0 | 1 | 0 | −12 | 12 | |
| 10 | 516 | 0 | 1 | 0 | 0 | 0 | |
| 11 | 519 | 0 | 1 | 0 | −1 | 1 | |
| 12 | 519 | 0 | 1 | 0 | −2 | 2 | ↑ |
| 13 | | | | | | | |
| 14 | 519 | 0 | 1 | 0 | −11 | '11 | ↓ |
| 15 | 519 | 0 | 1 | 0 | −12 | 12 | |
| 16 | 521 | 0 | 2 | 0 | −12 | 12 | |
| 17 | 516 | 0 | 2 | 0 | 0 | 0 | |
| 18 | 519 | 0 | 2 | 0 | −1 | 1 | |
| 19 | 519 | 0 | 2 | 2 | 2 | | ↑ |
| 20 | | | | | | | |
| 210 | 519 | 0 | 2 | −11 | 11 | | ↓ |
| 22 | 519 | 0 | 2 | 0 | −12 | 12 | |
| 23 | 522 | 1 | 2 | 1 | −12 | 12 | |
| 24 | 513 | 1 | 0 | 1 | −12 | 12 | |
| 25 | 516 | 1 | 0 | 1 | 1 | 0 | |
| 26 | 519 | 1 | 0 | 1 | 0 | 1 | |
| 27 | 519 | 1 | 0 | 1 | −1 | 2 | ↑ |
| 28 | | | — | | | | |
| 29 | 522 | 15 | | 15 | — | — | ↓ |
| 30 | 513 | 15 | 0 | 15 | — | — | |

TABLE IX-continued

| ROW NO | OPERATION REF NO | TRACE SAMPLE L | CHANNEL N | PILOT START SAMPLE Jo | PILOT SAMPLE J | OUTPUT SAMPLE K | SKIP OPERATIONS |
|---|---|---|---|---|---|---|---|
| 31 | 516 | 15 | 0 | 15 | 15 | 0 | |
| 32 | 519 | 15 | 0 | 15 | 14 | 1 | |
| 33 | 519 | 15 | 0 | 15 | 13 | 2 | ⇡ |
| 34 | | | | | | | |
| 35 | 519 | 15 | 0 | 15 | 4 | 11 | ⇣ |
| 36 | 519 | 15 | 0 | 15 | 3 | 12 | ⇡ |
| 37 | | | | | | | |
| 38 | 521 | 15 | 2 | 15 | | | ⇣ |
| 39 | 516 | 15 | 2 | 15 | 15 | 0 | |
| 40 | 519 | 15 | 2 | 15 | 14 | 1 | |
| 41 | 519 | 15 | 2 | 15 | 13 | 2 | ⇡ |
| 42 | | | | | | | |
| 43 | 519 | 15 | 2 | 15 | 4 | 11 | ⇣ |
| 44 | 519 | 15 | 2 | 15 | 3 | 12 | |
| 45 | 526 | 15 | 2 | 15 | 3 | 12 | |

For example, row 6 shows a skip operation symbol indicative of skipping the large number of iterations through operation 519 in between row 5 and row 7 while the K-parameter is being incremented from output sample K=2 in row 5 to output sample K=11 in row 7. A showing of the skipped operations would not add to the description wherein the repetitive nature of the processing and the following description will permit one skilled in the art to reconstruct the skipped operations from the teachings of the present invention.

An example of operation of the embodiment discussed above with reference to FIG. 5A will now be provided for the parameters discussed above for Table III. In Table III the trace sample parameter L ranges from 0 through 15, the maximum trace sample parameter Lmax is 15; the pilot start sample parameter Jo ranges from 0 through 3, the pilot sample parameter J ranges from 0 through 3, the maximum pilot sample parameter Jmax is 3, the output sample parameter K ranges from 0 through 12, and the maximum output sample parameter Kmax is 12. Table III has been used to illustrate operation of a single trace channel but the arrangement discussed with reference to FIG. 5A illustrates a multiple trace arrangement. For the example described with reference to Table IX, a set of three channels will be assumed wherein the channel parameter N ranges from 0 through 2 and the maximum channel parameter Nmax is 2.

Operation of the algorithm shown in FIG. 5A will now be discussed in detail with reference to Table IX.

The program enters the routine through operation 510 and initializes the trace sample parameter L to zero and the pilot start sample Jo to zero as shown in row 1 for operation 511. The program detects a sync pulse in operation 512 and enters outer loop 501 to initialize the channel parameter N to channel zero in operation 513 (row 2), then enters middle loop 502 to sample the input trace signal for sample time zero channel zero(L=0 and N=0 for row 3) in operation 515. The program initializes the J-parameter and the K-parameter by loading the Jo-parameter of zero into the J-parameter and by zero setting the K-parameter in operation 516 (row 3).

Operation commences to inner loop 503 to compute the output term $Z_{KN}$ for output samples K=0 and channel N=0 (row 3) associated with pilot signal $P_J$ for the first pilot sample of J=0 (row 3). The K-parameter is tested in operation 518, where the K-parameter is equal to zero and not equal to Kmax (row 3). The program branches to operation 519 where the J-parameter is decremented to −1 and the K-parameter is incremented to 1 (row 4). The J-parameter is tested in operation 527, where the J-parameter is negative (−1) and therefore less than zero, where the P-samples for the J-parameter less than zero are not used to update the output samples. Therefore the program branches to operation 518, skipping operation 517 wherein the output samples are not updated for this and subsequent negative values of the pilot sample parameter J. The program then tests for the K-parameter in operation 518, but the K-parameter equals 1 (row 4), causing the program to branch through operation 519 which decrements the J-parameter to −2 and increments the K-parameter to 2(row 5).

The program continues to loop through operations 518, 519, and 527 for 10-iterations (8-skipped iterations with row 6 and rows 7 and 8) until the output sample parameter K is incremented to 12 (row 8). Therefore, the test for K=Kmax in operation 518 causes the program to branch along the YES path because K=12 (row 8) and Kmax=12 (Table III), resulting in the program exiting from inner loop 503 to operation 520. The 13-iterations through inner loop 503 corresponding to the 13-output samples $Z_0$–$Z_{12}$ (Table III) to provide an update of the output samples with the trace sample multiplied by the pilot samples. This iteration provides no updates for output samples $Z_1$–$Z_{12}$ because the test in operation 527 determined that the pilot signal parameter J corresponding to the output samples $Z_1$–$Z_{12}$ were negative, as illustrated in the $T_o$ column of Table III having blanks in those table positions.

After exiting from inner loop 503 through operation 520, the N-parameter is tested to see if the output samples of the last channel Nmax have been updated, but N=0 (row 8) and not Nmax which equals 2. Therefore, the program branches to operation 521 to increment the N-parameter from zero (row 8) to 1 (row 9). The program then loops back within middle loop 502 to sample channel 1 for N=1 (row 9) and then to initialize the J-parameter to Jo which is zero and to zero-set the K-parameter in operation 516 (row 10). Therefore, operation 516 sets up the computation to iterate through inner loop 503 for the next trace signal sample which is the trace signal sample for the second trace channel N=1. The program iterates through inner loop 503 13-times related to the 13-output samples $Z_0$–$Z_{12}$ (rows 11-15) but updates only the first output sample $Z_0$ as discussed above for trace channel zero (rows 4-8). The primary difference between the operations performed in rows 3-8 and in rows 10-15 is that the program has incremented from the first channel (N=0) to the second channel (N=1), where all other parameters are the same.

As discussed for row 9 above, the program exits inner loop 503 and increments the channel parameter N, wherein the channel parameter N is incremented to N=2 (row 16). The program again iterates through inner loop 503 with operations shown in rows 17-22 which are the same as the operations performed in rows 3-8 except that the correlation computations are performed for the third channel (N=2). One difference for the programmed operations for the third channel is provided in operation 520 where Nmax=2 for this example and therefore when N=2 (rows 22 and 23) the program branches out of middle loop 502 along the YES path from operation 520 into outer loop 501 to test the L-parameter in operation 525. Because Lmax=15 (Table III) and L=0 (row 23), the program branches along the No path from operation 525 to operation 522 to increment the L-parameter to 1 and the Jo-parameter to 1 (rows 23).

At the end of the sample interval defined in operations 523 and 524, the program loops back to operation 513 in outer loop 501 where the channel parameter N is initialized back to zero to identify the first channel for this second sample time interval (row 24) to start the iterative processing for each channel associated with the second sample time interval L=1. The program inputs a trace sample in operation 515 related to the first channel and the second time interval, wherein N=0 and L=1 respectively (row 24), then the program initializes the J-parameter to the Jo-parameter which is 1 and the K-parameter K to zero (row 25) to set up the parameters for iterative processing of input samples $T_{LN}=T_{10}$. The program updates the first output sample $Z_0$ for the first channel (N=0) in operation 517 and iterates through inner loop 503 13-times until the K-parameter is incremented to Kmax which is 12, thereby causing the program to exit inner loop 503 from operation 518 along the YES path because K=Kmax=12. The J-parameter is initially set to J=1 (row 25) and therefore must be decremented twice (row 26 and row 27) before going negative, wherein the first two output samples $Z_0$ and $Z_1$ are updated before the test in operation 527 detects a negative pilot sample parameter J to skip the output update computation in operation 517. Inner loop 503 continues to generate the computations for each trace signal sample, middle loop 502 continues to sample each channel for a particular time interval, and outer loop 501 continues to sequence through time intervals until all correlation computations have been completed.

The last sample time is also shown in Table IX to illustrate how the program exists from the iterative routines, where the intermediate iterations between the second sample time (L=1) (row 29) and the sixteenth sample time (L=15) (row 29) are skipped (row 28) for simplicity of description. One skilled in the art can readily complete the skilled operations from the teachings herein and the above examples for rows 1-27, where these skipped operations are substantially identical to the iterative operations discussed for rows 1-27.

Continuing the discussion from operation 522 where the sample time parameter L has been incremented to 15 and the pilot start sample parameter Jo has been incremented to 15, the program performs the time delay operation for the sixteenth sample interval with operations 523 and 524 before looping back to operation 513 for initializing the channel parameter N to the first channel (N=0) (row 30) to input the first channel sample for this sixteenth sample parameter J to Jo which is 15 and for zero setting the output sample parameter K in operation 516 (row 31). Iterations through inner loop 503 are exemplified with decrementing of the pilot sample parameter J and incrementing of the output sample parameter K (rows 32-36) until the output sample parameter K is incremented to the Kmax parameter value of 12 (row 36) resulting in the program exiting from inner loop 503 along the YES path from decision operation 518. The operations shown in rows 31-36 are similar to the operations discussed for rows 3-8 above except that the sample time parameter L and related pilot start sample parameter Jo are equal to 15, related to the sixteenth and last trace sample interval. For this example Jmax=3, wherein all values of J greater than 3 which are the values of J related to output samples $Z_0$-$Z_{11}$ are not used in the output computation as detected in operation 527, resulting in the program looping back through operation 518 and skipping compute operation 517 for these values of pilot sample parameters J greater than J=3.

The second channel N=1 is iteratively processed for sample intervals L=15 similar to the processing of the first channel N=0 for sample intervals L=15 (rows 30-36) and therefore the detailed description for the second channel N=1 is skipped as indicated in row 37. The program starts the processing of the third and last channel N=2 for the last sample interval L=15 in operation 521 by incrementing the channel parameter N to N=2 (row 38) then looping back in middle loop 502 to sample the third channel N=2 for the last time interval L=15 in operation 515 and to initialise the computation for this sample in operation 516 by setting the pilot sample parameter J to the pilot start sample Jo which is 15 and to zero-set the output sample parameter K (row 39)). The program then enters inner loop 503 and iterates through the inner loop 13-times until the output sample parameter K is incremented to Kmax=12, causing the program to exit inner loop 503 from operation 518along the YES path to operation 520. These 13-iterations through inner loop 503 are exemplified with rows 40-44 similar to the above operations shown in rows 18-22 except that the sample time parameter L has been incremented to L=15 for rows 40-44. The program tests the channel parameter N in operation 520, wherein the channel parameter N is now equal to Nmax=2 (row 44) causing the program to branch along YES path to operation 525 to test the sample time parameter L. The sample time parameter L is equal to Lmax of 15 (row 519) causing the program to exit the correlation routine along the YES path from operation 525 to operation 526.

In view of the above example, the iterative operations through the correlation program have been shown in detail to illustrate in detail how the computation progresses.

DESCRIPTION OF FIG. 5B

An alternate embodiment of the system of the present invention will now be described with reference to FIG. 5B, FIG. 5B may represent a computer flow diagram for a software embodiment as discussed with reference to FIG. 5A above or may represent a state diagram for a hardwired logical embodiment as will be discussed with reference to FIG. 6 hereinafter. Because FIG. 5A has been discussed primarily with reference to a software embodiment, FIG. 5B will be discussed primarily with reference to a hardware embodiment, illustrating the similarity between computer flow diagrams and hardware state diagrams and illustrating the ability to either program a computer or to design logic to implement a computer flow diagram and a hardwired logic state diagram. For example, the textbook by Chu referenced hereinafter discusses implementation of state diagrams with hardwired logic with reference to FIGS. 11-5 and 11-6 on pages 408 and 411 therein and the textbooks by Sherman, Stark, Jeenel, Golden, Schriber, Maurer, Martin, and Swallow referenced hereinafter discuss programming of computers in response to flow diagrams. Therefore those skilled in the art will be able to program flow diagram operations with a general purpose computer and be able to design hardwired logic from the flow diagrams and state diagrams of FIG. 5A and 5B, wherein the information contained in a flow diagram and in a state diagram are substantially the same and would permit those skilled in the art to program a computer or design hardwired logic to implement flow diagram and state diagram operations.

The state diagram of FIG. 5B will now be discussed in detail. Table III exemplifies an algorithm substantially the same as that mechanized with the state diagram of FIG. 5B, wherein reference to Table III will assist in understanding the state diagram of FIG. 5B. A sequencer using integrated circuits may be used to sequence through a sequence of states, wherein the sequencer may comprise a word-counter and a bit-counter or the sequencer may be implicit in the counters and sequential logic of the correlation processor. The sequencer is shown commencing operation at reference point 1 and proceeding to test for a sync pulse in operation 540. The sequencer remains "locked up" waiting for a sync pulse, as shown by the looping-back along the NO path and the sequencer proceeds along the YET path to operation 541 when a sync pulse is detected. The sync pulse may be used to clear a counter or to reset logic to permit the sequencer to continue operation through the state diagram wherein the logic may be "locked up" waiting for the sync pulse to clear or to reset logical elements. Upon detection of a sync pulse; the parameters L, Jo, J, and K may be cleared in operation 541; wherein the arrival of a sync pulse may "unlock" the sequencer by clearing counters, as will be discussed in detail with reference to FIG. 6D hereinafter. The parameters L, Jo, J, and K have the same significance as in the discussion referenced to FIG. 5A above and will be briefly summarized below. The L-parameter represents the designation of a trace signal sample, wherein the first trace signal sample is designated by L=0. The Jo-parameter represents the designation of the first pilot signal sample, where the Jo-parameter may be equal to the L-parameter as shown in Table III and where the designation of the trace signal sample in the top row of Table III and the designation of the pilot signal sample in the top pilot signal sample row of Table III, which is the first pilot sample, have corresponding numbers therebetween for this particular algorithms. The J-parameter represents the pilot signal sample which ranges from J=Jo set forth in the top pilot signal sample row of Table III through J=0 for the last pilot signal sample designated $P_0$. The K-parameter represents the output signal sample, wherein the first output signal sample is $Z_0$ having a K value of zero and being incremented through the last output signal sample which is $Z_{15}$ in Table III representing a Kmax-parameter of 15.

After clearing the L, Jo, J, and K parameters in operation 541, the pilot sample $P_J$ and trace sample $T_L$ are accessed in operation 542, wherein the $P_J$ signal sample is the appropriate pilot signal sample and the $T_L$ signal sample is the appropriate trace signal sample for the computation.

In a hardware embodiment, the signal samples such as the pilot signal samples $P_J$ and the output signal samples $Z_K$ may be accessed from a shift register memory, a random access memory (RAM), a read-only memory (ROM), a core memory, a disc memory or other well known memory devices which may be used for storing signal samples. The trace signal sample $T_L$ may be accessed by sampling an input trace signal in real-time or may be stored in a buffer memory and accessed when appropriate. For the first pass through the iteration, J is equal to zero for the first pilot signal sample $P_0$ and L is equal to zero for the first trace signal sample $T_0$. The accessed trace and pilot signal samples $T_L$ and $P_J$ are multiplied in operation 543, wherein this multiplication computation may be an incremental multiplication such as by using a hardware exclusive-OR circuit as discussed in detail in FIG. 6 hereinafter or may be various combinations of whole number, ternary, and incremental multiplications that can be implemented with well known stored program computer and hardware logical arrangements.

The product of $T_L$ and $P_J$ computed in operation 543 is used to update output signal sample $Z_K$ by adding the product $T_L \cdot P_J$ to the $Z_K$ sample as shown in operation 543. The computed product $T_L$ and $P_J$ may be added to the related output signal sample $Z_K$ which may be accessed from memory and the updated output signal sample may then be stored back in memory. In an alternate embodiment, the output signal samples may be stored in the persistency of a cathode ray tube (CRT) such as used in an oscilloscope rather than in a digital memory as will be briefly discussed hereinafter. In this oscilloscope storage embodiment, each column of Table III may represent a different sweep of the CRT beam to record the output signal sample Z-parameters on the CRT by intensity modulating the Z-axis with the product solutions $T_L$ times $P_J$, as will be discussed in detail hereinafter.

After the computation in operation 543, the K-parameter is tested to see if K=Kmax, indicative of the last output sample $Z_{Kmax}$ which indicates that all of the output signal samples have been updated for a particular trace signal sample, thereby necessitating accessing of the next trace signal sample for the next computation iteration. If the K-parameter is not equal to Kmax as tested in operation 544, the sequencer will branch along the NO path to operation 545 to decrement the J-parameter and to increment the K-parameter. This operation can be better understood with reference to Table III, where the J-parameter associated with the pilot signal sample $P_J$ decreases and the K-parameter associated with the output signal $Z_K$ increases as operation progresses vertically downward in Table III for a particular trace signal sample $T_L$. For example, the sample for L=3 starts with a pilot signal sample $P_3$ for J=3 related to an output signal sample $Z_0$ for K=0. As the computation progresses, the pilot sample designator J is decremented from 3 to 2 to 1 to 0 for successive iterations through operation 545 and the output sample designator K is incremented from 0 to 1 to 2 to 3 for the corresponding iterations through operation 545 related to the decremented pilot samples and a particular trace signal sample.

The J-parameter may be tested for being negative in operation 546, where the sequencer branches along the YES path to operation 547 if the J-parameter is negative and along the NO path to operation 542 if the J-parameter is positive. This can be better understood with reference to Table III, where computations for a particular trace signal sample such as $T_3$ continues through pilot samples $P_3$-$P_0$, wherein updating of the output signal samples is disabled when the pilot sample designator J is decremented beyond the last pilot signal sample $P_0$ to negative pilot signal samples. While the J-designator is not negative, the sequencer will continue to iterate through the accessing of the pilot signal samples $P_J$ and the computation of multiplying the pilot signal samples $P_J$ with the trace signal sample $T_L$ in operations 542 and 543. As the pilot designator J is decremented towards a negative value in operation 545 for successive iterations, the computation progresses towards the $P_0$ pilot signal sample, as shown in Table III.

When the iteration progresses past the $P_0$ sample to the pilot signal designator J equalling a negative value, the computation may be disabled because such negative pilot signal samples should not update the output signal samples $Z_K$. This is illustrated in FIG. 5B, wherein a negative J-parameter detected in operation 546 causes the sequencer to disable the computation in operation 547 and to loop back to operation 544 without accessing the computational parameters $P_J$ and $T_L$ nor computing the product thereof in operations 542 and 543.

In other embodiments, the sequencer may loop back from operation 547 to operation 542 thereby not skipping operations 542 and 543, wherein disable operation 547 may set a flip-flop to disable the computation performed in operation 543 from updating the output signal samples $Z_K$ with computational solutions corresponding to negative pilot sample designator J values.

As the sequencer causes the processor to iterate through operations 542–547, the output sample designator K is increment in operation 545 and tested in operation 544 until K=Kmax, thereby causing the sequencer to exit the iterative loop of operations 542–547 to operation 548. The logic will test to see if the trace signal sample $T_L$ has been incremented to the last trace signal sample $T_{Lmax}$. If l=Lmax, then the last trace signal sample has been processed and the sequencer will loop back along the YES path to lookup waiting for a new sync pulse in operation 540, indicative of the need to start a new correlation operation. If the L-parameter is not equal to Lmax as tested in operation 548, the sequencer branches along the NO path to operation 549 to increment the trace sample designator L for identification of the next trace signal sample $T_L$ and to increment the first pilot sample designator Jo to select a first pilot sample $P_{Jo}$ one increment further advanced from the prior first pilot sample, as illustrated in the first row of pilot signal samples shown in Table III. In the embodiment exemplified with Table III, the first pilot sample designator Jo is equal to the trace sample $T_L$ designator L and, therefore, the Jo-parameter may be set equal to the L-parameter for one embodiment of the correlator of the present invention.

After incrementing the L and Jo designators, the sequencer branches to operation 550 to load the pilot signal first sample designator Jo into the pilot signal designator memory location J and to clear or zero-set the output sample designator K. The significance of this operation can be understood with reference to Table III, wherein operations for a new trace signal sample such as $T_3$ are initialized by incrementing the tart pilot sample designator Jo from 2 to 3 for designation of a stored first pilot sample of $P_3$ by loading the start pilot signal designator Jo into the J-parameter memory location to select $P_{Jo}$=$P_3$ and to clear the output sample designator K to initially select $Z_K$=$Z_0$. The sequencer then branches back to operation 542 to access the sequence of pilot signal samples $P_J$ starting with the $P_3$ first pilot signal sample, computing the sequence of updated output signal samples $Z_K$ in operation 543, the incrementing the output sample designator K and decrementing the pilot sample designator J in operation 545; wherein these iterations proceed until the last output signal sample Kmax is updated followed by incrementing to the next input trace signal sample $T_L$ for processing.

The embodiments discussed with reference to FIGS. 5A and 5B are directed to an algorithm such as discussed with reference to Table III, but these embodiments are presented in slightly different forms to illustrate different features of the present invention. For example, FIG. 5A illustrates a time-shared embodiment for correlating a plurality of trace signals from a corresponding plurality of transducers with either a common pilot signal $P_J$ or separate pilot signals $P_{JN}$. Therefore, the embodiment illustrated in FIG. 5A may correlate each of the plurality of trace signals with a different pilot signal or with the same pilot signal. For example, the pilot signal sample may be a single-dimensional common pilot signal $P_J$ or may be a two-dimensional or different pilot signal $P_{JN}$ for each trace signal where the N-channel designation may identify the channel and the J pilot sample designator may identify the particular pilot sample for that pilot signal N. Alternately as discussed with reference to FIG. 5B, a single channel correlator may be implemented for correlating a trace signal from a single channel in contrast to the embodiment discussed with reference to FIG. 5A for time-sharing operations between a plurality of channels. Therefore, a single correlator may be dedicated to a single channel in accordance with the embodiment discussed with reference to FIG. 5B or may be shared between a plurality of channels in accordance with the embodiment discussed with reference to FIG. 5A and where a plurality of single channel or multiple channel correlators may be used to process information from a larger array of channels.

Another comparison between the embodiments discussed with reference to FIGS. 5A and 5B is related to time-sharing between other operations. The embodiment shown in FIG. 5A provides for a program to enter the correlation operation at point 1 and to exit the correlator operation from point 2 and may further provide for a program to enter and to exit on a re-entrant basis within the correlation computation such as with multilevel subroutines for permitting other system operations to be performed on a time-shared basis with the correlation operation shown in FIG. 5A. Alternately, the embodiment described with reference to FIG. 5B may be dedicated to a single channel correlation operation wherein a sync pulse may initiate the correlation operation and wherein the termination of the correlation operation following the YES path from operation 548 looping back to the start point 1 to again "lock up" the sequencer waiting for a sync pulse in operation 540.

DESCRIPTION OF FIGS 6A–6C

A preferred embodiment of the correlator of the present invention will now be discussed with reference to FIG. 6.

Figure 6A:
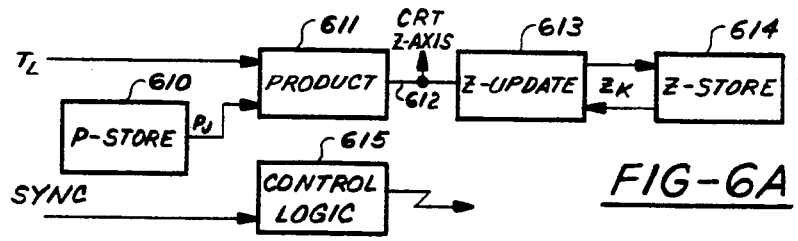
FIG. 6A shows a detailed block diagram of a correlator and compositor arrangement.
Figure 6B:
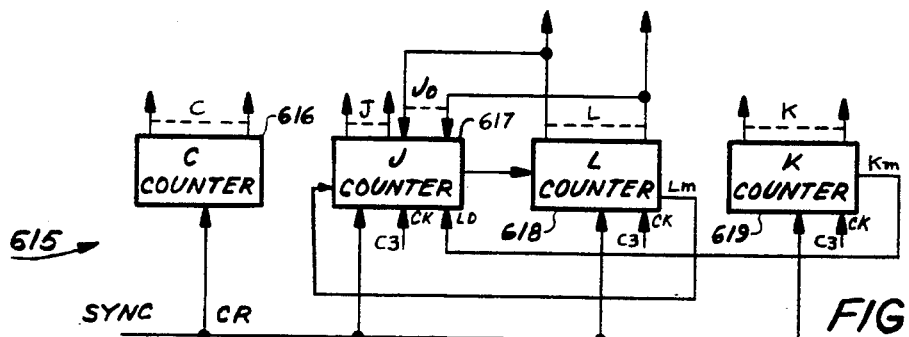
FIG. 6B shows a counter arrangement for implementing control logic in accordance with the arrangement shown in FIG. 6A.
Figure 6C:
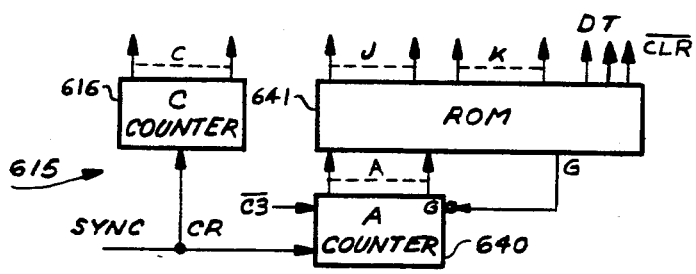
FIG. 6C shows a ROM arrangement for implementing control logic in accordance with the arrangement shown in FIG. 6A.
Figure 6E:
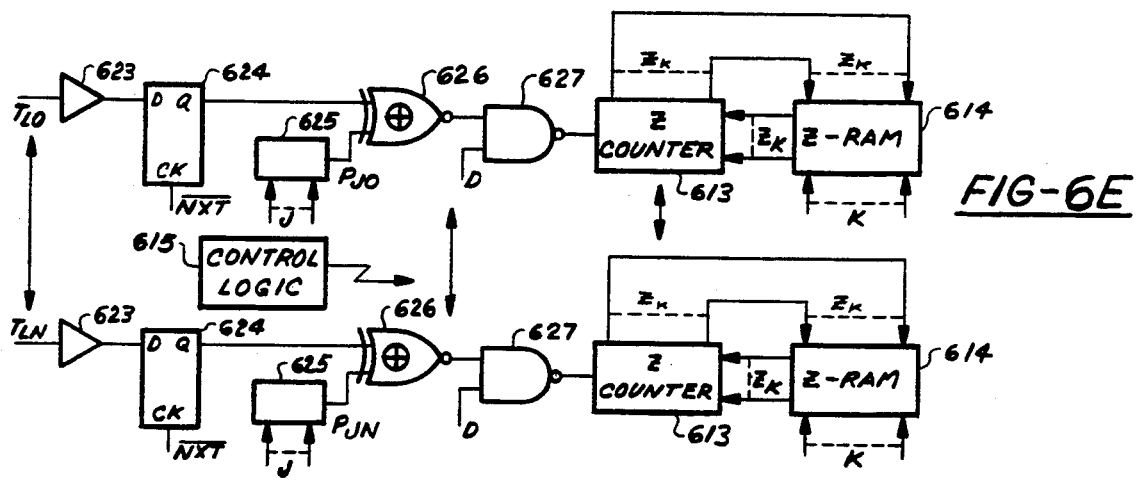
FIG. 6E shows a multi-channel correlator arrangement in accordance with FIG. 6D.
Figure 6D:
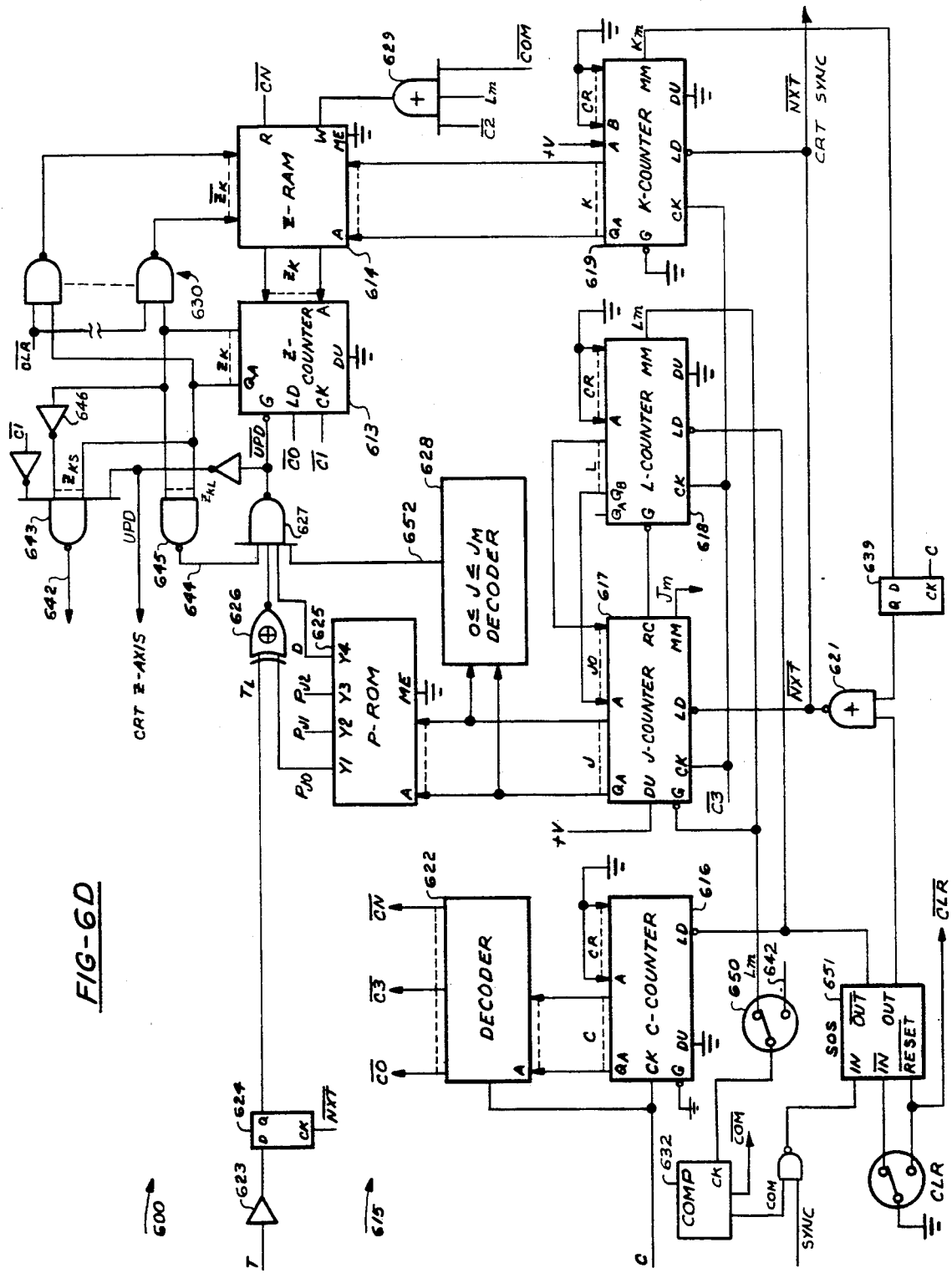
FIG. 6D shows a detailed control logic and correlator arrangement in accordance with FIGS. 6A and 6B.

FIG. 6A is a block diagram of the correlator which is shown in detailed logical design form in FIG. 6D. Trace signal samples $T_L$ and pilot signal samples $F_J$ are received by product circuitry 611 to generate product signal 612. Trace signal samples $T_L$ may be received in real-time from signal processing circuitry and may be single-bit digital samples or whole-number digital samples. Pilot signal $P_J$ may be received in real-time from the signal processing circuitry such as for auto-correlation or may be received from a pilot sample memory shown as P-store 610 for cross-correlation. Product circuitry 611 may provide a single-bit product computation such as implemented with an exclusive-OR circuit in a preferred embodiment or may provide for multiplying a pair of multiple-bit samples or for multiplying a single-bit sample with a multiple-bit sample.

Product signal 612 from product circuit 611 may be used to update output signal samples $Z_K$ with Z-update circuitry 613 for a memory output device or to modulate the Z-axis signal of a CRT for a display output device. For the CRT embodiment, synchronization of the CRT sweep may be performed by control logic 615 and modulation of CRT beam intensity may be performed with product signal 612, where persistency of the CRT may be relied on for temporary storage and memory capabilities as discussed in detail hereinafter. In a digital storage embodiment, correlation output samples $Z_K$ may be stored in Z-store 614 and may be updated with product signal 612 using Z-update circuitry 613. Z-update circuitry 613 may sequentially access Z-output samples $Z_K$ from Z-store 614 for updating with product signal 612 and may then store updated output signal sample $Z_K$ into Z-store 614. Control logic 615 may sequentially access trace signal samples $T_L$, pilot signal samples $P_J$, and output signal samples $Z_K$ for updating the output signal samples $Z_K$ with the product of the trace signal sample $T_L$ and the pilot signal sample $P_J$, then controlling the storing of output samples $Z_K$ back into Z-store 614. Further, control logic 615 may be responsive to an external signal such as a sync signal related to the start of correlation operations that is responsive to the start of transmission of a chirp signal with a VIBROSEIS signal generator.

Control logic 615 may be implemented with counters, decoders, and logical arrangements; or with a ROM microprogrammable control arrangement; or with other well known sequencing and controlling arrangements. A preferred embodiment will be discussed with reference to FIG. 6D for implementing control logic 615 with a logical arrangement for convenience of discussion.

Memory devices such as P-store 610 and Z-store 614 may be implemented with a read only memory (ROM) for P-store 610 and with a random access memory (RAM) for Z-store 614 to exemplify use of these different memories devices, as will be discussed in detail with reference to FIG. 6D hereinafter. Alternately, memories may be provided for storage of trace signal samples $T_L$, pilot signal samples $P_J$, and the output signal samples $Z_K$ which may be implemented with a core memory, a ROM, a RAM, or other well known memories.

As an alternate, these memory devices may be implemented with combinations of well known memories, wherein P-store 610 will be described for a ROM implementation and Z-store 614 will be described for a RAM implementation with reference to FIG. 6D hereafter to exemplify the use of a combination of memory devices. As another alternative, each memory device may include a combination of memory devices where for example Z-store 614 may include a RAM for temporary or buffer storage and a disc memory for more permanent larger scale storage; wherein the high access rate RAM may provide a least significant portion of Z-samples for high speed updating under control of product signal 612 and the low access rate disc memory may provide a full output signal sample word for low speed updating with the least significant portion of the 2-samples from the RAM.

In a preferred embodiment discussed with reference to FIG. 6D, P-store 610 is described as an integrated circuit read only memory and Z-store 614 is described as an integrated circuit random access memory. Further, correlator 400 has been described with reference to FIG. 4 provide shift registers 412 and 417 for storing pilot signal samples and trace signal samples respectively and a plurality of registers 421 for storing output signal samples. These embodiments have been shown with different memory arrangements to exemplify the use of different types of memories for the system of the present invention. From these teachings, those of ordinary skill in the art will be able to implement a pilot signal memory, a trace signal memory, and an output signal memory using other memory techniques. For example, pilot signal memory P-store 610 may be implemented with a shift register memory (FIG. 4), an integrated circuit ROM (FIGS. 6D and 6E), an integrated circuit RAM, a core memory, a CCD memory, a disc memory or other well known memory devices. Similarly, a trace signal memory may be implemented with a shift register memory (FIG. 4), an integrated circuit RAM, a core memory, a CCD memory, a disc memory, or other well known memory devices. Similarly, an output signal memory Z-store 614 may be implemented with a register memory (FIG. 4), an integrated circuit RAM (FIGS. 6D and 6E), a core memory, a CCD memory, a disc memory, or other well known memory devices. The control arrangement 615 discussed in detail with reference to FIGS. 6B–6D may be configured by those of ordinary skill in the art from the teachings of the present invention to accommodate other memory devices for implementing the digital filtering algorithms of the present invention.

In accordance with a memory feature of the present invention, a unique memory arrangement such as for Z-store 614 will now be discussed in grater detail. Prior art systems use disc memories for storing composited and correlated information such as exemplified by the CAFDRS system mentioned above. These disc memory arrangements have the disadvantages of being mechanical rotating memories that are large in size, heavy in weight, and low in reliability compared to solid state devices. Further, disc memories cannot be rapidly accessed nor readily expanded compared to solid state devices. Therefore, in accordance with the present invention solid state memories may be used for information storage; wherein these solid state memories have high speed, small size and weight, solid state reliability, and simple expandability. In accordance with this memory feature of the present invention, a solid state memory such as a random access memory (RAM), a charge coupled device (CCD) memory, a magnetic bubble memory, or other solid state memories may be used for correlation and for compositing. Prior art disc memories have access times of approximately 30-milliseconds which may be 100,000-times slower than with solid state memories and disc memories require complex electromechanical rotating hardware that is expandable only within a limited range wherein the smaller configurations are burdened with high overhead costs.

A further feature of the present invention provides a solid state memory for rapid access in conjunction with high speed correlating and compositing operations which is used in combination with a disc memory for mass storage. In one embodiment, the least significant part of a correlator output word may be stored in a higher access rate RAM while the most significant part of the word may be stored in a lower access rate disc memory and wherein the least significant portion of the word in the RAM may be updated at high speed from the correlation computation and the most significant portion of the word in the disc memory may be updated at a slower rate from the least significant portion of the word in the RAM. This arrangement takes advantage of the high access rate of the RAM in conjunction with the low cost of the disc memory to provide the advantages of both, the high access rate of the RAM and the low cost storage of the disc memory.

In one example 4-bit output words may be stored in RAM for updating by the correlation computation such as with incrementing or not incrementing the stored word in response to the single-bit correlation computation. Because a 4-bit (modulo-16) word can be incremented 15-time before overflowing, the 4-bit word may be used to store the least-significant-bits (LSBs) for a worst case of 15 accesses and increments before it is necessary to unload this word due to potential overflow considerations. Therefore, a 4-bit word stored in a high access rate memory (RAM) need only be used to update a 20-bit word stored in a lower access rate memory (disc memory) at a data rate of 1/15th the data rate of the high access rate memory. Therefore, access rate requirements on the low access rate memory can be substantially reduced such as by a factor of 15 in accordance with this feature of the present invention. In this mechanization, the correlator may access the RAM at high data rates to update the 4-bit words and the disc may access the RAM at a lower data rate such as 15-times lower than the correlator data rate to update the stored 20-bit words in the disc memory with the 4-bit words in the RAM.

Updating of the 20-bit words may be accomplished by adding the 4-bit word from the RAM to the corresponding 16-bit word in the disc memory and zero-setting the RAM word after it has been used to update the 20-bit word in the disc memory. Therefore, as the 4-bit words in RAM are incrementally updated at a high data rate, the 20-bit words on the disc are updated at 1/15th the data rate with the 4-bit words from the RAM; thereby placing the major storage burden on the disc memory and placing the major access rate burden on the RAM.

In accordance with the incremental correlation feature of the present invention, low signal-to-noise ratios provide approximately a 50% increment or don't increment duty cycle. Therefore, a 4-bit RAM word may not have to be sampled by the disc memory at a rate greater than once every 31-correlation updates because typically only half of the correlation operations may require the RAM word to be incremented. Other disc memory update rates may be provided as a safer hedge relative to preventing overflow of the RAM 4-bit word yet minimizing the disc memory access requirements. Further, the limiting circuit 645 of the compositor arrangement discussed with reference to FIG. 6D may be used to prevent overflows and therefore optimize disc memory access rate requirements. In such an arrangement, incrementing of a 4-bit RAM word may be conditioned upon the 4-bit RAM word not being all ones, indicating a pending overflow condition of a signal peak. If the 4-bit RAM word were all ones, the increment operation may be disabled with circuit 645 (FIG. 6D) to preclude overflow. Loss of the increment of information due to limiting with circuit 645 may be relatively inconsequential in accordance with the characteristics of the correlation algorithm as discussed herein. Further, this disabling of incrementing for a maximum word magnitude is analogous to the condition of saturation of an analog signal, wherein saturation of the digital word merely limits the amplitude and may actually have beneficial results for the correlation algorithm such as by saturating large signals.

Prior art systems such as the CAFDRS and GEO-COR systems utilize a plurality of head-per-track disc memories to buffer data, wherein a first disc memory is used with a compositor and a second disc memory is used with a correlator. Such disc memories are expensive and unreliable, inherent in the rotating mechanical nature of these memories. A preferred memory arrangement in accordance with the present invention eliminates the requirement for rotating memories for one-line field operations. In this preferred embodiment, working memories may be integrated circuit memories or other solid state memories such as RAM, ROM, and shift register memories. In accordance with the correlate on-the-fly and the composite-after-correlation features of the present invention discussed herein, the prior art requirement for an input compositing disc memory is eliminated and, in accordance with the record on-the-fly feature of the present invention discussed herein, the requirement for a large compositor output memory may be eliminated, where input trace information may be correlated on-the-fly and composited-after-correlation without the need for an input compositor disc memory and the correlation output information may be recorded directly with a magnetic tape recorder without the need for an output disc memory. Therefore, the above mentioned advantage for eliminating the requirement for rotating memories accrue to the system of the present invention.

In an embodiment of a geophysical exploration system, a large off-line memory may be desired for large data processing operations such as for gathering and stacking apparatus. In the prior art, a supervisory computer may be used in conjunction with compositor and correlator disc memories to provide gathering and stacking operations on an off-line basis such as during the night time when data acquisition, compositing, and correlation operations have been discontinued. Therefore, it may be desired to have a large off-line rotating memory available in the system. In accordance with another feature of the present invention, a disc memory may be provided for off-line operations when the system is not experiencing severe shock and vibration conditions such as during the evening when the track is stationary and therefore not causing vibration and shock conditions due to movements over rough terrain between shotpoints. In accordance with this feature of the present invention, a well known disc pack memory may be provided without degrading the cost and reliability advantages mentioned above. A disc pack memory may have a high tolerate to vibration when the disc pack is removed from the spindle and the weighed arm is locked into a stowed position. Further, a disc pack memory may provide many times more storage than the conventional disc or drum head-per-track rotating memories and may have a price that is only a small fraction of a price of head-per-track rotating memories. In one embodiment, a disc pack memory may be provided for $7,000 wherein the disc pack memory may have greater storage capacity than a disc head-per-track subsystem manufactured by DDC or by Pacific Micronetics selling for over $50,000.

The memory arrangement of the present invention has been described above for a high access rate RAM and a low access rate disc memory to exemplify a memory feature of the present invention. It is herein intended that the RAM and the disc memory arrangement be merely exemplary of any higher access rate memory used in conjunction with any lower access rate memory to provide advantages such as discussed herein.

Synchronization of signal processing and data processing operations with external signals is well known in the art, wherein such synchronization with received signals may be provided by those of ordinary skill in the art in accordance with the teachings of the present invention. For example, synchronization and triggering circuits are well known in the oscilloscope art such as the circuits used with the Tektronix model 454 oscilloscope. Similarly, special oscilloscope triggers and displays such as the Tektronix digital delay device model DD501 for providing triggering, synchronization, delay, and other such signal processing operations. Still further, arrangements of synchronizing a digital device to an input signal, digitizing the input signal samples, and storing the samples in memory is well known in the signal processing art. For example, Nicolet Instruments Inc of Madison, Wis. provides the Nicolet 1090 digital oscilloscope which provides for loading a memory with digitized samples of an input analog signal for display, wherein synchronization to input signals and loading of a memory with input signal samples is well known in the prior art and may be used in conjunction with the teachings of the present invention. In the present invention, signal SYNC shown in FIGS. 5 and 6 may be generated with wall known synchronization circuits such as provided in the above mentioned products. Further, loading of a memory with a digitized pilot signal may be accomplished with circuitry such as used in the above mentioned Nicolet digital oscilloscope. Still further, outputting of digital information to an output device such as from Z-store 614 (FIG. 6A) may be provided with well known arrangements for outputting digital samples from a digital memory to an output device such as a recorder; where this outputting capability is provided with said Nicolet digital oscilloscope and with other wall known prior art devices. Yet further, Z-store 614 may be connected to refresh an oscilloscope such as for displaying of stored information with said Nicolet digital oscilloscope.

In view of the above, synchronization, sampling, and storing of information is well known in the art and displaying or outputting of stored signal samples is well known in the art, wherein such well known synchronization, inputting, and outputting circuitry may be used in conjunction with the correlator arrangements of the present invention such as described for FIG. 6 above.

Control logic 615 (FIG. 6A) may be implemented with using well known control arrangements such as a counter arrangement which will be discussed with reference to FIG. 6B hereinafter and a microprogrammable read only memory (ROM) arrangement which will be discussed with reference to FIG. 6C hereinafter. These control arrangements may be implemented for the algorithm discussed with reference to FIG. 5B or may be implemented for other algorithms.

Control arrangement 615 is shown in FIG. 6B as being implemented with a plurality of counters for generating control signals and address signals for the correlation computation logic. C-counter 616 provides a plurality of clock signals and control signals for sequencing operations including a C3 control signal to be used as a clock signal for the other counters. J-counter 617 generates a J-address code for accessing a pilot signal sample $P_J$ from pilot signal memory 610 wherein J-counter 617 may be loaded with a Jo address, then clocked with the $C_3$ clock signal to sequence through the pilot signal J-addresses. L-counter 618 counts trace signal samples in response to each sequence of J-counter 617 as will be discussed in detail with reference to FIG. 6D or alternately in response to each sequence of K-counter 619 for incrementing L-counter 618. K-counter 6190 sequences through the Z-output signal samples $Z_K$ for each trace signal sample $T_L$ until the last trace signal sample $T_{Lmax}$ is detected by L-counter 618, which may be used to disable K-counter 619. For each iteration of K-counter 619, an output signal controls loading of J-counter 617 with the first pilot sample address Jo which may be equal to the count value in the L-counter 618 for the algorithms discussed with reference to FIGS. 5A and 5B.

Operation of control logic 615 may be initiated with the sync signal loading counters 616–619 with initial conditions and may be terminated after the L-counter 618 has sequenced through all trace sample addresses. Termination may be determined by the output signal from L-counter 618 disabling K-counter 619 and C-counter 616; thereby disabling the C3 clock to J-counter 617, L-counter 618, and K-counter 619. Operation may be resumed in response to another sync command which clears L-counter 618, enabling operation of C-counter 616 and initializing the other counters. During continuing operations, J-counter 617 sequences through the J-address to access the appropriate pilot signal samples $P_J$ from P-store 610 for multiplication with the trace signal samples $T_L$ with product logic 611 to generate product signal 612. Simultaneously, K-counter 619 sequences through the K-addresses to access the appropriate output signal samples $Z_K$ from Z-store 614 for updating of the output signal samples with Z-update logic 613. After the last trace signal sample $T_{Lmax}$ has been processed as determined with L-counter 618; the output of L-counter 618 may be used to disable sequential operation of the correlator until the next sync signal is detected.

An alternate embodiment of control logic arrangement 615 is shown in FIG. 6C as being implemented with an ROM for generating control signals and address signals for the correlation computation logic. C-counter 616 sequences through correlator operations, as discussed with reference to FIG. 6A above. The $\overline{C3}$ clock signal from C-counter 616 may be used to increment A-counter 640 for addressing ROM 641 with address signals $A_o$–$A_m$. ROM 641 may have a plurality of codes stored in each ROM address location including the pilot signal sample address J and the output signal sample address K for accessing of P-store 610 and Z-store 614 (FIG. 6A). A disable bit signal D may be used to disable the computation for pilot signal samples outside of the desired range such as shown with blank spaces in Table III above. Further, an output control bit G may be used to designate the end of the correlation operation for disabling A-counter 640. In this ROM control logic embodiment, the sync signal may clear A-counter 640 to the zero-state, thereby permitting A-counter 640 to be incremented through a sequence of addresses for ROM 641. When the last-address is detected as indicated by output signal G from ROM 641, A-counter 640 is locked-up by output signal G to hold this last-address. Clearing of A-counter 640 with the sync signal will change the address from the last-address, indicated by the G-lockup signal, to the first-address which may be a zero-address. For the example shown in Table III, A-counter 640 may be a modulo-209 counter for sequencing through 208-ROM addresses. This can be calculated with reference to Table III, wherein each of 16-trace signal samples may be processed for each of 13-output signal samples for a total of $16 \times 13 = 208$ operations. For an alternate embodiment also shown with reference to Table III, A-counter 640 may be a modulo-53 counter for sequencing through 52- ROM addresses. This can be calculated with reference to Table III by skipping blank locations, wherein each of 13 output signal samples may be updated with each of four pilot signal samples and trace signal samples for a total of $13 \times 4 = 52$ operations.

A brief description will now be provided for the modulo-209 ROM control logic embodiment. For the first trace signal sample T, the first ROM word may have a J-address of zero for pilot signal sample $P_0$ and a K-address of zero for output signal sample $Z_0$. Subsequent ROM words may increment through K-addresses from a K-address of one through a K-address of 15. Disable signal D may be zero-set for disabling updates related to the blanks in the first column of Table III related to the trace signal sample $T_0$. The 14th word in ROM 641 may have a J-address of one pertaining to the $P_1$ pilot signal sample in the second column shown in Table III and a K-address of zero pertaining to the $Z_0$ first output signal sample; followed by a $J_o$-$K_o$ word, and followed by 14-words with a disable signal D related to the blank positions of column two in Table III. Similarly, each block of 13-words in ROM 641 may correspond to the pilot signal sample J-addresses and output signal sample K-addresses for each trace signal sample $T_L$ as represented by each column in Table III and with the D-signal from ROM 641 being zero-set for the blank positions shown in Table III and being one-set for the words corresponding to the non-blank positions having pilot signal samples $P_0$–$F_3$ shown in Table III.

The last address in ROM 641 ($A = A_{208}$) may have a one-set G-bit being indicative of the last control word pertaining to the last output signal sample $Z_{12}$ of the last trace signal sample $T_{15}$ as shown in Table III. The G-bit signal may be used to disable A-counter 640 and may also be used to disable computation logic an indicative of the end of the computation.

In an alternate arrangement, the signals in ROM 641 may correspond to the parameter set forth in Table IX which has been used to exemplify operation with reference to FIG. 5 above.

For the example provided in Table III, the J-address may be a two-bit address for defining pilot signal sample addresses 0–3 and the K-address may be a four-bit address for identifying output signal sample addresses 0–12. Therefore, for the example shown in Table III and the implementation discussed with reference to FIG. 6C, an arrangement having 208-words of 8-bits may be required; wherein the 8-bit word may include a J-address of two-bits, a K-address of four-bits, a D-signal of one-bit, and a G-signal of one-bit. The cost of this ROM may be determined from a 208-word by 8-bit memory involving 1664-bits which may cost only $0.001 per bit in production quantities for a total ROM cost of approximately $1.66. For larger more complex systems, the size and therefore the cost of ROM 641 may increase exponentially with the size of the problem; wherein the ROM logic discussed with reference to FIG. 6C may be more competitive for smaller correlation embodiments and wherein the counter logic discussed with reference to FIG. 6B may be more competitive for larger correlation embodiments.

In view of the above, control logic 615 may be mechanized with a counter arrangement or with an ROM arrangement to implement the algorithms discussed with reference to FIGS. 5A and 5B or to implement other correlation algorithms that will now become obvious to those skilled in the art from the teachings of the present invention.

DESCRIPTION OF FIG. 6D

The arrangement shown in FIG. 6D is consistent with the real-time computational algorithm discussed with reference to FIGS. 5A and 5B above, the mechanization discussed with reference to FIGS. 6A–6C above, and the example present in Table III above. Although the above discussed algorithms, mechanizations, and examples provide sufficient detail to permit one of ordinary skill in the art to practice the present invention; extensive detail is provided in FIG. 6D to illustrate a specific logical design, circuit design, and selection of components for practicing the present invention.

A brief discussion of the arrangements set forth in FIG. 6D will now be provided, followed by a more detailed description of this arrangement. A sync signal may be used to initiate a correlation operation wherein the sync signal is input to synchronous one-shot SOS 651 when enabled by AND-gate 638 under control of compositor logic 632. Compositor logic 632 may count the numbers of correlations to be composited together, compare the number of composited correlations with a programmed number, and disable subsequent correlation operations after the proper number of correlations have been composited together by disabling the sync signal with disable signal 636 and AND-gate 638. A preferred embodiment of compositor control 632 will be discussed in detail with reference to FIG. 6F hereinafter.

Correlation may be initiated with a sync pulse to AND-GATE 638 to be enabled or disabled with signal 636 from compositor control 632 which controls the number of sync pulses and therefore the number of correlations that are to be composited together. An enabled sync pulse to synchronous one-shot SOS may initiate an output pulse OUT to preload or to clear C-counter 616, J-counter 617, L-counter 618, and K-counter 619 such as by loading zero inputs or other input states or by being connected to a clear input of these counters for embodiments having counters with clear inputs. The C-counter 616 may successively iterate through a sequence of control states or clock states C0-C3 to sequence correlator operations. One of the states of C-counter 616 may be used as a clock signal $\overline{C3}$ to the other counters 617–619 to clock counters 617–619 at the appropriate time.

J-counter 617 may be initially preloaded with the Jo-parameter from L-counter 618 and controlled to count down for selecting the appropriate pilot signal sample $P_J$ from P-ROM 625. For each countdown of J-counter 617 through the zero-state, L-counter 618 may be incremented as being indicative of completion of a correlation operation for a particular trace signal sample $T_L$ for being advanced to the address of the next sample $T_{L+1}$. In one embodiment, the L-address from L-counter 618 may be equal to the Jo-parameter as discussed with reference to Table III and FIGS. 5A and 5B above, where outputs QA, etc of L-counter 618 may be connected to preload J-counter 617 at the appropriate time. K-counter 6190 may be controlled to sequence through output signal samples $Z_K$ for each trace signal sample $T_L$, where output signal address K of K-counter 619 may be used to address Z-RAM 614 to selected the appropriate output sample $Z_K$ in sequence for updating with the correlation computation.

After all output signal samples $Z_K$ have been updated for a particular trace signal sample $T_L$, the address of the last K-counter sample may be detected as the Km-signal from K-counter 619 which may be used to control preloading of J-counter 617 with the Jo-address from L-counter 618 for the next trace sample iteration and preloading of K-counter 619 with an initial address such as a zero address for the start of the next update iteration for output signal samples $Z_K$. When L-counter 618 has been incremented to the number of the last trace signal sample Lm, output signal Lm of L-counter 618 may be used to identify completion of a correlation computation with compositor control 632 when selected with composite control switch 650.

A trace signal sample $T_L$ may be accessed in real-time as it becomes available for processing with squaring amplifier 623 and latching flip-flop 624 to provide a latched trace signal sample $T_L$ to exclusive-OR circuit 626. Pilot signal $P_J$ may be accessed from P-ROM 625 under control of the J-address from J-counter 617 to be multiplied with the trace signal sample $T_L$ from flip-flop 624 for a single-bit multiplication operation with exclusive-OR circuit 626 for generating an output product signal to gate 627. Decoder 628 may be used to identify redundant or unnecessary computations, exemplified by the blank spaces in Table III, and decoder 628 may be used to disable the computation with disable signal 652 to gate 627. Alternately, decoder 628 may be used to reduce the number of computations so that the mechanization shown in FIG. 6D does not sequence through such unnecessary computations, as will be discussed in more detail hereinafter.

Disable signal 652 from decoder 628 detects unnecessary computations may monitoring the J-address parameter of J-counter 617 for disabling the product signal from gate 626 with gate 627 to disable updating of the output sample $Z_K$.

Output signal samples $Z_K$ are accessed from Z-RAM 614 with the output signals K from K-counter 619. Accessed output samples $Z_K$ may be loaded into Z-counter 613 for updating in response to a single-bit product signal from gates 626 and 627. The single-bit product signal either enables or disables incrementing of Z-counter 613 for an incremental correlation computation, wherein output signal samples $Z_K$ stored in Z-RAM 614 are sequentially loaded into Z-counter 613 for updating and then stored in Z-RAM 614 after updating. Output signal samples $Z_K$ stored in Z-RAM 614 may be samples for a single correlation computation or may be composited and correlated information. Start of a new compositing operation may be preceeded by clearing output signal samples $Z_K$ stored in Z-RAM 614 with NAND-gates 630 under control of the $\overline{CLR}$ signal from clear switch CLR, where prior output signal samples stored in Z-RAM 614 may be cleared to begin compositing of new output signal samples.

An adaptive composite control may be implemented with detector gate 643 for generating adaptive output signal 642 to clock compositor control 632 when selected with switch 650. Detector gate 643 detects when an output signal sample $Z_K$ exceeds a selected magnitude $Z_{KS}$ and generates an output signal 642 to decrement Q-counter 635 in compositor control 632 in response thereto.

A limiter control may be implemented with detector gate 645 for generating limit control signal 644 to disable updating of the output signal sample $Z_K$ in Z-counter 613 if the magnitude of that output signal sample $Z_K$ is equal to a selected limitor magnitude $Z_{KL}$. This limitor control prevents output signal samples $Z_K$ from being updated beyond a maximum magnitude and therefore from overflowing.

A detailed description of the arrangement shown in FIG. 6D will now be provided.

External control arrangements used to control the correlator shown in FIG. 6D includes the composite control and the clear control. The sync signal initiates a correlation operation if enabled by composite control signal 636 from composite control 632. If Z-RAM 614 had previously been cleared with the clear signal $\overline{CLR}$ from the clear switch CLR, the sync signal initiates a correlation operation without compositing. If Z-RAM 614 had not been cleared with the clear signal $\overline{CLR}$ from the clear switch CLR, the syn signal may initiate another correlation for compositing with output samples of a prior correlation that are stored in Z-RAM 614. Composite control 632 enables the sync signal with enable signal 636 to AND-gate 638.

As discussed above, the $Z_K$-samples stored in Z-RAM 614 are incrementally updated in response to trace signal samples $T_L$, wherein the computational logic for updating the $Z_K$-samples does not distinguish between updating in response to trace samples from the same trace signal or from sequential trace signals. Control logic 615 keeps track of updating in response to a single trace signal and compositor control 632 keeps track of the number of sequential correlated trace signals that are to be composited together. Therefore, output signal samples $Z_K$ in Z-RAM 614 are enhanced in relation to the number of updates for a trace signal and in relation to the number of trace signals without specific distinction as to whether the updates are being obtained from a single long trace signal or from a plurality of short trace signals.

Synchronous one-shot 651 initiates a correlation computation in response to either an enabled syn pulse for generation of a new correlation computation or in response to clear signal $\overline{CLR}$ for clearing output samples stored in Z-RAM 614. Output signals OUT and $\overline{OUT}$ from synchronous one-shot 651 preload C-counter 616, J-counter 617, L-counter 618, and K-counter 169. For simplicity of discussion, counter 613 and 616–619 will be shown as synchronous up-down-counters with a synchronous load capabilities such as the S/N 74190 and the S/N 74191 counters. Other counters may be used such as the S/N 74163 up-counter. The states that are preloaded into counters 616–619 are determined by the input lines A, etc. The clear inputs CR to counters 616, 618, and 619 are grounded to zero-set counters 616 and 617 and to zero-set the most-significant-bits of counter 619. The +V signal input to the least-significant-bit of counter 619 preloads a least significant one-bit into counter 619. The Jo-input signals to J-counter 617 from the L-output signals of L-counter 618 are used to preload the first pilot signal sample address Jo into J-counter 617. Alternately, if the counters have a clear input such as with the S/N 74163 counters, then the counters may be cleared with the clear input. J-counter 617 is cleared by preloading zeros wherein the load signal to the load input LD of J-counter 617 is responsive to output signals $\overline{OUT}$ from one-shot 651 through NOR-gate 621 to preload J-counter 617 with the state of L-counter 618. Because output signal $\overline{OUT}$ of one-shot 651 provides for clearing L-counter 618 by loading zero-states as discussed above, loading of the zero-set states of L-counter 610 into J-counter 617 results in cleaning J-counter 617. The S/N 74190 and S/N 74191 type counters are loaded by placing a zero-state signal on load input LD. Therefore, output signal $\overline{OUT}$ from one-shot 651 loads the zero-state conditions into counters 616 and 618 and output signals OUT from one-shot 651 is inverted with NOR-gate 621 to provide an inverted or zero-state load signal LD to counters 617 and 619.

C-counter 616 is shown in an up-count mode, where down-up control signal DU is shown grounded for commanding an up-count. C-counter 616 is initially cleared by loading a zero-state as a ground condition CR on input lines A, etc under control of inverted load signal $\overline{OUT}$ to load input LD to synchronize C-counter 616 with the sync signal to AND-gate 638. C-counter 616 may be continuously enabled to count with ground signal an enable input G. External clock signal C is used to clock C-counter 616 to sequence through a group of control states which may be four-states C0–C2 or may be more than four-states. For a four-state C-counter embodiment, a two-bit C-counter 616 may be used such as by monitoring the two least-significant-bits QA and QB from C-counter 616 with decoder 622. Decoder 622 may generate decoded output signals $\overline{C0}$–$\overline{C3}$ in response to the two least-significant-bits QA and QB output from C-counter 616 or may generate additional output states in response to more-significant-bits of C-counter 616. Decoder 622 may be a well known integrated circuit decoder such as the S/N 7442A decoder which may be connected as a two-bit decoder by ground in the two most-significant-bit inputs C and D into decoder 622 and connecting the QA and QB signals from C-counter 616 to the two least-significant-bit inputs A and B respectively of decoder 622,. Output signals from decoder 622 may be provided in complemented or uncomplemented form, wherein the outputs of many well known decoders may be in complemented form and may be provided in uncomplemented form by processing with well known inverts such as S/N 7404 inverter circuits.

Operation of C-counter 616 and decoder 622 may provide a sequence of control signals starting with the $\overline{C0}$ control signal and sequencing through the $\overline{C3}$ control signal or may provide other sequences of control signals as C-counter 616 is incremented through a binary count, wherein each binary count state may be decoded with decoder 622. For the mechanization shown in FIG. 6D, it will be assumed that the first output signal $\overline{C0}$ is provided to Z-counter 613 to command loading of Z-counter 613, followed by the next output signal $\overline{C1}$ provided to clock input CK of Z-counter 613 to clock Z-counter 613 for updating output signal sample $Z_K$ stored therein in response to the update signal from gates 626 and 627, followed by the next output signal $\overline{C2}$ provided to Z-RAM 614 for writing the $Z_K$ signal from Z-counter 613 into Z-RAM 614, and followed by the next output signal $\overline{C3}$ provided to clock input CK of counters 617–619 to clock counters 617–619 for the next output sample $Z_K$ update operation. Well known RAM circuits such as Z-RAM 614 require only a single mode control signal such as a read or a write signal, where the C2-signal going to the one-state may command a write-mode and the $\overline{C2}$-signal going to the zero-state may command a read-mode such as with the S/N 74200 RAM integrated circuit. Alternately, some memories may require separate read and write signals, where the $\overline{C2}$ control signal may be used as a write command signal W and an additional $\overline{CN}$ control signal may be used as a read command signal R as shown for Z-RAM 614. Therefore, sequencing through the $\overline{C0}$–$\overline{C3}$ control states may control a sequence of operations of (1) loading Z-counter 613 from Z-RAM 614 under control of control signal $\overline{C0}$; (2) updating the sample loaded into Z-counter 613 under control of clock control signal $\overline{C1}$; (3) storing the contents of Z-counter 613 into Z-RAM 614 under control of write control signal $\overline{C2}$; and (4) updating J-counter 617, L-counter 618, and K-counter 519 by clocking with control signal $\overline{C3}$ to advance to the next address state for addressing the next pilot signal sample $P_J$ and the next output signal sample $Z_K$ for the next set of sequential control operations.

The sequence of operations of loading output signal sample $Z_K$ into Z-counter 613; updating output signal sample $Z_K$ in Z-counter 613; storing updated output sample $Z_K$ in Z-RAM 614, and updating the pilot signal and output signal memory addresses with J-counter 617 and K-counter 619 respectively provides a preferred sequence of operations for a preferred embodiment shown in FIG. 6D. As discussed above, use of the S/N 74200 RAM makes the read operation implicit in the absence of the write command $\overline{C2}$ wherein accessing of Z-RAM 614 may be achieved automatically by the next update sample address from K-counter 619 in the absence of the write control signal $\overline{C2}$.

Output signals $\overline{C0}$–$\overline{C3}$ from decoder 622 may be used for clock signals and may have transitionary conditions due to the changes of more than one flip-flop at a time in C-counter 616 thereby causing transitionary states to appear on output signals $\overline{C0}$–$\overline{CN}$ from decoder 622. Therefore, decoder 622 may be gated with clock signal G to provide a time delay for transitionary conditions to stabilize prior to enabling output signals $\overline{C0}$–$\overline{CN}$ from decoder 622. In an embodiment where decoder 622 is implemented with an S/N 2442A circuit; least significant output signals QA and QB of C-counter 616 may be connected to the A and B least significant input terminals of decoder 622 and clock signal C may be connected to the most significant input terminal of decoder 622. In this arrangement, clock signal C may clock C-counter 616 with a positive transition to the one-state and may enable signals $\overline{C1}$-$\overline{CN}$ when clock signal C makes a negative transition to a zero-state which may be about one-half clock period after C-counter 616 has changed state. Therefore, the gating of decoder 622 with clock signal C precludes race conditions which could be caused by transitions of C-counter 616.

J-counter 617 may be connected as a down-counter by connecting the down-up signal input DU to a positive voltage. J-counter 617 may be loaded with the Jo-parameter from L-counter 618, initially under control of the sync pulse generated output signal OUT from one-shot 651 and subsequently from the last address Km of K-counter 619/ both signals being NORed together with NOR-gate 621. J-counter 617 is clocked with clock signal $\overline{C3}$ from decoder 622 to decrement through the J-address parameters starting with the Jo-address to sequentially access pilot signal samples $P_J$ from P-ROM 625. Output signal lines QA, etc from J-counter 617 containing the J-address are communicated to P-ROM 625 as the P-ROM address. Similarly, output lines QA, etc from L-counter 618 may be communicated to inputs A, etc of J-counter 617 for preloading the J first pilot signal sample address which in a preferred embodiment may be the same as the contents of L-counter 618, J-counter 617 is permitted to count-down from the preloaded address Jo through zero, where a zero-address may generate an output signal such as from min-max output MM or ripple clock output RC to enable input G of L-counter 618. These min-max or ripple clock outputs may be used to increment L-counter 618 as indicative of completion of the correlation operation for the last prior trace signal sample, to identify the next trace signal sample to be processed, and to provide the next Jo signal to J-counter 617. J-counter 617 and L-counter 618 are shown connected with ripple clock output RC of J-counter 617 being input to enable input G of L-counter 618 for incrementing L-counter 618 with the zero-state of J-counter 617. J-counter 617 may be disabled by min-max output signal Lm of L-counter 618 connected to enable input G of J-counter 617 as shown in FIG. 6D. As an alternate, J-counter 617 may be disabled by min-max output signal Jm of J-counter 617 connected to enable input G of J-counter 617 (not shown). As discussed in detail herein, decoder 628 disables updating of output signal samples $Z_K$ in response to negative J-numbers thereby making such negative J-numbers "don't care" numbers. J-counter 617 may count through a zero-state to a least significant negative-state which is an all one-state. Therefore, J-counter 617 may generate two ripple count RC output pulses for the all zero-state and the all one-state to L-counter 618, thereby generating two clock pulses for each count-down operation of J-counter 617. This double pulse condition may be compensated for with a divide-by-two circuit in L-counter 618, implemented with the first counter stage identified with a QA output signal, wherein the least-significant-bit after the divide-by-two A-bit would be the B-bit related to the QB output from L-counter 618 as shown in FIG. 6D. As an alternate, a divide-by-two toggle flip-flop (not shown) may be connected between the RC-output of J-counter 617 and the G-input of L-counter 618. Other alternate arrangements may be implemented in consideration of this condition, L-counter 618 may be connected as an up-counter by connecting input control signal DU to group and to command an up-count operation. L-counter 618 is initially cleared by loading zeros in response to output signal $\overline{OUT}$ from one-shot 651 and then permitted to count outputs from J-counter 617 to enable input G as being indicative of completion of processing of another trace signal sample $T_L$. Therefore, L-counter 618 counts trace signal samples $T_L$ wherein the completion of processing of a trace signal sample is identified by the signal to enable input G enabling the $\overline{C3}$ clock to increment L-counter 618. The output of L-counter 618 shown as output signals QB, etc may be used as the Jo input to J-counter 617. Further, the min-max output Lm of L-counter 618 may be used to disable J-counter 617 by applying a one-state signal to enable input G of J-counter 617 to disable counter operation in response to the Lm signal, which is indicative of completion of processing of a last trace sample $T_{Lm}$ for a particular correlation.

K-counter 619 may be initially preloaded in response to output signal OUT from one-shot 651 by loading a zero-state or an LSB one-state. K-counter 619 is then permitted to sequence through a group of output signal sample addresses K for each trace signal sample $T_L$ under control of clock signal $\overline{C3}$. K-counter 619 may be connected as an up-counter as controlled by down-up control signal DU being connected to ground. When K-counter 619 increments to a maximum address, the maximum output signal Km is generated as indicative of completion of processing of all output signal samples $Z_K$ corresponding to a particular trace signal sample $T_L$. Maximum output signal Km may be used to initiate processing for a new trace signal sample $T_L$ by clocking flip-flop 624 to sample the trace input sample $T_L$ and by generating a load command to J-counter 617 and K-counter 619 through flip-flop 639 and NOR-gate 621 to preload the Jo address from L-counter 618 into J-counter 617 and to preload a start address into K-counter 619 to initiate processing of a next trace signal sample $T_L$. Correlation of a new trace signal is initiated by loading counters 616–619 in response to an output signal OUT from one-shot SOS as being indicative of the start of a new trace signal for correlation and for synchronizing counters 616–619 with the new trace signal.

It is desired that the Km signal be generated in response to the largest K-address but operation of K-counter 619, implemented with an S/N 74191 integrated circuit, will also generate the Km-output signal in response to an all zero-state. Generation of the min output in response to an all zero-state may be preempted by preloading K-counter 619 to a non-zero state. Therefore, K-counter 619 may be preloaded to an LSB or unity-state by connecting the A-input to a positive voltage and connecting the B-input and other more significant inputs to ground. As discussed herein, the max-min output of K-counter 619 may be used to preload J-counter 617 and K-counter 618 for subsequent iterations. For this embodiment, the output signal sample addresses K may be stored in locations ranging from Z-RAM address K=1 to Z-RAM address K=KM such as by having an address that is one least-significant-bit greater than the subscript number of the address parameter K. For example, numbering output sample address K to range from 1 through 13 instead of from 0 through 12 as shown in Table III would be consistent with the mechanization of K-counter 619 shown in FIG. 6D.

A one-bit time delay may be provided for the NXT signal with flip-flop 639 to reduce a potential race condition between clocking of L-counter 618 in response to ripple clock output RC from J-counter 617 and the related loading of J-counter 617 and K-counter 619 in response to the NXT signal from NOR-gate 621. Feedback signal Km to NOR-gate 621, indicative of completion of output sample updates in response to a particular trace signal sample, may be input to D flip-flop 639 under control of clock signal C and may be output to NOR-gate 621 one C-clock pulse period thereafter. The clock signal to flip-flop 639 may be free running input clock C as shown, or may be one of the control clock signals $\overline{C0}$–$\overline{C3}$, or may be any of these control clocks inverted to provide the proper phase relationships between the clocking of counters 617–619 and loading of counters 617 and 619 under control of the NXT signal.

The arrangement shown in FIG. 6D may provide a trace signal $T_L$ from an external source such as geophone transducer and may provide a pilot signal $P_J$ from P-ROM 625. Input trace signal sample $T_L$ may be processed with squaring amplifier 623 such as a μA710 comparitor for generating a single-bit squarewave output in response to an analog input signal. Alternately, amplifier 623 may be a Schmidt trigger such as an S/N 7414 integrated circuit or other type of input circuit. An input flip-flop 624 may be used to sample the input signal from squaring amplifier 623 so that the trace signal to gate 626 is held constant for a particular trace sample period. In an alternate embodiment, the output signal of squaring amplifier 623 may be provided directly to gate 626, wherein a trace signal that is changing during the computational period may be preferred to an arrangement where a device such as flip-flop 624 samples and stores a trace signal from the trace sample period.

P-ROM 625 may be accessed with the J-address signals from J-counter 617 to define sequential sample $P_J$ of the pilot signal to be processed for each trace signal sample $T_L$. P-ROM 625 may be an S/N 74187 ROM circuit or other well known ROM circuit. Memory enable inputs ME may be connected to ground to select the ROM or may be controlled with J-address signals from J-counter 617 for cascading ROM circuits, as described in The TTL Data Book referenced hereinafter on pages 410–416 therein, Address inputs A, etc may be excited with the J-address from J-counter 617 for selecting each pilot signal sample $P_J$ in sequence. An S/N 74187 ROM circuit may be used to implement ROM 625 having 256-words by 4-bits. Output words Y1–Y4 may be used as a single parallel output word, or may be increased in length by paralleling ROM circuits, or for the arrangement illustrated in FIG. 6D may provide a single-bit signal form one of the signal outputs shown as the Y1 output signal for input to gate 626. Similarly, Y2 and Y3 output signals may provide pilot signal samples for other correlator channels when separate pilot signals for each of a plurality of correlator channels is desired, as discussed in detailed hereinafter with reference to FIG. 6E.

Output signal Y4 form P-ROM 625 may be used as a disable signal 652 for J-addresses less than zero or greater than Jmax, shown as blank locations i Table III. Alternately, disable signal 652 may be generated with decoder logic to detect negative J-addresses from J-counter 617 and to detect J-addresses greater than Jmax from J-counter 617 for disabling gate 627 with disable signal 652. Decoder 628 may be implemented as a well known decoder such as using combinational logic for generating an output signal 652 in response to J-addresses, wherein J-addresses between a range of Jo and Jmax may enable gate 627 and J-addresses outside of that range may disable gate 627 with disable signal 652. Decoder 628 may be defined for the example set forth in Table III, wherein the range of acceptable J-addresses is from J=0 to J=3. Assuming that J-counter 617 is a seven-bit counter, then a J-address with the five MSBs being zero-states defines acceptable J-addresses and with the five MSBs having at least a single one-state defines unacceptable J-addresses outside the range of J=0 to J=3. For this example, decoder 628 may be a NOR-gate such as an S/N 74260 five-input NOR-gate for NORing together the five-MSBs of the J-address. Consistent well known NOR-gate operation, output signal 652 from NOR-gate decoder 628is in the zero-state if one or more of the five MSBs of the J-address is in the one-state for disabling NAND-gate 627 and output signal 652 from NOR-gate decoder 628 is in the one-state if all of the five MSBs of the J-address are in the zero-state for enabling NAND-gate 627.

Exclusive-OR circuit 626 compares a trace signal sample $T_L$ with a pilot signal sample $P_J$ to generate an output signal related to a comparison therebetween. The output signal from gate 626 will be in the one-state if both input signals are in the one-state or if both input signals are in the zero-state indicating a comparison condition and the output signal of gate 626 will be in the zero-state if one of the input signals is in the one-state and the other of the input signals is in the zero-state indicating a non-comparison condition.

The output signal of an exclusive-OR gate is related to a non-comparison condition, where the output signal is in the one-state when the input signals are in different states (the one-state and the zero-state) and where the output signal is in the zero-state when the input signals are in the same states (the one-states or the zero-states). For convenience of description, a complement exclusive-OR gate 626 is shown in FIG. 6D for generating a product signal, where the output signal is in the one-state when the input signals are in the same state and where the output signal is in the zero-state when the input signals are in different states. The complement exclusive-OR symbol 626 is shown in FIG. 6D, wherein a small circle is shown on the output as being indicative of a inversion of the exclusive-OR signal consistant with well known prior art symbology. A complement exclusive-OR gate is known as a coincidence gate, wherein these gates are discussed in detail in the textbook by Chu referenced hereinafter at pages 109–115 therein. These gates may be synthesized with conventional gate logic as shown in Chu or may be implemented with an S/N 7486 exclusive-OR gate (described in The TTL Data Book on pages 209–213 therein) followed by an S/N 7404 inverter gate for a complement exclusive-OR circuit mechanization. Hand-gate 627 may be used to control updating of the $Z_K$ sample with Z-counter 613 under control of the output signal from gate 626 when enabled with signals 644 and 652. Disable signal 652 enables updating for a range of J-addresses between J=0 and J=Jm and disables updating for J-addresses outside of this range. Gate 627 is shown as a NAND-gate to invert the enabled product signal from gate 626 to compensate for the complement G-input logic of Z-counter 613 shown by the small circle on the G-input to Z-counter 613. Enabled update signal from gate 626 may be used to control Z-counter 613 for updating an output signal sample $Z_K$. Z-counter 613 may be connected for an up-count mode by connecting the down-up mode control DU to ground; wherein a non-comparison or zero-state output signal from gate 626 will be inverted with NAND-gate 627 to disable incrementing of Z-counter 613 and a comparison or one-state output signal from gate 627 will be inverted with NAND-gate 627 to enable incrementing of Z-counter 613 by controlling enable input G. In an alternate embodiment, Z-counter 613 may be connected for a down-count mode by connected the down-up mode control DU to a positive voltage as shown for J-counter 617; wherein a non-comparison or zero-state of the output signal from gate 626 will disable decrementing of Z-counter 613 and a comparison or one-state of the output signal from gate 626 will enable decrementing of Z-counter 613 by controlling enable input G. In still another embodiment, enable input G of Z-counter 613 may be connected to ground for continuously enabling Z-counter 613 and the output of gate 627 may be connected to down-up input control Du for incrementing in response to a one-state from gate 626 and for decrementing in response to a zero-state from gate 626. In yet another embodiment an AND-gate may be used in place of NAND-gate 627 for incrementing in response to a zero-state from gate 626 and for decrementing in response to a one-state from gate 626. Therefore, various embodiments permit incrementing and not incrementing, decrementing and no decrementing, or incrementing and decrementing Z-counter 613 in response to comparison between a trace signal sample $T_L$ and a pilot signal sample $P_J$ to gate 626.

Z-counter 613 may be loaded with output signal samples $Z_K$ from Z-ROM 614 for updating each sample. Updated output signal samples $Z_K$ from Z-counter 613 may be stored back into Z-ROW 614 after updating. The $\overline{CO}$ control signal from decoder 622 controls loading of Z-counter 613 with output signal sample $Z_K$ addressed by output address K of K-counter. Output signal sample $Z_K$ is available on output lines $Z_K$ of Z-RAM 614 at the $\overline{CO}$ control signal time because the $\overline{C2}$ control signal is in the one-state at the $\overline{CO}$ control signal time, thereby causing the addressed Z-RAM parameter to be available to Z-counter 613 at the $\overline{CO}$ time. The next control signal $\overline{C1}$ clocks Z-counter 613 to update the output signal sample $\overline{Z}_K$ in response to the output of gate 626, making the updated output signal sample $Z_K$ available to Z-ROM 614 as the $\overline{Z}_K$ signal from Z-counter 613 for storing under control of write control signal $\overline{C2}$ following update control signal $\overline{C1}$ to Z-counter 613. Sequential loading, updating and storing operations controlled by sequential control signals $\overline{C0}$, $\overline{C1}$, and $\overline{C2}$ and the subsequent updating of the K-address parameter by clocking K-counter 619 with the $\overline{C3}$ clock signal provides a sequence of repetitive operations for accessing, updating, storing, accessing, updating, storing, etc for Z-RAM 614 and Z-counter 613.

Z-counter 613 is loaded with output signal sample $Z_K$ from Z-RAM 614 input to the A, etc inputs of Z-counter 613 for loading thereof. Output signals QA, etc from Z-counter 613 are recirculated to Z-RAM 614 through NAND-gates 630 as inverted output signal samples $\overline{Z}_K$ for storing in Z-RAM 614 under control of read/write mode control signal $\overline{C2}$ after updating of the $Z_K$ sample with Z-counter 613 under control of update control clock signal $\overline{C1}$. Clear enable signal $\overline{CLR}$ is provided to NAND-gates 630 in response to a clear command from clear switch CLR, wherein output signal samples $Z_K$ to Z-RAM 614 are recirculated in response to a one-state of clear signal $\overline{CLR}$ and are not recirculated in response to a zero-state of clear signal $\overline{CLR}$ which forces all $Z_K$ inputs to Z-RAM 614 to the one-state as indicative of a zero-set or cleared complement number.

Read and write control for Z-RAM 614 is provided with write control clock signal $\overline{C2}$ to OR-gate 629 for controlling write input W for Z-RAM 614. Write clock $\overline{C2}$ for Z-RAM 614 is enabled with $\overline{COM}$ signal 636, indicative of the total number of composites not being completed, and with output signal Lm from L-counter 618, indicative of a correlation operation being in process.

Z-RAM 614 may be accessed with a K-address from K-counter 619 to Z-RAM inputs A, etc with the memory enable signal ME in the zero-state for selecting Z-RAM 614. Alternately, cascading of RAM circuits may use the ME signal input as an address input as described in The TTL Data Book on pages 463-465 for an S/N 74200 RAM circuit. Similarly, control signal $\overline{C2}$ may select writing of the $Z_K$-parameter into Z-RAM 614 when the C2 write enable signal is in the zero-state shown by the $\overline{C2}$ designation and may provide for outputting stored $Z_K$-samples in a read mode when the C2 signal is in the one-state. In alternate memory embodiments, an RAM may be implemented with a write clock to write input line W and a read clock to read input line R such as shown for write clock $\overline{C2}$ and read clock $\overline{CN}$.

Z-RAM 614 may be a single-bit by 256-word S/N 74200 RAM circuit wherein four S/N 74200 circuits may be connected in parallel for a four-bit $Z_K$ word used with a single four-bit Z-counter circuit 613, or eight-RAM circuits S/N 74200 may be connected in parallel for an eight-bit $Z_K$ word used with a pair of cascaded four-bit Z-counter circuits 613 to implement an eight-bit Z-counter, or larger numbers of Z-RAM circuits may be connected in parallel as discussed in The TTL Data Book on pages 463-465 therein and larger numbers of counter circuits may be cascaded as discussed in The TTL Data Book on pages 417-436 therein.

An adaptive compositing and correlating arrangement will now be discussed.

As a plurality of correlated signals are composited together, the output signal samples related to correlation peaks increase in amplitude at a significantly greater rate than the noise signal peaks and other undesirable signal components. The number of composites to provide a desired quality output signal may be related to the amount of noise, the signal-to-noise ratio, and the degree of correlation between signals. For the conditions of good correlation and low noise, the correlation signal peaks will build-up rapidly for a relatively few composites. For the conditions of poor correlation and high noise, the correlation signal peaks will build up slowly even for a larger number of composites. Similarly, the signal-to-noise ratio may be improved as a function of the number of samples correlated and composited together, where this function may be a square-root function of the number of correlation and composite summations for a particular output sample. For a low signal-to-noise ratio or a high noise condition, a larger number of correlation and composite operations may be required to compensate for the poor signal-to-noise ratio. For a high signal-to-noise ratio or a low noise condition, a smaller number of correlation and composite operations may be required to enhance the signal-to-noise ratio to a desired level.

A figure-of-merit indicative of the quality of output signal samples may be related to the amplitude of the output signal sample peaks. If correlation and compositing were permitted to continue until the correlated signal sample peaks are built-up to a large magnitude, then a good quality output signal may be provided. One approach would be to detect when an output signal sample exceeds a prescribed amplitude as indicative of a good quality correlated output signal. Because of the possibility of noise bursts occasionally providing an erroneous peak, it may be desired to obtain a plurality of output signal samples having large magnitudes as indicative of a good quality correlated output signal. An adaptive correlation arrangement will now be discussed using compositor control 632 to adaptively control compositor operations until a good quality correlated output signal is obtained, as indicated by obtaining a prescribed number of correlated output signal samples that have exceeded a prescribed magnitude as being indicative of a good quality correlated output signal.

An embodiment will now be discussed with reference to FIG. 6D for an adaptive compositor control based upon a programmable quantity of correlated output signal samples exceeding a selected sample magnitude. In one embodiment, the selected signal magnitude may be programmable such as with a thumbwheel switch arrangement as discussed for the programmable compositor control 632 with reference to FIG. 6F hereinafter. Compositor control 632 may be a programmable compositor control as discussed with reference to FIG. 6F hereinafter and may be used to generate output signal COM 636 for enabling sync pulse to AND-gate 630 under control of input signals Lm from L-counter 618 as discussed above. In an alternate embodiment, an adaptive arrangement may be provided by controlling compositor control 632 with adaptive control signal 642 from a detector such as NAND-gate 643. NAND-gate 643 may monitor output signal samples $Z_K$ associated with Z-counter 613 and Z-RAM 614 to detect when an output signal sample $Z_K$ has been updated to a predetermined or selected magnitude $Z_{KS}$. For convenience of illustration, NAND-gate 643 is shown monitoring signal lines $Z_K$ as being indicative of a selected magnitude output signal sample $Z_{KS}$. Inverters may be provided in sample lines $Z_K$ such as inverter 646 to define the selected magnitude $Z_{KS}$ of signals $Z_K$ detected with NAND-gate 643. When NAND-gate 643 detects the selected magnitude $Z_{KS}$ of signal $Z_K$, output signal 642 goes low for that sample time; thereby clocking counter 635 in composite control 632. Composite control 632 may receive a clock signal CK from gate 643 as signal 642 for an adaptive control embodiment or may receive a clock signal from L-counter 618 output signal Lm, which was described above for a non-adaptive embodiment, as selected by compositor select switch 650.

As output samples $Z_K$ are detected having amplitudes equal to the selected magnitude $Z_{KS}$, output signal 642 from NAND-gate 643 decrements Q-counters 635 from the programmed-state toward the zero-state. After the programmed quantity of selected magnitude signals are detected with NAND-gate 643, Q-counter 635 is decremented to zero by a programmed quantity of selected magnitude samples and generates output signal 636 to disable further compositing operations; where the adaptive condition of a programmed quantity of output signal samples having achieved a selected amplitude $Z_{KS}$ is indicative of a desired output signal quality.

As discussed herein, one figure-of-merit or determination of output signal quality is based upon the quantity of output signal samples that exceed a selected sample magnitude $Z_{KS}$. An algorithm has been selected wherein Q-counter 635 is decremented in response to an output signal sample $Z_K$ reaching a selected magnitude $Z_{KS}$, wherein output signal samples that have exceeded the selected magnitude are not counted because they have a different code than the selected magnitude code detected with NAND-gate 643; wherein codes larger than the selected magnitude and codes smaller than the selected magnitude are not detected by NAND-gate 643. Therefore, only as an output signal sample $Z_K$ traverses through the selected magnitude $Z_{KS}$ does NAND-gate 643 generate output signal 642 to decrement Q-counter 635. One contingency exists wherein the output signal sample may be incremented to a selected signal magnitude $Z_{KS}$ but several update iterations may pass without that output signal sample being incremented past the selected signal magnitude $Z_{KS}$. Therefore, in the adaptive compositing embodiment discussed with reference to FIG. 6D, an output signal sample remaining at the selected output signal selected magnitude $Z_{KS}$ may improperly continue to decrement Q-counter 635. It is desired that an output signal sample be permitted to decrement Q-counter 635 only once as the output signal sample magnitude $Z_K$ traverses the selected signal magnitude $Z_{KS}$. Therefore, the selected signal magnitude $Z_{KS}$ is gated with update signal UPD from gate 627 through an inverter and with update control signal $\overline{C1}$ through an inverter. Therefore, the selected signal magnitude $Z_{KS}$ is gated to increment Q-counter 635 only when that particular output signal $Z_K$ is incremented past the selected signal magnitude $Z_{KS}$ as being indicative of the particular output signal sample $Z_K$ being at the selected magnitude $Z_{KS}$. This is controlled by being gated with update command signal UPD which is indicative of a pending update past the selected signal magnitude and further gated with control signal $\overline{C1}$ which is also used to clock Z-counter 613 to increment the particular output signal sample $Z_K$ past the selected output signal sample magnitude $Z_{KS}$. Therefore, NAND-gate 643 generates output signal 642 to decrement Q-counter 635 only when an output signal sample $Z_K$ is at the selected magnitude Z, and is being incremented to the next magnitude therefrom.

Output signal COM 636 from compositor control 632 may be used to excite an announciator such as a lamp or a buzzer to alert an operator to the completion of compositing condition and may be used as an input to an external device such as a supervisory computer to alert the external device to the completion of compositing condition. This condition may be used to initiate recording of correlated and composited output signal samples $Z_K$ in Z-RAM 614 or may be used to control other devices and operations.

In view of the above, a plurality of pulses are generated as signal 642 with gate 643 wherein each output pulse 642 may be related to a different output signal sample $Z_K$ traversing selected output signal sample magnitude $Z_{KS}$ and wherein the quantity of samples exceeding the selected signal magnitude $Z_{KS}$ may be indicative of the quality of the output sample information.

An overflow limiting arrangement will now be discussed.

An arrangement has been discussed above for providing a number of composites-after-correlation to build-up output signal sample peaks in an adaptive manner to a large value. It is possible that a correlated output signal sample may build up to a maximum value and then be incremented beyond the maximum value to an overflow condition. As is well known in the art, when counter arrangements such as Z-counter 613 are incremented past the maximum value of an all one-state, the counter will overflow by making a transition to the minimum value of an all zero-state; consistent with the well known modulo counter logic which implies a loss of overflow information beyond the maximum value. In a correlation operation, amplitude of a sample provides a figure-of-merit of the various correlation comparisons, wherein a large magnitude output signal sample is indicative of good correlation and a small magnitude output signal sample is indicative of poor correlation. In accordance with this overflow limiter feature of the present invention, if a peak signal reaches the largest magnitude permitted by a correlator, the peak magnitude may be limited or saturated to preserve the maximum magnitude and overflows may be precluded with saturation or limiting logic. Such limiting may not significantly degrade information contained in the saturated signal sample particularly when compared to the gross error caused by an overflow condition.

In accordance with the saturation limiting concept discussed above, a digital saturating or digital limiting arrangement will now be discussed with reference to FIG. 6D. Signal 644 may be a limiting signal generated by a detector such as NAND-gate 645 in response to a limiting magnitude $Z_{KL}$ of output signal sample $Z_K$. If the output signal sample $Z_K$ has a limiting magnitude such as a maximum magnitude having an all one-state, this maximum limiting signal magnitude $Z_{KL}$ may be detected with NAND-gate 645 which will generate a zero-state output signal 644 in response to the limiting magnitude sample $Z_{KL}$. Limiting detection signal 644 may be used to disable NAND-gate 627, thereby disabling updating of Z-counter 613 for a particular sample having a limiting magnitude $Z_{KL}$. Therefore, output signal samples loaded from Z-RAM 614 into Z-counter 613 will be updated by incrementing towards a limiting magnitude such as a magnitude of an all one-state. NAND-gate 645 detects the limiting magnitude and generates signal 644 to disable NAND-gate 627 in response to a limiting magnitude sample in Z-counter 613, thereby disabling updating of Z-counter 613 with signal 644 when Z-counter 613 contains an output signal sample $Z_K$ having a maximum magnitude $Z_{KL}$. Therefore, output signal samples $Z_K$ may be incremented toward the maximum magnitude $Z_{KL}$ but will not be incremented past the maximum magnitude as controlled by NAND-gate 645 and signal 644. This arrangement may be termed a digital saturation or digital limiting control circuit to saturate the digital magnitude at or to limit the digital magnitude to a prescribed maximum value without permitting overflows or other gross error conditions. Although a maximum signal magnitude of an all one-state has been discussed for simplicity, NAND-gate 645 may detect any signal sample magnitude determined with an input code of inverted and non-inverted bits of output signal sample $Z_K$ related to the desired maximum output signal sample magnitude.

In a preferred embodiment, limit detector 645 may be used in conjunction with adaptive compositor control 643 wherein digital limiter 645 may detect an output signal sample magnitude $Z_{KL}$ greater than the threshold output signal sample magnitude $Z_{KS}$ detected with adaptive compositor control 643, wherein $Z_{KL}$ may be greater than $Z_{KS}$. Therefore, output signal sample magnitudes may be incremented to the adaptive threshold magnitude $Z_{KS}$ and detected by adaptive control detector 643 before being limited by limitor threshold detector 645 at limiting magnitude $Z_{KL}$.

For simplicity of discussion, adaptive detector 643 and limiter 645 have been discussed for detection of selected magnitude and limited magnitude signals for an incremental update arrangement. Detectors 643 and 645 may be used to detect adaptive magnitude $Z_{KS}$ and limiter magnitude $Z_{KL}$ for incremental update, decremental update, or incremental-decrement update arrangements; wherein the $Z_K$ signal magnitude detected with detectors 643 and 645 may be selected for the particular update embodiment.

In a preferred embodiment, it may be desirable for K-counter 619 to continuously access Z-RAM 614 so that output signals $Z_0$–$Z_{Km}$ from Z-RAM 614 may be continually available in sequence to external devices such as for refreshing a CRT or for recording on a magnetic tape. This output capability may be controlled in response to a signal indicative of completion of correlator and compositor operations such as output signal Lm from L-counter 618, which is indicative of the completion of correlation of a trace signal, or output signal 636 of compositor control 632, which is indicative of completion of compositing-after-correlation operations. In a preferred embodiment, output signal 636 from compositor control 632 may be provided to external equipment as indicative of completion of compositing and correlation operations and may be used to enable output signal samples $Z_K$ from Z-RAM 614 to external devices. This may be accomplished by permitting K-counter 619 to continue to sequence through the K-addresses after correlation and compositing operations have been completed as shown by K-counter 619 having an input enable signal G connected to ground for continuous enabling of K-counter 619 operations. Further, output signals from K-counter 619 such as output K-addresses, maximum output signal Km, and/or the CRT sync signal may be provided to external equipment for synchronization and identification of the $Z_K$ samples from Z-RAM 614. This output mode of operation caused K-counter 619 to sequence through to maximum address Kmax indicated by output signal Km which preloads K-counter 619 through flip-flop 639 and NOR-gate 621 with load signal NXT to again start sequencing through the set of addresses. Z-RAM 614 may continue to generate output signals $Z_K$ in response to K-addresses from K-counter 619 for monitoring by external equipment.

To preserve the contents of Z-RAM 614 during the output mode operation, write signal $\overline{C2}$ may be disabled by compositor control signal $\overline{COM}$ to OR-gate 629. Therefore, K-counter 619 may continue to sequence through output signal K-addresses for accessing output signal samples $Z_K$ from Z-RAM 614, wherein compositor signal $\overline{COM}$ disables the write signal for Z-RAM 614 after compositing operations have been completed to preserve the output signal samples without modification.

Sequencing of K-counter 629 through the set of K-addresses may be continuously provided during the output mode. Initiation of a clear operation with clear switch CLR generating clear signal $\overline{CLR}$ for initiating of a new set of composite-after-correlation operations is performed by controlling compositor control 632 to enable the sync signal after clearing of the compositor control 632 for a new set of composites. This will cause output signals from one-shot 651 to generate preload signal NXT through NOR-gate 621 to cause preloading of K-counter 619 to the first address state independent of whether K-counter 619 has been in the middle of a count associated with the output mode discussed above. Therefore, there is no need to synchronize compositor logic and clear logic with operations of K-counter 619, wherein generation of load signal NXT in response to compositor control signals or clear control signals through one-shot 651 may automatically force K-counter 619 into synchronization, thereby discontinuing output mode operations without causing detrimental effects in the correlator logic. It may be necessary for output devices to monitor output K-addresses from K-counter 619 to insure that a complete set of output information has been obtained or in an alternate embodiment to monitor maximum output signal Km from K-counter 619 to determine if a complete set of output information has been obtained. In another alternate embodiment it may be necessary for output devices to monitor maximum output signal Km in conjunction with CRT sync signal NXT to determine if maximum output signal Km has initiated CRT sync signal NXT as being indicative of completion of an output mode iteration or to determine if minimum output address Km did not initiate CRT signal sync NXT as indicative of early termination of the output mode cycle in response to a clear command from clear switch CLR preloading K-counter 619 to force synchronization with clear mode operations.

The arrangement shown in FIG. 6D is illustrated in simplified form for simplicity of discussion and for compatibility with discussion related to Table III and FIG. 5. For example, a plurality of counters are shown such as C-counter 616, J-counter 617, L-counter 618, K-counter 619, and Z-counter 613 which are shown as S/N 74191 type counters. These counters may be implemented as single four-bit counter circuits or may be cascaded to provide the desired number of states using well known techniques discussed in The TTL Data Book on pages 417–436. The TTL Data Book further provides a detailed logical diagram on the counter circuit such as for illustrating the ripple clock and max-min output signal logic shown on pages 417–436 therein. Although the max-min and ripple clock logic for the S/N 74191 counter circuit may be used to exemplify the arrangement shown in FIG. 6D, external logic may be used to provide a max-min and ripple clock output signal for any number of counter stages whether the number of stages are factorable by four relative to the four-stages per S/N 74191 circuit permitting use of the ripple clock and max-min logic of the integrated circuit or whether the number of stages are not factorable by four and therefore may be implementable with discrete logic circuits. Further, Z-RAM 614 may be a single-bit RAM such as the S/N 74200 RAM, wherein a plurality of individual S/N 74200 RAM integrated circuits may be connected in parallel for providing a parallel whose word output $Z_K$ as discussed on pages 463–470 of The TTL Data Book. Therefore, Z-counter 613 and Z-RAM 614 may be expanded to have a large number of bits per word by cascading Z-counter circuits S/N 74191 and by connecting in parallel RAM circuits S/N 74200 as described on pages 417–436 and pages 463–470 respectively in The TTL Data Book. Similarly, P-ROM 625 may be a one-bit by 256-bit ROM or may be a 4-bit by 256-bit ROM such as implemented with integrated circuits S/N 74187. For the S/N 74187 4-bit by 256-word ROM circuit, one-bit such as the Y1-bit may be selected for the single-bit $P_J$ output signal, wherein other bits such as the Y2-bit and Y3-bit may not be necessary and may not be used. Further, ROM and RAM circuits may be cascaded to provide a greater number of words, may be connected in parallel to provide a greater number of bits, or may be connected in parallel and cascaded to provide a greater number of bits together with a greater number of words than available with individual ROM and RAM integrated circuits. Connecting of ROM and RAM circuits in cascade and in parallel is well known in the art such as discussed on pages 410–416 and 463–470 of The TTL Data Book and as discussed elsewhere in prior art literature.

In the above discussions relative to FIG. 6D; counters 613, 616, 618, and 619 have been described as operating in an up-counter mode and counter 617 has been described as operating in a down-counter mode consistent with the examples provided with reference to Table III and FIGS. 5A and 5B above. This consistency is provided for simplicity of discussion and is not a necessary requirement of the implementation. For example, embodiments may be provided for J-counter 617 implemented either as a down-counter or as an up-counter; where pilot signal samples may be stored in P-ROM 625 having time sequential samples progressing from a lower address to a higher address for J-counter 617 operating in a down-counter mode or pilot signal samples may be stored in P-ROM 625 having time sequential samples progressing from a higher address to a lower address for J-counter 617 operating in an up-counter mode. Similarly, C-counter 616 has been discussed for operation in an up-counter mode but alternate embodiments may be provided for C-counter 616 operating in an up-counter mode, a down-counter mode, or any counter mode wherein sequential signals C0–C3 are selected in a sequence of operations independent of the direction of count of C-counter 616. Similarly, K-counter 619 may be implemented as either an up-counter or a down-counter. K-counter 619 generates addresses K for accessing Z-RAM 614 where the count direction and count code of K-counter 619 is not a fixed constraint, but K-counter 619 should be initialized to the same state and should count in the same sequence of codes for accessing the same memory locations from Z-RAM 614; wherein it is not important which storage location in Z-RAM 614 corresponds with a particular Z output sample as long as that $Z_K$ output sample is consistently stored in the same location and otherwise kept track of for updating the appropriate output sample $Z_K$ with the related computational solution from gate 626. Similarly, L-counter 618 may count output samples as an up-counter or as a down-counter, and L-counter 618 may be implemented consistent with the supplying of the Jo-parameter to preload J-counter 617. The primary purpose of L-counter 618 is for determining the end of the trace signal by counting trace signal samples $T_L$ and for generating the Lm output signal indicative of the last trace signal sample. Another purpose of L-counter 618 is for generating the Jo-parameter for preloading of J-counter 617. Similarly, Z-counter 613 is used to incrementally update $Z_K$ parameters from Z-RAM 614, wherein updating may be provided as incrementing and not-incrementing in response to a one-state and a zero-state respectively from gate 626 or incrementing and not-incrementing in response to zero-state and a one-state from gate 626 respectively. Alternately, the output of gate 627 may be input to the down-up signal terminal DU of Z-counter 613 for decrementing and incrementing in response to a zero-state and a one-state respectively output from gate 626 or for incrementing and decrementing in response to a one-state and a zero-state respectively from gate 626. The mechanization of incrementing and not-incrementing or decrementing and not decrementing of Z-counter 613 in response to the output of gate 626 will determine whether the output signal magnitude will increase in a positive direction or increase in a negative direction for good correlations.

Resistors may be used which are not shown in FIG. 6D for simplicity but are described in the product literature and are well known in the art. For example, pull-up resistors may be used for open-collector output circuits, wherein an open-collector output signal line may be connected to a positive voltage source with a resistor such as connecting to a +5-volt source with a 5K-ohm resistor. Open collector outputs using pull-up resistors may need individual pull-up resistors for each output signal line unless they are being wire-ORed together, in which case they may be connected to the same pull-up resistor. Similarly, unused inputs may be left open or may be connected to a positive supply directly or with a pull-up resistor such as connecting to a +5-volt supply with a 1K-ohm pull-up resistor. A plurality of unused inputs may all be connected to the same pull-up resistor.

The arrangement shown in FIG. 6D has been presented in simplified form to better exemplify the features of the present invention. A significant increase in speed may be achieved by implementing additional techniques in the arrangement shown in FIG. 6D as discussed below.

Operation of the arrangement shown in FIG. 6D may be increased in speed by overlapping operations such as controlled by control signals $\overline{C0}$–$\overline{C3}$. Such overlapping operations may be performed by providing parallel or redundant devices. For example, a plurality of Z-counter and Z-RAM devices may be provided such as for accessing a $Z_K$ word from a first Z-RAM for loading a first Z-counter while storing an updated $Z_K$ word from a second Z-counter into a second Z-RAM. This implementation may include a second K-counter, wherein two sequential adjacent K-addresses may be stored in the two counters or may include a K-register used in conjunction with a K-counter wherein the K-counter may store the latest Z-RAM address such as the access address and a K-register (not shown) may store the Z-RAM store address of the last updated word, where the store address might be one address less than the access address.

Improvement in speed with the arrangement shown in FIG. 6D may also be obtained by providing an arrangement for determining the first Z-output sample to be updated such as with a K0 counter for preloading the K-counter with the value of the address of the first output sample to be updated, which might be implemented similar to the arrangement discussed above for the preloading of the J-counter with the address Jo of the first pilot signal sample $P_{J_o}$. With reference to Table III, the first output sample to be updated for any trace signal sample may be determined by a simple counter arrangement which may be incremented for each new trace signal sample processed. The first group of trace signal samples, which are the first four trace signal samples in the example shown in Table III, are used to update the output signal samples $Z_K$ starting with the first output signal sample $Z_0$. Subsequent trace signal samples, such as trace signal sample $T_4$–$T_{15}$ for the example shown in Table III, do not update the first output signal sample $Z_0$ but updated output signal samples other than $Z_0$. For the example shown in Table III, trace signal samples $T_4$ has a first updated output signal sample $Z_1$, trace signal samples $T_5$ has a first updated output signal sample $Z_2$, etc wherein the last trace signal sample $T_{15}$ has a first updated output signal sample $Z_{12}$ which is the last output signal sample. Therefore, many output signal samples are not updated by each trace signal sample shown as blank locations in the upper right hand portion of Table III and therefore may be skipped in the computation by preloading the address of the first output signal sample Ko into K-counter 619 from a first updated output signal sample counter identified as the Ko-counter (not shown) which is incremented as the trace signal is sampled with the $\overline{NXT}$ signal.

Additional speed may be obtained by skipping update computations associated with subsequent output signal samples that should not be updated such as indicated by the blank spaces in the lower left-hand corner of Table III. For example, output signal samples will be updated as the pilot signal sample address-J is decremented through J=0, wherein the $P_0$ pilot signal sample associated with the J=0 address may be the last pilot signal sample used to update output signal samples $Z_K$ in response to any particular trace signal sample $T_L$. This consideration may be shown with the $P_0$ pilot signal sample being the last pilot signal sample in each column of Table III and being followed vertically downward by blank spaces in Table III indicative of subsequent output signal samples not being updated. Therefore, detection of the $P_0$ pilot signal sample such as by detection of the J-counter 617 going through a zero-state related to J=0 may be used to detect updating of the last output signal sample in response to a particular trace signal sample. Termination of updating for that particular trace signal sample may be achieved by using the max-min mm output of J-counter 617 to initiate processing of the next trace signal sample by replacing the Km signal to NOR-gate 621 with the Jm signal to NOR-gate 621 to enable preloading of J-counter 617 with the Jo-parameter from L-counter 618 and to enable preloading of K-counter 619 for the start of the next set of output signal sample updates in response to the next trace signal sample $T_L$. Therefore, the time required for the counters in control logic 615 to increment through unnecessary operations, such as shown in Table III as the blanks on the lower left-hand corner, may be reduced thereby reducing the time for performing the correlation operations.

In an alternative embodiment, the sequence may be terminated when J-counter 617 decrements to the zero-state as being indicative of the last necessary computation. The zero-state of J-counter 617 may be detected with decoder 628 or with min-max signal Jm to control loading of J-counter 617 with the Jo-parameter and loading of K-counter 619 to the initial state for the next updating of the output samples. Similarly, K-counter 619 may be preloaded with the address of the first output signal sample to be updated, wherein the first output signal sample to be updated may be related to the trace signal sample being processed. For example, the $T_8$ trace signal sample starts with updating of the $Z_5$ output signal sample (Table III); wherein the first output signal sample to be updated may be related to the address of the trace signal sample by the equation $K=L-3$ for the example shown in Table III. For simplicity of discussion, arrangement shown in FIG. 6D merely disables updating of output signal samples with decoder 628 and NAND-gate 627 for non-updating iterations related to blank spaces of Table III. Those of ordinary skill in the art will be able to identify the circuit shown in FIG. 6D to incorporate these optimation features from the teachings of the present invention.

Additional time may be saved by providing a sample buffer memory for trace signal samples $T_L$ so that trace signal samples may be received and stored at an average sample rate and may be provided to the correlation logic at the desired computational rate. Such an arrangement may be valuable to compensate for peak computational loads and for minimum computational loads associated with the above described time reducing control operations. This consideration will now be described with reference to Table III, wherein certain trace signal samples may have a reduced computational load. For example, trace signal sample $T_0$ updates only a single output signal sample $Z_0$, trace signal sample $T_1$ updates only two output signal samples $Z_0$ and $Z_1$, etc. Also, many trace signal samples $T_4$–$T_{12}$ update a total of four output signal samples where the above optimization arrangements may have unequal times between processing trace signal samples depending upon the location in the sequence of trace signal samples being processed. Therefore, a buffer memory for buffering trace signal samples $T_L$ may permit trace signal samples to be sampled at fixed time intervals such as an average time interval and may permit accessing of the buffered trace signal samples from the buffer memory at the required computational rate, where computational time may be longer than the average sample period for longer computational requirements and may be shorter than the average sample period for shorter computational requirements. Such a buffer memory may be implemented for loading trace signal samples under control of an incrementing next input sample counter and for accessing samples under control of an incrementing next output sample counter wherein the next input sample counter may be incremented at the average sampling rate and the next output sample counter may be incremented in response to completion of each correlation operation such as under control of load signal $\overline{\text{NXT}}$ from NOR-gate 621 as indicative of the need to sample the next trace signal sample. A well known first-in-first-out (FIFO) memory may be used to provide this trace signal buffer memory operation.

Additional improvements in speed may be obtained by using the output of gate 626 to determine whether the related output signal sample $Z_K$ is to be updated such as by incrementing in one embodiment or by decrementing in an alternate embodiment. If the output signal sample $Z_K$ is to be updated, it may be accessed from Z-RAM 614 for updating with Z-counter 613. If output signal sample $Z_K$ is not to be updated such as with a not-increment or not-decrement command from gate 626, it may not be necessary to access the output signal sample $Z_K$ from the Z-RAM 614. Therefore, the $\overline{\text{C0}}$–$\overline{\text{C2}}$ control signal sequence may be eliminated for a non-update condition controlled by gate 626, which may reset C-counter 616 and may clock counters 617–619 such as with the $\overline{\text{C3}}$ clock signal or an equivalent clock signal but may not perform Z-RAM and Z-counter operations related to the non-update condition. In a system having a low signal-to-noise ratio or a high noise content, an input trace signal sample $T_L$ may have a duty-cycle of approximately 50% which may be slightly-weighted or biased by the signal contained therein. Assuming a 50% duty-cycle of increment and non-increment commands from gate 626 for simplicity of discussion, only one-half of the update command iterations will command updating of output signal samples $Z_K$ with increment and non-increment or decrement and non-decrement algorithms. Therefore, implementation of conditional access update, and store operations for Z-RAM 614 may result in a saving of almost 50% of the time required for updating operations.

As discussed above for operation 527 (FIG. 5A) and decoder 628 (FIG. 6D) a test of the J-parameter or other related test may be used to determine which updates may be unnecessary or undesirable, wherein such unnecessary updates may be related to the blank spaces shown in Table III above and may be termed blank updates. Detection and elimination of such blank updates may be necessary to preclude erroneous updates of output signal samples $Z_K$. The operations associated with blank updates such as memory accesses and computations may be skipped or eliminated to increase time available for other operations, to increase speed, and other such considerations.

A brief description of the blank update consideration will now be provided with reference to Table III. The number of memory access and multiplication operations for a correlation computation may depend on the mechanization. Embodiments may be provided wherein the number of operations are related to either the product of the number of trace signal samples and the number of pilot signal samples or to the product of the number of trace signal samples and the number of output signal samples. For the example shown in Table III, there are sixteen trace signal samples and four pilot signal samples which would be related to 64-computational operations for a first embodiment and there are sixteen trace signal samples and thirteen output signal samples which would be related to 208-computational operations for a second embodiment. In a preferred embodiment, the blank update operations may be eliminated where the required number of operations are related to the product of the number of pilot signal samples and the number of output signal samples; where Table III shows four pilot signal samples and thirteen output signal samples for a total of 52-update operations.

The number of updates may be determined by the relationship between the number of pilot signal samples and the number of trace signal samples as shown in equation (2), equation (5), equation (6), and equation (7).

$$N_U = N_P N_Z \quad \text{equation (5)}$$

$$N_U = N_P(N_T - N_P + 1) \quad \text{equation (6)}$$

$$N_U = N_P N_T - N_P + N_P \quad \text{equation (7)}$$

$$N_U = N_T N_Z \quad \text{equation (8)}$$

$$N_U = N_T - N_T N_P + N_T \quad \text{equation (9)}$$

Equation (2) shows the relationship between the number of trace signal samples ($N_T$), the number of pilot signal samples ($N_P$), and the number of output signal samples ($N_Z$). As discussed above for a preferred embodiment, the number of updates ($N_U$) may be equal to the product of the number of pilot signal samples ($N_P$) and the number of output signal samples ($N_Z$) as shown in equation (5) above. The value for the number of output signal samples ($N_Z$) from equation (2) may be substituted into equation (5) yielding equation (6), which may be simplified by multiplying through to generate equation (7). With reference to equation (7), the number of updates ($N_U$) varies as an exponential function of the number of pilot signal samples ($N_P$) and is related to the number of trace signal samples ($N_T$). For the example shown in Table III having sixteen trace signal samples ($N_T$) and four pilot signal samples ($N_P$), a total of 52-update computations ($N_U$) are required. For a geophysical embodiment having 32,000 trace signal samples ($N_T$) and 24,000 pilot signal samples ($N_P$), a total of approximately 192-million update computations ($N_U$) are required.

If update computations associated with the blank positions in Table III were implemented even though they were not used to update the output signal samples, then the computational load would be significantly greater. The total number of update locations in Table III including blank update locations and actual update locations is equal to the product of the number of trace signal samples ($N_T$) and the number of output signal samples ($N_Z$) as shown in equation (8). Substituting equation (2) into equation (8) yields the number of updates ($N_U$) in terms of the number of pilot signal samples ($N_P$) and the number of trace signal samples ($N_T$) as shown in equation (9). Substituting the value of $N_T=16$ and $N_P=4$ for the example shown in Table III into equation (9) yields 208 update computations which is approximately four-times the number of update computations required for an embodiment excluding computations associated with blank locations in Table III. Similarly, for the geophysical embodiment wherein $N_T=32,000$ and $N_P=24,000$; the number of updates is equal to approximately 256-million update computations which is approximately 25% more than the 192-million update computations for the above example excluding the blank update computations.

In view of the above examples and with reference to equation (7) and equation (9), several considerations relating to the number of update computations and the skipping of blank update computations become apparent. First, the number of update computations becomes very large as the number of pilot signal samples ($N_P$) and the number of trace signal samples ($N_Z$) becomes large. Second, the reduction of update computations by skipping blank computations such as shown by the blank spaces in Table III has a reduction in significance as the number of pilot signal samples ($N_P$) approaches the number of trace signal samples ($N_T$) and has an increase in significance as the number of pilot signal samples ($N_P$) is made less than the number of trace signal samples ($N_T$). Third, determination of the blank update computations is necessary to preclude improperly updating of output signal samples, thereby involving a programming or logical circuit implementation to detect the unnecessary update computations, where such an implementation may also be used to skip the blank update computations. Therefore, an alternate embodiment of the present invention may include an arrangement for detecting blank update computations, exemplified by the blank spaces in Table III; may include an arrangement for disabling updating of output signal samples in response to blank update computations; and may include an arrangement for disabling operations associated with blank update computations such as memory accessing and store operations and output signal update operations.

The arrangement discussed with reference to FIG. 6 and in particular FIG. 6D has been discussed for correlation operations. Further, it has been discussed above that compositing-after-correlation is implicit in the summation of single-bit correlation products with corresponding output samples to build-up significance of the output samples either through correlation of additional samples of a single trace signal or by compositing of additional samples of additional trace signals. The compositing operation associated with the correlator of the present invention may be better understood by illustrating how the arrangement shown in FIG. 6D can provide a compositing operation independent of the correlation operation. In a compositor embodiment, there is no need to implement a pilot signal memory nor pilot signal control operations; wherein J-counter 617, L-counter 618, P-ROM 625, decoder 628 and exclusive OR-gate 626 may be eliminated. The trace signal $T_L$ may be provided directly to gate 627 to control the incrementing and not-incrementing or decrementing and not-decrementing of Z-counter 613 in response to one-state and zero-states respectively of trace signal $T_L$.

K-counter 619 keeps track of the addresses of composited trace signal samples. Overflow signal Km of K-counter 619 may be connected to K-counter enable input G to disable operation of K-counter 619 after the K-counter has sequenced to the Km maximum address, thereby locking-up K-counter 619 through enable signal G.

Receipt of a sync pulse to AND-gate 638 when enabled by signal 636 from compositor control 632 generates output pulse $\overline{OUT}$ for clearing C-counter 616 and generates output pulse OUT for preloading K-counter 619 to initiate another composite operation. As K-counter 619 increments from the initial address to the maximum address Km, input trace samples $T_L$ may be conditionally added to or not added to the samples stored in Z-RAM 614 by incrementing or not-incrementing the corresponding output signal samples $Z_K$ loaded into Z-counter 613. When the last trace sample $T_L$ is used to update the last composited signal sample in Z-RAM 614, identified by the last address Km from K-counter 619, the Km signal from K-counter 619 may again lock-up K-counter 619 pending arrival of the next input sync pulse which is indicative of the start of the next trace signal. Composite control 632 may operate similar to that described for the composite-after-correlation arrangement discussed above with reference to FIG. 6D. Therefore, a programmable quantity of trace signals may be composited together as discussed for composite control 632 above.

Another difference with a compositor arrangement compared to a composite-after-correlation arrangement is that K-counter 619 has a number of Z-RAM addresses corresponding to the number of trace signal samples $T_L$, wherein the address Km may correspond to the address of the last trace signal sample and wherein the number of output signal samples $Z_K(N_Z)$ may be equal to the number of trace signal samples ($N_T$) for compositing. This is in contrast to the compositing-after-correlation embodiment discussed with reference to FIG. 6D above; wherein the number of Z-RAM addresses is equal to the number of output signal samples ($N_Z$) which is equal to the difference between the number of trace signal samples ($N_T$) and the number of pilot signal samples ($N_P$) discussed with reference to equation (2) above. Therefore, the number of correlation output signal samples ($N_Z$) is less than the number of composited output signal samples for a simple compositing arrangement without correlation, assuming that the number of trace signal samples is the same for the compositing-only embodiment and for the correlation or compositing-after-correlation embodiment.

DESCRIPTION OF FIG. 6E

The correlator arrangement of the present invention may be implemented as a plurality of correlator channels having portions of logic being dedicated to a particular channel and other portions of logic being shared between a plurality of channels. One embodiment of a multi-channel correlator arrangement is shown in FIG. 6E having computational logic dedicated to each of a plurality of channels and having control logic 615 being shared between all of the channels. A multi-channel correlator arrangement such as shown in FIG. 6E may be implemented by using a plurality of single-channel correlators, wherein such single-channel correlator arrangements are discussed with reference to FIGS. 5B, 6A, and 6D above. Alternately, a multi-channel correlator arrangement may be implemented such as with the time-shared arrangement discussed with reference to FIG. 5A above.

The arrangement shown in FIG. 6E will now be discussed in detail. A plurality of correlator channels may be configured to process each of a plurality of trace signals wherein each trace signal may be processed first with a squaring amplifier 623 for squaring a trace signal and then with a sample flip-flop 624 for sampling and storing the trace signal sample in response to the next command signal NXT. P-store 610 may be implemented with a P-ROM 625 for generating pilot signal samples in response to pilot signal sample addresses J generated by control logic 615. Multiplication or comparison of a trace signal sample $T_L$ and a pilot signal sample $P_J$ may be performed with exclusive-OR network 626 to generate a single-bit compare signal to NAND-gate 627 for enabling or disabling with disable signal D for updating a related $Z_K$ output signal sample. Each channel may have a Z-RAM 614 for storing output signal samples $Z_K$ and a Z-counter 613 for updating an accessed output signal sample $Z_K$. The output signal sample $Z_K$ is selected with K-addresses from K-counter 619 in control logic 615 and is loaded into Z-counter 613 for updating under control of an update signal from NAND-gate 627. After updating, the updated output signal sample $Z_K$ is stored back into Z-RAM 614. Therefore, each trace signal correlator channel may be similar to the single channel correlator discussed in detail with reference to FIG. 6D above.

For a multi-channel correlator arrangement, control logic 615 may be common to a plurality of correlator channels and may be shared between this plurality of correlator channels. For example, the control signals from control logic 615 such as clock signals C from C-counter 616, pilot signal sample addresses J from J-counter 617, trace signal sample addresses L from L-counter 618, and output signal sample addresses K from K-counter 619 may be shared between a plurality of correlator channels, wherein the control signals may be common to each channel and wherein the correlation operations of all channels may be synchronized together with control logic 615. Alternately, synchronization of each of a plurality of correlator channels may be provided with different sync signals for each of the channels having different time synchronization or being asynchronous therebetween. Such an arrangement requires operation of each correlator channel to operate asynchronously with respect to each other correlator channel. Therefore, control logic 615 may be duplicated for each of a plurality of asynchronously operating correlator channels. As still another alternate, portions of control logic 615 such as logic associated with C-counter 616 may be shared between each of a plurality of correlator channels and other portions of control logic 615 such as logic of J-counter 617, L-counter 618, and K-counter 619 may be dedicated to each of the correlator channels and may be duplicated for each correlator channel. Therefore, various combinations of dedicated control logic and shared control logic may be provided in conjunction with a plurality of correlator channels.

Each of the plurality of channels shown in FIG. 6E is shown having an input trace signal $T_{LO}-T_{LN}$ and a pilot signal $P_{JO}-P_{JN}$. Various alternate embodiments may be provided with combinations of trace signals and pilot signals. For example, the trace signal to each of a plurality of channels may be different from the trace signals to the other channels or the trace signal to each of a plurality of channels may be the same as the trace signals to the other channels. Further, the pilot signal to each of a plurality of channels may be different from the pilot signals to the other channels or the pilot signal to each of a plurality of channels may be the same as the pilot signal to the other channels. These alternative will be described in greater detail below.

In a first multi-channel correlator embodiment, the trace signals to each of a plurality of channels may be different from the trace signals to other channels and the pilot signals to each of the plurality of channels may be different from the pilot signals to other channels. Therefore, each of the plurality of channels may have a different trace signal and a different pilot signal than the other channels. In such an arrangement, trace signals $T_{LO}-T_{LN}$ and pilot signals $P_{JO}-P_{JN}$ may be all different therebetween.

In another multi-channel correlator embodiment, the trace signals to each of a plurality of channels may be the same as the trace signals to other channels and the pilot signals to each of the plurality of channels may be the same as the pilot signals to other channels. Therefore, each of the plurality of channels may have the same trace signal and the same pilot signal. In such an arrangement, trace signals $T_{LO}-T_{LN}$ may be the same and pilot signals $P_{JO}-P_{JN}$ may be the same, wherein trace signals and pilot signals may be represented without channel designations as $T_L$ and $P_J$ respectively.

In still another multi-channel correlator embodiment, the trace signals to each of a plurality of channels may be different from the trace signals to other channels and the pilot signals to each of the plurality of channels may be the same as the pilot signals to other channels. Therefore, each of the plurality of channels may have different trace signals and may have the same pilot signal. In such an arrangement, trace signals $T_{LO}-T_{LN}$ may be all different therebetween and pilot signals $P_{JO}-P_{JN}$ may be the same therebetween; wherein pilot signal may be represented without channel designations as $P_J$. In this embodiment having a different trace signal and the same pilot signal for each channel, a plurality of different trace signals may be "searched" to find a common signature signal therein.

In yet another multi-channel correlator embodiment, the trace signals to each of a plurality of channels may be the same as the trace signals to other channels and the pilot signals to each of the plurality of channels may be different from the pilot signals to other channels. Therefore, each of the plurality of channels may have the same trace signal and may have different pilot signals. In such an arrangement, trace signals $T_{LO}$–$T_{LN}$ may be all the same therebetween and pilot signals $P_{JO}$–$P_{JN}$ may be different therebetween; wherein trace signals may be represented without channel designations as $T_L$. In this embodiment having a different pilot signal and the same trace signal for each channel, the same trace signal may be "searched" with a plurality of different pilot signals to find different signature signals multiplexed in the trace signal.

A pilot signal common to a plurality of channels may be obtained from a single P-store 610 such as P-ROM 625, wherein a single P-ROM output such as pilot signal $P_{JO}$ may be fanned-out to each of a plurality of channels such as by being input to gate 626 of channel N in place of pilot signal $P_{JN}$. Alternately, a separate P-store 610 such as P-ROM 625 may be provided for each channel as shown for FIG. 6E wherein the same pilot signal may be stored in each P-ROM 625.

A trace signal common to a plurality of channels may be obtained by inputting the same trace signal to each of a plurality of correlator channels wherein a single trace signal such as signal $T_{LO}$ may also be input to channel N in place of trace signal $T_{LN}$.

Output signal sample processor logic comprising Z-RAM 614 and Z-counter 613 may be provided separately for each correlator channel as shown in FIG. 6E for separate output signal sample processing. Alternately, output signal sample processor logic 613 and 614 may be common to a plurality of channels such as for compositing correlated signals from a plurality of channels theretogether. In such an arrangement, the update control signal $\overline{C1}$ to clock Z-counter 613 (FIG. 6D) may be provided as a plurality of clock signals being clock signals $\overline{C1}_0$–$\overline{C1}_N$ related to correlation channels 0–N respectively. The plurality of clock signals may clock Z-counter 613 to update an output signal sample in response to each of a sequence of update signals for a particular output signal sample, wherein each of the correlator channels 0–N may be selected in sequence by each of the corresponding clock signals $\overline{C1}_0$–$\overline{C1}_N$ respectively to apply the update control signal from gates 627 for each channel in sequence to update the signal sample from Z-counter 613. This arrangement is particularly useful when synchronization of input trace signals is the same so that all of the input trace signal samples have correspondence therebetween and have correspondence to the same output signal sample accessed from Z-RAM 614 and available in Z-counter 613. This arrangement provides compositing-after-correlation between a plurality of correlation channels.

In an alternate embodiment, a plurality of trace signals $T_{LO}$–$T_{LN}$ may have different synchronizations therebetween and different sets of control logic 615 for each correlator channel having a different synchronization characteristic, wherein it may be desirable to composite the correlated signals from each of a plurality of non-synchronous or asynchronous correlator channels theretogether. In such an arrangement, each channel may be sequenced to access an appropriate sample from Z-RAM 614 for updating in Z-counter 613 and for storing back into Z-RAM 614 before a next correlator channel is permitted to access Z-RAM 614 for updating a different Z-output signal sample. In this arrangement, each correlator channel may access Z-RAM 614 in it's proper time, update the accessed sample in Z-counter 613, and load the related sample back into Z-RAM 614 before the sequensor sequences to the next channel for updating of a different output signal sample. This arrangement is similar to the time-shared multi-channel arrangement discussed with reference to FIG. 5A, wherein the sequensor may sequence through a plurality of trace signals for a particular signal sample interval for updating of an output signal sample accessed for a particular channel, then being stored back into Z-store 614 prior to sequencing to the next correlator channel. In a hardware embodiment, this arrangement may be implemented by expanding C-counter 616 shown in FIG. 6D to sequence through a plurality of clock states $\overline{C0}$–$\overline{C3}$ for each correlator channel in sequence. For a three channel system, C-counter 616 may sequence through clock signals $\overline{C0}_0$–$\overline{C3}_0$ for channel 0, followed by clock signals $\overline{C0}_1$–$\overline{C3}_1$ for channel 1, followed by clock signals $\overline{C0}_2$–$\overline{C3}_2$ for channel 2, and then followed by clock signals $\overline{C0}_0$–$\overline{C3}_0$ for again processing channel 0, etc. The related signals may be ORed together such as $\overline{C0}_0+\overline{C0}_1+\overline{C0}_2$ for generating the $\overline{C0}$ signal into Z-counter 613; $\overline{C1}_0+\overline{C1}_1+\overline{C1}_2$ for generating the $\overline{C1}$ clock signal into Z-counter 613; $\overline{C2}_0+\overline{C2}_1+\overline{C2}_2$ for generating the write enable signal C2 into Z-RAM 614 through NAND-gate 629; and $\overline{C3}_0+\overline{C3}_1+\overline{C3}_2$ for generating the counter clock signal $\overline{C3}$. Alternately, the $C3_0$–$C3_2$ clock signals to J-counter 617, L-counter 618, and K-counter 619 may be provided to separate counters for each channel for this non-synchronous embodiment.

In view of the above, various combinations of commonality and separation may be provided between a plurality of correlator channels with combinations of the same trace signal or different trace signals to the plurality of correlator channels, the same pilot signal or different pilot signals to the plurality of correlator channels, and the same output signal processing logic or different output signal processing logic for the plurality of correlator channels.

The arrangement shown in FIG. 6E is intended to be representative of a plurality of correlator channels ranging from channel-0 to channel-N. For an embodiment having two correlator channels identified as channel-0 and channel-1, then N=1. Similarly, for an embodiment having 10-channels defined as channels 0–9, then N=9. Similarly, other pluralities of correlator channels may be provided without departing from the descriptions provided herein. The vertical arrows shown in FIG. 6E are intended to represent additional correlator channels between channel-0 and channel-N which are not shown because they may be identical to the two channels, channel-0 and channel-N, shown in FIG. 6E.

DESCRIPTION OF FIG. 6F

Compositor control arrangement 632 provides for controlling a programmable number of composite operations after correlation for the correlation arrangement discussed with reference to FIG. 6D above. A programmable Q-counter 635 may be preloaded with a digital number such as from thumbwheel switches 333 or from other programmable sources to define the number of correlation operations that are to be composited together. Q-counter 613 is shown connected as a down-counter to count-down from the preloaded number under control of the clock signal CK which may be the Lm signal derived from L-counter 618, wherein the Lm signal is indicative of completion of a correlation operation. Therefore, Q-counter 635 may count-down from a programmed quantity of correlation operations being decremented at the completion of each correlation operation and underflowing when the number has been counted-down to zero to disable further correlations.

A programmable input device such as thumbwheel switches 633 may be provided to Q-counter 635 in parallel signal form. Thumbwheel switches 633 may be hexidecimal thumbwheel switches or BCD thumbwheel switches which are well known in the art such as Digiswitch thumbwheel switches manufactured by the Digitran Company of Pasadena, Calif. Thumbwheel switches 633 usually provide complement outputs which are inverted with inverters 634 to provide uncomplemented signals to Q-counter 635. Q-counter 635 may be an S/N 74190 counter which is a BCD counter used in conjunction with BCD thumbwheel switches or may be an S/N 74191 binary counter for use with hexidecimal thumbwheel switches.

Clearing of Z-RAM 614 has been discussed with reference to FIG. 6D above, wherein Z-RAM 614 is cleared with gates 630 under control of clear signal $\overline{CLR}$ from clear switch CLR as being indicative of the completion of a prior compositing and correlation operation and the intended initiation of the next compositing-after-correlation operation. Therefore, the $\overline{CLR}$ signal is connected to the load input LD of Q-counter 635 for loading Q-counter 635 from thumbwheel switches 633. Q-counter 635 is connected for a down-count with the up-down input UD connected to a positive voltage. Clock input CK to Q-counter 635 may be connected to the Lm signal line from L-counter 618, where the Lm signal is indicative of the last trace sample for a correlation. Therefore, the Lm signal would clock Q-counter 635 to decrement the initially preloaded number in response to the completion of each successive correlation and compositing operation. Alternately, clock input CK to Q-counter 635 may be connected to the adaptive control signal 642 (FIG. 6D), where the adaptive control signal 642 is indicative of an output signal sample $Z_K$ reaching a selected magnitude $Z_{KS}$ for decrementing Q-counter 635 as discussed with reference to FIG. 6D above.

When Q-counter 635 is decremented to zero, the min-max output signal mm goes high which disables subsequent counting of Q-counter 635 by being directly connected to the enable input G and the output signal mm generates disable signal 636 with inverter 637 to disable subsequent sync pulses, as discussed with reference to FIG. 6D above. Q-counter 635 remains disabled until preloaded with the $\overline{CLR}$ signal as discussed above.

Figure 6F:
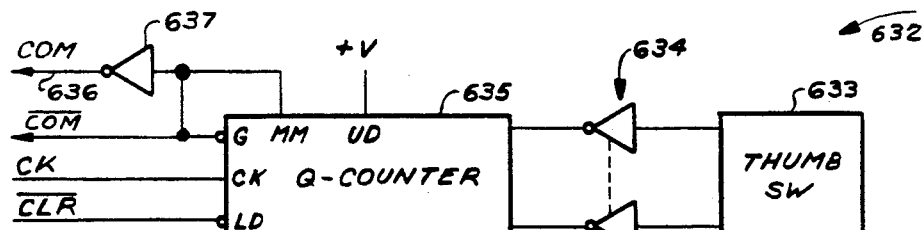
FIG. 6F shows a composite control arrangement in accordance with FIG. 6D.
Figure 6G:
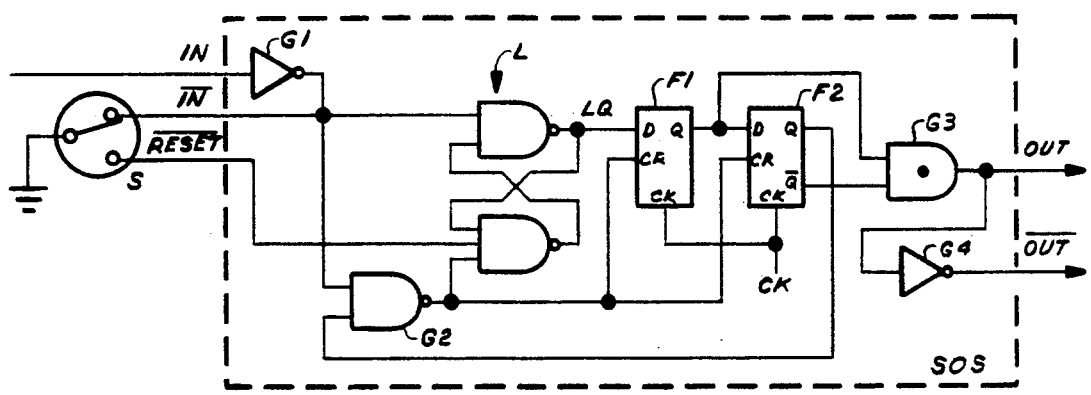
FIG. 6G shows a synchronous one-shot logical schematic.

Compositor control arrangement 632 discussed with reference to FIG. 6F permits a sequential group of compositing operations to be performed after correlation and then maintains the composited information in Z-RAM 614 until cleared such as with the clear switch CLR to initiate another composite-after-correlation operation.

For simplicity of discussion; Q-counter 635 has been discussed as a single four-bit counter circuit S/N 74191 and thumbwheel switch 633 has been discussed as a single four-bit switch. Alternately, Q-counter 635 and input source 633 may be cascaded such as in four-bit blocks to increase control beyond the maximum of 15 composites-after-correlation permissible with a single four-bit arrangement. Such cascading of counters and thumbwheel switches is well known in the art, where the cascading of the S/N 74191 circuits is described in The TTL Data Book referenced hereinafter. Further, thumbwheel switches are merely exemplary of one form of programming Q-counter 635, wherein thumbwheel switches 633 may be replaced by a digital register that may be loaded from a digital computer or other digital device or may be any prior art arrangement for preloading counter 635 with the desired number of composites.

DESCRIPTION OF FIG. 6G

A synchronous one-shot circuit SOS (FIG. 6G) is provided to generate a synchronous output pulse OUT having a prescribed pulse width and being synchronized with a clock signal CK in response to a transition of an input signal IN. Further, the SOS circuit may provide a latching function that permits error free generation of the output pulse independent of whether the input signal is shorter than the output pulse or longer than the output pulse. Further, the SOS circuit may be used to provide switch debounce and other such operations associated with input signals.

Latch circuit L is constructed with a pair of cross-coupled NAND-gates such as with S/N 74279 circuits. A low input to the top gate generates a high output LQ and a low input to the bottom gate generates a low output $\overline{LQ}$. The memory function associated with latch L provides for storing the high output signal LQ or the low output signal $\overline{LQ}$ when the input signals go high. For example, switch S may be a manual switch with one pole connected to the $\overline{IN}$ line and the other pole connected to the $\overline{RESET}$ line. Switch S being positioned to the $\overline{IN}$ position will ground the $\overline{IN}$ line to set latch L to the LQ-state. The condition of the moving element of switch S bounding on a terminal may apply alternate high and low conditions to the $\overline{IN}$ input of latch L, but the memory associated with latch L will maintain the latched position LQ independent of the switch bounce on the $\overline{IN}$ terminal. Latch L will not be reset until the moving element of switch S is positioned to the $\overline{RESET}$ input, thereby applying a ground signal to the reset input of latch L and causing latch L to assume the $\overline{LQ}$ state independent of switch bounce at the $\overline{RESET}$ terminal. Similarly, a short pulse on an input line $\overline{IN}$ will set latch L, where latch L will remain set until it is reset with the $\overline{RESET}$ signal or with the generation of an output pulse through gate G3, as will be discussed hereafter. For convenience, both an $\overline{IN}$ signal line and IN signal line are provided wherein the IN signal line is inverted with gate G1 which may be wire-ORed with the $\overline{IN}$ signal line as an input to latch L.

The state of latch L is shifted through flip-flops F1 and F2 in sequential shift register fashion under control of clock signal CK. Initially with latch L being zero-set, flip-flops F1 and F2 had been reset due to the asynchronous clear signal to clear inputs CR, which will be discussed hereafter, or by shifting the input zero-state through flip-flops F1 and F2 under control of shift clock CK. Therefore, it will be assumed that flip-flops F1 and F2 are initially in the zero-set state. When latch L is one-set, latch output signal LQ goes high thereby making the input to flip-flop F1 high, but flip-flop F1 will remain in the latched zero-state and flip-flop F2 will remain in the latched zero-state. On the occurrence of a transition of clock signal CK, flip-flops F1 and F2 will set to the input signal states, wherein flip-flop F1 will be set to the one-state of input signal LQ and flip-flop F2 will be set to the zero-state of input signal F1Q. Flip-flop F1 being set to the one-state causes the input of flip-flop F2 to go to the one-state, wherein the next transition of clock signal CK will therefore set flip-flop F2 to the one-state. Therefore, the two clock pulses following the latch L being set to the one-state will progressively set flip-flop F1 to the one-state and then set flip-flop F2 to the one-state. The transitionary condition of flip-flop F1 having been set to the one-state and flip-flop F2 not as yet being set to the one-state is detected by gate G3 having as inputs the F1Q signal and $\overline{F2Q}$ signal to generate an output signal in response thereto. This transitionary condition of F1Q·F2Q lasts for precisely one clock period from the time that flip-flop F1 is clocked to the one-state and until the time that flip-flop F2 is clocked to the one-state.

Flip-flops F1 and F2 will remain in the one-state until latch L is reset. If latch L is reset with the $\overline{RESET}$ input signal, the zero-state of latch signal LQ will be shifted through flip-flops F1 and F2 under control of sequential clock signals CK to sequentially zero-set flip-flops F1 and F2. Alternately, if the reset of latch L is generated with NAND-gate G2, the reset signal may be used to reset latch L and to simultaneously reset flip-flops F1 and F2 through asynchronous clear inputs CR. NAND-gate G2 detects the occurrence of two conditions which are the input signal IN becoming low and the output of flip-flop F2 becoming high. The input signal IN becoming low (corresponding to the input signal $\overline{IN}$ becoming high) is indicative of the input signal that had set latch L being completed. Feedback signal F2Q is indicative of the completion of output signal OUT from gate G3 because output signal OUT is generated during the transitionary condition of flip-flop F1 being one-set and flip-flop F2 being zero-set; wherein this transitionary condition is completed when flip-flop F2 becomes one-set thereby disabling gate G3 with the $\overline{F2Q}$ signal.

Gate G2 prevents improper conditions from occurring such as the condition where the input signal IN has a short duration and is completed before output pulse OUT is generated and the condition that the input signal IN has a long duration where output pulse OUT is generated before input signal IN is completed. Gate G2 insures that latch L will not be reset until both, input signal IN has been completed and has gone low and output pulse OUT has been generated as indicated by the F2Q signal going high. Therefore, a short input pulse IN will be disabled from prematurely resetting latch L with the feedback signal F2Q and an early output pulse OUT will be disabled from prematurely resetting latch L with a long input pulse IN.

Operation of synchronous one-shot SOS is based upon an input signal responsive sequence of transitions by flip-flops F1 and F2 which is detected by AND-gate G3 wherein the output of AND-gate G3 is a one-clock period wide pulse occurring at the transition of input signal IN from a zero-state to a one-state. This is accomplished by providing a one-clock pulse period delay with flip-flop F2 and monitoring for the transition condition that flip-flop F2 input signal F1Q is high when flip-flop F2 output signal F2Q is low as indicative of a change in the input signal F1Q to the high state during the last immediately prior clock period. For example, input signal IN may be low for a period of time prior to making a transition to the one-state. Therefore, flip-flops F1 and F2 being continuously clocked with clock signal CK are continuously set to this zero-state of input signal IN. When a clock pulse sets flip-flop F1 to the one-state thereby setting output signal F1Q to the one-state in response to a first clock pulse, the state of flip-flop F2 remains zero-set because the input signal F1Q is in the zero-state when the clock pulse CK occurs; wherein the input signal F1Q makes a transition to the one-state after the clock pulse CK has clocked flip-flop F1. Therefore, for that clock pulse period, the input to flip-flop F2 is high, the Q output of flip-flop F2 is low, and the $\overline{Q}$ output of flip-flop F2 is therefore high; consistent with the operation of such D flip-flops. AND-gate G3 detects this condition of a high input signal F1Q and a high output signal $\overline{F2Q}$ of flip-flop F2 as being indicative of a transition of the input signal IN, where AND-gate G3 generates an output signal OUT in response thereto. The next immediate clock pulse CK sets flip-flop F2 to the high-state of the input signal F1Q, thereby causing the $\overline{Q}$ output signal of flip-flop F2 to go to the low-state resulting in disabling of AND-gate G3 and causing the output of AND-gate G3 to go to the zero-state. Therefore, the output of gate G3 is one-set for one clock period occurring at the transition of the input signal IN from the zero-state to the one-state.

Operation of asynchronous one-shot SOS will now be discussed with reference to the following table

| ROW | IN | LQ | CK | F1 | F2 | OUT |
|-----|----|----|----|----|----|-----|
| 1 | 0 | 0 | 0 | 0 | 0 | 0 |
| 2 | 0 | 0 | 1 | 0 | 0 | 0 |
| 3 | 0 | 0 | 0 | 0 | 0 | 0 |
| 4 | 1 | 1 | 0 | 0 | 0 | 0 |
| 5 | 1 | 1 | 1 | 1 | 0 | 1 |
| 6 | 1 | 1 | 0 | 1 | 0 | 1 |
| 7 | 1 | 1 | 1 | 1 | 1 | 0 |
| 8 | 1 | 1 | 0 | 1 | 1 | 0 |
| 9 | 1 | 1 | 1 | 1 | 1 | 0 |
| 10 | 0 | 0 | 0 | 0 | 0 | 0 |

As an initial condition, synchronous one-shot SOS is assumed to be in the zero-state as shown in the above table which is consistent with a zero-state input signal IN which asynchronously zero-sets latch L and where the zero-state of latch L is synchronously shifted into flip-flops F1 and F2. Sequential occurrence and drop-out of clock signal CK shown in rows 2 and 3 merely preserves the steady state zero-set conditions.

When the input signal IN goes to the one-state, latch L will be one-set but synchronous flip-flops F1 and F2 will not change state until the clock signal transition occurs as shown in rows 4 and 5. When the clock signal CK makes a transition to the one-state, flip-flop F1 will be clocked to the one-state due to the one-state of the input signal LQ and flip-flop F2 will be clocked to again assume the zero-state due to the zero-state of the input signal F1Q occurring immediately prior to and during the occurrence of the clock pulse transition as shown in row 5. Clock signal CK will again go to the zero-state as shown in row 6 without changing the state of the synchronous elements and will again make a transition to the one-state as shown in row 7 to again clock flip-flops F1 and F2. Because input signal LQ to flip-flop F1 has remained in the one-state, flip-flop F1 will be clocked to preserve the one-state and because input signal F1Q to flip-flop F2 is now in the one-state, flip-flop F2 will be clocked to the one-state as shown in row 7.

Clock pulse CK will continue to go to the one-state and then to the zero-state as shown in rows 8 and 9 without changing the state of the SOS circuits until the input signal IN goes low as shown in row 10. When the input signal IN goes low and flip-flop F2 is in the one-state, input signals $\overline{IN}$ and F2Q to gate G2 cause the output of gate G2 to go to the zero-state which will reset latch L and will reset flip-flops F1 and F2 with an asynchronous clear signal to clear inputs CR, resulting in the zero-state shown in row 10.

In an alternate sequence of operation, if the input signal IN that went to the one-state in row 4 were to go to the zero-state in row 5; operation would proceed as illustrated independent of the state of input signal IN except that latch L and flip-flops F1 and F2 would be zero-set immediately after flip-flop F2 went to the one-state in row 7 instead of delaying through rows 7–10 until input signal IN went low as discussed above.

Output signal OUT is generated by AND-gate G3 in response to flip-flop F1 being one-set and flip-flop F2 being zero-set as shown in rows 5 and 6. As flip-flop F2 going to the one-state (row 7) terminates output pulse OUT, it enables AND-gate G2 to reset latch L and to reset flip-flops F1 and F2 when input signal IN goes low, wherein flip-flop F2 being one-set indicates the completion of the output signal OUT.

DESCRIPTION OF FIG. 6H

An output display arrangement will now be discussed with reference to FIG. 6H. An output CRT device such as models GO1 and GO2 manufactured by Tektronix of Beaverton, Oreg. may be excited with digital information from the correlator arrangement shown in FIG. 6D. The CRT accepts an X-axis analog signal and a Y-axis analog signal for controlling the electron beam in the X-axis and the Y-axis respectively. In one embodiment of the present invention, a Z-digital-to-analog converter Z-DAC 646 may be used to excite the Y-axis input with an analog signal related to the output signal sample magnitude $Z_K$ and a K-digital-to-analog converter K-DAC 647 may be used to excite the X-axis input with an analog signal related to the output signal sample address K. As K-counter 619 increments through the addresses of the output signal samples $Z_K$, the addresses K are used to excite K-DAC 647 to sweep the electron beam across the CRT along the X-axis as the addresses K from K-counter 619 are incremented toward increasing magnitudes. Similarly, as the output signal samples $Z_K$ are accessed from Z-RAM 614 in response to addresses K from K-counter 619, the output signal sample magnitude $Z_K$ is used to excite Z-DAC 646 to control the Y-axis amplitude of the CRT trace related to the magnitude of the particular $Z_K$ sample.

A CRT may be automatically synchronized with the correlator of the present invention, wherein the K-addresses from K-counter 619 defines the X-axis displacement of the electron beam with K-DAC 647 and also accesses the related output signal samples $Z_K$ from Z-RAM 614 to define the Y-axis displacement of the electron beam with Z-DAC 646. Because each K-address defines a particular X-axis position on the CRT and a particular output signal sample $Z_K$ from Z-RAM 614, the same output signal sample $Z_K$ always corresponds to a particular X-axis location on the CRT. As the output signal K from K-counter 619 sweeps the electron beam across the CRT and as this output signal K from K-counter 619 also addresses the output signal samples $Z_K$ from Z-RAM 614, the progressive updating of the output signal samples $Z_K$ and the build-up of the magnitude of the output signal samples is traced on the CRT as the magnitudes progress upward in the Y-axis for successive X-axis sweeps.

After the correlation and compositing operations have been completed such as controlled by compositor control 632 with signal 636, K-counter 619 may free run continually accessing Z-RAM 614 without updating the data stored therein to provide for continuous refreshing of the CRT. This refreshing is accomplished by K-counter 619 continually counting in a sequence of K-addresses for accessing Z-RAM 614. The K-address outputs of K-counter 619 and the output signal samples from Z-RAM $Z_K$ continuously excite K-DAC 647 and Z-DAC 646 respectively to successively refresh the output signal sample displayed on the CRT.

Figure 6H:
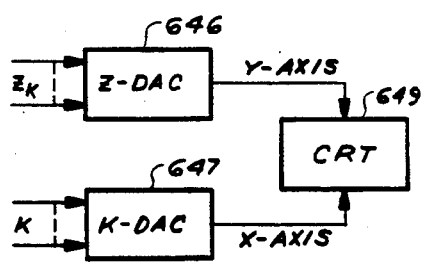
FIG. 6H shows a CRT display arrangement.

In an alternate embodiment of a CRT display, a storage CRT such as the model 602 storage CRT manufactured by Tektronix of Beaverton, Oreg. may be used to display correlated and composited information, shown as CRT 649 in FIG. 6H. Excitation of storage CRT may be the same as excitation of a refreshable CRT as discussed above with reference to FIG. 6H. In an embodiment where K-counter 619 is locked-up with output signal Lm from L-counter 618, refreshing for a refreshable CRT may not be provided. During correlation, output address K of K-counter 619 may be used for exciting the X-axis of the CRT through K-DAC 647 and output signal samples $Z_K$ may be used for exciting the Y-axis of the CRT through Z-DAC 646 to display the Y-amplitude of the output signal samples as the output signal samples $Z_K$ are updated for each iteration of K-counter 619. When compositing and correlation operations are completed, as controlled with composite control 632 generating completion signal 636, K-counter 619 may be locked-up, and may therefore discontinue sweeps of CRT 649. A history of updates may be provided on storage CRT 649 as the output signal samples $Z_K$ are progressively updated until the maximum update magnitudes, where the progressive updates are preserved on the storage CRT as the output signal samples are updated.

In a manual adaptively controlled embodiment, an arrangement may be provided for an operator to discontinue compositing operations such as by manually generating signal 636 to disable AND-gate 638 to disable sync signals from initiating additional compositing-after correlation operations. In this embodiment, an operator may monitor a CRT display, as discussed above for CRT 649, to monitor the amplitudes of correlation output peak signals. When the operator has determined that a sufficient number of composites has been completed by viewing the CRT display, the operator may discontinue compositing operations such as disabling sync signal to gate 638 as described above.

DESCRIPTION OF FIGS. 7A–7C

Figure 7A:
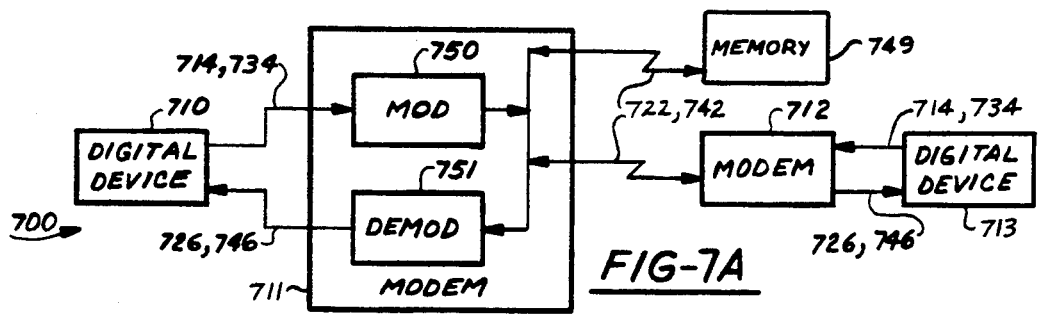
FIG. 7A shows a block diagram of a communication arrangement.

In accordance with another feature of the present invention, a signature correlation modem will be provided for a communication system to enhance communication operations. A communication system 700 is shown in FIG. 7A comprising an arrangement for communicating between digital device 710 and digital device 713 with signals 722 or 742 over a data link such as a telephone line. For simplicity of discussion, signal lines and the signals communicated thereon may each be referred to with the same reference number.

Prior art communication systems may use a modulator and demodulator (modem) arrangement to modulate a carrier signal with digital data for communication from a transmitting digital device and for demodulating the transmitted signal at a receiving digital device.

Modulation is provided for ease of communication, wherein digital pulses may be used to modulate an audio frequency carrier for transmission over an audio frequency telephone data link and digital pulses may be used to modulate a radio frequency (RF) carrier for transmission over an RF data link. Digital devices 710 and 713 may be digital computers, Teletypewriters, data entry systems, and other well known devices for communicating data. In prior art systems; modems 711 and 712 may be any well known prior art modems but, in accordance with the present invention, modems 711 and 712 may be chirp generator and correlator modems.

Well known prior art modems may provide frequency modulation wherein a digital data one-state may generate a lower frequency audio signal and a digital data zero-state may generate a higher frequency audio signal. The audio signal may be transmitted on a data link to a prior art demodulator in a receiving modem which demodulates the high and low frequency transmitted signals to reconstruct the digital one-bits and zero-bits for subsequent use by a digital receiving device. Prior art modems must have an adequate noise immunity to reduce errors to an acceptable level, but prior art modems are very sensitive to the amount of noise or the signal-to-noise ratio, characteristics of the data link, noise bursts, and other transmission phenomenon that degrades transmitted signals. Further, data rates are limited by the transmission characteristics such as noise because the shorter data-bits associated with higher data rate signals either require higher frequency carriers or a reduced number of cycles of a lower frequency carrier; wherein signal degradation is related to carrier frequency and to the number of cycles of the carrier. For example, degradation of telephone line transmissions is increased as the transmitting frequency is increased. Further, the fewer the number of carrier signal cycles per transmitted digital data-bit, the smaller the amount of signal averaging or filtering that is possible and the lower the noise immunity of the system. In prior art systems, the limitation of having a transmitted carrier with a period no longer than the pulse width of the transmitted digital data pulse imposes a severe constraint which limits data rates and increases error rates.

Prior art modems are manufactured in quantity by many different companies. For example, the Data Communication Products department of the General Electric Company in Lynchburg, Va. manufactures a range of modems defined as modem models TDM and the Diginet series modems. Modems and modem error rates are discussed in Datamation in an article published in October 1974 *Evaluating Modems* by Ritchie and in an article *Reducing Telephone Network Errors* by Normal published in October 1971; wherein these articles are incorporated herein by reference. Digital devices may communicate information in parallel digital form and data links may communicate information in serial digital form such as in the well known Teletypewriter serial data format. Commercial devices are available for providing communication between a digital system operating with parallel digital words and a modem and data link operating with serial digital words, where the serial digital words may have a particular format with a start-bit, a pair of stop-bits, and a plurality of data-bits including a parity data-bit. This well known word format is described in an applications note by General Instrument Corp of Hicksville, N.Y. entitled *Using The UAR/T In Data Communications* by Paul R. Ahrens which is incorporated herein by reference. Further, description of the operation of the General Instrument Corp UAR/T Universal Synchronizer Receiver/Transmitter AY-5-1012 is provided in data sheets distributed by General Instrument Corp which are incorporated herein by reference. Other universal asynchronous receiver/-transmitter devices are available such as from Standard Microsystems Corp of Hauppauge, N.Y. model COM2502 which is described in a preliminary data sheet dated June 1972 and from Motorola Semiconductor Products Inc of Phoenix, Ariz. models MC2257L and MC2259L which are described in Electronic Products Magazine published on Feb. 21, 1972 on page 56 therein; wherein the descriptions are incorporated herein by reference. In view of the above, communication of digital data is well known in the art but prior art modems do not use correlation techniques and therefore have limited communications capability in the presence of noise and data link disturbances.

In accordance with one feature of the present invention, a correlator arrangement is provided for enhancing noise immunity by enhancing signal-to-noise ratio through correlation. As will be shown below, short digital pulses may be used to modulate a lengthy chirp signal; wherein a modulated chirp signal may be significantly longer than the modulating digital pulse and wherein a correlator may be used in the receiving system to demodulate the chirp signal for improving the signal-to-noise ratio and for compressing the long chirp signal to a short pulse having a time resolution at least as good as the width of the modulating digital pulse.

In accordance with another feature of the present invention, an arrangement is provided for generating a plurality if chirp signals which may be continuous without spacings therebetween or may be superimposed or overlapping therebetween. In a communication embodiment, it may be necessary to generate a plurality of chirp signals for modulation by a plurality of digital data-bits, wherein the digital data-bits may have close spacing therebetween and therefore the relatively long chirp signals may overlap therebetween, as will be discussed with reference to FIG. 7 hereinafter. Other embodiments such as a geophysical embodiment, a radar embodiment, and a sonar embodiment may also use such continuous or overlapping chirp signals. In accordance with this feature of the present invention, a multi-chirp signal generating device is provided for generating a plurality of chirp signals that are continuous or overlapping therebetween. These continuous or overlapping chirp signals may be synchronized, wherein the plurality of chirp signals may begin at the same time as discussed above for a geophysical embodiment, may be staggered in a periodic fashion as discussed hereinafter for a communication embodiment, may be overlapping in random fashion, or may be overlapping in other arrangements. This overlapping chirp feature of the present invention provides for overlapping different chirp signals, wherein the overlapping chirp signals may have poor correlation therebetween and therefore may be readily separatable through correlation with different pilot signals.

Chirp signals are discussed herein to exemplify the features of the present invention. Although a chirp signal may sometimes by used to identify a linear frequency sweep signal, the term chirp signal is herein intended to mean a generalized signal form and is not intended to be limited to a linearly swept frequency.

A more detailed description of the embodiment shown in FIG. 7A will now be provided.

System 700 comprises digital device 710 such as a Teletypewriter for generating digital data signals 714 and 734 to modem 711 which modulates chirp signals with the digital signals from digital device 710 for transmission on data link 722 and 742 such as a telephone line to receiving modem 712. A correlation demodulator in modem 712 compresses modulated chirp signals into signal peaks or short pulses for output to receiving digital device 713 which may be a Teletypewriter. Teletypewriters are well known digital typewriters which generate digital signals in serial form for transmission over a data link and which receive such digital signals in serial form to record an output message with a typewriter or a tape punch in response to the received digital signals. Well known digital typewriters may be used such as the Teletypewriter model ASR-33 manufactured by the Teletype Corporation of Skokie, Ill. Other digital devices may be used as sources 710 and as destinations 713 of digital data. For example, digital computer source 710 may transmit digital data 714 and 734 onto telephone line 722 and 742 through modem 711 and digital computer receiver 713 may receive digital data 726 and 746 from a telephone line 722 and 742 through receiving modem 712. Further, other data links may be used such as a microwave data link, a radio data link, and other well known data links.

Operation of the chirp-correlator modem feature of the present invention will now be discussed with reference to the signals shown in FIGS. 7B and 7C.

Digital data may be received from a prior art device generator such as a Teletypewriter in the form shown as signals 714 and 734 (FIGS. 7B and 7C) having a zero-level start-bit and a pair of one-level stop-bits with a sequence of digital data-bits contained therebetween. Similarly, digital data may be provided from the receiver modem in the form shown as signals 726 and 746 (FIGS. 7B and 7C) having a start-bit, two stop-bits, and a plurality of data-bits consistent with modulating signals 714 and 734. Data signal 714 may be provided to a modulator in a modem for modulation of chirp pilot signals.

In order to obtain improvements such as enhanced noise immunity, reduced bandwidth, and increased data rates; digital data-bits of signals 714 and 734 are used to modulate signals such as chirp signals 715-721 and 735-741 respectively. If each transition of signals 714 and 734 initiates a chirp signal and if chirp signals are superimposed or multiplexed onto a transmission line, a correlator in a receiving modem can be used to demodulate the chirp carrier signals by correlating the multiplexed chirp signals with a chirp operator or pilot signal to reconstruct the digital modulating signals such as transition signals and to reconstruct the digital word in response to the reconstructed transition signals.

Figure 7D:
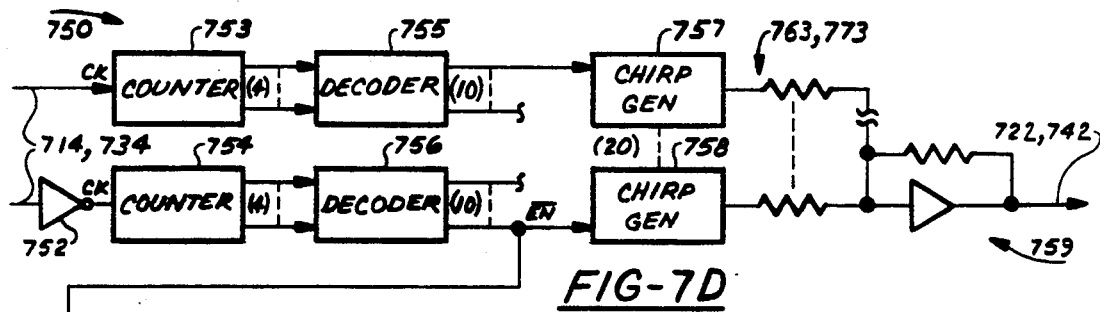
FIG. 7D shows a detailed block diagram and schematic representation of a multiple chirp generator for generating chirp waveforms in accordance with FIGS. 7B and 7C.
Figure 7E:
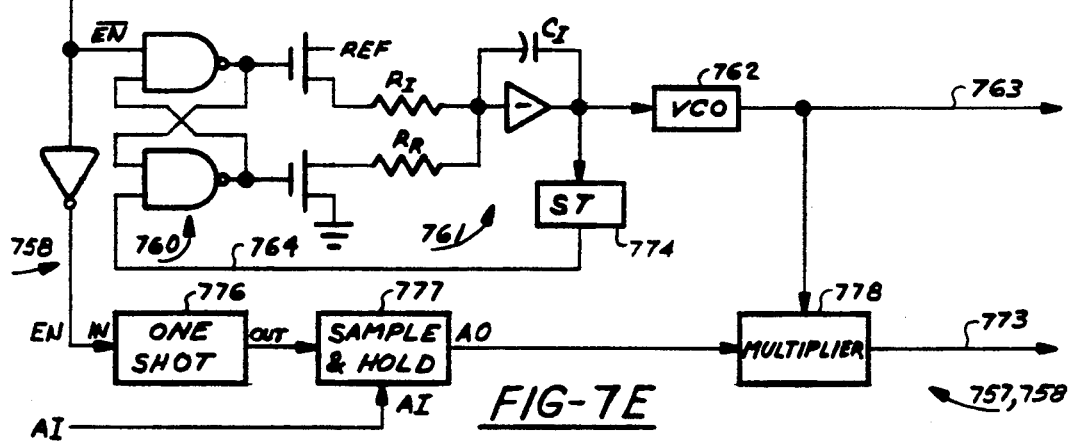
FIG. 7E shows a detailed schematic and block diagram representation of a chirp generator in accordance with FIG. 7D.
Figure 7F:
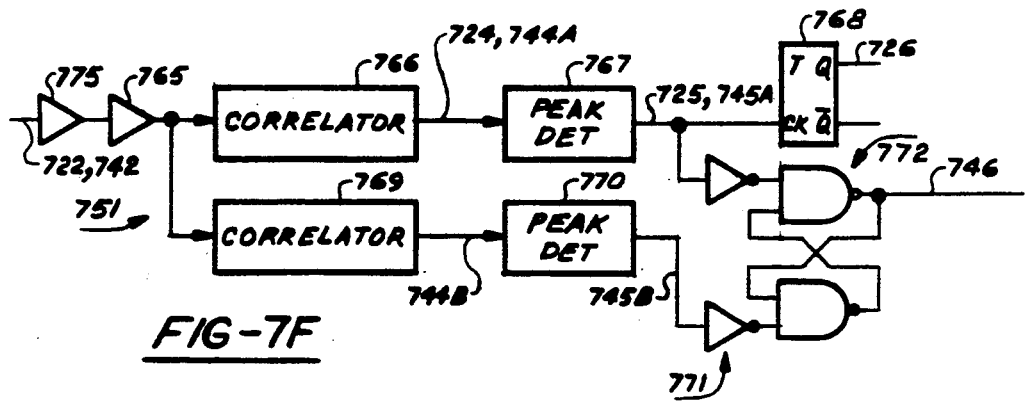
FIG. 7F shows a detailed block diagram and schematic representation of a correlation demodulator in accordance with FIG. 7A.
Figure 7B:
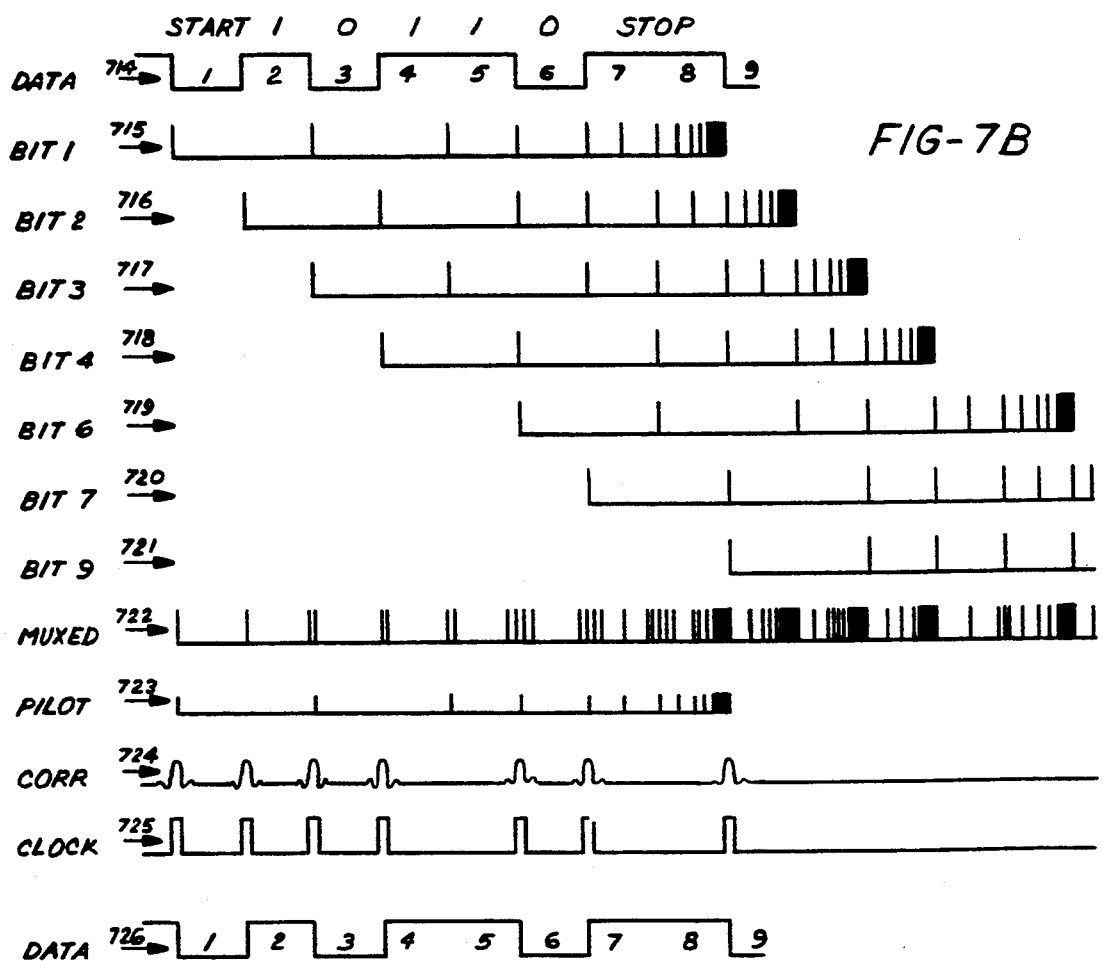
FIG. 7B shows a multiple up-chirp communication waveforms in accordance with the communication arrangement of FIG. 7A.
Figure 7C:
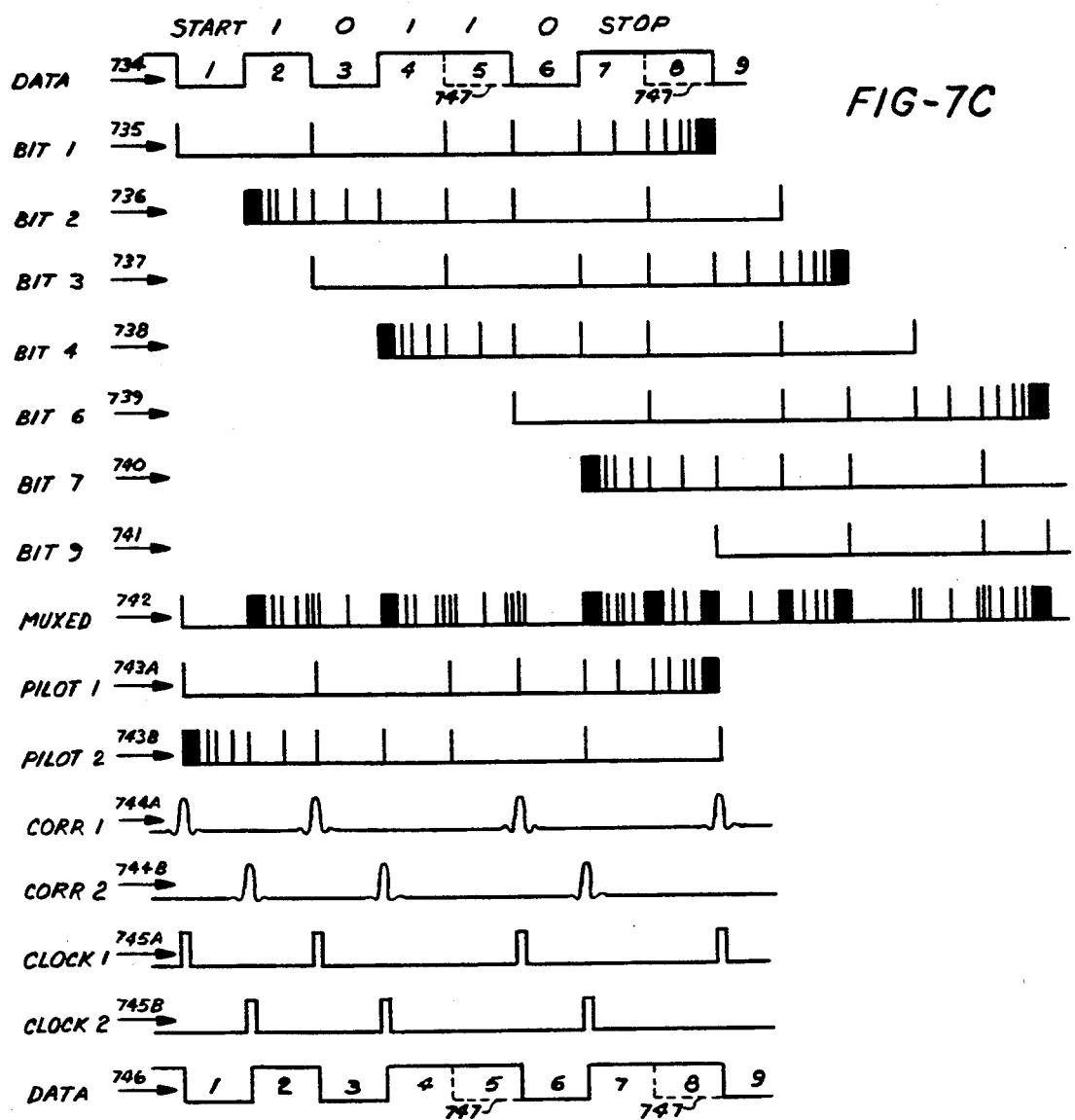
FIG. 7C shows multiple up-chirp and down-chirp waveform in accordance with the communication arrangement of FIG. 7A.

The vertical line schematic notation discussed above will be used to exemplify the data communication embodiment with reference to FIGS. 7B and 7C. Chirp signals 715-721 may be initiated at a transition of digital signal 714. For example, chirp signal 715 starts at the transition to the start-bit of signal 714, chirp signal 716 starts at the transition from the start-bit to the following logical one-bit, and chirp signals 716-721 correspond to the subsequent transitions of signal 714 from one-bits to zero-bits or from zero-bits to one-bits. For this embodiment, the two-sets of adjacent one-states, which are the two adjacent one-states in the middle of signal 714 and the two adjacent stop-bits at the end of signal 714, are shown without a transition inbetween adjacent one-states and therefore are shown without a chirp signal being started inbetween adjacent one-states. Adjacent one-states or adjacent zero-states will not provide a transition and therefore will not initiate an intermediate chirp signal. This is a characteristic associated with a non-return-to-zero (NRZ) signal. Well known techniques can be used to convert a non-return to zero (NRZ) signal to a return-to-zero (RZ) signal and an RZ signal to a NRZ signal. Further, other conversion techniques permit generation of chirp signals in response to positive transitions, negative transitions, absences of transitions such as with adjacent NRZ bits that are the same (ones or zeros) or in response to other characteristics of a signal. Generation of chirp signals 715-721 is shown in FIG. 7B in response to both positive and negative transistors of an NRZ signal and generation of up-chirp signals and down-chirp signals are shown in FIG. 7C in response to negative and positive transitions respectively of an NRZ signal.

Signal 722 represents the summation, or multiplexing, or mixing the chirp signals 715-721 associated with transitions of signal 714 onto a single transmission line, wherein the frequency related vertical lines associated with signals 715-721 are shown projected vertically downward onto multiplexed signal 722 to illustrate schematically the effects of multiplexing chirp signals 715-721. Signal 722 provides a complex waveform, wherein it is not readily obvious where the various chirp signals start or end nor the specific digital representation of this multiplexed chirp signal. Multiplexed signal 722 is shown as a set of multiplexed chirp signals without noise or distortions. When such a signal is transmitted over a data link, ambiguities such as noise, signal dropouts, distortions and other perturbing characteristics may be introduced; wherein subsequent correlation may be used to reconstruct the original signal even in the presence of such perturbations. For simplicity of discussion, such perturbations are not shown in the signals of FIGS. 7B and 7C. For the present example, digital signal 714 may be assumed to be generated by a Teletypewriter digital device 710 and chirp signals 715-721 may be assumed to be generated by chirp modulator 750 in response to digital signal 714. Multiplexed chirp signal 722 is transmitted from chirp modulator 750 to a correlation demodulator 751 in receiving modem 712 such as over a telephone data link 722. Correlator in receiving modem 712 correlates multiplexed chirp signal 722 with pilot signal 723, wherein pilot signal 723 may be a duplicate of each individual chirp signal 715-721.

Correlation of multiplexed signal 722 with chirp pilot signal 723 may generate a correlation output signal 724. Correlation output signal 724 provides a correlation output peak signal in each phase or time related bit position having good quality correlation between operator signal 723 and multiplexed signal 722. Therefore, correlation output signal 724 provides a correlation peak related to the start of each multiplexed chirp signal 715-721 related to each digital transition associated with digital signal 714. Output signal 724 may be processed by digital circuitry to reconstruct signal 714 as signal 726. In one embodiment, each correlation output peak of signal 724 is converted to a digital pulse such as with a digital peak detector circuit to generate digital pulses shown in signal 725 corresponding to correlation peaks in signal 724 which in turn correspond to transitions of digital bits in signal 714. Processing of digital pulses 725 may be performed by clocking a trigger flip-flop to reconstruct digital signal 714 as output signal 726, wherein each clock pulse to a trigger flip-flop may cause the trigger flip-flop to change state and wherein each clock pulse in signal 725 may cause a transition of a trigger flip-flop state to generate signal 726 to reconstruct original digital signal 714.

Prior art systems often use modulator-demodulator (modem) devices for modulating a fixed frequency carrier signal with digital signals for transmission to a remote location. In accordance with the teachings of the present invention, the chirp signature generator may be considered to be a novel form of a modulator and a correlator may be considered to be a novel form of a demodulator.

In prior art systems, each digital bit modulates a constant frequency carrier signal; wherein the one-bits may modulate a one-kilohertz carrier signal and the zero-bits may modulate a two-kilohertz carrier signal. The duration of time of such prior art modulated signals is related to the bit period. For example, a Teletypewriter may operate at a 110-baud data rate having a period of approximately 9-milliseconds per bit representing only 9-cycles of a one-kilohertz modulated carrier signal and 18-cycles of a two-kilohertz modulated carrier signal.

In accordance with the data communication feature of the present invention, a correlator may be used to compress a long signal such as a long chirp signal into a short peak signal, wherein the chirp signal may overlap many bit-time periods and may be compressed with a correlator demodulator into a short peak signal having a time resolution less than one-bit time period. For example, modulated chirp signals 715–721 (FIG. 7B) are shown having a duration of 8-bit time periods and being compressed into correlation output pulses shown in signal 724 having a duration of approximately ¼-bit time period; thereby providing chirp signal compression by a factor of approximately 32. Similarly, longer chirp signals may be provided for greater signal enhancement and detection which may permit compression to a correspondingly narrow pulse. Signal enhancement may be related to the number of samples or number of cycles associated with a transmitted signal, wherein the relatively short period and small number of carrier cycles associated with data-bits transmitted with prior art modems will not permit signal enhancement to the degree achievable with the relatively long chirp signal period and large number of cycles associated with data-bits transmitted with the modem of the present invention.

An alternate communication embodiment will now be discussed with reference to FIG. 7C, wherein a one-to-zero transition of signal 734 (identical to signal 714 above) initiates up-chirp signal 735 and a zero-to-one transition of signal 734 initiates down-chirp signal 736. As discussed with reference to FIG. 7B above, a plurality of chirp signals may be generated for digital bits 1, 2, 3, 4, 6, 7, and 9 as signals 735–741 respectively. Chirp signals related to digital bits 1, 3, 6, and 9 representing one-to-zero transitions are shown as up-chirp signals 735, 737, 739, and 741. Chirp signals related to digital bits 2, 4, and 7 representing zero-to-one transitions are shown as down-chirp signals 736, 738, and 740. Chirp signals 735–741 are multiplexed together to form MUXED signal 742 for transmission over a data link; wherein MUXED signal 742 is formed by superimposing chirp signals 735–741, as discussed for generating signal 722 of FIG. 7B above.

Multiplexed signal 742 may be communicated over a data link to a receiving modem, where it is demodulated with each of two pilot signals, pilot 1 signal 743A being an up-chirp signal and pilot 2 signal 743B being a down-chirp signal corresponding to modulated up-chirp and down-chirp signals 735–741. Correlation of MUXED signal 742 with pilot 1 signal 743A generated CORR 1 signal 744A having correlation output peaks representing the sequence of up-chirp signals in MUXED signal 742 and, similarly, correlation of MUXED signal 742 with pilot 2 signal 743B generates CORR 1 signal 744B having correlation output peaks representing the sequence of down-chirp signals in MUXED signal 742. Therefore, one-to-zero transitions and zero-to-one transitions may be individually multiplexed onto a single data link as up-chirp signals and as down-chirp signals respectively and may be demultiplexed or separated out by correlation with related up-chirp and down-chirp pilot signals 743A and 744B respectively to generate correlation output peaks related to the one-to-zero transitions and zero-to-one transitions respectively of data signal 734. As discussed with reference to FIG. 7B above, CORR 1 signal 744B and CORR 2 signal 744B may each be converted to digital clock pulses, wherein CORR 1 signal 744A and CORR 2 signal 744B may be converted to clock signals 745A and 745B respectively representing the zero-setting and the one-setting respectively of the modulating digital data signal 734 to generate reconstructed data signal 746. The hardware embodiment used to generate these signals will be discussed in detail with reference to FIGS. 7D–7I hereinafter.

The embodiment discussed with reference to FIG. 7C above illustrates the generation of a plurality of different chirp signals such as up-chirp and down-chirp signals. The degree of separation of the different chirp signals that are multiplexed together is related to the degree of correlation between the different modulated chirp signals or the different pilot signals. Up-chirp pilot signal 743A and down-chirp pilot signal 743B do not correlate therebetween and therefore permit good separation by correlation of up-chirp and down-chirp signals that are multiplexed together. Many other pilot signals may be provided that do not correlate well or correlate poorly therebetween and therefore provide good separation or signals related thereto. Therefore, the discussion relative to FIG. 7C provides a more general teaching, which is the separation of a plurality of different signals multiplexed together by modulating with different signature signals to be separated; wherein the different modulated signals may provide poor correlation therebetween for separation of modulated signals therebetween. The arrangement discussed with reference to FIG. 7B provides separation between chirp signals that are multiplexed together having a separable time relationship therebetween. The arrangement discussed with reference to FIG. 7C provides separation between chirp signals that are multiplexed together because of both, a time relationship therebetween and a signature relationship therebetween. Therefore, in accordance with another feature of the present invention, a plurality of signals having different signatures may be modulated to permit separation therebetween. For example, in a geophysical exploration embodiment, a plurality of chirp signals may be superimposed together such as by mixing different chirp signals prior to exciting a VIBROSEIS generator or by generating a different chirp signal with each of a plurality of VIBROSEIS generators to ensonify subsurface structures with a plurality of chirp signals simultaneously or overlapping therebetween. For another example, in a digital communication embodiment a plurality of sets of data may be used to modulated different signature signals, may be superimposed therebetween, and may be transmitted substantially simultaneously or in overlapping fashion over a data link for increasing effective data rates. Separation of the different signature signals may be provided with a plurality of correlators, where each correlator may correlate multiplexed signal 742 with a different signature pilot signal. Therefore, each correlator may separate out signals having a signature related to the signature of the pilot signal of that correlator and may not separate out other modulated signals having signatures different than the signature of the pilot signal to that correlator. In accordance with this feature of the present invention, a significant improvement over prior art systems may be achieved. For example, prior art systems provide for multiplexing different carrier or subcarrier frequencies together such as by transmission of different radio signals on different carrier frequencies; while the system of the present invention provides for transmitting the same frequencies having differences in signal signatures to provide separation therebetween. Therefore, in accordance with the present invention many different modulated signals may be superimposed or multiplexed on a single frequency band.

The communication embodiment of the present invention will now be described in more detail.

Prior art communication technology utilized various constant subcarrier frequencies to be modulated with different information so that each constant subcarrier and information modulated thereon may be separated with filters tuned to the related subcarrier frequency. Therefore, it is important in prior art systems that the subcarrier frequencies have a constant frequency for separation with filters. Further, each subcarrier frequency requires a certain bandwidth, wherein a plurality of subcarrier frequencies require a bandwidth related to the sum of bandwidths of each subcarrier frequency, modulation sidebands, and the number of different subcarrier frequencies.

In accordance with the present invention, a variable frequency signal such as a chirp signal is provided that can be separated from other signals in response to a signal signature, wherein separation or demodulation may be performed with a correlator device in contract to the constant frequency tuned filters of the prior art. Therefore, this feature of the present invention provides for modulation of correlatable signals having signatures that permit separation with a correlator, wherein the modulated signals may be chirp signals. Signals having different signatures such as an up-chirp signal and a down-chirp signal may be separated with correlation techniques. An arrangement will now be described for using variable frequency correlatable signals to perform the operations which are performed in the prior art with constant frequency carrier signals; wherein this feature of the present invention provides significant advantages over the prior art systems. For simplicity, chirp signals will be provided in the present discussion but any other signal form that satisfies these teachings of the present invention may be used in place of chirp signals.

Each of a plurality of signals may be used to modulate a chirp generator, as discussed for a digital signal embodiment with reference to FIGS. 7B and 7C herein. If a first data signal modulates an up-chirp signal and a second data signal modulates a down-chirp signal, then the modulating signals may be transmitted together and separated with a correlator in contrast to prior art arrangements for modulating each of a plurality of different fixed frequency carrier signals with a data signal and separating each modulating signal with a tuned filter arrangement. Because of the similarity of functions, a chirp modulated with a data signal may be termed a carrier signal or a subcarrier signal and a plurality of chirp subcarrier signals separable therebetween through correlation may be used as a multiple subcarrier communication arrangement. A multiple chirp subcarrier arrangement may be implemented in accordance with the arrangement discussed with reference to FIGS. 7D–7F. A different signal or data channel may be input to a different modulation channel similar to modulation channel comprising counter 753, decoder 755, and a plurality of chirp generators 757–758. If the chirp generators associated with each counter 753 and decoder 755 have the same subcarrier chirp, then the data-bits associated with that signal modulate the subcarrier chirp signal. Similarly if a second data signal modulates chirp subcarrier signals with a second modulator channel comprising counters 754 and decoder 756 and related chirp generators having the same chirp characteristic therebetween but having different chirp characteristic than the first channel, the second signal will modulate a different chirp subcarrier signal. The two signals modulating different chirp subcarriers may be multiplexed together on the same data link as discussed with reference to FIGS. 7B and 7C above and may be separated therebetween with a correlation demodulator such as described with reference to FIG. 7F, wherein each of a plurality of correlators 766 and 769 provide correlation with reference to a different chirp subcarrier signal for separation of each of a plurality of chirp signals. This chirp subcarrier modulating arrangement can be better understood by a discussion with reference to FIG. 7C. FIG. 7C has been used to illustrate modulation of an up-chirp signal in response to a negative transition signal and a down-chirp signal in response to a positive transition signal. Alternately, an up-chirp signal may be modulated with a first data signal and a down-chirp signal may be modulated with a different second data signal; wherein the modulation of a single chirp signal with a data signal has been discussed above with reference to FIG. 7B. Therefore, assuming that the up-chirp modulated signals multiplexed into signal 742 are related to a first data signal and the down-chirp modulated signals multiplexed into signal 742 are related to a second data signal; then correlation in a demodulator with pilot signal 743A will separate out the first data signal modulating the up-chirp subcarrier and with pilot signal 743B will separate out the second data signal modulating the down-chirp subcarrier. Therefore, the first data signal may be shown as correlation signal 744A and the second data signal may be shown as correlation signal 744B corresponding to correlation of the multiplexed signal 742 with up-chirp pilot signal 743A and with down-chirp pilot signal 743B respectively. Correlation signal 744A and correlation signal 744B may each be used to reconstruct the different modulating data signals as discussed with reference to FIGS. 7B and 7F wherein correlation signal 724 is used to reconstruct data signal 726 for each subcarrier chirp signal and may be used to communicate different portions of a single data signal such as discussed for the communication of positive and negative transitions of a single data signal 734 with reference to FIG. 7C or can be used to transmit a plurality of different data signals as discussed immediately above.

Output signals from the signature modem arrangement of the present invention may be very long continuous signals. Therefore, particular advantages may be achieved by using the correlate on-the-fly and output on-the-fly features of the present invention in combination with the signature modem feature of the present invention.

DESCRIPTION OF FIG. 7D

A detailed hardware embodiment will now be discussed in accordance with the communication system 700 discussed with reference to FIG. 7A above and the examples discussed with reference to the waveforms shown in FIGS. 7B and 7C above. Modems 711 and 712 each include a modulator 750 and a demodulator 751, wherein a modulator in accordance with the present invention will be discussed hereafter with reference to FIGS. 7D and 7E and a demodulator in accordance with the present invention will be discussed hereinafter with reference to FIG. 7F.

One embodiment of modulator 750 is shown in FIG. 7D for providing a plurality of chirp signals in response to transitions of digital signals 714 and 734 generated by a digital device 710. A serial digital signal 714 is received by counters 753 and 754, wherein counters 753 and 754 may by any well known digital counter and in a preferred embodiment may be S/N 7490 four-bit decade counter circuits. Counter 753 may be incremented by positive transitions of signals 714 and 734 such as transitions from a zero-state to a one-state and counter 754 may be incremented by negative transitions of signals 714 and 734 such as transitions from a one-state to a zero-state. Counter 754 is shown with inverted input signals wherein transitions of input signals 714 and 734 are inverted by inverter 752, which may be an S/N 7404 inverter circuit, to clock counter 754 with negative transitions of signals 714 and 734 such as transitions from a one-state to a zero-state. Therefore, counters 753 and 754 may count different transitions, wherein counter 753 may count non-inverted or positive transitions and counter 754 may count inverted or negative transitions of signals 714 and 734.

Decoders 755 and 756 decode the count states of counters 753 and 754 respectively, wherein a sequence of transitions of input signals 714 and 734 will sequence through a plurality of counter states to sequence through a plurality of output states for decoders 755 and 756. Decoders 755 and 756 may be S/N 7442A BCD-to-decimal decoders for decoding BCD outputs of counters 753 and 754 to select an output signal in one of ten lines for each decoder. Each output line from decoders 755 and 756 is connected to a different chirp generator 757-758, wherein selecting of a decoder output line in response to a transition of signals 714 and 734 is used to initiate a chirp signal from a chirp generator 757-758.

For the embodiment shown in FIG. 7D, chirp generators 757-758 may generate identical signature chirp signals or may generate different signature chirp signals. In the embodiment discussed with reference to FIG. 7B, each chirp signal signature is the same for data-bits having either a positive or a negative transition as shown in waveforms 715-721. Therefore chirp generators 757-758 may generate identical chirp signals when selected by decoders 755 and 756. In the embodiment discussed with reference to FIG. 7C, each positive transition from a zero-state to a one-state of waveforms 714 and 734 initiate a down-chirp signal such as BIT 2 signal 736 and each negative transition from a one-state to a zero-state of waveforms 714 and 734 initiates an up-chirp signal such as BIT 1 signal 735. As discussed above, counter 753 may be responsive to zero-to-one level transitions and therefore may control a plurality of ten chirp generators including chirp generator 757 for generating down-chirp signals related to the zero-to-one transitions of signals 714 and 734 and counter 754 may be responsive to one-to-zero level transitions and therefore may control a plurality of ten chirp generators including chirp generator 758 for generating up-chirp signals related to one-to-zero transitions of signals 714 and 734. Therefore, steering of the input positive and negative transitions to counters 753 and 754 respectively permits control of down-chirp signals with positive transitions and up-chirp signals with negative transitions respectively; or conversely.

Chirp signals from chirp generators 757-758 may be summed together with operational amplifier 759 including input summing resistors and a feedback resistor and further representing line drive capability to drive the data link with signals 722 and 742. Operational amplifier 759 is typical of well known prior art operational amplifiers such as the $\mu A709$ and $\mu A741$ operational amplifier manufactured by Fairchild Semiconductor of Sunnyvale, Calif. The summing of signals with operational amplifiers as shown for amplifier 759 is well known in the art, as discussed in the reference to Korn and to Levine provided hereinafter.

The communication arrangement set forth in FIG. 7D can be further exemplified with the signals set forth in FIG. 3D, which will now be used to exemplify a multiple pilot or multiple carrier communication arrangement with reference to the arrangement set forth in FIG. 7D. A first modulated carrier signal may be an up-chirp signal 336 and a second modulated carrier signal may be a down-chirp signal 337. Signals 336 and 337 may be multiplexed together to form a multiple carrier signal or may be controlled separators to maintain discrete and separate carrier signals. For simplicity of discussion, modulated carrier signals 336 and 337 are shown as equal length chirp signals having the same sweep frequency range where signal 336 is an up-chirp signal and signal 337 is a down-chirp signal. Modulated carrier signals may be similar chirps having up-chirp and down-chirp sweeps as shown in FIG. 3D or may be other modulated carrier signals such as exponential chirp signals or signals having particular signature characteristics for demodulation with a correlator device. Further, modulated carrier signals 336 and 337 are shown having equal length and starting at the same time for simplicity of discussion. In alternate embodiments, modulated carrier signals 336 and 337 may have different envelope lengths, different signature characteristics, different sweep frequency ranges, different starting times, and other such characteristics without departing of the teachings of the present invention.

With reference to FIGS. 3D and 7D, a first channel may receive a first data signal with counter 753 and a second channel may receive a second data signal with counter 754 for distribution to first channel chirp generators 757, etc and second channel chirp generators 758, etc. The first channel chirp generators may generate up-chirp signals such as signal 336 and the second channel chirp generators may generate down-chirp signals such as signal 337. If the same digital data were entered into both channels of FIG. 7D, similar up-chirp and down-chirp signals would be generated at corresponding times as shown in FIG. 3D. For example, a first data-bit input to the first channel may be represented by up-chirp signal 338 and a first data-bit input to the second channel may be represented by down-chirp signal 339. Similarly, a second data-bit or transition entered into the first channel may be represented by up-chirp signal 340 and a second data-bit entered into the second channel may be represented by down-chirp signal 341. Data-bit signals 338–341 may be multiplexed together such as with operational amplifier 759, as discussed above with reference to FIG. 7D, to provide multiplexed signal 342 representing the sum of signals 338–341. After communication, separation of the up-chirp carrier signals and the down-chirp carrier signals may be performed with a plurality of correlators as shown in FIG. 7F, wherein a first correlator 766 may correlate the multiplexed signal 342 with an up-chirp pilot signal 336 to generate the output signal-1 343 and a second correlator 769 may correlate the multiplexed signal 342 with a down-chirp pilot signal 337 to generate output signal-2 334. Output signal-1 343 and output signal-2 344 are similar because they represent the same digital signal input to each channel for this particular simplified example. Output signal-1 343 and output signal-2 344 may each be peak detected with peak detectors 767 and 770 respectively and used to reconstruct the digital input signals such as with output trigger flip-flop 768 as described above. Ability to modulate each of a plurality of different chirp carrier signals permits a plurality of different chirp signals to be multiplexed together for transmission, wherein each type of chirp signal may represent a different carrier signal for modulation with a different data signal for communication. At the receiver, each carrier signal may be separated out and demodulated with a correlator having a pilot signal corresponding to the carrier chirp signal for separation and demodulation.

In view of the above, a plurality of digital signals can be used to modulate different chirp carrier signals or other signals for separation or demodulation through correlation; wherein the modulation of different chirp signals may be defined as carrier modulation because each carrier channel represented by a different type of chirp signal can be separated from each other carrier channel such as with a correlation demodulator in a receiver.

In a data communication example discussed above with reference to FIGS. 3D and 7D, a plurality of carrier modulated frequency sweeps may be provided, wherein each carrier may have an identical frequency band or a similar frequency band and wherein modulated chirp signals 336 and 337 may have similar frequency ranges. The difference between these chirp carrier signals that permits separation therebetween may be in the way the same frequency band is utilized to accomodate a plurality of different signature signals such as with an up-chirp signature or with a down-chirp signature; wherein the up-chirp and down-chirp signals may be swept through the same frequency band but in different directions. Therefore, difference of carrier signatures may be provided having the same or similar or overlapping band or range of frequencies yet still be separable therebetween because of the different characteristic signature of each chirp signal independent of the common frequency band. This can be contrasted to prior art systems wherein a plurality of carrier frequencies are provided and wherein each carrier frequency has substantially a constant frequency and has a different frequency that other carrier frequencies. Because the prior art must use a different frequency band for each carrier or subcarrier, the bandwidth required for a plurality of carrier channels is related to the sum of the bandwidths of each of the plurality of channels. In the system of the present invention, a plurality of channels may be modulated with signals having different correlation signatures but having the same band or overlapping bands of frequencies. Therefore, in accordance with this feature of the present invention, a plurality of modulation carrier signals may be provided without increasing the bandwidth requirements over a single modulation carrier.

In view of the above, additional correlation carriers can be added to a communication system without requiring an increase in bandwidth as with prior art systems.

A further improvement in data communication may be obtained from an increase in data rates permissible with a correlator modem arrangement. In prior art systems; as the data rate increases, the time interval for transmitting a data-bit decreases and therefore noise immunity is reduced because of the smaller interval of transmitted carrier signal per data-bit. For example, a higher data rate provides a shorter data-bit period and therefore, assuming that data rates are increased but modulating frequencies are maintained constant, a reduced number of carrier cycles are provided for each transmitted data-bit. The reduced time interval for each data-bit for higher data rates reduces the ability to improve the signal-to-noise ratio because of this reduced number of cycles or related effects; wherein signal-to-noise ratio and related error rates are major factors in determining data rates of a data link. In the system of the present invention, a chirp carrier modulation envelope is not limited to a related data-bit period. For example, FIG. 7B shows a start-bit for communicated signal 714, wherein the start-bit initiates generation of an up-chirp signal 715, and wherein up-chirp signal 715 is in no way limited in duration by the width of the start-bit of data signal 714. Therefore, even if data rates of signal 714 are increased causing a reduced data-bit time interval, the duration of the chirp signal envelopes may be preserved. Further, a long chirp period may be tolerated because the correlation operation "compresses" a chirp signal into a "pulse" as shown with correlation signal 724, wherein the time resolution of reconstructed digital data 714 may be related to the resolution of the peaks of correlator output signal 724 and wherein peaks of correlator output signal 724 may have a sharpness and related resolution that are a function of the quality of the correlation such as with the type of signatures, the number of octaves traversed by the chirp signals, and the length of the chirp signal. Therefore, it can be seen that higher data rates are possible without reducing the modulation chirp envelope duration and by preserving a high signal-to-noise ratio inherent in a correlation embodiment with a long chirp signature; wherein data rates may be increased without the same impact of constraints imposed upon prior art communications systems.

In view of the above, the system of the present invention can provide a significant increase in an amount of data that can be communicated on a data link due to the ability to multiplex a plurality of different carrier signals without significantly increasing bandwidth requirements and because data rates may be increased due to the high noise immunity associated with the chirp communication embodiment of the present invention.

Yet another communication feature of the present invention provides for simultaneous communication of information in a plurality of directions or to a plurality of destinations, wherein each destination may demodulate or separate out the appropriate information through correlation. This feature will now be described with reference to FIGS. 3D and 7A for a data communications embodiment providing duplex communication over a data link. Full-duplex communication involves transmission of information simultaneously in both directions with the receiving and the transmitting of information simultaneously. For example, digital device 710 may be generating data signals 714 and 734 to modulator 750 in originating modem 711 and may be simultaneously receiving data signals 726 and 746 from demodulator 751 in originating modem 711. Transmitted information from modulator 750 may be multiplexed onto data link 722 and 742 simultaneously with the receiving of information impressed on data link 722 and 742 by answering modem 712.

The prior art provides full-duplex communication by transmitting on a first frequency and receiving on a second frequency. For example, acoustic modem DC-3100 manufactured by Novation Inc of Tarzana, Calif. originates with digital signals for transmission on 1270 Hz and 1070Hz for mark-bits and space-bits respectively and answers with digital signals for transmission on frequencies of 2225 Hz and 2025 Hz for mark-bits and space-bits respectively. Because originate and answer information is provided on different frequency bands, filters in the modem may be used to receive an answer on one frequency band while simultaneously transmitting information on a second frequency band, which is known as full-duplex operation.

In accordance with the present invention, digital information may be used to modulate chirp signals, as discussed with reference to FIGS. 7B and 7C, wherein an originating modem may transmit a first modulated signal having a first signature and may receive a second modulated signal having a second signature; wherein the answering modem may receive the first signature modulated signal and may transmit the second signature modulated signal; and wherein the first and second signature modulated signals may have different signatures and may therefore be separable therebetween. For example, a first modulated signal may be an up-chirp signal and a second modulated signal may be a down-chirp signal for providing separation therebetween through correlation.

The full-duplex communication arrangement of the present invention will now be discussed with reference to FIG. 3D. Up-chirp signal 336 may be selected for the modulation carrier of originating modem 711 and may be selected for the pilot signal of the correlator demodulator of answering modem 712. Further, down-chirp signal 337 may be selected for the pilot signal of the correlator demodulator of originating modem 711 and may be selected for the modulation carrier of answering modem 712. Originating modem 711 may generate a sequence of up-chirp signals 338 and 340 to answering modem 712 and may receive a plurality of down-chirp signals 339 and 341 from answering modem 712. Answering modem 712 may receive a sequence of up-chirp signals 338 and 340 from originating modem 711 and may generate a sequence of down-chirp signals 339 and 341 to originating modem 711. All of the bidirectional full-duplex chirp signals, including up-chirp signals 338 and 340 and down-chirp signals 339 and 341 may be superimposed or multiplexed on common data link 722 and 742 as shown for MUX signal 342. Originating modem 711 may demodulate MUX signal 342 with a correlator using a down-chirp pilot signal 337 to obtain correlation output signal 344 related to the digital data transmitted from answering modem 712. Similarly, answering modem 712 may demodulate MUS signal 342 with a correlator using an up-chirp pilot signal 336 to obtain correlation output signal 343 related to digital data transmitted from originating modem 711. Signal 343 and signal 344 may be used to reconstruct digital data transmitted from originating modem 711 and from answering modem 712 respectively as received and demodulated in answering modem 712 and in originating modem 711 respectively; as discussed above for the embodiment set forth in FIGS. 7D-7F relative to the signals shown in FIGS. 7B and 7C.

The signals shown in FIG. 3D show pairs of up-chirp and down-chirp signals starting at substantially the same time for the purpose of simplicity of illustration. In an actual application, originating modem 711 may generate up-chirp modulated signals 338 and 340 at times related to input of digital data and related to the code of digital data received from digital device 710. Similarly, answering modem 712 may generate down-chirp signals 339 and 341 at times related to input of digital data and related to the code of digital data from digital device 713 which may be asynchronous with reference to the digital data from digital device 711. Therefore, chirp signals superimposed on the data link may have different time or phase relationships between up-chirp signals transmitted from originating modem 711, between down-chirp signals transmitted from answering modem 712, and between up-chirp and down-chirp signals therebetween. The effect of the different phasing and interspacing of modulated carrier signals on the data link would be to change the form of MUX signal 342 and further to change the correlation output signals 343 and 344 related to the particular time sequence of up-chirp signals and down-chirp signals respectively that are to be illustrated; which can now be constructed by one skilled in the art from the teachings of the present invention such as with the same methods discussed for FIGS. 3A-3D and FIGS. 7B and 7C above.

A full-duplex communication arrangement will now be discussed with reference to FIG. 7C. FIG. 7C has previously been described for an embodiment generating up-chirp signals in response to negative transitions of data signal 734 and down-chirp signals in response to positive transitions of data signal 734. For discussion of the present duplex communication arrangement; up-chirp signals 735, 737, 739, and 741 may be generated by originating modem 711 in response to digital signal transitions similar to that discussed with reference to FIG. 7B above and down-chirp signals 736, 738, and 740 may be generated by answering modem 712 in response to digital data signal transitions similar to that discussed with reference to FIG. 7B above. Multiplexing of up-chirp signals from originating modem 711 and down-chirp signals from answering modem 712 on a single transmission line may be illustrated with MUXED signal 742. Separation of the up-chirp signals transmitted by originating modem 711 from MUXED signal 742 may be accomplished in answering modem 712 by demodulation with a correlator using an up-chirp pilot signal 743A to generate correlation output signal 744A. Similarly, separation of the down-chirp signals transmitted by answering modem 712 from MUXED signal 742 may be accomplished in originating modem 711 by demodulating with a correlator using a down-chirp pilot signal 743B to generate correlation output signal 744B. Correlation output signal 744A may be used to reconstruct digital information transmitted from answering modem 712 and correlation output signal 744B may be used to reconstruct digital information transmitted from originating modem 711 using the arrangement discussed with reference to FIG. 7F above.

A simple illustration of a full-duplex communication arrangement is shown in FIG. 7A where digital device 710 may generate digital signal 714 to modulator 750 (shown in more detail in FIG. 7D) for generating output chirp signals to data link 722 and 742 and demodulator 751 (shown in more detail in FIG. 7F) may be connected to the same data link 722 and 742 for receiving transmitted chirp signals that are multiplexed on the data link for demodulation and subsequent communication to digital device 710 as signals 726 and 746 from demodulator 751 to digital device 710. Therefore, although modulator 750 and demodulator 751 have been individually discussed for either transmitting signature modulated signals or receiving signature modulated signals, it is herein intended that modulator 750 and demodulator 751 be operable simultaneously to both, transmit modulated signature signals and receive modulated signature signals in a full-duplex mode of operation.

Prior art modem transmit modulated carrier signals on a data link in response to received digital data and generate digital data in response to received modulated carrier signals from a data link as is well known in the art. In these prior art modems, communication may be in either simplex, half-duplex, full-duplex, or other modes of operation well known in the art such as for the referenced modem manufactured by Novation Inc. Therefore, substitution of the signature modulator shown in FIGS. 7D and 7E for generating output signature modulated carrier signals in response to received digital data and the signature demodulator shown in FIG. 7F for receiving signature modulated carrier signals and generating output digital data in response thereto may be used to replace corresponding modulator and demodulator elements in well known prior art modems. Therefore, various well known arrangements such as coupling to a data link 722 and 742, coupling to digital devices 710 and 713, and other such arrangements are well known in the art and therefore need not be disclosed in further detail herein.

The above discussion is provided in simplified form to illustrate communication features of the present invention for simultaneously transmitting and receiving signature modulated information having correlatable signals with different signatures for receiving and for transmitting of digital data. For simplicity of discussion, signals shown in FIGS. 3D, 7B and 7C have been used to exemplify this inventive feature because these figures provide for multiplexing together or chirp signals having different signatures and for separation of such multiplexed chirp signals having different signatures through correlation. Other examples may be provided to further illustrate such a simultaneous transmission and receiving arrangement, but FIGS. 3D, 7B, and 7C provide sufficient illustration of the teachings involved therewith to permit one of ordinary skill in the art to practice this inventive feature. For example, different phase relationships between the up-chirp signals, the down-chirp signals, and between the up-chirp and the down-chirp signals may be provided to illustrate a more random occurence of the chirp signals and a more random occurance of phase relationships therebetween. Regardless of the time phase relationships between digital data bits, chirp signals may be represented for transmitted data and for received data having the desired phase relationships; could be multiplexed together as discussed with reference to FIGS. 3D, 7B, and 7C above; and the different sequences of chirp signals could be separated out therebetween for reconstruction of a transmitted digital signal; wherein the different phase relationships will be readily understood and the related signal diagrams can be readily constructed by one of ordinary skill in the art from the teachings of the present invention.

DESCRIPTION OF FIGS. 7E AND 7F

A chirp generator 758 is shown in more detail in FIG. 7E where the $\overline{EN}$ signal from decoder 756 is received by latch 760, which may be a S/N 74279 latch, to initiate a chirp signal. Latch 760 is used to store the decoder output signal $\overline{EN}$ for selecting chirp generator 758, wherein sequential transitions of signals 714 and 734 may increment counters 753 and 754 passed the selecting decoder output signal $\overline{EN}$ from decoder 756 before the selected chirp signal has been completed. This is particularly true for high data rates in conjunction with long chirp signals, wherein the chirp signal may not be completed by the time a new chirp signal must be generated in response to a new data signal transition. Therefore, each chirp generator may have a memory contained therein such as with latch 760 to store a selecting command until the chirp signal has been completed. In an embodiment wherein the signal $\overline{EN}$ may be longer than the period of the generated chirp signal, a synchronous one-shot SOS may be used as will be discussed in detail with reference to FIG. 7G above. The showing of latch 760 with and without synchronous one-shot SOS in FIG. 7G and in FIG. 7E respectively is provided to illustrate both alternatives, wherein synchronous one-shot SOS may be used or may not be used as required by the particular application.

Latch 760 enables an integrator 761 through input resistor $R_I$ and feedback capacitor $C_I$ to generate a ramp output signal to a voltage controlled oscillator (VCO) 762. Such analog integrators are well known in the art and are described in the books by Korn and by Levine referenced hereinafter. Integrator 761 may include a $\mu$A709 or $\mu$A741 operational amplifier in well known integrator circuit configurations. Further, VCO 762 may be any well known VCO or voltage-to-frequency converter many of which are commercially available and well known in the art as discussed elsewhere herein. A precise ramp may be generated by integrating a reference voltage REF wherein latch 760 may control an analog switch to the reference voltage REF for input of the precise reference voltage to integrator 761 using well known prior art reference signal switching arrangements. Integrator 761 generates a ramp to VCO 762, wherein VCO 762 generates an output signal having a frequency related to the instantaneous voltage of the input ramp. Therefore, the frequency of output signal 763 may vary linearly as a function of the liner ramp input to VCO 762.

A Schmidt trigger (ST) 744 may be used to detect a ramp voltage amplitude related to the end of the chirp signal for resetting latch 760 with reset signal 764 and for discharging capacitor $C_I$ of integrator 761 through reset resistor $R_R$. Threshold detectors such as Schmidt triggers and well known in the art such as S/N 7414 circuits.

Other arrangements for generating chirps are well known in the art and may be used herein. Further, integrator 761 may be replaced by other function generators to generate exponential chirp signals, up-chirp signals, down-chirp signals, and to generate virtually any frequency sweep function using well known analog function generation techniques as an input signal to a VCO. Further, various up-chirp and down-chirp signals may be generated by using inverters to invert the analog sweep signal. For example, placement of an analog inverter such as a μA709 operational amplifier inbetween integrator 761 and VCO 762 may convert a down-ramp from integrator 761 to an up-ramp by inversion to change a down-chirp signal from VCO 762 to an up-chirp signal, and conversely. Therefore, the difference between up-chirp generators and down-chirp generators may be merely a sign reversal associated with an analog signal input to VCO 762 or alternately may be with the internal circuitry of VCO 762.

Demodulator 751 may be a correlation demodulator for demodulating chirp signals received over data link 722 and 742. One form of demodulator 751 in accordance with the present invention is shown in FIG. 7F. Signals 722 and 742 may be received from a data link with line receiver 775 and may be "squared-up" with squaring circuit 765 such as a μA7810 circuit. The squared-up signal from circuit 765 may be processed by a correlator 266 which may be the improved correlator arrangement of the present invention or may be any well known correlator arrangement for generating correlated output signals 724, as described with reference to FIG. 7B above. Correlated signal 724 may be processed with a digital peak detector 767 to generate a squarewave clock signal 725 to clock trigger flip-flop (T) 768 to generate output data signal 726 in accordance with the signals shown in FIG. 7B. For the arrangement discussed with reference to FIG. 7C, a second correlator 769 may be provided; wherein correlator 766 may perform correlation using an up-chirp pilot signal 743A and correlator 769 may perform correlation using a down-chirp pilot signal 743B (FIG. 7C). Therefore, correlator output signals 744A and 744B (FIG. 7F) may correspond to correlator output signals 744A and 744B respectively discussed with reference to FIG. 7C; wherein the output of correlator 766 may correspond to the transitions from a one-state to a zero-state related to an up-chirp signal and the output of correlator 769 may correspond to the transitions from a zero-state to a one-state related to a down-chirp signal. Peak detectors 767 and 770 may detect the correlator output signal peaks to generate clock signals 745A and 745B, as will be discussed hereinafter. Clock signals 745A and 745B may be inverted with inverter circuits 771 to set latch 772 and to reset latch 772 respectively in response to a positive signal transition and a negative signal transition respectively to generate data signal 746.

Correlators 766 and 769 may be the improved correlator embodiments of the present invention or may be any prior art correlator arrangement or any equivalents thereof. Peak detectors 767 and 770 may be well known digital detectors and comparitors for detecting a threshold magnitude of a digital word. A preferred embodiment of a digital peak detector 645 was discussed with reference to FIG. 6D above. Additional circuitry may be provided to insure that the correlation output signals 724, 744A, and 744B are properly related to data signal transitions such as by checking periods between correlation output peaks, checking parity, and by checking other signal characteristics. Inverters 771 may be S/N 7404 inverter circuits, latch 772 may be an S/N 74279 latch circuit, and T flip-flop 768 may be an S/N 7473 JK flip-flop with the J and K input signals left open or connected to a one-state for providing toggling operation in response to clock pulses.

DISCUSSION OF FIGS. 7G AND 7H

Figure 7G:
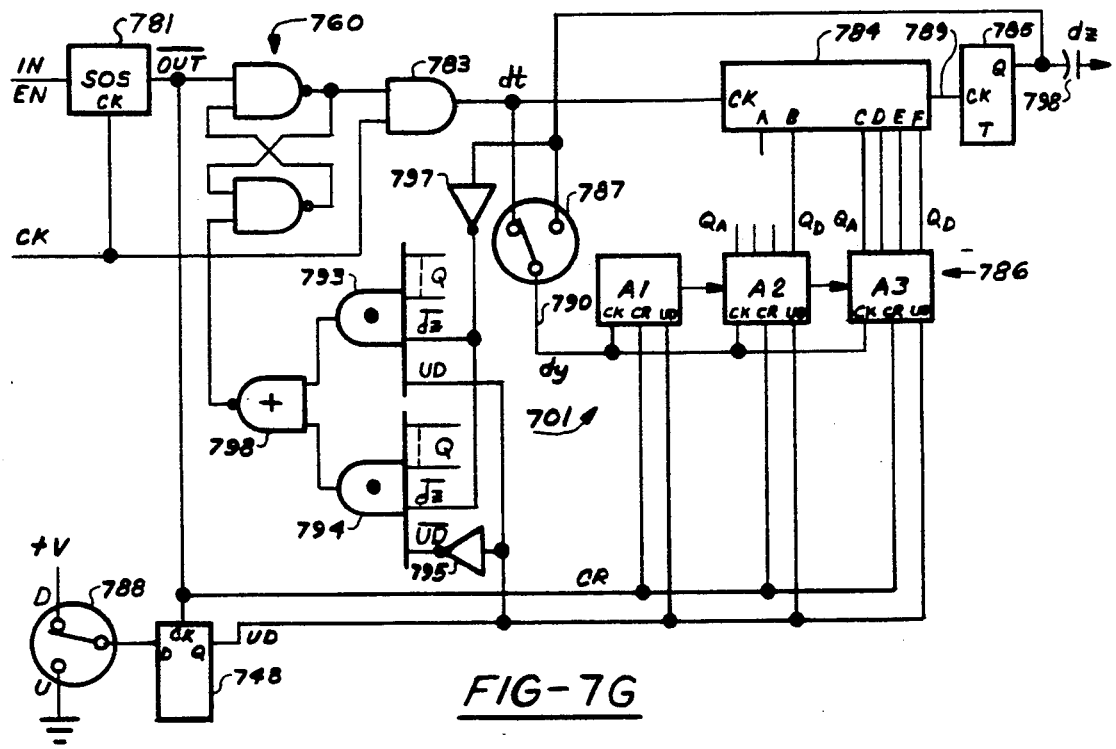
Figure 7H:
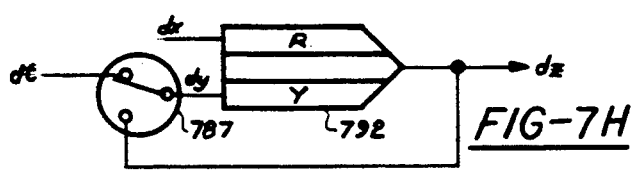
FIG. 7H shows a digital differential analyzer arrangement of a chirp generator in accordance with FIG. 7D.

One embodiment of chirp generators 757 and 758 has been discussed with reference to FIG. 7E above. Now alternate embodiments of chirp generators 757 and 758 (FIG. 7D) will be discussed with reference to FIGS. 7G and 7H. The arrangements shown in FIGS. 7G and 7H are programmable digital rate generators for generating output digital pulse rates that are controllable. The chirp generator embodiment of FIG. 7G uses a Texas Instruments rate generator S/N 7497 for a programmable chirp generator and the chirp generator embodiment of FIG. 7H uses a Digital Differential Analyzer (DDA) for a programmable chirp generator.

Output signal $\overline{EN}$ from decoder 756 is processed with chirp generators 757–758 to generate output chirp signals 763 and 773. Output signal $\overline{EN}$ from decoder 756 may be processed directly with latch 760 (FIG. 7E) or may be processed with a synchronous one-shot 781 (FIG. 7G) before setting latch 760. Synchronous one-shot 781 may generate a one-clock pulse period output pulse $\overline{OUT}$ in response to a positive transition of input signal EN to set latch 760 and to preload counter 786. One embodiment of synchronous one-shot 781 is described in detail with reference to FIG. 6G above.

The single pulse output of SOS 781 is initiated with selection of the particular chirp generator 758 with decoder output signal $\overline{EN}$ and is used to initialize rate generator 701 for generating a chirp signal. This initialization occurs by setting latch 760 with SOS output signal $\overline{OUT}$ and by presetting counters 786 with SOS output signal $\overline{OUT}$.

For an embodiment using counters 786 having a clear control such as S/N 74163 type counters, output signal $\overline{OUT}$ from SOS 781 may be input to the clear control input of each counter as clear signal CR. For an embodiment using S/N 74190 type up-down counters for counters 786, clear signal CR may be input to the load control input and a particular initial state may be wired to be preloaded in response to the load signal CR from SOS 781, wherein preloading and clearing of S/N 74190 type counters has been discussed in detail with reference to FIG. 6D above. For the S/N 74190 type counter embodiment, preloadable input lines may be all zero to clear counters 786 in response to load input signal CR as discussed above for C-counter 616 with reference to FIG. 6D. Alternately for the S/N 74190 type counter embodiment, preloadable input lines may be connected to a preferred combination of one-bits and zero-bits to load non-zero-states as discussed above for K-counter 619 and J-counter 617 with reference to FIG. 6D. In a preferred embodiment, output signal UD from up-down switch 788 may be connected to the preloadable signal lines; where load control signal CR from SOS 781 may load a zero-state in response to up-down switch 788 being in the up-position for commanding an up-count with a low UD signal and may load a one-state in response to up-down switch 788 being in the down-position for commanding a down-count with a high UD signal.

The setting of latch 760 with SOS output signal $\overline{OUT}$ enables clock pulses CK to be applied to rate multiplier 784 with gate 783 as the dt input to rate multiplier 784. Rate multiplier 784 generates output clock pulses 789 having a pulse rate proportional to the rate of the dt clock pulses and proportion to the input signal B–F from counters 786. Toggle flip-flop 785 is used to generate a symmetrical squarewave output signal dz in response to output pulses 789, where output pulses 789 may not be symmetrical. Flip-flop 785 changes state for each rate multiplier output pulse 789 to generate a squarewave output signal dz having a frequency that is half of the frequency of signal 789 and having a symmetrical signal related to the spacing between output pulses 789 from rate multiplier 784.

A plurality of counters 786 may be used to control the rate of output pulses 789 from rate multiplier 784, wherein the pulse rate of output pulses 789 is proportional to the input signals A–F of rate multiplier 784 from counters 786. For simplicity, it will be assumed that input signal dt represents a constant clock signal. Therefore, output signal 789 of rate multiplier 784 may have a frequency proportional to the state of counters 786. If counters 786 have a constant number stored therein, then output signal 789 may have a constant frequency. If counters 786 have a number stored therein that is changing, then output signal 789 may have a frequency changing at a rate proportional to the change in the number stored in counters 786.

The number stored in counters 786 may be changed at a rate determined by the frequency of clock signal dy 790 which may be selected from different sources with switch 787. If switch 787 is positioned to select the constant dt signal, the constant dy clock signal 790 to counter 786 may cause counters 786 to count at a constant rate. If switch 787 is positioned to select the dz clock signal, the dy clock signal 790 to counters 786 may cause counters 786 to count at a rate determined by the rate of change of output signal dz which is directly proportional to the state of counters 786 and therefore related to the input clock signal dy 790 of counters 786. Therefore, selection of output signal dz 798 for counter clock signal dy 790 may provide an exponential changing output signal frequency.

Counters 786 may be connected so that the least significant seven stages provide a divide-by-128 count so that the most significant stages of counters 786 controlling rate multiplier 784 are changing at only 1/128 the rate of clock signal 790 to provide a relatively slowly changing chirp signal compared to the frequency of clock signal 790. The least significant bit A input to rate multiplier 784 may be open or one-set to insure that a minimum output pulse rate will be generated even when counters 786 are zero-set such as when cleared at the start of the chirp operation with clear signal CR from SOS.

Switch 788 may be positioned to select whether clock signal dy 790 to counters 786 generates an up-count related to an up-chirp signal or generates a down-count related to a down-chirp signal. Flip-flop 748 may be used to sample output signal UD from switch 788 in response to output signal $\overline{OUT}$ to make the circuit insensitive to changes in the position of switch 788 during operation. Flip-flop 748 may be clocked with initializing signal $\overline{OUT}$ from the SOS to store the state of switch 788 for the duration of the initialized operation. A preferred embodiment will now be discussed wherein the state of up-down switch 788 is preloaded into counters 788 in response to clear signal CR wherein a zero-state is loaded into counters 786 for an up-count related to a low UD signal and a one-state is loaded into counters 786 for a down-count related to a high UD signal. In an up-count mode, counters 786 may be incremented from the preloaded zero-state to a maximum count state such as a one-state which may be detected with up-count detector 794 to terminate the up-chirp signal. Similarly, in a down-count mode, counters 786 may be decremented from the preloaded one-state to a minimum count state such as a zero-state which may be detected with down-count detector 793 to terminate the down-chirp signal. Because the output pulse rate or chirp signal frequency is proportional to the number in counters 786; a zero-state may provide a minimum chirp signal frequency, a one-state may provide a maximum chirp signal frequency, an up-count from a zero-state to a one-state may provide a chirp signal ranging from a minimum to a maximum frequency, and a down-count from a one-state to a zero-state may provide a chirp signal from a maximum to a minimum frequency. For an up-chirp signal, the highest frequency representing the end of the up-chirp signal is related to a high number such as a one-state of the five most-significant-bits of counters 786 for commanding a maximum output frequency signal 789 from rate multiplier 784. Because an up-chirp signal is selected with switch 788 and flip-flop 748 controlling the UD signal to be low, the low UD signal enables AND-gate 794 through inverter 795 and disables AND-gate 793. The input signals to enabled AND-gate 794 may represent a maximum state of the most significant bits (MSBs) of counters 786 to detect the end of an up-chirp signal for resetting latch 760 through NOR-gate 796. For a down-chirp signal, the lowest frequency representing the end of the down-chirp signal is related to a low number such as a zero number in counters 786 for commanding a minimum output frequency from rate multiplier 784. Because a down-chirp signal is selected with switch 788 and flip-flop 748 controlling the UD signal to be high, the high UD signal disables AND-gate 794 through inverter 795 and enables AND-gate 793. The input signals to enabled AND-gate 793 may represent a minimum state of the MSBs of counters 786 to detect the end of a down-chirp signal for resetting latch 760 through NOR-gate 796. Termination of the up-chirp signal through AND-gate 794 and termination of the down-chirp signal through AND-gate 793 is accomplished by NORing together the terminating signals from AND-gates 793 and 794 with NOR-gate 796 to reset latch 760 for disabling AND-gate 783 to disable generation of clock pulses dt. Disabling of clock pulses dt from clocking rate multiplier 784 causes output signal dz to remain at a fixed level.

In a preferred embodiment, the dz signal may be inverted by inverter 797 to enable AND-gates 793 and 794 to terminate the chirp signal by setting latch 760 only when output signal dz is in the zero-state. In an alternate embodiment, inverter 797 may be eliminated, wherein the uncomplimented dz output signal may be used to enable AND-gates 793 and 794 to terminate the chirp signal with the output signal dz in the one-state. Output signal dz may be capacitively coupled onto a data link with capacitor 798 in order to provide isolation and to make the voltage on the data link relatively independent of the digital state associated with rate multiplier output signal dz.

Components shown in FIG. 7G are well known components. For example, switches 787 and 788 may be well known toggle switches such as SFDT toggle switches or may be electronic switches such as using FET switching transistors. Other components shown in FIG. 7G may be series 7400 integrated circuits such as manufactured by Texas Instruments. Well known logical arrangements permit other components to be used in place of those discussed herein. For example, latch 760 may be constructed with a pair of S/N 7400 NAND-gates, AND-gates 793 and 794 may be constructed with an S/N 7430 NAND-gate followed by an S/N 7404 inverter. Further, rate multiplier 784 may be constructed with an S/N 7497 rate multiplier circuit or may be constructed with discrete logic to synthesize the logic contained on the S/N 7497 integrated circuit. Other logical modifications or substitutions for the logic shown in FIG. 7G may be provided by one of ordinary skill in the art from the teachings set forth herein. The Texas Instruments Inc book entitled the TTL Data Book referenced hereinafter sets forth detailed specifications, schematics, and applications notes for the series 7400 circuits and other well known documents in the field provide further information on the use of these circuits so that one of ordinary skill in the art may apply those circuits to the configuration set forth in FIG. 7G.

The operation of counters 786 will now be discussed with reference to Tables X and XI. Counters 786 may be well known 4-bit up-down binary counters such as S/N 74190 type counters which synchronously count dy clock pulses to update the count number therein. Three counter circuits A1, A2, and A3 786 may be cascaded as shown in FIG. 7G or may be cascaded in other well known arrangements. The counting arrangement for counters 786 is shown in Table X and XI. Three column groups are provided to show counter sequences wherein counter circuit A1 provides the least-significant-bits (LSBs) in the left column group, counter circuit A2 provides the middle-bits in the middle column group, and counter A3 provides the most-significant-bits (MSBs) in the right column group. The least-significant-bit (LSB) is shown in the left-bit column of the left column group for counter A1 where the significance of the data-bits increases towards the most-significant-bit (MSB) in the right column of the right column group for counter A3. For convenience of reference, all rows in Tables X and IX are numbered sequentially. The MSB output from counter A2 may be connected to the B input of rate generator 784 and all 4-bits output from counter A3 may be connected to the C–F inputs of rate generator 784 in order of increasing significance as shown for the corresponding columns in Tables X and XI. Counters 786 have a total 12-bits for a module 4096 count, wherein Tables X and XI skip many of the binary counts for simplicity of presentation, as identified in the skip column with marks in Table X rows 6 and 9 and Table XI rows 5 and 8. The count states of counters A1, A2, and A3 follow well known binary counting methods wherein the skipped counts will be readily filled-in by one of ordinary skill in the logical design art.

As an up-count example provided with reference to Table X, counters 786 are initially preloaded with a zero-state as shown in row 1. Counters 786 will count up from the zero-state of row 1 incrementing through the one-state of row 2, the two-state of row 3, the three-state of row 4, the four-state of row 5, etc without affecting the output pulse rate dz of rate generator 784 because the count has not as yet progressed to changing the input code B–F of rate generator 784 as shown in columns B–F of Table X.

TABLE X

| ROW | COUNTER A1-LSBs | COUNTER A2 B | UP-COUNT COUNTER A3-MSBs CDEF | SKIP | DESCRIPTION | COUNT |
|---|---|---|---|---|---|---|
| 1 | 0000 | 0000 | 0000 | | PRELOAD | 0 |
| 2 | 1000 | 0000 | 0000 | | INCR-1 | +1 |
| 3 | 0100 | 0000 | 0000 | | INCR-2 | +2 |
| 4 | 1100 | 0000 | 0000 | | INCR-3 | +3 |
| 5 | 0010 | 0000 | 0000 | ⇑ | INCR-4 | +4 |
| 6 | | | | | | |
| 7 | 1111 | 1110 | 0000 | ⇓ | INCR-127 | +127 |
| 8 | 0000 | 0001 | 0000 | ⇑ | INCR-128 | +128 |
| 9 | | | | | | |
| 10 | 1111 | 1111 | 1110 | ⇓ | INCR-4094 | +4094 |
| 11 | 1111 | 1111 | 1111 | | INCR-4095 | +4095 |

TABLE XI

| ROW | COUNTER A1-LSBs | COUNTER A2 B | DOWN-COUNT COUNTER A3-MSBs CDEF | SKIP | DESCRIPTION | COUNT |
|---|---|---|---|---|---|---|
| 1 | 1111 | 1111 | 1111 | | PRELOAD | −1 |
| 2 | 0111 | 1111 | 1111 | | DEC-1 | −2 |
| 3 | 1011 | 1111 | 1111 | | DEC-2 | −3 |
| 4 | 0011 | 1111 | 1111 | ⇑ | DEC-3 | −4 |
| 5 | | | | | | |
| 6 | 0000 | 0001 | 1111 | ⇓ | DEC-127 | −128 |

TABLE XI-continued

| | | DOWN-COUNT | | | | |
|---|---|---|---|---|---|---|
| ROW | COUNTER A1-LSBs | COUNTER A2 B | COUNTER A3-MSBs CDEF | SKIP | DESCRIPTION | COUNT |
| 7 | 1111 | 1110 | 1111 | ↑ | DEC-128 | −129 |
| 8 | | | | | | |
| 9 | 0100 | 0000 | 0000 | ↓ | DEC-4093 | −4094 |
| 10 | 1000 | 0000 | 0000 | | DEC-4094 | −4095 |
| 11 | 0000 | 0000 | 0000 | | DEC-4095 | −4096 |

A section of the binary count inbetween increment 4 (row 5) and increment 127 (row 7) is shown skipped in row 6, wherein the skipped counts merely represent well known progressing binary count codes. The increment from 127 to 128 shown in row 7 and row 8 respectively causes a first change in the input to rate multiplier 784 by changing the B-signal from a zero-state to a one-state thereby causing the dz output rate 798 to increase, consistent with well known operation of rate multiplier 784. Similarly, as the counter clock pulses by 790 continue to increment from count 128 (row 8) toward count 4095 (row 11), the output frequency of rate multiplier 784 increases until counters 786 achieve an all one-state (row 11) which is detected by AND-gate 794 to reset latch 760 through NOR-gate 796 thereby terminating the chirp signal at the maximum frequency condition.

Similarly for a down-count example provided with reference to Table XI, counters 786 are initially pre-loaded with a one-state as shown in row 1. Counters 786 will count-down from the one-state of row 1 through the decrementing states of negative-two through negative-four (rows 2-4), through the skipped counter-states of negative-five through negative-127 (row 5), through the decrementing states of negative-128 (row 6) which is then decremented to negative 129 (row 7) which first changes the input state to rate multiplier 784 by changing the least significant input signal B from a one-state to a zero-state thereby decreasing output pulse rate dz from rate generator 784. Similarly, the state of counter 786 continues to decrement with well known sequential binary counts 130-4093 being skipped for simplicity (row 8). Negative-4094 (row 10) is then decremented to negative-4096 (row 11) which is the maximum negative count and which is related to the minimum frequency generated for the down-chirp signal. This maximum negative count (row 11) may be detected with AND-gate 793 to reset latch 760 through NOR-gate 796 to end the down-chirp signal at this lowest frequency value.

Alternately, AND-gates 793 and 794 may terminate an up-chirp or a down-chirp at any desired frequency which is determined by the selected input lines from counters 786 to AND-gates 793 and 794. AND-gates 793 and 794 may be built-up by cascading two-input or four-input AND-gates to provide any number of input lines. Further, inverter gates may be used to enable AND-gates 793 and 794 for any zero-state counter conditions shown in Tables X and XI. Similarly, gates 793 and 794 may be arranged to monitor all bits of counters 786 which for this simplified example represents 12-bits or may be connected to monitor a limited number of bits from counters 786 such as the five MSBs shown as columns B-F in Tables X and XI or may be otherwise connected for terminating a chirp signal.

An alternate embodiment of a chirp generator is shown in schematic form in FIG. 7H in the form of a digital differential analyser (DDA) integrator element. The DDA integrator is a well known prior art digital integrated element having a Y-register for adding up dy input pulses, an R-register for accumulating the sum of the Y-register contents in response to dx input pulses and a dz output signal representative of an incremental overflow of the R-register in response to the summation of the contents of the Y-register. DDA integrators are well known in the art and are discussed in the text book by Braun referenced hereinafter at Chapter 8 therein. Also, DDA integrators are described in Applicant's other issued patents such as U.S. Pat. No. 3,586,837 and U.S. Pat. No. 3,564,536 which are incorporated herein by reference. DDA integrator 792 may be used to generate a chirp signal dz by updating the Y-register in response to either dt input pulses or dz feedback pulses selected with switch 787 as the dy input signal as discussed above for the embodiment set forth in FIG. 7G. The dy input pulses selected with switch 787 update the Y-register, which is successively added to the R-register in response to the dx input pulses where the dx input pulses may be equal to the dt input pulses similar to the embodiment discussed with reference to FIG. 7G. The output pulses dz have a pulse rate proportional to the dy input pulses selected with switch 787 and the update pulsed dx. If the dx pulse rate is constant, selection of the dt pulses with switch 787 provides linear update of the Y-register parameter causing a linear increase in the frequency of the dz signal and selection of the pulses with switch 787 provides an exponential update of the X-register parameter causing an exponential increase in the frequency of the dz signal similar to the rationale discussed with reference to FIG. 7G.

The counter and rate multiplier arrangement 786 and 784 discussed with reference to FIG. 7G above may be considered to be a DDA integrator implemented as a rate multiplier, wherein counters 786 may be considered to be the Y-register of the DDA integrator and the counter arrangement in rate multiplier 784 may be considered to be the R-register of the DDA integrator.

In view of the above, DDA integrators and related incremental processing devices may be used to generate chirp signals such as a linear chirp signal, an exponential chirp signal, an up-chirp signal, and a down-chirp signal. Further, a virtually unlimited number of different types of functions may be generated with DDA integrators such as discussed in the textbook by Braun referenced hereinafter.

The embodiments discussed with reference to FIGS. 7G and 7H above provide squarewave or pulse rate signals to synthesize a chirp signal. A chirp signal does not require any particular signal form but may be a squarewave signal, a sinewave signal, a sawtooth signal or other well known signal forms. Similarly, the pilot signal used for correlation of a received chirp signal may take any of these signal forms. Still further, in the single-bit embodiment of the present invention, amplitude characteristics of a signal are less significant than are the amplitude characteristics in other embodiments having greater amplitude resolution. Still further, transmission of a squarewave such as on a data link provides a filtering effect, where the high frequency Fourier components associated with the sharp edges of a squarewave signal may be degraded more than the lower frequency components, wherein the transmitted squarewave may be degraded to merely a sinewave representing the fundamental frequency of the squarewave which is the pulse repetition frequency of the squarewave. Therefore, transmission of a squarewave on a data link and the resultant degradation thereof may be considered to be a squarewave to sinewave converter. Alternately, squarewaves may be processed with filters to generate sinewaves, wherein coupling capacitor 798 (FIG. 7G) may be part of a low pass filter to convert squarewave output dz from flip-flop 785 to a sinewave signal form.

In view of the above, another feature of the present invention provides for generating squarewave chirp signals for the communication and ensonifying purposes discussed herein wherein such communication and ensonifying chirp signals may have the desired chirp characteristics and may be generated with DDA, rate multiplier, or other digital function generators.

DESCRIPTION OF FIG. 7I

A multiple chirp generator arrangement will now be discussed with reference to FIG. 7I for generating a plurality of chirp signals such as illustrated in FIG. 7B. As discussed for FIG. 7B above, it is desirable to generate a plurality of chirp signals 715–721 wherein each chirp signal is delayed in time with respect to other chirp signals for identifying a binary code of a digital word. An arrangement has been discussed for generating the chirp signals shown in FIG. 7B in response to transitions of waveform 714 with reference to the chirp generator of FIGS. 7E and 7G. An arrangement will now be discussed with reference to FIG. 7I for generating a plurality of chirp signals such as chirp signals 715–721 in response to the one-states of a digital signal such as data signal 714. Further, an arrangement will be discussed for generating a plurality of sequential chirp signals in response to a parallel digital word with reference to FIG. 7I in contrast to the serial digital word responsive chirp signal arrangement discussed with reference to FIGS. 7D, 7E, and 7G above.

Figure 7I:
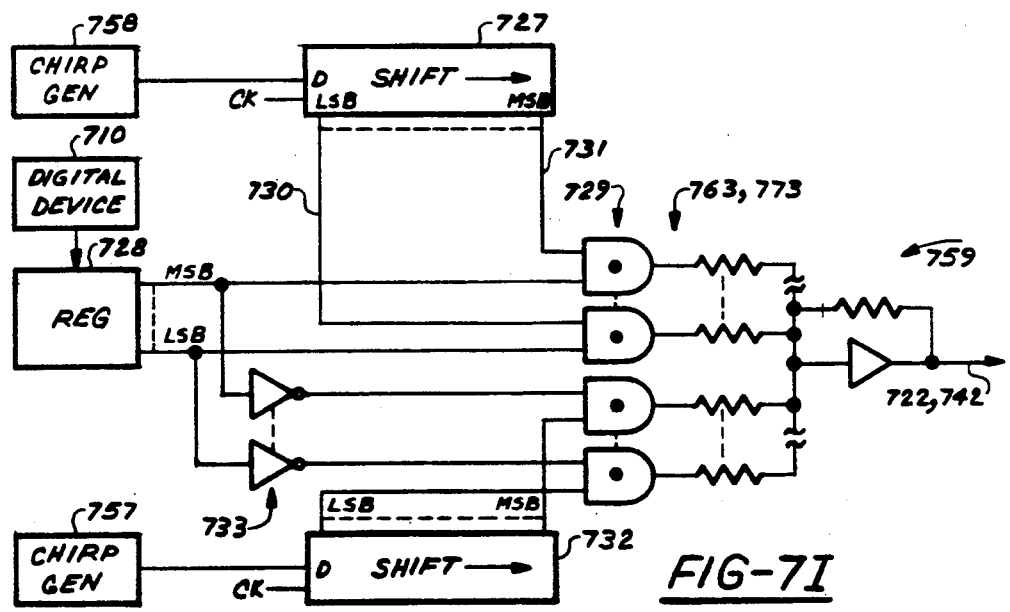
FIG. 7I shows an alternate embodiment of a multiple chirp generator arrangement in accordance with FIG. 7D.

The arrangement shown in FIG. 7I produces a plurality of chirp signals 763 and 773 for multiplexing onto a data link with summing amplifier 759 as multiplexed signals 722 and 742 in response to a digital word stored in static register 728. Digital device 710 may load a digital word into register 723 for communication over a data link, wherein register 728 may store the digital word and may provide the digital output signals in parallel word form to enable AND-gates 729 in response to each one-bit condition and to disable AND-gates 729 in response to each zero-bit condition. Each gate 729 may correspond to a digital signal from register 728 for enabling the corresponding gate in response to a one-bit signal and disabling the corresponding gate in response to a zero-bit signal or conversely. A chirp generator 758 generates a chirp signal which may be a digital chirp signal and which may be a chirp generator such as discussed with reference to FIGS. 7E, 7G, or 7H above.

Chirp generator 758 may generate a digital chirp signal to a shift register 727 clocked with clock signal CK. As shift register 727 is clocked, the state of the chirp signal from chirp generator 758 is sampled and shifted along register 727 from the register input D to the other end of the register in the direction of the arrow (FIG. 7I(. The chirp signal samples are presented to output lines 730–731 from shift register 727 as the chirp signal samples are shifted past the output lines. The sampled chirp signal is first shifted past output line 730 and subsequently past other output lines through the last output line 731. If input clock signal CK is a constant clock frequency and if shift register 727 has output lines that are spaced an equal number of shift register bits apart, the chirp signal from chirp generator 758 will be available at shift register 727 output lines 730–731 with different signal phase shifts due to the time delays between the information shifting through register 727 becoming available to the output lines in sequence at different times. The chirp signal will become available to the left-most output lines first and the right-most output lines last as it is shifted through the shift register 727 from left to right wherein the time delay between the chirp signal becoming available at adjacent output lines is related to the number of shift register stages between adjacent output lines and the frequency of the clock signal CK. For example, if clock signal CK is a 1-MHz clock signal and if output lines of register 727 have 32-shift stages therebetween, the chirp signal will be presented to adjacent output lines with a 32-microsecond delay or phase shift between adjacent output lines as the chirp signal is shifted through register 727. Therefore, each of the output lines 730–731 of register 727 provides a chirp signal that is shifted or delayed by a prescribed amount which is a 32-microsecond time delay or phase shift for each successive output line for the above example.

The chirp signals from register 727 may be selected or non-selected with AND-gates 729 in response to digital bits from register 723 wherein a one-bit from register 723 will enable a related AND-gate 729 to multiplex a related chirp signal onto data link 722 and 742 and a zero-bit from register 728 will disable a related AND-gate 729 to disable multiplexing of a related chirp signal onto data link 722 and 742. Alternately, inverters 733 will cause zero-bits from register 728 to enable a corresponding AND-gate 729 as will be discussed hereafter.

The arrangement shown in FIG. 7I may include a plurality of shift registers 727 and 732 with related chirp generators 758 and 757 respectively for multiplexing different chirp signals onto data link 722 and 742. In one embodiment, chirp generator 758 may be an up-chirp generator wherein the one-bits of register 728 may be used to multiplex a time sequence of up-chirp signals onto the data link and chirp generator 757 may be a down-chirp generator wherein the zero-bits of register 728 may be used to multiplex a time sequence of down-chirp signals onto the data link. Multiplexing of signals onto the data link in response to one-bits of register 728 may be provided by having AND-gates 729 enabled by uncomplemented output signals of register 728 and multiplexing of signals onto the data link in response to zero-bits of register 728 may be provided by having AND-gates 729 enabled by complemented output signals of register 728. Complemented output signals may be generated as $\overline{Q}$ signals from register 728 or may be generated by complementing the Q or uncomplemented output signals with inverters 733 to generate uncomplemented enabling control signals to gates 729 in response to zero-bits stored in register 728. Alternately, a plurality of registers such as register 728 may be provided for modulating chirp signals and for multiplexing a time sequence of modulated chirp signals onto the data link, where each of the plurality of registers 728 may control output chirp signals through AND-gates 729 from different shift registers 727 and 732 for generating different types of chirp signals in relation to each shift register. Alternately, various combinations of data registers 728, chirp generators 757 and 758 generating chirp signals having different chirp signatures therebetween, and shift registers 727 and 732 may be arranged for generating modulated chirp signals onto a data link for transmission of multiplexed chirp signals.

It is herein intended that any references to communicating of signals on a data link be generally applicable for other uses of multiple chirp signals including ensonifying subsurface structures in a geophysical embodiment, ensonifying underwater objects in a sonar embodiment, or otherwise providing multiplexed signals for other applications of the present invention.

In a preferred embodiment, gates 729 controlling a plurality of chirp signals having sequentially increasing time delays such as with signals 715-721 (FIG. 7B) may be enabled with control signals from register 728 having sequentially increasing significance respectively. As shown in FIG. 7I, the first chirp signal 730 may be controlled with AND-gate 729 that is enabled with the LSB of register 728 and the last chirp signal 731 may be controlled with AND-gate 729 that is enabled with the MSB of register 728; thereby multiplexing an LSB-first MSB-last chirp signal sequence. Alternately, an MDS-first LSB-last sequence may be provided.

Communication of information with modulated sequential chirp carrier signals can be better understood with reference to an example which will be discussed with reference to FIGS. 7C and 7I. Data signal 734 has a plurality of zero-states and a plurality of one-states where an embodiment has been discussed for generating up-chirp signals in response to negative transitions from the one-state to the zero-state and for generating down-chirp signals in response to positive transitions from the zero-state to the one-state. For simplicity of discussion and to permit use of the signals shown in FIG. 7C to illustrate the operation of the chirp generator shown in FIG. 7I, it will now be assumed that digital signal 734 is in the zero-state for data-bit 5 and stop-bit 8 as shown with dotted lines 747 in FIG. 7C.

For the chirp generator arrangement discussed with reference to FIG. 7I, the one-states of signal 734 may be used to generate down-chirp signals starting at times related to the spacing between a sequence of one-state data bits. For example, the start-bit shown as a zero-state bit (FIG. 7C) disables the first AND-gate 729 and therefore disables the first sequential chirp signal. The second-bit shown as a one-state data-bit enables the second AND-gate 729 and therefore enables the second sequential chirp signal, thereby permitting the second sequential chirp signal to be multiplexed onto the data link. Similarly, the third-bit shown as a zero-state data-bit disables the third AND-gate 729 and therefore disables the third sequential chirp signal. The fourth-bit shown as a one-state data-bit enables the fourth AND-gate 729 and therefore enables the fourth sequential chirp signal, thereby permitting the fourth chirp signal to be multiplexed onto the data link. The fifth-bit and sixth-bit shown as zero-state data-bits disable the fifth and sixth AND-gates 729 and therefore disable the fifth and sixth sequential chirp signals. The seventh-bit shown as a one-state data-bit enables the seventh AND-gate 729 and therefore enables the seventh sequential chirp signal, thereby permitting the seventh chirp signal to be multiplexed onto the data link. The eighth-bit and ninth-bit shown as zero-state bits disable the eighth and ninth AND-gates 729 and therefore disable the eighth and ninth sequential chirp signals. Therefore, three chirp signals may be generated in response to signal 734 stored in register 728 with the arrangement discussed with reference to FIG. 7I. The first down-chirp signal 736 is generated in response to the first one-bit which is the second-bit in signal 734; having a time delay of one-bit time from the start of the transmission. Similarly, the second and third down-chirp signals 738 and 740 are generated in response to the second one-bit and the third one-bit in signal 734; having time delays of three-bit times and six-bit times respectively from the start of transmission. Down-chirp signals 736, 738, and 740 may be multiplexed together as discussed with reference to FIG. 7D above to form a multiplexed signal such as multiplexed signal 742; wherein the multiplexed signal may have other signals multiplexed thereon such as up-chirp signals as shown with signal 742 and such as noise signals which are not shown. Correlation of multiplexed signal with down-chirp pilot signal 743B provides output signal 744B having correlation peaks related to the start of one-bits of waveform 734 which may be peak detected to generate clock signal 745B and may be further processed to generate data signal 746 in accordance with the teachings of the present invention as discussed with reference to FIG. 7F above.

For the example presented above having a 32-microsecond delay per bit, the time delays of the down-chirp signals from the start of the transmission can be calculated; where the first down-chirp signal 736 would start 32-microseconds after the start of transmission corresponding to the first one-bit of signal 734; followed by a second down-chirp signal 738 having a three-bit time or 96-microsecond time delay from the start of the transmission or a two-bit time or 64-microsecond time delay from the start of the first down-chirp signal related to the first one-bit of signal 734; followed by a third down-chirp signal 740 related to having a six-bit time or 192-microsecond time delay from the start of the transmission or a two-bit time or a 64-microsecond time delay from the start of the second down-chirp signal related to the second one-bit of signal 734. Therefore, arrangements shown in FIG. 7I may communicate signal 734 (FIG. 7C) in the form of 3-down chirp signals that are sequential and overlapping and that have a time sequential form related to the time sequence of one-bits in order of increasing significance in signal 734.

The chirp generator arrangement discussed with reference to FIG. 7D is an edge or transition responsive chirp generator and the chirp generator arrangement discussed with reference to FIG. 7I is a state or level responsive chirp generator. It is intended that these descriptions relative to generating chirp signals in response to transitions of digital signals and states of digital signals be the exemplary of many other types of signal condition responsive chirp signals; wherein those of ordinary skill in the logical design art will now be able to provide chirp signals responsive to any signal characteristic in accordance with the teachings of the present invention.

Another example will now be provided to illustrate operation of the arrangement set forth in FIG. 7I. For this example it is required that data is to be transmitted with a 32-microsecond period per data-bit which is approximately a 30 KHz data rate and that five-cycles of the highest chirp signal frequency be transmitted per data-bit period. Further, well known sampling theory requires that the sampling rate be twice the highest frequency that is to be preserved. The requirement for five-cycles of the highest chirp frequency be transmitted per data-bit period implies five-cycles per a 32-microsecond period or approximately 6-microseconds per cycle or approximately a 150-KHz highest chirp signal frequency. The sampling theory requirement of two-samples per cycle implies a maximum sampling rate of twice the 150-KHz maximum frequency or a 300-KHz sampling rate. Because shift register 727 samples the input chirp signal once per clock pulse, a clock pulse frequency of 300-KHz is required. Because there must be one shift register stage per sample and because there are ten-samples per each of five-cycles per data-bit period; there must be ten shift register stages inbetween each adjacent output line 730–731.

The operation of the multiple chirp generation arrangement (FIG. 7I) will now be discussed with another example with reference to FIG. 7C. Data signal 734 may be loaded into register 728 from digital device 710. Gates 729 may be enabled with the one-bits in register 728 as discussed above. Chirp generator 758 may generate a down-chirp signal such as shown in signal 736. The example shown in FIG. 7C provides down-chirp signals 736, 738, and 740 starting at positive transitions from a zero-state to a one-state related to the start of a one-bit. The chirp signal from generator 758 is shifted through register 727 where the output lines 730–731 to gates 729 which are enabled by one-bits cause down-chirp signal being shifted through register 727 to be multiplexed onto the data link. Therefore, chirp signals 736, 738 and 740 will be multiplexed onto the data link at times related to the sequence of occurrence of the one-bits in waveform 734. Because chirp signals 735–741 have been constructed for a transition responsive multiple chirp generator, adjacent one-bits 5 and 8 of signal 734 are shown changed to zero-bits with dashed lines 747 for this example.

In an alternate embodiment, the arrangement set forth in FIG. 7I may use the $\bar{Q}$ or zero output signal lines from register 728 to enable gates 729, wherein zero-bits will enable gates 729 to cause time related chirp signals to be generated and one-bits will disable gates 729 to prevent time related chirp signals from being generated. Considering the signals shown in FIG. 7C and disregarding dashed lines 747; each zero-bit in signal 734 is shown initiating an up-chirp signal 735, 737, 739, and 741 and each one-bit in signal 734 is shown as not-initiating an up-chirp signal. Therefore, multiplex of up-chirp signals in response to zero-bits of signal 734 defines the zero-states of signal 734 and therefore completely defines the code of signal 734. The up-chirp signals may be multiplexed together and communicated over the data link as signal MUXED 742, wherein MUXED signal 742 may contain various combinations of noise, down-chirp signals, and other information which may not significantly interfere with the separation or demultiplexing of the up-chirp signals from MUXED signal 742 through correlation with up-chirp pilot signal 743A to generate correlation output signal 744A related to the time sequence of zero-states in data signal 734.

In yet another alternate embodiment, the arrangement set forth in FIG. 7I may provide two channels illustrated with chirp generators 757 and 758 and shift registers 727 and 732 respectively; wherein chirp generator 757 may generate a down-chirp signal selected with the zero-bits of register 723 and chirp generator 758 may generate an up-chirp signal selected with the one-bits op register 728; wherein the down-chirp signals selected with the zero-bits and the up-chirp signals selected with the one-bits of register 728 may all be multiplexed together onto the data link, as discussed above for up-chirp signals and for down-chirp signals. The combination of up-chirp signals and down-chirp signals selected with gates 729 are multiplexed together, transmitted together, and separated therebetween; as discussed above for up-chirp signals and for down-chirp signals with reference to FIG. 7C.

The arrangement of FIG. 7I has been discussed for a constant frequency clock pulse signal CK to shift registers 727 and 732. Alternately, shift registers 727 and 732 may have variable clock pulse signals. For example, the arrangements shown in FIGS. 7G and 7H provide variable frequency squarewave signals dz which may be used as a chirp signal as discussed above or which may be used as a variable frequency clock signal to registers 727 and 732 as shown in FIG. 7I. The connection of the dz signal (FIGS. 7G and 7H) for a linearly swept increasing or decreasing clock signal applied to the clock input CK of registers 727 and 732 generates a plurality of chirp signals through gates 729 for multiplexing onto the data link. If the clock signal CK is an increasing frequency clock signal, a chirp signal from chirp generator 758 may be shifted through register 727 at an increasing rate that is a function of time and therefore may appear to have a higher frequency at output signal lines which have a longer delay and are further along towards the right of register 727. Therefore, the chirp signal viewed on output line 730 may have a lower frequency range and a longer chirp signal envelope than chirp signals from subsequent outputs such as output 731. Such chirp signals multiplexed onto the data link may be separable therebetween based upon the time phasing or time sequence between chirp signals, where a time sequence of chirp signals has been discussed above with reference to FIGS. 7B and 7C, and may be further separable therebetween based upon the different signatures of the chirp signals such as higher frequency range chirp signals and shorter chirp signal envelopes.

The combination of the signature of a chirp signal into data input D of register 727 and the signature of a chirp signal into clock input CK of register 727 will together determine the characteristic of each of a plurality of chirp signals generated on output lines 730–731 of register 727; where these characteristics include the signature of each chirp signal, the signature between chirp signals, the duration of the chirp envelope, and other such characteristics of each chirp signal and characteristics between chirp signals. Alternately, these variable clock frequency arrangements of the present invention permit the generation of multitudes of different types of chirp signals under program control. For example, a first programmable chirp generator 758 such as shown in FIG. 7G may be used to generate a chirp input signal D and a second programmable chirp generator such as the arrangement shown in FIG. 7G may be used to generate a chirp clock signal CK to register 727; wherein the chirp frequency of the input signal D and the chirp frequency of the clock signal CK may be constant frequencies or may be swept frequencies such as a linearly varying up-chirp or down-chirp signals, exponentially varying up-chirp or down-chirp signals, or combinations therebetween. For example, the signals to the D-input and CK-input of register 727 may be a constant frequency and a linear up-chirp signal respectively, a linear down-chirp signal and a linear up-chirp signal respectively, an exponential down-chirp signal and a linear up-chirp signal respectively, a linear-up-chirp signal and a linear down-chirp signal respectively, or any other combinations of D-input and CK-input frequency controlled signals. Further, the lengths of the signal envelopes and the frequency ranges of the sweeps to the D-input and CK-input of register 727 may be controlled using the arrangements discussed with reference to FIGS. 7G and 7H.

In view of the above, multitudes of complex chirp signals can be generated each having substantially different correlation signatures therebetween, each generated from one of a plurality of outputs of register 727, and/or each selectable either individually or in combinations with a select code loaded into register 728 for enabling and disabling AND-gates 729.

Although the arrangement of FIG. 7I has been discussed with reference to a data communication embodiment, this arrangement may be used for many other embodiments. For example, it may be desirable to ensonify a subsurface environment in a geophysical application with a plurality of chirp signals each having a different signature and each being generating overlapping therebetween for separation through correlation. In such an embodiment, multiplexed chirp signals 722 and 742 may be provided to a VIBROSEIS signal generator for ensonifying a subsurface environment with seismic signals having the multiplexed chirp signal characteristics. Acquisition and processing of the multiplexed chirp signals having time delay differences and having signature differences therebetween may permit correlation with each of a plurality of operator signals such as generated by the arrangement shown in FIG. 7I for separating the signal components.

Further, prior art signal generators such as the VIBROSEIS signal generator are excited with sinusoidal signals. In accordance with another feature of the present invention, such signal generators may be excited with squarewave signals such as the squarewave chirp signals discussed herein with reference to digital chirp generators shown in FIGS. 7G–7I. The multiplexing together of a plurality of chirp signals may provide complex frequency components superimposed therebetween independent of whether sinusoidal or squarewave signals are used so that advantages assumed by the prior art for sinusoidal chirp signals loses much of its significance in conjunction with the improved arrangement of the present invention; wherein squarewave chirp signals may be used for chirp excitation particularly when a plurality of squarewave chirp signals are multiplexed together such as for exciting a VIBROSEIS for ensonifying the subsurface environment with seismic signals.

The components shown in FIG. 7I may be well known components. For example, register 728 may be a well known static register such as S/N 74174 and S/N 74175 registers and shift registers 727 and 732 may be well known shift registers such as the S/N 7491A 8-bit shift registers cascaded together to form the desired length shift register, MOS-FET shift registers, or other well known shift register arrangements. Further, AND-gates 729 may be S/N 7408 AND-gate circuits; inverters 743 may be S/N 7404 inverter circuits; and amplifier 759 may include $\mu$A709 or $\mu$A741 amplifier circuits. Further, digital device 710 may be a computer, Teletypewriter, or other well known sources of digital information. Yet further, chirp generators 757 and 758 may be the same chirp generators discussed with reference to FIGS. 7E, 7G, and 7H above or may be well known prior art chirp generators.

DESCRIPTION OF FIG. 8

For simplicity of discussion and to better exemplify the features of the present invention, arrangements have been provided in digital form or in a form that has minimized the showing of amplitude effects of signals. Now an arrangement will be provided for illustrating the effects of amplitude in an embodiment for communicating samples of analog information.

An analog signal may be sampled for modulating a chirp signal using amplitude modulation, phase modulation, frequency modulation, or other modulation techniques. An amplitude modulation arrangement will be described with reference to FIG. 8 to exemplify this feature of the present invention. An analog ramp signal AI will be sampled at points S1, S2, S3, and S4; where the analog samples will be used to amplitude modulate and time modulate a chirp signal for communication of the analog samples. Analog signal AI is shown as a ramp signal for simplicity of explanation of this feature of the present invention; although any analog waveform may be sampled and communicated in the manner exemplified with ramp waveform AI. Sample S1 is a high amplitude sample, which is used to amplitude modulate a first chirp signal 811, wherein chirp signal 811 is shown having a relatively high amplitude corresponding to the relatively high amplitude of sample S1. Similarly, samples S2–S4 amplitude modulate chirp signals 812–814. Therefore, samples S1–S4 are shown having linearly decreasing relative amplitudes therebetween and wherein chirp signals 811–814 are shown having linearly decreasing relative amplitudes therebetween corresponding to the amplitudes of analog samples S1–S4 respectively. Chirp signals 811–814 are shown progressively time delayed, wherein a chirp signal may be started at the time the analog signal AI is sampled for modulating the started chirp signal when the amplitude of the related analog sample. Therefore, a chirp signal may have a starting time related to the particular sample time and may have an amplitude related to the amplitude of the related sample; wherein each chirp signal 811–814 may correspond in time phase with the related sample S1–S4 respectively and may correspond in amplitude with the related sample S1–S4 respectively. In particular, signal 811 may start at sample time S1 and may have an amplitude related to the amplitude of sample S1, signal 812 may start at sample time S2 and may have an amplitude related to the amplitude of sample S2, signal 813 may start at sample time S3 and may have an amplitude related to the amplitude of sample S3, and signal 814 may start at sample time S4 and may have an amplitude related to the amplitude of sample S4. Therefore, samples S1–S4 may be taken at progressively increasing times consistent with well known sampling arrangements and may have progressively decreasing amplitudes consistent with sampling a down-ramp;

wherein corresponding chirp signals 811-814 have progressively increasing starting times and progressively decreasing amplitudes corresponding to the related samples S1-S4.

Chirp signals 811-814 may be multiplexed together such as with electronic summation as discussed with reference to FIGS. 7D-7E above or with implicit multiplexing such as discussed above for a geophysical embodiment. Signals 811-814 may be multiplexed together to form multiplexed signal 815, wherein multiplexed signal 815 provides a schematic representation of the frequency related characteristics of a chirp signal; wherein signal 815 provides spacing of vertical lines to set forth the frequency components as discussed with reference to FIG. 3 above and signal 815 also has an amplitude related characteristic shown schematically by the amplitudes of the vertical lines. Summation of sinusoidal signals or other signals is well known in the art and can be performed simply by summation of amplitudes or other well known summing or multiplexing techniques. For simplicity of discussion, a schematic notation is used in FIG. 8 for signal 815 showing amplitudes related to the vertical summation of the vertical lines in signals 811-814 for a schematic analog summation notation. Therefore, the amplitudes of signals in signal 815 do not necessarily represent amplitude peaks of the summed signals but merely represent the concentration of frequency components associated with the vertical line frequency schematic notation of signals 811-814.

Multiplexed signal 815 may represent a transmitted signal in a communication system, may represent superposition or multiplexing of a plurality of reflections from different sized reflectors in a geophysical embodiment, or may represent a generalized modulation of analog amplitude chirps for other applications. Regardless of the application and the means of obtaining multiplexed signal 815, analog amplitude modulated chirp signals being multiplexed together may be separated by correlation with a chirp operator corresponding to the chirp signature set forth in signals 811-814. Correlation of signal 815 with a constant amplitude chirp operator may provide correlation output signal 816 having four correlation output peaks 821-824; wherein each peak is shown having an amplitude corresponding to the amplitude of the related chirp signal components 811-814 multiplexed onto signal 815 and having spacing between correlation output peaks 821-824 related to the spacing between related chirp signal components 811-814 respectively of multiplexed waveform 815. For example, peak 821 corresponds in amplitude and time position with sample S1 and with chirp signal 811; peak 822 corresponds in amplitude and time position with sample S2 and with chirp signal 812; peak 823 corresponds in amplitude and time position with sample S3 and with chirp signal 813; and peak 824 corresponds in amplitude and time position with sample S4 and with chirp signal 814.

The analog chirp modulation method discussed with reference to the waveforms of FIG. 8 will now be discussed for the hardware embodiment set forth in FIGS. 7D-F. A counter 754 may count sample clock signals 714 for sampling an analog input signal AI. As counter 754 increments in state in response to input sample clock signal 714, decoder 756 is sequenced through a plurality of output-states to sequentially select each of a plurality of chirp generators such as chirp generator 758 in sequence. A typical chirp generator is shown in FIG. 7E, wherein the generation of a chirp signal 763 in response to signal EN from decoder 756 has been discussed in detail above. For analog amplitude modulation of a chirp signal, an additional circuit may be added for each chirp generator including one-shot 776, sample-and-hold 777, and multiplier 778 to generate a chirp signal that is modulated with a particular analog amplitude. Output signal EN of decoder 756 initiates a chirp signal by setting latch 760 and initiates sampling of an analog signal AI with one-shot 776 controlling sample-and-hold circuit 777, wherein one-shot 776 may be a synchronous one-shot SOS discussed with reference to FIG. 6G above or may be any well known one-shot circuit. When output signal EN of decoder 756 makes a state transition, one-shot 776 is initiated to generate an output pulse to sample-and-hold 777 to sample analog input signal AI for generating analog output signal AO of sample-and-hold 777 which is a stored analog value of sampled analog input signal AI. Sample-and-hold 777 stores the sampled analog signal AO for the duration of the chirp signal to insure that the chirp signal will be processed with a constant analog amplitude signal. In another embodiment that may involve integrating of the analog input signal AI over the period of a chirp signal, sample-and-hold 777 may be eliminated and analog input signal AI may be used in place of analog output signal AO. Analog output signal from sample-and-hold 777 may be applied to one input to multiplier 778 and chirp signal 763 may be applied to the other input of multiplier 778, wherein output signal 773 from multiplier 778 represents the analog amplitude of the product of chirp signal 763 and analog signal AO. Therefore, output signal 773 of multiplier 778 may be a chirp signal having an amplitude related to the amplitude of the analog sample AO as shown with waveforms 811-814 of FIG. 8.

A demodulator may be provided as discussed with reference to FIG. 7F above; wherein correlator 766 may be used to derive correlation output signal 816. The amplitude peaks 821-824 of signal 816 may be processed with digital peak detector 767 and may be further processed with a digital data processor. The output of the digital signal processor may be input to a compositor for compositing-after-correlation or may be otherwise stored, composited, or processed as required by the system. Components discussed with reference to FIGS. 7D-7F may be well known components, where one-shot 776, sample-and-hold 777, and multiplier 778 may be well known devices which are referenced in other discussions herein.

The reference signal arrangement discussed with reference to FIGS. 9F-9J above may be used in the arrangement discussed for analog modulation of a signature signal with reference to FIGS. 7 and 8 above to enhance precision. For example, an analog amplitude reference signal may be multiplexed with analog signal samples for modulating chirp signals to generate an amplitude reference chirp signal, wherein correlation output signals 816 (FIG. 8) may be adjusted in amplitude in response to the reference correlation peak amplitude. In this embodiment, one of the states of distributor counters 753 and 754 is identified with an output signal from decoder 756 (FIG. 7D) may enable a reference signal switch such as with control signal 968 to reference switch 962 and to disable analog input signal AI such as with control signal 967 to analog switch 991 (FIG. 9F). Analog signal 949 may be provided to multiplier 778 (FIG. 7E) instead of to CCD memory 932

(FIG. 9F) to provide a reference signal and analog signal samples being multiplexed together for amplitude modulating chirp signals. Refresh circuit 996 (FIGS. 9F-9J) may be provided in a receiving modem for sampling the reference signal to provide an automatic gain control arrangement or other arrangement for compensating amplitude of the related peak signals 821-824 (FIG. 8).

In one arrangement of an output refresh circuit, digital samples in Z-store 614 of a correlator may be normalized to the most significant part of the digital word, wherein the reference signal sample may have a maximum amplitude and, therefore, normalizing all output signal samples until the maximum signal sample is at the maximum word size may have the same effect as multiplying the other signal samples by the same compensating parameter. Normalizing may be implemented by searching for the peak amplitude and multiplying all signal samples by a factor that makes the peak signal sample magnitude equal to the maximum magnitude permissible, considering the word size of the output signal sample memory. Other amplitude compensation arrangements for digital data such as well known scaling arrangements may be provided for compensating of amplitude errors related to amplitude modulation of correlatable signals.

In summary, as sample clock signal 714 sequences counter 754 and decoder 756 through a sequence of output states, where each output state selects a chirp generator 758 to generate a chirp signal 763 starting at each sample clock time and the output state also commands sample-and-hold 777 to sample analog input signal AI. Multiplier 778 multiplies chirp signal 763 and analog amplitude modulating signal AO to generate analog amplitude modulated chirp signal 773, as shown with signals 811-814 in FIG. 8. A plurality of analog amplitude modulated chirp signals 811-814 may be summed together with summing amplifier 759 (FIG. 7D) to provide multiplexed signal 815 for communication over a data link or for other purposes related thereto.

SIGNATURE MEMORY ARRANGEMENT

The arrangement shown in FIG. 7, discussed above for a signature modem embodiment, will now be discussed for the signature memory embodiment of the present invention.

Digital device 749 may be any digital device and may be a digital signature memory device in the instant feature of the present invention. Signature memory 749 may be a magnetic rotating memory such as a disc memory or a drum memory, a magnetic tape memory, a delay line memory such as a magnetostrictive delay line memory, or other well known memory devices. Signature memory 749 may be a digital memory or an analog memory using either digital signature information as discussed with reference to FIG. 7 or analog signature information as discussed with reference to FIG. 8. For simplicity of discussion to exemplify the instant feature of the present invention, signature memory 749 may be discussed in the form of a digital magnetic tape memory. It is herein intended that any reference to a digital magnetic tape memory be exemplary of magnetic disc memories, magnetic drum memories, magnetostrictive delay line memories, and other well known memories for storing information in digital signal form or in analog signal form; wherein the use of other types of memories will become apparent to those skilled in the art from the teachings of the present invention. Further, for simplicity of discussion, signature signals will be considered to be digital squarewave chirp signals having an up-sweep or a down-sweep in frequency of a digital squarewave signal. This digital squarewave signal can be utilized with existing memory read and write electronics which are designed for digital signal processing in well known prior art memory devices. Alternately, analog read and write amplifiers for recording analog signals such as on a magnetic tape are well known in the art and may be used for processing analog signature signals, the use of which will become apparent from the teachings of the present invention.

The signature memory arrangement of the present invention provides significant advantages over prior art digital memory arrangements. One advantage is related to the increase in storage density of a memory, wherein a plurality of signature carrier channels may be multiplexed together having a different signature signal per channel for separation therebetween through correlation. Another advantage is related to a long signature signal per bit that has high immunity to noise and signal drop-outs, thereby reducing error rates and permitting lower quality memory devices to be utilized. Other advantages are similar to advantages discussed above for other features of the present invention.

The digital signature memory arrangement in accordance with the present invention will now be described with reference to FIG. 7. Digital device 710 may be a digital computer or other well known device for processing digital information. Digital device 710 may communicate with digital memory 749 through an interface exemplified with modem 711. Modem interface 711 may comprise a signature modulator 750 for modulating signature related signals such as chirp signals with digital signals 714 and 734 for storing into digital memory 749 and may include signature demodulator 751 for demodulating signature related signals such as chirp signals to generate output signals 726 and 746. Interface modem 711 may be used in place of or in addition to well known memory interface devices for interfacing to memory 749 such as a well known magnetic tape interface or rotating memory interface. Interface modem 711 may process magnetic read signals for generating digital information to digital device 710 and may process digital signals 714 and 734 from digital device 710 to generate magnetic write signals for memory 749.

Implementation of modem 711 is shown in detail in FIGS. 7B-7F and has been discussed in detail for a signature modem communication embodiment with reference to FIG. 7 above. To reiterate, digital device 710 generates digital output signals 714 and 734 to modulator 750 for modulating signature signals. Modulator 750 may include counters 753 and 754 for sequencing decoders 755 and 756 respectively in response to transitions of digital input signals 714 and 734 to sequence through a plurality of decoder output states for selecting chirp generators 757-758. Chirp generators 757-758 generate sequential signature signals 763 and 773 which may be overlapping or simultaneously generated signature signals, wherein signature signals 763 and 773 may be multiplexed or summed together with summing amplifier 759 to generate write signals 722 and 742 to a write head associated with memory 749. Signature signals 763 and 773 may be analog signature signals or digital signature signals and may be generated with a signature signal generator such as chirp generators 757-758 as discussed with reference to FIGS. 7E and 7G-7I above. Multiplexed signature signals 722 and 742 may drive a write head included in memory 749 to provide multiplexed signature signals overlapping therebetween for recording on a magnetic surface such as for a disc, drum, or tape memory. Recorded information may be in overlapping signature signal form in contrast to the prior art single-bit recording techniques. Signature signals may be considered to be a plurality of single-bit signals multiplexed therebetween for providing a plurality of squarewave transitions analogous to the single-bit squarewave embodiment used in the prior art. Therefore, well known write electronics may be used with the signature modulator arrangement of the present invention.

Interface modem 711 may receive recorded signals 722 and 742 for demodulation with signature demodulator 751 for providing output signals 726 and 746 to digital device 710. Demodulator 750 is shown in greater detail in FIG. 7F as described in detail above for a signature modem embodiment and will now be briefly reiterated for a signature memory embodiment. Memory output signals 722 and 742 may be received from a read head for processing with read amplifier 775 and squaring amplifier 765 to provide multiplexed signature signals to correlators 766 and 769. Signature signals may be recorded as a plurality of overlapping signals having a first signature characteristic related to a first channel of information being multiplexed together with a plurality of overlapping signals having a second signature characteristic related to a second channel of information. The two channels of information may be separate with correlators 766 and 769, wherein correlator 766 may operate in response to a pilot signal having a signature related to the first signature signal and correlator 769 may operate in response to a pilot signal having a signature related to the second signature signal for generating output signals 724 and 744A related to the first channel and 744B related to the second channel of information multiplexed theretogether. Digital peak detectors 767 and 770 may process correlator output signals 744A and 744B related to the first channel and the second channel respectively for generating output signals 725 and 745A related to first channel information and output signal 745B related to second channel information. If recorded information from each of the channels is related to positive and negative transitions of the recorded digital signal, then each channel signal may be used to toggle a flip-flop such as channel 1 signals 745 and 745A toggling flip-flop 768 to generate digital output signal 726 related to first channel recorded information. Alternately, if pairs of channels are used to record a first signature signal related to a positive transition and a second signature signal related to a negative transition of digital signals 714 and 734, then pairs of channels may be grouped together to set and reset a latch such as latch 722 to generate digital output signal 746 for each pair of channels recorded in memory 749. A large number of channels of information may be multiplexed together with modulator 750 for storage in memory 749 and may be separated therebetween with demodulator 751, wherein each channel may be related to a different signature signal for separation therebetween with correlator demodulators.

The elements described with reference to FIG. 7 may be the same elements described for the communication modem embodiment discussed above with reference to FIG. 7. For example, correlators 766 and 769 may be well known prior art correlators or may be an improved correlator embodiment in accordance with the present invention such as discussed with reference to FIGS. 4–6 above. Similarly, chirp generators 757–758 may be any well known prior art chirp generator or may be improved chirp generators in accordance with the present invention such as discussed with reference to FIGS. 7E and 7G–7I above.

A signature memory arrangement in accordance with the present invention will now be discussed with reference to FIG. 3A. The signature signal may be defined as an up-chirp signature signal 310 which may be used to modulate information for recording in a signature memory device. Signature modulator 750 may generate a plurality of up-chirp signals 311–314 having time-phase relationships therebetween shown with the start of the up-chirp signals progressing toward the right-hand portion of FIG. 3A for signal 311–314 and may be generated in response to modulating signal characteristics such as signal transitions or signal states. Modulated up-chirp signals 311–314 may be multiplexed therebetween with multiplexer 759 to generate multiplexed signal 315 for recording in signature memory 749. Reading of multiplexed signal 315 may be accomplished with a read head for outputting stored information from signature memory 749, generating output multiplexed signal 315 which is related to the input multiplexed signal stored in signature memory 749. Processing of multiplexed signal 315 with correlation demodulator 751 may generate correlation output signal 316 having correlation peaks such as peak 317 related to modulated up-chirp signals 311–314. Correlation output peaks 316 may be generated with digital peak detector 767 to generate output information such as output digital information.

A multi-channel signature memory arrangement in accordance with the present invention will now be discussed with reference to FIG. 3D. For simplicity of discussion, an embodiment having two channels will be discussed wherein the same information will be assumed to be stored in each of two channels. Digital signals 714 and 734 from digital device 710 may clock counters 753 and 754 to sequence first signature decoder 755 and second signature decoder 756 to select first signature chirp generators 757, etc and second signature chirp generators 758, etc for multiplexing theretogether. In this example, the first signature is an up-chirp signature and the second signature is a down-chirp signature. It is assumed that two data-bits are input to each of the two modulator channels, wherein a first data-bit causes up-chirp signal 338 to be generated with channel-1 and down-chirp signal 339 to be generated with channel-2 and wherein a second data-bit causes up-chirp signal 340 to be generated with channel-1 and down-chirp signal 341 to be generated with channel-2. Chirp signals 338–341 may be multiplexed theretogether with multiplexor 759 to form multiplexed signal 342 for recording in digital memory 749. Reading of stored information will generate a multiplexed output signal related to multiplexed signal 342 for processing with signature demodulator 751. Correlation of multiplexed signal 342 with a first correlator 766 operating in response to a first signature signal 336 may generate correlation output signal 724 and 744A shown as correlation output signal 343 related to first channel information and correlation of multiplexed signal 342 with a second correlation 769 operating in response to a second signature signal 337 may generate output correlation signal 744B shown as correlation output signal 344 related to second channel information. First and second channel signals 343 and 344 may be processed with digital peak detectors 767 and 770 respectively and other processing logic for reconstructing the information contained therein. Storing and reading of multiplexed signal 342, comprising a plurality of sequential and overlapping signature signals having different signatures therebetween, permits a plurality of overlapping signature signals having the same signature related to the same channel and a plurality of overlapping signature signals having different signatures therebetween related to different channels to be multiplexed together and to be stored in such overlapping multi-channel multiplexed signal form.

The signature memory feature of the present invention will now be exemplified with reference to FIG. 7B. Digital signal 714 from digital device 710 may be processed with signature modulator 750 to generate a sequence of signature signals shown as up-chirp signals 715-721 in response to transitions of digital signal 714. Counters 753 and 754 receive digital signal 714, wherein counter 753 may be incremented in response to positive transitions of signal 714 and counter 754 may be incremented in response to negative transitions of signal 714. Each transition of signal 714 causes one of the counters 753 or 754 to increment to a new state, thereby causing one of the decoders 755 and 756 to be incremented to a new state for selecting a next one of chirp generators 757-758. Each chirp generator 757-758 generates an up-chirp signal in response to selection with output signals of decoders 755 and 756 in response to each transition of signal 714 for generating an up-chirp signal 715-721. Up-chirp signals 715-721 may be multiplexed together with multiplexor 759 for driving a write head for storage in signature memory 749. Reading of information stored in memory 749 generates an output multiplexed signal related to multiplexed signal 722 for processing with demodulator 751. Demodulator 751 receives multiplexed signal 722 with read amplifier 775 for processing with squaring amplifier 765 and for correlating with correlator 766 in response to up-chirp signal 723. Correlator 766 generates correlation output signal 724 wherein each correlation output peak may be related to an up-chirp signal 715-721. Correlation output signal 724 may be processed with digital peak detector 767 to generate a reconstructed digital output signal 726.

FIG. 7C will now be used to exemplify a multi-channel embodiment of the signature memory feature of the present invention. Digital data signal 734 may be generated with digital device 710 to modulator 750 in modem 711 for storage in signature memory 749. A first signature signal such as up-chirp signal 735 may be generated in response to each negative transition and a second signature signal such as down-chirp signal 736 may be generated in response to each positive transition of signal 734 with modulator 750. Signal 734 may be input to counter 753 in uncomplemented form and to counter 754 in complemented form, wherein each positive transition clocks counter 753 to command a down-chirp signal with down-chirp signal generators 757, etc under control of decoder 755 and wherein each negative transition may be inverted to clock counter 754 to command an up-chirp signal with up-chirp signal generators 758, etc under control of decoder 756. Positive transitions of signal 734 to bit-2, bit-4 and bit-7 generate down-chirp signals 736, 738, and 740 respectively. Negative transitions of signal 734 to bit-1, bit-3, bit-6, and bit-9 generate up-chirp signals 735, 737, 739, and 741 respectively. Transition responsive chirp signals 735-741 may be multiplexed theretogether with multiplexor 759 to generate multiplexed signal 742 for driving a write head to write multiplexed signal 742 into signature memory 749. Information stored in signature memory 749 may be monitored and demodulated with demodulator 751, where multiplexed signal 742 sensed with amplifier 775 may be processed with correlator 769 operating in response to up-chirp pilot signal 743B for generating correlator output signal 744B and may be processed with correlator 766 operating in response to down-chirp pilot signal 743A for generating correlator output signal 744A. Peak detectors 767 and 770 may be digital peak detectors and may generate clock pulses 745A in response to peaks of correlated output signal 744A and may generate clock pulses 745B in response to peaks of correlator output signal 744B to reconstruct digital signal 746 having up-chirp responsive negative transitions and down-chirp responsive positive transitions.

An alternate multi-channel embodiment will now be described with reference to FIG. 7C. A first signal may be input to counter 753 and a second signal may be input to counter 754. Transitions of the signal to counter 753 may generate down-chirp signals 736, 738, and 740 and transitions of the signal input to counter 754 may generate up-chirp signals 735, 737, 739, and 741. Down-chirp signals may constitute a first channel in response to transitions of the digital input to counter 753 and up-chirp signals may constitute a second channel in response to transitions of the digital signal input to counter 754. Up-chirp signals from the second channel and the down-chirp signals from the first channel may all be multiplexed theretogether to provide multiplexed signal 742 for storing in signature memory 749. Similarly, multiplexed signal 742 may be read from signature memory 749 for processing with signature demodulator 751 to generate correlated output signal 744A related to the first channel and correlated output signal 744B related to the second channel. Correlator output signals 744A and 744B may be provided as separate signals related to separate output channels. Therefore in accordance with the instant feature of the present invention, a plurality of separate memory channels may be provided having different signatures therebetween for multiplexing theretogether, for storage in signature memory 749, and for separation therebetween when output from signature memory 749 with a plurality of correlator demodulator channels operating in response to different signature pilot signals. Therefore, multiplexing together of different signature signals for storage and demultiplexing for separation of the different signature signals output from signature memory 740 permits a plurality of signature channels to be recorded in a superimposed or overlapping form for increasing storage density.

An analog signature memory embodiment will now be exemplified with reference to FIG. 8. A plurality of analog signal samples S1–S4 may be used to modulate signature signals, such as up-chirp amplitude signals 811–814. Amplitude modulated signature signals 811–814 may be multiplexed theretogether to provide multiplexed analog signal 815 for recording in an analog memory device. Reading of multiplexed signal 815 from signature memory 749 and processing with correlator demodulator 751 provides correlation output signal peaks 816 having a spacing therebetween related to input analog signal samples S1–S4. Sample S1 may be considered to be a reference signal amplitude, wherein correlation output signal peak 821 related to reference amplitude signal sample S1 may be used to compensate for amplitude errors as discussed with reference to FIG. 9 hereinafter.

The signature memory feature of the present invention may be used in conjunction with well known prior art memories wherein input signals provided to signature memory 749 may be processed with signature modulator 750 and stored signals received from signature memory 749 may be processed with signature demodulator 751. One well known prior art magnetic tape recorder memory is the model H magnetic tape recorder manufactured by Cipher Data Products of San Diego, Calif. and described in Technical Manual CDP-100 revised October 1970 which is incorporated herein by reference. Another well known prior art magnetic tape recorder memory is the Model 7X20 synchronous write synchronous read tape transport manufactured by Pertec of Chatsworth, Calif. and described in Operating And Service Manual No 101007 which is incorporated herein by reference. Another prior art magnetic tape recorder is manufactured by Bucode Inc of Hauppauge, N.Y. and described in the Handbook, Operation And Maintenance, Magnetic Tape Systems Models 4005 and 4025 dated October 1872 and incorporated herein by reference.

Arrangement of the signature memory of the present invention using the above referenced Bucode magnetic tape systems will now be described with the above referenced Bucode Handbook. FIG. 4-2 of said handbook shows read/write circuits having computer data input and computer data output, where the computer data input signals may be connected to signature modulator 750 for generating multiplexed signature signals 722 and 742 and the computer data output signals may be connected to signature demodulator 751 for demodulating multiplexed signature signals 722 and 742 (FIG. 7) for operation in accordance with the present invention. Similarly, the Bucode Handbook defines interface line receiver and line driver arrangements that are compatible with well known line receiver and line driver circuits for interfacing to the magnetic tape system. Further, schematics of the logic and electronic circuits of the Bucode magnetic tape system are available to show well known prior art magnetic tape system implementation. Similarly, the above referenced documents describing the Ciper and Pertec magnetic tape systems provide interface specifications to permit one of ordinary skill in the art to interface therewith. Also, other well known prior art memories such as magnetic disc and magnetic drum memories are well documented to permit one of ordinary skill in the art to interface therewith.

Many well known memory devices are multi-track devices such as 7-track and 9-track magnetic tape transports and multi-track head per track magnetic disc and drum memories. Therefore, a plurality of input signals may be provided simultaneously to such memory devices and a plurality of output signals may be received simultaneously from such memory devices. For simplicity of discussion, only a single track of a plurality of tracks that may be available is considered with reference to FIG. 7. It is herein intended that the single track modulator 750 described with reference to FIGS. 7A and 7B and the single track demodulator 751 described with reference to FIGS. 7A and 7F be exemplary of modulator and demodulator arrangements for other tracks which may be included in a multi-track modem having multiple modulator and demodulator devices. In a preferred embodiment, single track modem 711 may be duplicated to provide a separate modem for each of a plurality of tracks for signature memory 749. Therefore, a 7-track magnetic tape transport may have 7-modem devices such as modem 711 wherein each of the 7-modem devices may be dedicated to a different magnetic tape transport track. Further, each of the tracks of signature memory 749 may have a plurality of channels wherein each channel may be related to a different signature modulated signal and where all of the different signature modulated signals for the different channels may be multiplexed theretogether to provide a multi-channel track for each of a plurality of tracks.

Prior art multi-track memories may provide a plurality of serial words wherein each serial word may be recorded on a separate track or may provide a plurality of parallel words wherein each parallel word is recorded on a plurality of tracks. For example, well known IBM tape formats provide a 7-bit parallel word to be recorded on a 7-track magnetic tape wherein each bit of a word is recorded on a different track. In accordance with the present invention, a different serial word of a plurality of serial words may be recorded on each channel of each of a plurality of tracks. In an alternate arrangement, digital information may be stored in parallel form having one-bit per channel for each of the tracks and having a different parallel word per multi-channel track. In still an alternate embodiment, digital information may be stored in parallel form having a different digital bit of a parallel word stored on a different track which may be the corresponding modulating signal channel of each track or may be a different modulating signal channel of each track and wherein other parallel words may be stored with different digital bits of each word on different tracks. In still another embodiment, a multi-bit signature signal amplitude may be recorded, wherein a plurality of bits for each of the signature signals may be recorded on a different channel of a particular track and wherein different bits of the digital information may be recorded on different tracks. Other combinations of serial and parallel digital word recordings having combinations of channels and tracks for a particular digital signal may be provided.

Validity checks and error checks may be made using well known codes such as a parity check, a cyclic redundancy check (CRC) and a longitudinal redundancy check (LRC) to determine validity of memory output information. If the memory output signals do not pass the required checks or have not obtained the desired amplitude, repetitive readings of the recorded information may be made and the signals may be composited theretogether such as for compositing-after-correlation capability. In a rotating memory such as a magnetic disc or magnetic drum memory, recorded information may be sequentially presented as the memory rotates, thereby providing sequential traces for compositing theretogether. For a magnetic tape memory, the magnetic tape may be rewound and reread for a desired number of times for compositing memory output information to enhance output signals. This compositing arrangement may be used in conjunction with the signature memory arrangement of the present invention to enhance output signals and, in the presence of an error condition, permits compositing operations to overcome the error condition. Well known recorded preamble and postamble data such as for drum, disc, and tape memory blocks may be used for synchronization of correlation and compositing operations just as they are used in the prior art for synchronizing of data transfer operations.

An analog signature memory arrangement may be exemplified with signature memory 749 implemented with an Ampex Model 601 magnetic tape recorder, discussed in Ampex Operation Maintenance Manual TM1001 incorporated herein by reference. The Ampex model 601 recorder is an analog magnetic tape recorder and therefore provides for recording analog signals. Therefore, use of analog signature signals such as sine-wave chirp signals may be modulated with input information. Analog multiplexed signals from modulator 750 may be input to a record channel such as the microphone input on the Ampex tape recorder for recording on magnetic tape and analog multiplexed signals from the magnetic tape recorder may output from a read channel such as from the output jack labeled phones on the Ampex tape recorder.

Output signals from the signature memory arrangement of the present invention may be very long continuous signals. Therefore, particular advantages may be achieved by using the correlate on-the-fly and output on-the-fly features of the present invention in combination with the signature memory feature of the present invention.

CRT DISPLAY EMBODIMENT

In a display system embodiment of the present invention output signal samples may be displayed to an operator with a cathode ray tube (CRT) display device in real-time as the information is being correlated without the need for an output memory device. In such an arrangement, the output product $P_J$ times $T_L$ may be presented directly to a CRT or other display device. The output memory may be implicit in the display device, where the output device may be a storage CRT such as the Tektronix Model 601 CRT or may be an oscilloscope such as Tektronix Model 454 oscilloscope, wherein the memory function may be performed by the persistency of the CRT.

The use of a CRT display for the output device and the use of the presistancy of the CRT display for the memory device will now be discussed with reference to the example set forth in Table III, the algorithm discussed with reference to FIGS. 5A and 5B above, and the embodiment discussed with reference to FIG. 6D above. Two signals available from the correlation processor (FIG. 6D) will be used to control a CRT including the product signal from gate 626 related to the product of $P_J$ and $T_L$ which may be a one-bit product in a simplified embodiment to exemplify this feature and the synchronization signal from gate 621 related to initiating a new update of output signal samples.

The product signal from gate 627 may be provided to the z-axes input of a CRT which is the intensity modulation input to the CRT. Therefore, the solution of each product computation may present either an intensity point or a non-intensity point. The persistency or storage characteristic of the CRT may cause all intensity signals associated with a corresponding point on the CRT to be summed or integrated by the persistency or storage characteristic of the CRT. Therefore, as the CRT electron beam is swept over the face of the CRT under control of the CRT SYNC signal (FIG. 6D), the intensity of the electron beam when traversing a particular point for each of a plurality of sweeps may be integrated for that particular point to provide an intensity that is related to the sum of the intensities for each successive sweep. The intensity may be degraded as a function of time. For a storage CRT such as the Tektronix Model 601 CRT, the degradation may be inconsequential; wherein the intensity of a point may be approximately proportional to the sum of the intensities of the electron beam for that point on the CRT for each of a plurality of sweeps. For a non-storage CRT such as the Tektronix Model 454 oscilloscope CRT, the signal may be degraded as a function of time and as a function of persistency wherein more recent sweeps may have more significance than earlier less recent sweeps. This is not necessarily a disadvantage, wherein the operator's eye or a recording device may integrate the visual information even for a high speed short persistency CRT such as used in the Tektronix Model 454 oscilloscope. Further, a continuous correlation operation may be used to present continuous information to the CRT for continuously refreshing the CRT with new display information in order to compensate for degradation of old display information.

In view of the above, storage or persistency characteristics of a CRT, or of an output medium such as film, or of an operator's vision may provide an output memory function for the correlation operation in place of a more permanent memory such as a core memory, a disc memory, and a magnetic tape memory.

A CRT display may display output signal samples $Z_0$–$Z_{12}$ (Table III) that are presented at positions along a sweep horizontally across a CRT, where the $Z_0$ output signal sample may be provided at the start of a sweep at the left-hand side of the CRT and the $Z_1$–$Z_{12}$ output signal samples may be sequentially presented to the CRT as the sweep progresses in the right-hand direction until the last output signal sample $Z_{12}$ is provided at the right-hand end of the sweep. Each output product $T_L$ times $P_J$ may be used to excite the CRT Z-axes as intensity modulation to the Z-axes input of the CRT. The CRT display may be synchronized to the computation with the CRT SYNC pulse (FIG. 6D), a $Z_0$ address (K=0), or other sync pulse relating to the start of the output signal sample updates. In an alternate embodiment discussed with reference to FIG. 5A, a CRT sync pulse may be provided in any of operations 515 or 516. In another alternate embodiment discussed with reference to FIG. 5B, a CRT sync pulse may be provided with the start of the correlation sync pulse detected in operation 540 or in any of operations 541 or 542 for the first iteration and either of operations 548–550 for subsequent iterations.

The significance of the CRT displayed information will now be described with reference to the above mentioned sync pulse and the product output signals. Each column shown in Table III represents a plurality of pilot signal sample computations for each trace signal sample, wherein each pilot signal sample updates an output signal sample for the trace signal sample at the top of the column (Table III). Therefore, computations described for the algorithm set forth in Table III such as with reference to FIGS. 5A, 5B, and 6D provide a sequence of pilot signal computations starting with the first pilot signal sample $P_{J_0}$ at the top of a column (Table III) and progressing to the last pilot signal sample at the bottom of the column, wherein the related computations correspond to output signal samples $Z_0$–$Z_{12}$ in sequence. Therefore, this computational algorithm provides for the sequential updating of output signal samples $Z_0$–$Z_{12}$ as the computation for a selected trace signal sample $T_L$ progresses from a first pilot signal sample $P_{Jo}$ at the top of a column to a last pilot signal sample at the bottom of a column. Because the computation is synchronized to the output signal samples wherein the first product (row 1) for a particular trace signal sample updates the first output sample $Z_0$; the second product (row 2) for a particular trace signal sample updates the second output signal sample $Z_1$; and so forth as the computations for a particular trace signal sample and for the sequential pilot signal samples generates updates for the sequential $Z_0$–$Z_{12}$ output signal samples. Therefore, this computational algorithm sequentially scans through all of the output signal samples $Z_K$ in sequence for each trace sample $T_L$ and updates the appropriate output signal samples. If a CRT display is synchronized to the output sample updates, the output signal samples or the output sample updates may be displayed on the CRT as the electron beam sweep progresses across the CRT face refreshing the output signal samples $Z_0$–$Z_{12}$ for each electron beam sweep; wherein each electron beam sweep is synchronized to each new trace signal sample $T_L$ and therefore to each computational iteration corresponding to each update of the sequential output signal samples. Synchronization of the CRT electron beam sweep to the start of the output signal updates for a particular trace signal sample synchronizes the CRT sweep to the computational inner loop 503 (FIG. 5A) or operations 542–547 (FIG. 5B), wherein the output signal sample storage memory may be the storage or persistency of the CRT and wherein each input trace signal sample causes a new set of inner loop iterations of the correlation algorithm and a resultant sequential update of the output signal samples as the electron beam sweeps across the CRT face.

Updating of each output signal sample $Z_K$ occurs at a precise time after the start of the sweep of the start of the sync pulse because of precise timing of digital equipment operating with crystal clocks and because of the precision of the CRT sweep circuitry. Therefore, the CRT display updates are repeatable for a particular output sample position on the face of the CRT. For this CRT embodiment, it is desirable to have equal time intervals between update of each output signal sample to have equal spacing and repeatable spacing for output signal samples on the CRT display. Therefore, the inner loop computational iterations set forth in FIGS. 5A and 5B may have equal time delays for each iteration period in an iterative loop. In FIG. 5A, inner loop operations are shown taking two separate paths determined by test operation 527 in order to save computational time. In the CRT embodiment it is desired to maintain constant time rather than achieve minimum time, wherein operation 527 may determine whether computational results should be displayed but may not bypass operation 517. This could be accomplished by placing a time delay in the NO path from operation 527 having a time delay period equal to the time delay period of compute operation 517 to equalize time delays through inner loop 503. Alternately, decision operation 527 could enable or disable a blanking flip-flop control circuit to determine if the computed product should be displayed or not displayed, wherein the CRT display may be blanked for not displaying the computed update in response to the NO path logic and may be unblanked for displaying the computed update in response to the YES path from operation 527; wherein both the unblanked YES path and the blanked NO path would execute the computation in operation 517 instead of bypassing operation 517 with the NO path. Similarly, in the algorithm set forth in FIG. 5B; the test for J being negative in operation 546 may have a disable computation operation 547 for the YES path that is equal in time delay to the access and compute operations 542 and 543 for the NO path to equalize time delays for both alternate paths when looping back for inner loop operations. Many other alternate arrangements will now become obvious to those of ordinary skill in the art from the teachings of this invention for providing repeatable or constant time delays between output signal updates for synchronization with a CRT sweep.

The arrangement discussed with reference to FIG. 6D may be used in conjunction with a CRT output device. For example, the output of NOR-gate 621 is shown as CRT sync signal and output of NAND-gate 627 is shown as a CRT Z-axis excitation signal; where these CRT control signals will be described below.

The start of updating of each new output sample $Z_K$ is identified by loading of counters 616 and 619 with output signal NXT from NOR-gate 621, followed by a time sequence of computational updated under control of exclusive-OR gate 626 as enabled with NAND-gate 627. Therefore, the output of NOR-gate 621 may be used for synchronizing a CRT sweep and the output of NAND-gate 627 may be used to excite the Z-axis intensity control of a CRT wherein a zero-state from gate 627 is indicative of a comparison between trace signal samples $T_L$ and pilot signal samples $P_J$ and a one-state from gate 627 is indicative of a non-comparison between trace signal samples $T_L$ and pilot signal sample $P_J$. Therefore, the output of NOR-gate 621 may initiate a CRT sweep and the output of gate 627 may be used to intensity modulate a CRT sweep. Further, update signal $\overline{\text{UPD}}$ from NAND-gate 627 may be inverted to provide update signal UPD to excite the CRT Z-axis with a one-state related to a comparison and a zero-state related to a non-comparison as shown in FIG. 6D.

LISTING PERIOD COMPENSATION

The real-time correlation and compositing-after-correlation features of the present invention provide unique operational capabilities that have not been available to the prior art. In the prior art, a single chirp signal may be generated and monitored with an array of transducers, wherein the system required a "listening period" following the end of the transmitted chirp signal. This listening period is related to the propagation time of the transmitted chirp signal to the most remote part of the environment that is to be interrogated and the propagation time back to the array in order to permit the signals at the end of the chirp signal to propagate to the extreme distances and to be reflected back to the array. In a typical geophysical embodiment, the trace signal may include a 24-second transmitted chirp signal and an 8-second listening period for a total trace signal duration of 32-seconds. Such listening periods provide well defined boundaries between sequential chirp signals and therefore between sequential trace signals.

The system of the present invention provides a capability to continuously correlate and composite trace information without specifically providing a listening period or other such boundary inbetween operations. For example, transmission of chirp signals need not cease for a listening period but a next successive chirp signal may be generated immediately after completion of a first chirp signal, wherein such successive chirp signals may have poor correlation for separation through correlation therebetween. For example, a first chirp signal may be an up-chirp signal having a 24-second period, followed immediately by another chirp signal which may be a down-chirp signal having a 24-second period, followed immediately by another chirp signal which may be another up-chirp signal having a 24-second period, etc. A multiple channel correlator such as shown in FIG. 6E may be provided to correlate a trace signal with an up-chirp signal for a first channel and with a down-chirp signal for a second channel; providing correlated output signals from the first channel related to the up-chirp signal and providing correlated output signals from the second channel related to the transmitted down-chirp signal.

Alternately the plurality of channels shown in FIG. 6E may be used to control a single Z-RAM 614 and a single Z-counter 613 for compositing the updates from each of a plurality of correlation channels into the same output signal samples. Such an embodiment may be implemented by updating a single Z-counter in response to a first pilot signal and then updating the same Z-counter in response to a second pilot signal in sequence, thereby sharing a single Z-counter 613 and Z-RAM 614 with a plurality of channels. Alternately, selecting each of a plurality of updates from each of a plurality of channels permits correlating a single trace signal $T_L$ with each of a plurality of pilot signal by providing a sequence of updates of the output signal sample in Z-counter 613 in response to each of the plurality of correlated output signals under control of a sequence of update signals such as from decoder 622. For example, decoder 612 may generate a sequence of $\overline{C1}$ clock signals to Z-counter 613, wherein a different channel is selected with each of the sequence of $\overline{C1}$ signals to Z-counter 613 for updating a single output single sample contained in Z-counter 613 from correlation update control signals related to each of a plurality of channels for compositing of these channels together.

This capability permits generation of short chirp signals and short pilot signals and permits continuous generation of ensonifying signals such as starting new chirp signals immediately after the completion of a prior chirp signal or overlapping chirp signals or otherwise ensonifying the environment without the usual prior art listening period.

Continuous generation of short chirp signals may not degrade the effects of a long chirp signal used in the prior art system because the total length of the sequential short chirp signals may equal or exceed the length of a single long chirp signal. Further, continuous generation of short chirp signals may provide a significantly simpler implementation such as having a smaller J-counter 617, a smaller L-counter 618, and a smaller P-ROM 625. For this embodiment, the number of output signal samples may not be reduced because the number of output samples may be related to the range through the environment which is substantially independent of the manner of ensonifying the environment. Therefore, as the trace signal and pilot signal durations are reduced, the difference therebetween may be maintained substantially constant based upon the relationship set forth in equation (2) above. One apparent saving of this embodiment is elimination of the prior art listening periods, wherein the above geophysical example having a 24-second pilot signal being generated at 32-second intervals in consideration of the 8-second listening period may be changed to generate a 24-second pilot signal at 24-second intervals instead of the above 32-second intervals. This elimination of the listening period effectively increases productivity by 25% for the present example. Similarly, improved precision is obtained by compositing of output signal samples $Z_K$ related to each of a plurality of different types of chirp signals that do not correlate therebetween, where the correlation output computational noise sidelobes, shown schematically in FIG. 3D as sidelobes 346 and 347, may be reduced to provide a more precise illustration of the environment. This improvement has been discussed with reference to FIG. 3D above, wherein sidelobe signals from different types of ensonifying signatures have different characteristics therebetween and may provide cancellation therebetween when composited-after-correlation, thereby effectively improving the signal-to-noise ratio.

Particular advantages may be obtained by using the listening period compensation arrangement of the present invention with the record on-the-fly arrangement of the present invention in conjunction with a short pilot signal. The listening period in prior art systems is related to the range through the subsurface environment, wherein an 8-second listening period may be related to a 40,000-foot range based upon a 10,000-foot/second average velocity. Therefore, as the trace signal length is varied, the listening period must be maintained substantially constant to preserve the desired range. As the trace signal is reduced in length, the relatively non-productive listening period increases as a percentage of the trace signal. This can be shown by a simple example wherein an 3-second listening period out of a 32-second trace signal constitutes 25% of the trace signal duration and an 8-second listening period out of a 16-second trace signal constitutes 50% of the trace signal duration. Therefore, the prior art has maintained trace signals that are relatively long compared to the listening period. Because the amount of input comparator memory in prior art systems is related to the length of the trace signal, trace signal durations have been maintained at a minimum practical duration, with a 32-second trace signal being a practical upper limit. Therefore, trace signal duration of prior art systems have been severely constrained due to the required listening period limiting the shorter duration of trace signals and due to the amount of compositor memory limiting the longer duration trace signals. The system of the present invention significantly reduces or eliminates these prior art constraints; wherein reduction or elimination of the listening period as discussed above for the system of the present invention permits extremely short trace signals to be provided without degradation of productivity and wherein elimination of the compositor memory such as with compositing-after-correlation capability as discussed above for the system of the present invention permits extremely long if not unlimited duration trace signals.

In accordance with the instant feature of the present invention, further improvements will now be summarized. In order to better understand these features of the present invention, a term "seismic range" will be defined. Seismic range is defined as having the units of time and is defined as being the time for the seismic signals to propagate from the seismic generator to the end of the range and back to the transducer array, wherein the seismic range may be the determining criterion for the prior art listening period. For example, a prior art listening period herein defined as seismic range is based upon an approximate velocity of 10,000-feet/- second and propagating through 80,000-feet of subsurface environment for a listening period of 8-seconds wherein the 80,000-feet of propagation distance is related to propagating outward from the seismic generator through the subsurface environment to a range of 40,000-feet and then propagating backward toward the seismic array for the same distance of 40,000-feet, wherein a seismic range of 8-seconds may be related to an 80,000-foot propagation distance or a 40,000-foot distance of a most remote subsurface reflector. Seismic range is only analogous to the prior art listening period because the range of the system of the present invention is relatively independent of prior art considerations such as a listening period and therefore the system of the present invention requires definition of new terms to exemplify features of the present invention. The term seismic range has been chosen for similarity with the terminology radar range in the radar field, wherein radar range is related to twice the time for radar signals propagating to an object at a particular range which is related to the propagation time outward to the object and backward to the radar receiver.

In accordance with the above definition and the instant features of the present invention, the distinction of these features over the prior art will now be discussed in terms of the seismic range definition. Prior art systems are limited to a trace signal duration that is no shorter than twice the seismic range, primarily because productivity is significantly degraded for trace signal durations less than twice the seismic range. For the condition wherein the trace signal is twice the seismic range, the seismic range or listening period of prior art systems represents half of the trace signal duration and therefore implies only a 50% productivity because VIBROSEIS generators are only ensonifying the subsurface environment for one-half of the trace period; wherein the prior art listening period encompasses the other one-half of the trace signal duration. In accordance with the listening period compensation feature of the present invention, the listening period may be reduced in duration to being less than the seismic range duration and, in the ultimate, the listening period may be eliminated entirely. Therefore, this feature of the present invention may be characterized by an ensonifying signal duration that is less than the seismic range wherein the ensonifying signal duration may be only slightly less than the seismic range duration, may be one-half of the seismic range duration, may be one-fourth of the seismic range duration, may be one-tenth of the seismic range duration, may be one-hundredth of the seismic range duration, or may be any other duration which is less than the seismic range duration.

Although prior art systems used discretely definable signature signals having a precise signature characteristic such as a precisely definable up-chirp signal and because prior art systems separate a sequence of signature signals with listening periods, the sequence of ensonifying signals in prior art systems is readily definable. In accordance with the instant feature of the present invention for providing multiplexing of a plurality of different signature signals either overlapping or being continuous therebetween, an output signal such as a vibratory seismic signal from a VIBROSEIS generator may not provide readily definable identification of each of a plurality of different signature seismic signals. Therefore, definitions will now be provided to illustrate the characteristic features of the present invention relating to a plurality of signature signals wherein terms will be defined with reference to FIG. 7C. If a plurality of signature signals 735–741 are generated and multiplexed together to provide multiplexed signal 742 for ensonifying a subsurface environment or for other purposes such as communication of digital information, multiplexed signal 742 may appear to be a continuous signal wherein the component signature signals signals 735–741 may not be readily identifiable in multiplexed signal 742. For example, up-chirp signal 735 and down-chirp signal 736 being overlapping therebetween and being multiplexed together into multiplexed signal 742 are not readily identifiable in multiplexed signal 742. The significance of providing a plurality of different signature signals may be best characterized by the use or purpose of multiplexing together a plurality of signature signals. For embodiments wherein a plurality of signature signals are multiplexed together or generated together, either overlapping or in sequence; the purpose of using such different signature signals is for separation therebetween through correlation in a signal processing system. Therefore, a definition of whether multiplexed signal 742 is a single signature signal or represents a plurality of signature signals may be defined by evaluating the correlation processor and the pilot signals related thereto as indicating the number of different signature signals to be separated. For the example shown in FIG. 7C, a multiple channel correlator is provided for correlating multiplexed signal 742 with up-chirp signal 743A with a first correlator channel and with down-chirp signal 743B with a second correlator channel to separate up-chirp and down-chirp signals multiplexed together as multiplex signal 742 to generate separate up-chirp related signal 744A and down-chirp related signal 744B. In view of the above, the number of different signature signals contained in multiplexed signal 742 may be related to the number of signature signals separated therefrom with multiple channel correlators, or the number of different pilot signals used with said multiple channel correlator that are related to the combined signals in multiplexed signal 742, or the number of output signals separated through correlation from multiplexed signal 742 rather than merely the number of signal components multiplexed together to form multiplexed signal 742. Therefore, the number of signature signals may be defined in relation to features of the system. In one embodiment, the number of signature signals may be related to the number of signal components generated separately and combined theretogether such as with multiplexer 759 (FIG. 7D). In an alternate embodiment, the number of signature signals may be related to the number of correlator channels in a multiple channel correlator for processing the trace signals. In another alternate embodiment, the number of signature signals may be related to the number of pilot signals or to the number of different signature pilot signals utilized in filtering the trace signals. In still another alternate embodiment, the number of different signature signals may be related to the number of different correlation output signals for the number of meaningfull and independent sets of correlator output information.

The teachings of the present invention provide for improving capability over prior art systems such as reduction or elimination of non-productive listening periods and increasing productivity through obtaining of meaningful information not available with prior art systems including simultaneous ensonification of a plurality of shotpoints and overlapping of a plurality of different signature signals for separation and compositing therebetween. Therefore, it is herein intended that embodiments incorporating such improvements and exemplified with the simplified examples provided herein be included in the terminology relating to the inventive features. For example language relating to a plurality of sequential ensonifying signals is intended to include overlapping signals having different start times or different end times, a multiplexed signal having different signature component signals which may be separated with a plurality of correlator channels operating in response to different pilot signals, ensonification with a plurality of generators to generate independent signals related to simultaneously ensonifying a subsurface environment with a sequence of signals, and other methods of combining, separating, and otherwise structuring signals and processing thereof to implement the features of the present invention.

The listening period compensation feature of the present invention will now be illustrated with an example. For a system requiring a seismic range of 8-seconds for identifying subsurface structures at 40,000-feet distance, a plurality of ensonifying signals may be generated having overlapping, adjacency, or continuity therebetween; wherein overlapping, adjacent, or other ensonifying signal relationships which are spaced closer than the seismic range related listening period may have different signatures therebetween for separation through correlation. For the above seismic range of 8-seconds, a first ensonifying signal having a first signature may be generated for 8-seconds, followed immediately by a second ensonifying signal having a second signature and being generated for a duration of 8-seconds, followed immediately by the first above-mentioned ensonifying signal, etc; wherein each ensonifying signal having the same signature may have a spacing therebetween related to the 8-second seismic range duration and wherein the seismic range duration between ensonifying signals having the same signatures may be "filled-in" with ensonifying signals having different signatures. In an alternate arrangement, a first signal having a first signature may be generated for a duration of 6-seconds, followed by a two-second time delay without ensonifying signal generation, followed by a second signal having a second signature with a duration of 6-seconds, followed by a two-second time delay without ensonifying signal generation, followed again by the sequence starting with the first ensonifying signal having the first signature. In still another embodiment, a first ensonifying signal having a duration of ten-seconds and having a first signature may be generated followed by and a second ensonifying signal having a duration of ten-seconds and having a second signature may be generated having an overlapping signal portion therebetween of two-seconds duration. The above three examples exemplify the conditions of continuously generated ensonifying signals without spacings between different signature signals, generation of a plurality of ensonifying signals having spacings therebetween wherein the spacings are less than the seismic range duration, and generation of different signature seismic signals having overlapping therebetween. The above examples were provided for simplicity of illustration of the alternates of the instant feature of the present invention wherein the plurality of different signature ensonifying signals may have the same durations therebetween, different durations therebetween, durations equal to the seismic range duration, durations different from the seismic range duration, continuous generation from a first signature signal to a second signature signal, spacings between the sequential signature signals, and overlapping between the sequential signature signals. For simplicity of illustration, the above examples provided two different sequential signature signals before repeating the sequence of signature signals, wherein it is herein intended that the sequence of different signature signals be exemplary of the more general embodiment wherein a plurality of signature signals which may be more than two signature signals is exemplified with the simple example above for two signature signals. Another example of a plurality of signature signals may provide for three different signature signals being adjacent, overlapping therebetween, or having spaces therebetween wherein the space are less than the seismic range duration.

In another example, it may be assumed that the system has a seismic range of 8-seconds having a first signature ensonifying signal generated with a duration of 4-seconds followed immediately by a second signature ensonifying signal having a duration of 4-seconds and followed immediately thereafter by a third seismic signature ensonifying signal having a duration of 4-seconds, then repeating the sequence of the set of three ensonifying signals each having a 4-second duration and being substantially continuous therebetween. This example provides for a relatively short signature signal followed by a plurality of other signature signals wherein the duration of the signature signals following a first signature signal may be equal to or greater than the seismic range duration so that the first signature signal is not repeated until after the completion of the seismic range duration.

MULTIPLE SHOT POINT ARRANGEMENT

An arrangement in accordance with the present invention will now be discussed for acquiring a plurality of sets of information simultaneously in contrast to prior art system arrangements for acquiring sets of information sequentially. This arrangement of the present invention will be discussed for a geophysical embodiment which is intended to be exemplary of the broad scope and applicability of this invention feature.

Prior art systems use a plurality of VIBROSEIS generators positioned at a single shotpoint and used to ensonify the subsurface environment. This plurality of VIBROSEIS generators operate in parallel to intensify the ensonifying signals over that generated with a single VIBROSEIS generator. Trace signals are received and composited in a geophysical exploration system for subsequent recording. After a sufficient number of composites have been acquired for a particular shotpoint, the VIBROSEIS generators are moved to another shotpoint and again used to ensonify the subsurface environment with a plurality of chirp signals for generating a plurality of traces for compositing for the second shotpoint. Therefore, prior art systems require a number of time-consuming moves and set ups for the VIBROSEIS generators that is proportional to the number of shotpoints.

In accordance with the instant feature of the present invention, an arrangement is provided for reducing the number of move and setup operations for the VIBROSEIS generators. A plurality of VIBROSEIS generators may be used to ensonify the subsurface environment such as with the arrangements shown in FIGS. 1C and 1D having a first VIBROSEIS generator 128A and a second VIBROSEIS generator 128B for generating ensonifying signals 129A and 129B respectively. The instant feature of the present invention is directed to reducing VIBROSEIS movements and setups. In accordance with this feature, each VIBROSEIS generator 128A and 128B may be set up at a different shotpoint, wherein VIBROSEIS 128A may be set up at a first shotpoint and VIBROSEIS 128B may be set up at a second shotpoint. Each VIBROSEIS may generate a different signature signal where, for example, ensonifying signal 129A from VIBROSEIS generator 128A may be an up-chirp signal and ensonifying signal 129B from VIBROSEIS generator 128B may be a down-chirp signal. Ensonifying signals 129A and 129B may be multiplexed together by transmission through the subsurface environment and may be received by array 110 as a multiplexed seismic signal. Array 110 may generate signals 111 for processing with signal processor 112 to generate processed multiplexed signal 113 for digital filtering operations.

In one embodiment discussed with reference to FIG. 1C, a plurality of sequential trace signals may be composited together with compositor 114 to generate composited signal 115 to multi-channel correlator 116. Multi-channel correlator 116 may correlate composited signal 115 with a plurality of pilot signals, wherein a first correlator channel 116A may correlate composited signal 115 with a first pilot signal 122A which may be an up-chirp pilot signal and a second correlator channel 116B may correlate composited signal 115 with a second pilot-signal which may be a down-chirp pilot signal for generating output signal 117A from correlator 116A related to up-chirp portions of composited signal 115 and for generating output signal 117B from correlator 116B related to down-chirp portions of composited signal 115 respectively. Therefore, correlation output signal 117A may be related to the ensonifying signals generated at the first shotpoint with VIBROSEIS 128A and correlation output signal 117B may be related to the ensonifying signals generated at the second shotpoint with VIBROSEIS 128B. Because chirp signals from different shotpoints that are generated simultaneously or overlapping therebetween are multiplexed theretogether as they propagate through the subsurface environment, an acquired multiplexed signal may be related to multiplexing ensonifying signals from each of a plurality of shotpoints. As discussed above, each VIBROSEIS generator related to different shotpoints generates an ensonifying signal having different signatures therebetween, wherein the different signatures related to different shot-points may be separated through correlation with multi-channel correlator 116 for providing separate information from different shotpoints simultaneously.

In an alternate embodiment discussed with reference to FIG. 1D, processed multiplexed signal 113 may be processed with correlator 116 which may be a multichannel correlator having a first correlator channel 116A and a second correlator channel 116B. Processed signal 113 may be correlated with a first pilot signal 122A which may be an up-chirp signal for generating correlated output signal 117A related to the ensonifying signal 129A from VIBROSEIS 128A at the first shotpoint. Similarly, processed signal 113 may be correlated with a second pilot signal 122B which may be a down-chirp signal for generating correlated output signal 117B related to ensonifying signal 129B from VIBROSEIS 128B at the second shotpoint. Therefore, correlated output signal 117 may be related to ensonifying signals from the first shotpoint and correlated output signal 117B may be related to ensonifying signals from the second shotpoint for ensonifying the subsurface structures from two shotpoints simultaneously. Correlation output signals 117A and 117B may be composited either together or separately with compositor 121 and may be recorded together with a single recorder 118 (FIG. 1D) or may be recorded separately with a separate recorder 118A and 118B for each of the separate correlated output signals 118A and 118B (FIG. 1C). For this embodiment wherein a plurality of ensonifying signals are generated simultaneously for different shotpoints, it may be desirable to maintain the ensonifying correlation output signals, which are related to each different shotpoint, separate therebetween for separate gathering, static and dynamic corrections, and stacking operation. Therefore, correlated output signals 117A and 117B may not be composited therebetween but may be individually recorded for separate processing therebetween.

Logistics and productivity advantages of the multiple shotpoint feature of the present invention will now be illustrated with several examples. For these examples, a set of chirp signals will be generated and composited for each of 100-shotpoints, wherein each chirp signal will have a period of 30-seconds including a listening period, and wherein movement to and setup at a new shotpoint will take five-minutes. A constant seismic energy arrangement will be assumed wherein a single VIBROSEIS generator per shotpoint must generate a set of 20-composites, two-VIBROSEIS generators per shotpoint must generate a set of 10-composites and five VIBROSEIS generators per shotpoint must generate a set of 4-composites.

A prior art arrangement having two VIBROSEIS generators per shotpoint requires a set of 10-composites per shotpoint and 100-moves between shotpoints. Based upon ½-minutes per composite and 5-minutes per move; a composite time of 5-minutes is required per shotpoint, a total composite time of 500-minutes is required per 100-shotpoints, and a total time of 500-minutes is required per 100-moves; yielding a total time of 1,000-minutes per compositing and movement time per 100-shotpoints.

The instant method of the present invention having two VIBROSEIS generators with one VIBROSEIS generator at each of a pair of shotpoints requires a set of 20-composites per pair of shotpoints and 50-moves between pairs of shotpoints. Based upon ½-minute per pair of composites and 5-minutes per pair of moves; a composite time of 10-minutes per pair of shotpoints, a total composite time of 500-minutes is required per 50-pairs of shotpoints, and a total time of 250-minutes is required per 50-pairs of moves; yielding a total time of 750-minutes per compositing and movement time per 100m-shotpoints. This total time of 750-minutes is approximately 25% less time than the 1,000-minutes required for the prior art arrangement using two VIBROSEIS generators.

A prior art arrangement having five VIBROSEIS generators per shot-point requires a set of 4-composites per shotpoint and 100-moves between shotpoints. Based upon ½-minutes per composite and 5-minutes per move; a composite time of 2-minutes is required per shotpoint, a total composite time of 200-minutes is required per 100-shotpoints, and a total time of 500-minutes is required per 100-moves; yielding a total time of 700- minutes per compositing and movement time per 100-shotpoints.

The instant method of the present invention having five VIBROSEIS generators with one VIBROSEIS generator at each of five-shotpoints requires a set of 20-composites per set of 5-shotpoints and 20-moves between sets of 5-shotpoints. Based upon ½-minutes per set of 5-composites and 5-minutes per set of 5-moves; a composite time of 10-minutes is required per set of 5-shot-points, a total composite time of 200-minutes is required per 20-sets of 5-shotpoints, and a total time of 100-minutes is required per 20-sets of moves; yielding a total time of 300-minutes per compositing and movement time per 100-shotpoints. This total time of 300-minutes is approximately 60% less time than the 700-minutes required for the prior art arrangement using five VIBROSEIS generators.

In view of the above, using a plurality of VIBROSEIS generators in accordance with the present invention may reduce average move and setup time and may not affect compositing time. Assuming that a geophysical exploration system may be leased for $5,000 per day; a 25% increase in productivity may be related to $1,250 savings per day and a 60% increase in productivity may be related to $3,000 savings per day.

The instant feature of the present invention for simultaneously ensonifying multiple shotpoints will now be discussed with reference to the signals shown in FIG. 3D. Signal 336 is shown as an up-chirp signal which may be the same as ensonifying signal 129A from VIBROSEIS generator 128A (FIGS. 1C and 1D) and signal 337 is shown as a down-chirp signal which may be the same as ensonifying signal 129B from VIBROSEIS generator 128B at a first and at a second shotpoint respectively. Reflections from the up-chirp and down-chirp ensonifying signals may be multiplexed together by propagation thorough the subsurface environment and may be received by a transducer array as a multiplexed signal containing multitudes of up-chirp and down-chirp signal reflections multiplexed together. A simple illustration is provided in FIG. 3D showing two reflectors for reflecting up-chirp ensonifying signal 336 as reflected up-chirp signals 338 and 340 and for reflecting down-chirp ensonifying signal 337 as reflected down-chirp signals 339 and 341, wherein an actual geophysical application may receive reflections from thousands of subsurface reflectors.

Up-chirp signal 336 from a first shotpoint may be reflected from a first subsurface reflector as up-chirp reflection 338 and from a second subsurface reflector as up-chirp reflection 340. Similarly, down-chirp signal 337 from a second shotpoint may be reflected from a first subsurface reflector as down-chirp reflection 339 and from a second subsurface reflector as down-chirp reflection 341. The two shotpoints may be adjacent shotpoints being spaced relatively close together, wherein the reflection of ensonifying signals from each of the two adjacent shotpoints occurs substantially simultaneously because of substantially constant propagation paths due to the close proximity between adjacent shotpoints. Therefore, for simplicity of illustration, up-chirp and down-chirp reflections 338 and 339 respectively from a first reflector and up-chirp and down-chirp reflectors 340 and 341 from a second reflector are shown lined-up for simplicity of illustration. Therefore, up-chirp signal 338 and down-chirp signal 339 generated at different shotpoints are shown lined-up vertically related to similar propagation paths to the first subsurface reflector for simplicity of illustration and up-chirp signal 340 and down-chirp signal 341 generated at different shotpoints are shown lined up vertically related to similar propagation paths to the second subsurface reflector for simplicity of illustration. Ensonifying signals from different shotpoints may have different propagation paths to a reflector and therefore may have different time relationships, wherein chirp-signal reflections from a particular subsurface reflector due to ensonification from different shotpoints may have different time-phase relationships and therefore may not necessarily line-up as shown in FIG. 3D. Regardless, for simplicity of discussion and illustration, such reflections of ensonifying signals generated at different shotpoints from the same reflector are shown lined up in FIG. 3D.

Reflections 338–341 are shown multiplexed together by propagation through the subsurface environment to form multiplexed signal 342. Signals shown in FIG. 3D may correspond to signals shown in FIGS. 1C and 1D. Multiplexed signal 342 may be received by array 110 as signals 109, 109A, and 109B. Array 110 may generate array signal 111 for processing with signal processor 112 to generate processed multiplexed signal 113 for compositing and for correlation. The processed multiplexed signal 113 and 342 may be further processed with multi-channel correlator 116. Correlator channel 116A may correlate multiplexed signal 113 and 342 with up-chirp pilot signal 122A and 336 to generate correlated output signal 117A and 343 related to a first shotpoint and correlator channels 116B may correlate multiplexed signal 113 and 342 with down-chirp pilot signal 122B and 337 to generate correlated output signal 117B and 344 related to a second shotpoint.

Another example of the method of simultaneously ensonifying the subsurface environment from a plurality of shotpoints will be described with reference to FIG. 7C. Assuming up-chirp signals are generated with first VIBROSEIS 128A at a first shotpoint and down-chirp signals are generated with second VIBROSEIS 128B at a second shotpoint, a plurality of up-chirp and down-chirp signal reflections 735–741 may be multiplexed together as multiplexed signal 742. For conditions of significantly different propagation times from each shotpoint to the subsurface reflectors such as for widely separated shotpoints, the up-chirp reflections related to the first shotpoint have different times of arrival than the down-chirp reflections related to the second shotpoint. A plurality of reflectors may generate up-chirp reflections 735, 737, 739, and 741 in response to ensonifying signals from the first shotpoint and a plurality of reflectors may generate down-chirp reflections 736, 738, and 740 in response to ensonifying signals from the second shotpoint. Transducer array 110 receives reflections 735–741 multiplexed together due to propagation through the subsurface environment, wherein the array signals may be multiplexed signal 742. Correlation of signal 742 with up-chirp pilot signal 743A related to the ensonifying signals from the first shotpoint will generate correlation peaks shown as signal 744A related to the reflectors and relative propagation times associated with the first shotpoint and correlation of signal 742 with a down-chirp pilot signal 743B related to ensonifying signals from the second shotpoint will generate correlation peaks shown as signal 744 B related to reflectors and spacings due to the propagation times associated with the second shotpoint. Correlation signal 744A related to the first shotpoint and correlation signal 744B related to the second shotpoint may be individually recorded with separate output device such as output device 118A and output device 118B shown in FIG. 1C for subsequent gathering, stacking, and static and velocity corrections.

An arrangement for correlating a trace signal or a plurality of trace signals with a pilot signal or a plurality of pilot signals in combination has been discussed with reference to FIGS. 5A and 6E above. For the method of simultaneously ensonifying from multiple shotpoints, these arrangements of FIGS. 5A and 6E may be used wherein a single trace signal may be provided to a plurality of correlator channels such as compositor signal 115 (FIG. 1C) and processed signal 113 (FIG. 1D) for correlation with a plurality of pilot signals 122A and 122 B using a plurality of correlator channels 116A and 116B for generating a plurality of output signal samples 117A and 117B (FIGS. 1C and 1D).

Another embodiment of the simultaneous ensonification from multiple shotpoint feature of the present invention will now be described, wherein explosive type of ensonifying sources may be used in place of the VIBROSEIS generators discussed above. The advantages achieved with the above described VIBROSEIS generator embodiment are applicable to the explosive type generators described hereinafter. Two primary differences exist for the explosive type generators when compared to chirp VIBROSEIS generators, wherein explosive type ensonifying signals have a significantly shorter duration and explosive type generators may not provide repeatable ensonifying signals.

Explosive type generators may provide only a short ensonifying signal. For example, dynamite blasts may provide only milliseconds of ensonifying signal duration compared to seconds of vibratory VIBROSEIS ensonifying signals thereby involving about a factor-of-1,000 difference in time duration. A pattern of explosive charges may be provided to lengthen the duration of explosive ensonifying signals but the explosive signals may still have a period of only about one-thousandth of the period of VIBROSEIS chirp signals.

Explosive ensonifying signals may not be repeatable relative to VIBROSEIS ensonifying signals, where explosive charges may not be controllable to a desired predictable precision. Therefore, it may be desirable to monitor the explosive ensonifying signals by sampling the signals such as with a whole-number analog-to-digital converter discussed with reference to FIG. 2 above or with a single-bit converter discussed with reference to FIG. 4 above. Sampled and stored explosive ensonifying signals may be used as pilot signals for correlation, thereby circumventing problems associated with the nonrepeatability or nonpredictability of the explosive signal signatures.

An explosive signal may be monitored with a geophone located near the ensonified shotpoint, wherein sampling operations may be initiated with the same signal that initiates the explosive charges. The sampled signals may be transmitted to the appropriate correlator channels for storage as a pilot signal for subsequent correlation wit monitored trace signals. For simultaneous ensonifying of a plurality of shotpoints, explosive charges may be initiated in a non-overlapping sequence, wherein a charge at a first shotpoint may be initiated and sampled, followed by an explosive charge at a second shotpoint being initiated and monitored, followed by a next sequential explosive charge being initialed at each of the other shotpoints to be simultaneously ensonified. Therefore, ensonifying signals may not be overlapping therebetween but may be overlapping the longer trace signals generated by reflections as the short ensonifying signals propogate through the subsurface environment. A multi-channel correlator may receive a sequence of nonoverlapping sampled ensonifying signals from each of the plurality of simultaneously ensonifyied shotpoints for storage as pilot signals and may receive a trace signal related to multiplexed reflections associated with the ensonifing signals from the plurality of shotpoints. A plurality of correlator channels may each correlate the trace signal with a different one of the sampled pilot signals to separate the reflections associated with each of the simultaneously ensonified shotpoints therebetween as discussed above for the VIBROSEIS generator embodiment.

Because of the sequential nature of initiating explosive ensonifying charges, the correlated output signals may have a time relationship or phase relationship between each of the simultaneously ensonified shotpoints; wherein a correlation output signal related to a earlier ensonified shotpoint may have an earlier time phase relationship than correlation output signals associated with each of the later ensonified shotpoints and wherein the time-phase relationship may be related to the time sequence of initiating explosive ensonifying charges. In an embodiment where explosive ensonifying signals are generated in a time sequence but correlation operations for all channels are initiated simultaneously, correlation output signals being phase shifted therebetween may be recorded maintaining the phase shifted relationships and may have information recorded therewith identifying the degree of phase shift or may be phase shifted after correlation to normalize the starting points for each ensonifying explosive signal to the same time-phase relationship. In an alternate embodiment, correlation operations for each of the plurality of channels may not start simultaneously therebetween but may start at sequential times related to the sequential time relationships between initiation of ensonifying explosive charges.

Although a plurality of explosive charges may have different signatures therebetween or may not be repeatable nor predictable, the differences in the signatures may be relatively small wherein separation between channels for different shotpoint pilot signals may be poor. Therefore, shaped explosive charges may be provided wherein the sequential or overlapping ensonifying signals for each of the plurality of shotpoints may be shaped to have different durations, amplitudes, and other such characteristics. For example, an explosive charge may be composed of a plurality of subcharges exploded in sequence having particular time relationships and amplitude relationships therebetween. Shaping of charges to provide explosive signal envelopes having desired characteristics is well known in the explosive art. Therefore, explosive charges at each of a plurality of shotpoints may be shaped to have different signatures therebetween for good separation of related reflected signals therebetween.

Further, in accordance with the present invention, an arrangement having simultaneous ensonification of a plurality of shotpoints may use combinations of continuous ensonifying signals such as provided with a VIBROSEIS generator and explosive signals as provided with dynamite, wherein VIBROSEIS ensonifying signals and simultaneous or overlapping explosive ensonifying signals may provide overlapping trace signals therebetween and may be initiated at different shotpoints therebetween.

In view of the above, a significant enhancement in productivity can be achieved by ensonifying the subsurface environment with an ensonifying source of each of a plurality of shotpoints, wherein the ensonifying signal from each shotpoint may have a signature that is different than the ensonifying signal from each other simultaneously ensonified shotpoint for separation through correlation of the reflections from subsurface structures related to each shotpoint. Although this method of the present invention has been discussed for the embodiment of a geophysical exploration system, it is equally applicable to other systems such as underwater acoustics systems.

MULTIPLE CHANNEL ENSONIFICATION FROM EACH SHOTPOINT

In accordance with another feature of the present invention, an arrangement and method will now be provided for ensonifying the subsurface environment with a plurality of overlapping signal channels to enhance productivity. Prior art systems provide only a single channel of ensonifying signals and provide only a single correlator for processing the trace signal. Therefore, prior art systems require generation of multiple sequential ensonifying signals for providing multiple composites and require listening periods therebetween.

In accordance with the instant feature of the present invention, generating of overlapping ensonifying signals having a different time-phase relationship therebetween permits substantially simultaneous ensonification and substantially simultaneous correlation and compositing of multiplexed signals; thereby simultaneously ensonifying the subsurface environment with a plurality of overlapping signals for compositing in contrast to the prior art method of sequentially ensonifying the subsurface environment with a plurality of sequential non-overlapping signals for compositing theretogether.

The degree of improvement in productivity of the instant feature of the present invention compared to prior art methods may be better understood with a simple example. Prior art systems may provide 16-composites of a trace signal having a 24-second pilot signal and a 8-second listening period, where acquisition of 16-sequential 32-second duration trace signals requires 512-seconds of acquisition, ensonification, and compositing. In accordance with the instant feature of the present invention, 16-different signature signals may be multiplexed together having different time-phase relationships therebetween and being overlapping therebetween; wherein the 16-multiplexed signature signals may be acquired substantially simultaneously and separated with a 16-channel correlator for compositing theretogether after correlation. Time duration of the multiplexed trace signals have approximately the same duration as a single trace signal without a listening period, which is approximately 24-seconds. Therefore in the above example, an improvement in productivity of more than 20-times (24-seconds compared to 512-seconds) may be achieved over prior art arrangements and methods by the present feature of simultaneous ensonification in contrast to the prior art method of sequential ensonification and by the present feature of separation of different signature signals with a plurality of correlator channels in contrast to the prior art arrangements of having only a single correlator channel.

Figure 3E:
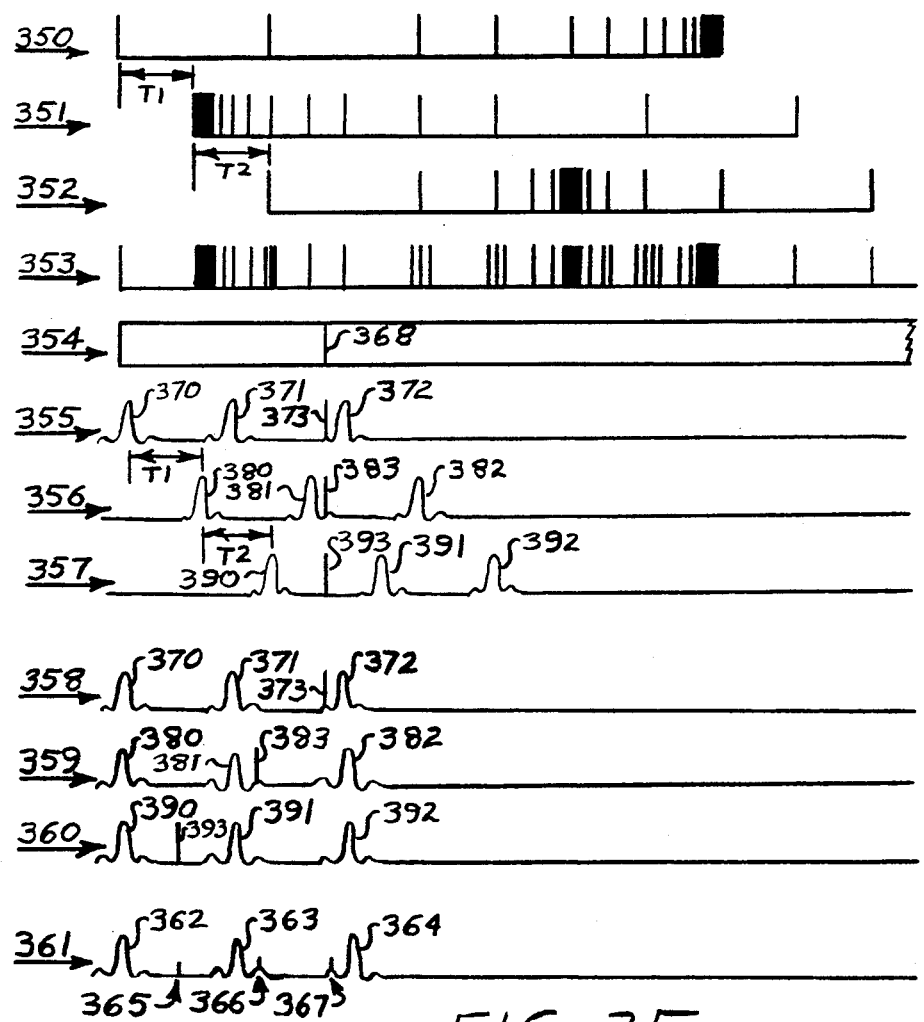
FIG. 3E illustrations ensonification with overlapping chirp signals.

In accordance with the present invention, a plurality of ensonifying signals may be generated being overlapping therebetween or being continuously generated in sequential form. This may be contrasted to the prior art ensonifying signals which must be generated in sequential form having listening periods therebetween due to limitations of those prior art systems. In a first embodiment of the instant feature of the present invention, ensonifying signals may be generated having overlapping therebetween and being phase-locked therebetween such as shown with ensonifying signals 336 and 337 (FIG. 3D). In a second embodiment of the instant feature of the present invention, signals having different signatures therebetween may be generated in sequence without having overlapping therebetween and without having the usual prior art listening period. In a third embodiment of the instant feature of the present invention, ensonifying signals may be generated having overlapping therebetween but having different time-phase relationships starting at different times therebetween such as shown with ensonifying signals 350-352 (FIG. 3E). The first above embodiment is described herein for multiple shotpoint ensonification with reference to FIG. 3D. The second above embodiment is described herein for reduction or elimination of a listening period. The third above embodiment will now be described in detail for compositing of different trace signal channels multiplexed together and overlapping therebetween to minimize the number of sequential signals required for compositing.

The conceptual basis associated with mutliplexing a plurality of different signature trace signals having different time-phase relationships therebetween will now be discussed. The operation of compositing provides enhancement of signal-to-noise ratio as is well known in the prior art. In order to provide this signal-to-noise ratio enhancement, a plurality of trace signals having statistically independent random noise is desired for compositing operations. For examples, compositing of a first trace signal sample from each of three trace signals theretogether reduces noise if noise signal components in each of the three corresponding trace signal samples is different therebetween and preferably is statistically independent therebetween. In such a compositing operation the statistically independent nature of the random noise signal components will be reduced by being summed together. For example, the first sample of a first trace signal may have a large positive component of noise and the first sample of a second trace signal may have a large negative component of noise, wherein summation of the large positive noise component and the large negative noise component may yield a small noise component; thereby reducing instantaneous noise components and enhancing the signal-to-noise ratio. For a plurality of ensonifying signals starting at the same time, corresponding samples of each of the trace signals may have the same noise components. Compositing of such different trace signals having the same noise components in corresponding samples may not provide the above mentioned improvement in signal-to-noise ratio because the noise components summed theretogether are not statistically independent but may have the same noise amplitudes, where compositing of the same noise components may enhance the noise components along with the signal components. Alternately, if two ensonifying signals are generated having different time-phase relationships therebetween, corresponding trace signal samples may have different noise components and the noise components would be reduced by compositing. For example, if the two ensonifying signals 336 and 337 (FIG. 3D) had a phase shift therebetween, then corresponding signal samples would have different time-phase relationships therebetween and would have different noise components superimposed on corresponding signal samples; thereby providing for reduction of noise components through compositing.

In another example, it will be assumed that up-chirp signal 336 is initiated before down-chirp signal 337, wherein down-chirp signal 337 will be initiated after the first 100-sample intervals of up-chirp signal 336. For this example, sample-101 of up-chirp signal 336 would occur at a time corresponding to the time of sample-1 of down chirp signal 337, sample-102 of up-chirp signal 336 would occur at a time corresponding to the time of sample-2 of down-chirp signal 337, etc. Therefore, sample-1 of down chirp signal 337 may have the same noise components as sample 101 of up-chirp signal 336 because they both occur at the same time and sample-1 of down-chirp signal 337 may have different noise components than sample-1 of up-chirp signal 336 because both, sample-1 of up-chirp signal 336 and sample-1 of down-chirp signal 337, occur at different times having 100-sample time intervals therebetween. For the compositor arrangement of the present invention, sample-1 of down-chirp signal 337 may be composited with sample-1 of up-chirp signal 336 for compositing of corresponding samples, but the noise component of sample-1 of down-chirp signal 337 may be different than the noise component of sample-1 of up-chirp signal 336 because of the 100-sample intervals therebetween. Therefore, compositing of corresponding samples between up-chirp signal 336 and down-chirp signal 337 may provide for noise component reduction; wherein different noise components are contained in corresponding signal samples having different time-phase relationships therebetween and wherein such different noise components may have a statistically independent relationship therebetween and may provide noise reduction through compositing therebetween. Therefore, compositing of corresponding samples between up-chirp signal 336 and down-chirp signal 337 may provide for noise component reduction; wherein different noise components are contained in corresponding signal samples having different time-phase relationships therebetween and wherein such different noise components may have a statistically independent relationship therebetween and may provide noise reduction through compositing therebetween.

A preferred time-phase relationship for overlapping ensonifying signals will now be discussed. As discussed above, it is desired to provide a time-phase relationship between overlapping signals to permit different noise components to be introduced therebetween. Therefore, it is desired to have a time-phase relationship between overlapping ensonifying signals related to the period of the primary noise component. Assuming that the primary noise component has a frequency range from 10-Hz through 50-Hz, it may be desired to provide a phase relationship between channels greater than the period of the 50-Hz noise component. For example, it may be desired to have a 100-millisecond phase relationship between overlapping signals which is longer than the 20-millisecond period associated with 50-Hz noise frequency components. For the above example having 100-samples of phase shift between overlapping signals, a 1-millisecond sample period for a phase shift of 100-samples provides 100-milliseconds of phase shift which is greater than the 20-millisecond period of the primary lowest frequency noise component.

The instant features of the present invention will now be described with reference to FIG. 3E. Three chirp signals having different signatures are shown as signals 350–352 having phase shifts therebetween. Phase shifted signal signatures 350–352 may be multiplexed together as multiplexed signal 353 for ensonifying a subsurface environment. Multiplexed signal 354 may be received by a geophone array as related to ensonifying signal 353 being reflected from each of three subsurface reflectors and having noise pulse 368 superimposed thereon. Trace signal 354 may be a complex signal having three reflections of ensonifying signal 353 multiplexed together as reflected from three subsurface reflectors, wherein a detailed vertical line notation is not shown for signal 354 for simplicity where the three reflections of ensonifying signal 353 multiplexed together in different time-phase relationships results in a densely cluttered schematic notation. Correlation of received trace signal 354 with a three channel correlator may be provided for correlating input trace signal 354 with each of the three ensonifying signals 350–352 to generate three output signals 355–357 each having three peaks related to the three subsurface reflectors and each having a noise pulse occurring at the same time as received noise pulse 368. Phase shifting of signals 355–357 for compositing corresponding samples is shown with signals 358–360 and compositing of signal 358–360 is shown with composited signal 361.

A detailed description of FIG. 3E will now be provided. Three signature signals 350–352 are generated having different signatures and different time-phase relationships therebetween. For example, signal 350 may be an up-chirp signal, signal 351 may be a down-chirp signal, and signal 352 may be a down-up-chirp signal, wherein signals 350–352 provide poor correlation therebetween and therefore may be separated through correlation. Signals 350–352 may be used to ensonify the subsurface environment. In one embodiment, signals 350–352 may be electrically multiplexed together to form signal 353 as discussed for the multiple chirp summing arrangement with reference to FIG. 7 herein, wherein multiplexed signal 353 may be use to excite a VIBROSEIS generator for ensonifying the subsurface environment. Alternately, each of signals 350–352 may be used to excite a different one of three VIBROSEIS generators for ensonifying the subsurface environment, wherein signals 350–352 may be multiplexed together in an implicit form as the independently generated signals 350–352 propagate through the subsurface environment. Ensonifying signal 353 is assumed to be reflected from each of three subsurface structures, wherein the three reflections of multiplexed signal 353 are superimposed theretogether to form trace signal 354. Trace signal 354 is shown having noise peak 368 impressed thereon as illustrating a concept of the instant feature of the present invention. Trace signal 354 may be received with a geophone array for subsequent processing with a multiple channel correlator. A first correlator channel may correlate trace signal 354 with up-chirp signal 350 to generate correlation output signal 355 having three correlation peaks 370–372 related to the three subsurface reflectors and having noise pulse 373 impressed thereon. Similarly, a second correlator channel may correlate trace signal 354 with down-chirp signal 351 to generate correlation output signal 356 having three correlation peaks 380–382 related to the three subsurface reflectors and having noise pulse 383 impressed thereon. Similarly, a third correlator channel may correlate trace signal 354 with down-up-chirp signal 352 to generate correlation output signal 357 having three correlation peaks 390–392 related to the three subsurface reflectors and having noise pulse 393 impressed thereon. Correlation output signals 355–357 have corresponding correlation peaks; wherein correlation peaks 370, 380, and 390 from output signals 355–357 respectively are related to a first subsurface reflector; correlation peaks 371, 381, and 391 from output signals 355–357 respectively are related to a second subsurface reflector; and correlation peaks 372, 382, and 392 from output signals 355–357 are related to a third subsurface reflector. Similarly, noise pulses 373, 383, and 393 are related to noise pulse 368 impressed upon trace signal 354. Noise pulse 368 introduced into trace signal 354 is shown schematically as a sharp noise pulse for simplicity of illustration of the instant inventive feature. Similarly, noise pulse 368 is projected vertically downward onto correlated output signals 355–357 as noise pulses 373, 383, and 393 respectively as a schematic notation of illustrating phase and time relationships; wherein noise pulse 368 may be reduced in amplitude and spread in time by the process of correlation and wherein noise pulses 373, 383, and 393 shown in signals 355–357 respectively and 358–360 respectively are shown in schematic pulse form for simplicity of illustrating the instant inventive feature.

Correlation output signals 355–357 have similar correlation output peaks representing reflections from the same subsurface environment, but signals 355–357 have two important differences therebetween. First, correlation output signals 355–357 show different time-phase relationships between corresponding correlation peaks because of the different time-phase relationships of ensonifying signals 350–352. Second, noise pulse 368 of trace signal 354 is shown at the same time for each of signals 355–357 and therefore having different phase relationships between the phase shifted peaks of signals 355, 356, and 357. The phase shifting is related to down-chirp signal 351 initiated after a T1 time delay from the start of up-chirp signal 350 and down-up-chirp signal 352 initiated after a T2 time delay from the start of down-chirp signal 351. Therefore, output signal peaks 370–372 related to up-chirp signal 350 has a phase lead of period T1 relative to output signal peaks 380–382 related to down-chirp signal 351 and output signal peaks 380–382 related to down-chirp signal 3511 has a further phase lead of period T2 relative to output signal peaks 390–392 related to down-up-chirp signal 352. Therefore, correlation peaks of signals 355–357 are phase shifted in relation to the phase shifts between ensonifying signals 350–352 respectively. Noise pulse 368 impressed upon trace signal 354 at a particular time is therefore impressed upon correlated output signals 355–357 at a related time independent of the degree of phase shifting of the signal peak. Therefore, noise pulse 368 is shown schematically on output signals 355–357 occurring at the same time as shown schematically on trace signal 354. Because peaks of signals 355–357 have different phase relationships therebetween, noise pulses 373, 383, and 393 occurring at the same time have different phase relationships with the correlation peaks of signals 355–357 respectively. This can be seen by noise pulse 373 occurring inbetween peaks 371 and 372 but being very close to peak 372 in signal 355, noise pulse 383 occurring inbetween peaks 381 and 382 but being very close to peak 381 in signal 356, and noise pulse 393 occurring about midway inbetween peaks 390 and 391 in signal 357.

Compositing of signals 355–357 together may be implemented by compositing corresponding signal samples together. For example, the first sample related to up-chirp signal 355 may occur at the start of signal 350, the first sample related to down-chirp signal 351 may occur at the start of signal 351 after a time delay T1 from the first sample of signal 350, and the first sample related to down-up-chirp signal 352 may occur at the start of signal 352 after a time delay T2 from the first sample of signal 351. Compositing of all first samples of output signals 355–357 may be shown schematically by shifting output signals 356 and 357 to line up with corresponding samples of output signal 355; wherein output signals 358–360 correspond to output signals 355–357 respectively except that signals 356 and 357 have been phase shifted by a T1 time delay and a T1+T2 time delay respectively to cause corresponding output samples of signals 355–357 to line up as shown for output signals 358–360. Lining up of output samples in signals 358–360 cause related output signal peaks to line up because corresponding output signal peaks are related to the same subsurface reflectors and therefore have the same propagation times and the same phase relationships therebetween. Noise signal pulses 373, 383, and 393 are shown having different phase relationships in each of signals 358–360 respectively wherein lining up of corresponding output signal samples having different time relationships causes noise signal samples having the same time relationship to occur at different phases as shown in signals 358–360. Compositing of signals 358–360 may be provided by adding corresponding output signal samples together, wherein signals 358–360 have been phase shifted to vertically line up corresponding signal samples; where vertically lined up samples may be vertically summed to provide composited signal 361. Composited signal 361 is shown normalized to the peak signal amplitudes. For example, first correlation peak 362 of signal 361 may be formed by summing together corresponding samples of correlation peaks 370, 380, and 390, thereby providing a triple amplitude peak 362 while summing of first noise pulse 393 provides only a ⅓ amplitude composited noise signal component 365 because noise component 393 only occurs in one of the three samples composited together from signals 358–360. Similarly, correlation peaks 371, 381 and 391 are composited to provide triple amplitude correlation peak 363; correlation peaks 372, 382 and 392 are composited to provide triple amplitude correlation peak 364; noise pulse 383 is composited to provide single amplitude noise pulse 366; and noise pulse 373 is composited to provide single amplitude noise pulse 367. Therefore, amplitudes of correlation peaks 362–364 may be enhanced and nose pulses 365–367 may be reduced in relative amplitude through correlation.

In an alternate arrangement, trace signal 354 may be correlated with each of pilot signals 350–352 through different correlator channels wherein pilot signals 350–352 may be time delayed or phase shifted by time delays T1 and T2 shown in FIG. 6E for signals 350–352. Correlating with pilot signals 350–352 being time delayed therebetween may directly generate output signals 358–360 thereby automatically compensating for phase shifts T1 and T2 shown for correlation output signals 355–357. Phase shifting to lineup corresponding signal samples may be implicit in the phase relationships between stored pilot signals, wherein phase relationships of pilot signals may be defined with well known prior art techniques and may be stored in pilot signal memory devices such as P-RAM 625 (FIGS. 6D and 6E) in phase shifted form.

The improvement of the instant feature of the present invention will now be discussed with reference to prior art systems to exemplify the advantage of the instant feature. Prior art systems provide for generating a sequence of chirp signals, wherein each of the sequence of chirp signals has the same chirp signature and wherein a listening period is provided inbetween the plurality of ensonifying chirp signals. The reflections for each of the chirp signals are received in sequence and composited together in sequence. After a plurality of trace signals have been sequentially composited together, the composited signals may be corrolated before recording. This is substantially different from the instant feature of the present invention which provides for simultaneously (not sequentially ensonifying of the subsurface environment with a plurality of overlapping signature signals, separation of the signature signals with a multi-channel correlator (not single channel correlation wherein each channel is operating in response to a different signature pilot signal, and compositing the plurality of correlated signals after correlation (not before correlation) substantially simultaneously (not sequentially). This feature of the present invention provides significant improvements including improved productivity by simultaneously generating a plurality of signals for compositing and by compositing correlation output signals having different sidelobe components related to different pilot signals and therefore improving precision of the output signal.

The instant feature of the present invention will now be discussed with reference to FIG. D. A plurality of VIBROSEIS generators 108 including a first VIBROSEIS generator 128A generating a first signature signal 129A and a second VIBROSEIS generator 128B generating a second signature signal 129B may be used to simultaneously ensonify the subsurface environment. Array 110 receives reflections from subsurface structures related to first and second ensonifying signals 129A and 129B for generating array signals 111. Signal processor 112 may process array signals 111 to generate trace signal 113 for correlation with correlator 116. Correlator 116 may be a multiple channel correlator and may include a first correlator channel 116A for correlating trace signal 113 with a first signature pilot signal 122A for generating correlation output signal 117A and a second correlator channel 116B for correlating trace signal 113 with a second signature pilot signal 122B for generating correlation output signal 117B. If the first pilot signal 122A has a signature related to the signature of the ensonifying signal 128A, then the first correlation output signal 117A will be related to reflections of the first ensonifying signal 129A. Similarly, if the second pilot signal 122B has a signature related to the signature of the second ensonifying signal 129B, then the second correlation output signal 117B will be related to reflections of second ensonifying signal 129B. Correlated output signals 117A and 117B may be composited theretogether with compositor 121 for generating composited output signal 117 to output device 118. In a preferred embodiment, ensonifying signal 129A may be phase shifted relative to ensonifying signal 129B as described above with reference to FIG. 3E and therefore correlation output signal 117A may be phase shifted relative to correlation output signal 117B.

The instant feature of the present invention will now be described with reference to FIG. 5A. FIG. 5A has been described above for a multi-channel correlation embodiment providing correlation and compositing capability. For the instant feature of the present invention, the trace signal may be the same trace signal for all channels, wherein the trace signal channel designator N may be the same for all channels and therefore the trace signal sample designation $T_{LN}$ may be simplified to trace signal sample designation $T_L$. Similarly, all correlation output signals may be composited theretogether into a single correlation output signal, wherein the output signal designator N may be the same for all channels and therefore output signal sample designation $Z_{KN}$ may be simplified to output signal sample designation $Z_K$. In the computation shown for operation 517, the same trace signal sample $T_L$ may be multiplied by the pilot signal samples $P_{JN}$ for each of a plurality of channels to update the same output signal sample $Z_K$ for each channel. In this embodiment, the pilot signal samples $P_{JN}$ may be phase shifted therebetween as shown for pilot signals 350–352 (FIG. 3E). Alternately, the updates related to pilot signal samples having the same J-subscript for the same trace signal sample may be composited into different output signal samples of the same output signal to provide for the phase shift relationship therebetween.

A multiple channel correlator is shown in FIG. 6D, wherein a first correlator channel is provided for processing first trace signal sample $T_{LO}$ and a last correlation channel is provided for processing last trace signal $T_{LN}$. Each correlator channel may correlate and composite output signals related to different pilot signals $P_{JO}$–$P_{JN}$ in separate Z-RAM circuits. Alternately, Z-counter 613 and Z-RAM 614 may be common to all channels, wherein each product signal from gate 627 may be used to update the related output signal sample in Z-counter 613 in sequence as described for a multiple channel correlation and compositing embodiment above.

A hardware embodiment of the instant feature of the present invention will now be discussed with reference to FIG. 7D. Generation of different signature signals having different phase relationships may be provided with the arrangement shown in FIG. 7D. A squarewave signal 714 may be used to control generation of overlapping signature signals wherein the positive transition of squarewave signal 714 may clock counter 753 and the negative transition of seuarewave signal 714 may be inverted with inverter 752 to clock counter 754. Output signals from counter 753 may be decoded with decoder 755 and output signals from counter 754 may be decoded with decoder 756 to be distributed between a first set of chirp generators including generator 757 and a second plurality of chirp generators including generator 758 respectively. Chirp output signals 763 and 773 from chirp generators 757–758 may be multiplexed together with amplifier 759 for exciting a VIBROSEIS signal generator with signals 722 and 742. If the chirp generators including chirp generator 757 that are responsive to decoder 755 are up-chirp generators and if the chirp generators including chirp generator 758 that are responsive to decoder 756 are down-chirp generators, then the up-chirp signal will be generated in response to a positive transition of signal 714 and a down-chirp signal will be generated in response to a negative transition of signal 714. Because positive transitions and negative transitions of signal 714 occur at different times, up-chirp signal generators responsive to positive transitions and down-chirp signal generators responsive to negative transitions will generate up-chirp signals starting at different times than down-chirp signals being multiplexed together. Therefore, a plurality of signature signals may be generated having phase shifts therebetween for multiplexing theretogether to simultaneously ensonify a subsurface environment with phase shifted overlapping signature signals.

CORRELATION OUTPUT ON-THE-FLY

For simplicity of discussion, correlator embodiments discussed above have shown all of the output signal samples related to correlation of a trace signal stored in the output memory such as Z-RAM 613 until all compositing and correlation operations have been completed. The required amount of output signal sample memory for such examples is related to the difference in the number of trace signal samples and the number of pilot signal samples as defined by equation (2) above. In accordance with an output on-the-fly feature of the present invention, output memory requirements may be reduced by outputting output signal samples on-the-fly as they become fully updated rather than storing them until all output signal samples become fully updated. In accordance with the output on-the-fly feature of the present invention, output memory requirements may be further reduced by eliminating the requirement to store output signal samples that have not been updated for a first time. Further, in accordance with the output on-the-fly feature of the present invention, time to output correlated signal samples may be reduced by outputting correlated signal samples simultaneously with acquisition and correlation of trace signal samples. This output on-the-fly feature of the present invention permits correlation of substantially continuous trace signals of extreme length but requiring a relatively small output signal memory wherein the output signal memory requirement may be define by (1) the number of pilot signal samples or (2) the difference in the number of trace signal samples and the number of pilot signal samples as set forth in equation (2) above; whichever of items (1) and (2) above is less. For trace signals that are significantly longer than pilot signals, item (1) above is less. For trace signals that are only slightly longer than pilot signals, item (2) above is less. Examples may be provided wherein the trace signal is significantly longer than the pilot signal and therefore it may be assumed herein that the output memory requirement is equal to the number of pilot signal samples for simplicity of discussion. The "on-the-fly" output arrangement may be used for minimizing output signal sample memory requirements particularly when correlating extremely long continuous trace signals. An arrangement has been described herein for correlating on-the-fly without buffering trace signal samples at the correlator input. Particular advantages are achieved with the feature for correlating on-the-fly without buffering trace signal samples in combination with the feature for outputting on-the-fly without buffering all output signal samples in accordance with the instant feature of the present invention.

Continuous correlation of input trace signals may be provided with an output signal sample memory that is significantly smaller than indicated by equation (2) above. This arrangement will now be discussed with reference to Table III. As discussed above, when each trace signal sample is acquired with time progressing toward the right-hand part of Table III, a plurality of pilot signal samples for a related trace signal sample column are compared with each acquired trace signal sample and each pilot signal sample and trace signal sample comparison is used to update a group of output signal samples that is less than the total of all output signal samples. For example, acquisition of trace signal sample 2, provides for updating the $Z_0$–$Z_3$ output signal samples with pilot signal samples $P_3$–$P_0$ respectively. Similarly, acquisition of trace signal sample $T_4$ provides for updating of output signal samples $Z_1$–$Z_4$. Similarly, as the acquired trace signal samples progress towards the right-hand portion of Table III, the pilot signal samples progress vertically downward in Table III indicative of updating of groups of output signal samples having increased subscript designators and therefore having increased time-phase considerations. As acquisition of trace signal samples progresses from trace signal sample $T_3$ to trace signal sample $T_4$, output signal sample $Z_0$ being fully updated with trace signal sample $T_3$ is not updated with trace signal sample $T_4$ but output signal samples $Z_1$–$Z_3$ are not fully updated with trace signal sample $T_3$ and therefore must be updated with trace signal sample $T_4$. Therefore, as acquisition of trace signal samples progresses toward the right-hand portion of Table III, earlier time related output signal samples having lower magnitude subscripts become fully updated. Therefore, output signal samples that are fully updated need not be stored in the output signal sample memory and may be output to external devices for processing such as to a magnetic tape recorder for recording. Similarly, as acquisition of trace signal samples progresses to the right-hand portion of Table III, subsequent output signal samples having greater time relations such as output signal samples having greater subscript magnitudes may not be updated for earlier trace signal samples but may be updated for later trace signal samples. For example, output signal sample $Z_9$ may not be updated until trace signal sample $T_9$ is acquired and therefore an output signal storage location need not be preserved for output signal samples $Z_9$ until the acquisition of a related trace signal sample which is trace signal sample $T_9$.

In view of the above, only a limited set of output signal samples need be updated for each acquired trace signal sample wherein the set of output signal samples that are updated in response to each acquired trace signal sample may not exceed the number of pilot signal samples. For the example shown in Table III, the maximum number of pilot signal samples is $P_0$–$P_3$ and therefore a maximum number of four output signal samples $Z_K$ are updated in response to a particular trace signal sample $T_L$. Therefore, there may be no need to store a greater number of output signal samples in the output signal memory than the number of pilot signal samples. In general, a pilot signal has a limited number of samples such as the four pilot samples for the example shown in Table III or the 24,000 pilot signal samples for a geophysical example described herein. Further, a trace signal may have a very large number of samples and may approach an unlimited number of samples such as for a trace signal being continually acquired and correlated without interruption or discontinuities. For such a pilot signal having a limited number of pilot signal samples and such a trace signal having an unlimited number of trace signal samples, equation (2) indicates a very large number of output signal samples related to the difference between the number of trace signal samples and the number of pilot signal samples. If only a limited quantity of output signal samples are updated in response to each acquired trace signal sample and if processing of output signal samples is sequential; then a limited group of output signal samples may be updated as each trace signal sample is acquired. Fully updated output signal samples may not be preserved in output signal memory but may be output from the system as being fully updated wherein output signal samples that are not as yet updated at least one time need not be stored in the output signal memory. Therefore, an output signal memory having a number of samples related to the number of pilot signal samples may be used in conjunction with a very long trace signal which may be a continuous trace signal without practical limit nor duration. In this embodiment, a well known first-in-first-out FIFO memory may be used wherein fully updated output signal samples are output to external systems and not preserved in storage and wherein new output signal samples to be updated are entered into the memory taking positions vacated by outputting of the fully updated output signal samples.

Operation of a FIFO type memory arrangement can be understood with reference to Table III. The row shown as row $M_Z$ defines a preferred memory location for output signal samples. Memory locations $M_0$–$M_3$ comprise four memory locations related to the four pilot signal samples of the example shown in Table III. As trace signal samples $T_0$–$T_3$ are acquired in sequence, pilot signal samples $P_0$–$P_3$ are used to update output signal samples $Z_0$–$Z_3$ stored in memory locations $M_0$–$M_3$. After completion of processing in response to trace signal sample $T_3$, output signal sample $Z_0$ has been completely updated and may be output to external equipment leaving memory location $M_0$ available. As trace signal sample $T_4$ is acquired, pilot signal samples $P_0$–$P_3$ are used to update output signal samples $Z_4$–$Z_1$ respectively. All four memory locations $M_0$–$M_3$ have been committed to output signal samples $Z_0$–$Z_3$ respectively, thereby not providing a memory location for output signal sample $Z_4$ which is being newly updated in response to trace signal sample $T_4$. Because output signal sample $Z_0$ stored in memory location $M_0$ has already been completely updated and therefore output to external equipment, memory location $M_0$ is not needed to store output signal sample $Z_0$ and therefore is available to store newly updated output signal sample $Z_4$ as shown with memory location $M_0$ being directly below output signal sample $Z_4$ (Table III). Similarly, as trace signal samples $T_5$–$T_7$ are acquired in sequence, output signal samples $Z_1$–$Z_3$ in sequence become fully updated in response to the sequence of trace signal samples $T_5$–$T_7$ and therefore may be output to external equipment. Similarly, new output signal samples $Z_4$–$Z_7$ start to become updated in sequence related to the acquisition of trace signal samples $T_4$–$T_7$ and therefore require memory storage locations. Therefore, as output signal samples $Z_0$–$Z_3$ become fully updated, new output signal samples $Z_4Z_7$ respectively become newly updated and require memory storage locations, wherein output signal samples $Z_0$–$Z_3$ being fully updated and being output makes available memory locations $M_0$–$M_3$ respectively in sequence for storage of new output signal samples $Z_4$–$Z_7$ respectively in sequence and output signal samples $Z_4$–$Z_7$ may be stored in memory locations $M_0$–$M_3$ respectively as these memory locations become available. Similarly, as other stored output signal samples become fully updated and are output, other newly updated signal samples requiring memory locations may be assigned memory locations vacated by completely updated signal samples that have been output to external equipment.

In view of the above, an output signal memory may have a storage capacity less than would be required for the number of output signal samples defined by equation (2) above, wherein output signal samples that have been completely updated need not be stored in output signal memory and output signal samples that are not as yet being updated need not be stored in output signal memory; wherein the required number of output signal samples to be stored for updating may be related to the number of pilot signal samples. This embodiment of the present invention is particularly useful when the number of trace signal samples significantly exceeds the number of pilot signal samples. Further, the instant feature of the present invention permits a virtually unlimited length trace signal to be processed with a limited length pilot signal without incurring the virtually limitless output signal memory requirement implied by equation (2) for an extremely long trace signal and a limited length pilot signal.

The instant feature of the present invention is particularly useful for extremely long trace signals. For example, the feature of the present invention related to the elimination of the listening period gap between trace signals provides a substantially continuous and potentially extremely long trace signal, wherein the instant feature of the present invention is particularly useful for this storing feature in combination with the feature of the present invention related to the elimination of a listening period. As another example, in a passive surveillance sonar application, a correlator may compare a relatively short pilot signal with a very long trace signal being required for long periods of time to detect acoustic signals generated by marine vehicles. In still another embodiment, a correlator may monitor a vibration sensor such as on a piece of machinery or an aircraft engine for detection of a particular vibration signature, wherein the vibration signal may be continuously generated for extremely long periods of time such as for hours of time and wherein the pilot signal may have a limited duration such as for only seconds of time having three-orders-of-magnitude (factor-of-1,000) difference in duration between the pilot signal and the trace signal. In still another example, a signature memory arrangement may provide continuous signature signals such as with a long magnetic tape for correlation with a relatively short pilot signal to generate output digital information.

A correlation output signal memory may be used to implement the continuous correlation feature of the present invention with well known memories and control arrangements. Such well known arrangements include a shift register arrangement and a random access memory arrangement which will now be discussed below.

In a shift register arrangement, a shift register may be implemented to store a plurality of correlation output words and may be arranged for processing through a plurality of output signal samples by outputting fully updated output signal samples at the "front-end" of the memory and entering newly updated output signal samples at the "rear-end" of the memory. This embodiment can be illustrated with reference to Table III, where a four-word output memory $M_0$–$M_3$ may be utilized to process through 13-output signal samples $Z_0$–$Z_{12}$. The four shift register words $M_0$–$M_3$ may be recirculated for updating with a related pilot signals sample in sequence and the newly acquired trace signal sample $T_L$. For each recirculation, it may be desired to "dropoff" the oldest stored output signal sample and to add a newly updated output signal sample at the latest memory location. Therefore, for the update recirculation related to trace signal sample $T_3$, the contents of the least significant memory location $M_0$ may be output to external devices, the least significant memory location $M_0$ may be cleared, and the shift register may be recirculated one word time to place the newly available memory location $M_0$ following the previous last memory location $M_3$. Subsequent updating of output signal samples $Z_1$–$Z_4$ may now be provided in response to trace signal sample $T_4$, wherein the output signal sample $Z_4$ newly added for updating may be stored in the previously cleared memory location $M_0$. Another iteration of four updates for memory locations $M_1$, $M_2$, $M_3$ and $M_0$ in response to pilot signal samples $P_3$–$P_0$ respectively may be performed to update output signal samples $Z_1$–$Z_4$ respectively. Similarly, at the end of each recirculation of the output signal shift register, the oldest output signal sample related to a fully updated output signal sample is output to external equipment, the related memory location may be cleared for use with the newest output signal sample to be updated, and the shift register memory may be recirculated by one word time to put it in the proper sequence for updating. A control circuit for the shift register embodiment may sequence through a number of update counts for enabling clock pulses to the shift register, which would be four clock pulses for the example shown in Table III having four memory words $M_0$–$M_3$, then would generate a control signal for enabling an extra clock pulse to recirculate and clear the oldest output signal sample and further to output the oldest output signal sample to make the related output memory location available as the newest memory location. These continuous multi-clock updating and single clock clearing and recirculating operations may be repeated in repetitive sequence as memory locations $M_0$–$M_3$ precess along output signal samples $Z_0$–$Z_{12}$.

In a random access memory embodiment such as discussed with reference to FIG. 6, random access memory Z-store 614 may operate under control of control logic 615 which may be counter control logic discussed with reference to FIGS. 6B and 6D above or may be ROM control logic discussed with reference to FIG. 6C above. For the ROM control logic arrangement discussed with reference to FIG. 6C above, a processing sequence of Z-store memory addresses may be stored in control ROM 641.

The output on-the-fly feature of the present invention will now be described with reference to FIGS. 6C and 6D. FIG. 6C provides a ROM control arrangement for use in conjunction with the correlation channel arrangement shown in FIG. 6D. FIG. 6D is shown implemented with a counter control arrangement shown in FIG. 6B, wherein the ROM control arrangement shown in FIG. 6C may be used interchangeably therewith and wherein the ROM control arrangement shown in FIG. 6C may be used in place of the counter control arrangement shown in FIG. 6D.

ROM control 615 has been discussed above with reference to FIG. 6C for a preferred embodiment of the present invention. An alternate embodiment will now be discussed to exemplify the instant feature of the present invention related to reduction of output signal memory 614. An input sync signal OR may be used to clear C-counter 616 and A-counter 640 to initiate correlation and/or compositing operations under control of ROM 641. C-counter 616 may continue to count through a sequence of control signals $\overline{C0}$–$\overline{CN}$ for controlling correlator and compositor operations as discussed above with reference to FIGS. 6B and 6D. One of the control signals from C-counter 616 may be used to clock A-counter 640 such as control signal $\overline{C3}$. A-counter 640 may increment through a sequence of ROM addresses for accessing ROM 641 to generate a sequence of control signals and output correlator addresses. Output signals form ROM 641 described with reference to FIG. 6C above include the J-address, the K-address, disable signal D, and the end of correlation signal G. For convenience of implementation of the instant feature of the present invention, two additional control signals T and $\overline{CLR}$ may be provided by expanding ROM 641 to having two additional bits for these control signals. A-counter 640 may sequence through a set of control signals and addresses being stored in ROM 641 for controlling operation of the correlator, wherein the sequence of control signals and addresses will be discussed in detail with reference to Table XII hereinafter.

The instant feature of the present invention will be exemplified with Table XII to illustrate the sequence of operations for controlling a correlator with an output-on-the-fly arrangement. The example set forth in Table XII is based upon a 16-sample trace signal, a 4-sample pilot signal, and a 13-sample output signal such as shown in Table III above. Further, the example discussed with reference to Table XII hereinafter may be better understood by cross-referencing to Table III and FIGS. 6C and 6D.

Column-A of Table XII represents a sequence of ROM addresses generated by clocking of A-counter 640 with control signal $\overline{C3}$ to sequence through a plurality of states of ROM 641. For the example shown in Table III, a set of 69 A-counter address may be used for accessing ROM addresses 0–68. In the following discussion of Table XII, the addresses listed in sequence on column-A will be used to identify control and address words from ROM 641 being in the same row with the accessing address.

TABLE XII

| A | L | J | K | M | D | T | $\overline{CLR}$ | J-ADD Jm | J-ADD Jo | K-ADD Km | K-ADD Ko | 0 |
|---|---|---|---|---|---|---|---|---|---|---|---|---|
| 0 | — | — | — | 0 | 0 | 0 | 0 | — | — | 0 | 0 | 0 |
| 1 | — | — | — | 1 | 0 | 0 | 0 | — | — | 0 | 1 | 0 |
| 2 | — | — | — | 2 | 0 | 0 | 0 | — | — | 1 | 0 | 0 |
| 3 | — | — | — | 3 | 0 | 0 | 0 | — | — | 1 | 1 | 0 |
| 4 | 0 | 0 | 0 | 0 | 1 | 0 | 1 | 0 | 0 | 0 | 0 | 0 |
| 5 | 0 | — | — | 1 | 0 | 0 | 0 | — | — | 0 | 1 | 0 |
| 6 | 0 | — | — | 2 | 0 | 0 | 0 | — | — | 1 | 0 | 0 |
| 7 | 0 | — | — | 3 | 0 | 0 | 0 | — | — | 1 | 1 | 0 |
| 8 | 1 | 1 | 0 | 0 | 1 | 0 | 1 | 0 | 1 | 0 | 0 | 0 |
| 9 | 1 | 0 | 1 | 1 | 1 | 0 | 1 | 0 | 0 | 0 | 1 | 0 |
| 10 | 1 | — | — | 2 | 0 | 0 | 0 | — | — | 1 | 0 | 0 |
| 11 | 1 | — | — | 3 | 0 | 0 | 0 | — | — | 1 | 1 | 0 |
| 12 | 2 | 2 | 0 | 0 | 1 | 0 | 1 | 1 | 0 | 0 | 0 | 0 |
| 13 | 2 | 1 | 1 | 1 | 1 | 0 | 1 | 0 | 1 | 0 | 1 | 0 |
| 14 | 2 | 0 | 2 | 2 | 1 | 0 | 1 | 0 | 0 | 1 | 0 | 0 |
| 15 | 2 | — | — | 3 | 0 | 0 | 0 | — | — | 1 | 1 | 0 |
| 16 | 3 | 3 | 0 | 0 | 1 | 1 | 0 | 1 | 1 | 0 | 0 | 0 |
| 17 | 3 | 2 | 1 | 1 | 1 | 0 | 1 | 1 | 0 | 0 | 1 | 0 |
| 18 | 3 | 1 | 2 | 2 | 1 | 0 | 1 | 0 | 1 | 1 | 0 | 0 |
| 19 | 3 | 0 | 3 | 3 | 1 | 0 | 1 | 0 | 0 | 1 | 1 | 0 |
| 20 | 4 | 3 | 1 | 1 | 1 | 1 | 0 | 1 | 1 | 0 | 1 | 0 |

TABLE XII-continued

| A | L | J | K | M | D | T | $\overline{CLR}$ | J-ADD Jm | J-ADD Jo | K-ADD Km | K-ADD Ko | 0 |
|---|---|---|---|---|---|---|---|---|---|---|---|---|
| 21 | 4 | 2 | 2 | 2 | 1 | 0 | 1 | 1 | 0 | 1 | 0 | 0 |
| 22 | 4 | 1 | 3 | 3 | 1 | 0 | 1 | 0 | 1 | 1 | 1 | 0 |
| 23 | 4 | 0 | 4 | 0 | 1 | 0 | 1 | 0 | 0 | 0 | 0 | 0 |
| 24 | 5 | 3 | 2 | 2 | 1 | 1 | 0 | 1 | 1 | 1 | 0 | 0 |
| 25 | 5 | 2 | 3 | 3 | 1 | 0 | 1 | 1 | 0 | 1 | 1 | 0 |
| 26 | 5 | 1 | 4 | 0 | 1 | 0 | 1 | 0 | 1 | 0 | 0 | 0 |
| 27 | 5 | 0 | 5 | 1 | 1 | 0 | 1 | 0 | 0 | 0 | 1 | 0 |
| 28 | 6 | 3 | 3 | 3 | 1 | 1 | 0 | 1 | 1 | 1 | 1 | 0 |
| 29 | 6 | 2 | 4 | 0 | 1 | 0 | 1 | 1 | 0 | 0 | 0 | 0 |
| 30 | 6 | 1 | 5 | 1 | 1 | 0 | 1 | 0 | 1 | 0 | 1 | 0 |
| 31 | 6 | 0 | 6 | 2 | 1 | 0 | 1 | 0 | 0 | 0 | 1 | 0 |
| 32 | 7 | 3 | 4 | 0 | 1 | 1 | 0 | 1 | 1 | 0 | 0 | 0 |
| 33 | 7 | 2 | 5 | 1 | 1 | 0 | 1 | 1 | 0 | 0 | 1 | 0 |
| 34 | 7 | 1 | 6 | 2 | 1 | 0 | 1 | 0 | 1 | 1 | 0 | 0 |
| 35 | 7 | 0 | 7 | 3 | 1 | 0 | 1 | 0 | 0 | 1 | 1 | 0 |
| 36 | 8 | 3 | 5 | 1 | 1 | 1 | 0 | 1 | 1 | 0 | 1 | 0 |
| 37 | 8 | 2 | 6 | 2 | 1 | 0 | 1 | 1 | 0 | 1 | 0 | 0 |
| 38 | 8 | 1 | 7 | 3 | 1 | 0 | 1 | 0 | 1 | 1 | 1 | 0 |
| 39 | 8 | 0 | 8 | 0 | 1 | 0 | 1 | 0 | 0 | 0 | 0 | 0 |
| 40 | 9 | 3 | 6 | 2 | 1 | 1 | 0 | 1 | 1 | 1 | 0 | 0 |
| 41 | 9 | 2 | 7 | 3 | 1 | 0 | 1 | 1 | 0 | 1 | 1 | 0 |
| 42 | 9 | 1 | 8 | 0 | 1 | 0 | 1 | 0 | 1 | 0 | 0 | 0 |
| 43 | 9 | 0 | 9 | 1 | 1 | 0 | 1 | 0 | 0 | 0 | 1 | 0 |
| 44 | 10 | 3 | 7 | 3 | 1 | 1 | 0 | 1 | 1 | 1 | 1 | 0 |
| 45 | 10 | 2 | 8 | 0 | 1 | 0 | 1 | 1 | 0 | 0 | 0 | 0 |
| 46 | 10 | 1 | 9 | 1 | 1 | 0 | 1 | 0 | 1 | 0 | 1 | 0 |
| 47 | 10 | 0 | 10 | 2 | 1 | 0 | 1 | 0 | 0 | 1 | 0 | 0 |
| 48 | 11 | 3 | 8 | 0 | 1 | 1 | 0 | 1 | 1 | 0 | 0 | 0 |
| 49 | 11 | 2 | 9 | 1 | 1 | 0 | 1 | 1 | 0 | 0 | 1 | 0 |
| 50 | 11 | 1 | 10 | 2 | 1 | 0 | 1 | 0 | 1 | 1 | 0 | 0 |
| 51 | 11 | 0 | 11 | 3 | 1 | 0 | 1 | 0 | 0 | 1 | 1 | 0 |
| 52 | 12 | 3 | 9 | 1 | 1 | 1 | 0 | 1 | 1 | 0 | 1 | 0 |
| 53 | 12 | 2 | 10 | 2 | 1 | 0 | 1 | 1 | 0 | 1 | 0 | 0 |
| 54 | 12 | 1 | 11 | 3 | 1 | 0 | 1 | 0 | 1 | 1 | 1 | 0 |
| 55 | 12 | 0 | 12 | 0 | 1 | 0 | 1 | 0 | 0 | 0 | 0 | 0 |
| 56 | 13 | 3 | 10 | 2 | 1 | 1 | 0 | 1 | 1 | 1 | 0 | 0 |
| 57 | 13 | 2 | 11 | 3 | 1 | 0 | 1 | 1 | 0 | 1 | 1 | 0 |
| 58 | 13 | 1 | 12 | 0 | 1 | 0 | 1 | 0 | 1 | 0 | 0 | 0 |
| 59 | 13 | 0 | — | 1 | 0 | 0 | 0 | 0 | 0 | 0 | 1 | 0 |
| 60 | 14 | 3 | 11 | 3 | 1 | 1 | 0 | 1 | 1 | 1 | 1 | 0 |
| 61 | 14 | 2 | 12 | 0 | 1 | 0 | 1 | 1 | 0 | 0 | 0 | 0 |
| 62 | 14 | 1 | — | 1 | 0 | 0 | 0 | 0 | 1 | 0 | 1 | 0 |
| 63 | 14 | 0 | — | 2 | 0 | 0 | 0 | 0 | 0 | 1 | 0 | 0 |
| 64 | 15 | 3 | 12 | 0 | 1 | 1 | 0 | 1 | 1 | 0 | 0 | 0 |
| 65 | 15 | 1 | — | 1 | 0 | 0 | 0 | 1 | 0 | 0 | 1 | 0 |
| 66 | 15 | 1 | — | 2 | 0 | 0 | 0 | 0 | 1 | 1 | 0 | 0 |
| 67 | 15 | 0 | — | 3 | 0 | 0 | 0 | 0 | 0 | 1 | 1 | 0 |
| 68 | — | — | — | — | 0 | 0 | 0 | — | — | — | — | 1 |

Column-L of Table XII identifies the trace signal sample being processed, wherein the first trace signal sample $T_0$ is identified by the 0-terms in column-L. (A-addresses 4–7), the second trace signal sample $T_1$ is identified by the 1-terms in column-L (A-addresses 8–11), and other subsequent trace signal samples are identified by the other sequential sets of numbers through number 15 at the bottom of column-L (A-addresses 64–67) indicative of the last trace signal sample $T_{15}$. The L-parameter may not be generated explicitly by control logic 615, wherein identification of a trace signal sample may be implicit in the sequence of samples accessed in response to the processing of sequential trace signal samples. The last trace signal sample may be identified with the counter embodiments described with reference to FIG. 6D such as with the Lm signal from L-counter 618 defining the last trace signal sample. For the ROM control arrangement of FIG. 6C, signal G may be used to identify completion of processing of the last trace signal sample by disabling A-counter 640.

Column-J identifies the pilot signal sample $P_J$ to be multiplied by the trace signal sample $T_L$ identified in column-L. Transitionary states at the start of the correlation and at the completion of correlation shown in Table III as being related to trace signal sample $T_0$–$T_2$ and $T_3$–$T_{15}$ respectively are processed with a reduced number of pilot signal samples, where the excluded pilot signal samples are identified by dashes in column-J indicative of don't care functions. Inbetween the startup transition and the completion transition of correlation operations, all pilot signal samples $J_3$–$J_0$ may be used to update output signal samples $Z_K$ as shown in Table III and therefore all pilot signal samples $P_3$–$P_0$ may be used to process non-transitory trace signal samples $T_3$–$T_{12}$.

Column-K identifies output signal samples $Z_K$ to be updated with pilot signal sample $P_J$ and trace signal sample $T_L$ identified with column-J and column-L respectively of Table XII. Precession of output signal samples $Z_K$ relative to pilot signal samples $P_J$, indicative of shifting of the pilot signal along the trace signal, may be seen by comparing column-J and column-K of Table XII. For example, pilot signal sample $P_3$ is used to update output signal sample $Z_0$ for trace signal sample $T_3$ (A-address 16), pilot signal sample $P_3$ is used to update output signal sample $Z_1$ for trace signal sample $T_4$ (A-address 20), pilot signal sample $P_3$ is used to update output signal sample $Z_2$ for trace signal sample $T_5$ (A-address 24), etc.

Column-M identifies the output signal memory addresses for storing output signal samples $Z_K$. The output signal memory locations (column-M) corresponding to the output signal samples (column-K) (A-addresses 0–22) until the output signal sample memory locations are reassigned when earlier output signal samples become fully updated and are output and later output signal samples become newly updated and must be stored until fully updated. The precession of output signal memory addresses (column-M) is shown as the precession progresses for the sequence of trace signal samples $T_L$. This precession of output memory addresses is similar to the above described precession of output signal samples (column-K) except that the output memory addresses (column-M) are implemented as a modulo-3 arrangement wherein every fourth output memory address overflows or is reassigned to the least significant output memory address for storing the next sequential output signal sample.

Column-D provides a disable signal to disable updating output signal samples $Z_k$ in response to an improper pilot signal sample. The D signal is shown having a zero-state for disabling updating in response to a dash in column-J or column-K related to an update condition. Inbetween the correlation start transition and the correlation completion transition (A-addresses 16–55) for trace signal samples $T_3$–$T_{12}$, the D-signal is continuously in the one-state to enable all update operations.

Column-T represents a transfer command signal for transferring a fully updated output signal sample when transfer signal T is in the one-state, related to an output signal sample row having a fully updated output signal sample. For example, output signal sample $Z_0$ is initially updated for A-address 4, subsequently updated for A-addresses 8 and 12, and fully updated for A-address 16, wherein the one-state of transfer signal T for A-address 16 is indicative of a fully updated output signal sample $Z_0$ and provides for transfer to an output device of the fully updated $Z_0$ output signal sample. Similarly, each subsequent output signal sample being updated with pilot signal sample $P_3$ (A-addresses 20, 24, 28, etc) becomes fully updated and therefore are output when enabled by a one-state of transfer signal T. Transfer signal T may be provided to external equipment to enable transferring of fully updated output signal samples $Z_K$ contained in Z-counter 613 from the output of Z-counter 613 to the external device under control of transfer signal T.

Column-$\overline{CLR}$ provides clear signal $\overline{CLR}$ to recirculation gates 630 for initially clearing Z-RAM 614 (A-addresses 0–3) and for clearing the contents of each output memory location when the output signal sample contained therein is fully updated and is therefore transferred to external equipment as identified by a one-state signal in column-T. This clearing of fully updated signals after outputting is provided by disabling the recirculation path from Z-counter 613 to Z-RAM 614 (FIG. 6D) with clear signal $\overline{CLR}$ wherein a completely updated output signal sample in Z-counter 613 is output to external equipment in response to the one-state of transfer signal T and is cleared by disabling recirculation with the zero-state of clear signal $\overline{CLR}$. An initial clear iteration (A-addresses 0–3) may be provided to sequence through output signal memory addresses $M_0$–$M_3$ for clearing Z-RAM 614 in anticipation of a new correlation operation. Alternately, the output signal memory may be cleared during the completion transition during completion of updating or output signal samples without new output signal samples being available, indicated by the dashes in column-K for A-addresses 59, 62–63, and 65–67 for output signal samples. If output memory locations are cleared during the completion transitions, the startup iteration (A-addresses 0–3) may be unnecessary. For the embodiment shown in Table XII, clear signal $\overline{CLR}$ is in the zero-state for clearing an output memory location for all disable states shown as zero-states in column-D. Therefore, for this embodiment, the D-bit shown in column-D is redundant with the $\overline{CLR}$-bit and therefore the D-bit may be eliminated.

Column J-ADD provides the J-address codes to identify a pilot signal sample; wherein the binary J-address code in the J-ADD column corresponds to the J-address of the J-column discussed in detail above. For the embodiment of the instant example, the four pilot signal samples $P_3$–$P_0$ may be completely defined with two digital bits wherein Jm is the most-significant-bit and J0 is the least-significant-bit. The discussions for J-addresses shown in J-column are applicable to the description for the binary J-address codes in column J-ADD.

Column K-ADD provides the memory addresses used for storing the output signal samples listed in column-K and provides a binary code equivalent to the decimal code listed in column-K. Although column K-ADD has K-nomenclature for the heading, the information is related to the output memory locations listed in column-M. The four output memory locations $M_0$–$M_3$ may be defined with a two-bit binary code having Mm most-significant-bit and M0 least-significant-bit for addressing output memory locations. Precession of the output memory addresses in column K-ADD is the same as discussed for the precession of addresses in column-M above.

Column-G is use to control completion of correlation. A zero-state G-signal enables A-counter 640 to sequence through A-addresses 0–67 and a one-state G-signal locks up A-counter 640 at address 68 to terminate correlation and to await the next sync signal CR to clear A-counter 640 for again sequencing through the correlation control signals in ROM 641.

The dashes shown in Table XII are related to don't care functions wherein numbers that may be put in place of the dashes are not significant and do not affect the correlation solution. Dashes for A-addresses 0–3 are provided wherein the L-parameter, J-parameter, K-parameter are not significant for these output memory clear operations. Similarly, control signals for A-addresses 5–7, 10–11, and 15 may not be significant because these control signals are related to non-update conditions; wherein the non-update conditions permit K-addresses to be provided to equalize time between trace signal samples and wherein skipping non-update conditions such as A-addresses 5–7, 10–11, and 15 would decrease the duration of sampling intervals for trace signal samples $T_0$–$T_2$. Similarly, non-update conditions defined by A-addresses 59, 62–63, and 65–67 are provided to equalize update times. In one embodiment, updating of the last trace output signal sample (A-address 64) terminated sampling operations, wherein control signals associated with A-addresses 65–67 may be eliminated or defined by a one-state G-signal which could be provided for A-address 65 because the last output signal sample update operation has been completed in A-address 64.

The arrangement shown in FIG. 6D may operate in response to control signals from ROM control 615 shown in FIG. 6C and exemplified with Table XII. For example, the D-signal in Table XII may correspond to the D-signal from P-ROM 625 to NAND-gate 647, wherein a zero-state D-signal may disable updating operations and a one-state D-signal may enable updating operation. Clear signal $\overline{CLR}$ to recirculation gates 630 provides for clearing output memory locations in response to a zero-state $\overline{CLR}$ signal and for permitting recirculation without clearing output memory locations in response to a one-state $\overline{CLR}$ signal. J-addresses to P-ROM 625 may be the two-bit J-address shown in the J-ADD column of Table XII. K-addresses to Z-RAM 614 may be the two-bit K-address shown in the K-ADD column of Table XII. Sample flip-flop 628 may be clocked with transfer signal T shown in Table XII or may be clocked with another control signal bit stored in ROM 641 for each new trace signal sample $T_L$. Alternately, sample flip-flop 624 may be eliminated where the output of amplifier 6723 may be input directly to gate 625 as trace signal sample $T_L$ without use of sample flip-flop 624. Further, logic associated with compositing may be eliminated for the instant feature of the present invention thereby eliminating switch 650, compositor control 632, and enable gate 638. Further, one-shot 651 operating in response to the sync signal may generate an output signal to clear C-counter 616 and further to clear A-counter 640, wherein A-counter 640 may be implemented as K-counter 619 and wherein the G-signal may be connected to input G of K-counter 619 for enabling or disabling counter operations. Still further, clear switch CLR may be eliminated, wherein clear signal CLR may be derived from ROM 641 as discussed with reference to Table XII.

The example shown in Table XII illustrates precession of memory addresses with respect to output signal samples and other aspects of the instant feature of the present invention. For example, A-address 16 provides for the fourth and last update of output signal sample $Z_0$ in memory location $M_0$ with pilot signal sample $P_3$ and trace signal $T_3$; resulting in generation of a one-state transfer control signal T for transferring the fully updated output signal sample $Z_0$ to external devices and for clearing of output memory location $M_0$ with a zero-state clear signal $\overline{CLR}$. Further, the cleared output memory location $M_0$ may be subsequentially reassigned to the next output signal sample $Z_4$ (A-address 23) for starting updating of this new output signal sample $Z_4$ in memory location $M_0$. Similarly, precession of output memory locations with reference to output signal samples is shown progressing through all output signal samples in Table XII for the example set forth in Table III.

ROM control logic 615 shown in FIG. 6C will now be sized for the example set forth in Table XII. C-counter 616 may be implemented as a two-bit counter and with a two-bit, four-state decoder as shown in FIG. 6D. A-counter 640 may be implemented as a 7-bit counter connected as a pair of S/N 74190 type counter circuits which are connected for an up-count mode of operation and having a G-enable input connected to the G-output of ROM 641. The 7-bit A-counter 640 has a maximum count range from 0 through 127. A-counter 640 may be cleared to the zero-state with sync signal CR and may be clocked with control signal $\overline{C3}$ until the G-output signal from ROM 641 to the G-input of A-counter 640 is in the one-state as shown with A-address 68 (Table XII) to discontinue counting operations until again cleared with sync signal CR. The 7-address signals A from A-counter 640 may be used to address the 68-control words stored in ROM 741 for the example shown in Table XII, wherein each control word has one D-bit, one T-bit, one $\overline{CLR}$-bit, two J-ADD bits, two K-ADD bits, and one G-bit for a total of 8-bits per ROM word. The 8-bits per word times 69-words provides a total of 552-bits for the example shown in Table XII. Based upon a price of 0.1¢ per bit, ROM 641 may have a cost of approximately 55¢ to implement the example shown in Table XII. Inefficiencies may arise wherein a 69-word 8-bit ROM may not be commercially available. Therefore, a larger ROM such as a 128-word ROM may be necessary to implement the example set forth in Table XII. Regardless, the low cost of the ROM implementation is not significantly altered by this inefficiency of less than 50¢ worth of unused ROM capability.

The instant feature of the present invention is directed to continuously outputting fully correlated samples simultaneously with correlation of subsequent samples, wherein earlier output signal samples may be completely updated and output for recording while later trace signal samples are still being correlated for the same trace signal. This simultaneous correlation and output feature of the present invention yields significant advantages over prior art systems such as permitting correlation of extremely long trace signals, reducing output storage requirements, and reducing output storage time; as will be discussed briefly hereinafter.

Prior art systems have been considered that the amount of output storage is related to the difference between the number of trace signal samples and pilot signal samples as set forth in equation (2) above. Therefore, correlation of extremely long trace signals is considered by the prior art to be impractical due to the extremely large output memory requirements. For example, a sonar passive surveillance application may provide a one-second pilot signal having 1,000-samples and a 30-thousand second trace signal having 30-million samples; thereby having an output memory requirement of approximately 30-million samples for a single trace. With the instant feature of the present invention which simultaneously correlates and outputs information, the output memory requirement is related to the number of pilot signal samples and is relatively independent of the number of trace signal samples wherein the system of the present invention implementing the above example would require storage for only about one-thousand output signal samples independent of the number of samples in the trace signal. Continuous trace signals having substantially infinate length may be processed with the instant feature of the present invention wherein such infinite length trace signals are inconsistant with prior art application algorithms.

The amount of output signal memory required for a correlation computation is considered by the prior art to be related to the difference between the number of trace signal samples ($N_T$) and the number of pilot signal samples ($N_P$) as defined by equation (2) above. With the instant feature of the present invention, the amount of output signal memory is relatively independent of the length of the number of trace signal samples but is related merely to the number of pilot signal samples ($N_P$) or the number of output signal samples ($N_K$) whichever is less. For the above example having a 1,000-sample pilot signal and a 30-million sample trace signal, the output memory requirement may be only 1,000-output signal samples related to the number of pilot signal samples, providing a reduction in output memory requirements by a factor-of-30,000 over the requirements for prior art correlation algorithms operating in accordance with equation (1) above.

Reduction in output recording time provides an important advantage of the instant feature of the present invention. In one embodiment, a magnetic tape recorder may be required to record output signal samples, wherein the magnetic tape recorder may have a recording speed of 1,000-sample per second consistent with the trace signal sample acquisition rate for the above example. Prior art systems would require storage of all of the output signal samples and then recording of the output signal samples only after correlation has been completed. The instant feature of the present invention provides for recording of completely updated correlation output signal samples as they become fully updated simultaneously with the correlation of later acquired trace signal samples. Therefore, in accordance with the instant feature of the present invention; as trace signal samples are acquired and correlated at a rate of 1,000-samples per second, fully updated output signal samples may be simultaneously recorded on magnetic tape wherein the rate of fully updated output signal samples may be equal to the rate of acquired trace signal samples consistent with the instant feature of the present invention and therefore the output rate of fully updated output signal samples may be equal to the trace signal sample acquisition rate of 1,000-samples per second. Therefore, this fully updated 1,000-sample per second rate is consistent with magnetic tape recorder speeds and permits recording on-the-fly as output signal samples become fully updated to make output signal sample memory locations available for newly updated output signal samples in response to newly acquired trace signal samples. For the above example having 30-million trace signal samples and approximately 30-million output signal samples, prior art systems would acquire and store the 30-million trace signal samples requiring 30-thousand seconds, would then correlate 30-million trace signal samples which might take another 30-thousand seconds, and would then record the approximately 30-million output signal samples on a magnetic tape recorder operating at a record rate of 1,000-samples per second requiring another 30-thousand seconds for a total of 90-thousand seconds or approximately 25-hours for acquisition, correlation, and recording operations. In accordance with the correlate on-the-fly feature of the present invention, the 30-thousand seconds for correlation of trace signal samples may be performed simultaneously with the 30-thousand seconds for acquisition of the trace signal samples, wherein the prior art operation requiring a total of 90-thousand seconds may be reduced to 60-thousand seconds by simultaneously performing acquisition and correlation operations. In accordance with the instant feature of the present invention for recording on-the-fly in combination with the above discussed feature of the present invention for correlating on-the-fly; output signal samples may be recorded as they become fully updated simultaneously with trace signal samples being correlated as they become acquired; wherein acquisition, correlation, and recording operations may be performed simultaneously thereby requiring only 30-thousand seconds for this combined correlate on-the-fly and record on-the-fly feature of the present invention. Therefore, the record on-the-fly feature of the present invention may provide a 33% reduction in operating time and the record-on-the-fly feature in conjunction with the correlation on-the-fly feature of the present invention may provide a 67% improvement in operating time, wherein the 25-hour acquisition, correlation, and recording time set forth for the above example of the prior art system operation may be reduced by a factor-of-3 to about 8-hours of simultaneously performed acquisition, correlation, and recording with the correlate on-the-fly and the record on-the-fly features of the present invention.

In accordance with the record on-the-fly feature of the present invention, an improved method will now be provided for a geophysical exploration embodiment. Prior art systems must store all input trace signals for compositing-before-correlation and must store all output signals during correlation and prior to recording on magnetic tape. Prior art systems may have a relatively long pilot signal comparable in duration to the trace signal to minimize effects of the non-productive listening period. In one prior art system, a 24-second pilot signal may be used in conjunction with an 8-second listening period to generate a 32-second trace signal. In accordance with the output on-the-fly feature of the present invention, advantages may be achieved when the pilot signal is significantly shorter than the output signal or significantly shorter than the seismic range. For example, a system in accordance with the present invention may be implemented for generating a 9-second trace signal in response to a 1-second pilot signal for generating an 8-second output signal related to a seismic range of 8-seconds for a 40,000-foot range. In accordance with the above mentioned calculations related to the amount of output storage required, the output storage for outputting on-the-fly for this example may be the pilot signal or output signal duration, whichever is less; wherein the pilot signal duration is 1-second and the output signal is 8-seconds for an output memory requirement of 1-second of output signal storage. Therefore, for a record on-the-fly feature of the present invention, a short pilot signal being shorter than the seismic range duration reduces the amount of required output memory in a record on-the-fly embodiment. Further, improvements may be obtained by combining various features of the present invention wherein the listening period compensation, simultaneously ensonification from a plurality of shotpoints, and simultaneous ensonification with a plurality of overlapping ensonifying signals generated from the same shotpoint may provide even more significant improvements when used in combination theretogether. Therefore, for the above arrangement having a 1-second pilot signal and an 8-second seismic range, a plurality of sequential overlapping ensonifying signals each having a short duration may be used wherein 9-sequential 1-second signals having different signatures therebetween may be generated sequentially for providing continuous or overlapping ensonification of the subsurface environment during the seismic range duration associated with each of those sequential 1-second ensonifying signals.

CHARGE COUPLED DEVICE SIGNAL PROCESSOR (FIG. 9)

Charge coupled devices (CCDs) may be used to provide signal processing accordance with the present invention. CCDs are well known in the art, being monolithic integrated circuits having charge storage and charge transfer capability. The CCD may have one or more input terminals, one or more output terminals, and a plurality of charge transfer stages to "shift" the charge between stages. Arrangement of input stages, output stages, and transfer circuits are well known in the art. For simplicity of discussion, a CCD will be considered as a circuit having input signal lines, output signal lines, and various shiftable stages coupling input and output lines. The monolithic implementation of such a CCD is well known in the art and therefore will not be discussed herein.

CCD signal processors will be discussed with reference to FIG. 9 hereinafter in the embodiment of an acoustic imaging system. These CCD signal processor arrangements are intended to be generally applicable for many signal processing uses that will become obvious to those skilled in the art from the teachings of the present invention. For example, this CCD signal processor arrangement may be used as a demodulator, multiplexer, or sample-and-hold circuit for use in systems including data acquisition, analog signal processing, computer peripheral, telemetry, and other systems. Further, a hybrid memory embodiment may be used as an off-line computer memory, an on-line computer memory, a disc memory replacement, an analog memory for an analog or hybrid computer, an other arrangements.

CCD DEMODULATOR AND MULTIPLEXER (FIG. 9A)

In accordance with the present invention, a phase sensitive demodulator and a multiplexer arrangement will now be described with reference to FIG. 9A. To exemplify this embodiment of the present invention, it will be described relative to the channel processing arrangement for an acoustic imaging system.

An array of transducer elements 910 is provided to generate transducer signals 912 with each element 911 generating an output signal 913 in response to acoustic inputs sensed by elements 910. Signal processor 914 provide signal processing operations on signals 912, wherein these signal processing operations may include buffering, amplification, and noise filtering. Processed transducer signals 915 and 916 may each be input to one switch or a pair of switches shown as field effect transistor (FET) switches 917 and 918. One of each pair of switches may be controlled by an in-phase (0°) reference signal 930 and the other switch may be controlled by a quadrature (90°) reference signal 931. Reference generator 929 generates in-phase signal 930 and quadrature signal 931 for complex demodulation of processed signals 915 and 916 respectively. In one embodiment, reference generator 929 may have substantially the same frequency as the acoustic signals sensed by elements 910. As is well known in the art, sampling or switching an AC signal with a reference signal will provide an output signal that is related to the component of the input signal that is in-phase demodulated signals and quadrature reference signal 931 controls quadrature FETs 918 to provide quadrature demodulated signals. CCD 920 is implemented to receive and store a plurality of demodulated input signals 919 with corresponding charge storage and shift elements, where each storage element in CCD 920 sums or integrates the charge provided by each corresponding signal 919 which are switched or demodulated with FETs 917 and 918. The amount of charge that is accumulated in each CCD storage element is related to the amplitude of the input signal and the time that switches 917 and 918 are conducting. The summation of samples controlled with FETs 917 and 918 cause a charge to be stored that has a magnitude related to the phase components of the input signal 915 which is sampled in-phase with the corresponding reference signal 930 or 931. Input FETs 917 and 918 may have a charging time constant associated therewith such as with the on-resistance of the FET and the charging capacitance of the CCD. The charging time constant may be increased by connecting resistors in series with FETs 917 and 918 or by reducing turn-on excitation of FETs 917 and 918 to provide a desired charging rate. The charging time constant should be longer than the frequency of the input and reference signals to filter the demodulation switching transients.

Mode logic 921 controls system operations. A plurality of modes may be provided with control signals including demodulate and integrate mode signals 924, shift signal 922 and convert signal 923. These signals control the sequential modes of operation of the system. For example, demodulate and integrate signal 924 enables reference generator 929 to generate in-phase signal 930 and quadrature signal 931 to sample input signals 915 and 916 with switches 917 and 1918 to build-up charge in corresponding elements of CCD 920, which demodulates and filters processed signals 915 and 916. After a pre-determined period of time or quantity of integration samples, the shift and convert mode may be enabled, and the demodulate and integrate mode may be disabled; thereby causing signals 930 and 931 to turn off or "open" switches 917 and 918 to prevent further charge accumulation in CCD 920. Mode logic 921 may then generate clock pulses 922 to shift the stored charge through CCD 920 to output signal line 925. Analog-to-digital converter (ADC) 926 may be controlled with convert signal 923 to convert analog output signal 925 to digital form as digital signals 927. Clock signal 922 and convert signal 923 may be interleaved so that each analog signal 925 that is shifted out of CCD 920 will be converted with ADC 926 to provide sequential digital output signals 927. Therefore, the plurality of demodulated and integrated signals may be stored in CCD 920 and may be sequentially or serially shifted out of CCD 920 as analog output signals 925 and may be converted to sequential digital signals 927 with ADC 926. This arrangement provides a parallel-to-serial signal converter, which is known in the art as a multiplexer.

Mode logic 921 may be a well known counter and decoder arrangement such as a Texas Instruments counter S/N 7490 and decoder 7442. Gating of clock signals and generation of quadrature signals is discussed in related patent applications which are incorporated herein by reference.

The arrangement described with reference to FIG. 9A further exemplifies a CCD arrangement for summing analog signals. Input signals 919 excite related CCD elements when switches 917 and 918 are conducting, where the CCD elements effectively add new charge that is related to the amplitude of input signal 919 to the charge previously stored in the corresponding CCD element.

Prior art phase sensitive demodulators provide a switching arrangement and a filtering arrangement, wherein the filtering arrangement "smooths" switching transitions to provide a steady state output signal. In system 900, switches 917 and 918 in conjunction with CCD 920 provide operations similar to that used in prior art phase sensitive demodulators. For example, switches 917 and 918 will switch processed signals 915 and 916 in-phase with reference signals 930 and 931 and charge storage elements of CCD 920 will integrate or filter the sampled processed signals 919 to provide a steady state charge signal proportional to the phase related component of processed signals 919 as a steady state charge amplitude without switching transients.

The CCD demodulator and multiplexer embodiment has been described for a combined phase sensitive demodulator and multiplexer arrangement. It is herein intended that the demodulator arrangement and the multiplexer arrangement may be usable as separate arrangements and may be combined in a preferred embodiment of the present invention. Further, any reference to a demodulator with reference to the embodiment shown in FIG. 9A is also intended to exemplify a sample-and-hold arrangement wherein the demodulator arrangement described with reference to FIG. 9A provides a sample and storage operation under control of mode signals and therefore further exemplifies a sample-and-hold arrangement. Still further, a plurality of samples may be added or integrated under control of the reference signals 930 and 931 using the storage and charge adding or charge integrating capabilities of the CCDs, exemplifying analog summation or integration and particularly analog summation or integration under control of digital logic signals.

BEAM FORMING (FIG. 9B)

A beam forming arrangement may be provided with a plurality of transducer elements for receiving incident illumination and a delay line having taps for introducing received energy from the transducers into the delay line. Assuming that the taps are equally spaced relative to the time delay therebetween, if the period of a signal introduced into the plurality of taps is equal to the time delay between taps, that signal may reinforced at each tap and may exit the delay line having an amplitude related to the incident energy. If the period of the signal is different from the time delay between taps, the signal may not be reinforced to the same degree as in the above-mentioned case. Still further, if the waveform period is half the delay between taps, alternate taps would provide a signal 180 degrees out-of-phase with the preceding tap signal thereby cancelling the signal introduced at two adjacent taps. This is analogous to the operation of a well known phase sensitive demodulator wherein an input signal has a first frequency characteristic and wherein the reference signal has a frequency characteristic that is equal to the input signal frequency, different from the input signal frequency, or half of the input signal frequency respectively relative to the three delay line examples discussed above.

In one beam forming embodiment, a plurality of transducers 910 are shown receiving illumination along lines 9690 from source 9634. Transducer output signals 968 are connected to taps on CCD delay line 966. The input signals 968 propagate along CCD delay line 966 in the direction shown by arrow 970 to be generated as output signal 971, which is related to the time varying summation of input signals 968 having time delays T1 on input lines 968. If the time delay between signal taps 968 is a fixed delay T1 corresponding to a wavelength and if the spacing between transducers 910 is related to wavelength λ1, then the delay line 966 will enhance the signals by summing the input components in-phase and outputting the time variying summation on signal line 971. If the incident illumination 969 has a frequency f1 with a wavelength λ1, then energy coming from source 964 propagating in direction 973 parallel to the plane of transducers 910 will provide in-phase signal components at each of the transducers 910 for enhancement of signal 971. For frequencies lower than frequency f1, an angle θ may exist wherein the incident illumination projected upon transducer array 9109 will have a wavelength component equal to λ1 and thereby satisfying the conditions for enhancement of output signal 971. Therefore, there is a relationship between spacing λ1 of transducer elements 910, time delay T1 between delay line taps 968, frequency of incident illumination, and angle-of-incidence θ for signal enhancement.

In accordance with one feature of the present invention, a beam forming arrangement is provided having a controllable illuminating frequency which defines the angle θ viewed by the array 910. A variable transmitter frequency such as provided with a VIBROSEIS chirp generator may be used with the beam forming arrangement of this inventive feature. It can be seen that the signal that will be enhanced with delay line 966 is related to the frequency of the illumination and the angle θ of incident illumination, wherein the component of wavelength in the plane of sensors 910 must be equal to distance λ1. Therefore, the lower the frequency the greater must be the angle θ and the higher the frequency the smaller must be the angle θ for enhancing signal 971. Further, signal 971 is related to the illuminated environment at an angle θ that is determined by the frequency of the incident illumination. Therefore, the direction of received beam θ is related to the frequency of the illumination, wherein the beam direction can be controlled by the illuminating frequency.

In accordance with the present invention, a variable frequency illuminator is provided to control the direction of the received beam 969 and therefore the portion of the environment to be interrogated, where the information is output as signal 971. Various well known arrangements may be used in conjunction with the system of the present invention including arrangements for controlling the transmitting frequency to sweep through a controllable angle θ to interrogate an environment.

In another embodiment of the present beam forming inventive feature, delay line 966 may be replaced with a CCD, as described above with reference to FIG. 9A. In this embodiment, CCD 920 receives input signals 919 from transducers 910. A clock generator 921 provides clock signals 922 to shift information along CCD 920 to the output signal 925. In this arrangement, the time delay between taps 919 is controlled by the frequency of clock 922, where the time delay is related to the clock frequency and to the number of shift stages between taps 919. For simplicity, it will herein be assumed that taps 919 are located one shift stage apart, wherein each clock pulse 922 will shift the charge that is accumulated at a particular tap 919 by one tap toward output signal 925.

CCDs have the characteristic of accumulating charge in relation to (1) the signal magnitude on an input line and (2) the time for which the signal is present. Therefore, the output signal on line 925 is related to the magnitude of signals 919 and the time of charge accumulation related thereto. Assuming that the time of charge accumulation is related to the shift frequency, the output signal 925 will be related to the signal magnitude on lines 919 for the time of charge accumulation. As discussed relative to FIG. 9B for the delay line 966, the output signal 925 will be related to the frequency of the illuminating energy, the time delay between shifting stored signals between input lines 919 and the angle of incidence θ of the illumination. Assuming that the frequency is constant and the time delay between input signal lines 919 is related to the frequency of shift clock signal 922, then beam angle θ that will cause signal 925 to be enhanced is inversely related to the frequency of clock signal 922, wherein a high clock frequency will steer the beam to a low angle and a low clock frequency will steer the beam to a high angle for enhancement of signals 925 and 971 related to the particular beam angle.

Therefore, beam forming may be achieved with a CCD arrangement and beam angle θ may be controlled by the frequency of clock signal 922.

Figure 9A:
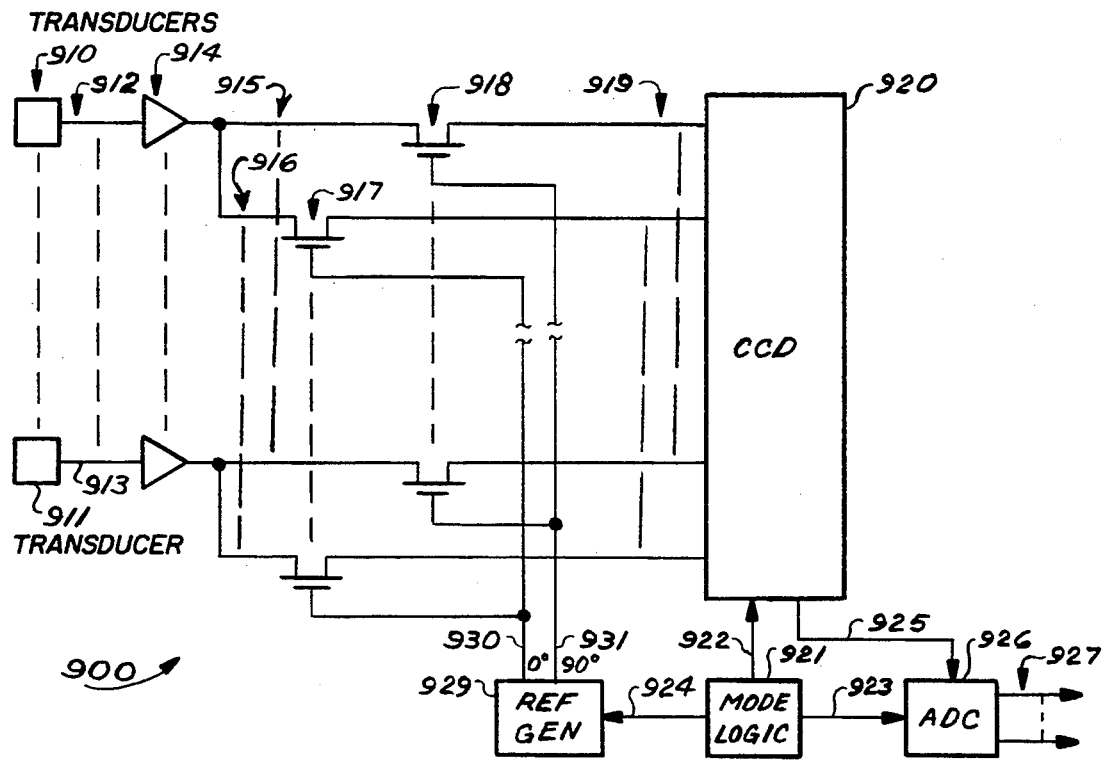
Figure 9B:
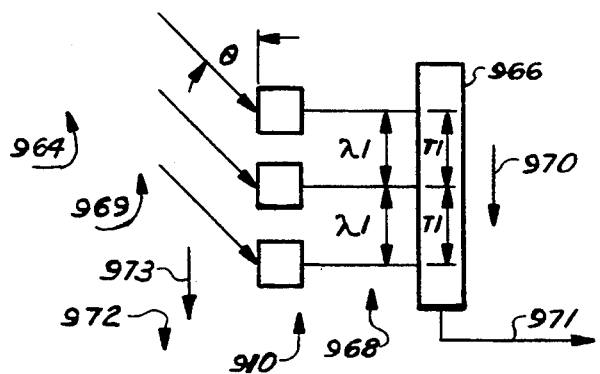

The CCD arrangement set forth in FIG. 9A has been used to exemplify the CCD arrangement of the beam forming inventive feature. In this embodiment, switches 917 and 918 may be used for demodulating the input signals 916 or may be controlled to be conductive or "on" to provide greater similarity to the delay line embodiment discussed with reference to FIG. 9B. Further, the modes of integrate or shift as discussed for the demodulator and multiplexer arrangement with reference to FIG. 9A are interleaved as alternate integrate (sample) and shift commands for the beam forming feature of the present invention; wherein mode logic 921 may command integrate, shift, integrate, shift, etc. as alternate operations or interleaved operations for beam forming of input signals.

Background on beam forming concepts may be obtained from the prior art literature such as the reference to Dolph listed hereinafter and the references cited therein.

HYBRID MEMORY (FIGS. 9C ET SEQ)

Memories for storing digital information in digital form are well known in the art and include digital shift registers, disc memories, and magnetic tape. In one embodiment of the present invention, a "digital" memory is provided for storing information in analog signal form and for operating in conjunction with a digital system as a digital memory. The storage of information in analog signal form and the conversion between digital and analog signals for storage, for input, or for output will herein be termed a hybrid memory arrangement.

A CCD memory degrades signals as they are shifted through the memory due to charge transfer inefficiencies. Several CCD memory refresh mechanizations will be described with reference to FIGS. 9A–9J to illustrate refresh embodiments. Refreshing may be provided in the digital domain as will be described with reference to FIG. 9C, in the analog domain as will be described with reference to FIGS. 9F and 9G, or in the hybrid (analog and digital) domain as will be discussed with reference to FIG 9J. A digital refresh embodiment provides re-establishment of signal amplitudes with digital circuit elements substantially operating on digital signals in the digital domain. An analog refresh embodiment provides re-establishment of signal amplitudes with analog circuit elements substantially operating on analog signals in the analog domain. A hybrid refresh embodiment provides re-establishment of signal amplitudes with a combination of analog and digital signals in combined analog and digital domains. A digital refresh embodiment is discussed with reference to FIG. 9C; where digital circuits add a digital "non-significant" bit to a digital signal to re-establish digital signal amplitude. An analog refresh embodiment is discussed with reference to FIGS. 9H and 9I; where analog circuits control gain with an analog sampled signal to re-establish analog signal amplitude. A hybrid refresh embodiment is discussed with reference to FIG 9J where digital circuits set the gain of an analog amplifier with a digital gain setting number to control an analog signal.

The hybrid memory feature of the present invention will now be described. This feature provides improved storage utilization. For example, analog signals may be stored and shifted within CCD memory 932 to an accuracy that, for this example, will be assumed to be better than one part in 256 or 8-bits of digital resolution. An analog signal having such resolution may require only a single shiftable memory cell. Digital signals stored and shiftable in CCD memory 932 having such digital resolution would require 8-bits of digital resolution to provide a resolution of one part in 256. Therefore, for this example an improvement in storage capacity by a factor of eight may be achieved, where 8-bit resolution analog information may be stored and shifted in CCD memory 932 requiring only one-eighth of the number of storage elements that would be required to store and shift 8-bit resolution digital information in CCD memory 932.

Figure 9C:
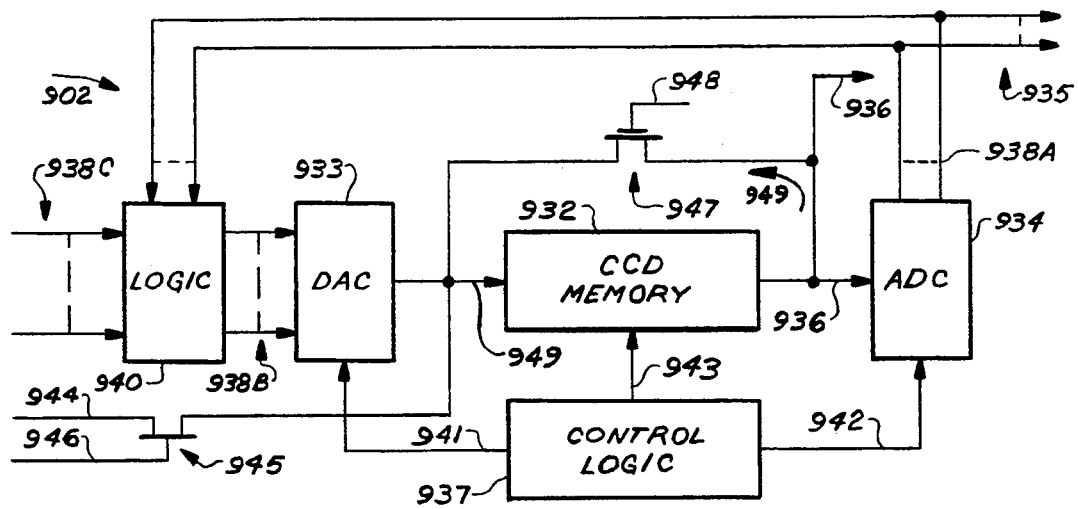

A hybrid memory arrangement using a CCD will now be described with reference to FIGS. 9C and 9D. Hybrid memory system 902 comprises CCD memory 932, input digital-to-analog converter (DAC) 933 and output analog-to-digital converter (ADC) 934. CCD memory 932 comprises a plurality of shiftable analog storage elements, wherein an analog input signal 949 is stored in a first CCD element and, under control of clock signal 943, input analog signal 949 is shifted through a plurality of CCD analog charge memory stages until it reaches an output stage which provides the shifted analog charge signal as output signal 936. Output analog signal 936 may be converted with ADC 934 to provide digital output signals 935 for use by a digital data processing system. Input digital signals 938B to DAC 933 are converted to analog signal 949 for storage in CCD memory 932. Information shifted out of CCD memory 93 may be recirculated as input information in analog signal form along recirculation path 939 or may be recirculated as digital signals from 938A to signals 938B. Information in CCD memory 932 may be changed by opening the recirculation path, either analog recirculation path 939 with switch 947 or digital recirculation path 938B with logic 940, and enabling digital input signals 938C with well known selection logic 940 or analog input signal 944 with switch 945.

Control logic 937 provides sequential control signals for clocking CCD memory 932 with clock signal 943 and for controlling the conversion of input and output information with convert signals 941 and 942. In one embodiment having digital recirculation, control logic 937 may provide clock signal 943 to provide a new output signal 936, then provide convert signals 941 and 942 to convert analog output signal 936 to digital signal 938A with ADC 934 and to covert digital signals 938B to analog signal 949. Signal 938A may be available to the digital system and may be further available for recirculation.

Operation and error reduction for a hybrid memory will now be discussed. An example will be provided to illustrate the relationships between signal degradation by a CCD memory and resolution of DAC 933 and ADC 934. In a preferred embodiment, ADC resolution is worse than DAC resolution which is worse than signal degradation through CCD; where DAC and ADC resolution can be set to be worse than signal degradation. ADC 934 is assumed to have a conversion precision of 8-bits or one part in 256 for the present example, where this resolution is assumed to be greater than the degradation of the stored information in CCD memory 932. Further, DAC 933 is assumed to have a resolution greater than the resolution of ADC 934, which will be 9-bits or one part in 512 for the present example. Therefore, it can be seen that DAC 933 may have greater resolution than ADC 934, where the state of the least significant bit of DAC 933 may be considered to have no "significance" and therefore may be set to either the one or the zero state without affecting the operation of hybrid memory 902.

Therefore, in accordance with the present invention, the least significant bit of DAC 933, which is a "non-significant bit", will be set to the one-state so that input analog signal 949 will always be on the high side of the permissible input signal variation, where any signal degradation through CCD memory 932 will merely be degradation of a part of the "non-significant" information of degradation of information that is always on the high side of the permissible variations within the resolution of ADC 934. Although analog signal 949 is degraded as it is shifted through CCD memory 932, the degradation will be less than the "non-significant" bit or "bias" imposed on signal 949 by DAC 933. This bias does not overlap to the next count of ADC 934 because it is also less than the resolution of ADC 934. Therefore, degradation of analog signal 949 through CCD memory 932 may be less than the bias signals due to this "non-significant" bias bit in DAC 933 and therefore can never be degraded to the next lower count associated with ADC 934. Therefore, DAC 933 will re-establish the level of signal 949 independent of degradation through CCD memory 932, but neither re-establishment of the signal level with DAC 933 nor degradation of the signal shifted through CCD memory 932 will overlap the next highest count or degrade below the next lower count of ADC 934.

Figure 9D:
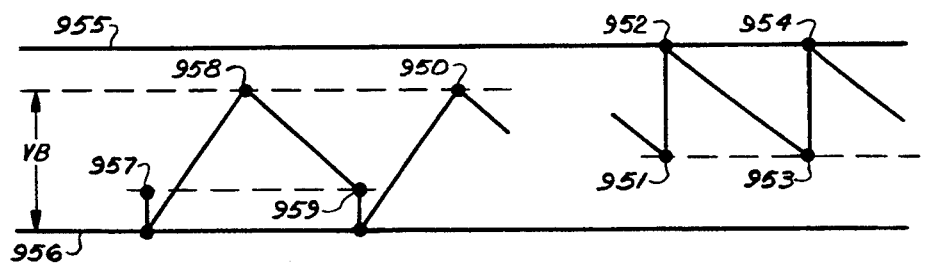

The error reduction concept can be better understood with reference to FIG. 9D, where a resolution increment of ADC 934 is shown bracketed by upper limit 955 and lower limit 956. Analog output signal 936 is shown having an amplitude 957 into ADC 934. ADC 934 converts signal 957 and rounds-off the output digital number to amplitude 956. The digital number related to amplitude 956 is recirculated as signals 938A and 938B to DAC 933 which converts amplitude 956 to an analog signal level and introduces an "non-significant" bit or bias having an amplitude VB which is less than the resolution increment between resolution amplitudes 956 and 955 but which is greater than the degradation of the signal 949 when shifted through CCD memory 932. Therefore, input signal 949 will have an amplitude that is equal to amplitude 956 plus the bias amplitude VB for a total amplitude shown as amplitude 958. As the analog input signal 949 is shifted through memory 932, it is degraded toward amplitude 959 and output as signal 936. Again, conversion of signal 936 having amplitude 959 with ADC 934 provides amplitude 956, which is again recirculated and converted to amplitude 950 and again shifted through CCD memory 932. Therefore, the roundoff with ADC 934 and the introduction of bias VB with DAC 933 automatically compensates for degradation of the signal shifted through memory 932, thereby precluding an accumulation of error; neither round-off, nor bias, nor memory shift related degradation.

In still another example, output analog signal 936 may be degraded to level 951, where ADC 934 converts analog signal 951 to digital form and "rounds high" to the next higher increment of amplitude 952. Signal amplitude 952 is then degraded through recirculation, D/A conversion and shifting as described above to amplitude level 953 (the same as amplitude 951) as output signal 936 but is again converted with ADC 934 to digital form and again "rounded-high" to amplitude 954 (the same as amplitude 952) before again recirculating.

Rounding high may be accomplished with well known analog biasing, digital biasing, adding one digital increment, or other well known rounding techniques. For example, a "non-significant" or bias bit may be set to a fixed state to bias the digital number to the high side for a "round-high" arrangement.

In view of the above, degradation of an analog signal such as due to shifting, can be limited to a finite error or resolution region and can be prevented from accumulating without limit. Therefore, limiting the magnitude of error accumulation permits analog signal degradation to be tolerated and permits unlimited shifting operations with only a limited error accumulation.

The above described embodiments for elimination of accumulating error has been described relative to recirculation for a hybrid memory. It should be understood that this invention feature has broad applicability, where this inventive feature may be practiced with any embodiment that either biases an input analog signal of rounds-off an output signal as discussed relative to FIGS. 9C and 9D above.

In the above example, biasing and round-off of signals has been shown using digital techniques. Other bias and round-off techniques may be used. For example, analog biasing such as with summing resistors or by scaling the signals may be used. Similarly, round-off may be achieved with digitizing a signal. Other arrangements will now become obvious to those skilled in the art from the teachings of the present invention.

An adaptive refresh arrangement will now be described with reference to FIG. 9F. CCD memory 932 stores information under control of clock signal 943. The information is loaded as signal 949 and output as signal 936 in serial form. These signals may be analog level signals or digital single-bit signals. Refresh circuit 996 refreshes memory output signal 9365 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and FET electronic switch 947.

Input signals to memory 932 are selected with input selector switches 947, 991 and 992 to generate input signal 949. Switch 947 selects recirculation signal 960 from memory output. Switch 991 selects analog input signal AI to load new information into memory 932. Switch 992 selects a reference signal REF. Switches 947, 991, and 992 may be controlled with a digital gate such as AND-gates 987 and 988 and inverter-gate 989 respectively. When decoder signal 990 is low, AND-gates 987 and 988 are disabled and inverter 989 is enabled for non-selecting switches 947 and 991 and for selecting switch 992. When decoder signal 990 is high, AND-gates 987 and 988 are enabled and inverter 989 is disabled for selecting either switch 947 or 991 in response to recirculation mode command signal RECIRC and input mode command signal INPUT of for non-selecting switch 992 respectively. Recirculation is enabled with recirculation command signal RECIRC to gate 987 and input signal AI is enabled with input command signal INPUT to gate 988. Therefore, memory 932 may load recirculated information, input information, or a reference signal under control of signals to gates 987, 988, and 989, respectively.

An arrangement will now be discussed for adaptively controlling refreshing of information stored in memory 932 by using a reference signal to control gain of the refresh circuitry 996. Clock pulses 943 will herein be assumed to be from a free-running clock for simplicity of discussion, where memory 932 is continually clocked to load either recirculation signal 960, analog input signal AI, or reference signal REF under control of logical signals 948, 967, and 968 from gates 987, 988, and 989; respectively. Clock signal 943 may clock a counter 993 to provide a count that is indicative of the number of clock pulses received and therefore the position of the information shifted into memory 932. For example, counter 993 provides operation similar to the bit, word, and sector counters associated with well known prior art disk memories which are used for counting disk memory clock pulses to keep track of the location of information on a rotating disk. Counter output signals 994 are provided to decoder 995 generating decoder output signal 990 in response to a particular code of counter signals 994 from counter 993. Well known decoders such as the Texas Instruments S/N 7445 decoder provides a high signal output when the input code is not true and provides a low signal output when the input signal code is true. Therefore, when counter 993 increments through a selected code, decoder 995 may provide a low output signal 990; which may enable switch 992 through inverter 989 and which may disable switches 947 and 991 through gates 987 and 988 respectively to load a reference signal REF into memory 932 through switch 992 as signal 949. In one embodiment, the selected code in counter 993 lasts for one period of clock signal 943, where the next clock pulse increments counter 993 to a different code condition. Therefore, decoder output signal 990 may have a single clock pulse width and reference signal REF loaded into memory 932 may be loaded into a single-bit position.

Mode selection may be performed with a mode flip-flop M1 for selecting a recirculation mode with the $\overline{Q}$ signal RECIRC or for selecting an input mode with the Q signal INPUT. The state of the mode flip-flop M1 may be controlled with well known logic arrangements such as toggling a Texas Instrument's S/N 7473 J-K flip-flop or loading a mode condition into a Texas Instrument's S/N 7474 flip-flop. The recirculation mode is commanded when the M1 flip-flop generates a high recirculation mode signal RECIRC thereby enabling gate 987, where recirculation control signal 948 becomes high for the period of time that decoder signal 990 is high. Recirculation control signal 948 controls recirculation switch 947 to be conductive for the period of time decoder signal 990 is high to conduct recirculation signal 960 to the input of CCD memory 932 as signal 949. Similarly, the input mode is commanded when the M1 flip-flop generates a high input mode signal INPUT, thereby enabling gate 988, where input control signal 967 becomes high for the period of time that decoder signal 990 is high. Input control signal 967 controls input switch 991 to be conductive for the period of time decoder signal 990 is high to conduct input signal AI to the input of CCD memory 932 as signal 949. Mode command signals RECIRC and INPUT are mutually exclusive, where only one of these mode command signals may be high at a time, which is characteristic of flip-flop Q and $\overline{Q}$ output signals. Therefore, either the recirculation switch 947 will be conductive as enabled by recirculation control signal 948 being high, or the input switch 991 will be conductive as enabled by input control signal 967 being high, or neither recirculation switch 947 nor input switch 991 will be conductive as disabled by decoder signal 990 being low.

Decoder signal 990 is high for the data load portion of a memory cycle and low for a reference load portion of a memory cycle as will be discussed with reference to FIG. 9G. A memory cycle may be defined as a storage sequence of a combination of data and reference signals. In a simplified example used herein, a memory cycle may be the number of clock pulses required to shift a stored signal from the input of memory 932 to the output of memory 932. For example, a memory having a 512 data-bit capacity and a one reference-bit capacity may have a memory cycle of 513 clock pulses. Therefore, the decoder signal 990 will be high for the 512 data-bit portion of the memory cycle will be low for the one reference-bit portion of the memory cycle. When decoder signal 990 is high, inverter 989 will be disabled and gates 987 and 988 will be enabled; where data will be recirculated through switch 947 or data will be input through switch 991 under control of mode signals RECIRC or INPUT. When decoder signal 990 is low, inverter 989 will be enabled and gates 987 and 988 will be disabled independent of the state of mode signals RECIRC and INPUT. Inverter 989 will invert a low decoder signal 990 to produce a high reference control signal 968 to make reference switch 992 conductive, which results in reference signal REF being input to memory 932 as signal 949 where reference signal REF will be input through switch 992.

Reference signals can be introduced into selected bit positions of memory 932 with counter 993, decoder 995, and input circuitry 908. Reference signal REF may be a precise amplitude signal, wherein the precision of the amplitude may be preserved with a good quality electronic switch 992 or other switch which are well known in the art, wherein a precision reference amplitude signal input to CCD memory 932 through switch 992 as signal 949 may be stored in a selected bit position. The reference signal bit may be shifted through memory 932 under control of clock signal 943 and shifted out of memory 932 as output signal 936 to refresh circuitry 996. The reference signal may be degraded as it is shifted through memory 932, consistent with the charge transfer inefficiency of the CCD type memory devices. Reference signal REF stored in and shifted through memory 932 may be degraded by substantially the same amount as other signals stored in and shifted through memory 932. Because reference signal REF was initially stored in memory 932 as a precise signal amplitude, the amplitude of the reference signals when shifted out of memory 932 is indicative of the degradation through memory 932. Therefore, the reference signal output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operations as a function of actual degradation of the signal and may therefore be used over a range of degradation variables such as over a temperature range, over a clock pulse frequency range, and over variations between difference CCD memory devices and may further be used to adaptively compensate for other variations such as charge leakage, aging of CCD memory elements, and other such effects.

In a simplified embodiment, it may be assumed that counter 993 contains a number of counts equal to the number of bits in memory 932 and that a particular count code, which may be the first count code for the present simplified example, is detected with decoder 995 to generate decoder signal 990. For the first count of each memory shifting sequence, the output of decoder 995 will go low thereby commanding loading of reference signal REF into memory 932 as discussed above and simultaneously enabling refresh circuitry 996 with decoder signal 990 to sample or otherwise monitor a signal being shifted out of memory 932; wherein the synchronization counter 993 provides another frame, or initialization point, or start of the shift operation with a reference signal being loaded into memory 932 and the last prior reference signal being simultaneously available as the output signal 936 of memory 932. Therefore, decoder 995 may enable loading of a new reference signal into memory 932 and may also enable sampling of the degraded reference signal as signal 936 output from memory 932 with refresh circuitry 996.

In a simplified example, it will be assumed that memory 932 has a four-bit storage capacity and that counter 993 is a two-bit counter for a four-count operation, known as a modulo-3 counter. This example will now be discussed with reference to the waveforms shown in FIG. 9G. Clock signal 943 is represented as a sequence of clock pulses. Signal 990 is shown as a square-wave signal which is low for each fourth-bit time, which is consistent with decoder 995 decoding the output of a two-bit four-state counter 993. Data signal 949 is shown in digital squarewave form for convenience but may also be implemented as analog amplitude signals. Data waveform 949 is shifted into memory 932 and similarly is shifted out of memory 932 as signal 936 after a four-bit time shift delay. Therefore, signals 949 and 936 are substantially the same signal except that signal 936 has been delayed by four-clock pulse periods and has been degraded by the shifting operations through memory 932. It will further be assumed for this example that recirculation control signal RECIRC is high and the input control signal INPUT is false. Therefore, three data-bits will be recirculated during the high period of decoder signal 990 and one reference-bit will be loaded during the low period of decoder signal 990. As shown in FIG. 9G, data signals (shown as a "1" and a pair of "0"s following the reference signal R) will be recirculated as signal 960 through switch 947 under control of decoder signal 990 and mode signal RECIRC. Therefore, when decoder signal 990 goes low, gate 987 will cause control signal 948 to go low thereby making switch 947 non-conductive and disabling recirculation signal 960. Further, when decoder signal 990 goes low, inverter 989 will cause control signal 968 to go high thereby enabling reference signal REF to load a precision voltage into the CCD memory, shown in FIG. 9G as signal R in waveform 949. Similarly, when decoder signal 990 goes high, recirculation signal 960 will be enabled with gate 987 and switch 947 and reference signal REF will be disabled with inverter 989 and switch 992, thereby permitting the three data-bits shown as a "100" code to be recirculated as signal 960 into memory 932 as signal 949. Therefore; as counter 993 increments from a count of 0 to a count of 3, decoder 995 enables the reference signal REF to be loaded into memory 932 at the count of 0 and the digital data in memory 932 (consisting of a "100" sequence) to be recirculated and loaded into memory 932 at the counts of 1, 2 and 3. Refresh circuitry 996 monitors the reference signal shifted out of memory 932 as signal 936, identified by a low decoder output signal 990 to refresh circuitry 996; where refresh circuitry 996 will adaptively re-establish the amplitude levels of the data in response to the reference signal, as described in detail hereinafter.

A simplified embodiment of a refresh circuit will now be described with reference to FIG. 9H. Output signal 936 from memory 932 is processed with amplifier 963. Sample-and-hold circuit 961 samples the output signal 936 under control of the decoder sample signal 990; where decoder signal 990 going low enables sample-and-hold 961 to sample the reference bit of output signal 936; thereby providing output signal 962 indicative of degradation of the reference signal through memory 932. Amplifier 963 may be an RCA Model No. CA3080 transconductance amplifier, wherein the gain through amplifier 963 is controlled by control signal 962. Therefore, memory output signal 936 is adjusted in amplitude with amplifier 963 as a function of control signal 962, thereby providing refreshed recirculation signal 960. Control signal 962 may be connected to control input $I_{ABC}$ of amplifier 963 and signal 936 may be applied to the inverting input of amplifier 963, wherein the output signal 960 is related to the product of the signals 962 and 936. It may be desired that the amplitude of signal 960 be inversely proportional to the control signal 962, wherein control signal 962 may be implemented as a complement signal by subtraction from a reference signal or may be inverted as a reciprocal signal inversely proportional to the sampled signal 936 for complement or inverse control of amplifier 963. Reciprocal and subtraction circuits are well known in the art and may be introduced in signal line 962 to complement or invert the signal from sample and hold 961.

An alternate embodiment of refresh circuitry 996 is shown in FIG. 9I, where memory output signal 936 is loaded into sample-and-hold 961 under control of decoder signal 990, as described with reference to FIG. 9H, and signal 936 is further processed with an inverting circuit to provide an output amplitude that is inversely proportional to the degradation of the reference signal. An implicit servo is shown in FIG. 9I, implemented with multiplier 980 and summer 999, wherein an implicit servo is well known in the art and is described in the reference by Levine listed hereinafter. The sampled reference signal is provided as signal 962 to multiplier 980. Multiplier 980 generates a product signal 982 which is proportional to the sampled signal 982 and the memory output signal 965 ($-Z$). The product signal 962 and the input signal 936 are algebraically summed with summing amplifier 999 to provide an implicit servo output signal 965; which can be shown to be related to input signal 936 divided by sampled signal 962. Amplifiers 999 and 976 may be used to adjust the scale factor of signal 965 to the desired value with feedback and input resistors and may be used to provide amplification, buffering, and inversion of summation signal SUM. Output signal 960 can be shown to have an amplitude proportional to the amplitude of input signal 936 and inversely proportional to the amplitude of degraded reference signal 962 stored in sample-and-hold circuit 961.

The implicit servo shown in FIG. 9I will now be described. The implicit servo discussion will reference equation (10) through equation (14) below to provide a simplified explanation of operation. Signals will be represented in equations (10)–(14) by the reference designation of the signal as shown in FIG. 9I provided in parentheses () in the equation as being indicative of the signal magnitude.

$$(SUM) = (936) + (982) \approx 0 \qquad \text{equation (10)}$$

$$(982) = (962)(965) = -YZ \qquad \text{equation (11)}$$

$$(SUM) = (936) + (962)(965) = X - YZ \approx 0 \qquad \text{equation (12)}$$

$$(965) = -(936)/(962) \qquad \text{equation (13)}$$

$$Z = X/Y \qquad \text{equation (14)}$$

Summation signal SUM is equal to the difference between product signal 982 and input signal 936. Because output signal 965 is fedback in servo form to multiplier 980 to close a servo loop, signal SUM is controlled to be a very low magnitude near zero signal, as shown by the approximately zero ($\approx 0$) symbol in equation (10). Multiplier signal 982 from multiplier 980 is equal to the product of signal 965 and adaptive scale factor signal 962, as shown in equation (11). Substitution of equation (11) into equation (10) to eliminate the signal 982 term yields equation (12). Grouping of terms, factoring of the signal 965 term, and solving for the signal 965 yields the input signal 936 term divided by adaptive scale factor signal 962; as shown in equation (13). This solution is based upon the assumption that signal sum is servoed to a very low signal amplitude then amplified with amplifier 999 to generate signal 965 for output and for feedback. In a high gain servo, the error in assuming that signal SUM is approximately equal to zero may be very small and will be assumed to be negligible. Equation

(13) shows that compensated signal 965 is approximately equal to input signal 936 divided by the adaptive scale factor signal 962; wherein the greater the degradation through memory 932, the smaller will be adaptive scale factor signal 962 and therefore the larger will be the signal 965. In other words, the degraded signal 936 is multiplied by the reciprocal of the sampled reference signal to increase the signal 936 to a level related to the amount of degradation, as defined by adaptive scale factor signal 962. Other analog signal processing and implicit servo arrangements will now become obvious to those skilled in the art such as providing various function generation circuits to adjust the amplitude of degraded signal 936 as a function of adaptive control signal 962.

An alternate discussion of an implicit servo will now be presented with reference to the textbook by Levine listed hereinafter; wherein the following description is similar to the example provided on page 157 therein and wherein signals 936, 962, and 965 will be referred to as signals X, Y and Z respectively for compatibility with the description in the book by Levine. It is desired to solve the equation $Z=X/Y$ as shown in equation (14), wherein Z is the corrected output signal 965, X is the degraded memory signal 936, and Y is the adaptive control signal 962 defining the magnitude of the required re-scaling. The servo output signal $(-Z)$ is fedback to multiplier 980 to be multiplied with adaptive scale factor signal Y 962 to provide output signal $(-YZ)$ as signal 982. Signal 982 $(-YZ)$ is added to the uncorrected signal X 936 at the summing junction of operational amplifier 999 to generate the summation signal SUM which is amplified with amplifier 999 to provide output signal $(-Z)$ 965 as a solution to equation (14).

The corrected signal $(-Z)$ 965 is processed with inverting amplifier 976 to generate a non-inverted output and recirculation signal 960. Scale factors may be readjusted by a fixed amount by selecting feedback resistors of operational amplifiers 999 and 976.

Still another embodiment of the refresh circuit 996 is shown in FIG. 9J. Decoder signal 990 may be used to enable analog-to-digital converter (ADC) 934 to convert a reference bit of the memory output signal 936 to provide a digital output number Y 938A proportional to the degraded reference signal Output work 938A may be used to excite multiplying digital-to-analog converter (DAC) 933. The DAC is implemented with analog switches 974 and weighted summing resistors 975 in a well known arrangement. Multiplying DAC 933 generates an output signal to the summing junction of operational amplifier 999 that is proportional to the digital number (Y) 938A and proportional to the excitation signal $(-Z)$ 965 fedback from the output of operational amplifier 999. Similar to the mechanization discussed for FIG. 9I above, feedback signal $(-Z)$ 965 is multiplied by digital input number (Y) 938A to generate output analog signal $-YZ$. Signal $-YZ$ is summed with input signal X at the summing junction of operational amplifier 999 to generate output signal $(-Z)$ 965 for feedback and for output. Buffer amplifier 976 is used for inversion, scaling, and buffering as discussed with reference to FIG. 9I above.

The instant reference signal refresh feature of the present invention has been described in detail with reference to FIGS. 9F–9J for scale factor compensation related error mechanisms such as charge transfer inefficiencies. In accordance with another feature of the present invention, a reference signal bias refresh compensation arrangement will now be discussed with reference to FIGS. 9F–9J.

An important CCD error mechanism may be relatively independent of signal magnitude scale factor such as being related to time, temperature, and/or other variables. This error mechanism may be defined as a bias error mechanism and may be caused by thermal leakage, recombination, or other well known affects as described in the article by Carnes and Kosonowsky referenced hereinafter. Compensation for bias errors may be accomplished in a manner similar to the arrangement discussed above for scale factor errors.

A bias reference signal may be multiplexed into a CCD memory as discussed for the scale factor reference signal with reference to FIGS. 9F–9J above. For simplicity of discussion, the bias reference signal REF (FIG. 9F) and R (FIG. 9G) may be described as a zero magnitude reference signal but the bias reference signal may be any convenient magnitude signal. As the bias reference signal is shifted through CCD memory 932, the magnitude will change as a function of leakage and other bias error mechanisms. The bias reference signal will be shifted out of CCD memory 932 to refresh circuit 996 for compensating the data signal 936 for bias errors. The bias reference signal may be loaded into sample and hold 961 to generate stored bias reference signal 962 (FIG. 9H). Bias reference signal 962 may be subtracted from memory output signal 936 to generated refreshed or compensated output signal 960.

The arrangement shown in FIG. 9H has been implemented to illustrate scale factor compensation, where changes to FIG. 9H will now be discussed to illustrate bias compensation. Amplifier 963 may be connected as well known differential amplifier, wherein memory output signal 936 may be connected to the negative input and stored reference signal 962 may be connected to the positive input or conversely to generate differential output signal 960. Differential signal 960 may represent memory output signal 936 with the bias error signal subtracted out therefrom, thereby compensating for bias errors.

The scale factor and bias compensation arrangements discussed with reference to FIGS. 9F–9J above may be combined to form a combination scale factor and bias compensation arrangement. Decoder 995 may generate first and second output signals for controlling multiplexing of scale factor and bias reference signals respectively into different samples of CCD memory 932 with multiplexing circuits similar to gate 989 and switch 992 of multiplexer 908 and for controlling sampling of scale factor and bias reference signals respectively with different sample and hold circuits similar to sample and hold circuits 961 for scale factor and bias compensation respectively. Scale factor compensation may be performed with product circuits 963, 980, and 974 shown in FIGS. 9H–9J and bias compensation may be simultaneously performed with differential circuits by subtracting the bias reference signal from the memory output signal such as before scale factor compensation with differential amplifier 963 or after scale factor compensation with differential amplifier 976. In alternate arrangements, the bias reference signal may be sampled before or after scale factor compensation, the scale factor reference signal may be sampled before or after bias compensation, and the memory output signal may be compensated for bias errors before or after it is compensated for scale factor errors by appropriate arrangements of circuit placement and input signal selections.

Devices shown in FIG. 9F et seq are well known in the art. For example, counter 993 may be a Texas Instruments (TI) counter S/N 7493, decoder 995 may be a TI decoder S/N 7441-S/N 7449, inverter 989 may be a TI inverter S/N 7404 and AND-gates 987 and 988 may be TI gates S/N 7408. Switches 947, 991, and 992 may be any well known switches and, in a preferred embodiment, may be electronic switches implemented with field effect transistors (FETs). CCD memory 932 may be a well known CCD memory shift register device. Sample-and-hold circuit 961 is well known in the prior art, wherein one prior art sample-and-hold circuit is manufactured by Datel Systems Inc as Model SHM-3. Analog multipliers are well known in the art and may be implemented with any well known analog multiplier such as with a RCA model CA3080 transconductance amplifier connected as an analog multiplier. One form of analog multiplier is shown in block diagram form as multiplier 980. A RCA CA 3080 transconductance amplifier form of multiplier is shown as device 963. These two forms are exemplary of the present invention which may be implemented with other well known forms of analog multipliers. Converters such as ADC 934 and multiplying DAC 933 are well known in the art, wherein commercial ADC and multiplying DAC devices are exemplified by Datel Systems Inc devices model ADC 89 series and model DAC-HI 12B respectively. Operational amplifiers for summing and buffering operations are well known in the prior art such as the Fairchild $\mu$A709 and $\mu$A741 operational amplifiers which may be arranged with input and feedback resistors as shown with circuit 999 and 976.

The arrangements discussed with reference to the figures are presented in a simplified form to better exemplify the present invention although many other arrangements may be utilized which will now become obvious to those skilled in the prior art. For example, refresh circuitry 996 may be implemented with a well known automatic gain control (AGC) circuitry). An AGC circuit may operate from the reference signal 962 that is sampled in response to decoder signal 990 as described above. In an alternate embodiment which finds primary advantage in a digital memory arrangement, refresh circuitry 996 may integrate the signals from CCD memory 932 to provide a gain control signal related to the average of the information stored in memory 932. Information in memory 932 may include control signals to equalize the number "1" and "0" counts being loaded into memory 932 so that the integral of the output signals 936 will have an average value of zero and will have an amplitude related to the degraded signal amplitude. Further, for a digital memory arrangement refresh circuitry 996 may merely sample digital one-bits shifted out of CCD memory 932 being indicative of signal degradation without the use of the reference signal discussed above.

In an alternate embodiment, the amplitudes of the input signals 949 to memory 932 may be adjusted in relation to the degradation through memory 932 to normalize output signals 936 in contrast to the arrangement described above wherein refresh circuitry 996 re-establishes the amplitude of output signals for input of a normalized signal to memory 932 as signal 949.

Input circuitry; consisting of logic gates such as gates 987–989 and analog switches such as switches 947, 991, and 992; may be considered to be a multiplexer because this circuitry combines or multiplexes a plurality of analog signals (particularly data signal 960 or AI with a reference signal). Further, refresh circuitry 996 may be considered to be a demultiplexer because this circuitry separates or demultiplexes a plurality of analog signals (particularly the reference signal which is separated with sample-and-hold 961 from the memory output signal).

It can be seen that CCD memory 932 are electronic devices that may be shifted or not shifted under control of gated clock pulses 943 from control logic 937. Therefore, control of CCD memory may permit outputting of information on line 936 and inputting of information on line 949 while clocking CCD memory 932 or while holding the state of CCD memory 932 stationery by disabling clock 943. This is a significant advantage over the well known rotating memories such as disc memories, where a disc memory is continually rotating and may not be conveniently stopped due to the inertia of the memory and other such considerations. Therefore, a CCD memory that may be stopped under control of electronic signals will provide greater versatility in accessing and loading information and generally in operation of the memory device.

Although the present memory arrangement may be described with respect to a CCD memory and signal processing arrangement, it is intended that the inventive features described herein be applicable to signal processing and memory arrangements in general and not be limited to CCD arrangements. For example, an adaptive refresh arrangement described herein is equally applicable to other memory arrangements such as a magnetostrictive delay line memory and an LC delay line memory.

The CCD arrangements discussed with reference to FIG. 9C et seq are described for embodiments wherein signals are stored in analog signal form having analog resolution. It will now become apparent to those skilled in the art that these arrangements may also be used to store digital information such as in single-bit form. For example, ADC 934 may be a single-bit ADC such as a threshold detector. In one embodiment, a well known Schmidt trigger threshold detector may be used as a one-bit ADC 934 to detect whether the output information 936 is above or below a threshold, indicative of a binary one or a binary zero condition. If above the threshold, Schmidt trigger ADC 934 may restore the amplitude to an upper amplitude magnitude and, if below a threshold, Schmidt trigger ADC 934 may restore the signal to a lower amplitude magnitude. As described with reference to FIGS. 9C and 9D above, ADC 934 would restore the input signal 949 to an amplitude that may permit degradation through CCD memory 932 without traversing the higher level threshold, detected with ADC 934. This arrangement can be described with reference to FIG. 9D, where amplitude 956 may be defined as the high level threshold of Schmidt ADC 934, where an input signal 936 to ADC 934 above amplitude 956 such as amplitude 951 may be detected as a high level signal and may be restored to a high level recirculation amplitude 952. Shifting through CCD memory 932 would degrade amplitude 952 to amplitude level 953 which is still greater than the minimum high level amplitude 956; where ADC 934 may restore amplitude 953 to the high level recirculation amplitude 954. The system may have a characteristic where the difference between input threshold 956 and recirculation amplitude 955 is greater than the degradation of signal 949 when shifted through CCD memory 932, where this degradation may be the difference in amplitude between points 952 and 953 which is less than the difference in amplitude 955 (952) and 956. Input signals 936 to ADC 934 which are below threshold 956 may be recirculated as low level magnitudes.

Degradation of low level amplitudes may be of only secondary consideration because degradation of amplitudes through CCD memory 932 may tend to reduce the amplitude of the signal, thereby minimizing the detrimental effect on low level amplitudes. According to this consideration, it may be desirable to provide a high level amplitude for a first binary state and a low level amplitude for a second binary state, where the low level amplitude may be closer to zero voltage than to a high level negative amplitude. For example, representation of two binary states with a high level positive amplitude and a low level amplitude or a high level negative amplitude and a low level amplitude are preferred over an arrangement with representation of two binary states with a high level positive amplitude and a high level negative amplitude; where degradation of high level negative signals may be comparable to degradation of high level positive signals and where degradation of low level positive or negative signals may be minimized.

Now, an example will be provided to illustrate this degradation consideration. A binary signal will be assumed representing a one-state whenever the signal amplitude is greater than a threshold amplitude 956 and a zero-state whenever the signal amplitude is less than a threshold amplitude 956. Threshold signal amplitude 956 is assumed to be three-volts, degraded signal amplitude 951 and 953 is assumed to be four-voltage, restored one-level signal amplitude 952 and 954 are assumed to be five-volts, and restored zero-level signal amplitude (not shown) is assumed to be zero-volts. As restored signal 952 is shifted through CCD memory 932, the signal is shown being degraded from a five-volt amplitude 952 to a four-volt amplitude 953, but four-volts is greater than the three-volt threshold of Schmidt trigger 934. Therefore, the four-volt input signal 936 will be restored to an equivalent five-volt output signal 938A at amplitude 954. As a zero-level signal is shifted through CCD memory 932, the signal will be reduced in amplitude toward zero-volts (if it is not already at zero-volts) and will, therefore, not be degraded toward the threshold amplitude 956.

In another embodiment, the threshold signal is assumed to be zero-volts, the restored binary one signal is assumed to be plus three-volts, the restored binary zero signal is assumed to be minus three-volts, and signal degradation is assumed to be from the plus-voltage level and from the minus-voltage level toward the zero-voltage threshold level. Therefore, both the binary one and the binary zero voltage levels will degrade toward the threshold level. Therefore, this embodiment may be less desirable than the embodiment of the above example where only the binary one voltage level will degrade toward the threshold voltage level.

In still a further embodiment of the hybrid memory arrangement of the present invention, a ternary memory may be provided with a three-state ADC 934, where the recirculation line 938A from ADC 934 may have three-states including a positive-amplitude, a zero-amplitude, or a negative-amplitude. ADC 934 may be implemented with a pair of Schmidt triggers, where a positive Schmidt trigger may generate a high level amplitude or low level amplitude in response to a high level or a low level positive amplitude of input signal 936 and a negative Schmidt trigger may generate a high level amplitude or a low level amplitude in response to a high level or low negative amplitude of input signal 936. Therefore, if input signal 936 had a high level positive amplitude, the positive Schmidt trigger would be in the positive high level state and the negative Schmidt trigger would be in the low level state; if input signal 936 has a low level amplitude, both positive and negative Schmidt triggers would be in the low level state; and it input signal 936 had a negative high level amplitude, the positive Schmidt trigger would be in the low level state and the negative Schmidt trigger would be in the negative high level state. Summing of Schmidt trigger outputs would provide a high level output if the positive Schmidt trigger was in the high level state, a negative output if the negative Schmidt trigger was in the negative high level state, and low level output if both Schmidt triggers were in the low level state. It should be noted that when one of the Schmidt triggers is in a high level state, the other Schmidt trigger is in the low level state consistent with ternary signal forms and with the binary nature of Schmidth trigger threshold detectors.

CCD COMPOSITOR (FIG. 9E)

Compositors are well known in the geophysical art. One well known prior art compositor is implemented in the CAFDRS system sold by United Geophysical Corporation, an affiliate of Bendix Corporation located in Pasadena, Calif., which is implemented with a General Automation Corp SPC-16 computer. Another well known compositor is the trace compositor, model 1011 manufactured by Scientific Data Systems of Santa Monica, Calif. and described in Technical Manual SDA 98 02 62A dated November 1967. Such compositors accept input waveforms from geophone transducers and store the sampled waveforms in memory, where corresponding samples of each sequential waveform are added together. The sampling and adding of input waveform samples to previously sampled and added corresponding waveform samples is known as compositing. Compositing effectively sums or integrates corresponding samples in the temporal or time-domain to enhance the signal-to-noise ratio.

Figure 9E:
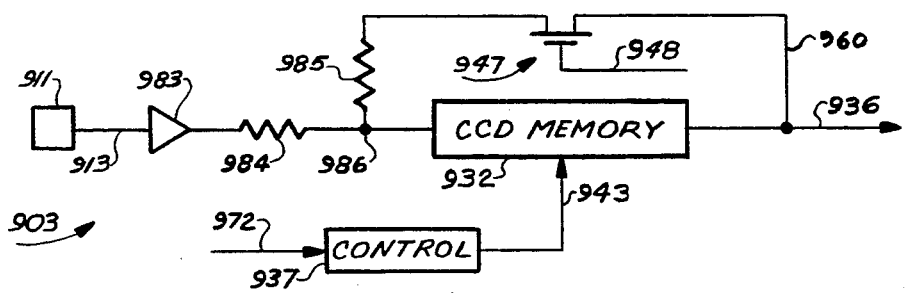

An improved compositor arrangement is shown in FIG. 9E using a CCD memory arrangement. CCD compositor 903 is shown for a single transducer input waveform. In a preferred embodiment, a plurality of compositor channels may be provided wherein one compositor channel per transducer may be used to composite each transducer input waveform known as a trace.

In reference to FIG. 9E, input transducer 911 generates transducer signal 913 which is preprocessed with buffer amplifier 983. Transducer signal from buffer amplifier 983 is input to CCD memory 932 through summing resistor 984. As data in CCD memory is shifted with clock pulses 943, input signal 986 is shifted into and stored in CCD memory 932. Control signal 972 enables control 937 to generate clock pulses 943 for the period of a trace, where control device 972 enables the shifting of CCD memory 932 at the start of an input trace from transducer 911 and control signal 972 disables the shifting of CCD memory 932 at the completion of the input trace from transducer 911. The first trace may be loaded into CCD memory 932, where the recirculation path 960 is disabled by making FET switch 947 non-conductive with control signal 948, which is indicative of the first trace to be loaded into CCD memory 932. Opening of the recirculation path 960 insures that the first trace will be loaded into CCD memory 932 and that prior contents of the CCD memory will not carry-over to the new composited information. For subsequent traces following the first trace, control signal 948 controls FET 947 to be conductive to provide a recirculation path for the composited information in CCD memory 932 to be recirculated and added to the input trace through summing resistor 985 to summing point 968, where the input trace signal will be added at summing point 986 through input summing resistor 984. Therefore, when a trace subsequent to the first trace is sensed by transducer 911 this new input trace will be summed with the recirculated composited information 960 and then shifted into CCD memory 932. Therefore, CCD memory 932 provides the operation of storing the composited information and summing resistors 984 and 985 provide the operation of adding the input information to the stored information.

The information stored in CCD memory 932 may be analog samples, wherein the shift clock 943 effectively samples a portion of input signal 913 by inputting to CCD memory on input signal line 986, then shifting under control of clock 943.

Input control signal 972 to control logic 937 may be related to the ensonifying signal such as a well known chirp signal, where the system generates a control signal to the transmitter, which may be a well known VIBROSEIS device for ensonifying an underground environment. Control signal line 972 may be derived from the ensonifying signal to start the sampling and compositing of input signal 913 with CCD memory 932. Control 937 may include a timer such as a well known counter to provide clock pulses 943 for a fixed period of time starting with the transmitter command signal 145 input to control 937 as signal 972.

One distinction of the CCD compositor of the present invention is that the signals are added in the analog domain and are stored as analog signals in contrast to digital domain summing and storage in prior art systems. Another distinction is that a separate compositor channel may be used for each input channel rather than using the prior art time-shared added and disc memory storage.

Additional distinctions and advantages may be obtained by using the hybrid memory teachings of the present invention discussed with reference to FIGS. 9C and 9D in conjunction with the compositor discussed with reference to FIG. 9E. In this arrangement, analog trace signals may be provided as analog input signal 944 to be added with recirculated signal 936 at summing point 949. Alternately, input signals may be digitized with a well known ADC and may be input as signals 938C to logic 940 which may be well known adding logic to add input signals 938C to recirculated signal 938A to provide the summed digital signal 938B for storage in CCD memory 932.

Another feature of the present invention provides for summing of analog signals which are input to a CCD. Such analog summing is exemplified with summing resistors 984 and 985 to summing junction 986 shown in FIG. 9E. Similarly, CCD input signals 919 (FIG. 9A) may be summed or otherwise combined with other analog signals. Further, input signal 944 and recirculation signal 936 from hybrid memory arrangement 902 shown in FIG. 9C may be summed as input signal 949 if recirculation control signal 948 makes recirculation FET 947 conductive at the same time that input control signal 946 makes input FET 945 conductive. In one embodiment, summing may be performed with summing resistors as is well known in the art such as with summing resistors 984 and 985 to summing junction 986 as shown in FIG. 9E. For simplicity, summing resistors may not be shown such as for recirculation signal 936 and input signal 944 to summing junction 49. Still further, other analog summing arrangements are well known in the art.

In CCD compositor arrangement 903, an arrangement may be used to compensate for signal degradation, as discussed with reference to FIGS. 9C et seq above. Further, recirculation signal 960 may be scaled to the proper amplitude such as with well known scaling techniques using ADC 934 or, alternately, by adjusting summing resistors 984 and 985.

CCD CORRELATOR

A CCD correlator may be provided in accordance with the present invention using CCD memory and analog signal processing techniques. This CCD correlator will now be discussed relative to FIGS. 4, 6, 7, and 9.

One embodiment of a CCD correlator will now be discussed with reference to FIG. 4. Loading of a pilot signal into register 412 and loading of a trace signal into register 417 have been described for single-bit digital signal samples with reference to FIG. 4 above. If registers 412 and 417 are CCD registers, then analog signal samples may be stored therein. For a CCD correlator embodiment, pilot signal samples may be processed with amplifier 410 and trace signal samples may be processed with amplifier 415 which may be $\mu$A709 operational amplifiers. Gates 411 and 416 have been discussed above as digital gates for a digital embodiment but may be analog gates such as FET analog switches in an analog embodiment. Pilot signal samples may be loaded into CCD register 412 in analog signal form with a LOAD P signal in the zero-state inverted with inverter 414 for selecting input pilot signal from amplifier 410 with FET switch gate 411 for loading into register 412. Similarly, the LOAD P signal in the zero-state may be inverted with inverter 418 to select input trace signal from amplifier 415 with analog gate 416 for loading into CCD register 417 as analog trace signal samples. When the LOAD P signal and LOAD T signal go to the one-state, input pilot and trace signals from amplifiers 410 and 415 respectively are disabled with inverters 414 and 418 respectively and recirculation signals are enabled. Pilot sample register 412 may have an extra CCD shift register stage 413 for providing an extra one-bit time delay for recirculation through analog selection gate 411 and trace signal samples from CCD register 417 may be recirculated back to the input of CCD register 417 through analog selection gate 416.

Analog switches 411 and 416 may be field effect transistor (FET) switches with the outputs connected together either directly or with resistors for summing or conducting the selected signal from the selected FET switch to the input of CCD registers 412 and 417. Selection of the FET switches for conduction or for non-conduction may be provided with the LOAD P and LOAD T signals for gates 411 and 416 respectively. Therefore, analog signal gates may be provided for selection operations similar to the digital signal gates discussed above.

Product circuit 419 has been discussed as an exclusive-OR circuit for generating a single-bit product signal 424 in response to single-bit output signals from registors 412 and 417 for a digital single-bit embodiment. In the instant CCD embodiment, product circuit 419 may be any well known analog multiplier circuit such as discussed in detail for multiplier 778 (FIG. 7E).

Counter 420 and register 421 may be replaced by a CCD register for shifting analog product samples 424 as a CCD shift register for storage and for adding new correlated output signal samples to prior correlated output signal samples for compositing-after-correlation in the same form discussed for CCD compositor 903 (FIG. 9E).

In an alternate embodiment, one of the input signal may be stored as single-bit digital signal samples and the other input signal may be stored as analog signal samples. For example, pilot signal logic comprising squaring amplifier 410, inverter 414, gate 411, register 412, and flip-flop 413 may be single-bit digital logic elements as discussed above for the single-bit digital embodiment and operational amplifier 415, inverter 418, analog gates 416, and CCD memory 417 may be analog sample elements as discussed for the CCD correlator embodiment immediately above. Multiplier 419 may be implemented to multiply a single-bit digital sample and an analog sample such as a FET switch for conducting an analog signal sample from CCD register 417 in response to a one-state of the digital bit from register 412 and for non-conducting an analog signal sample from register 417 in response to a zero-state digital bit from register 412. Therefore, product signal 424 may be equal to the analog signal from CCD register 417 when the digital signal from register 412 is in the one-state and product signal 424 may be a zero signal when the signal from registers 412 is in the zero-state. CCD register or compositor comprising stages 420–421 may load or sum analog signal samples generated as signal 424 into register stages 420–421 for storage and for compositing operations. Therefore, a single-bit sample and an analog sample product arrangement may be implemented using the combination of techniques discussed for the single-bit digital embodiment and for the CCD analog embodiment above.

The arrangement discussed herein with reference to FIGS. 9F-9J may be used for preserving the precision of analog signal samples stored in CCD memories such as registers 412, 417, and 420–421. Therefore, input logic to registers 412, 417, and 420–421 may include a multiplexer for multiplexing an analog reference signal with the input signal samples and the output of these registers may contain refresh circuitry operating in response to the analog reference signal sample.

In an alternate embodiment, the correlation processing may be performed in parallel word form as will be described hereinafter for a single-bit digital pilot signal and an analog trace signal. A plurality of digital pilot signal bits from register 412 may each be used to select or non-select a corresponding FET multiplier switch such as indicated by multiplier 419 to control the updating of a plurality of analog output signal sample bits stored in register stages 420–421 in response to a single analog sample from register 417. Alternately, a single output digital sample from register 412 may control a plurality of multiplier gates 419 to either select or non-select updating of a plurality of output signal samples in register stages 420–421 in response to a plurality of analog signal samples from register 417. Therefore, although the arrangement shown in FIG. 4 has been discussed for a serial arrangement wherein a plurality of serial words in registers 412 and 417 may be processed with a single multiplier circuit 419 in sequential or serial form to update a plurality of output signal samples shifted between stages 420–421 in sequential serial form; the communication paths shown in FIG. 4 may also represent parallel signal communication paths or may represent combinations of serial and parallel communication paths. Further, sets of parallel processors such as parallel multipliers 419 may be provided for processing parallel signals in parallel signal paths.

The arrangement discussed with reference to FIG. 6D may also be implemented with a CCD register embodiment; For example, trace signal T may be processed with an operational amplifier 623 to provide input signal samples $T_L$. Sample device 624 may be a well known sample-and-hold circuit as discussed with reference to sample-and-hold 777 (FIG. 7E). Alternately, sample circuit 624 may be eliminated. P-ROM 625 may store single-bit digital signal samples for gating trace signal sample $T_L$ in response to a one-state pilot signal sample and for not gating trace signal sample $T_L$ in response to a zero-state pilot signal sample from R-ROM 625. Product circuit 626 may be a single FET switch as discussed with reference to FIG. 4 above for either gating or not gating the input analog trace signal samples to be summed into the output signal sample memory. Z-RAM 614 and Z-counter 613 may be replaced with a CCD memory for storing analog signal samples from product circuit 626 as discussed for a CCD embodiment with reference to FIG. 4 above and as discussed for compositor 903 with reference to FIG. 9E above.

Digital detector circuits 643 and 645 have been discussed as digital detectors with reference to FIG. 6D. Alternately, detectors 643 and 645 may be implemented as analog detectors such as Schmidt triggers or other analog threshold detectors for an analog output signal sample embodiment. Control circuitry including compositor control 632, one-shot 651, counters 616–619, decoder 622, and decoder 628 which have been discussed above for a digital embodiment but may also be used in conjunction with the analog or hybrid CCD memory embodiment.

A hybrid correlator embodiment has been discussed above with reference to FIGS. 4 and 6D, wherein the term hybrid correlator is herein intended to mean a correlator that provides correlation between a first signal having a plurality of digital signal samples and a second signal having a plurality of analog signal samples processed with a hybrid multiplier such as multiplier 419 (FIG. 4) and multiplier 626 (FIG. 6D). In the hybrid embodiments discussed above, the digital signal samples were assumed to be pilot signal samples and the analog signal samples were assumed to be trace signal samples. Alternately, the digital signal samples may be trace signal samples and the analog signal samples may be the pilot signal samples. For simplicity of discussion, the digital signal samples have assumed to be single-bit digital signal samples and hybrid multiplier 419 (FIG. 4) and 626 (FIG. 6) has been assumed to be single-bit hybrid multipliers such as a single FET switch. In an alternate embodiment, the digital signal samples may be multi-bit digital signal samples such as 4-bit digital signal samples and hybrid multiplier 419 (FIG. 4) and 626 (FIG. 6) may be a multiplying digital-to-analog (DAC)

converter such as multiplying DAC 933 (FIG. 9J) or may be other well known multiplying DAC circuits.

For the CCD correlator arrangement discussed with reference to FIG. 6D, the Z-store may be a CCD shift register being shifted under control of clock C2 as gated by composite signal $\overline{C01}$ and correlate enable signal Lm through OR-gate 629. Although Z-store has been discussed for a Z-Ram 614 with reference to FIG. 6D. replacement of Z-Ram 614 with a CCD shift register under control of the clock signal from gate 629 permits use of a CCD memory in the arrangement shown in FIG. 6D. Further, Z-counter 613 may be eliminated, wherein output signals $Z_K$ from a CCD Z-store may be recirculated and summed with analog product signal from analog multiplier 626 and analog gate 627. In this CCD compositor embodiment, CCD shift registers are not random access devices and therefore cannot be instantaneously synchronized with an input sync signal to gate 638. Therefore, it may be desirable to discontinue recirculation of the CCD shift register after completion of compositing and correlation operations under control of the Lm and $\overline{COM}$ signals to OR-gate 629. Therefore, Z-store implemented with a CCD shift register may be maintained in a static state except when compositing and correlating. As is well known in the art, a shift register such as a CCD shift register is a sequential access device under control of a clock signal, wherein accessing may not be performed in response to an address on a random access basis as discussed for Z-Ram 614 operating in response to K-addresses from K-counter 619. Therefore, K-counter 619 may not be required for accessing the Z-store but may be used primarily for initiating another load of J-counter 627 with the Jo-parameter and K-counter 619 with a zero-state or other initial condition with signal Km through NOR gate 621.

SAMPLED FILTER ARRANGEMENT

A sampled filter arrangement 1000 having important advantages over prior art filters will now be discussed with reference to FIG. 10. Arrangement 1000 incorporates many inventive features including a sample-on-the-fly arrangement, an improved memory arrangement, a hybrid arrangement, and other inventive features. For convenience of discussion, the sampled filter arrangement of the present invention will be discussed in the embodiment of a discrete Fourier transform (DFT) arrangement, which is intended to exemplify more general filter methods including other Fourier transforms, correlators, convolvers, compositors, FIR filters, and other filter arrangements.

The DFT arrangement of the present invention will now be discussed with reference to FIGS. 10A–10D to illustrate the processing methods. Elements $t_0-t_3$ represent time domain samples; where the first sample is $t_0$, the second sample is $t_1$, the third sample is $t_2$, and the fourth sample is $t_3$. These samples may be analog samples, digital samples, single-bit samples, or other samples. The time domain samples are mapped into frequency domain samples through appropriate constants such as by multiplying the input sample by the appropriate constant and summing the product thereof into the appropriate output sample storage location. Output samples are designated as the $f_0-f_3$ samples wherein the $f_0$ sample is the lowest frequency sample, the $f_3$ sample is the highest frequency sample, and the $f_1$ and $f_2$ samples are intermediate frequency related samples of ascending frequency significance.

For simplicity of discussion, time domain samples $t_0-t_3$ are assumed to be equally spaced in time and frequency domain samples $f_0-f_3$ are assumed to be equally based in frequency; but such equal time spacing and equal frequency spacing is not necessary for implementation of the system of the present invention. Further, for simplicity of discussion the number of time domain samples $t_0-t_3$ is shown equal to the number of frequency domain samples of $f_0-f_3$; although there may be fewer time domain samples than frequency domain samples or there may be fewer frequency domain samples than time domain samples. Therefore, for the general method, any number of time domain samples having any desired time spacing therebetween may be mapped into any number of frequency samples having any frequency spacing therebetween.

The mapping of any time sample $t_n$ into any frequency sample $f_n$ can be performed in the following manner. The time sample $t_n$ is multiplied by an appropriate constant and added into the related frequency sample or frequency bin. The constant is a function of the time relationship of the time domain sample $t_n$ and the frequency relationship of the frequency domain sample $f_n$. For example, the constants may be a pair of trigonometric constants, being the sine and cosine functions of the argument wt; where $w=2\pi f$ and wherein the f and t values of this argument are derived from the time-related source and frequency-related destination of the particular operation. Alternately, other constant terms may be used.

Figure 10A:
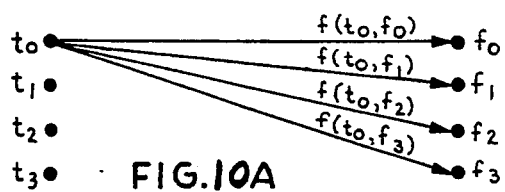
FIGS. 10A-10B illustrates a sampled filter arrangement in accordance with the system of the present invention wherein FIGS. 10A-10D set forth signal flow diagrams for a filter implementation, FIG. 10R sets forth a filter system block diagram, and FIG. 10F sets forth a hybrid filter arrangement in accordance with the block diagram of FIG. 10E.
Figure 10C:
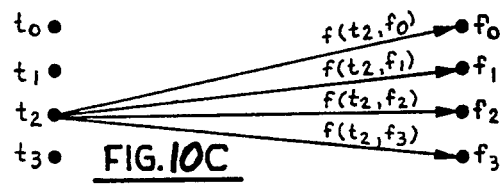
FIG. 10 comprising
Figure 10B:
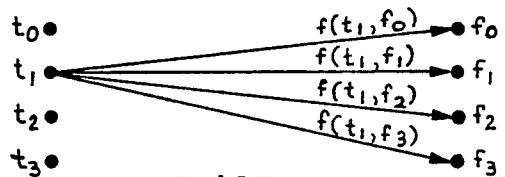
Figure 10D:
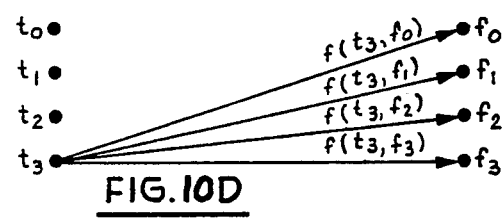

An example of operation will now be provided relative to FIGS. 10A–10D. As shown in FIG. 10A, the first time domain sample $t_0$ is mapped into each of a plurality of frequency domain samples $f_n$ by multiplying the $t_0$ sample by the appropriate constant (which is a function of the $t_0$ time source and the related $f_n$ frequency destination) and then summing that product into the appropriate frequency sample $f_n$. As shown in FIG. 10B, the second time domain sample $t_1$ is mapped into each of a plurality of frequency domain samples $f_n$ by multiplying the $t_1$ sample by the appropriate constant and then summing that product into the appropriate frequency sample $f_n$. Similarly and as shown in FIGS. 10C and 10D, the third and fourth time domain samples $t_2$ and $t_3$ are mapped into each of a plurality of frequency domain samples $f_n$ by multiplying the t sample by the appropriate constant and then summing that product into the appropriate frequency sample $f_n$. Therefore, for each of four time domain samples $t_0-t_3$ updating each of four frequency domain samples $f_0-f_3$ (FIGS. 10A–10D), each frequency domain sample $f_0-f_3$ will be updated four times, once for each input sample $t_0-t_3$. Alternately, input sampling can continue past the $t_3$ sample for subsequent updating of each of the four frequency domain samples $f_0-f_3$ or conversely a limited number of time domain samples such as four time domain samples $t_0-t_3$ can each be used to update a large number of frequency domain samples such as 64 frequency domain samples.

For simplicity of discussion, a single time domain sample is shown updating a single frequency domain sample (FIGS. 10A–10D). As is well known in the DFT art, updating of samples is typically performed using a complex (real and imaginary) number representation characterized by in-phase and out-of-phase updates, or sine and cosine updates, etc. In one embodiment, two time domain samples may be provided for each time domain sample period $t_0-t_3$ and each of the pair of time domain samples can be multiplied by the appropriate constant to update the corresponding one of a pair of complex frequency domain samples. Therefore for example, the $t_0$ time domain sample (FIGS. 10A–10D) may represent a pair of complex time domain samples, the $f_0$ frequency domain sample (FIGS. 10A–10D) may represent a pair of complex frequency domain samples, and the constant being a function of $t_0$ and $f_0$ may represent a pair of constants being a sine function and a cosine function of the time and frequency related argument. Alternately, the time samples $t_0$–$t_3$ may be single (not complex) samples, wherein each time sample t may be multiplied by a complex pair of constants to generate a complex pair of frequency-related updates for updating a complex pair of frequency domain samples f for each frequency. As another alternative, a complex pair of time domain samples may be generated by using a pair of non-complex time domain samples offset in time such as offset by one-half of the sampling period. Many other methods for satisfying the complex number requirements of a DFT will now become obvious from the teachings herein.

For simplicity of discussion, the methods shown in FIGS. 10A–10D use only four time domain samples t and four frequency domain samples f. In an actual implementation, such sets of four may be quadrature signals having zero and unity trigonometric functions and therefore represents an extremely simple configuration. It is herein intended that these groupings of four be exemplary of larger groupings that represent more practical implementations of a DFT.

The transform on-the-fly method of the present invention will now be discussed. When the $t_0$ sample is received (FIG. 10A) it is multiplied by the four constants that are functions of the $t_0$ time sample and of frequency and used to update each of the four frequency samples. When the $t_1$ sample is received (FIG. 10B), it is multiplied by the four constants that are functions of the $t_1$ time sample and of frequency and used to update each of the four frequency samples. When the $t_2$ sample is received (FIG. 10C) it is multiplied by the four constants that are functions of the $t_2$ time sample and of frequency and used to update each of the four frequency samples. When the $t_3$ sample is received (FIG. 10D), it is multiplied by the four constants that are functions of the $t_3$ time sample and of frequency and used to update each of the four frequency samples. Therefore, it can be seen that each time domain sample is fully processed and fully updates the frequency samples to implement the process-on-the-fly arrangement of the present invention.

A process-on-the-fly implementation has been disclosed for a correlator processor herein; which arrangement is equally applicable to a DFT processor or other filter arrangement to provide other arrangements such as a DFT.

A general implementation of a filter exemplified by a DFT wil be discussed with reference to FIG. 10E an a specific hybrid embodiment will be discussed with reference to FIG. 10F hereinafter. The sampled filter arrangement may be implemented in analog, digital, or hybrid signal processing form. Preferred embodiments of all three forms will be discussed hereinafter to exemplify the more generally applicable features of the present invention.

Many filtering and processing arrangements can be characterized as the sum-of-the product arrangement, wherein an input sample 1012 may be multiplied by a reference sample 1013 using a multiplier 1014 and summed with a summer 1017, with the output sample stored in output memory 1018. For example, a sequence of reference samples 1013 can be provided by memory 1010 to be processed with a sequence of input samples 1012 such as from input memory 1011 to be multiplied with multiplier 1014 and summed with summer 1017. Each input sample 1012 can processed with a corresponding reference sample 1013 such as disclosed with reference to FIG. 6D herein.

Arrangement 1000 is shown in block diagram form, wherein the elements and methods used therefor have been disclosed in detail in the instant application and in related applications. For example, reference memory 1010 may be the analog ROM as discussed with reference to FIGS. 1–3 of application Ser. No. 889,301 or may be a digital ROM such as ROM 625 at FIG. 6D herein. Further, multiplier 1014 may be an analog multiplier as is well known in the art, a hybrid multiplier such as a multiplying DAC, or a digital multiplier such as a single bit multiplier or a whole number multiplier as discussed in application Ser. No. 889,301 and as discussed herein. Further, summer 1017 may be an analog summer or a digital summer and output memory 1018 may be an analog memory or a digital memory as disclosed herein.

Further control arrangements, addressing methods and other concepts for sample filters are set forth in detail herein and various addressing and control arrangements are set forth in application Ser. No. 889,301; where these methods may be implemented in the structural form set forth relative to FIG. 10 herein. For example, a start address for accessing an ROM may be derived as set forth in FIG. 6 herein and may be preloaded into word counter 316 (FIG. 6A of application Ser. No. 889,301) to provide accessing the analog ROM of the present invention in accordance with the addressing method of FIG. 6 herein. Other adaptations of the system of FIG. 10 herein and the methods and arrangements of the system of FIG. 10 herein can now be provided by one skilled in the art from the teachings herein.

Arrangement 1000 characterizes a general sampled filter arrangement in accordance wtih the system of the present invention. Reference memory 1010 provides constant or reference information 1013. Memory 1010 may be an analog ROM in accordance with the present invention or a digital ROM such as ROM 625 at FIG. 6D herein. Alternately, reference memory 1010 may be an RAM, a core memory, or any other memory arrangement. Input memory 1011 may be a CCD or other serial memory or other memory arrangement disclosed herein or known in the art. Alternately, a process on the fly method in accordance with the disclosure in application Ser. No. 550,231 may be used, wherein input signal 1012A may be sampled directly from front end 1009 as signal 1012 and processed-on-the-fly without the need for input memory 1011.

Figure 10E:
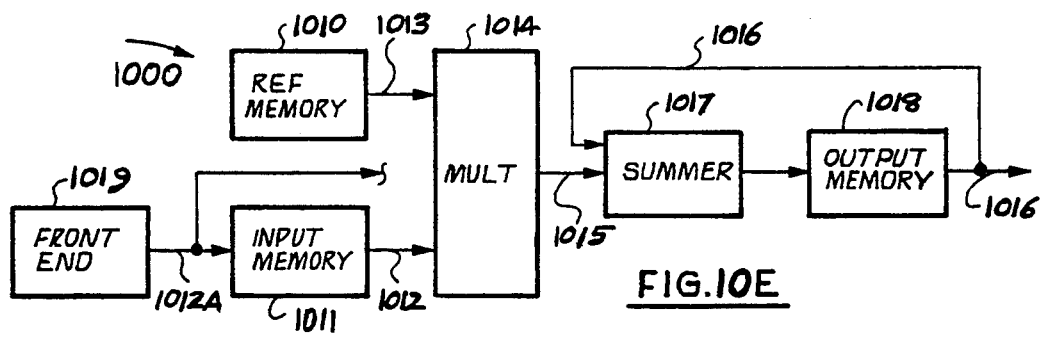
Figure 10F:
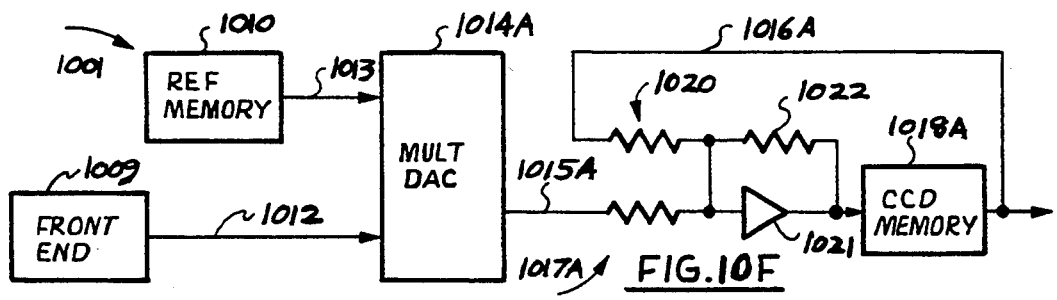

Because of the large number of combinations of analog and digital signal processors that may be implemented with the arrangement of FIG. 10E, the various combinations are summarized in tabular form in the TABLE OF PROCESSING ALTERNATIVES set forth herein. In this table; the elements (1010, 1011, 1014, 1017, and 1018) are set forth in columns and the embodiments (P0 to P31) are set forth in rows. For each embodiment, the elements in the columns are identified as either an analog element with a "0" symbol or a digital element with a "1" symbol. The table is organized in truth table form as a binary progression to identify all combinations in a convenient manner. For example, the first embodiment is a fully analog embodiment having all "0" elements and the last embodiment is an all-digital embodiment having all "1" elements, wherein all other embodiments may be considered to be hybrid embodiments having combinations of analog and digital ("1" and "0") elements. For convenience of reference, the binary numerical value of the combination of "1" and "0" terms in an embodiment is characterized by the decimal numerical value of the P reference number for that particular embodiment. For example, a "00111" embodiment can be characterized as a 7 based upon the weighted binary numerical value and defined as the P7 embodiment having digital elements 1010, 1011, and 1014 defined with "1" symbols and having analog elements 1017 and 1018 defined with "0" symbols.

For convenience of discussion and to limit the size of the TABLE OF PROCESSING ALTERNATIVES to a practical level, elements are defined as analog elements or digital elements by the analog or digital nature of the signals output therefrom. For example, reference memory 1010 may be the analog ROM of application Ser. No. 889,301 and may be characterized as an analog element if output signal 1013 is in analog signal form. Alternately, if an A/D converter is used in combination with the analog ROM for reference memory 1010, signal 1013 will be a digital signal and therefore element 1010 will be characterized as a digital element.

| REF NO → | 1018 | 1017 | 1014 | 1011 | 1010 | EMBODIMENT ↓ |
|---|---|---|---|---|---|---|
| P0 | 0 | 0 | 0 | 0 | 0 | ANALOG |
| P1 | 0 | 0 | 0 | 0 | 1 | HYBRID |
| P2 | 0 | 0 | 0 | 1 | 0 | HYBRID |
| P3 | 0 | 0 | 0 | 1 | 1 | HYBRID |
| P4 | 0 | 0 | 1 | 0 | 0 | HYBRID |
| P5 | 0 | 0 | 1 | 0 | 1 | HYBRID |
| P6 | 0 | 0 | 1 | 1 | 0 | HYBRID |
| P7 | 0 | 0 | 1 | 1 | 1 | HYBRID |
| P8 | 0 | 1 | 0 | 0 | 0 | HYBRID |
| P9 | 0 | 1 | 0 | 0 | 1 | HYBRID |
| P10 | 0 | 1 | 0 | 1 | 0 | HYBRID |
| P11 | 0 | 1 | 0 | 1 | 1 | HYBRID |
| P12 | 0 | 1 | 1 | 0 | 0 | HYBRID |
| P13 | 0 | 1 | 1 | 0 | 1 | HYBRID |
| P14 | 0 | 1 | 1 | 1 | 0 | HYBRID |
| P15 | 0 | 1 | 1 | 1 | 1 | HYBRID |
| P16 | 1 | 0 | 0 | 0 | 0 | HYBRID |
| P17 | 1 | 0 | 0 | 0 | 1 | HYBRID |
| P18 | 1 | 0 | 0 | 1 | 0 | HYBRID |
| P19 | 1 | 0 | 0 | 1 | 1 | HYBRID |
| P20 | 1 | 0 | 1 | 0 | 0 | HYBRID |
| P21 | 1 | 0 | 1 | 0 | 1 | HYBRID |
| P22 | 1 | 0 | 1 | 1 | 0 | HYBRID |
| P23 | 1 | 0 | 1 | 1 | 1 | HYBRID |
| P24 | 1 | 1 | 0 | 0 | 0 | HYBRID |
| P25 | 1 | 1 | 0 | 0 | 1 | HYBRID |
| P26 | 1 | 1 | 0 | 1 | 0 | HYBRID |
| P27 | 1 | 1 | 0 | 1 | 1 | HYBRID |
| P28 | 1 | 1 | 1 | 0 | 0 | HYBRID |
| P29 | 1 | 1 | 1 | 0 | 1 | HYBRID |
| P30 | 1 | 1 | 1 | 1 | 0 | HYBRID |
| P31 | 1 | 1 | 1 | 1 | 1 | DIGITAL |

Further, A/D converters may be used for generating digital output signals in response to analog input signals and D/A converters may be used to generate analog output signals in response to digital input signals to satisfy the conditions of the TABLE OF PROCESSING ALTERNATIVES. For example, relative to the P7 term; signals 1012, 1013, and 1015 from elements 1011, 1010, and 1014 respectively are digital signals while signals output from elements 1017 and 1-18 are analog signals. In order to facilitate this embodiment, it may be necessary to provide a D/A converter to convert digital signal 1015 to analog signal form for processing with analog summer 1017 and analog output memory 1018.

An analog sampled filter embodiment will now be discussed with reference to arrangement 1000. Reference memory 1010 may be the analog ROM of application Ser. No. 889,301 for generating analog samples 1013 to multiplier 1014. Input signal sample 1012 may be an analog signal sample such as from an analog input memory 1011 which may be a CCD or other analog memory. Alternately analog sample 1012 may be sampled with a sample-and-hold circuit or other circuit or may be sampled implicit in multiplier 1014; wherein such input signal sampling arrangements are discussed in application Ser. No. 550,231. Multiplier 1014 can be any known analog multiplier. Further, multiplier 1014 can have sample-and-hold circuits for processing input signals 1012 and 1013 and/or for processing product signal 1015. Product signal 1015 can be added to stored signal 1016 with summer 1017 and stored back into output memory 1018 in accordance with the arrangement discussed with reference to FIG. 6D herein. In this analog embodiment, summer 1017 can be an analog summer such as a differential amplifier, a resistor summing network, or other known analog summing arrangements. Output memory 1018 can be implemented as an analog output memory such as the CCD analog memory of the present invention or other analog memory arrangements.

A digital sampled filter arrangement will now be discussed with reference to arrangement 1000. Reference memory 1010, input memory 1011, and output memory 1018 can be any known digital memory devices such as ROM 625 and RAM 614 as discussed relative to FIG. 6D herein. Input signal 1012 and reference signal 1013 can be digital signals processed with digital multiplier 1014 to generate digital product signal 1015 for summing with digital summer 1017 and for storing in digital output memory 1018. Such a digital arrangement is discussed relative to FIG. 6D herein.

A hybrid sampled filter arrangement will now be discussed with reference to arrangement 1000. A hybrid arrangement is herein intended to mean an arrangement combining analog and digital signal processing. Hybrid embodiments may be implemented by various combinations of the analog and digital sampled filter arrangements discussed above.

In one hybrid embodiment discussed with reference to FIG. 10E; reference signal 1013 may be an analog signal and input signal 1012 may be a digital signal. Reference memory 1010 may be the analog ROM of the present invention for generating analog reference signal 1013. Input memory 1011 may be a digital memory for generating digital input signal 1012 or alternately digital signal 1012 may be derived directly from an A/D converter in a process-on-the-fly implementation. Multiplier 1014 may be a hybrid multiplier such as a multiplying DAC for generating product signal 1015 as an analog signal that is related to the product of analog reference signal 1013 and digital input signal 1012.

In another hybrid embodiment discussed with reference to FIG. 10F reference signal 1013 may be a digital signal and input signal 1012 may be an analog signal.

Reference memory 1010 may be a digital ROM for generating digital reference signal 1013 and input signal 1012 may be an analog input signal such as received from front-end circuitry 1009 such as transducers and signal processors. Multiplier 1014A may be a hybrid multiplier such as a multiplying DAC for generating analog product signal 1015A in response to the product of digital reference signal 1013 and analog reference signal 1012. Analog product signal 1015A may be summed with output signal 1016A with an analog summer such as summer 1017A having input summing resistors 1020, operational amplifier 1021 and feedback resistor 1022 The analog sum signal from summer 1017A may be stored in output CCD memory 1018A for subsequent updating with other product signals and for outputting as signal 1016.

In other hybrid embodiments, A/D converters may generate digital signals in response to analog signals and D/A converters may generate analog signals in response to digital signals to provide different combinations of hybrid signal processing.

May other sampled filter embodiments can be provided from the teachings of the present invention and the teachings of the referenced applications; wherein arrangement 1000 is provided merely to exemplify a preferred embodiment of the broadly related teachings of the present invention.

Various types of filters may be implemented with arrangement 1000 and with the various alternate embodiments from the teachings herein. For example, arrangement 1000 may be used to implement a correlator sampled filter, a Fourier transform filter, a compositor filter, and multitudes of other filters; as will be exemplified with several descriptions of preferred embodiments hereinafter.

A sample on-the-fly filter implementations will now be discussed for arrangement 1000. The on-the-fly filtering method has been disclosed relative to FIG. 6 herein; wherein this on-the-fly method will now be discussed relative to FIG. 10E. Input signal 1012 is processed on a sample-to-sample basis, wherein each sample of input signal 1012 is used to fully update a plurality of output samples prior to updating output samples with a next input sample. In this arrangement, input memory 1011 may be eliminated, wherein input signal 1012 may be a real time signal processed without memory buffering. In this arrangement, as each sample of input signal 1012 is provided to multiplier 1014, a plurality of reference samples 1013 are provided to multiplier 1014 for that single input sample 1012 to update a plurality of output samples in response to the single input sample 1012 and a plurality of reference samples 1013. In one embodiment, reference memory 1010 may be the analog ROM of the present invention that is sequentially accessed for blocks of reference samples and output memory 1018 may be the alterable analog memory of application Ser. No. 889,301. In this embodiment, a block of reference samples 1013 from analog ROM 1010 are accessed in synchronization with the accessing of a block of output signal samples 1016 from output memory 1018 for a particular input sample 1012 to update each of the sequence of output samples 1016 from output memory 1018 in response to the corresponding sample in the block of analog reference samples 1013 from reference memory 1010 Block accessing of an analog memory has been described in application Ser. No. 889,301 with reference to FIG. 6 and processing of input samples on-the-fly together with control logic, etc has been disclosed in detail relative to FIG. 6 herein.

A conventional (non-on-the-fly) arrangement will now be discussed for arrangement 1000. In a conventional arrangement input samples are stored in input memory 1011 and reference samples are stored in a reference memory 1010. A block of input samples 1012 are accessed from input memory 1011 and a block of corresponding reference samples 1013 are accessed from reference memory 1010 in synchronization therebetween for providing the proper reference sample as signal 1013 when a corresponding input sample is provided as signal 1012. Therefore, a sequence of corresponding signal pairs 1012 and 1013 are provided to multiplier 1014 in sequence for generating the product therebetween and for summing the sequence of products with summer 1017 for storing of the sum of these products as a single sample in output memory 1018. A change in the block of input samples accessed from input memory 1011 and/or a change in the block of reference samples stored in reference memory 1010 is then made to provide a new combination of signal sample pairs to multiplier 1014 to generate the next sample for storage in output memory 1018. Accessing of the appropriate blocks of samples from input memory 1011 and from reference memory 1010A for generating the particular output samples stored in output memory 1018 is well known in the art and, for example, is described in the reference by Rabiner and Gold. Selection of the appropriate block in memory may be provided with well-known addressing and selection arrangements and may be provided with the preferred embodiment discussed with reference to FIG. 6 in application Ser. No. 889,301 such as by preloading a start address into word counter 316 from computer 112R (FIG. 6A herein).

A correlator sampled filter will now be discussed for arrangement 1000. A real-time correlator can be implemented by multiplying an appropriate reference sample 1013 stored in memory 1010 by appropriate input sample 1012 using multiplier 1014 and adding together the appropriate product signals 1015 to generate output samples stored in output memory 1018. Conventional (non-on-the-fly) methods are well known in the art and non-conventional (on-the-fly) methods are discussed in detail herein such as with reference to FIG. 6D. For a process on-the-fly embodiment, for each input sample 1012; all output samples from memory 1018 are accessed with the same start address and in the same sequence and a plurality of reference samples 1013 are accessed from memory 1010 with a start address that changes as a function of a propogation or shifting method such as by being increments for each iteration of the processor, as discussed in detail herein such as with reference to L-counter 618 and J-counter 617 in FIG. 6D herein. This changing in the accessing start address of reference memory 1010 can be implemented with hard-wired counter logic such as discussed with reference to said FIG. 6D herein. Alternately, the accessing start address can be implemented under stored program processor control such as discussed with reference to FIG. 6 in application Ser. No. 889,301 by preloading word counter 316 with a start address determined under program control in computer 112R as defined with the flowcharts set forth in FIGS. 5A and 5B herein. Therefor, the on-the-fly correlator of FIG. 6 herein can be implemented with the analog ROM and/or the control arrangements of the present invention in the embodiment discussed with reference to FIG. 10A herein. Alternately, other correlator arrangements may be implemented with the arrangement shown in FIG. 10A using well-known methods for accessing reference samples 1013, input samples 1014, and output samples 1016.

A Fourier transform processor arrangement will now be discussed for arrangement 1000. For simplicity of discussion, a discrete Fourier transform (DFT) implementation will be discussed. A DFT is a well-known method of generating frequency-domain information from time-domain information wherein each input signal sample is multiplied by a pair of complex (real and imaginary) trigonometric samples and used to update the appropriate complex (real and imaginary) output samples. For an on-the-fly DFT implementation, as each input sample 1012 is made available to multiplier 1014 a block of reference samples 1013 are accessed from reference memory 1010 to update a block of output samples 1016 accessed from output memory 1018. The block of reference samples 1013 represent a sequence of complex pairs of trigonometric functions, having progressively increasing phases related to progressively increasing frequencies for a particular time delay, which are used to update output samples having progressively increasing frequencies corresponding to the frequency-related phases of the reference signals providing the updates. This method can be implemented with the correlator control arrangement set forth in FIG. 6D herein by storing the appropriate trigonometric constants in ROM 625 and by properly controlling the advancing of J-counter 617 for each input samples processed. In this DFT embodiment, the start address of J-counter 617 will be stepped to a start address related to the next block of reference samples rather than the next reference sample as implemented for the correlator mechanization. For example, the first block of DFT reference samples will correspond to the zero time phase shifts for each of the output frequency parameters, the second block of reference samples will correspond to the first sample time related phase shift for each of the output frequency parameters, etc. One form of this implementation would be to use L-counter 618 to identify the most significant part of the address and to use J-counter 617 for the least significant part of the address, being reset to zero and then incremented through the reference sample addresses of the selected block. In this form, J-counter 617 provides the least significant portion of the address, being the samples within the block, and L-counter 618 provides the most significant portion of the address, being the sample counter or block counter for accessing ROM 625 (FIG. 6D herein).

A compositor arrangement will now be discussed for arrangement 1000. A compositor is conventionally implemented by summing corresponding input samples from a plurality of different signals. In arrangement 1000, reference memory 1010 and multiplier 1014 may not be necessary, wherein input signal 1012 may be provided directly to summer 1017 as signal 1015 for summing with output signal samples 1016 and for storage in output memory 1018. This arrangement is similar to the compositor arrangement discussed with reference to FIG. 10E herein.

A beamformer arrangement will now be discussed for arrangement 1000. In a preferred embodiment, the beamformer is implemented as a single-bit beamformer in conjunction with a Fourier transform processor but the beamformer may also be implemented in other forms such as in whole number form. The beamformer and/or Fourier transform arrangements discussed herein may be implemented for a single beam or for a plurality of beams.

A beamformer can be implemented by summing the appropriate time and space-related samples together for a particular beam angle. Because summation is implicit in a Fourier transform arrangement, beamforming and Fourier transformation (or beamforming and other filter arrangements) can be implemented together for a simplified implementation. Time and spacial domain input samples 1012 can be obtained from a front-end transducer array 1009 summed together with summer 1017 and stored in output memory 1018. The proper time and spacial domain samples to be summed together can be defined by well-known beamformer concepts.

If Fourier transformation is also required such as for time domain beamforming and for frequency domain analysis, then each time and spacial domain sample can be multiplied by an appropriate Fourier transform constant with multiplier 1014 prior to summing of each update sample with summer 1017 and storage of the updated sample in output memory 1018. The proper product samples to be generated and summed together are defined by well-known beamformer and Fourier transform concepts.

A two-dimensional Fourier transformation can be implemented such as for frequency domain beamforming and frequency domain analysis in the form of a time domain and then a spacial domain transform. Each time domain and spacial domain sample may be multiplied by a pair of appropriate Fourier transform constants with multiplier 1014 or with a pair of multipliers prior to summing of each update sample with summer 1017 and storage of the updated sample in output memory 1018. The proper product samples to be generated and summed together are defined by well-known beamformer and two-dimensional Fourier transform concepts.

In another embodiment, the analog ROM of application Ser. No. 889,301 can be used in combination with an analog alterable CCD memory for sampled data filtering such as for correlation, Fourier transformation, etc. For example, the analog ROM can contain reference signal samples or pilot signal samples and the analog alterable CCD memory can contain input signal samples. These reference and input signal samples can be correlated together as discussed elsewhere herein or as is well known in the art such as for shift register correlation arrangements.

It is herein intended that the single-bit processing arrangements of the instant disclosure and of application Ser. No. 754,660 be usable with the system of FIG. 10. For example, the single-bit arrangement discussed with reference to FIG. 6D herein is intended to be usable with arrangement 1000 discussed herein such as for a single-bit Fourier transform processor. Further, the memory arrangements of the present invention can be used for constant register 453 and/or remainder register 451 (FIG. 4D) of application Ser. No. 754,660. For example, the analog CCD ROM of the present invention can be used for said constant register 453 and the analog CCD alterable memory of the present invention can be used for said remainder register 451.

Filtering operations provide an implicit enhancement of signal-to-noise ratio (SNR) and processing gain such as with the summation operation. Therefore, signals can be processed with low resolution, low accuracy, and/or low SNR circuits up to the summation operation; often without significant degradation of the final solution. Therefore, in a preferred embodiment, signals can be processed with relatively low precision, resolution, and/or SNR circuits such as analog, hybrid, low resolution digital, and/or low precision digital circuits before the summation operation and can be processed with relatively high precision, resolution, and/or SNR circuits such as high resolution and precision digital circuits for the summation operation for subsequent processing.

Because analog and/or hybrid signal processing can be lower in cost than digital signal processing and because digital signal processing preserves resolution, precision, and SNR characteristics; therefore analog and/or hybrid circuits can be used for front-end signal processing where resolution, precision, and SNR are less significant and digital circuits can be used for rear-end signal processing where resolution, precision, and SNR are more significant. A preferred embodiment of the present invention is represented by a hybrid embodiment having analog front-end signal processing and digital rear-end signal processing. Such an arrangement is characterized by embodiments P24 and may also be characterized by embodiments P16 to P30 and particularly embodiments P24 to P30 as set forth in the TABLE OF PROCESSING ALTERNATIVES herein. For example, in embodiment P24 reference memory 1010 may be the analog CCD ROM of application Ser. No. 889,301; input memory 1011 may be the analog alterable CCD memory of application Ser. No. 889,301 or alternately may be eliminated by processing signal 721A from front-end 1009 directly with multiplier 1014, multiplier 1014 may be any well-known analog multiplier, summer 1017 may be any digital summer and may include an analog-to-digital converter for converting analog product signal 1015 from analog multiplier 1014 to a digital signal for summing with digital stored signal 1016, and output memory 1018 may be a digital output memory such as a digital RAM as discussed with reference to FIG. 6D herein.

Another feature of the filtering arrangement of the present invention provides for output signal processing after filtering in a form that is inexpensive, efficient, and eliminates many error mechanisms. For simplicity of illustration, this inventive feature will be described in the embodiment of a single bit or incremental signal processing arrangement, but one skilled in the art will be able to implement other arrangements from the teachings herein.

In prior art systems such as fast Fourier transforms, output information is represented by complex (real and imaginary) information such as sine and cosine functions. Magnitude information is conventionally derived by calculating the square-root-of-the-sum-of-the-squares, or root-sum-of-the-squares (RSS) or vector sum to obtain magnitude information from the two trigonometric (complex) components. For an incremental or single-bit processor, the output quadrature components have been found to be linear components, not trigonometric components; wherein the two output quadrature components of a single-bit output signal can be summed directly as magnitudes and need not be vector summed as quadrature trigonometric components. This capability provides a simple magnitude implementation, reduces or eliminated phase-related errors, and provides other advantages. Simplicity is achieved, wherein the two quadrature components can be directly summed and need not be vectorially summed, thereby providing simpler processing circuitry.

In prior art systems such as Fourier transform type systems, samples are taken over a time aperture or sampling period, transformed to frequency-domain complex (real and imaginary) samples, then added into the proper frequency "bins". Each transformed sample represents magnitude of an inphase or quadrature component of the particular frequency value. The amplitudes of the inphase and quadrature complex samples represent vectorial components and therefore must be added vectorially such as with an RSS calculation to obtain a magnitude parameter. Because different time domain samples are taken at different times, any phase variations in the input samples will cause phase variations in the output complex samples over the time aperture of the samples. Therefore, for a particular output frequency bin, transformed samples having different phases will be added together linearly because of the sum of the products processing; where linear addition of phase varying complex components will introduce errors in prior art vectorially related quadrature signals. There phase-related errors can be reduced or eliminated by various methods in accordance with the present invention. A first method involves providing a vectorial computation on all quadrature components before being summed either together for magnitude information and/or before being summed with transformed components related to another input sample. A second method involves providing linear (not a trigonometric or vector) quadrature signals for direct or linear (not trigonometric or vector) addition for sum of the products and/or for magnitude type summing.

For the first method, when a pair of complex samples are transformed, then an RSS computation is performed thereon before summing with the other transformed samples. For the second method, a single-bit transform computation is provided to generate linearly related single-bit transformed samples that may be added directly without an RSS type computation. These two methods will now be discussed with reference to FIG. 10.

For the first method an RSS (square-root-of-the-sum-of-the-squares) computation will be inserted in each path that maps time samples $t_0$–$t_3$ into transformed samples $f_0$–$f_3$. For example, each of the two components of the $t_0$ complex sample would usually be multiplied by a related complex constant f ($t_0$, $f_0$) and added into the related complex output bins $f_0$. For the instant feature of the present invention, the two complex products would be combined with an RSS computation into a single magnitude product and added to other magnitude products in a single $f_0$ bin (not a pair of complex $f_0$ bins). Alternately, the RSS computation before summation can be replaces with other intermediate computations, where for example a simple sum-of-the-squares computation (without a square root computation) could be used to generate sum-of-the-squares or magnitude-squared outputs instead of RSS outputs. Therefore, because different transformed samples are added together in magnitude form, phase variations between input samples $t_0$–$t_3$ do not degrade precision of the output filtered signals. This feature of the present invention may be characterized as a magnitude-of-the-products calculation before sum-of-the-products calculation, or magnitude-before-summation calculation, or sum-of-the-magnitude calculation, or squaring-before-summing in place of the prior art sum-of-the-products calculation, or magnitude-after-summation calculation, or sum-of-the-complex-product calculation, or summing-before (or without) squaring respectively.

RSS or vector sum computations are well known in the art. An exact solution involves squaring the two components, then adding the squares, then taking the square root of the sum. A simplified approximate solution involves taking the absolute magnitude such as by changing any negative numbers to positive numbers, determining which is the larger of the two numbers, then adding the large to one-fourth of the smaller of the numbers; wherein the sum thereof represents an approximation of the RSS.

For the second method, a single-bit arrangement is provided, where input samples are single-bit and products are single-bit in accordance with the disclosure herein and in the referenced patent applications. Because single-bit products have a linear relationship and may be summed directly without an RSS computation, the effects of phase variations over the input aperture are inherently improved.

In view of the above an incremental, or single-bit, etc Fourier transform processor such as an FFT or DFT processor or other filter arrangement can provide significant improvements over conventional whole-number processors. A single-bit processor arrangement will now be discussed with reference to FIG. 10E. Front-end 1009 provides an analog time-domain signal 1012 to incremental multiplier 1014 to be incrementally multiplied with an incremental reference single-bit signal 1013 from reference memory 1010 using incremental multiplier 1014. Incremental input signal 1012 may be derived with a comparitor circuit such as a μA710 comparitor in front-end 1009. Reference memory 1010 stores the most significant bit or sign bit of the sine and cosine functions. Multiplier 1014 can be an exclusive-OR circuit for generating single-bit output signal 1015 in response to single-bit input signal 1012 and single-bit reference signal 1013. Summer 1017 added incremental product 1015 such as by incrementing a counter, wherein the number to be conditionally incremented is stored in memory 1018 and recirculated to summer 1017 to be incremented or to be not incremented in response to product signal 1015. This arrangement is similar to the correlator arrangement shown in FIG. 6D herein; where reference memory 1010, front-end 1009, incremental multiplier 1014, incremental summer 1017, and output memory 1018 of FIG. 10E may correspond to P-ROM reference memory 625, front-end element 623 and 624, incremental multiplier 626, incremental summer 613, and output memory 614 respectively as shown in FIG. 6D. Implementation of the arrangement shown in FIG. 6D in the form of a Fourier transform processor in accordance with the present invention has been discussed above such as by making minor changes to the logic associated with J-counter 617 and L-counter 618 and by entering the proper constants into P-ROM 625.

In one embodiment, the real and imaginary outputs may be preserved separately. In another embodiment, the real and imaginary outputs may be combined to form a vector sum or magnitude frequency related parameter for each output frequency value. In the former arrangement, each one of the two complex quadrature signals for each frequency value can be preserved separately, wherein input signal samples can be incrementally multiplied by incremental reference parameters and used to update the output complex parameters. In a vector magnitude embodiment, both the real incremental product and the imaginary incremental product can be used to update the same output frequency sample as a magnitude output frequency sample, wherein a complex input sample can be incrementally multiplied by each of two referenced samples and the two related incremental products can be added to the same frequency-related output signal sample.

In view of the above, the simple, efficient, low-cost implementation of a Fourier transform magnitude calculation is provided that reduces sensitivity to error mechanisms such as phase variations, phase jitter, noise, and other such effects.

This single-bit output signal processing feature of the present invention may be characterized as linear signal summation in contrast to vector signal summation or quadrature signal summation as implemented in prior art systems. In simple form, if a prior art signal processor were reduced in resolution to provide processing of single-bit signals and if output quadrature signals were added linearly rather than vectorially, then the improvements of the instant feature of the present invention is being practiced. Although this inventive feature represents a significant simplification over prior art signal processors in addition to the reduction in error mechanisms inherent in prior art signal processors, prior art signal processors are still implemented with the more expensive and more error prone arrangements, wherein the simplification provided by this feature of the present invention is certainly not obvious to prior art designers.

PROCESSOR FEATURES AND APPLICATIONS

A signal processing or filtering arrangement; herein called the Microwave Filtering Receiver (MFR) system for simplicity of discussion, is disclosed. The MFR system can use the Ultrafast Fourier Transform (UFT) processor, disclosed in application Ser. No. 754,660; which is pertinent to the present disclosure and which is herein incorporated by reference. Although the present disclosure is presented in the form of a microwave system, this microwave system disclosure is intended to exemplify other filtering systems including underwater acoustic, telephone communication, memory, and other systems. Relative to the pertinence of application Ser. No. 754,660; an illustrative embodiment disclosed therein is in the form of a single-bit processor, which is consistent with may teachings herein. Therefore, the teachings therein and the teachings herein may be used together in various combinations that can now be practiced by one skilled in the art from the teachings therein and the teachings herein.

MICROWAVE FILTER SYSTEM

The Microwave Filter Receiver (MFR) system represents an important advance in microwave receivers for radar, communication, electronic warfare and other such systems. Now, a technology is available that can reduce antenna and microwave transmitter and receiver requirements, utilize signals so small that they are virtually non-existent, and replace large antennas and discrete RF circuitry with digital large scale integration (LSI) circuitry. The MFR system is believed to characterize the next generation of microwave systems. In one embodiment, the MFR may be implemented with the UFT processor described in application Ser. No. 754,660. Other implementations thereof may also be used.

The UFT processor has been disclosed in the form of a Fourier transform processor for convenience of illustration. However, the teachings relative thereto may be used to implement other types of processors such as correlator, convolver, DFT, FIR, and other filter processors; various sum of the product processors; and processors performing other processing functions such as known in the DDA art.

Various features and applications of the UFT processor will now be described for one embodiment of the UFT processor consistent with the disclosures in application Ser. No. 754,660 and the disclosure herein.

The MFR technology is based on a new generation ultra-fast very low cost array processor for signal processing applications. It provides several orders-of-magnitude (hundreds of times) improvement over conventional array processors. The UFT processor provides such a significant improvement, new generations of systems can be configured to take proper advantage of this capability. These new generation systems cover the range of radar, communications, electronic warfare, and sonar systems and extend to applications never before able to use a digital array processor.

Salient features of the UFT processor includes the ability to operate hundreds of times faster then conventional (high input resolution) array processors, to be produced for less then 1% of the cost of conventional array processors for comperable tasks, and to provide levels of signal enhancement and filtering never before possible. These characteristics are derived from a new and novel systems concept that takes advantage of proven but unexploited concepts. In addition, a new and novel processor architecture has been configured to take advantage of these concepts to achieve capabilities never before available.

The UFT processor is inherently faster than conventional high speed processors. For example, the UFT processor can process over one billion ($10^9$) samples per second compared to conventional high speed processors which are limited to about one million ($10^6$) samples per second. Further, the UFT processor is inherently lower in cost then conventional high speed processors. For example, the UFT processor can be implemented in a slower speed configuration comparable to the speed of a conventional high speed processor for less than 1% of the cost of that conventional high speed processor.

Even if other processors could be configured to be as fast as the UFT processor but using conventional methods, such other processors would still not be feasible. For example, conventional methods cost hundreds of times more than with the UFT processor, possibly costing one million dollars for a conventional processor compared to $5,000 for a VLSI implemented UFT processor of the same throughput. Further, microwave "front end" converters that are necessary for operation are beyond the state-of-the-art for conventional processors, but are implicit with the UFT processor technology. Also, conventional processors cannot implement coherent processing after transformation (CAT TM), which is an important feature of the UFT processor and related systems.

Classically, introduction of a new technology has spawned new generations of systems. The UFT processor significantly expands the technology in digital array processing, providing capabilities that have never been utilized. Configuring of new generation systems around the UFT processor yields capabilities that far exceed conventional systems. For example, advantages that can be obtained with new generation microwave-type systems implemented with the UFT processor include (a) lower power transmitters,
(b) smaller size antennas,
(c) greater security and tolerance,
(d) greater range,
(e) greater precision, and
(f) lower cost, Further, new and unique capabilities of the UFT processor have not been fully applied but are expected to yield further advantages in new generation systems.

Therefore, the UFT processor technology provides a major advance in the state-of-the art and will yield new generation system having high speed and low cost signals processing capability.

The UFT processor has excellent features that are not available with other technologies and that are applicable to many different types of systems. Exemplary systems applications will now be discussed.

Microwave communication systems and radar systems transmit microwave signals in the hundred to thousand megahertz range. Microwave communications include RF communication, satellite communication, and a wide range of other communication. Radar includes search, attack, and doppler radar. Important considerations such as signal-to-noise-ratio (SNR) (discussed hereinafter) affects range, antenna size, power, security, and other considerations and can be enhanced with the UFT processor. Other UFT processor features such as very narrow bandwidth (discussed hereinafter) and frequency domain correlation can also enhance microwave communication and radar systems.

Active microwave systems radiate microwave energy that can be detected and evaluated by an undesired recipient. For example, radar signals can be analyzed for covert purposes, and in general microwave signals can be analyzed to defeat or misuse the system. The UFT processor has several features that significantly enhance the security of microwave systems. Extremely low level signals can be used for security, where the UFT processor has the capability to significantly enhance these signals (discussed hereinafter). Extremely narrow bandwidth can be used for security, where the UFT processor has the capability to detect and process such narrow bandwidth signals (discussed hereinafter). Therefore, the UFT processor can be used to enhance the security of microwave systems.

Microwave systems such as radar and communication systems are sensitive to signal amplitude and noise. Therefore, signal degradation such as due to high noise environments, long range, and jamming can adversely affect a microwave system. A high tolerance microwave system can be configured with the UFT processor which has the capability to significantly enhance signals, yielding reduced noise and extended range (discussed hereinafter). This signal enhancement capability, in combination with signature discrimination such as by correlation, can circumvent jamming. Therefore, the UFT processor can be used to enhance tolerance of microwave systems.

Electronic Warfare (EW) systems monitor microwave signals such as radar signals to generate countermeasures. These signals are often low level signals having short duration pulses and uncertain characteristics. The ability of the UFT processor to operate at ultrahigh speed, to enhance SNR, and to integrate for long periods of time facilitates improved EW systems.

A doppler radar navigation system for aircraft operates by transmitting a radar signal to the ground and measuring the change in frequency of the return signal. Change in frequency is proportional to velocity, permitting determination of instantaneous aircraft velocity. Velocity information is then used to compute aircraft position. The features of the UFT processor discussed above for radar and microwave systems are applicable to a doppler radar navigation system. Further, the very narrow bandwidth capability of the UFT processor permits accurate frequency discriminations, which is essential to a doppler system. Secure doppler navigation is an important industry objective. The features discussed above for secure microwave systems are also applicable to a secure doppler navigation system. Therefore the UFT processor can be used to enhance doppler navigation systems and can facilitate new generation high accuracy secure doppler navigation systems.

An active sonar system transmits acoustic signals to detect and characterize underwater objects such as submarines and mines. These signals may approach a megahertz for shorter range systems. Sonar echos are received with a hydrophone array and processed with a digital array processor. Complex processors are used for beamforming and signature analysis. Therefore, conventional systems are very expensive and limited in capability. The UFT processor can provide such beamforming and signature analysis at high speed for high frequency signals monitored with a large array, thereby providing greater precision and capability then with conventional processors. Further, the small size and efficient use of power enhances applications such as dip sonar and small vehicular systems which are severly limited in space and power. Also, the advantages discussed above for microwave and radar systems are applicable for sonar systems.

A sonar surveillance system is typically a passive system that "listens" for sounds such as from a submarine. These systems typically process long range low frequency signals having extremely low signal levels in very high noise levels. The advantages discussed above for active sonar systems and EW systems are applicable to sonar surveillance systems; particularly SNR enhancement, array processing, and signature analysis.

Advantages described herein are based upon MFR system and UFT processor innovations. These innovations will now be briefly discussed.

The MFR system is now feasible based upon a group of important characteristics derived with the UFT processor. UFT processor characteristics include extremely high performance; 100 to 1,000 times that of conventional digital filter processors; low cost; a microwave "front end" interface; and a virtually unlimited aperture that overcomes the severly limited aperture of conventional digital filter processor; which will be discussed below.

High speed is provided at relatively low cost. The highest speed conventional filter processors perform filter operations at a rate of one operation each 0.5 microseconds. The UFT processor performs a complete transform which includes thousands of filter operations each 0.1 microseconds, for a performance advantage of thousands of times over conventional filter processors.

Low cost is provided, where a price/performance ratio of 100 to 1,000 times better than the most competitive filter processors can be achieved. This advantage is derived from a unique processor architecture, providing extremely high performance with a minimum of circuitry.

Processing of samples at microwave frequencies necessarily requires an input interface that generates samples at microwave frequencies. Conventional analog to digital (A/D) converters cannot operate at microwave frequencies. Therefore, the UFT processor could not be interfaced to an antenna using conventional methods. A unique input interface has been configured that converts input microwave signals to a form required by the UFT processor consistent with the microwave sampling rate. This input interface solves a major problem associated with microwave signals processing.

Processing of samples at microwave frequencies generates output samples at microwave frequencies. This output sample frequency exceeds the capability of other components of conventional systems. Because the MFR system uses coherent integration after transformation to enhance SNR, an ultra-high speed integrator is used to integrate the output samples for SNR enhancement and for data compression. This arrangement receives low SNR samples at an ultra-high rate and generates high SNR samples at a reasonably low rate.

A virtually unlimited aperture is provided compared to the severly limited aperture of conventional filter processors. SNR enhancement is a function of the aperture, where SNR enhancement is generally considered to be proportional to the square root of the number of samples. Therefore, a conventional FFT processor with a 1,000 point FFT obtains an SNR enhancement of 33 times while the UFT processor with a virtually unlimited aperture has a virtually unlimited SNR enhancement. The virtually unlimited aperture of the UFT processor is derived from a unique coherent-integration after transformation (CAT TM) capability not available with conventional filter processors.

The UFT processor has a unique coherent-integration after transformation (CAT TM) capability, not available with conventional processors. Conventional processors require an amount of hardware or time that is exponentially related to the aperture size, while the UFT processor uses the same hardware on a time shared basis to expand the aperture. Therefore, the UFT processor eliminates the intolerable hardware or time constraints for large apertures.

In an FFT processor, the number of filter operations (called "butterflies") is $(n/2)\ln(n)$, where n is the number of samples in the aperture. For a conventional FFT processor; a 1,024 point FFT requires 5,120 "butterflies" and an 8,129 point FFT requires 53,248 "butterflies". Therefore, large apertures require enormous amounts of hardware or time for conventional FFT processors.

The UFT processor provides a very large aperture with CAT TM. For example, the UFT processor can implement a 1,024 point FFT; solve the FFT one thousand times in rapid succession; and integrate ten thousand solutions together, sample by corresponding sample. This capability provides a one million point aperture (1,024 point FFT by 1,000 integrations) for one thousand times SNR enhancement. Such an enhancement is extremely expensive with conventional antennas and receivers and virtually impossible with conventional FFT processors. For example, a one million point FFT would require about ten million "butterflies" with a conventional FFT processor, exceeding practical hardware and time considerations.

The UFT processor achieves practical CAT ™ not available with conventional FFT processors. Conventional FFT processors require a root-sum-square (RSS) operation on complex FFT components. This RSS effectively rectifies the noise, where CAT ™ processing in conventional systems will not fully enhance SNR. The UFT processor has a unique CAT ™ implementation, where SNR is fully enhancement for the CAT ™ processing.

The UFT processor includes many salient features that facilitates the systems advantages discussed above. These features include the following.
(a) High sample rate and throughput.
(b) Signal-to-noise-ratio enhancement.
(c) Wide aperture.
(d) Narrow bandwidth.

The combination of all of these features yields a truely important advance in the state-of-the-art yielding a profound impact on signal processing systems.

Sample rate and throughput will now be discussed. Sample rate and throughput are very important parameters in signal processing systems. Throughput or computational speed limits the true sample rate because the processor must be able to process the samples at the sample rate for effective operation. Sample rate, computational speed, and throughput will be used interchangeable herein.

Sample rate limits the highest frequencies that can be processed and affects SNR enhancement (discussed hereinafter) and other important parameters. Conventional high speed FFT processors have sample rates of about one-MHz, far too slow for processing microwave signals and severly limiting other capabilities. The UFT processor can easily process 400 MHz sample rates and several thousand MHz appears feasible. Therefore, the UFT processor can digitally process microwave signals, which is not possible with other processors.

This ability of the UFT processor to operate hundreds and possibly thousands of times faster then conventional high speed processors provides important advantages including direct processing of microwave signals, detecting very high speed signals, and greater SNR enhancement.

An indication of the UFT processor speed is provided with the following example. A 512-point FFT computation requires over 9,000 multiplications in addition to other operations. Execution of this FFT computation at a 10-MHz rate, consistent with the UFT processor capabilities, provides a rate of $90 \times 10^9$ (90 billion) multiplications per second. This is 100,000 times faster then a general purpose digital computer and 10,000 times faster than a conventional high speed array processor. Nevertheless, the UFT processor can be produced at lower cost then either the general purpose computer or the array processor.

Signal to noise ratio (SNR) will now be discussed.

SNR is a major limitation on microwave systems. The ability to detect small signals and the accuracy of analyzing signals is limited by the SNR. Although signals can be amplified, superimposed noise is also amplified. Therefore, SNR is a limiting characteristic for microwave system receivers. Large antennas and sophisticated receivers are conventionally used to enhance SNR; resulting in large, expensive mechanical and analog devices. Further, high power transmitters are conventionally used to increase signal strength and the attendant SNR.

Filters are a well known method for enhancing SNR. Analog filters and conventional digital filters are severely limited in enhancement ability. The MFR system uses a new filtering technology that has virtually unlimited SNR enhancement. Therefore, the MFR system can process signals lost in the noise and can reduce requirements for large antennas, sophisticated receivers and high power transmitters.

Analog filters are conventionally used to enhance SNR. Analog filters are typically used to narrow the frequency band and therefore to reduce noise that is outside the band. Unfortunately, analog filters are very limited relative to noise occuring inside the band. Therefore, the limited capability of analog filters has required use of high power transmitters, large antennas, and sophisticated receivers and has limited the ultimate level of useable signal.

Conventional digital filters are sometimes used to enhance SNR. Because of the relatively high cost, low speed, and limited aperture of conventional digital filters; only the most trivial SNR enhancement is possible. For example, conventional digital filters are hundreds of times too slow to directly sample microwave frequencies and, for any practical price, have an aperture that is so narrow that the objectives of the MFR system would be considered to be impossible.

The MFR system significantly reduces antenna requirements. Antennas provide signal gain by "accumulating" signals over the area of the antenna. The larger the antenna, the greater the area and the greater the signal gain. With the MFR system, gain and SNR enhancement is obtained through digital filtering. Therefore, digital LSI circuitry can be traded off against antenna size to optimize the overall system. Because of the low cost, small size, high reliability, and flexibility of digital LSI circuitry; the MFR system reduces antenna size and the problems associated with large mechanical devices.

The MFR system significantly reduces receiver requirements. Receivers provide low noise signal amplification and frequency selection with microwave, FR, and analog circuitry. With the MFR system, gain and SNR enhancement and frequency selection is obtained through digital filtering. Therefore, digital LSI circuitry can be traded-off against microwave, RF, and analog circuitry to optimize the overall system.

Although much of conventional receiver circuitry is miniaturized; devices such as waveguide, stripline, and discrete circuit components prevents the level of integration that is obtained with digital LSI circuitry. Therefore, the MFR system will significantly enhance microwave receivers.

The MFR system significantly reduces transmitter requirements. Transmitter power is determined by the required receiver SNR. For example, long distance communication and radar systems require high power transmitters in order to provide an acceptable SNR at the receiving antenna. With the MFR system, SNR is enhanced through digital filtering. Although much of conventional transmitter circuitry is miniaturized; devices such as wave guide, stripline, discrete circuit components and power devices prevent the level of integration that is obtained with digital LSI circuitry. Therefore, digital LSI circuitry can be traded-off against transmitter power to optimize the overall system.

SNR is a critical parameter is signal processing systems such as radar, communications, and sonar systems. SNR limits the ability to perform. For example, SNR determines range, precision, errors, and other critical parameters. Therefore, such systems are designed to maximize SNR.

SNR is enhanced as a function of the square root of the number of samples that can be coherently integrated. Some enhancement is obtained from non-coherent integration when SNR is high (large signals in lose noise levels). Unfortunately, SNR enhancement is most important when SNR is low (small signals in high noise levels). Therefore, non-coherent integration has reduced effectiveness when needed most, in very low SNR environments.

Conventional signals processors are severly limited in sample rats and sample quantity for coherent integration. For example, a conventioanl high speed signals processor can operate at one MHz sample rate for a 1,024 sample transform to achieve an SNR enhancement of 32-times ($\sqrt{1,024}$). Additional integration is typically noncoherent and therefore has reduced value in low SNR conditions where SNR enhancement is most important.

The UFT processor has a virtually unlimited SNR enhancement capability. Sample rates can be extremely high; possibly exceeding 1,000 MHz. Apertures can be extremely long, possibly exceeding one-second. SNR enhancement is related to sample rate and aperture size. Therefore, the UFT processor can provide extensive SNR enhancement to pull virtually non-existent signals out of the noise in which they are buried. This capability permits reduced transmitter power, antenna size, system range, and error rates and permits enhanced precision over conventional systems.

The aperture considerations will now be discussed. The aperture in a signal processing system affects the SNR enhancement, the bandwidth, and other important parameters. The aperture is related to the number of samples received and processed. Conventional FFT processors can use an aperture of about 1,000 points for a practical transform. Non-coherent integration of several transforms can provide an increase in aperture, but with reduced effectiveness. The UFT has a virtually unlimited aperture based upon an extremly high sample rate (discussed above) and coherent integration after transformation (CAT TM) capability. The UFT processor can achieve apertures of one billion samples based upon microwave sample rates and CAT TM capability, which is thousands of times better then with conventional high speed processor. Because important parameters such as SNR enhancement and bandwidth are related to the aperture, the UFT processor can provide state of the art capabilities (for signal enhancement and frequency discrimination).

Bandwidth considerations will now be discussed. Array procesor bandwidth is a function of the aperture size. For example, a one-ms aperture yields a one-KHz bandwidth and a one-second aperture yields a one-cycle bandwidth. A very important feature of signal processing systems is the ability to discriminate between different frequencies. Because of the UFT processor ability to implement large apertures (discussed above) it has exceptional frequency discrimination capabilities.

The MFR system is described using the UFT processor. Although Fourier transformation is an important form of digital filtering, the MFR and the UFT processor are not limited to Fourier processing. The UFT processor presents a general purpose implementation of sum-of-the-products processing, where most filtering algorithms of interest are sum of the product algorithms. The UFT processor was configured in the form of a Fourier transform processor merely for the purpose of a benchmark comparison with conventional FFT processors. Therefore, the MFR system and the UFT processor represent general purpose ultra-fast microwave processing capability.

The MFR system uses conventional circuits to provide revolutionary capability. Many innovations were required to facilitate the MFR system, which now yields a way to significantly reduce transmitter, antenna, and receiver requirements with digital LSI circuitry. The potential of reducing a large antenna by ten feet using a 1-inch integrated circuit and the potential of reducing a powerful transmitter by kilowatts using a 10 watt integrated circuit are predicted. Also, the use of signals that are lost in the noise and previously considered to be too small to receive can now be accomodated.

The maturing of the microwave technology will be characterized by ultra-high speed digital processors on LSI circuits replacing large antennas, powerful transmitters, and ultra-sensitive receivers. The MFR system is the forerunner of this new generation of microwave systems.

IN CLOSING

The features of the present invention have been discussed in detail above with reference to FIGS. 1-9. In closing, some of the important features of the present invention will be briefly discussed.

The improved digital filter of the present invention incorporates many important features that provide high speed, high accuracy, low complexity, and low cost with unique implementations and algorithms. A digital correlator and a digital compositor are used to exemplify a generalized digital filtering implementation. Processing of low resolution input information to generate high resolution output information enhances characteristics of a digital filter. Processing of input information in real-time reduces hardware complexity and improves operational capability.

Digital filtering algorithms are provided for processing low resolution input information to generate high resolution output information. Processing of low reduction input information simplifies circuitry and increases processing speed. Updating of high resolution output information is accomplished by low resolution updating of high resolution output information in response to low resolution processed information.

Single-bit input information provides the limiting case of low resolution input information, where single-bit information is simple to acquire and simple to process. Single-bit information may be considered to be a sign-bit signal, wherein the sign-bit may be considered to be the most-significant-bit of a digital word and wherein the sign-bit may be used as the single-bit resolution word. Such a sign-bit signal for a single-bit resolution word may be converted to digital form merely by detecting the positive or negative polarity of an input analog signal, wherein a polarity detector such as a comparitor or a Schmidt trigger may be considered to be a single-bit analog-to-digital converter.

A single-bit computation is provided as the limiting case of low resolution input information for updating high resolution output information. Single-bit computations may be implemented with simple circuitry and may be performed at high speed. For example, a single-bit multiplication operation may be performed by comparing sign-bits of the input signals to determine the sign-bit of the product; wherein multiplication of similar sign-bits, either both positive or both negative, yields a positive product sign-bit and multiplication of different sign-bits, a positive and a negative sign-bit, yields a negative product sign-bit. Single-bit or incremental multiplication may be performed with an exclusive-OR circuit, a coincidence circuit, or other single-bit comparison circuits to yield a single-bit product signal. Similarly, incremental addition can be implemented with simple circuits and provides high speed operations. Incremental addition may be performed with a simple counter arrangement and may be used to update high resolution sums in response to low resolution or incremental resolution operations. Incremental addition may be performed by either incrementing or non-incrementing the sum or by either incrementing or decrementing the sum in response to a binary state of an incremental number.

Real-time digital filtering provides for processing input information as it becomes available with reduced dependence upon buffering or storing of input information. A single channel digital filter may sample an input signal and may update a plurality of samples of an output signal in response to each input signal sample as the input signal samples are acquired, thereby eliminating the need to store or buffer input signal samples. Updating of output information in response to an input signal sample may involve the partial updating of each of a plurality of output samples in response to a single input sample. For an example of a correlation digital filter, each trace signal sample may contribute to the magnitude of a plurality of output signal samples, wherein a trace signal sample may be used to update a plurality of output signal samples. Similarly, each output signal sample may have a magnitude related to the magnitude of a plurality of trace signal samples and therefore may be updated in response to each of a plurality of trace signal samples, all of which contribute to the magnitude of the particular output signal sample. Therefore, a real-time correlation arrangement may provide for updating of a plurality of output signal samples in response to each trace signal sample as acquired.

A multi-channel digital filter arrangement may be implemented to update output signal samples with a plurality of sequential spacial-domain samples. Input samples from each of a plurality of spacial-domain channels may be acquired and processed for each sequential sample period, wherein processing involves updating of output information in response to spacial-domain samples across an array on a channel-by-channel basis as the sampling progresses in the temporal-domain on a sample-by-sample basis. In a simple embodiment wherein each channel is maintained separate and the plurality of channels do not interact, each channel may be sampled for a particular sample interval and each channel sample may be used to update output signal samples related to that particular channel without interacting with other channels. In alternate embodiments wherein the output signal samples are updated by samples from each of a plurality of input channels, the spacial-domain input samples across the array may be processed either together or separately to update the same output information having interaction therebetween.

Various digital filtering techniques may be combined to provide a plurality of interacting digital filter arrangements. This capability may be exemplified by the combination of a correlator filter and a compositor filter. Compositing may be performed in the time-domain or in the frequency-domain and correlation may be performed in the time-domain or in the frequency-domain. Various combinations of compositing and correlation may be provided including time-domain compositing and time-domain correlation, frequency-domain compositing and frequency-domain correlation, time-domain compositing and frequency-domain correlation, and frequency-domain compositing and time-domain correlation. Further, the arrangement may include either compositing-before-correlation or compositing-after-correlation capabilities. Therefore, an arrangement may be provided having time-domain compositing before time-domain correlation, frequency-domain compositing before frequency-domain correlation, time-domain compositing before frequency-domain correlation, or frequency-domain compositing before time-domain correlation. Alternately, the arrangement may provide time-domain correlation before time-domain compositing, time-domain correlation before frequency-domain compositing, frequency-domain correlation before frequency-domain compositing, and frequency-domain correlation before time-domain compositing. Therefore, alternate computations of compositing-before-correlation and compositing-after-correlation may be provided with either frequency-domain or time-domain correlation and with either frequency-domain or time-domain compositing.

A plurality of correlator channels may be provided for separation of selected signal components from an input signal or from a plurality of input signals. In one embodiment, a single input signal may be composited over a plurality of ensembles to provide a composited input signal, wherein the composited input signal may be correlated with a plurality of different correlator channels, and wherein each correlator channel may have a different correlation pilot signal for separating a different signal component from the composited signal with each correlator channel. In another embodiment, a plurality of correlator channels may process a single input signal wherein each of the correlator channels is responsive to a different pilot signal for separating different signal components from the input signal, wherein the output signals from each of the correlator channels may be composite together. In still another embodiment, a plurality of correlator channels may process an input signal with a different pilot signal for each of the correlator channels to separate different signal components from the single input signal without compositing the output signals theretogether. In yet an alternate embodiment, a plurality of input signals may each be processed with a corresponding correlator channel for outputting independent and separate correlator output signals. In yet another embodiment, a plurality of input signals may each be processed with a related correlator channel to generate a correlated output signal for each channel, wherein the plurality of correlated output signals from the plurality of channels may be composited together to provide an output composited signal related to the plurality of correlated input signals. In still yet another embodiment, a plurality of input signals may each be processed with a separate compositor to provide a plurality of composited input signals, wherein each composited input signal may be processed with a related correlator to generate a correlated and composited output signal for each of a plurality of compositor and correlator channels and wherein the plurality of output signals may be maintained separately therebetween or may be composited theretogether in a composite-before-correlation and a composite-after-correlation combined arrangement.

A plurality of correlator channels may be provided for separation of signal components with either a different pilot signal for each correlator channel or the same pilot signal for the plurality of correlator channels. Similarly, each of the correlator channels may process the same input signal or each of the correlator channels may process different input signals in response to the pilot signal. Various combinations of these capabilities may provide special advantages. In one arrangement, a plurality of correlator channels may each process a related input signal different from the other input signals to the other channels in response to a pilot signal that is different from the pilot signals of the other correlator channels. In another embodiment, a plurality of correlators may each process the same input signal in response to different pilot signals wherein the input signal for each of the plurality of correlator channels is the same and wherein the pilot signal for each of the plurality of correlators is different therebetween. In yet another embodiment, a plurality of correlator channels may each process a related input signal that is different from the input signals for the other correlator channels in response to the same pilot signal, wherein each of the plurality of correlator channels may have an input signal that is different from the input signals to the other correlator channels and may have a pilot signal that is the same as the other pilot signals for the other correlator channels. In still another embodiment, a plurality of correlator channels may each process the same input signal in response to the same pilot signal, wherein the input signal may be the same for each of the plurality of correlator channels and wherein the pilot signal may be the same for each of the plurality of correlator channels.

A correlator arrangement may have particular advantages by combining the correlation and compositing operations, wherein the compositing operation may be implicit in the correlation operation for compositing-after-correlation. A correlator may be implemented with a sum-of-the-products algorithm providing a sum-of-the-products computation for each of a plurality of correlations and may also provide an implicit compositing-after-correlation capability. In one embodiment, a plurality of trace signals may be correlated with the same pilot signal and may be composited-after-correlation by summing the products theretogether between different correlated trace signals. In another embodiment, a plurality of trace signals generated together or generated having overlapping therebetween may each be correlated and wherein the products of each correlation may be summed together for compositing-after-correlation between a plurality of channels. Similarly, the various alternate embodiments discussed above for a plurality of correlator channels may be composited theretogether by summation together of the products generated by each of a plurality of channels.

An iterative correlation algorithm is provided for iterating through various loops as the correlation computation progresses. A real-time correlation algorithm may have a high speed inner iterative loop for updating a plurality of output samples in response to a single trace signal sample and a plurality of pilot signal samples and may have a lower speed outer iterative loop for sequencing through each of a plurality of trace signal samples, wherein each of the plurality of trace signal samples accessed with the outer loop may be processed with the plurality of inner loop iterations mentioned above. Further, a middle iterative loop may be provided for sequencing through each of a plurality of trace signal channels, wherein each sample from each of the plurality of channels may be processed with the high speed inner loop and wherein the plurality of channels accessed with the middle loop may be provided in response to each sequential time interval sample associated with an outer loop iteration. Such a multiple iterative loop arrangement may be implemented in a software embodiment with a stored program computer such as with multi-level indexing operations and may be provided in a special purpose hardwired logical arrangement under control of a plurality of counters.

A compositing-after-correlation algorithm is provided wherein the update of output signal samples are the same for each of a plurality of different trace signal correlations, thereby permitting correlations to be continued with the computational updates being compatible for each of a plurality of trace signals. Therefore, correlation may be provided for a plurality of trace signals all updating the same output signal samples, thereby providing compositing-after-correlation capability. Compositing-after-correlation is provided by compositing together updates from a plurality of traces, wherein the updates are compatible independent of which of a plurality of signals is being correlated. This capability may be extended to encompass simultaneous correlation of each of a plurality of trace signals and updating of a common output signal in response to each correlation operation for compositing a plurality of simultaneously correlated or sequentially correlated trace signals together.

Generation of continuous pilot signals or generation of overlapping pilot signals in a geophysical embodiment may eliminate unnecessary time delays such as associated with the prior art listening period between completion of a first ensonifying signal and initiation of the next subsequent ensonifying signal. Elimination of listening periods may be provided by generating sequential or overlapping ensonifying signals having different signatures therebetween and being separable therebetween through correlation. Such an arrangement may involve implementation of a plurality of correlator channels, each channel having a different pilot signal for correlating with each of the signatures associated with the different ensonifying signals.

Reduction of digital noise, computational noise, and correlation sidelobes may be accomplished by compositing together a plurality of correlated signals, wherein each of the plurality of correlated signals may be generated in response to a different pilot signal signature. Each correlated signal may be generated in response to a different pilot signal signature and may have different sidelobes and other effects related to undesirable signal portions, wherein the compositing-after-correlation of such correlated signals may provide for reduction of the undesirable signal portions.

An embodiment is provided for monitoring a non-repeatable type of ensonifying signal such as a dynamite blast and correlating the received trace signals with the monitored ensonifying signal. A plurality of correlated signals may be composited therebetween in response to correlation with a pilot signal derived by measuring the ensonifying signals; thereby permitting compositing of signals after correlation related to non-repeatable ensonifying signal sources such as dynamite blasts.

The compositing-after-correlation feature of the present invention provides important efficiencies of mechanization. For example, the usual requirement for a large input memory for buffering uncorrelated trace signals may be eliminated. Further, compositing-after-correlation may be provided as being implicit in the correlation mechanization of a preferred embodiment, where compositing capability may be obtained without the need for special compositing devices. For example, the correlation algorithm involves a sum-of-the-products computation while compositing involves a sum computation, where the sum of the products computation of the correlation mechanization includes the summation computation associated with compositing and therefore minimizes special compositing computational logic. Still further, a significant amount of time may be saved by compositing as part of a correlation operation wherein the usual prior art requirement to composite at a different time than the time to correlate is eliminated by providing both compositing and correlation substantially simultaneously.

A preferred embodiment of a compositor and correlator uses counter control logic and incremental computational logic for providing correlated output signal samples. A C-counter is used to generate a sequence of control signals for sequentially controlling various correlator operations. A J-counter is preloaded with an initial address and controlled to countdown through a sequence of pilot signal sample addresses. A P-store provides pilot signal samples in response to addresses from the J-counter. A trace signal is sampled and converted to a single-bit signal form with a squaring amplifier and flip-flop to be compared with the stored pilot signal sample to determine correspondence therebetween. An exclusive-OR circuit may be used to provide such comparison to determine whether the single-bit trace and pilot signal samples are the same or are different for generating an update signal related to correspondence therebetween. A disable control arrangement is provided to disable the update signal for undesirable or blank update conditions outside of the range of acceptable pilot signal samples. An L-counter is provided to count trace signal samples for determining when the trace signal has been completed and therefore when a correlation operation has been completed. A K-counter is provided to sequence through a set of output signal samples synchronous with the sequencing through the set of pilot signal samples under control of the J-counter. The K-counter may be preloaded with a first output signal address and may be controlled to increment through the set of output signal samples. An output sample store is provided for storing output signal samples that are updated under control of an enabled update signal. The K-counter provides an address for accessing samples for updating and for again storing updated samples into the Z-store. A Z-counter is provided for receiving the sample for updating from the Z-store, for providing an incremental update in response to an enabled update signal, and for again storing the updated signal in the proper location in the Z-store. A clear control and a composite control may be provided for controlling compositing-after-correlation. The clear control may be used to clear the Z-store after a compositing and correlation operation has been completed. A composite control may be provided for determining the number of correlated trace signals that are to be composited together and for discontinuing compositing and correlation operations in response to the completion thereof. Output signals may be provided for display such as outputting of a CRT sync signal related to each output signal update operation in response to each new trace signal sample and in response to a CRT Z-axes control for modulating CRT intensity to update output signal samples. The output signals may be stored in the persistency characteristic of the CRT as an electron beam is swept over the CRT face. In an alternate display embodiment, digital samples from the Z-store and the Z-store address may each be provided to a digital-to-analog converter for controlling amplitude and displacement of a CRT electron beam in response to the address and the intensity samples for generating a plot of the correlation output signal in response thereto. Alternately, the output of the Z-store may be provided to an output device such as a magnetic tape recorder, a plotter, a computer, or other output device.

Implementation of a real-time correlator algorithm in a hardware embodiment or in a software embodiment may be provided with on-the-fly computations. Detection of a sync pulse may be used to initialize control logic and computational parameters. A trace signal sample may be acquired and may be processed with each of a plurality of pilot signal samples for updating output signal samples. After completion of processing each acquired trace signal sample with a plurality of pilot signal samples the pilot sample iteration control may be initialized, the next trace signal sample may be acquired, and the newly acquired trace signal sample may then be processed with a plurality of pilot signal samples. A pair of iterative loops may be provided wherein a high speed inner iterative loop may process a trace signal sample with a plurality of pilot signal samples and an outer iterative loop may be provided for acquiring each of a sequence of trace signal samples for processing each with the plurality of pilot signal samples with the inner iterative loop.

A multi-channel embodiment of the above described iterative processing arrangement may be provided with a middle iterative loop for sequencing through a plurality of channels for a particular sample interval, wherein the inner iterative loop processes each of the samples from the middle iterative loop with a plurality of pilot signal samples. After each of the plurality of channel signal samples for a particular time interval sample has been processed with the plurality of pilot signal samples, another sample time interval may be initiated with the outer loop for selecting a new time interval for iteratively processing the plurality of channel samples associated with that time interval in the middle loop and for iteratively processing each of the plurality of channel samples for the particular interval with the plurality of pilot signal samples in the inner iterative loop.

In accordance with the correlation algorithms of the present invention, sequential states in the iterative process may be unnecessary for updating output samples. A decoder circuit or a computational decision may be provided to detect necessary update operations for enabling and to detect unnecessary update operations for disabling. Similarly, the decoder logic or test operation permits skipping of unnecessary update operations such as by branching around sequential operations in hardware or in software or by preloading counters with the appropriate initial parameter in response to the last necessary parameter of a prior operation for the purpose of reducing computational time associated with unnecessary operations.

In accordance with a composite-after-correlation capability of the present invention, provision may be made for clearing the output sample memory contents for discontinuing compositing of prior correlated samples and provision may be made for perserving the output sample memory contents through subsequent correlations in order to implement compositing-after-correlation operations.

A multi-channel correlator and compositor arrangement may be provided by duplicating a single correlator channel for a plurality of times. Control logic may be common for the plurality of channels which may be synchronized for processing simultaneous information. Trace signals may be different for each of the plurality of channels or the same trace signal may be input to each of the plurality of channels. Similarly, pilot signals such as from a P-stored may be the same for each of the plurality of channels or may be different for each of the plurality of channels. In one embodiment, a different trace signal may be input to each of the plurality of correlator channels but the same pilot signal may be used for each of the plurality of channels for processing the different trace signals. Alternately, a single trace signal may be common to each of a plurality of correlator channels but the pilot signal may be different for each of the plurality of correlator channels for correlating a single trace signal with a plurality of pilot signals. Further, a different trace signal may be input to each of the plurality of correlator channels and a different pilot signal may be used for each of the plurality of correlator channels to correlate a pilot signal with a trace signal wherein the pilot signal and trace signal for each channel is different than the pilot signal and trace signal for each other of the plurality of channels. In an output embodiment, the output signal update and storage arrangement may be different and separate for each of the plurality of channels, wherein each channel may independently correlate and composite information without compositing with other channels. Alternately, the output signal storage and updating logic may be common to a plurality of correlating channels for compositing together the output signals from each of the plurality of correlator channels.

A compositor control may be provided having a programmable counter for loading a desired number of composite operations, then being decremented by each actual composite operation until counted down to zero as being indicative of completion of the programmed quantity of composite operations. Preloading of the programmable quantity of composite operations may be performed in response to a clear signal for clearing the output sample memory or may be performed in response to other control signals. Completion of composite operations may be controlled with a signal from the compositor control indicative of completion of the last programmable operation or may be controlled from other sources. For example, an operator may monitor the composited information such as with CRT or plotter output device for determining the quality of the output information, wherein the operator may initiate a control signal for discontinuing compositing operations when the output signal has acceptable quality. In an alternate embodiment, an adaptive control arrangement provides for detecting completion of a desired number of composite operations. For example, in a high noise environment amplitude of the composited signals will build up at a slower rate than for a low noise environment and therefore a particular output signal amplitude and signal-to-noise ratio characteristic may require more composites for a high noise environment than for a low noise environment. Because buildup of the output signals may be indicative of the noise level and may be indicative of the quality of the output signal samples, a detector may be provided in conjunction with the output update logic to determine if the signal samples have built up to a desired amplitude level for the correlation peak signals which may be indicative of a desired quality of output signal samples. Therefore, detection of signal peaks in the output signal samples may be used to adaptively terminate correlation and composition operations.

The digital filtering arrangement of the present invention may be used for a communication arrangement including communication of digital information and communication of analog information. A chirp modem arrangement is provided in accordance with the present invention, wherein data to be communicated modulates chirp signals for transmission over a data link and a demodulator in the modem provides correlation operations for separating communicated signals with demodulation through correlation. Modulated signals may be communicated as a plurality of overlapping signals having correlation separable characteristics exemplified by chirp signals.

In one digital communication embodiment, a serial digital word may modulate chirp signals in response to transitions between data-bits. A chirp signal may be generated in response to each positive transition and each negative transition, wherein chirp signals generated in response to positive transitions may be the same as chirp signals generated in response to negative transitions or, alternately, chirp signals generated in response to positive transitions may have a different signature than chirp signals generated in response to negative transitions for separation therebetween through correlation. A serial digital signal provides a sequence of bits, wherein digital bit responsive chirp signals may be generated in a sequence related to the sequence of digital bits. The digital bit responsive chirp signals may be multiplexed together for transmission over a communication link, wherein a multiplexed signal may include a plurality of overlapping chirp signals having a time relationship or phase relationship that is related to a time sequence of transitions of the digital data signal.

The multiplexed communication signal may be processed in a receiving modem with a signature demodulator for correlating the multiplexed signal with a related signature pilot signal to provide correlation output peaks related to transitions of the digital data signal. Electronic circuitry may be used to shape the correlation peaks and to convert the shaped correlation peaks into a digital data signal representative of the transmitted information. In one of the above mentioned embodiments which generates the same chirp signatures in response to both positive and negative transitions of the digital data signal; a single correlator may be provided in the demodulator to demodulate the sequence of single signature chirp signals representative of positive and negative transitions of the communicated digital data signal. This positive and negative transition related correlation output signal may be used to reconstruct the digital data signal by toggling a toggle flip-flop in response to each correlation peak signal. In the above mentioned embodiment wherein a first signature chirp signal is generated in response to a positive transition of the digital data signal and a second signature chirp signal is generated in response to a negative transition of the digital data signal, the demodulator in the receiving modem may include a pair of correlator channels wherein a first correlator channel operates in response to a positive transition related pilot signal and the second correlator channel operates in response to a negative transition related pilot signal to generate correlation output signals having peaks related to the positive transitions and the negative transitions respectively of the communicated data signal. The pair of correlation output signals may be processed to form digital pulses and may be used to reconstruct the communicated data signal by setting a flip-flop in response to positive transition related correlation output peak signals and resetting a flip-flop in response to negative transition related correlation output peak signals.

A plurality of overlapping chirp signals may be generated with a plurality of chirp signal generators controlled by a distributor arrangement for distributing control signals in sequence to a plurality of chirp generators. Each sequential transition of the data signal may be distributed to a next sequential chirp generator for generating the related chirp signal overlapping a chirp signal that is also being generated by previously activated chirp generators. The distributor may be constructed in the form of a counter that is clocked in response to transitions of the digital data signal, wherein the incrementally changing counter state may be processed with a decoder to incrementally advance a control signal inbetween a plurality of output signal lines connected to chirp generators to sequentially select each chirp generator in sequence. Each chirp generator may have a latching capability to latch the selecting signal for the condition that the selecting signal is advanced to select other chirp generators, wherein the latch memory preserves the selection of the chirp generator until generation of the chirp signal has been completed. The output of each of the plurality of chirp generators may be multiplexed together such as by exciting inputs to an electronic summing circuit or by exciting different excitation generators such as VIBROSEIS generators. For the electronic summing embodiment, an electronic signal may be provided having the multiplexed combination of all of the input chirp signals for transmission with a single excitation generator such as a line driver or radio transmitter for a data link. For the embodiment of exciting different VIBROSEIS generators, all chirp signals may be multiplexed implicit in the excitation and transmission wherein, for example, a plurality of seismic signals impressed on the subsurface environment may be mixed or multiplexed together as they propagate through the subsurface environment.

One embodiment of a chirp generator uses analog circuitry to generate a controlled chirp signal. An input latch may be used to store an input selecting signal for the condition that the input selecting signal has a shorter duration than the chirp signal duration and therefore must be stored to preserve the selecting condition for the duration of the chirp signal. An analog integrator may be used to generate a ramp signal for exciting a voltage control oscillator, wherein the voltage controlled oscillator generates a controlled frequency in response to the input analog signal which is a linear chirp signal in response to an input ramp signal. The input signal may be linear ramp of a positive polarity or a negative polarity for generating an up-chirp signal or a down-chirp signal respectively with the voltage controlled oscillator. Alternately, various analog function generators may be use din place of the analog integrator to generate analog signals having functions other than the linear ramp. For example, analog function generators may generate exponential, logrythmic, and other analog functions to excite the voltage controlled oscillator, wherein the voltage controlled oscillator generates a chirp signal having a frequency sweep related to an analog signal function. A detector such as a Schmidt trigger may be used to detect the end of the chirp signal such as by detecting a threshold of the analog function signal for generating a reset signal to reset the input latch and reset the analog circuitry such as by discharging capacitors.

An analog amplitude responsive chirp generator may be implemented by adding amplitude modulation circuitry to a digital or constant amplitude chirp generator. For example, an output chirp signal having amplitude information may be generated in response to a product of a constant amplitude signal and an analog voltage, wherein the product may be generated with an analog multiplier circuit in response to a constant amplitude chirp signal and an analog amplitude signal as multiplier inputs. The constant amplitude chirp signal may be generated with any chirp generator discussed herein or well known in the art. The analog voltage may be provided directly with an analog input signal line or may be provided from a sample-and-hold circuit which samples the analog input signal in response to the distributor or selecting signal that initiates the chirp generator. Therefore, chirp signals may be generated having a constant amplitude that is a function of a sampled and stored analog signal amplitude or a varying amplitude that is a function of variation in an analog input signal processed directly without a sample-and-hold circuit.

For the amplitude modulated chirp signal embodiment, the distributor that was described above may distribute initiation commands to each of a plurality of chirp generators for initiating chirp signals and for sampling analog input signals to amplitude modulate the chirp signals. The sample commands to the distributor may be from a sample clock defining the sampling time interval. A chirp generator enabled with the sample clock responsive distributor may simultaneously sample an analog input signal and initiate a chirp signal, wherein the chirp signal may be generated having an amplitude related to the amplitude of the sampled analog signal and a time or phase relationship defined by the time of the sampled clock and the related start of the chirp signal. Multiplexing of a plurality of amplitude related chirp signals provides a multiplexed signal for communication. Receiving of the communicated multiplexed signal may be provided with a demodulator in a receiving modem, wherein a correlator in the demodulator may be used to demodulate the amplitude modulated chirp signal to provide a plurality of correlation output peak signals having an amplitude related to the amplitude of an analog input sample and having a time spacing therebetween related to the times of the analog signal samples. A chirp demodulator may be implemented with a correlator, wherein the correlation demodulator may have a single correlator channel for demodulating chirp signals having a single signature signal characteristic or may have a plurality of correlation demodulator channels for demodulating a plurality of chirp signature signals. The correlation output signals having a plurality of signal peaks may be processed with digital peak detectors or threshold detectors for processing with digital circuits such as flip-flops or latches to reconstruct the communicated digital data signal from the detected correlation output peaks.

An alternate embodiment of a chirp generator may be implemented with a rate multiplier circuit controllable in response to an input pulse rate and in response to a digital word. A synchronous one-shot circuit may be provided to generate an output pulse in response to an input selecting signal such as from a chirp command distributor, wherein the pulse may be used to set a latch. The combination of a one-shot and a latch precludes detrimental effects due to input distributor signal duration such as for a long distributor signal duration being compensated by a one-shot circuit generating a pulse having a short pulse width in response to the input distributor signal and for a short distributor signal duration being compensated by a latch circuit which may latch the distributor signal responsive one-shot signal for a duration of time required to generate a particular duration chirp signal. The one-shot output pulse may be used to initialize the rate multiplier circuitry including setting a latch for storage of the one-shot signal for the duration of a chirp signal and resetting or initializing counter circuits and other circuits to initial conditions. A detector circuit may be provided for detecting the end of a chirp signal and for resetting the latch in response to the end of a chirp signal. The latched distributor signal may be used to enable an input clock pulse signal for clocking the rate multiplier, wherein the rate multiplier output pulse rate may be proportional to the frequency of the enabled input clock signal.

A counter circuit may be provided for generating the digital word input to the rate multiplier, wherein the rate multiplier output may be proportional to the input digital word from the counter. The counter may be controlled to count clock pulses to vary the digital word input to the rate multiplier and therefore to vary the pulse rate output from the rate multiplier in response thereto. For example, the counter may be connected to a constant pulse rate such as a constant clock signal for incrementing the counter in a linear manner to generate an up-chirp signal and for decrementing the counter to generate a down-chirp signal. Alternately, the counter may be connected to a variable pulse rate such as an output from a rate multiplier as a pulse rate feedback signal for generating an exponential up-chirp signal or down-chirp signal for an up-counter or down-counter arrangement respectively. Alternately, the clock signal to clock the rate multiplier and/or the counters may be a variable clock pulse such as from another rate multiplier, wherein a linear up-chirp clock signal to the rate multiplier and a constant clock signal to the counter may generate an exponential output chirp signal and wherein a linear up-chirp clock signal to both the rate multiplier and the counter may generate a higher order exponential output chirp signal. Therefore, selection of the clock signal to the rate multiplier will control the form of the output chirp signal and selection of the clock signal to the counter controlling the rate multiplier will further control the function of the output chirp signal.

A rate multiplier chirp signal may be controlled with an up-counter arrangement, a down-counter arrangement, or an up-down-counter arrangement. For a selectable up-down-counter arrangement, a selecting signal may be provided to select an up-count or a down-count for generating an up-chirp signal or a down-chirp signal respectively and, conversely, for generating a down-chirp signal and an up-chirp signal respectively. A distributor responsive input signal may be used to clear or preload the counter for generating an initial condition word input to the rate multiplier, wherein the initial condition of the counter may define the initial rate input of the rate multiplier. The counter may be cleared on initialized to a low number such as an all zero-state and controlled to count-up for an up-chirp signal and may be initialized or preloaded to a high number such as an all one-state and controlled to count-down for a down-chirp signal. Alternately, other initial conditions may be preloaded to define a start frequency for the rate multiplier.

A detector circuit may be implemented for detecting completion of a chirp signal such as implemented with a decoder or a logical gate arrangement response to a state of the counter. For an up-chirp signal, the detector circuit may be implemented with a logical gate that is responsive to a selected maximum frequency condition defined by the state of the counter such as the highest state of the counter being an all one-state. Similarly for a down-chirp signal, the detector circuit may be implemented with a logical gate that is responsive to a selected minimum frequency condition defined by the state of the counter such as the lowest state of the counter being an all zero-state or a low magnitude state such as a zero-state with a least significant one-bit to distinguish from an all zero-state. Enabling of an up-chirp detector and a down-chirp detector may be provided in response to an up-chirp command signal and a down-chirp command signal respectively such as from an up-down count command signal to the counter. The detector signal may be used to reset the input latch for disabling the input clock signal and therefore terminating the chirp signal.

In an alternate chirp generator embodiment, a digital differential analyzer (DDA) may be used to generate a controlled pulse rate for synthesizing a chirp signal. A DDA generates an output pulse rate dz proportional to an input pulse rate dx and the state of the Y-register. The Y-register state may be updated with dy incremental pulses, wherein the output pulse rate dz will vary as a function of the changes in the Y-register state which is updated by the dy input signal. For a constant frequency dy signal and a constant frequency dx signal, the dz output signal has a linear frequency variation. For a linearly varying frequency dx signal and a linearly varying frequency dy signal, the output dz signal may have an exponentially changing frequency sweep. In an alternate embodiment, the output dz signal may be fed back as a dy input signal in conjunction with a constant frequency dx signal to generate an exponentially varying frequency output dz signal. Various combinations of frequency sweeps to the dx input and dy input provides different chirp frequency functions as the output signal dz such as linear chirps, exponential chirps, and other chirp functions.

In still an alternate chirp generator embodiment, an arrangement is provided for delaying a chirp signal and for selecting delayed chirp signals in a desired combination. In a preferred embodiment, a chirp generator may be used to generate a particular chirp signal and a shift register may be used to delay the chirp signal. As chirp signal samples are shifted through the shift register, various output lines or taps having different delays or different numbers of stages therebetween will provide a chirp signal at each output tap having a delay related to the number of stages from the shift register input and therefore different delays therebetween. Therefore, a shift register or other delay device may be used to generate multiple chirp signals having different time delays or phase shifts from the input signal. A selection circuit may be provided for selecting a combination of the time delay chirp signals from the shift register such as for multiplexing therebetween to generate a multiplexed chirp signal for communication. In one embodiment, the time delay chirp signals may be selected in response to the states of a digital word stored in a control register, wherein each bit of the digital word may be used to enable or disable the chirp signal having a particular time delay from a tap such as by enabling or disabling a logical gate in response to the logical state of the data-bit signal. A plurality of chirp signals having different time delays or phases therebetween may be multiplexed theretogether such as for communication on a data link or for excitation of a VIBROSEIS generator.

The delay line chirp generator embodiment may be combined to provide a plurality of chirp generator and delay line combinations, wherein each combination may generate a plurality of phase shifted chirp signals and wherein each combination may provide a different set of chirp signature signals. In one embodiment, a first chirp signature signal may be selected in response to one-states of a control register and a second chirp signal signature may be selected in response to zero-states of a control register for multiplexing a combination of chirp signals with a first chirp signature related to the one-states of the digital word and a second chirp signature related to the zero-states of a digital word. In another embodiment, a plurality of control registers may be provided wherein each control register may provide for selection of chirp signals having a related signature; wherein chirp signals having a particular chirp signature may be related to a particular control register; and wherein chirp signatures related to different control registers may have different chirp signatures therebetween for identification and separation of chirp signals related to each of the plurality of control registers.

A plurality of different chirp signals each having a different chirp signature may be generated with the shift register embodiment discussed above by providing a variable frequency clock pulse signal to the shift register. Therefore, as a chirp signal is shifted along the shift register, variations in clock frequency provide compressing or spreading of the chirp signal periods and compressing or spreading respectively of the chirp envelope durations in response to increasing or decreasing clock frequencies respectively. Because the clock frequency varies as a function of time, the clock frequency may be different for each time delay interval when a chirp signal is being shifted past an output tap of the shift register and therefore each output tap has a different clock frequency component related thereto and therefore a different chirp signature related thereto. The clock signal from the shift register may be generated by a chirp generator discussed herein, wherein the clock signal frequency may be swept as a linear up-chirp signal, linear down-chirp signal, exponential up-chirp signal, exponential down-chirp signal, or other chirp signal functions. Similarly, the input chirp signal to the shift register may also have frequency sweep functions. The combination of the frequency sweep function of the input chirp signal and the frequency sweep function of the clock chirp signal may be used to generate complex combinations of chirp signals having different signatures and different time phasing therebetween as provided on the output taps of the shift register and as selectable under control of a control word or a data word in a control register.

An improvement in productivity of a geophysical exploration system may be provided by ensonifying the subsurface environment from a plurality of different shotpoints with simultaneous or overlapping ensonifying signals. Seismic reflections associated with simultaneously ensonifying each of a plurality of shotpoints may be separated through digital correlation if the ensonifying signals associated with each shotpoint have different signatures therebetween. A correlator may be provided having a plurality of correlation channels, wherein each correlator channel may process the same input trace signal with a different correlation operator signal and wherein each of the plurality of channels may be responsive to a pilot signal having a signature related to the signature of the ensonifying signals of a particular shotpoints. For example, a first VIBROSEIS generator at a first shotpoint and a second VIBROSEIS generator at a second shotpoint may each ensonify the subsurface environment with chirp signals that have different signatures therebetween; wherein the first VIBROSEIS generator may generate an up-chirp signal and the second VIBROSEIS generator may generate a down-chirp signal. A trace signal may be acquired that is related to multiplexed reflections from subsurface reflectors for processing with a multi-channel correlator arrangement having a first correlator channel for generating a first output signal in response to a first pilot signal such as an up-chirp signal and the trace signal and a second correlator channel for generating a second output signal in response to a second pilot signal such as a down-chirp signal and the same trace signal as processed with the first correlator channel. Therefore, a first output signal from the first correlator channel may be related to reflections of the first ensonifying signal generated by the first VIBROSEIS at the first shotpoint and a second output signal from the second correlator channel may be related to reflections of the second ensonifying signal generated by the second VIBROSEIS at the second shotpoint. The first and second correlated output signals may be separately recorded for static and dynamic corrections, gathering, and stacking.

Simultaneously ensonifying the subsurface environment from a plurality of shotpoints provides productivity advantages over prior art methods. In the prior art, a plurality of VIBROSEIS generators may all ensonify the subsurface environment with the same signature chirp signal at the same shotpoint for intensifying the seismic signal with the plurality of VIBROSEIS generators and for correlating with a single correlator. In accordance with the instant feature of the present invention, a multi-channel correlator is provided to permit separation of signals having different correlation signatures through correlation; thereby permitting generation of different signature seismic signals simultaneously at different shotpoints for separation with the plurality of correlator channels into separate correlated signals related to each individual shotpoint. Productivity may be enhanced by reducing the number of movements to and setups at new shotpoints. For example, a set of VIBROSEIS generators may operate at different shotpoints and may be moved between sets of shotpoints, thereby reducing the number of movements and setups.

A signal processing arrangement in accordance with the present invention may use an analog memory device such as a charge coupled device (CCD) for processing analog signals. Array input signals may be demodulated such as with electronic switches excited in response to a reference generator with the demodulated output signals being processed by a CCD memory. Each of the demodulated input signals may be applied to an input line of a CCD for accumulation of the synchronously switched signals by integrating current in charge storage elements. After sufficient cycles have been demodulated, demodulation control signals may be deactivated and shifting control signals may be initiated to shift the analog signals stored in the CCD to provide a sequence of analog output signals related to a plurality of parallel input signals. If an ensonifying signal is a chirp signal, the reference generator may provide a chirp demodulation signal to synchronously demodulate input chirp signals. The CCD may provide a multi-function capability including filtering of demodulated input signals and converting input signals from a parallel form to a serial form for sequential processing with time-shared chrcuits.

In a beam forming embodiment of the present invention, trace signals from transducers may be applied to a CCD in parallel at a plurality of input taps while the CCD is being clocked to shift the analog signal samples between taps. If the spacing between taps in relation to the clock frequency is controlled to be related to a wavelength characteristic of the signals from the transducer array, then the analog signals applied to each of a plurality of taps in sequence may be enhanced if the input signal period is similar to the inter-tap shifting period and the signals may be degraded if the above periods are not similar. Therefore, the CCD clock control signal and tap spacing may select a particular input spacial frequency period for enhancement, wherein the input spacial frequency period may be related to a direction of incident illumination which is herein termed beam forming. Variation of the CCD clock signal frequency will vary the inter-tap shift period and therefore will vary the period of input signal spacial frequency that will be enhanced, thereby controlling the direction of incident illumination that will be enhanced and therefore the incident illumination component that will be processed by the beam forming network.

A hybrid memory arrangement may be provided with an analog memory such as a CCD memory, wherein digital information may be provided to and received from the memory arrangement and wherein the memory arrangement may store information in an analog signal form. Conversion of input information from digital form to analog form may be provided with a digital-to-output signals from analog form to digital form may be provided with an analog-to-digital converter for outputting of digital information in response to stored analog information. In a shift register embodiment, recirculation may be provided with analog signals or with digital signals. In the digital recirculation embodiment, the analog samples from the CCD memory may be converted to digital form with an analog-to-digital converter, recirculated to the digital input, and converted from digital to analog signal form with a digital-to-analog converter for storage in the CCD memory in analog signal form. Refreshing of analog signals and digital signals may be provided to compensate for degradation of analog signals as they are shifted through the CCD memory.

In a digital refresh embodiment for an analog memory device, digital signals output from a hybrid memory may be rounded high to compensate for degradation towards a low level or may be rounded low to compensate for degradation towards a high level, wherein degradation of a signal shifted through an analog memory may be compensated by rounding the degraded output signal to a reference level, and wherein the degradation of the analog signal shifted through the memory may be less than the digital resolution of the round-off operation.

A refresh arrangement for a hybrid memory may be provided for detecting the amount of degradation of analog signals shifted through the memory and for refreshing the analog signals in response to the detected degradation. In a preferred embodiment, a reference signal having a reference analog amplitude may be multiplexed with analog data signals input to an analog memory and shifted through the analog memory. Refresh circuitry may sample the reference signal as indicative of the magnitude of the degradation and may refresh the analog signals from the analog memory in response to the amount of degradation of the reference signal. A multiplexer arrangement may be provided for multiplexing an analog reference signal with the input analog data signals, where the multiplexer may be an analog mixer for selecting either an analog recirculation signal or an analog input signal and interspersing an analog reference signal therewith. Selection may be provided with digital logic controlling analog switches for selecting the appropriate source of an analog signal for input to the analog memory such as from a recirculation source, an input source, or a reference source.

Hybrid memory refresh circuitry may include a sample-and-hold network for sampling and storing the reference signal from the analog memory. The output signal from the sample-and-hold circuit may be used to control a refresh circuit for controlling gain of an amplifier to selectively amplify the degraded analog signals to compensate for degradation caused by shifting through the analog memory. In one embodiment, the sampled reference signal may be used to control an AGC circuit for refreshing the analog signals. In another embodiment, the sampled reference signal may be used to control a multiplier circuit for multiplying the degraded signals by a signal related to the degradation of the signals. An implicit servo arrangement may be provided for multiplying the degraded signals by the reciprocal of the reference signal amplitude, wherein the amount of gain or multiplication may be related to the proportional degradation of the signals. The refresh circuitry may be implemented with analog signal processors, digital signal processors, and hybrid signal processors, where analog, digital, and hybrid mulitpliers are well known in the art.

An analog compositor may be implemented by inputting an analog trace signal to an analog shift register memory such as a CCD memory and shifting the analog memory to effectively sample the input trace signal, wherein each clock interval of the analog memory shift clock may be related to a sample interval of the analog signal input to the analog memory. Control logic may initiate shifting of the analog memory in response to a synchronization signal related to the start of a trace signal. As the analog memory is shifted and recirculated, each input sample may be added in analog signal form to a corresponding recirculated analog sample from the analog memory, wherein the adding of corresponding samples may be defined as a compositing operation. A reference signal as described above for a hybrid memory refresh arrangement may be used in conjunction with the analog compositor arrangement for mitigating effects of degradation due to shifting of analog signals. After a plurality of composites has been accomplished, the analog signal samples may be shifted out of the analog memory to an analog-to-digital converter such as for correlation with a digital correlator or for processing with other analog or digital signal processing circuits.

REFERENCES

Technology associated with implementation of the system of the present invention is well known in the art such as with circuit design, logical design, and computer programming. Further, prior art systems provide background for the system of the present invention. Still further, issued patents define well known methods and arrangements. References are provided hereinafter to prior art documents, systems, and patents; wherein the documents listed hereinafter and documents listed therein are incorporated herein by reference.

Digital filtering systems are well known in the art provide a basis for the improvements of the present invention. Such prior art systems include:

1. The Acoustic Imaging System built by Bendix Corp of Sylmar, Calif. for the Naval Undersea Research and Development Center in San Diego, Calif.;

2. The Computer Augmented Field Data Recording System (CAFDRS) built by United Geophysical of Pasadena, Calif.; and 3. The GEOCOR system built by Geophysical Systems Corp of Pasadena, Calif.

Documents on digital filtering include:

1. DIGITAL SIGNAL PROCESSING by Robiner and Radner for the IEEE Press (1972);

2. THE FAST FOURIER TRANSFORM AND ITS IMPLEMENTATION by Butler and Harvey;

3. SEISMIC FILTERING by Rothenburg and Van Nostrand for the Society of Exploration Geophysics (1971);

4. ENCYCLOPEDIC DICTIONARY OF EXPLORATION GEOPHYSICS by Sheriff for the Society of Exploration Geophysicists (1973);

5. THE ROBINSON-TREITEL READER by Seismograph Service Corp (1973);

6. CORRELATION TECHNIQUES—A REVIEW by Anstey for Geophysical Prospecting XII;

7. THE THEORY AND DESIGN OF CHIRP RADARS by Klauder in The Bell System Technical Journal vol XXXIX no 4 (July 1960);

8. A CURRENT DISTRIBUTION FOR BROADSIDE ARRAYS WHICH OPTIMIZES THE RELATIONSHIP BETWEEN BEAM WIDTH AND SIDE-LOBE LEVEL by Dolph in the Proceedings of the IRE on Waves and Electrons (June 1946);

9. DESIGN GUIDE TO DIGITAL FILTERS by Leon and Bass in EDN magazine (January 1974–June 1974);

10. THE SPECTRUM OF CLIPPED NOISE by Van Vleck and Middleton in the Proceedings of the IEEE (January 1966); and 11. DIGITAL SIGNAL PROCESSING by Oppenheimer and Schafer for Prentice Hall (1974).

Issued patents provide a basis for the improvements of the present invention including U.S. Pat. Nos. 2,624,876; 2,678,997; 2,688,124; 2,760,164; 2,808,577; 2,874,795; 2,910,134; 3,011,582; 3,018,962; 3,024,994; and 3,065,453.

Documents on circuit design include:

1. METHODS FOR SOLVING ENGINEERING PROBLEMS USING ANALOG COMPUTERS by Levine for McGraw Hill (1964);

2. ANALOG COMPUTERS by Korn and Korn; and

3. JUNCTION TRANSISTOR ELECTRONICS by Hurley for John Wiley & Sons (1958).

Documents on logical design include:

1. DIGITAL COMPUTER DESIGN FUNDAMENTALS by Chu for McGraw Hill (1962);

2. DIGITAL COMPUTER DESIGN by Braun for Academic Press (1963);

3. THE TTL DATA BOOK by Texas Instruments Inc (1973).

Documents on computer programming include:

1. PROGRAMMING AND CODING DIGITAL COMPUTERS by Sherman for John Wiley & Sons (1963);

2. DIGITAL COMPUTER PROGRAMMING by Stark for MacMillian Co (1967);

3. PROGRAMMING FOR DIGITAL COMPUTERS by Jeenel for McGraw Hill (1959);

4. IBM 360 PROGRAMMING AND COMPUTING by Golden and Leichus for Prentis-Hall (1967);

5. FUNDAMENTALS OF FLOWCHARTING by Schriber for John Wiley & Sons (1969);

6. PROGRAMMING: AN INTRODUCTION TO COMPUTER LANGUAGES by Maurer for Holden-Day (1968);

7. DESIGN OF REAL-TIME COMPUTER SYSTEMS by Martin; and

8. ELEMENTS OF COMPUTER PROGRAMMING by Swallow and Price for Hold Rinehart, and Winston (1965).

Documents on CCDs include:

1. CHARGE-COUPLED DEVICES AND APPLICATIONS by Carnes and Kosonocky for Solid State Engineering Magazine (April 1974);

2. CHARGE-COUPLED SEMICONDUCTOR SEMICONDUCTOR DEVICES by Boyle and Smith for the Bell System Technical Journal (1970); and 3. EXPERIMENTAL VERIFICATION OF THE CHARGE COUPLED DEVICE CONCEPT by Amelio for the Bell System Technical Journal (April 1970).

DISCLOSURE DOCUMENTS

An analysis pertinent to the present invention is set forth in the Disclosure Documents No. 091,629 filed in the Patent and Trademark Office on or about Jun. 16, 1980 by Gilbert P. Hyatt; which is herein incorporated by reference. The analyses therein entitled Signal Processing Analysis for the MBUL System; System Analysis for the MBLE; and System Analysis for MBLE With Convolver are analyses of a system that is representative of embodiments of the present invention such as a multiple signature system having multiple channel correlator and convolver processing. The analysis therein entitled Information Theory Principles For Communication System Improvement is an analysis pertinent to the present invention. The MBLE system discussed in the Dsiclosure Documents was selected as representative of embodiments of the present invention including seismic exploration, filter memory, filter modem, and other systems disclosed in the instant application and the parent application Ser. No. 550,231. Documents referenced in the Disclosure Documents are herein incorporated by reference including the following.

1. F. Jessie MacWilliams and Neil J. A. Sloane, "Pseudo-Random Sequences and Arrays", *Proceedings of the IEEE*, Vol 64, No. 12, pp 1715–1729.
2. Claude E. Shannon, "Communication in the Presence of Noise", *Proceedings of the IRE*, Vol 37, pp 10–21.
3. Claude E. Shannon, "A Mathematical Theory of Communication", *BSTJ*, Vol 27, pp 379–423, July 1948.
4. Gwilym M. Jenkins and Donald G. Watts, *Spectral Analysis and Its Applications*, San Francisco, Holden-Day, 1968.
5. David G. Luenberger, *Optimization by Vector Space Methods*, New York, John Wiley, 1969.
6. Robert H. Shumway, "Applied Regression and Analysis of Variance For Stationary Time Series", *Journal American Stat. Assoc.*, Dec. 1970, Vol 65, No 332, pp 1527–1546.
7. E. S. Pearson and H. O. Hartley, Biometrika Tables For Statisticians, Vol II, Cambridge, England, Cambridge University Press, 1972.
8. Athanasios Papoulis; *Probibility, Random Variables, and Stochastic Processes;* New York, McGraw Hill, 1965.
9. Douglas R. Anderson and Paul A. Wintz, "Analysis of a Spread Spectrum Multiple Access System With a Hard Limiter", *IEEE Transactions* Comm Tech, vol. COM-17, pp 285,290, April 1969.
10. W. J. Judge, "Multiplexing Using Quasiorthogonal Binary Functions", AIEE Trans Comm Elect, Vol 81, pp 81–83, May 1962.
11. Robert Gold, "Optimal Binary Sequences for Spread Spectrum Multiplexing" *IEEE Trans Inf Theory*, vol IT-13, pp 619–621, Oct. 1967.
12. Robert K. Otnes and Loren Enochson, *Digital Time Series Analysis*, New York, John Wiley and Sons, 1972.
13. S. Weinreb, "A Digital Spectral Analysis Technique and Its Application to Radio Astronomy", *MIT Research Laboratory of Electronics*, Technical Report 412, 1963.
14. M. Hinich, "Estimation of Spectra After Hard Clipping of Gaussian Processes", *Technometrics*, vol 9.
15. Henning F. Harmuth, *Transmission of Information by Orthogonal Functions*, New York, Springer-Verlag, 1969.
16. Albert J. Berni and William D. Gregg, "On the Utility of Chirp Modulation For Digital Signaling", *IEEE Trans. Comm*, vol COM-21, pp 748–751, June 1973.
17. Y. W. Lee, *Statistical Theory of Communication*, New York, Wiley, 1960.
18. R. W. Lucky, J. Salz, and E. J. Weldon Jr; *Principles of Data Communication*, New York, McGraw Hill Book Company, 1968.
19. B. Widrow et al, "Adaptive Antenna Systems", *Proc. IEEE*, vol 55, No. 12, Dec. 1967, pp 2143–2159.
20. W. W. Peterson and E. J. Weldon Jr. *Error-Correcting Codes*, 2nd ed., Cambridge, the MIT Press, 1972.
21. R. L. Dobrushin, "Information Transmission in a Channel With Feedback", *Theory of Probability and Applications*, vol 34, pp 367–383, Dec. 1958.
22. Claude F. Shannon, "Two-Way Communication Channels", Proc. 4th *Berkeley Symp Math Stat. and Prob.*, vol 1, pp 611–644, 1961.
23. J. Pieter M. Schalkwijk, "Coding Scheme For Addative Noise Channels with Feedback Part II: Band-Limited Signals", *IEEE Trans Infor Therory*, vol IT-12, pp 183–189, April 1966.
24. J. N. Pierce and S. Stein, "Multiple Diversity with Non-independent Fading", *Proc IRE* Jan 1960, pp 89–104.
25. R. G. Gallager, *Information Theory and Reliable Communication*, New York, John Wiley and Sons, 1968.
26. A. I. Khinchin, *Mathematical Foundations of Stastical Mechanics*, New York, Dover Pub Inc., 1949.
27. A. N. Kolmogorov, "On the Shannon Theory of Information Transmission in the Case of Continuous Signals", *IEEE Trans. Inform Theory*, vol IT-2, pp 102–108, Sept. 1956.
28. M. S. Pinsher, "Quantity of Information of a Gaussion Random Stationary Random Process Contained in a Second Process Related Stationary thereto", *Doklady Akad Nauk SSSR*, vol 111, No 4, 1956, pp 753–756.
29. J. M. Wozencraft and I. M. Jacobs, *Principles of Communication Engineering*, New York, John Wiley, 1965.
30. T. Berger, *Data Distortion Theory, A Mathematical Basis For Data Compression*, Englewood Cliffs, N.J., Prentice Hall Inc, 1971.

The filtering and processing capability disclosed herein and in the referenced applications are supplemented by the disclosures filed in the Patent and Trademark Office under the Disclosure Document Program (MPEP 1706) in (a) Disclosure Document No. 084,212 filed on Sep. 12, 1979; particularly at pages 41–46 therein;
(b) Disclosure Document No. 085,829 filed on Nov. 14, 1979; particularly at pages 68–77 therein;
(c) Disclosure Document No. 087,707 filed on Jan. 28 1980; particularly at pages 13–15 and 78–80 therein; and
(d) Disclosure Document No. 091,629 filed on Jun. 16, 1980;

which are herein incorporated by reference.

REMOTE ARRAY SYSTEM

An incremental processor provides significant advantages in addition to the processor-related advantages described in patent application Ser. Nos. 550,231 and 754,660 and patent applications related thereto. Such additional advantages will now be discussed.

Related patent application Ser. No. 490,816 discloses a whole number type arrangement in contrast to the incremental arrangement.

A whole number arrangement will now be discussed with reference to FIGS. 1 and 2A of application Ser. No. 490,816. For example, array 110 may be a towed array such as used in synthetic aperture sonar systems. Alternately, array 110 may be used in a dip sonar system such as the AN/AQS-17 sonar system. Towed arrays are typically deployed and towed from host surface ships. Dip sonars are typically deployed and used in conjunction with host helicopters. Geophysical exploration arrays are typically deployed and used in conjunction with host trucks. Information is transmitted from array 110 to the host vehicle or host system located remote therefrom. Array 110 generates analog signals 112 to channel processor 114 (FIG. 1) and transducer 210 generates analog signal 211 to channel processor 114 (FIG. 2A). Channel processor 114 comprises analog circuits for amplifying, demodulating, and filtering array signals 112 to generate output processed signals 116 (FIG. 1) and processed signals 215 and 235

(FIG. 2A). These processed signals 116, 215, and 235 are processed with multiplexer 118 and ADC 122 (FIG. 1) to generate whole number digital signals 124. reconstructor 126 is shown as a whole number processor for processing whole number digital signals 124 (FIG. 1). This arrangement characterizes whole number type signal processor and data processor arrangements. The instant features of the present invention are directed to incremental signal processing and data processing arrangements for providing important advantages compared to the whole number arrangement discussed above.

In remote array applications, information is communicated from a remote array to a host vehicle or host system. Typically, this communication is provided over a serial communication link, where information is transmitted in serial signal form in order to minimize the number of wires. Some degree of signal processing is implemented in the remote array device because array signals are low level analog signals that may not be capable of driving a cable without introducing substantial errors. Further, communicated information is often digital information such as signals 124 (FIG. 1 therein) because of the complexities of communicating multiplexed analog signals. Therefore, such a system typically has channel processors 114, multiplexer 118, and ADC 122 (FIG. 1 therein) located with the array 110 remote from the host vehicle or host system. Problems with such a whole number system include (a) location of electronics with the remote array and (b) communication of a large amount of digital whole work information. These problems can be mitigated with the use of the incremental or low resolution "front end" arrangement of the present invention, as discussed below.

An incremental arrangement is shown in related application Ser. No. 754,660. Input device 110 and input signal processor 112 (FIG. 1 therein) can be accoustical transducer 110C and amplifier 112C, prossibly including PSD 112D (FIG. 2A therein). Signal processor 112 when implemented as an incremental signal processor is a relatively simple signal processor. This is in contrast to the analog signal processor discussed above which is significantly more complex than an incremental signal processor. Further, incremental output signal 113 is implicitly in digital signal form, thereby eliminating the need for an ADC. Therefore, a simple incremental signal processor may be used to convert analog transducer signals to digital incremental signals with a significant reduction in electronic circuitry compared to an analog signal processing arrangement. In applications where such signal processing electronics is located in conjunction with a remote array arrangement, significant advantages are achieved by simplifying this electronics. Further, communication of incremental signals over a data link is significantly more efficient than communication of whole number digital signals. For example, a 12 bit ADC may be used to generate 12-bit digital numbers for communication to the host vehicle. Therefore, 12 digital bits must be transmitted for each signal sample. In contrast, an incremental arrangement communicates only a single incremental bit for each signal sample, yielding a factor of 12-times improvement in data rate.

In view of the above, an incremental arrangement provides significant advantages relative to signal processing, multiplexing, conversion, and communication of information from a remote array.

An illustrative embodiment has been described for communicating incremental information from an array to a signal processor. Alternate arrangements will now be discussed.

In a first alternate embodiment, low resolution whole number information is generated at the remote array, communicated to the host vehicle, and processed to generate high resolution whole number information. For example, a three bit ADC may be used to generate three bit digital information for communication. The three bit digital information can be processed to generate 12 bit digital information, as discussed and claimed in parent application Ser. No. 550,231. Although communication and processing of low resolution (i.e. three bit) information is not as efficient as communication of incremental (single bit) information, it is more efficient then processing of high resolution (i.e. 12 bit) information and preserves more of the input resolution then processing of incremental information.

In a second illustrative embodiment, an incremental (single bit) or low resolution (i.e. three bit) signal processor can be located with the remote equipment, having simpler implementation then a high resolution (i.e. 12 bit) signal processor. Therefore, processed information can be generated by relatively simple remote equipment and transmitted as high resolution information. In one configuration, integration after filtering (discussed herein and in the referenced applications) can be implemented in the remote equipment to provide high resolution information at low data rate for communication to the host vehicle.

GENERAL CONSIDERATIONS

The system of the present invention is intended to be generally applicable to the fields of signal processing, data processing and digital filtering. Although the present system may be described with a correlator digital filter in a geophysical application, descriptions are intended to be merely exemplary of the broad scope of the present invention. For example, the correlator processor is intended to generally exemplify digital filters or signal processing arrangements having broad scope. The geophysical application is intended to exemplify a broad range of signal processing and data processing applications including radar, underwater acoustics, medical diagnostics, equipment diagnostics, and a broad range of other applications. Further, the processing of single-bit input data to achieve high resolution output data is intended to exemplify the general concept of processing low-resolution input data to obtain high-resolution output data. The discussions relative to a correlator data processor are intended to exemplify generalized data processing arrangements including a convolution processor, a deconvolution processor, and a Fourier transform processor.

Terminology used in the instant application will now be defined.

Terminology pertaining to illumination is herein intended to include acoustic illumination; electromagnetic illumination including radio waves, laser waves and visible illumination; and other forms of illumination. Illumination provides for illuminating or ensonifying an environment, a medium or an object and provides for generating illumination signal inputs such as reflected illumination having characteristics of the environment. For example, illumination of a geophysical environment with a VIBROSEIS generator provides reflected seismic signals input to a geophone array, wherein the input seismic signals are related to the characteristics of the geophysical environment such as the characteristics of the medium and the characteristics of objects located therein.

Terminology pertaining to ensonifying is herein intended to have the same significance and meaning as terminology pertaining to illuminating as discussed above.

The terms "medium" and "environment" are herein intended to mean the transmission medium or environment for transmission of and for propagation of the illumination signals. For example, the acoustic medium may be seawater, the radar medium may be the atmosphere or space, and the geophysical medium may be the earth.

Illumination may be generated with a transmitter such as a VIBROSEIS transmitter as discussed above or with a well known radar transmitter or laser transmitter which provide a source of illumination energy for illuminating an environment. The terms "input transducers", "array", and other terms pertaining thereto are herein intended to mean general transducers and transducer arrays exemplified by a geophone array for a geophysical system, a hydrophone array for an acoustic imaging system, a photoelectric array for a laser system, a photosensitive medium for light, a well known radar receiver array for a radar system and other known input transducer arrangements.

Components have been shown in the figures in simplified schematic form to more easily exemplify the present invention, wherein circuit design is a well known art and wherein use of such components are well known in the art. Further, many alternate circuit embodiments and component types may be used to implement the discussed embodiments. For example, switches 650 and CLR 216 (FIG. 6D) and FETs 917 and 910 (FIG. 9A) can be implemented with well known switches including electronic switches such as FETs and bipolar transistors and even mechanical switches such as relays. Further, improved capabilities may be obtained by higher levels of integration. For example, FETs 917 and 918 may be manufactured as part of CCD 920 (FIG. 9A) to provide the combined capabilities of demodulation, filtering, and multiplexing with monolithic circuits.

The system of the present invention is intended to have a broad scope wherein a digital filtering system is intended to exemplify generalized arrangements for storing analog signals, processing analog signals and transferring analog signals; FFT and correlator processors are intended to exemplify generalized digital filtering or processing arrangements; and other such devices are intended to exemplify generalized arrangements.

The term signal is herein intended to include electrical signals, acoustic signals, illumination signals, and other known signals which may be sensed such as with a transducer and which may be processed such as with a filter.

Filter processing has been discussed herein relative to stored or generated information; which information has been identified as pilot information and reference information herein. For example, correlation has been discussed using pilot signal samples relative to FIG. 3 and using reference signal samples relative to FIG. 10.

Resolution is the fineness of the data. When resolution is relatively better it is characterized as being higher, finer or greater and when resolution is relatively worse it is characterized as being lower, coarser, or poorer.

For simplicity of illustration, the present invention has been discussed for a correlator digital filter. A correlator filter implementation is also illustrative of a convolution filter implementation, where the difference between a correlator and a convolver may be merely the form of the filter operator and wherein the terms correlation and convolution and the terms correlator and convolver may be used interchangeably for discussions related to the correlator implementation herein. Further a correlator may be used in well known Auto-Correlation and Cross-Correlation modes of operation. Still further, a correlator is exemplary of a generalized digital filter including recursive filters, non-recursive filters, Kalman filters, compositor filter, and other well known filters wherein the discussions related to a correlator are herein intended to be exemplary of a general type of filter and to be applicable to other types of filters.

Also for simplicity of illustration, the digital filter arrangement of the present invention has been discussed for processing chirp signals; wherein a chirp signal is intended to be illustrative of a generalized signal form including amplitude related signals, phase related signals, frequency related signals, and even noise signals.

Terminology pertaining to signatures is herein intended to mean characteristics of a signal and may include unique characteristics of signals that permit identification thereof or therebetween and may permit separation thereof such as through correlation.

Separation of signal components by filtering such as with correlation filters permits separation of signals due to filterable characteristics. For example, if signals have poor correlation or low correlation therebetween, then they may be easily separated through correlation. Poor correlation, low correlation, and terms pertaining thereto are intended to mean signals that do not have good correlation therebetween such as by generating small correlation output signal peaks when correlated theretogether.

A plurality is herein intended to mean more than one. For simplicity of discussion, a plurality may be exemplified with a limited number such as with two signals or with two devices, wherein such a limited number is intended to exemplify more than one such as two, or ten, or seventy-five, or ten-thousand, or any other number that is more than one.

The various features of the present invention have been discussed separately or in particular combinations for simplicity of presentation. Advantages may be obtained by combining or recombining various separately described features or combined features respectively of the present invention such as by combining the signature memory, correlate on-the-fly, output on-the-fly, and single-bit correlation features of the present invention. Therefore, it is herein intended that features of the present invention that may be described separately or in particular combinations may be grouped together and recombined in different combinations.

Preferred embodiments of the present invention include digital filtering arrangements exemplary of the broad teachings of the present invention. Alternate embodiments of the present invention may include analog filtering arrangements and hybrid (digital and analog) filtering arrangement consistant with the broad scope of the present invention.

From the above description it will be apparent that there is thus provided a device of the character described possessing the particular features of advantage before enumerated as desireable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A display system comprising:
an analog input image circuit generating an analog input image signal;
an analog to digital converter coupled to the analog input image circuit and generating digital input image signal samples in response to the analog input image signal, wherein the analog to digital converter includes a single bit circuit adapted to generate the digital input image signal samples as single bit digital input image signal samples in response to the analog input image signal;
an integrated circuit RAM coupled to the analog to digital converter and storing the single bit digital input image signal samples;
a RAM accessing circuit coupled to the integrated circuit RAM and accessing the single bit digital input image signal samples stored by the integrated circuit RAM;
an integrated circuit read only memory storing multiple bit digital reference signal samples;
a read only memory accessing circuit coupled to the integrated circuit read only memory and accessing the multiple bit digital reference signal samples stored by the integrated circuit read only memory;
a filter processor coupled to the RAM accessing circuit and coupled to the read only memory accessing circuit and generating multiple bit filtered digital image signal samples by filter processing the single bit digital input image signal samples accessed by the RAM accessing circuit in response to the multiple bit digital reference signal samples accessed by the read only memory accessing circuit;
a digital to analog converter coupled to the filter processor and generating an analog output filtered image signal in response to the multiple bit filtered digital image signal samples; and
a display coupled to the digital to analog converter and displaying a filtered image in response to the analog output filtered image signal.

2. A display system comprising:
an analog input image circuit generating an analog input image signal;
an analog to digital converter coupled to the analog input image circuit and generating digital input image signal samples in response to the analog input image signal, wherein the analog to digital converter includes a multiple bit circuit adapted to generate the digital input image signal samples as multiple bit digital input image signal samples in response to the analog input image signal;
an integrated circuit RAM coupled to the analog to digital converter and storing the multiple bit digital input image signal samples;
a RAM accessing circuit coupled to the integrated circuit RAM and accessing the multiple bit digital input image signal samples stored by the integrated circuit RAM;
an integrated circuit read only memory storing single bit digital reference signal samples;
a read only memory accessing circuit coupled to the integrated circuit read only memory and accessing the single bit digital reference signal samples stored by the integrated circuit read only memory;
a filter processor coupled to the RAM accessing circuit and coupled to the read only memory accessing circuit and generating multiple bit filtered digital image signal samples by filter processing the multiple bit digital input image signal samples accessed by the RAM accessing circuit in response to the single bit digital reference signal samples accessed by the read only memory accessing circuit;
a digital to analog converter coupled to the filter processor and generating an analog output filtered image signal in response to the multiple bit filtered digital image signal samples; and
a display coupled to the digital to analog converter and displaying a filtered image in response to the analog output filtered image signal.

3. A display system comprising:
an analog input image circuit generating an analog input image signal;
an analog to digital converter coupled to the analog input image circuit and generating digital input image signal samples in response to the analog input image signal, wherein the analog to digital converter includes a single bit circuit adapted to generate the digital input image signal samples as single bit digital input image signal samples in response to the analog input image signal;
an integrated circuit RAM coupled to the analog to digital converter and storing the single bit digital input image signal samples;
a RAM accessing circuit coupled to the integrated circuit RAM and accessing the single bit digital input image signal samples stored by the integrated circuit RAM;
an integrated circuit read only memory storing single bit digital reference signal samples;
a read only memory accessing circuit coupled to the integrated circuit read only memory and accessing the single bit digital reference signal samples stored by the integrated circuit read only memory;
a filter processor coupled to the RAM accessing circuit and coupled to the read only memory accessing circuit and generating multiple bit filtered digital image signal samples by filter processing the single bit digital input image signal samples accessed by the RAM accessing circuit in response to the single bit digital reference signal samples accessed by the read only memory accessing circuit;
a digital to analog converter coupled to the filter processor and generating an analog output filtered image signal in response to the multiple bit filtered digital image signal samples; and
a display coupled to the digital to analog converter and displaying a filtered image in response to the analog output filtered image signal.

4. A display system comprising:

an analog input image circuit generating an analog input image signal;

an analog to digital converter having a multiple bit circuit coupled to the analog input image circuit and generating multiple bit digital input image signal samples in response to the analog input image signal;

an integrated circuit RAM coupled to the analog to digital converter and storing the multiple bit digital input image signal samples;

a RAM accessing circuit coupled to the integrated circuit RAM and accessing the multiple bit digital input image signal samples stored by the integrated circuit RAM;

an integrated circuit read only memory storing multiple bit digital reference signal samples;

a read only memory accessing circuit coupled to the integrated circuit read only memory and accessing the multiple bit digital reference signal samples stored by the integrated circuit read only memory;

a filter processor coupled to the RAM accessing circuit and coupled to the read only memory accessing circuit and generating multiple bit filtered digital image signal samples by filter processing the multiple bit digital input image signal samples accessed by the RAM accessing circuit in response to the multiple bit digital reference signal samples accessed by the read only memory accessing circuit;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

5. A display system comprising:

an analog input image circuit generating an analog input image signal;

an analog to digital converter coupled to the analog input image circuit and generating digital input image signal samples in response to the analog input image signal, wherein the analog to digital converter includes a multiple bit circuit adapted to generate the digital input image signal samples as multiple bit digital input image signal samples in response to the analog input image signal;

an integrated circuit RAM coupled to the analog to digital converter and storing the multiple bit digital input image signal samples;

a RAM accessing circuit coupled to the integrated circuit RAM and accessing the multiple bit digital input image signal samples stored by the integrated circuit RAM;

an integrated circuit read only memory storing multiple bit digital reference signal samples;

a read only memory accessing circuit coupled to the integrated circuit read only memory and accessing the multiple bit digital reference signal samples stored by the integrated circuit read only memory;

a filter processor coupled to the RAM accessing circuit and coupled to the read only memory accessing circuit and generating multiple bit filtered digital image signal samples having a multiple bit digital resolution with more bits than the multiple bit digital input image signal samples and more bits than the multiple bit digital reference signal samples by filter processing the multiple bit digital input image signal samples accessed by the RAM accessing circuit in response to the multiple bit digital reference signal samples accessed by the read only memory accessing circuit;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

6. A display system comprising:

an analog input image circuit having a transducer generating a transducer signal and a signal processing circuit coupled to the transducer and generating an analog input image signal in response to the transducer signal;

an analog to digital converter coupled to the analog input image circuit and generating digital input image signal samples in response to the analog input image signal;

an integrated circuit RAM coupled to the analog to digital converter and storing the digital input image signal samples;

a RAM accessing circuit coupled to the integrated circuit RAM and accessing the digital input image signal samples stored by the integrated circuit RAM;

an integrated circuit read only memory storing digital transducer reference signal samples;

a read only memory accessing circuit coupled to the integrated circuit read only memory and accessing the digital transducer reference signal samples stored by the integrated circuit read only memory;

a filter processor coupled to the RAM accessing circuit and coupled to the read only memory accessing circuit and generating filtered digital transducer image signal samples by filter processing the digital input image signal samples accessed by the RAM accessing circuit in response to the digital transducer reference signal samples accessed by the read only memory accessing circuit;

a digital to analog converter coupled to the filter processor and generating an analog output filtered image signal in response to the filtered digital transducer image signal samples; and a display coupled to the digital to analog converter and displaying a filtered transducer image in response to the analog output filtered image signal.

7. A display system comprising:

an analog input image circuit having a plurality of analog input circuit channels, each one of the plurality of channels generating an analog input image signal;

an analog to digital converter coupled to the analog input image circuit and generating a plurality of channels of digital input image signal samples in response to the plurality of channels of analog input image signal;

an integrated circuit RAM coupled to the analog to digital converter and storing the plurality of channels of digital input image signal samples;

a RAM accessing circuit coupled to the integrated circuit RAM and accessing a plurality of channels of digital input image signal samples stored by the integrated circuit RAM;

an integrated circuit read only memory storing a plurality of channels of digital reference signal samples;

a read only memory accessing circuit coupled to the integrated circuit read only memory and accessing the plurality of channels of digital reference signal samples stored by the integrated circuit read only memory;

a plurality of channels of filter processors, each channel coupled to the RAM accessing circuit and coupled to the read only memory accessing circuit and generating filtered digital image signal samples by filter processing the digital input image signal samples accessed by the related channel of RAM accessing circuit in response to the digital reference signal samples accessed by the related channel of the read only memory accessing circuit;

a digital to analog converter coupled to the filter processor and generating an analog output filtered image signal in response to the plurality of channels of filtered digital image signal samples; and a display coupled to the digital to analog converter and displaying the plurality of channels of filtered images in response to the analog output filtered image signal.

8. A display system comprising:

a synchronization circuit generating a synchronization signal;

an analog input image circuit generating an analog input image signal;

an analog to digital converter coupled to the analog input image circuit and generating digital input image signal samples in response to the analog input image signal;

an integrated circuit RAM coupled to the analog to digital converter and storing the digital input image signal samples;

a RAM accessing circuit coupled to the integrated circuit RAM and accessing the digital input image signal samples stored by the integrated circuit RAM:

an integrated circuit read only memory storing digital reference signal samples and storing instructions;

a read only memory accessing circuit coupled to the integrated circuit read only memory and accessing the digital reference signal samples and the stored instructions stored by the integrated circuit read only memory;

a programmable filter processor coupled to the RAM accessing circuit, to the read only memory accessing circuit, to the read only memory accessing circuit, and to the synchronization circuit and generating filtered digital image signal samples in synchronization with the synchronization signal by filter processing the digital input image signal samples accessed by the RAM accessing circuit in response to the digital reference signal samples accessed by the read only memory accessing circuit, in response to the stored instructions accessed by the read only memory accessing circuit, and in response to the synchronization signal;

a digital to analog converter coupled to the filter processor and generating an analog output filtered image signal in response to the filtered digital image signal samples; and a display coupled to the digital to analog converter and to the synchronization circuit and displaying a filtered image in response to the analog output filtered image signal and in synchronization with the synchronization signal.

9. A display system comprising:

an analog input image circuit generating an analog input image signal;

an analog to digital converter coupled to the analog input circuit and generating digital input image signal samples in response to the analog input image signal, wherein the analog to digital converter includes a single bit circuit generating the digital input image signal samples as single bit digital input image signal samples in response to the analog input image signal;

an integrated circuit memory coupled to the analog to digital converter and storing the digital input image signal samples;

a filter processor coupled to the integrated circuit memory and generating filtered digital image signal samples by filter processing the digital input image signal samples stored by the integrated circuit memory;

a digital to analog converter coupled to the filter processor and generating an analog output filtered image signal in response to the filtered digital image signal samples; and a display coupled to the digital to analog converter and displaying a filtered image in response to the analog output filtered image signal.

10. A display system comprising:

an analog input image circuit generating an analog input image signal;

an analog to digital converter coupled to the analog input circuit and generating single bit digital input image signal samples in response to the analog input image signal;

an integrated circuit memory coupled to the analog to digital converter and storing the single bit digital input image signal samples;

a filter processor coupled to the integrated circuit memory and generating multiple bit filtered digital image signal samples by filter processing the single bit digital input image signal samples stored by the integrated circuit memory;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

11. A display system comprising:

an analog input image circuit generating an analog input image signal;

a reference signal memory storing single bit reference signal samples;

an analog to digital converter coupled to the analog input circuit and generating multiple bit digital input image signal samples in response to the analog input image signal;

an integrated circuit memory coupled to the analog to digital converter and storing the multiple bit digital input image signal samples;

a filter processor coupled to the integrated circuit memory and to the reference signal memory and generating multiple bit filtered digital image signal samples by filter processing the multiple bit digital input image signal samples stored by the integrated circuit memory in response to the single bit reference signal samples;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

12. A display system comprising:

an analog input image circuit generating an analog input image signal;

a reference signal memory storing single bit reference signal samples;

an analog to digital converter coupled to the analog input circuit and generating single bit digital input image signal samples in response to the analog input image signal;

an integrated circuit memory coupled to the analog to digital converter and storing the single bit digital input image signal samples;

a filter processor coupled to the integrated circuit memory and coupled to the reference signal memory and generating multiple bit filtered digital image signal samples by filter processing the single bit digital input image signal samples stored by the integrated circuit memory in response to the single bit reference signal samples;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

13. A display system comprising:

an analog input image circuit generating an analog input image signal;

a reference signal memory storing multiple bit reference signal samples;

an analog to digital converter coupled to the analog input image circuit and generating multiple bit digital input image signal samples in response to the analog input image signal;

an integrated circuit memory coupled to the analog to digital converter and storing the multiple bit digital input image signal samples;

a filter processor coupled to the reference signal memory and to the integrated circuit memory and generating multiple bit filtered digital image signal samples by filter processing the multiple bit digital input image signal samples stored by the integrated circuit memory in response to the multiple bit reference signal samples;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

14. A display system comprising:

an analog input image circuit generating an analog input image signal;

an analog to digital converter coupled to the analog input circuit and generating multiple bit digital input image signal samples in response to the analog input image signal;

an integrated circuit memory coupled to the analog to digital converter and storing the multiple bit digital input image signal samples;

a filter processor coupled to the integrated circuit memory and generating multiple bit filtered digital image signal samples having more resolution than the digital input image signal samples by filter processing the multiple bit digital input image signal samples stored by the integrated circuit memory;

a digital to analog converter coupled to the filter processor and generating an analog output filtered image signal in response to the multiple bit filtered digital image signal samples; and a display coupled to the digital to analog converter and displaying a filtered image in response to the analog output filtered image signal.

15. A display system comprising:

an analog input image circuit having a transducer generating a transducer signal and a signal processing circuit coupled to the transducer and generating an analog input image signal in response to the transducer signal;

an analog to digital converter coupled to the analog input circuit and generating digital input image signal samples in response to the analog input image signal;

an integrated circuit memory coupled to the analog to digital converter and storing the digital input image signal samples;

a filter processor coupled to the integrated circuit memory and generating filtered digital transducer image signal samples by filter processing the digital input image signal samples shared by the integrated circuit memory;

a digital to analog converter coupled to the filter processor and generating an analog output filtered image signal in response to the filtered digital transducer image signal samples; and a display coupled to the digital to analog converter and displaying a filtered transducer image in response to the analog output filtered image signal.

16. A display system comprising:

an analog input image circuit having a plurality of channels of the analog input circuit, each one of the plurality of channels generating an analog input image signal;

an analog to digital converter coupled to the analog input circuit and generating a plurality of channels of digital input image signal samples in response to the plurality of channels of analog input image signals;

an integrated circuit memory coupled to the analog to digital converter and storing the plurality of channels of digital input image signal samples;

a plurality of channels of filter processors, each channel coupled to the integrated circuit memory and generating filtered digital image signal samples by filter processing the related channel of the digital input image signal samples stored by the integrated circuit memory;

a digital to analog converter coupled to the filter processor and generating an analog output filtered image signal in response to the plurality of channels of filtered digital image signal samples; and a display coupled to the digital to analog converter and displaying the plurality of channels of filtered images in response to the analog output filtered image signal.

17. A display system comprising:
- a synchronization circuit generating a synchronization signal;
- an analog input image circuit generating an analog input image signal;
- an analog to digital converter coupled to the analog input circuit and generating digital input image signal samples in response to the analog input image signal;
- an integrated circuit memory coupled to the analog to digital converter and storing the digital input image signal samples;
- an integrated circuit read only memory storing instructions;
- a read only memory accessing circuit coupled to the integrated circuit read only memory and accessing the stored instructions;
- a programmable filter processor coupled to the read only memory accessing circuit, to the integrated circuit memory, and to the synchronization circuit and generating the filtered digital image signal samples in synchronization with the synchronization signal by filter processing the digital input image signal samples stored by the integrated circuit memory in response to the stored instructions accessed by the read only memory accessing circuit and in response to the synchronization signal;
- a digital to analog converter coupled to the filter processor and generating an analog output filtered image signal in response to the filtered digital image signal samples; and
- a display coupled to the digital to analog converter and to the synchronization circuit and displaying a filtered image in response to the analog output filtered image signal and in synchronization with the synchronization signal.

* * * * *